US012733161B2

(12) United States Patent
Zhou et al.

(10) Patent No.: US 12,733,161 B2
(45) **Date of Patent: *Sep. 8, 2026**

(54) THREE-DIMENSIONAL MEMORY DEVICE INCLUDING DISCRETE CHARGE STORAGE ELEMENTS AND METHODS OF FORMING THE SAME

(71) Applicant: Sandisk Technologies, Inc., Milpitas, CA (US)

(72) Inventors: Fei Zhou, San Jose, CA (US); Raghuveer S. Makala, Campbell, CA (US)

(73) Assignee: Sandisk Technologies, Inc., Milpitas, CA (US)

(*) Notice: Subject to any disclaimer, the term of this patent is extended or adjusted under 35 U.S.C. 154(b) by 797 days.

This patent is subject to a terminal disclaimer.

(21) Appl. No.: 18/154,286

(22) Filed: Jan. 13, 2023

(65) Prior Publication Data

US 2023/0171957 A1 Jun. 1, 2023

Related U.S. Application Data

(63) Continuation-in-part of application No. 18/145,275, filed on Dec. 22, 2022, now Pat. No. 12,453,088, (Continued)

(51) Int. Cl.
*H10B 41/27* (2023.01)
*G11C 16/04* (2006.01)
(Continued)

(52) U.S. Cl.
CPC ......... *H10B 41/27* (2023.02); *G11C 16/0483* (2013.01); *H10B 41/10* (2023.02); (Continued)

(58) Field of Classification Search
None
See application file for complete search history.

(56) References Cited

U.S. PATENT DOCUMENTS 5,915,167 A 6/1999 Leedy
8,349,681 B2 1/2013 Alsmeier et al.
(Continued)

FOREIGN PATENT DOCUMENTS

CN 108012567 A 5/2018
CN 110088901 A 8/2019

OTHER PUBLICATIONS

USPTO Office Communication, Non-Final Office Action for U.S. Appl. No. 18/145,275, mailed Jul. 17, 2024, 13 pages.
(Continued)

*Primary Examiner* — Sarah K Salerno
(74) *Attorney, Agent, or Firm* — THE MARBURY LAW GROUP PLLC

(57) ABSTRACT

A method of forming a memory device includes forming an alternating stack of disposable material layers and silicon nitride layers over a substrate, forming a memory opening through the alternating stack, forming a memory film and a vertical semiconductor channel in the memory opening, where the memory film includes a continuous silicon nitride charge storage material layer and a tunneling dielectric layer, forming a backside trench through the alternating stack, forming laterally-extending cavities by removing the disposable material layers selective to the silicon nitride layers through the backside trench, oxidizing portions of the silicon nitride layers and the continuous silicon nitride charge storage material layer exposed in the laterally-extending cavities to form silicon oxide insulating layers and to separate the continuous silicon nitride charge storage material layer into a vertical stack of discrete silicon nitride
(Continued)

charge storage material portions, and replacing remaining portions of the silicon nitride layers with electrically conductive layers.

9 Claims, 180 Drawing Sheets

Related U.S. Application Data which is a continuation-in-part of application No. 17/543,987, filed on Dec. 7, 2021, now Pat. No. 12,267,998, which is a continuation-in-part of application No. 17/090,420, filed on Nov. 5, 2020, now Pat. No. 11,659,711, which is a continuation-in-part of application No. 16/849,600, filed on Apr. 15, 2020, now Pat. No. 11,387,244.

(51) Int. Cl.

*H10B 41/10* (2023.01)
*H10B 41/35* (2023.01)
*H10B 43/10* (2023.01)
*H10B 43/27* (2023.01)
*H10B 43/35* (2023.01)

(52) U.S. Cl.

CPC ............. *H10B 41/35* (2023.02); *H10B 43/10* (2023.02); *H10B 43/27* (2023.02); *H10B 43/35* (2023.02)

(56) References Cited

U.S. PATENT DOCUMENTS 8,658,488 B2 2/2014 Dinitrakopoulos et al.
8,658,499 B2 2/2014 Makala et al.
8,847,302 B2 9/2014 Alsmeier et al.
8,933,501 B2 1/2015 Makala et al.
9,093,321 B2 7/2015 Makala et al.
9,252,151 B2 2/2016 Chien et al.
9,356,031 B2 5/2016 Lee et al.
9,397,093 B2 7/2016 Makala et al.
9,412,613 B2 8/2016 Manna et al.
9,419,012 B1 8/2016 Shimabukuro et al.
9,449,982 B2 9/2016 Lu et al.
9,576,975 B2 2/2017 Zhang et al.
9,627,399 B2 4/2017 Kanakamedala et al.
9,646,975 B2 5/2017 Peri et al.
9,691,884 B2 6/2017 Makala et al.
9,842,907 B2 12/2017 Makala et al.
9,875,929 B1 1/2018 Shukla et al.
9,960,180 B1 5/2018 Zhou et al.
10,115,732 B2 10/2018 Yu et al.
10,176,984 B2 1/2019 Smith et al.
10,192,784 B1 1/2019 Cui et al.
10,256,247 B1 4/2019 Kanakamedala et al.
10,256,252 B1 4/2019 Kanazawa
10,276,583 B2 4/2019 Sharangpani et al.
10,283,513 B1 5/2019 Zhou et al.
10,290,648 B1 5/2019 Zhou et al.
10,319,680 B1 6/2019 Sel et al.
10,381,366 B1 8/2019 Takahashi et al.
10,516,025 B1 12/2019 Nishikawa et al.
10,580,976 B2 3/2020 Takahashi et al.
10,700,078 B1 6/2020 Cui et al.
10,700,090 B1 6/2020 Cui et al.
10,707,233 B1 7/2020 Cui et al.
10,818,542 B2 10/2020 Cui et al.
10,998,331 B2 5/2021 Zhou et al.
11,049,807 B2 6/2021 Li et al.
11,114,462 B1 9/2021 Cui et al.
11,387,244 B2 7/2022 Makala et al.
2013/0264631 A1 10/2013 Alsmeier et al.
2014/0138760 A1 5/2014 Makala et al.
2015/0279856 A1 10/2015 Hyun et al.
2015/0294978 A1 10/2015 Lu et al.
2015/0333186 A1 11/2015 Yoo
2016/0043093 A1 2/2016 Lee et al.
2016/0071861 A1 3/2016 Serov et al.
2017/0025431 A1 1/2017 Kanakamedala et al.
2017/0084618 A1 3/2017 Peri et al.
2017/0243879 A1 8/2017 Yu et al.
2018/0033646 A1 2/2018 Sharangpani et al.
2018/0219017 A1 8/2018 Goda et al.
2018/0331117 A1 11/2018 Titus et al.
2019/0198510 A1 6/2019 Kim
2019/0252405 A1 8/2019 Tsutsumi
2019/0259772 A1 8/2019 Takahashi et al.
2019/0287982 A1 9/2019 Hinoue et al.
2019/0288192 A1 9/2019 Takahashi et al.
2019/0386108 A1 12/2019 Nishikawa et al.
2020/0006375 A1 1/2020 Zhou et al.
2020/0127126 A1 4/2020 Lee
2020/0273501 A1 8/2020 Yun et al.
2020/0388686 A1* 12/2020 Eom .................... H10D 64/037
2021/0066343 A1* 3/2021 Choi ...................... H10B 43/27
2021/0074720 A1 3/2021 Son et al.
2021/0104535 A1 4/2021 Yang et al.
2021/0193674 A1 6/2021 Said et al.
2021/0257378 A1 8/2021 Ueda et al.
2021/0265372 A1 8/2021 Kanakamedala et al.
2021/0265383 A1 8/2021 Kim et al.
2021/0265385 A1 8/2021 Rajashekhar et al.
2021/0296349 A1 9/2021 Yoshimizu
2021/0327889 A1 10/2021 Makala et al.
2021/0327890 A1 10/2021 Makala et al.
2021/0327897 A1 10/2021 Kasai et al.
2021/0388686 A1 12/2021 Chen
2022/0052073 A1 2/2022 Kitazawa et al.
2022/0093644 A1 3/2022 Sharangpani et al.
2022/0230917 A1 7/2022 Amano et al.
2022/0352200 A1 11/2022 Sano et al.
2022/0352201 A1 11/2022 Hinoue et al.
2022/0406379 A1 12/2022 Takeguchi et al.
2022/0406720 A1 12/2022 Hinoue et al.
2022/0406793 A1 12/2022 Takeguchi et al.
2022/0406794 A1 12/2022 Hinoue et al.

OTHER PUBLICATIONS

USPTO Office Communication, Non-Final Office Action for U.S. Appl. No. 17/543,987, mailed Jul. 12, 2024, 21 pages.

USPTO Office Communication, Final Office Action for U.S. Appl. No. 18/145,275, mailed Nov. 14, 2024, 15 pages.

Endoh, T. et al., “Novel Ultra High Density Flash Memory with A Stacked-Surrounding Gate Transistor (S-GT) Structured Cell,” IEDM Proc., pp. 33-36, (2001).

Gasvoda, J. R. et al., “Gas-phase surface functionalization of $SiN_x$ with benzaldehyde to increase $SiO_2$ to $SiN_x$ etch selectivity in atomic layer etching,”Journal of Vacuum Science & Technology, vol. 39, No. 4, 040401, (2021); https://doi.org/10.1116/6.0001046.

ISR-WO, Notification of Transmittal of the International Search Report and the Written Opinion of the International Searching Authority for International Patent Application No. PCTUS2020/067169, mailed on May 4, 2021, 9 pages.

Miyoshi, N. et al., “Atomic layer etching of $Si_3N_4$ with high selectivity to $SiO_2$ and poly-Si,” J. Vac. Sci. Technol. A 39, 052601 (2021); https://doi.org/10.1116/6.0001179.

Ohno, K. et al., “Reactive Ion Etching of Copper Films in a SiCl4, N 2, Cl2, and NH 3 Mixture.” *Journal of The Electrochemical Society*, vol. 143, No. 12, 4089, (1996); https://lopscience.iop.org/article/10.1149/1.1837341/pdf.

Sabouret, E., et al. “Reactive ion etching of metal stack consisting of an aluminium alloy, WGex, barrier and Ti adhesion layer.” *Microelectronic engineering* 37 (1997): 353-363; https://doi.org/10.1016/s0167-9317(97)00133-0.

Watanabe, D. et al., High selectivity ($SiN/SiO_2$) etching using an organic solution containing anhydrous HF, *Microelectonic Engineering*, vol. 86, No. 11, Nov. 2009, pp. 2161-2164, (2009), https://doi.org/10.1016/j.mes.2009.03.104.

(56) References Cited

OTHER PUBLICATIONS

Zeng, H. C. "Chemical etching of molybdenum trioxide: a new tailor-made synthesis of MoO3 catalysts." *Inorganic Chemistry*, vol. 37, No. 8, pp. 1967-1973, (1998); https://doi.org/10.1021/c971269v.

U.S. Appl. No. 17/378,196, filed Jul. 16, 2021, SanDisk Technologies LLC.

U.S. Appl. No. 17/399,710, filed Aug. 11, 2021, SanDisk Technologies LLC.

U.S. Appl. No. 17/507,224, filed Oct. 21, 2021, SanDisk Technologies LLC.

U.S. Appl. No. 17/659,902, filed Apr. 20, 2022, SanDisk Technologies LLC.

U.S. Appl. No. 18/145,275, filed Dec. 22, 2022, SanDisk Technologies LLC.

USPTO Office Communication, Non-Final Office Action for U.S. Appl. No. 18/344,411, mailed Feb. 6, 2026, 27 pages.

* cited by examiner 47
52
70
42
32
42
42
32
42
32
10
66
49'
11

66L
52
70
42
32
42
42
32
42
32
10
49'
11

52
54L
70
42
32
42
42
32
42
32
66
11
10

52
70
42
32
42
42
32
42
32
49'
66
11
10

50
56
54S
52
70
42
32
42
32
42
32
49'
11
10
601
602
77

54S
49'
167
167
167
52
70
42
32
42
42
32
42
32
10
11

54L
166
52
70
42
32
42
42
32
42
32
10
11

601
49'
50
56
54S
52
70
42
32
11
10'

54S
52
49'

50
52
54S
56
601
602
49'
70
42
32
11
10
77

55
60
601
602
63
62
11
58
10
56
54S
50
52
70
42
32

601
602
62
11
10
56
54S
50
52
70
42
32

55
60
601
602
63
62
11
10
58
56
54S
50
52
57
70
42
32

52
53
70
42
32
42
32
42
32
10
11
49'
42

70
42
32
42
32
42
32
10
11
49
42

55
60
601
602
50
56
54S
53
52
63
62
70
42
32
11
10
58

601
56
54N
50
52
49'
70
42
32
11
10

54N
52
49'

55
60
601
602
50
56
54N
52
63
62
70
42
32
11
58
10

55
50
52
54S
54N
56
60
602
601
63
62
70
42
32
11
58
10

50
52
54S
54N
56
602
601
62
70
42
32
11
10

55
60
601
602
56
54N
54S
52
50
57
63
62
70
42
32
11
58
10

66L
52
70
42
32
42
32
42
32
10
49'
11

52
70
42
32
42
32
42
32
10
49'
11

52
70
42
32
42
42
32
42
32
66
49'
11
10

66L 77
601
49'
56
54S
50
52
70
42
32
42
32
42
32
10
11

601
49'
56
54S
50
52
70
42
32
42
32
42
32
10
11

55
50
60
52
54S
56
602
601
63
70
42
32
11
58
10
57
54U
54T
54F 50
52
54N
56
70
42
32
11
10

54N
52
54U
54T
54F 50
52
54N
56
601
602
62
70
42
32
11
10

55
60
601
602
50
56
54S
52
57
44
63
62
70
46
32
11
116
58
10

55
60
601
602
63
49'
11
10
44
46
32
70
56
54S
53
52
50
57
116

55
60
601
602
63
62
56
54N
50
52
57
70
46
32
44
10
11
58
116

55
60
601
602
63
56
54S
50
52
57
70
46
32
44
11
58
10
116

55
60
601
602
63
56
54N
50
52
57
70
46
32
44
10
11
58
116

70
41
31
41
41
31
41
31
49'
11
10

70
41
33
41
41
33
41
33
49
10

601
49'
151L
154L
56
70
41
33
11
10

50
601
49'
151L
154L
56
70
41
31
11
10

55
50
60
601
602
56
154
151
152
73
63
62
70
43
132
132S
ULP
LPP
LLP
253
116
11
10
58

VA
62
52N
50
60
52A
52B
156
54
32F
54A
141
141
32U
32
146
32
146
32

VA
62
52N
50
52A
52B
60
156
54A
32F
54A
141
141
32U
32
146
32
146
32

VA
62
52N
50
60
52A
52B
156
54
31F
54A
141
141
146
31
31U
31
146
31

VA
62
52N
50
60
52A
52B
156
54A
34F
54A
141
141
34C
34D
146
34C
34D
146
34C
34D
34
34
34
31U

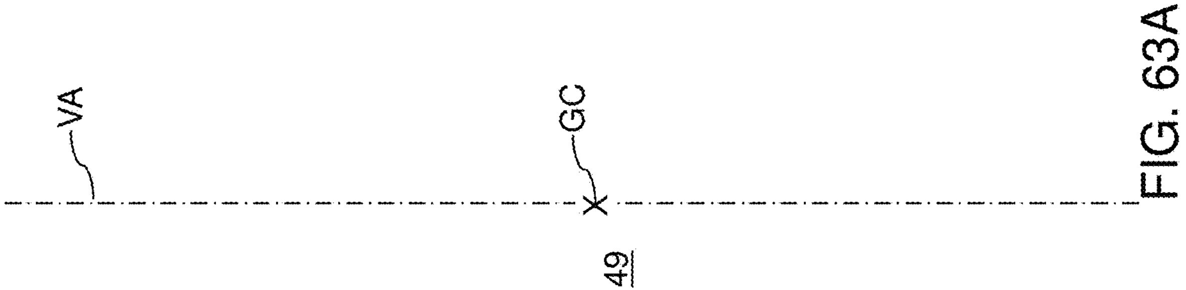
FIG. 63A
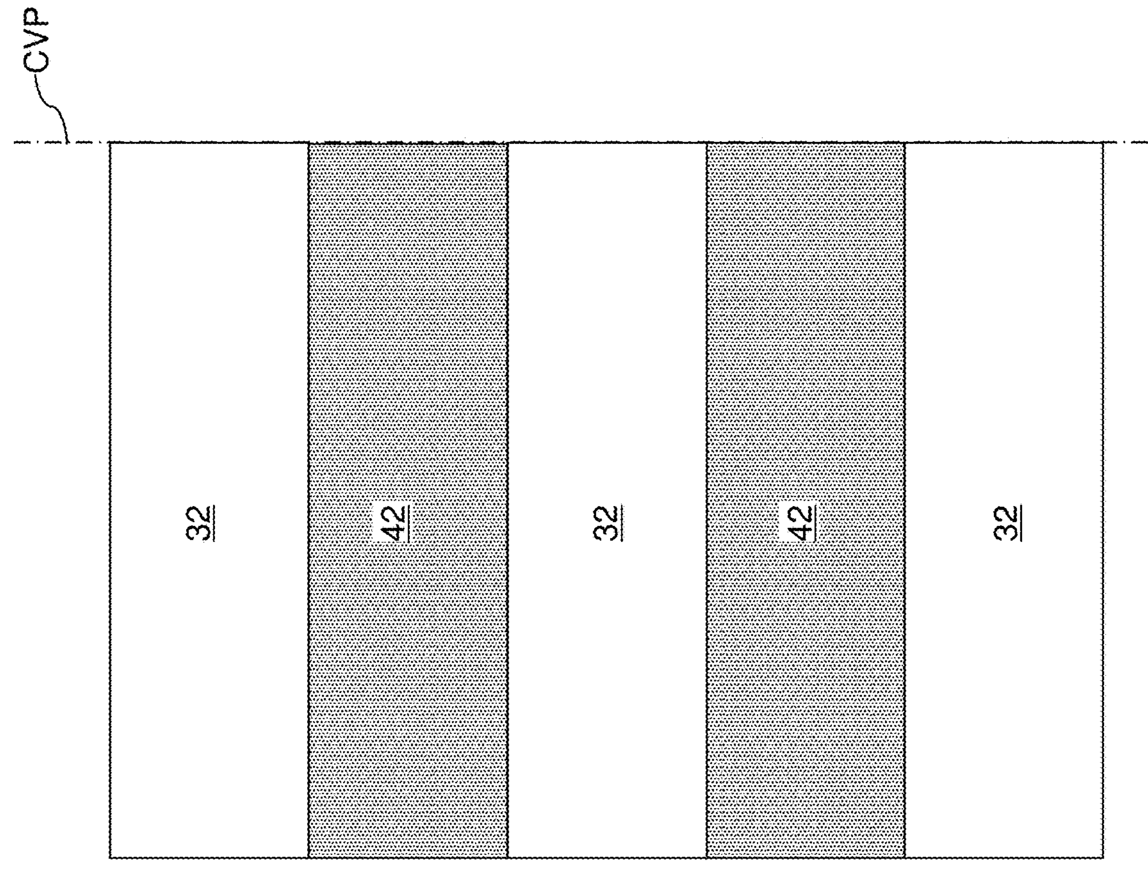

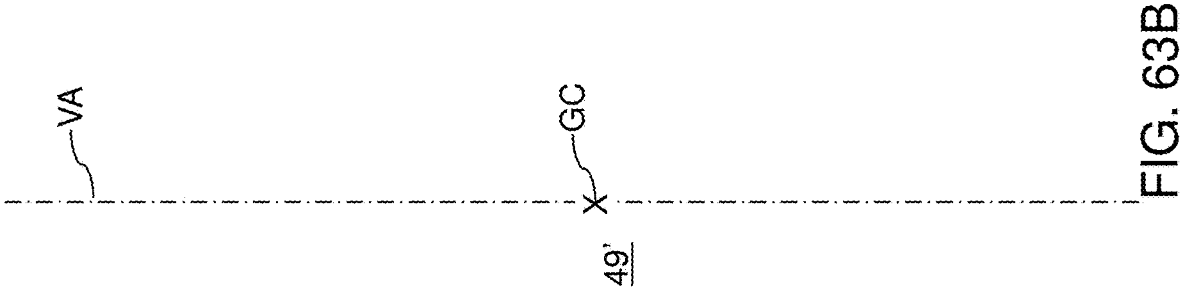
FIG. 63B
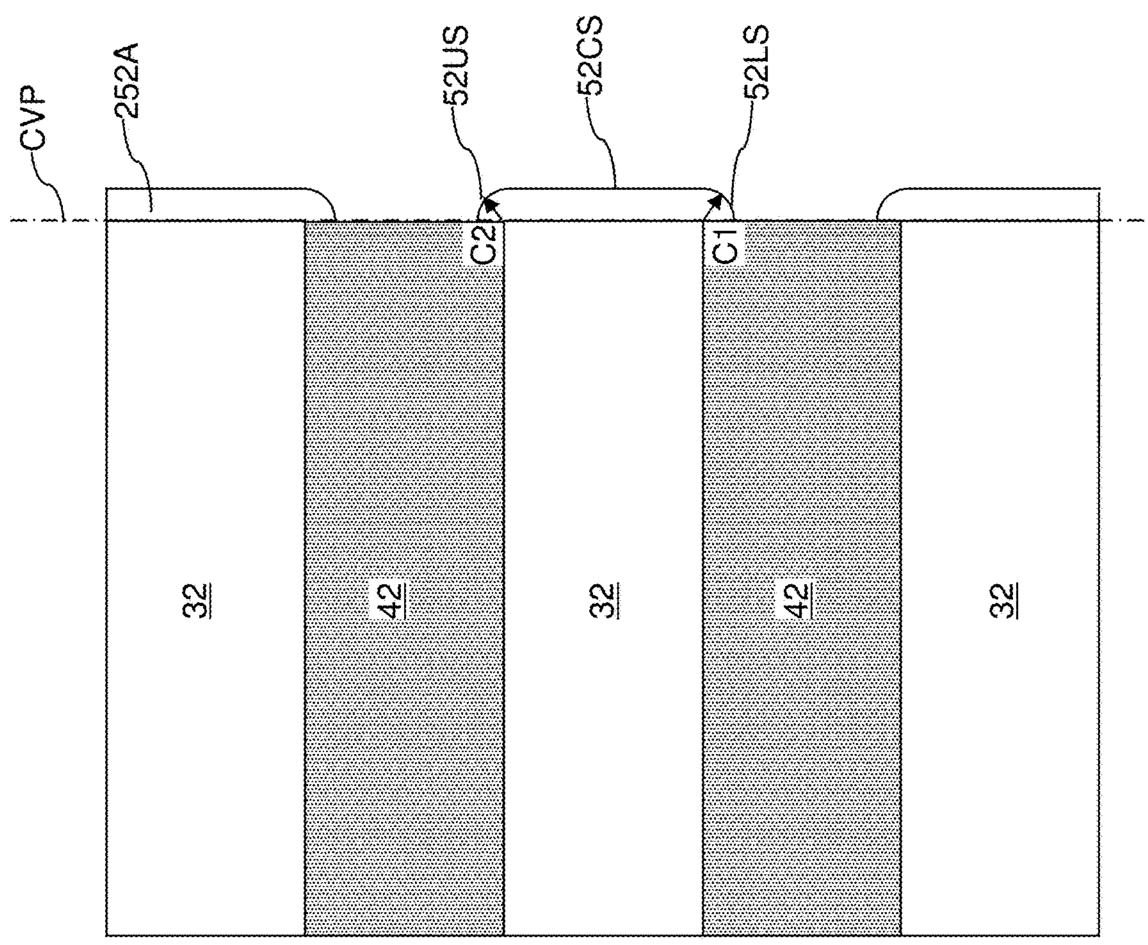

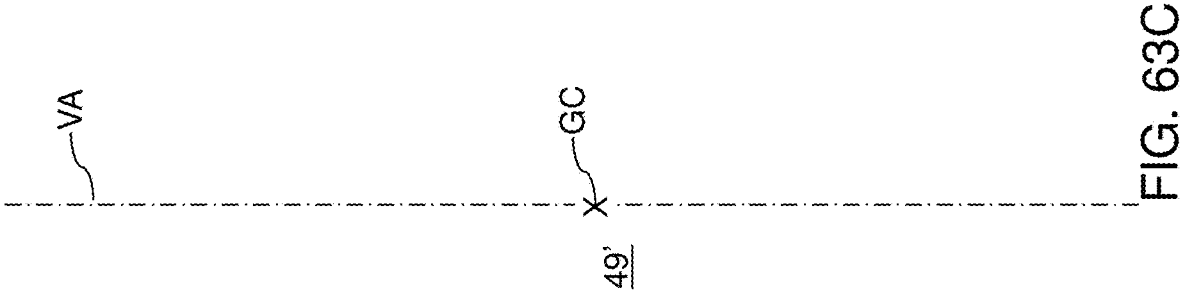
FIG. 63C
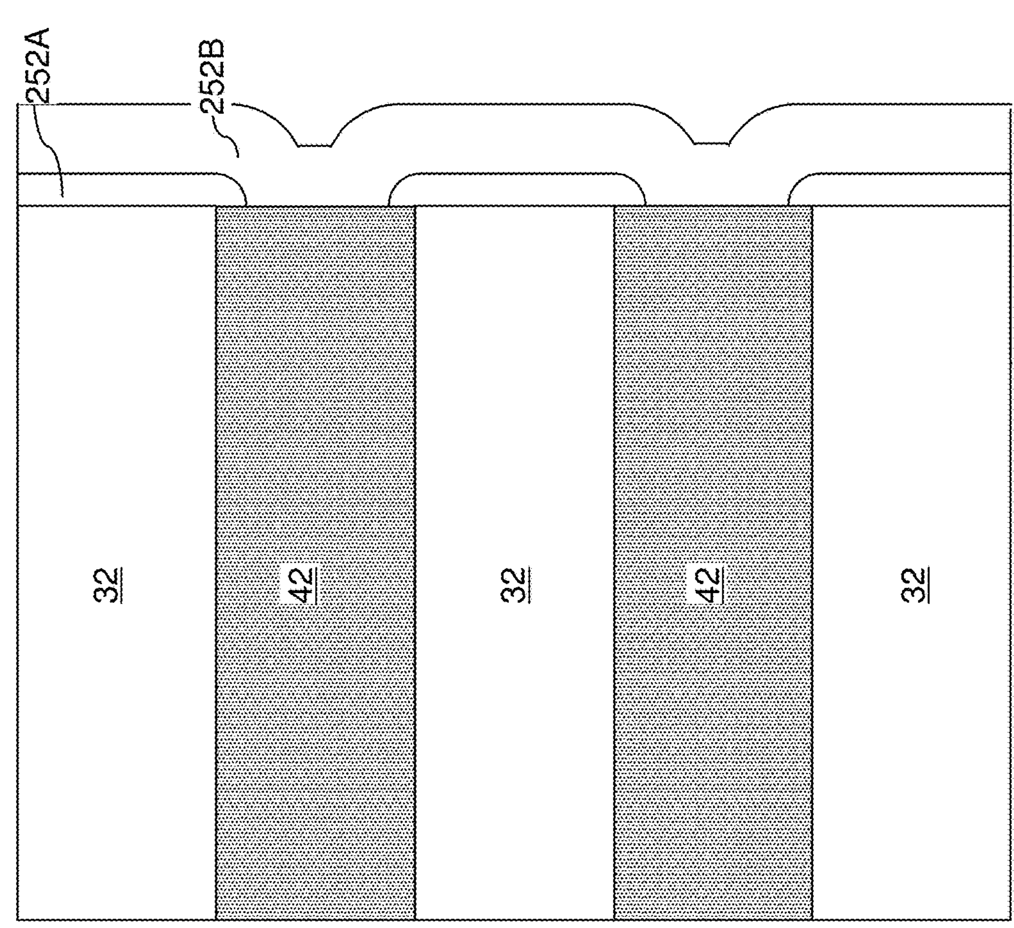

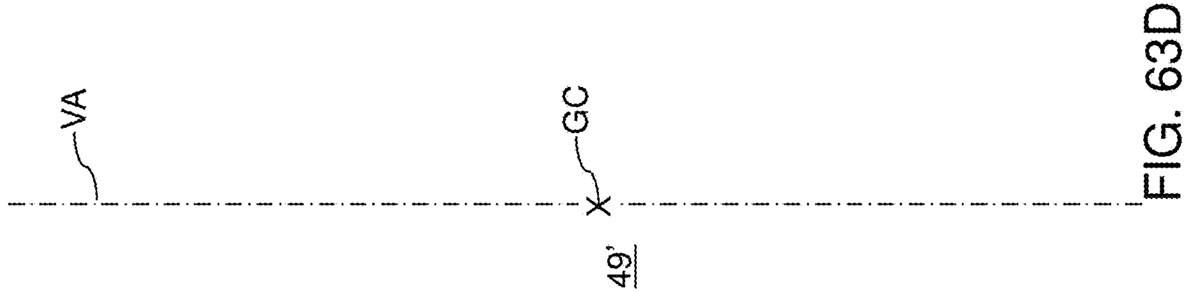
FIG. 63D
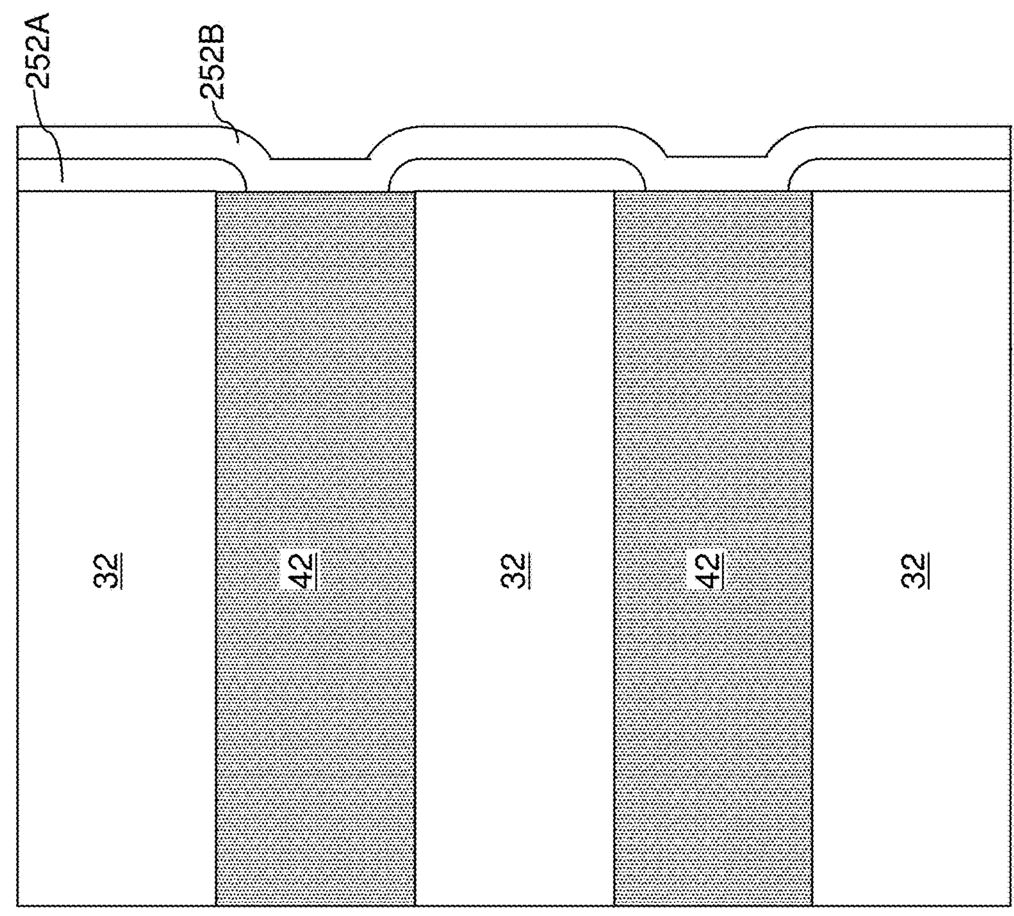

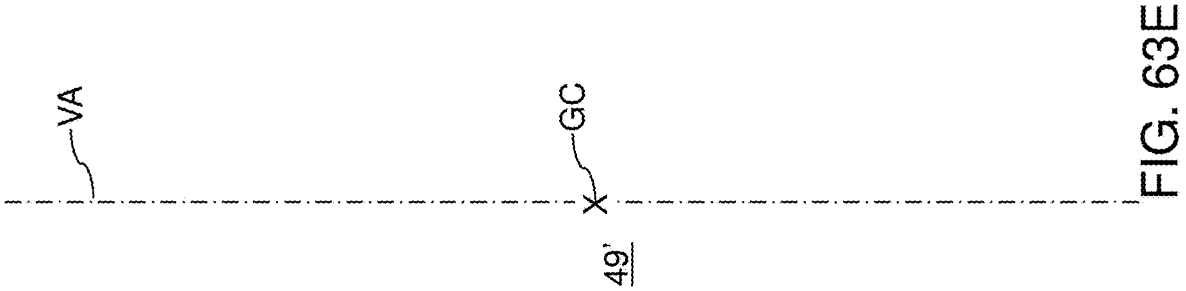
VA
GC
49'
FIG. 63E
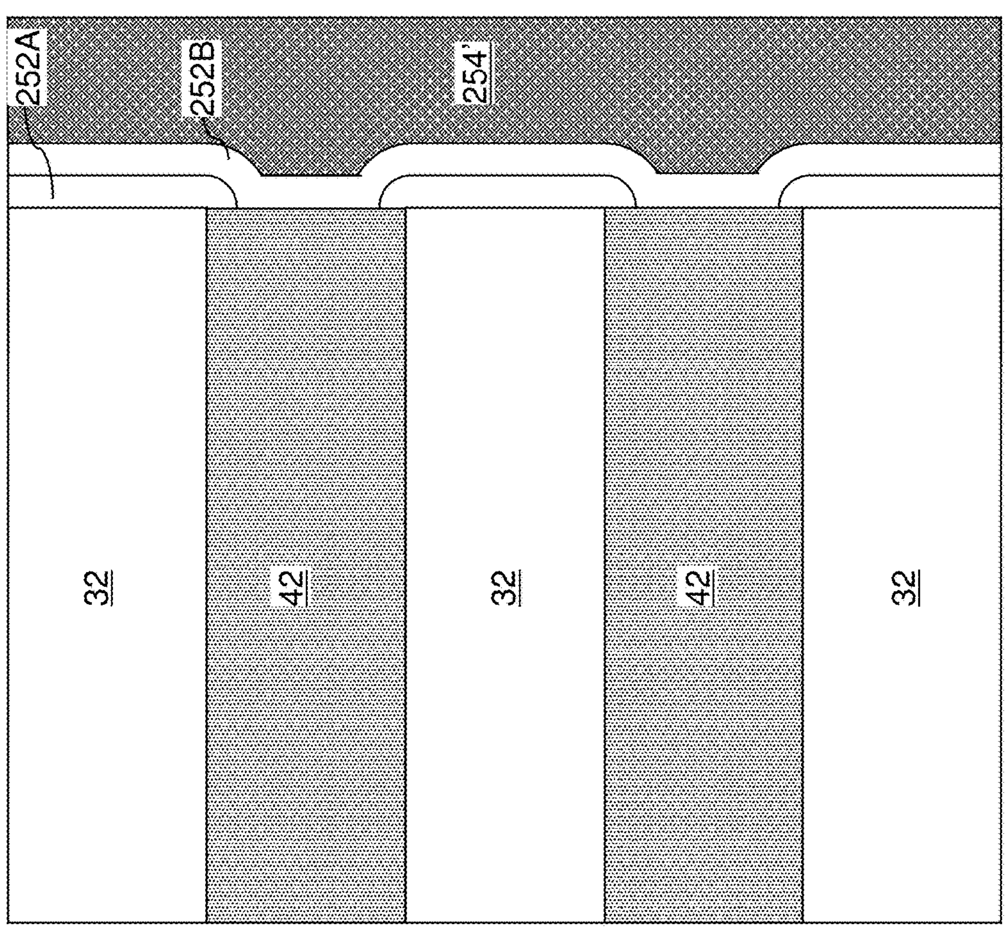
252A
252B
254'
32
42
32
42
32

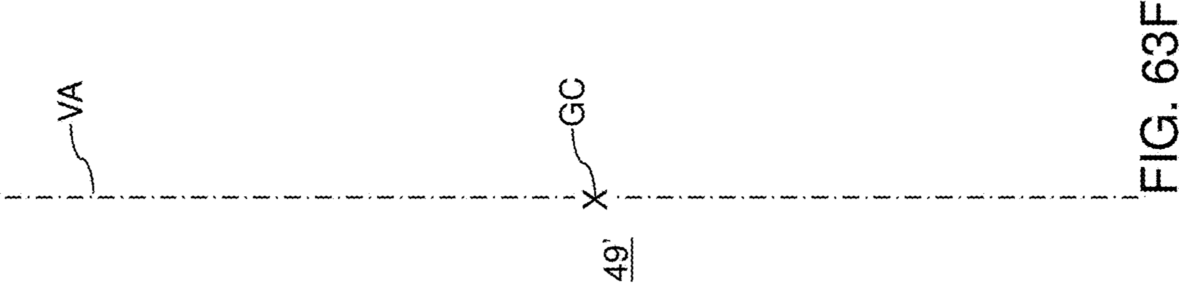
FIG. 63F
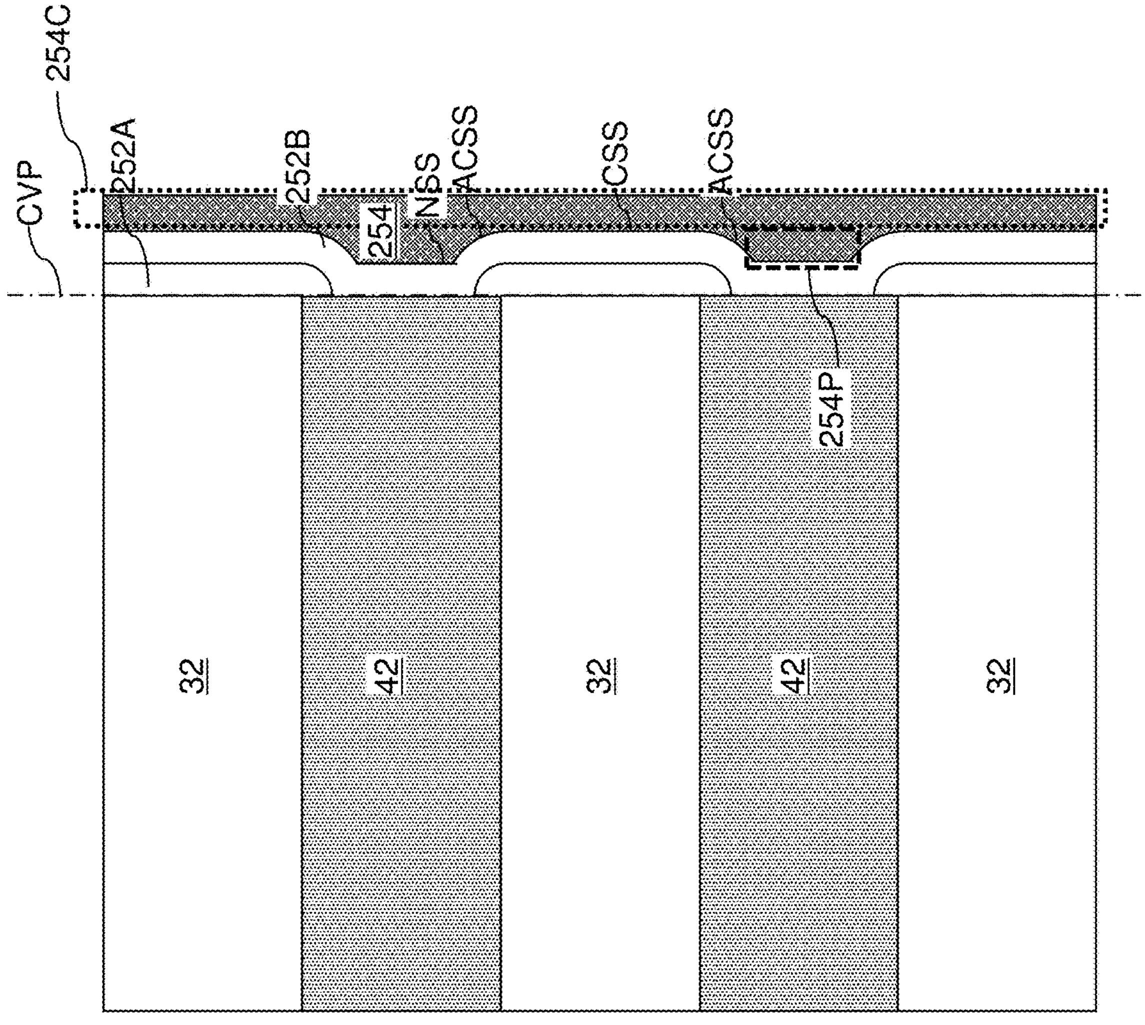

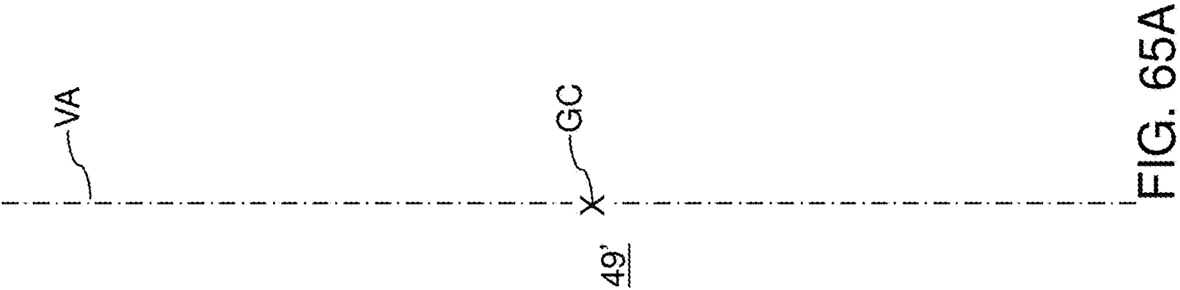
VA
GC
49'
FIG. 65A
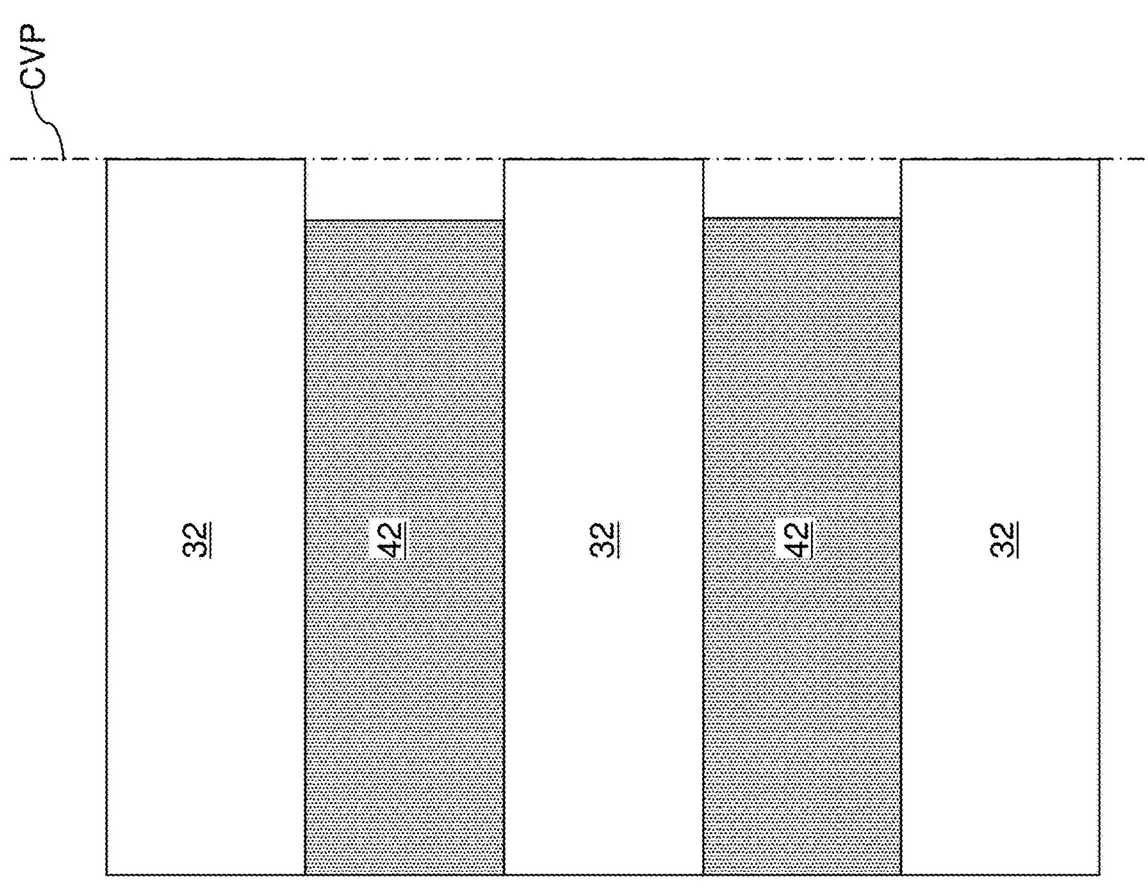
CVP
32
42
32
42
32

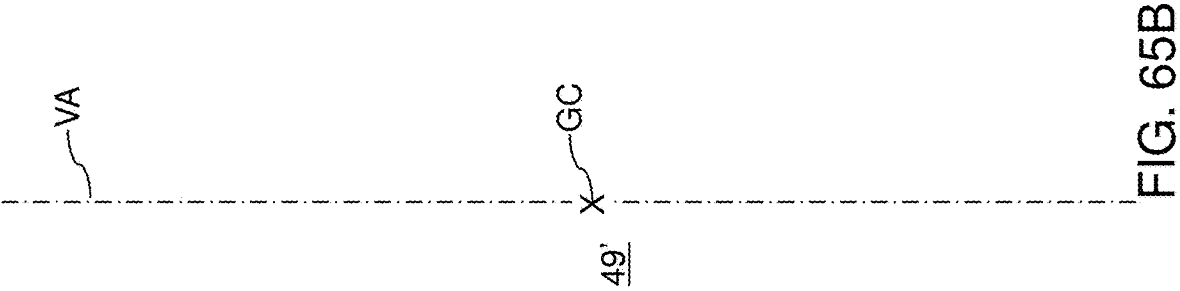
FIG. 65B
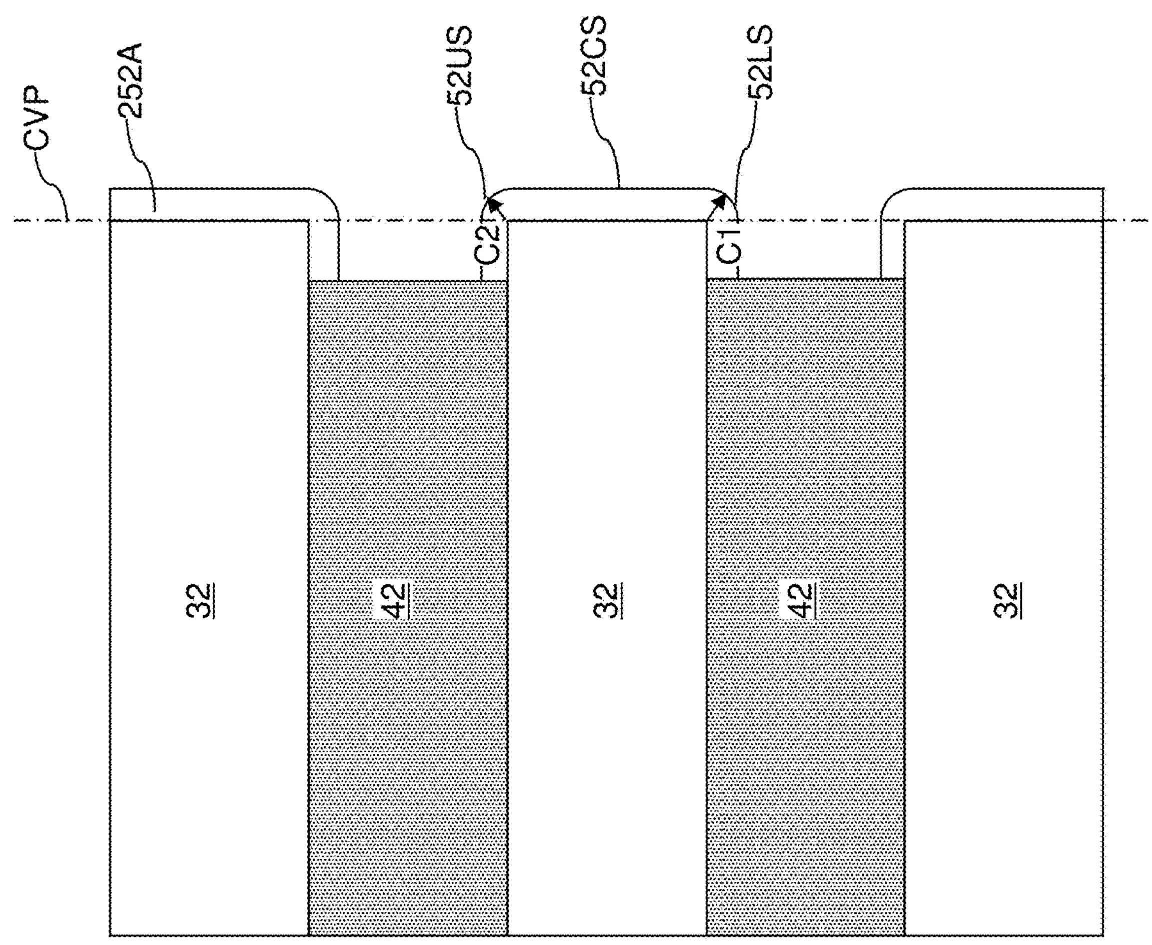

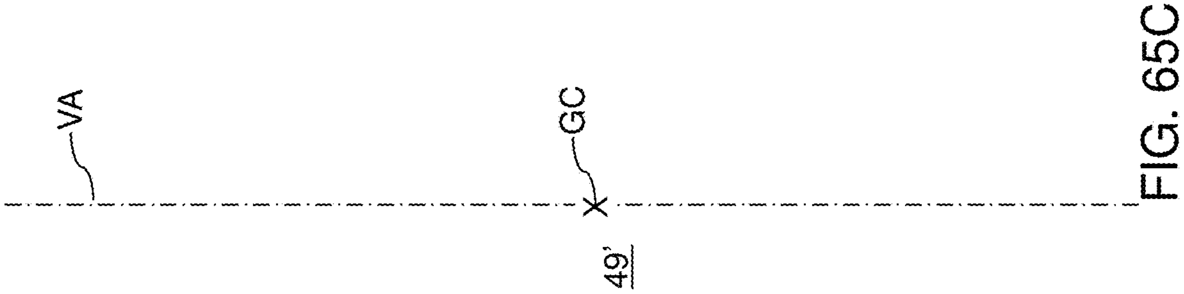
FIG. 65C
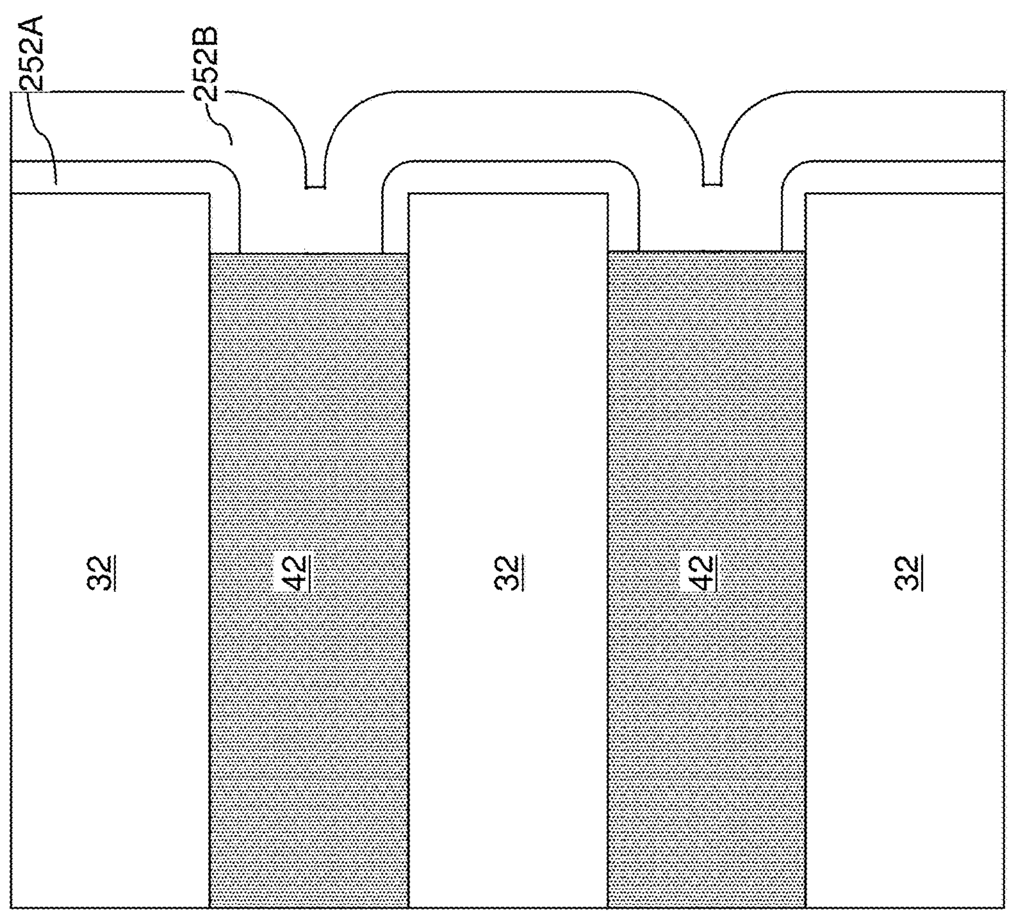

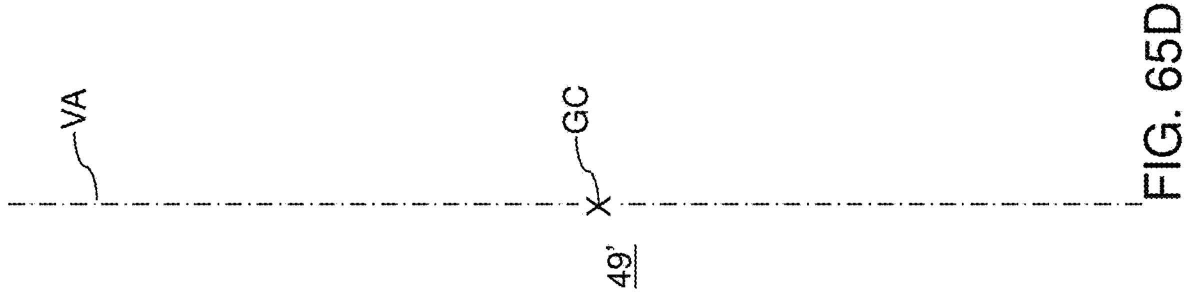
VA
GC
49'
FIG. 65D
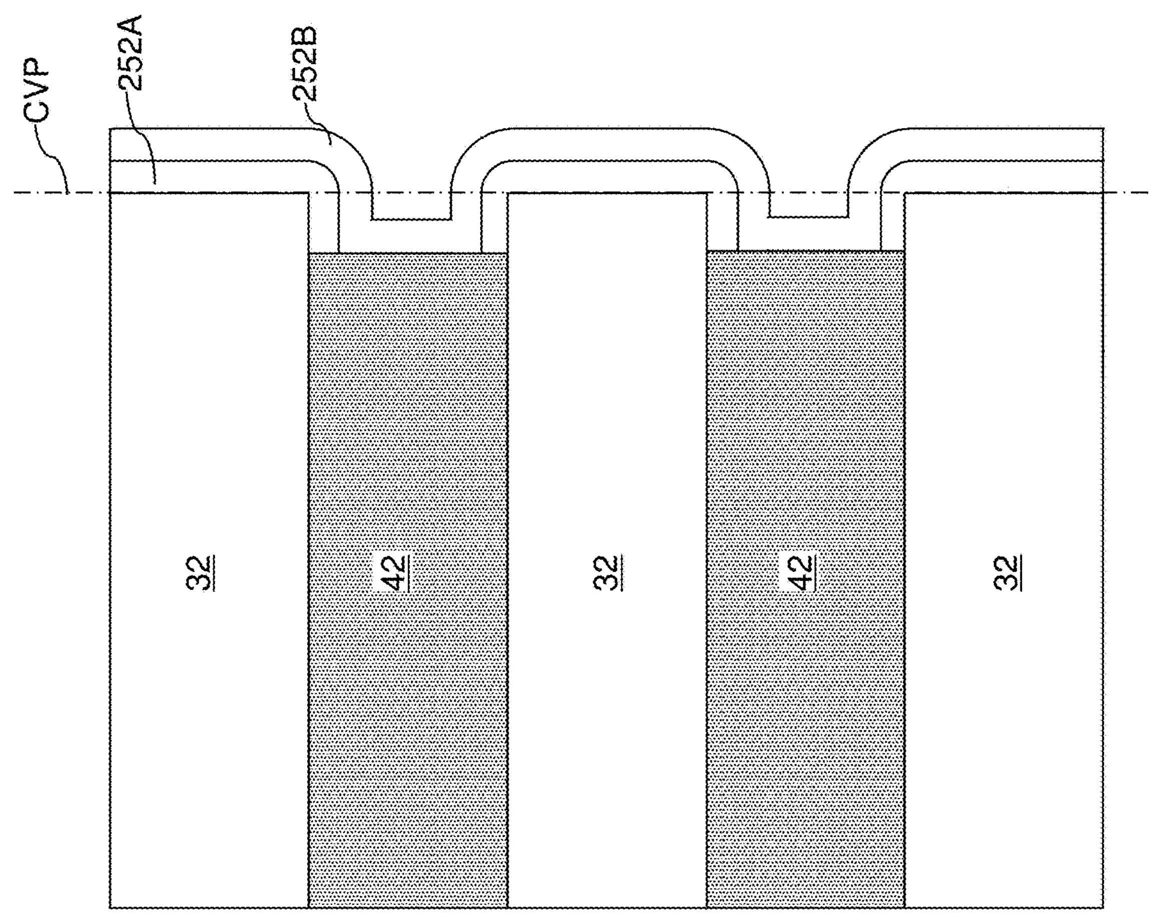
CVP
252A
252B
32
42
32
42
32

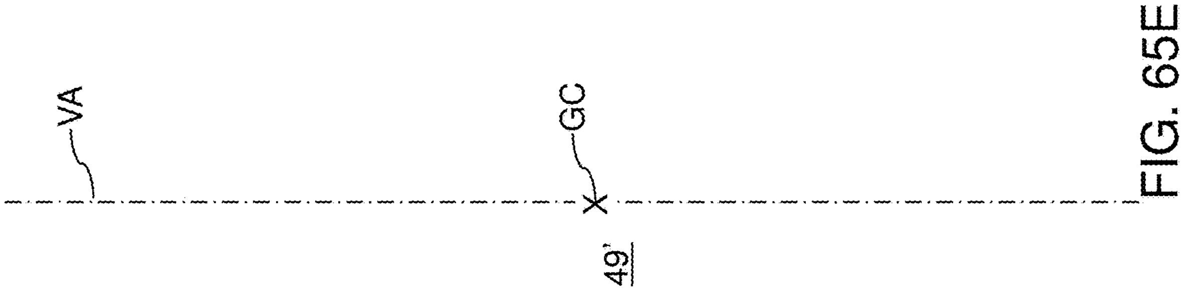
FIG. 65E
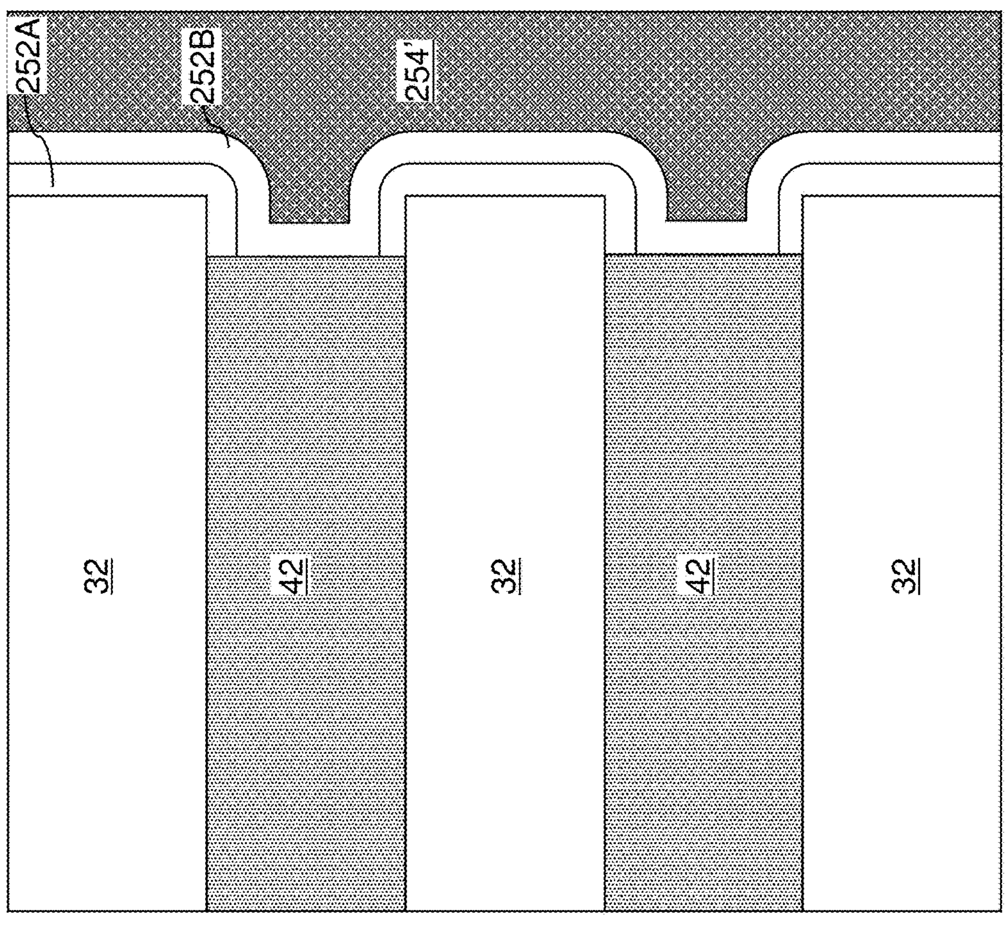

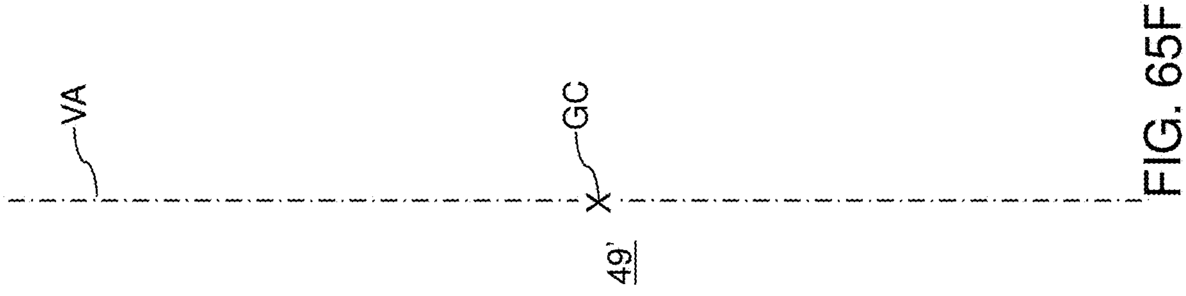
VA
GC
49'
FIG. 65F
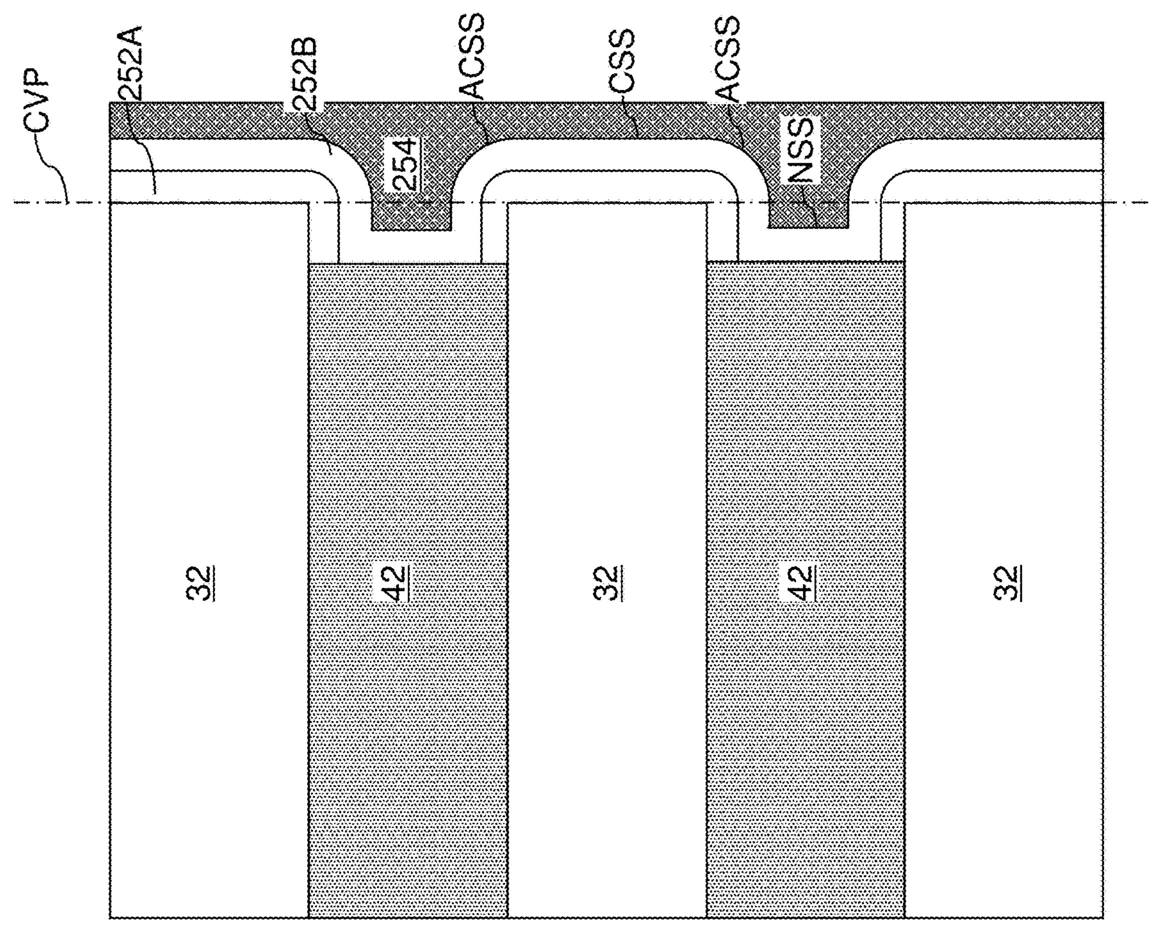
CVP
252A
252B
ACSS
CSS
ACSS
254
NSS
32
42
32
42
32

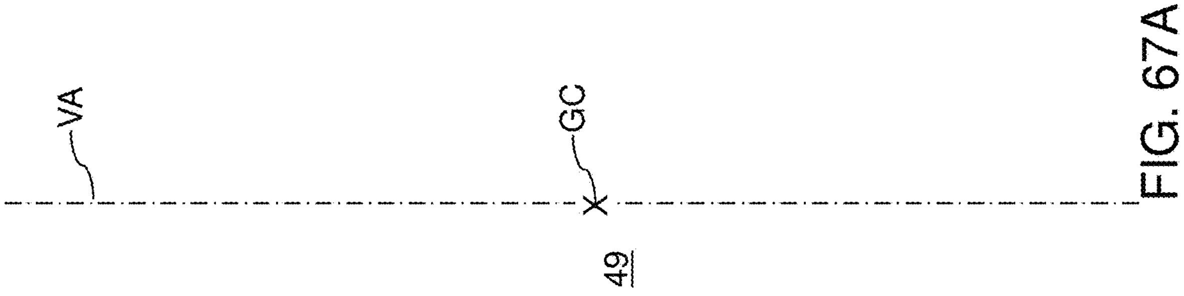
FIG. 67A
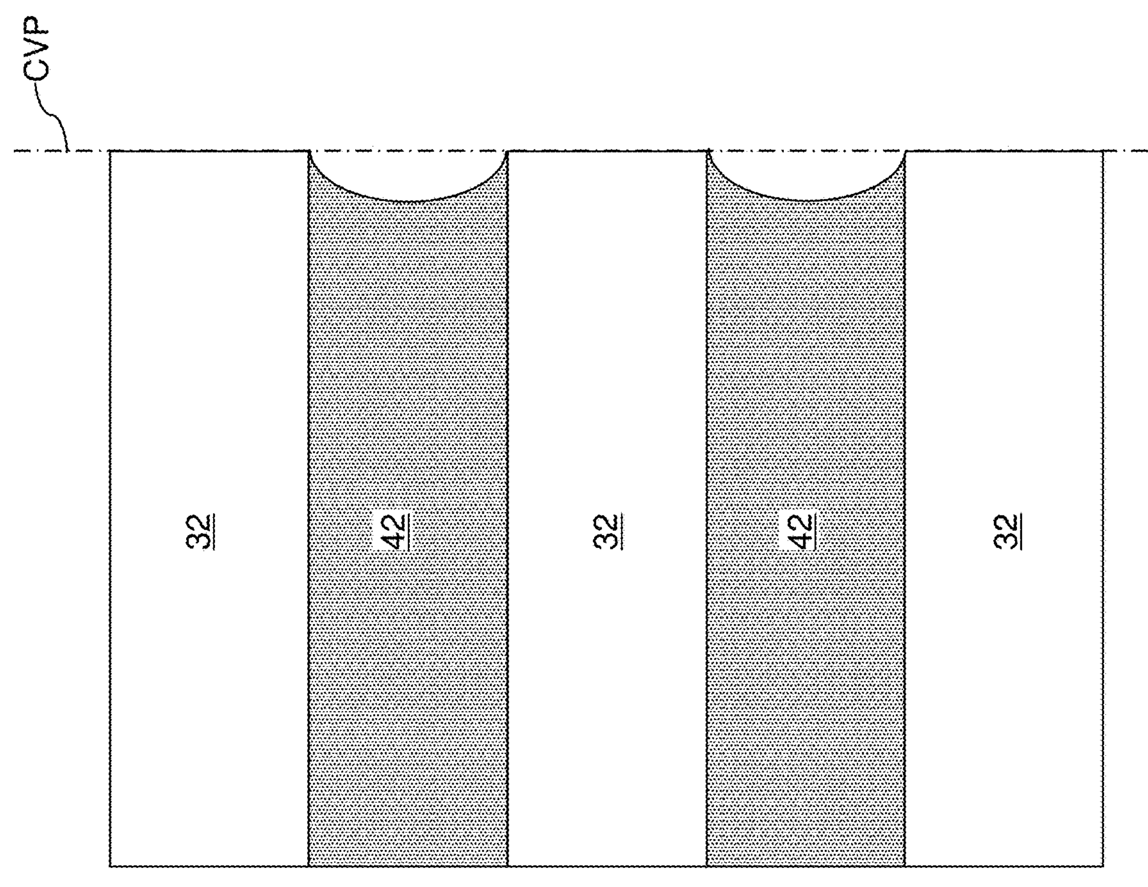

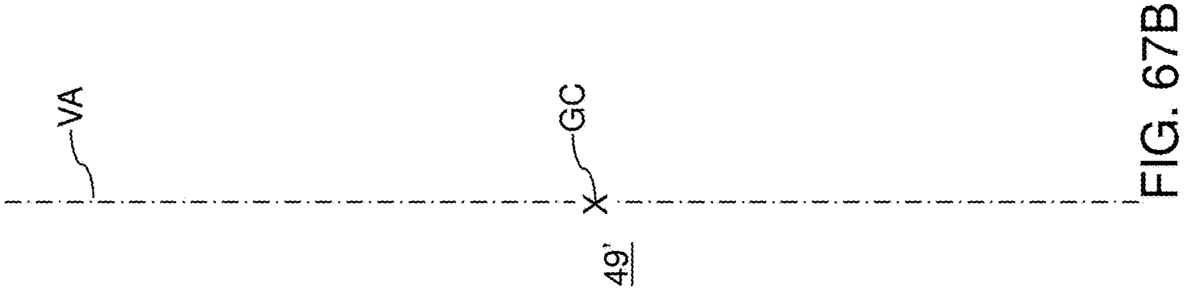
VA
GC
49'
FIG. 67B
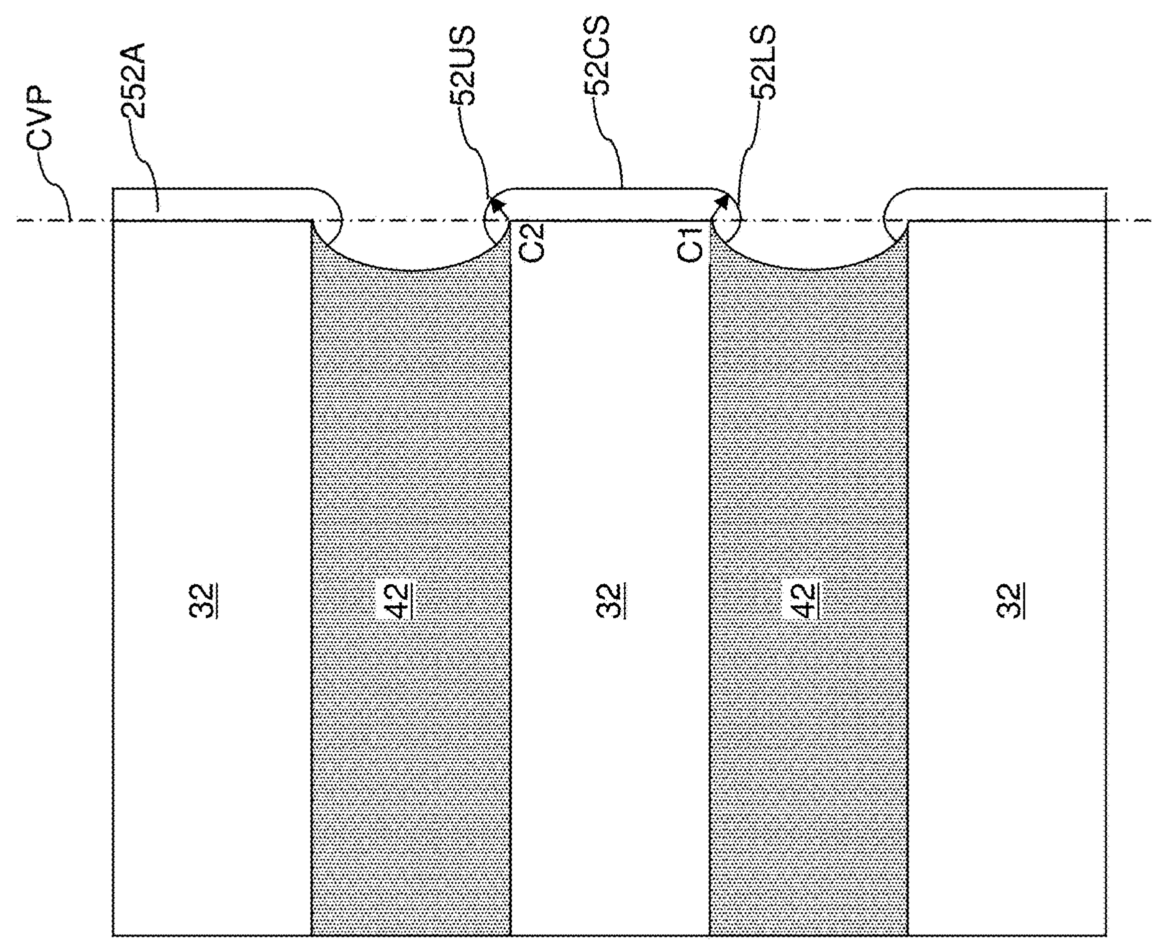
CVP
252A
52US
52CS
52LS
C2
C1
32
42
32
42
32

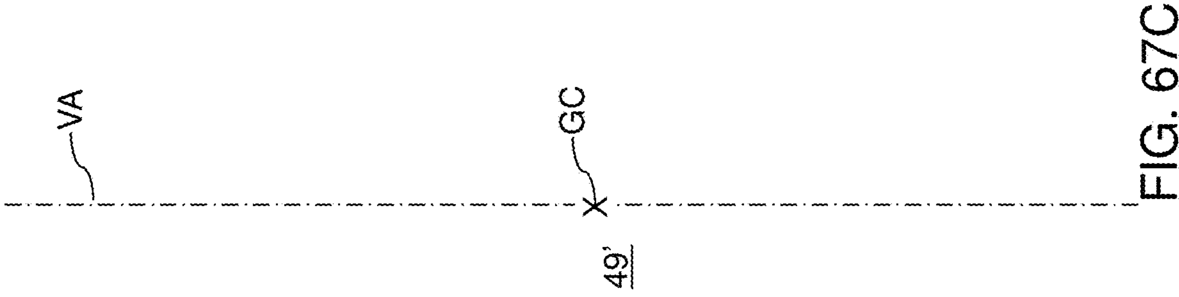
FIG. 67C
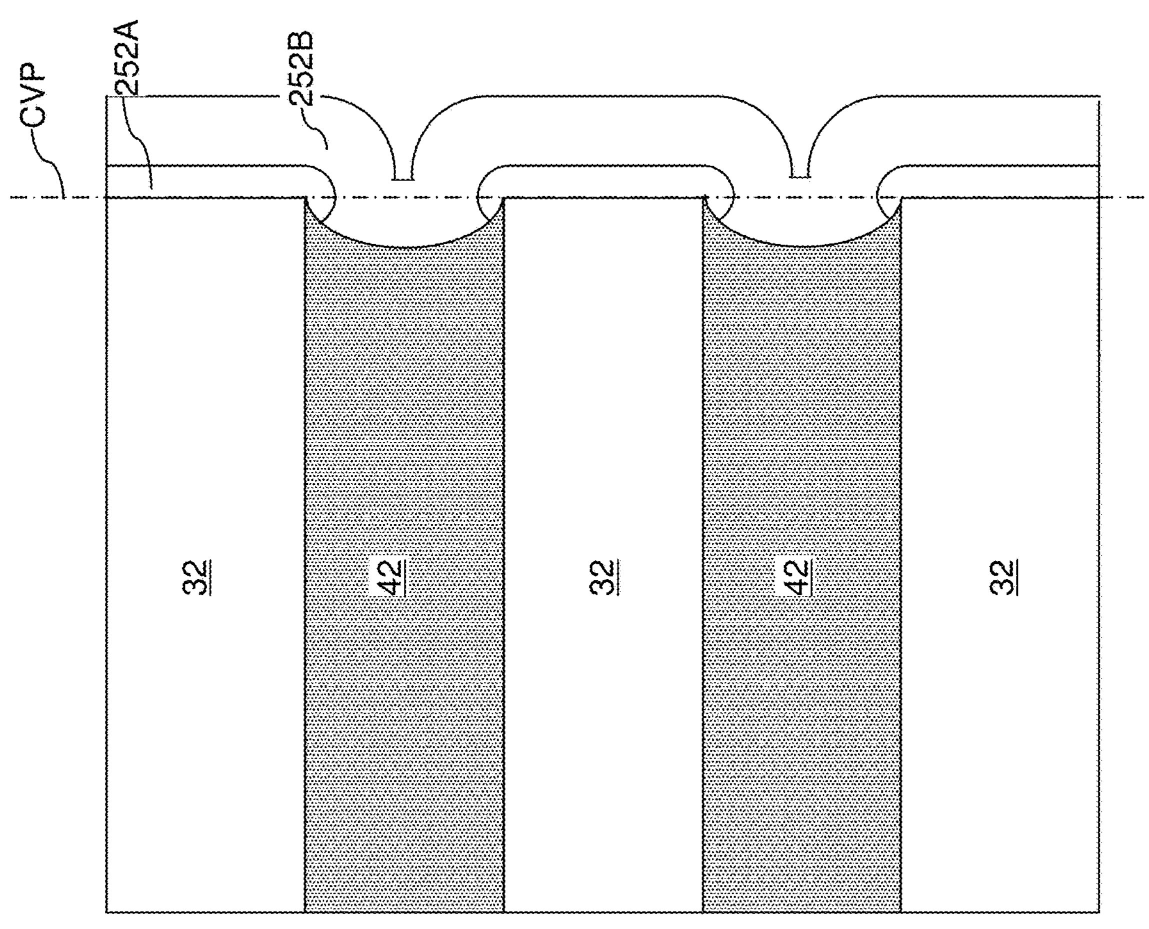

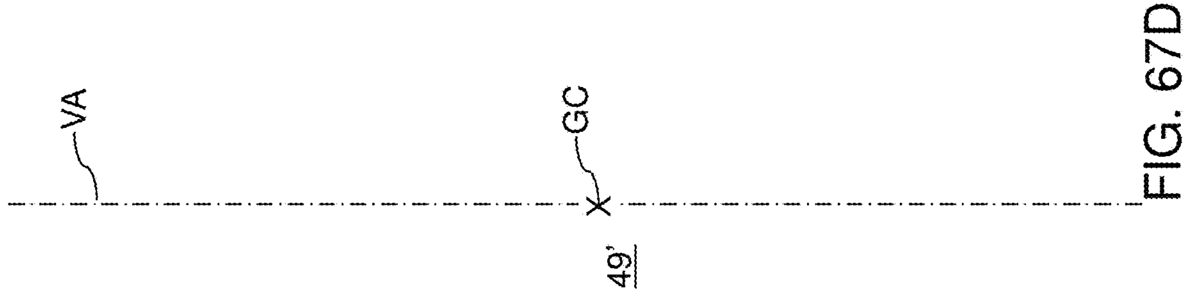
VA
GC
49'
FIG. 67D
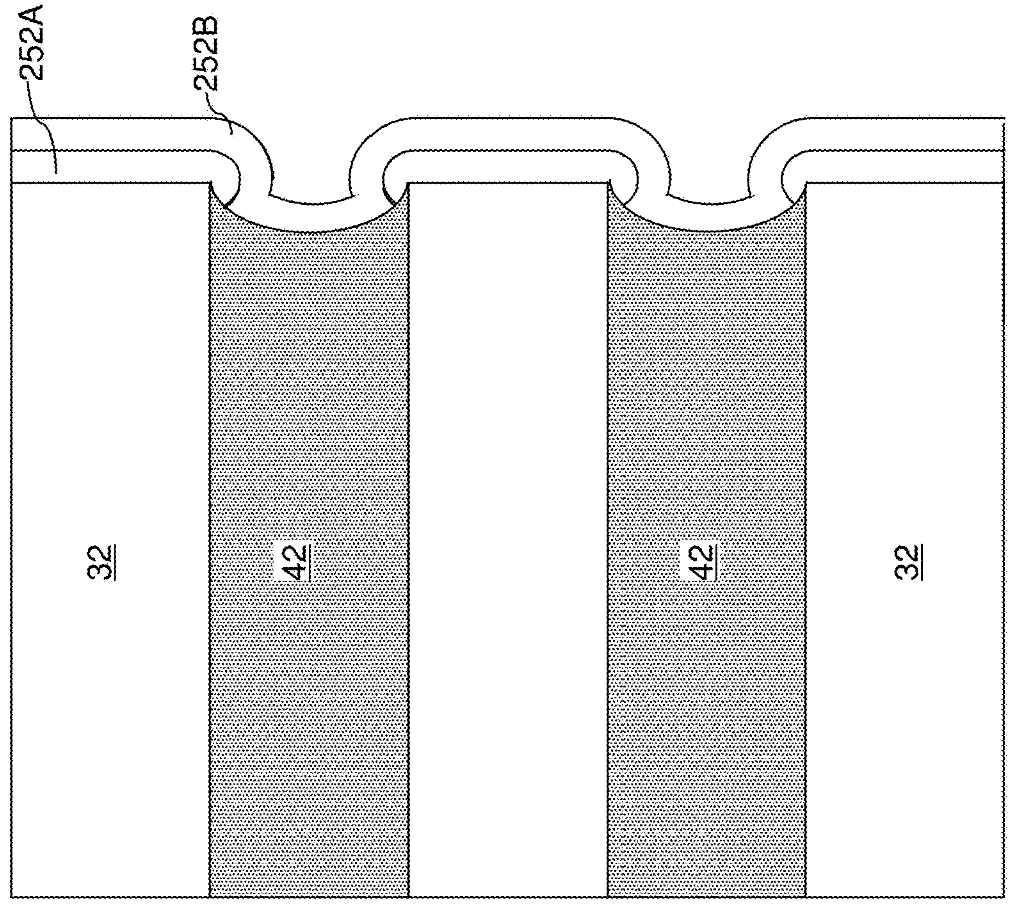
252A
252B
32
42
42
32

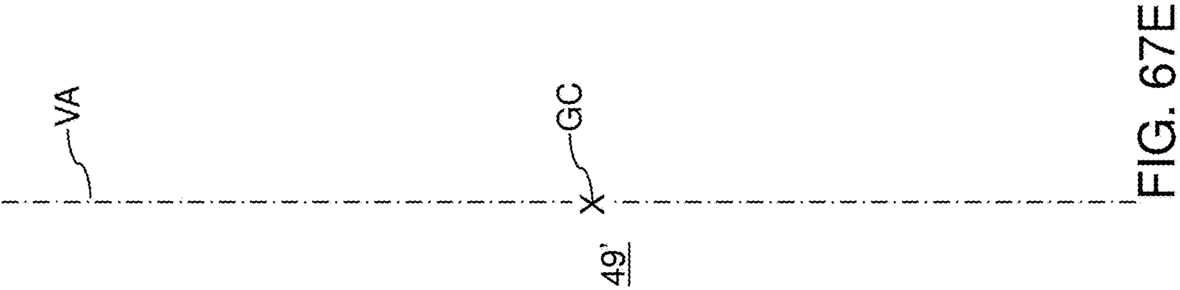
VA
GC
49'
FIG. 67E
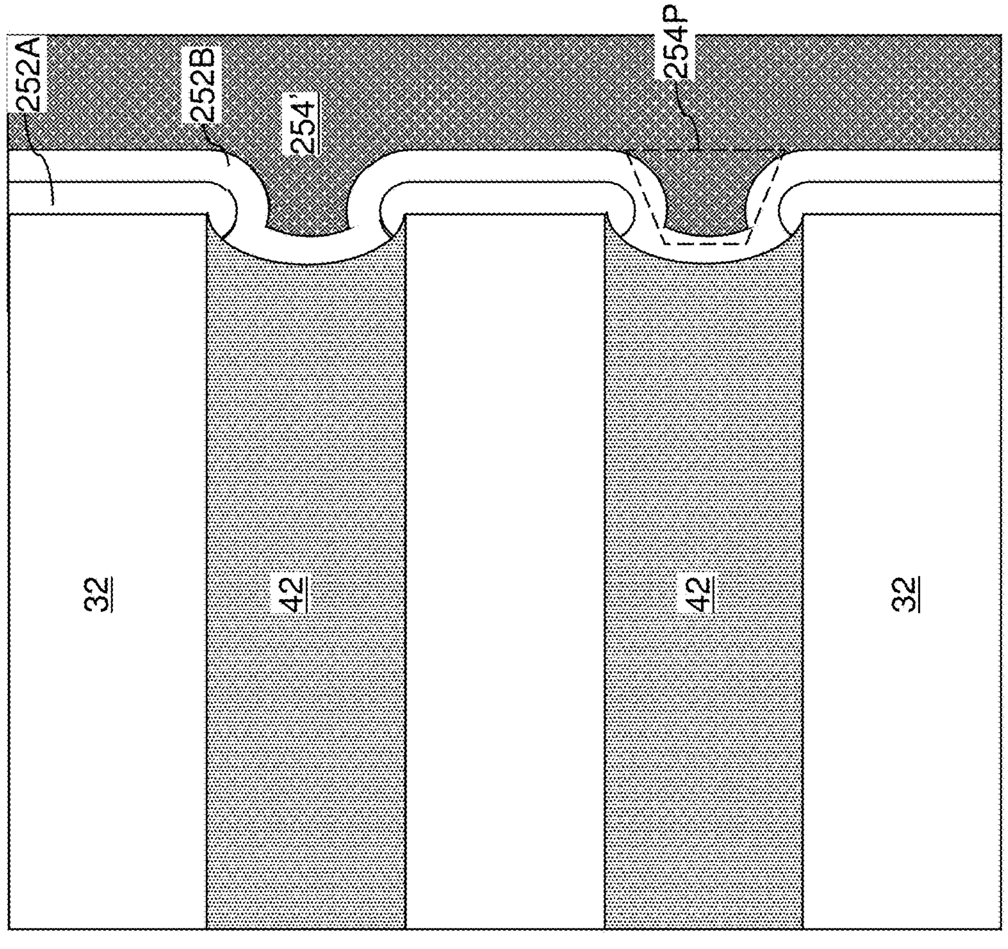
252A
252B
254'
254P
32
42
42
32

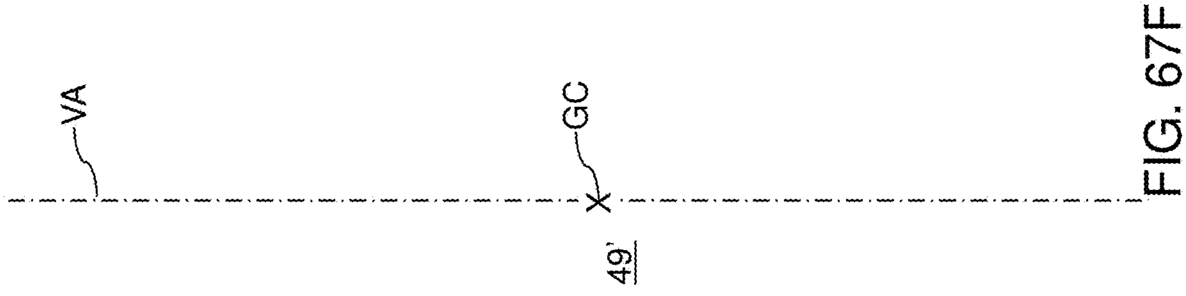
FIG. 67F
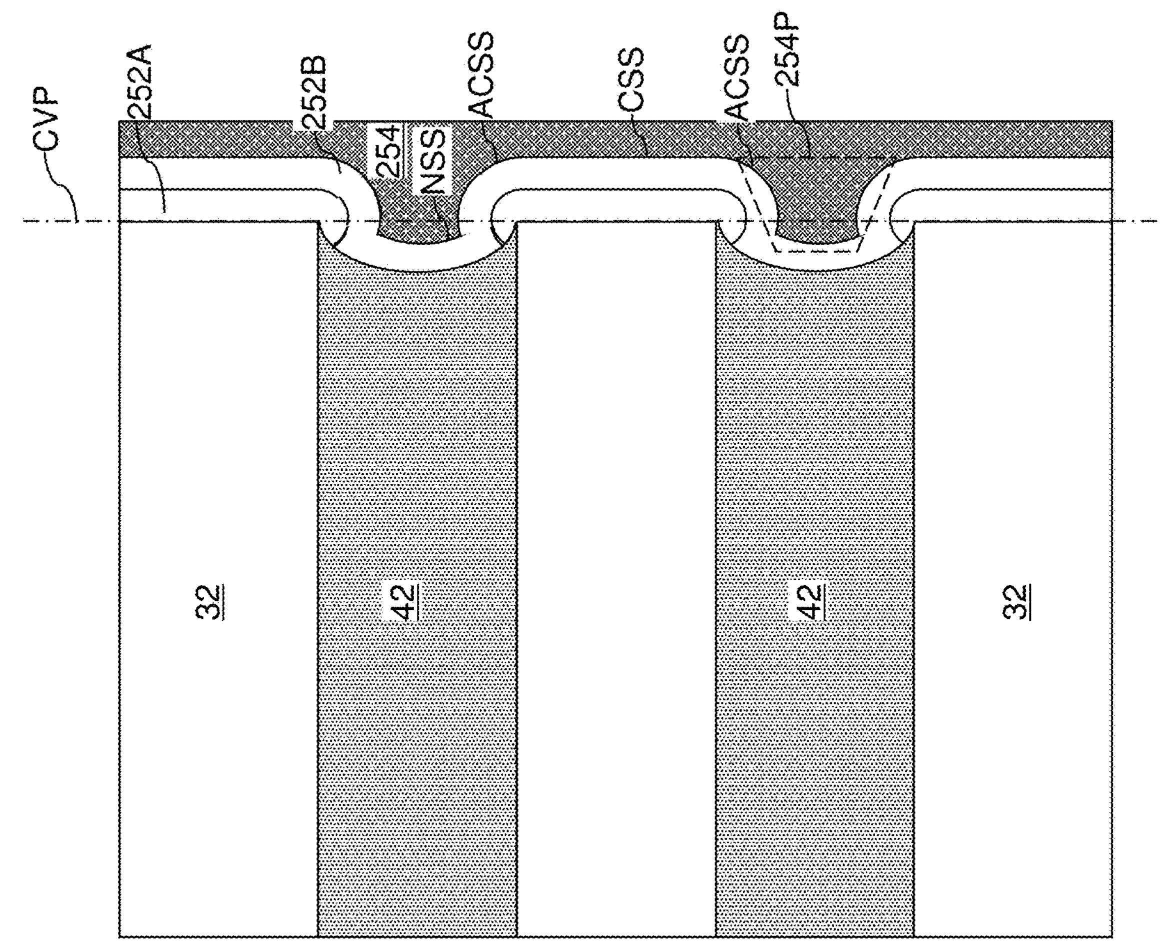

58
VA
GC
62
55
50
60
252A
252B
156
254P
254
CVP
32
43
43
32

58
VA
GC
62
55
50
60
252A
252B
254
ACSS
156
CSS
ACSS
254P
NSS
CVP
52US
52CS
52LS
46
46B
46A
32
32
32
44
46

55
50
52
154L
56
60
602
601
63
62
70
41
31
11
10
58

THREE-DIMENSIONAL MEMORY DEVICE INCLUDING DISCRETE CHARGE STORAGE ELEMENTS AND METHODS OF FORMING THE SAME

RELATED APPLICATIONS

This application is a continuation-in-part (CIP) application of U.S. application Ser. No. 18/145,275 filed on Dec. 22, 2022, which is a CIP application of U.S. application Ser. No. 17/543,987 filed on Dec. 7, 2021, which is a CIP application of U.S. application Ser. No. 17/090,420 filed on Nov. 5, 2020, which is CIP applications of U.S. application Ser. No. 16/849,600 filed on Apr. 15, 2020, the entire contents of which are incorporated herein by reference.

FIELD

The present disclosure relates generally to the field of semiconductor devices, and particularly to a three-dimensional memory device including discrete charge storage elements or width-modulated memory elements and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers; a memory opening vertically extending through the alternating stack; and a memory opening fill structure located in the memory opening and comprising a vertical stack of silicon nitride charge storage material portions, a vertical stack of annular silicon oxide material portions that is interlaced with the vertical stack of silicon nitride charge storage material portions along a vertical direction, and a vertical semiconductor channel, wherein each of the insulating layers has a horizontally-extending seam therein; and at least one of the insulating layers has an air gap that is adjoined to a respective horizontally-extending seam and laterally surrounding the memory opening fill structure.

According to another aspect of the present disclosure, a method of forming a memory device includes forming an alternating stack of disposable material layers and silicon nitride layers over a substrate, forming a memory opening through the alternating stack, forming a memory film and a vertical semiconductor channel in the memory opening, where the memory film includes a continuous silicon nitride charge storage material layer and a tunneling dielectric layer, forming a backside trench through the alternating stack, forming laterally-extending cavities by removing the disposable material layers selective to the silicon nitride layers through the backside trench, oxidizing portions of the silicon nitride layers and the continuous silicon nitride charge storage material layer exposed in the laterally-extending cavities to form silicon oxide insulating layers and to separate the continuous silicon nitride charge storage material layer into a vertical stack of discrete silicon nitride charge storage material portions, and replacing remaining portions of the silicon nitride layers with electrically conductive layers.

According to an aspect of the present disclosure, a memory device is provided, which comprises: an alternating stack of insulating layers and electrically conductive layers; a memory opening vertically extending through the alternating stack; and a memory opening fill structure located in the memory opening and comprising a vertical semiconductor channel and a memory film, wherein the memory film comprises a memory material layer having a straight inner cylindrical sidewall that vertically extends through a plurality of electrically conductive layers within the alternating stack without lateral undulation and a laterally-undulating outer sidewall having outward lateral protrusions at levels of the plurality of electrically conductive layers.

According to another aspect of the present disclosure, a method of forming a memory device comprises: forming an alternating stack of insulating layers and sacrificial material layers over a substrate; forming a memory opening through the alternating stack; selectively forming a vertical stack of tubular insulating spacers on surfaces of the insulating layers around the memory opening by performing a selective deposition process; forming a memory material layer over the vertical stack of tubular insulating spacers, wherein the memory material layer is formed with a straight inner cylindrical sidewall that vertically extends through the alternating stack without lateral undulation and a laterally-undulating outer sidewall having outward lateral protrusions at levels of the sacrificial material layers; forming a vertical semiconductor channel over the memory material layer; and replacing the sacrificial material layers with material portions comprising electrically conductive layers.

According to an aspect of the present disclosure, a memory device is provided, which comprises: an alternating stack of insulating layers and electrically conductive layers; a memory opening vertically extending through the alternating stack; and a memory opening fill structure located in the memory opening and comprising a vertical semiconductor channel and a memory film, wherein the memory film comprises a tunneling dielectric layer located in contact with the vertical semiconductor channel, and a vertical stack of charge storage material portions that are vertically spaced apart from each other by lateral protrusion portions of a subset of the insulating layers.

According to another aspect of the present disclosure, a method of forming a memory device is provided, which comprises: forming an alternating stack of spacer material layers and electrically conductive layers over a substrate, wherein the spacer material layers are formed as, or are subsequently replaced with, insulating layers; forming a memory openings through the alternating stack employing an anisotropic etch process that converts surface portions of the electrically conductive layers into metal oxide portions; forming annular cavities around the memory openings by at least partially removing the metal oxide portions; forming a contoured blocking dielectric layer at peripheral regions of the annular cavities and on sidewalls of the spacer material layers around the memory opening; forming a vertical stack of charge storage material portions over the contoured blocking dielectric layer; and forming a tunneling dielectric layer and a vertical semiconductor channel over the vertical stack of charge storage material portions.

According to an aspect of the present disclosure, a three-dimensional memory device is provided, which comprises: an alternating stack of insulating layers and electrically conductive layers located over a substrate; memory openings vertically extending through the alternating stack; and memory opening fill structures located in the memory openings, wherein: each of the memory opening fill structures comprises a vertical semiconductor channel and a memory film; and the memory film comprises a tunneling dielectric layer and a vertical stack of discrete charge storage elements that are vertically spaced apart from each other by lateral protrusion portions of a subset of the insulating layers.

According to another aspect of the present disclosure, a method of forming a three-dimensional memory device is provided, which comprises: forming an alternating stack of disposable material layers and silicon nitride layers over a substrate; forming memory openings through the alternating stack; forming memory opening fill structures in the memory openings, wherein each of the memory opening fill structures comprises a charge storage material layer, a tunneling dielectric layer, and a vertical semiconductor channel; forming laterally-extending cavities by removing the disposable material layers selective to the silicon nitride layers and the memory opening fill structures; and forming insulating layers comprising silicon oxide by performing an oxidation process that oxidizes surface portions of the silicon nitride layers and portions of the charge storage material layers that are proximal to the laterally-extending cavities, wherein remaining portions of the charge storage material layers form a vertical stack of discrete charge storage elements in each of the memory opening fill structures; and replacing remaining portions of the silicon nitride layers with replacement material portions that comprise electrically conductive layers.

According to an aspect of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layer; forming a memory opening through the alternating stack; forming annular lateral recesses at levels of the insulating layers by laterally recessing sidewalls of the insulating layers relative to sidewalls of the spacer material layers around the memory opening; forming a vertical stack of discrete metal portions in the annular lateral recesses; forming a semiconductor material layer on the vertical stack of the metal portions; forming a vertical stack of metal-semiconductor alloy portions by reacting the vertical stack of metal portions with portions of the semiconductor material layer located at levels of the insulating layers; removing the vertical stack of metal-semiconductor alloy portions selective to unreacted portions of the semiconductor material layer, wherein unreacted portions of the semiconductor material layer remain at levels of the spacer material layers and comprise a vertical stack of discrete semiconductor material portions; and forming a tunneling dielectric layer and a vertical semiconductor channel in the memory opening.

According to another aspect of the present disclosure, a three-dimensional memory device is provided, which comprises: an alternating stack of insulating layers and electrically conductive layers located over a substrate; a memory opening vertically extending through the alternating stack, wherein the memory opening has laterally-protruding portions that extend outward at each level of the insulating layers; and a memory opening fill structure located in the memory opening and comprising, from outside to inside, a blocking dielectric layer, charge storage structures comprising a vertical stack of discrete semiconductor material portions and at least one silicon nitride material portion in contact with the vertical stack, a tunneling dielectric layer in contact with the charge storage structures, and a vertical semiconductor channel.

According to yet another aspect of the present disclosure, a three-dimensional memory device is provided, which comprises: an alternating stack of insulating layers and electrically conductive layers located over a substrate; a memory opening vertically extending through the alternating stack, wherein the memory opening has laterally-protruding portions that extend outward at levels of the insulating layers; and a memory opening fill structure located in the memory opening and comprising, from outside to inside, a blocking dielectric layer, a vertical stack of discrete charge storage material portions, a tunneling dielectric layer, and a vertical semiconductor channel, wherein each charge storage material portion comprises a tubular portion located at a level of a respective one of the electrically material layers, an upper flange portion laterally extending outward from an upper end of an outer sidewall of the tubular portion, and a lower flange portion laterally extending outward from a lower end of the outer sidewall of the tubular portion.

According to still another aspect of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layer; forming a memory opening through the alternating stack; forming annular lateral recesses at levels of the insulating layers by laterally recessing sidewalls of the insulating layers relative to sidewalls of the spacer material layers around the memory opening; forming a vertical stack of discrete metal portions in the annular lateral recesses; forming a semiconductor material layer on the vertical stack of the metal portions; removing the vertical stack of discrete metal portions and portions of the semiconductor material layer that are adjacent to the vertical stack of discrete metal portions, wherein remaining portions of the semiconductor material layer comprise a vertical stack of semiconductor material portions, and each of the semiconductor material portions comprises a tubular portion, an upper flange portion laterally extending outward from an upper end of an outer sidewall of the tubular portion, and a lower flange portion laterally extending outward from a lower end of the outer sidewall of the tubular portion; and forming a tunneling dielectric layer and a vertical semiconductor channel in the memory opening.

According to another aspect of the present disclosure, a three-dimensional memory device is provided, which comprises: an alternating stack of insulating layers and electrically conductive layers located over a substrate; a memory opening vertically extending through the alternating stack, wherein the memory opening has laterally-protruding portions that extend outward at levels of the insulating layers; and a memory opening fill structure located in the memory opening and comprising, from outside to inside, a blocking dielectric layer, a vertical stack of charge storage material portions, a tunneling dielectric layer, and a vertical semiconductor channel, and a vertical stack of discrete annular insulating material portions located at the levels of the insulating layers between the blocking dielectric layer and the tunneling dielectric layer.

BRIEF DESCRIPTION OF THE DRAWINGS

FIGS. 63A-63G are sequential vertical cross-sectional views of a region around a memory opening during formation of a memory opening fill structure in a sixth exemplary structure according to a sixth embodiment of the present disclosure.

FIGS. 65A-65G are sequential vertical cross-sectional views of a region around a first alternative configuration of a memory opening during formation of a memory opening fill structure in a sixth exemplary structure according to the sixth embodiment of the present disclosure.

FIGS. 67A-67G are sequential vertical cross-sectional views of a region around a second alternative configuration of a memory opening during formation of a memory opening fill structure in a sixth exemplary structure according to the sixth embodiment of the present disclosure.

DETAILED DESCRIPTION

Figure 1:
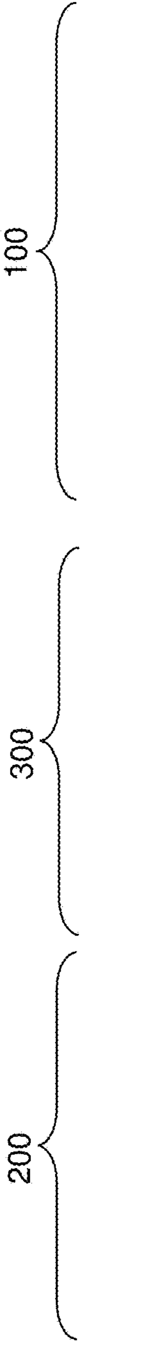
FIG. 1 is a schematic vertical cross-sectional view of a first exemplary structure after formation of at least one peripheral device and a semiconductor material layer according to a first embodiment of the present disclosure.
Figure 1:
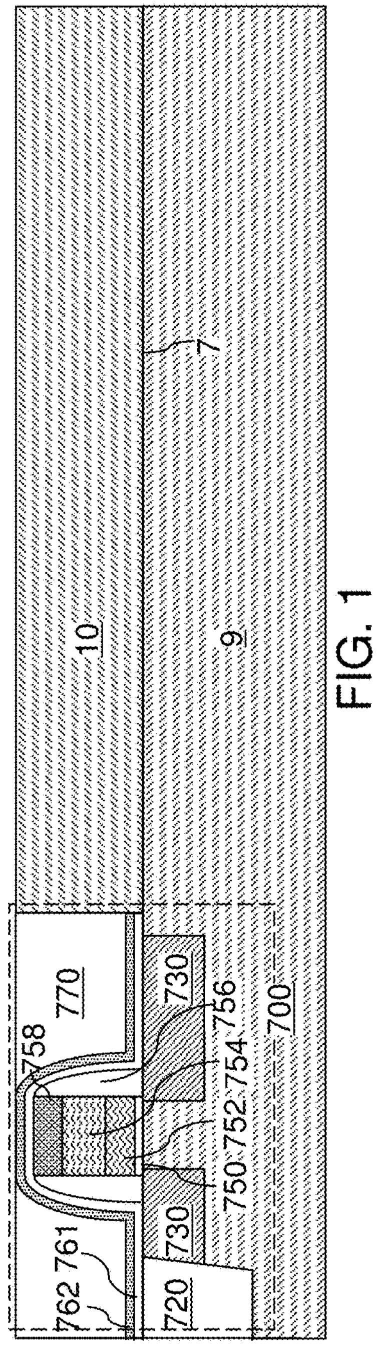

As discussed above, the present disclosure is directed to a three-dimensional memory device including discrete charge storage elements or width-modulated memory elements and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, there above, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a lower substrate semiconductor layer 9 and an optional upper substrate semiconductor layer 10. The lower substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the lower substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the lower substrate semiconductor layer 9. The at least one semiconductor device can include, for example, field effect transistors. For example, at least one shallow trench isolation structure 720 can be formed by etching portions of the lower substrate semiconductor layer 9 and depositing a dielectric material therein. A gate dielectric layer, at least one gate conductor layer, and a gate cap dielectric layer can be formed over the lower substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the lower substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the lower substrate semiconductor layer 9. As used herein, a surface is "physically exposed" if the surface is in physical contact with vacuum, or a gas phase material (such as air).

The optional upper substrate semiconductor layer 10, if present, can be formed on the top surface of the lower substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the lower substrate semiconductor layer 9. The deposited semiconductor material can be any material that can be employed for the lower substrate semiconductor layer 9 as described above. The single crystalline semiconductor material of the upper substrate semiconductor layer 10 can be in epitaxial alignment with the single crystalline structure of the lower substrate semiconductor layer 9. Portions of the deposited semiconductor material located above the top surface of the planarization dielectric layer 770 can be removed, for example, by chemical mechanical planarization (CMP). In this case, the upper substrate semiconductor layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

In one alternative embodiment, the peripheral device region 200 may be located under the memory array region 100 in a CMOS under array configuration. In another alternative embodiment, the peripheral device region 200 may be located on a separate substrate which is subsequently bonded to the memory array region 100.

Figure 2:
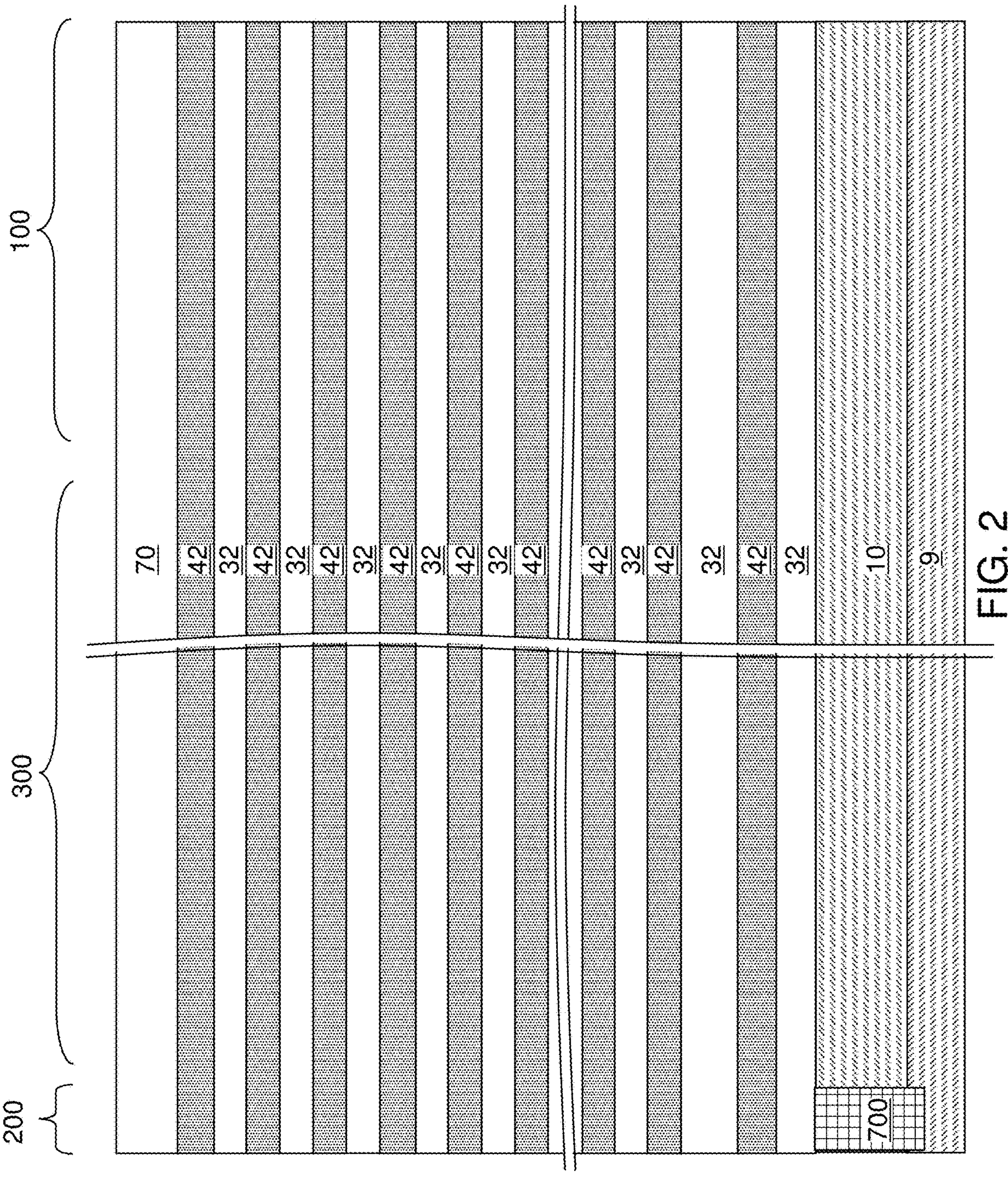
FIG. 2 is a schematic vertical cross-sectional view of the first exemplary structure after formation of an alternating stack of insulating layers and sacrificial material layers according to a first embodiment of the present disclosure.

Referring to FIG. 2, a stack of an alternating plurality of insulating layers 32 and spacer material layers (which can be sacrificial material layers 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of insulating layers 32 and spacer material layers may begin with a bottommost insulating layer 32 or with a bottommost spacer material layer, and may end with a topmost insulating layer 32 or with a topmost spacer material layer. In one embodiment, an instance of the first elements and an instance of the second elements may form a unit that is repeated with periodicity within the alternating plurality.

Generally, the spacer material layers may be formed as, or may be subsequently replaced with, electrically conductive layers. In case the spacer material layers are subsequently replaced with the electrically conductive layers, the spacer material layers are formed as sacrificial material layers 42. Alternatively, if the spacer material layers are formed as electrically conductive layers, replacement of the spacer material layers with other material layers is unnecessary. While the present disclosure is described employing an embodiment in which the spacer material layers are formed as sacrificial material layers 42 that are subsequently replaced with electrically conductive layers, embodiments are expressly contemplated herein in which the sacrificial material layers are formed as electrically conductive layers. In such cases, processing steps for replacing the sacrificial material layers 42 with electrically conductive layers are omitted.

The stack of the alternating plurality of the insulating layers 32 and the spacer material layers (such as the sacrificial material layers 42) is herein referred to as an alternating stack (32, 42). Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating material of the insulating layers 32 can be silicon oxide.

The spacer material of the sacrificial material layers 42 includes a sacrificial material that can be removed selective to the insulating material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The spacer material of the sacrificial material layers 42 can be subsequently replaced with electrically conductive electrodes which can function, for example, as control gate electrodes of a vertical NAND device. Non-limiting examples of the spacer material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The insulating material of the insulating layers 32 can be deposited, for example, by plasma enhanced chemical vapor deposition (PECVD). For example, if silicon oxide is employed for the insulating layers 32, tetraethyl orthosilicate (TEOS) can be employed as the precursor material for the PECVD process. The spacer material of the sacrificial material layers 42 can be formed, for example, by thermal CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42. Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
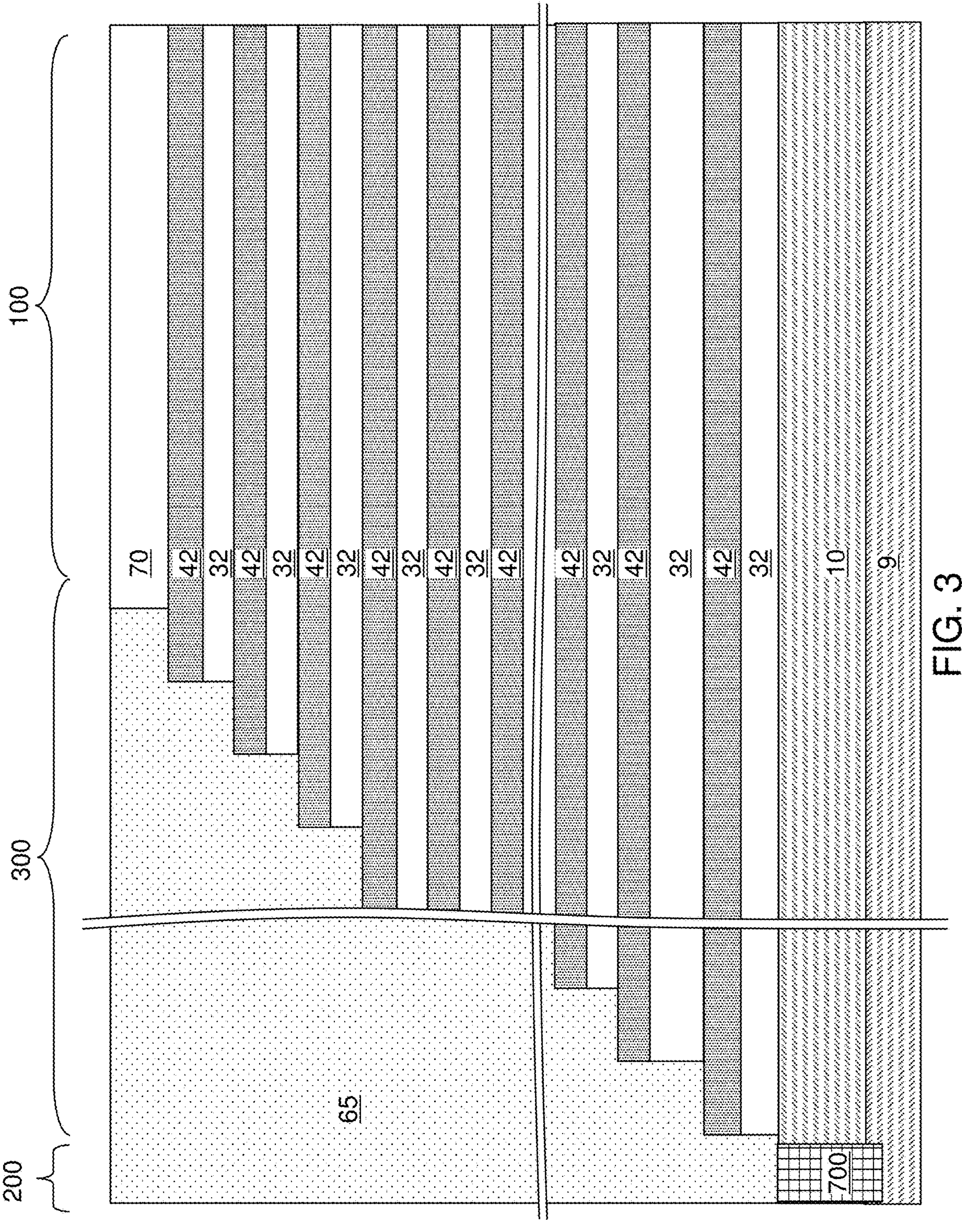
FIG. 3 is a schematic vertical cross-sectional view of the first exemplary structure after formation of stepped terraces and a retro-stepped dielectric material portion according to a first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 (FIG. 4A) can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
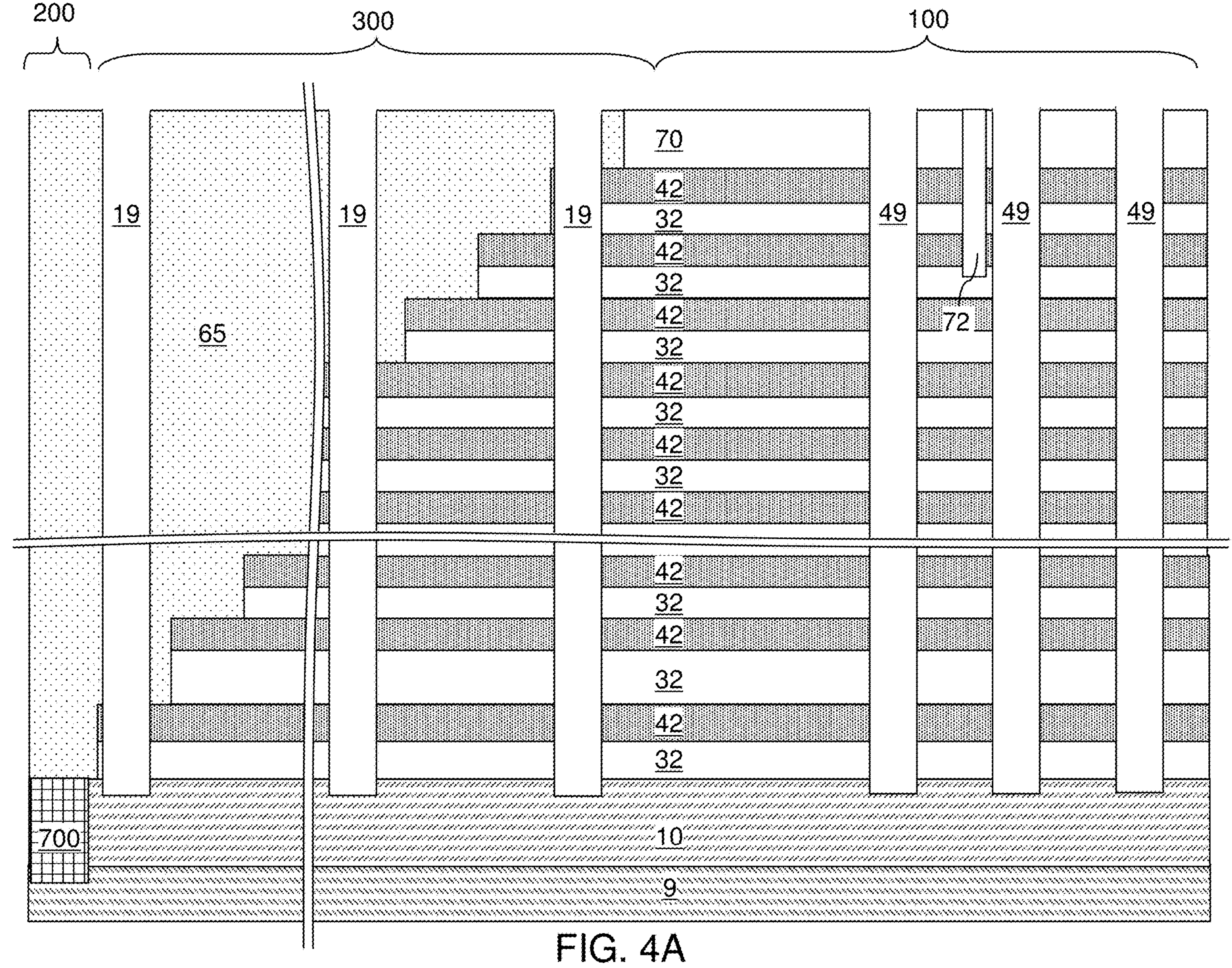
FIG. 4A is a schematic vertical cross-sectional view of the first exemplary structure after formation of memory openings and support openings according to a first embodiment of the present disclosure.
Figure 4B:
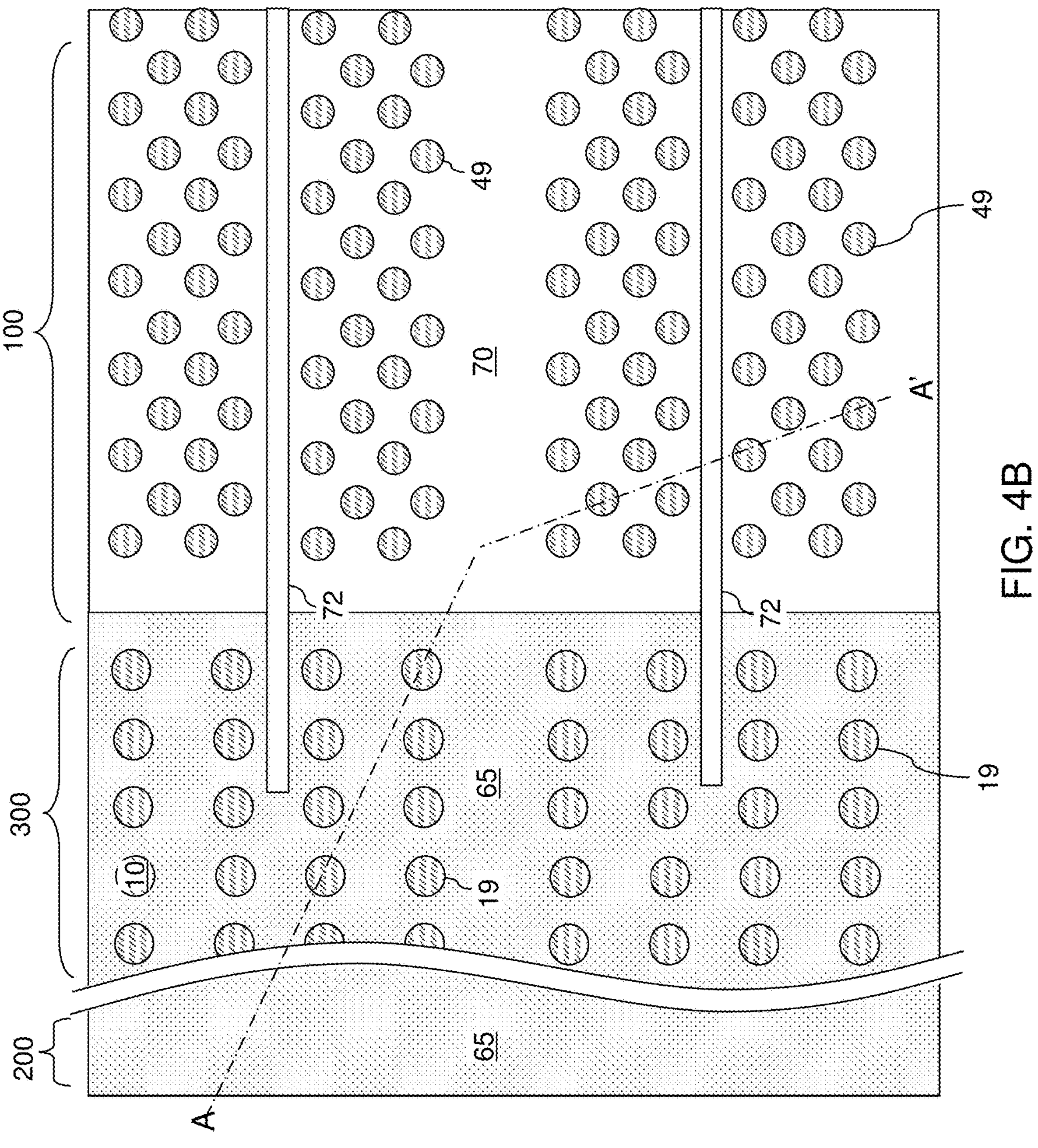
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the upper substrate semiconductor layer 10. In one embodiment, an overetch into the upper substrate semiconductor layer 10 may be optionally performed after the top surface of the upper substrate semiconductor layer 10 is physically exposed at a bottom of each memory opening 49 and each support opening 19. The overetch may be performed prior to, or after, removal of the lithographic material stack. In other words, the recessed surfaces of the upper substrate semiconductor layer 10 may be vertically offset from the un-recessed top surfaces of the upper substrate semiconductor layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the upper substrate semiconductor layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The lower substrate semiconductor layer 9 and the upper substrate semiconductor layer 10 collectively constitutes a substrate (9, 10), which can be a semiconductor substrate. Alternatively, the upper substrate semiconductor layer 10 may be omitted, and the memory openings 49 and the support openings 19 can be extend to a top surface of the lower substrate semiconductor layer 9.

Figures 5A, 5B:
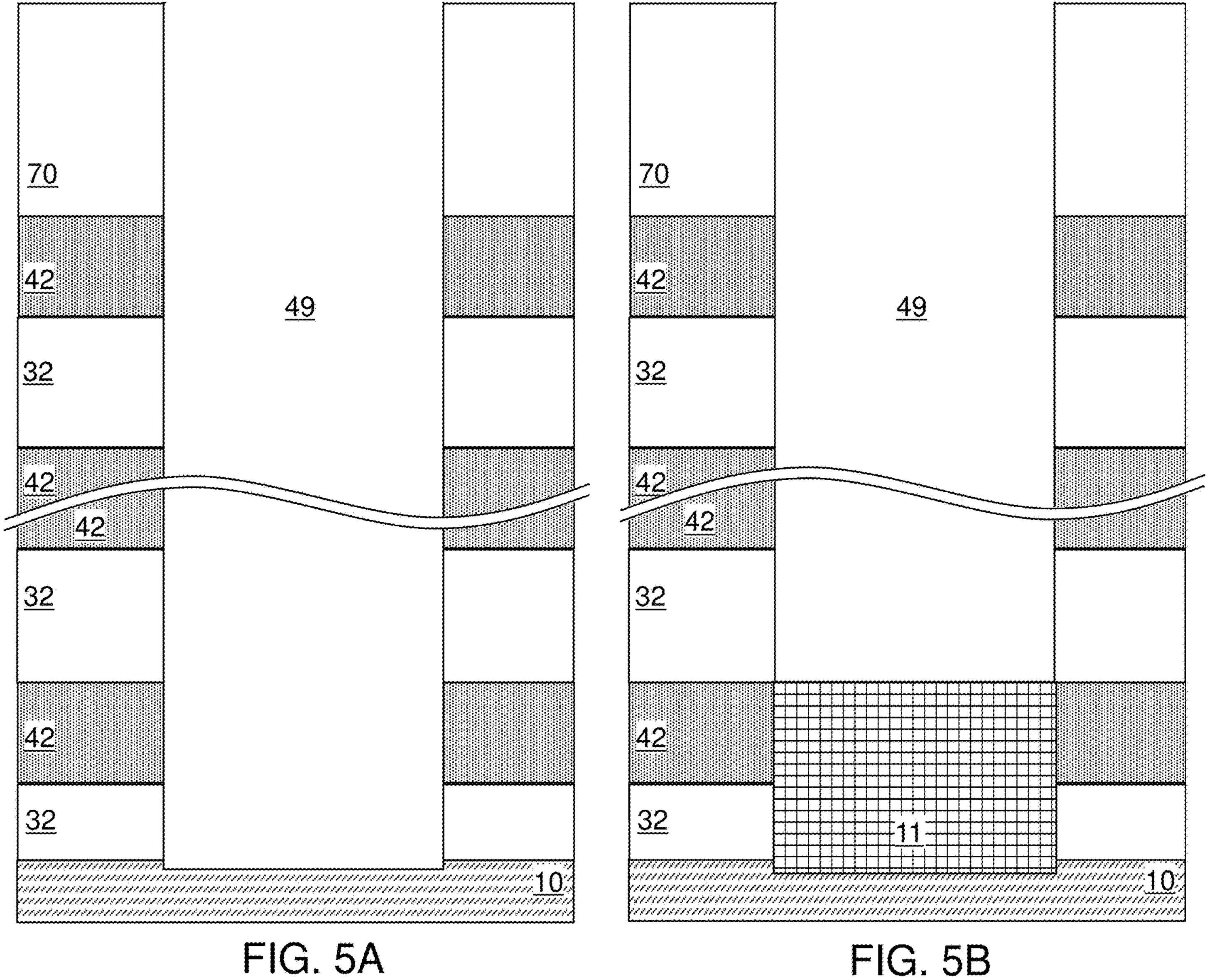
FIGS. 5A-5P are sequential schematic vertical cross-sectional views of a memory opening within the first exemplary structure during formation of a first exemplary memory opening fill structure according to a first embodiment of the present disclosure.
Figures 5C, 5D:
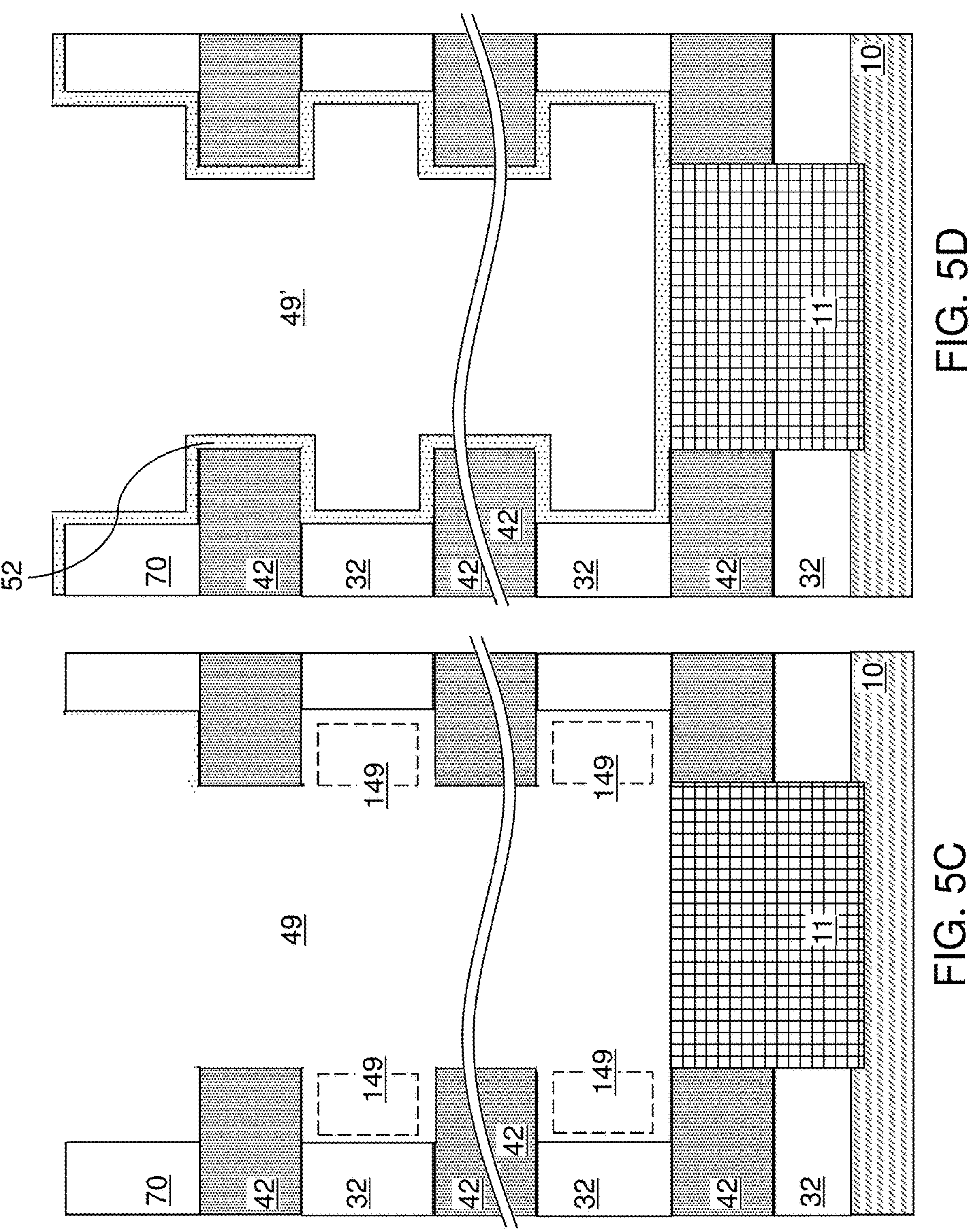
FIGS. 5Q and 5R are sequential schematic vertical cross-sectional views of a memory opening during formation of an alternative configuration of the first exemplary memory opening fill structure according to a first embodiment of the present disclosure.
Figures 5E, 5F:
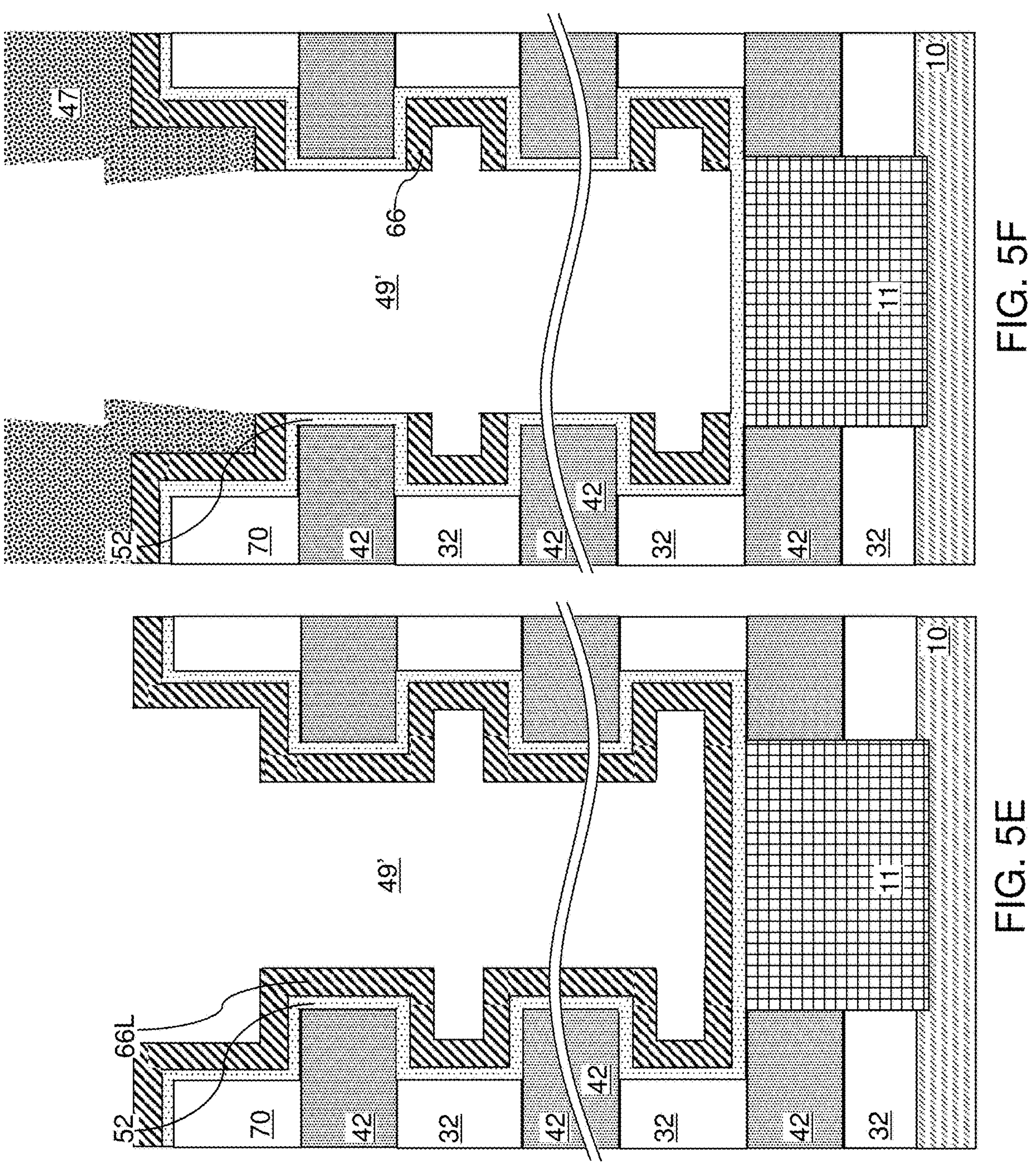
Figures 5G, 5H:
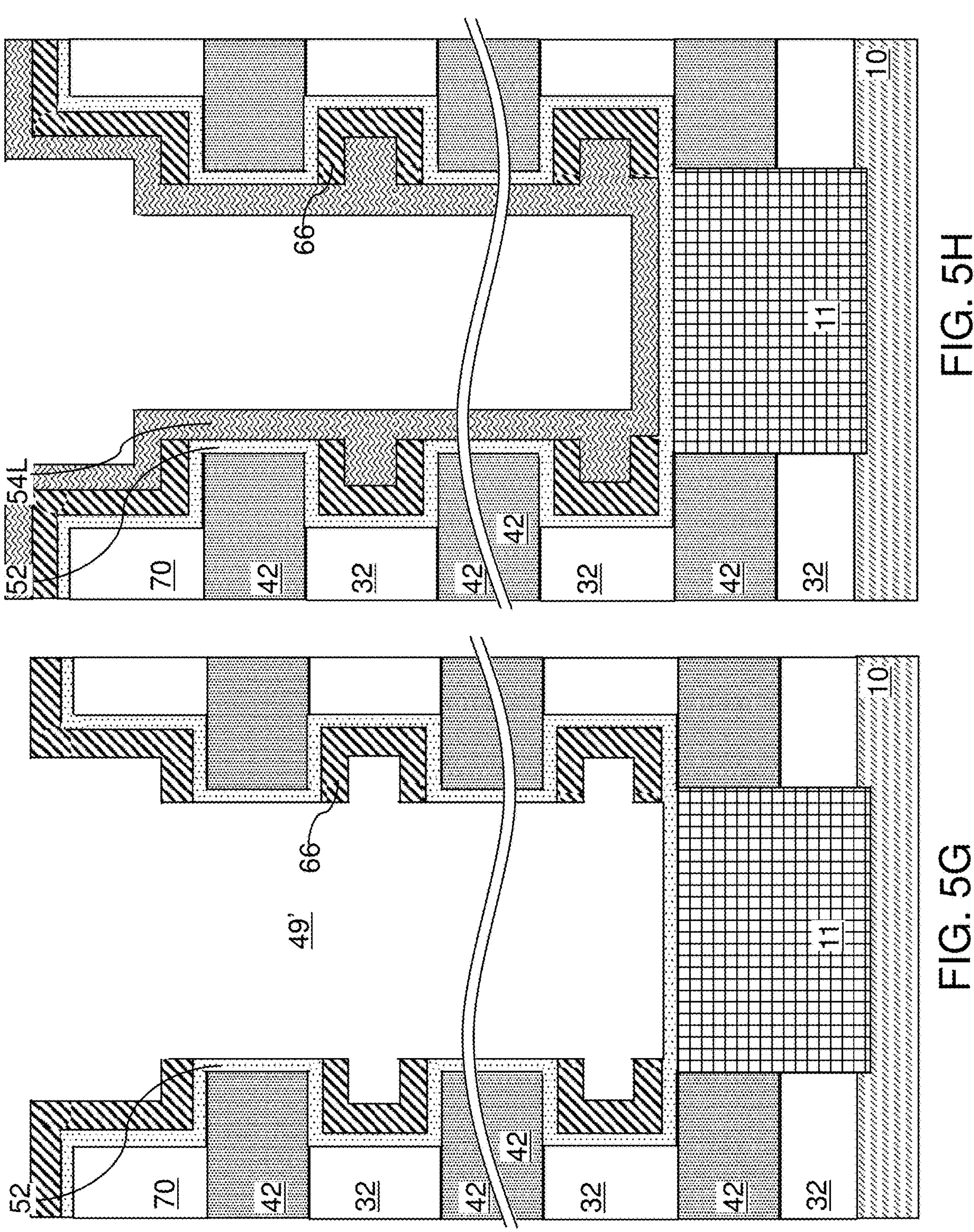
Figures 5I, 5J:
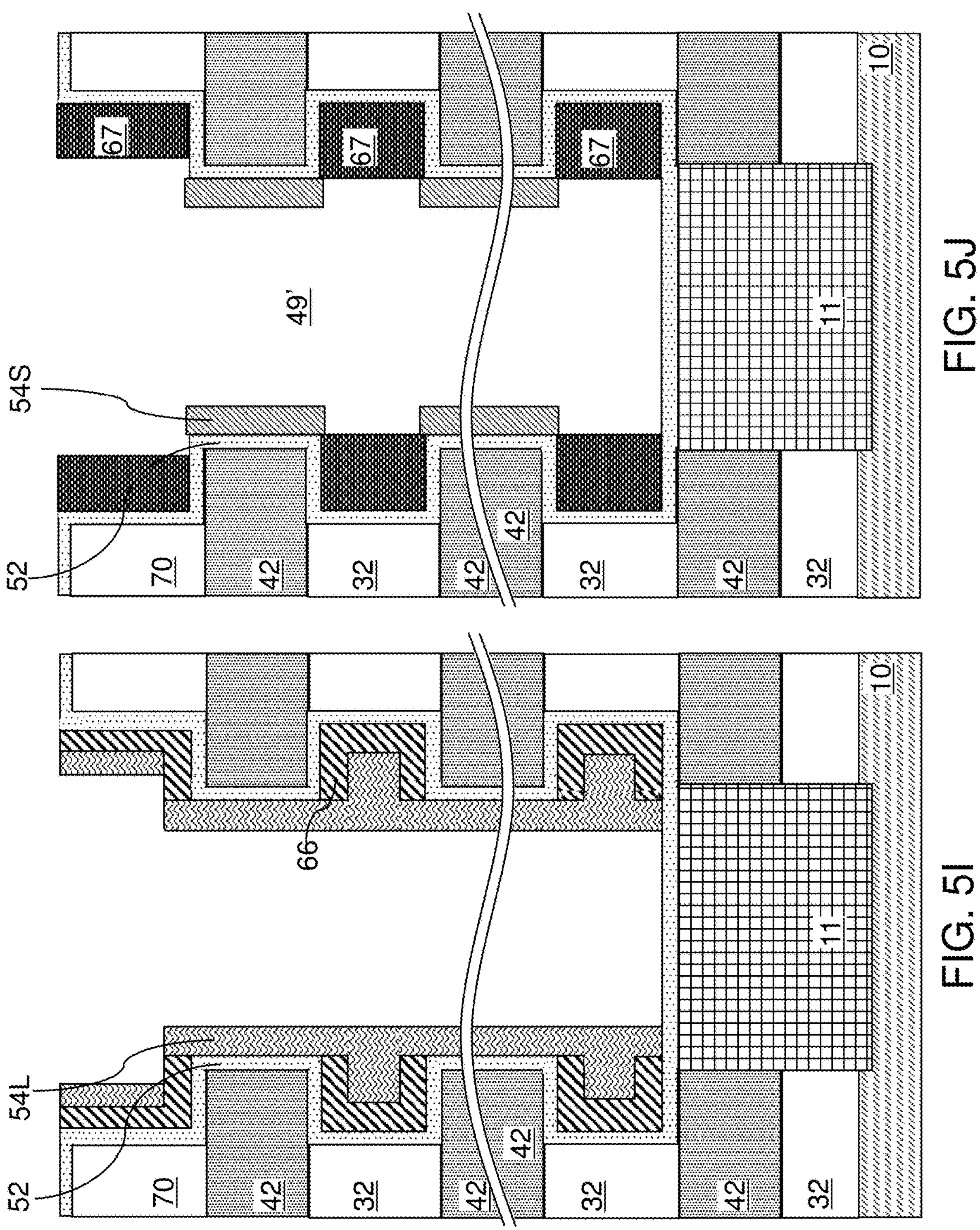
Figures 5K, 5L:
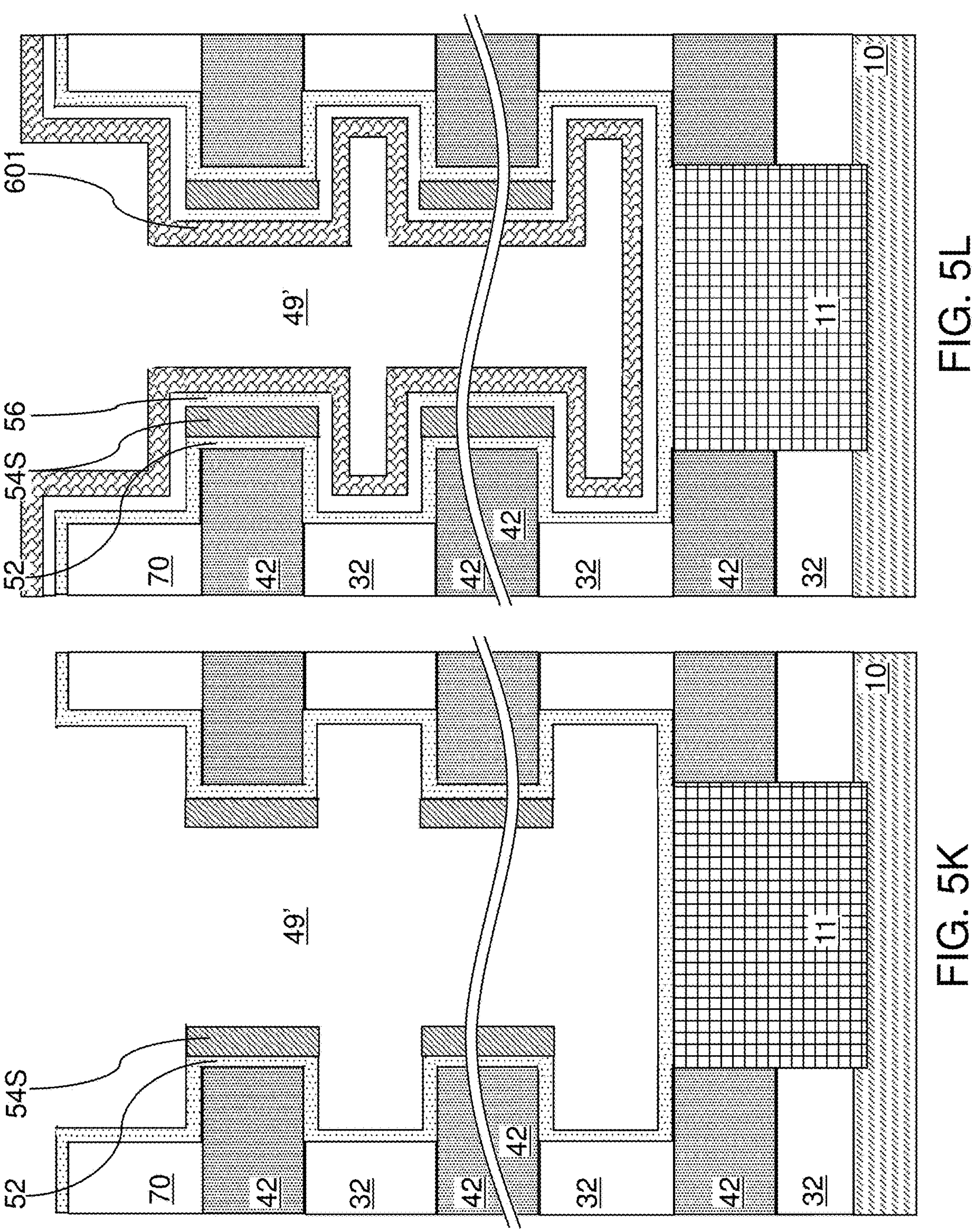
Figures 5M, 5N:
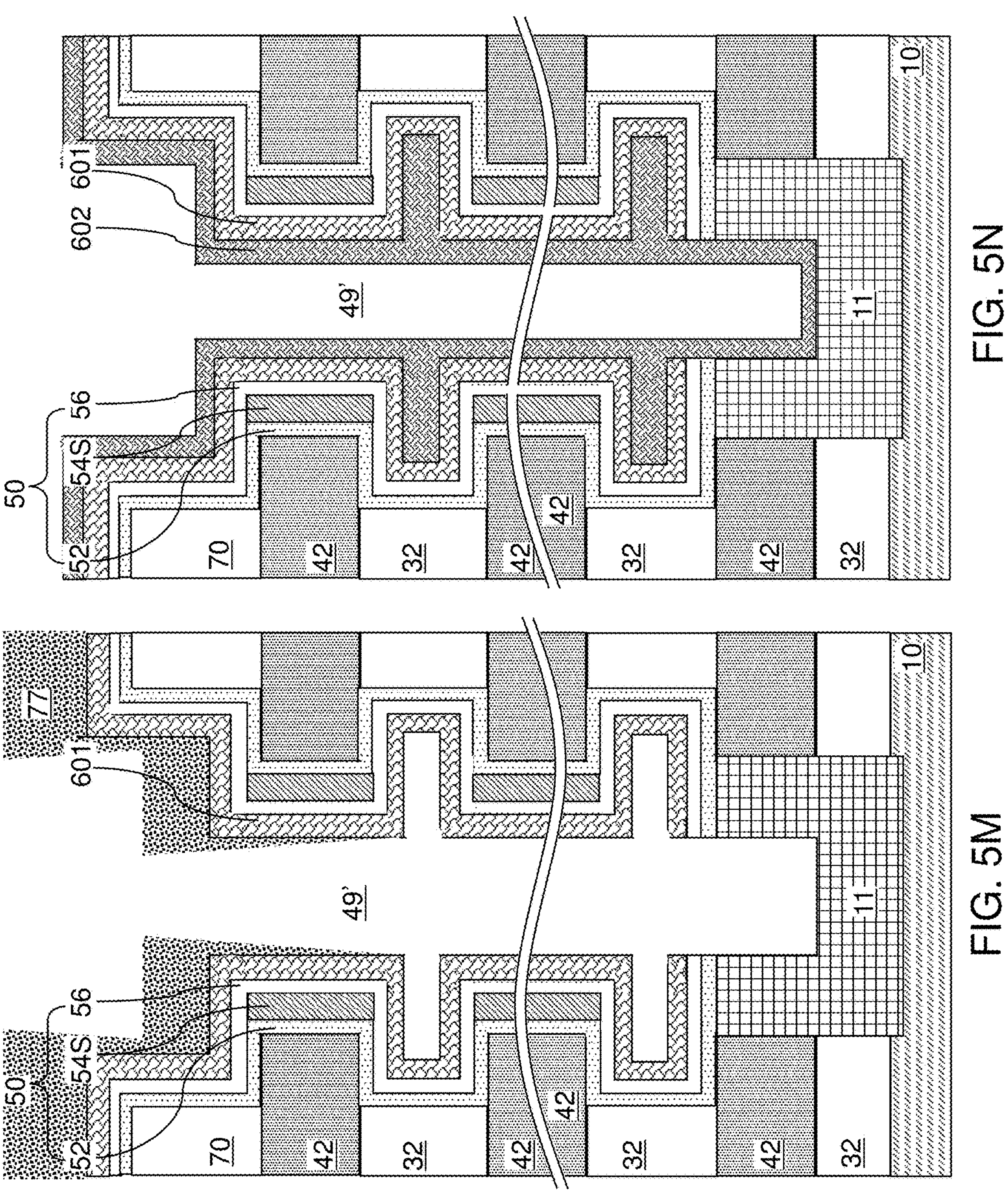
Figures 5O, 5P:
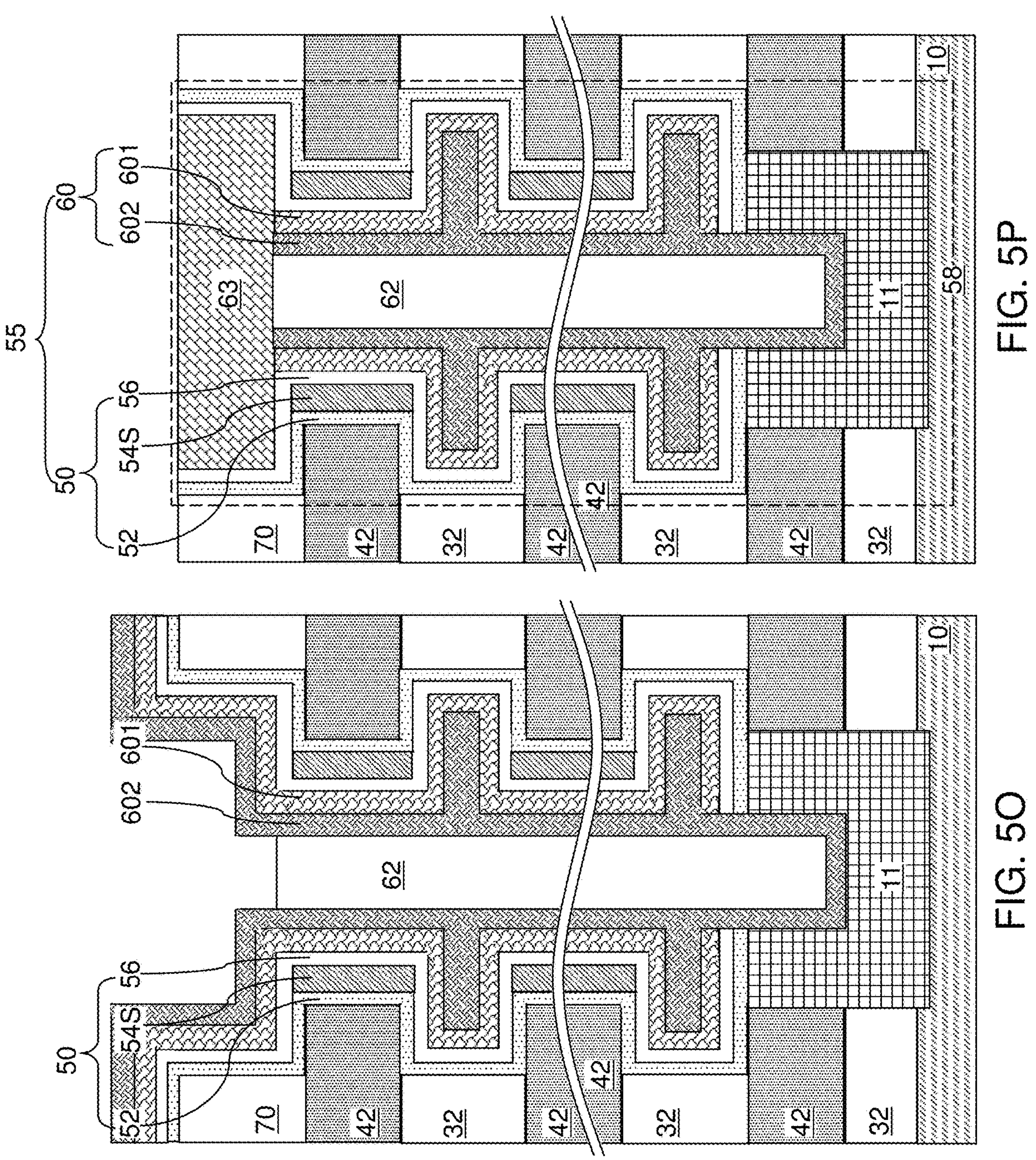

FIGS. 5A-5P illustrate structural changes in a memory opening 49 during formation of a first exemplary memory opening fill structure. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the upper substrate semiconductor layer 10. At this processing step, each support opening 19 can extend through the retro-stepped dielectric material portion 65, a subset of layers in the alternating stack (32, 42), and optionally through the upper portion of the upper substrate semiconductor layer 10. The recess depth of the bottom surface of each memory opening with respect to the top surface of the upper substrate semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the upper substrate semiconductor layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' (FIG. 5D) is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the upper substrate semiconductor layer 10 that the pedestal channel portion contacts. If an upper substrate semiconductor layer 10 is not present, the pedestal channel portion 11 can be formed directly on the lower substrate semiconductor layer 9, which can have a doping of the first conductivity type.

Referring to FIG. 5C, annular lateral recesses 149 can be formed at levels of the insulating layers 32 that are not masked by the pedestal channel portion 11. An additional annular lateral recess can be formed at the level of the insulating cap layer 70 around the memory opening 49. The annular lateral recesses 149 can be formed by laterally recessing sidewalls of the insulating layers 32 relative to sidewalls of the spacer material layers (such as the sacrificial material layers 42) around the memory opening 49. An isotropic etch process that etches the material of the insulating layers 32 selective to the material of the spacer material layers can be performed to laterally recess the physically exposed sidewalls of the insulating layers 32 relative to sidewalls of the spacer material layers (such as the sacrificial material layers). In one embodiment, the physically exposed surfaces of the insulating cap layer 70 may be isotropically recessed concurrently with formation of the annular lateral recesses 149. In an illustrative example, the insulating layers 32 include silicon oxide, the spacer material layers 42 include silicon nitride or a semiconductor material (such as polysilicon), and the isotropic etch process comprises a wet etch process employing dilute hydrofluoric acid.

The duration of the isotropic etch process can be selected such that the lateral recess distance of the annular lateral recesses 149 can be in a range from 5 nm to 100 nm, such as from 10 nm to 50 nm, although lesser and greater lateral recess distances can also be employed. The lateral recess distance refers to the lateral distance between a recessed sidewall of an insulating layer 32 relative to a sidewall of an immediately overlying spacer material layer (such as an immediately overlying sacrificial material layer 42) or relative to a sidewall of an immediately underlying spacer material layer. Each annular lateral recess 149 can have a volume of an annular cylinder, and is a portion of the memory opening 49. Thus, the memory opening 49 includes a vertical stack of annular lateral recesses 149 provided at levels of the insulating layers 32.

Referring to FIG. 5D, a blocking dielectric layer 52 can be conformally deposited on physically exposed surfaces of the insulating layers 32 and the spacer material layers (such as the sacrificial material layers 42). The blocking dielectric layer 52 can be deposited on the sidewalls of the insulating layers 32, annular horizontal surfaces of the insulating layers 32 overlying or underlying a respective one of the annular lateral recesses 149, sidewalls of the sacrificial material layers 42, a bottom surface of the memory opening 49 (which may be a top surface of a pedestal channel portion 11 or a top surface of the upper substrate semiconductor layer 10 if a pedestal channel portion is not employed), and physically exposed surfaces of the insulating cap layer 70.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

The blocking dielectric layer 52 has a laterally-undulating vertical cross-sectional profile, and comprises laterally-protruding portions that laterally extend into the annular lateral recesses 149. The laterally-protruding portions of the blocking dielectric layer 52 can be located at the levels of the insulating layers 32. Outer sidewalls of the laterally-protruding portions of the blocking dielectric layer 52 contact sidewalls of the insulating layers 32, and annular horizontal surfaces of the laterally-protruding portions of the blocking dielectric layer 52 contact annular horizontal surfaces of the spacer material layers (such as the sacrificial material layers 42).

Referring to FIG. 5E, a metal layer 66L can be conformally deposited on the inner sidewalls of the blocking dielectric layer. The metal layer 66L can include any metal that can form a metal-semiconductor alloy such as a metal silicide. In one embodiment, the metal layer 66L can include at least one transition metal that can form a metal silicide. For example, the metal layer 66L can include tungsten, titanium, cobalt, molybdenum, platinum, nickel, and/or any other transition metal that forms a metal silicide upon reaction with silicon. The metal layer 66L can be deposited by a conformal deposition method such as a chemical vapor deposition process or an atomic layer deposition process. The thickness of the metal layer 66L can be in a range from 2 nm to 20 nm, such as from 4 nm to 10 nm, although lesser and greater thicknesses can also be employed. The thickness of the metal layer 66L may be less than, equal to, or greater than one half of the thickness of each insulating layer 32. Thus, the annular lateral recesses 149 may, or may not, have unfilled volumes after formation of the metal layer 66L.

Referring to FIG. 5F, an optional patterning film 47 can be anisotropically deposited to cover the insulating cap layer 70 and the topmost laterally-protruding portion of the metal layer 66L that overlies the topmost spacer material layer (such as the topmost sacrificial material layer 42). The patterning film 47 is deposited with high directionality, and thus, has a significantly greater thickness above the insulating cap layer 70 than at the bottom horizontal surface of the memory opening 49 (which may be the top surface of the pedestal channel portion 11). The patterning film 47 may be a film including amorphous carbon as a predominant component. For example, Advanced Patterning Film™ by Applied Materials Inc.™ may be employed for the patterning film 47. Alternatively, the patterning film 47 can be omitted.

Portions of the metal layer located 66L outside the annular lateral recesses 149 can be anisotropically etched by performing an anisotropic etch process. The anisotropic etch process can employ an etch chemistry that etches the material of the metal layer 66L selective to the patterning film 47 (if present), selective to the material of the spacer material layers 42, and selective to the material of the blocking dielectric layer 52 and/or to the material of the pedestal channel portion 11. The anisotropic etch process can employ a reactive ion etch process. Remaining portions of the metal layer 66L comprise the vertical stack of discrete metal portions 66. The discrete metal portions 66 can be formed within a respective one of the annular lateral recesses 149 of the memory opening 49. Thus, the vertical stack of discrete metal portions 66 can be formed in the annular lateral recesses 149. The vertical stack of discrete metal portions 66 is formed directly on portions of an inner sidewall of the blocking dielectric layer 52 located at levels of the insulating layers 32.

The discrete metal portions 66 may have a C-shaped (e.g., clam shaped) vertical cross-sectional profile having vertical portion connecting two horizontal portions if the thickness of the metal layer 66L is less than one half of the thickness of each insulating layer 32, or may have a rectangular vertical cross-sectional profile if the thickness of the metal layer 66L is greater than one half of the thickness of each insulating layer 32. In one embodiment, the discrete metal portion 66 can comprise, and/or can consist essentially of, tungsten, titanium, cobalt, molybdenum, platinum, nickel, and/or any other transition metal that forms a metal silicide upon reaction with silicon.

Referring to FIG. 5G, the patterning film 47 (if present) can be subsequently removed, for example, by ashing. If the patterning film 47 is omitted, then the discrete metal portion 66 at the level of the insulating cap layer 70 is also not present because it would be removed during the anisotropic etch process shown in FIG. 5F.

Referring to FIG. 5H, a semiconductor material layer 54L can be conformally deposited on the physically exposed surfaces of the vertical stack of the metal portions 66 and on the physically exposed surfaces of the blocking dielectric layer 52. The semiconductor material layer 54L includes a semiconductor material that can form a metal-semiconductor alloy with the material of the metal portions 66. For example, the semiconductor material layer 54L can include silicon and/or germanium. In one embodiment, the semiconductor material layer 54L can include amorphous silicon, polysilicon, germanium, and/or a silicon-germanium alloy. The thickness of the semiconductor material layer 54L can be selected such that the entirety of the vertical stack of discrete metal portions 66 can react with the semiconductor material of the semiconductor material layer 54L during a subsequent anneal process. In one embodiment, the semiconductor material layer 54L can have a thickness in a range from 2 nm to 20 nm, such as from 4 nm to 10 nm, although lesser and greater thicknesses can also be employed.

Referring to FIG. 5I, an anisotropic etch process can be performed to remove horizontal portions of the semiconductor material layer 54L and the metal layer 66L (if present) that overlie the insulating cap layer 70, and to remove a horizontal portion of the semiconductor material layer 54L located at the bottom of the memory opening 49 (such as the horizontal portion of the semiconductor material layer 54L located above the pedestal channel portion 11).

Referring to FIG. 5J, a thermal anneal process is performed at an elevated temperature that induces formation of a metal-semiconductor alloy between the material of the metal portions 66 and the material of the semiconductor material layer 54L. The elevated temperature may be in a range from 400 degrees Celsius to 1,000 degrees Celsius, although lower and higher temperatures may also be employed depending on the composition of the metal-semiconductor alloy. It is not necessary to form a low-resistance phase metal-semiconductor alloy as required for typical semiconductor applications in this case. Even high-resistance intermediate phase metal-semiconductor alloys formed at a relatively low temperature are sufficient provided that such metal-semiconductor alloys can be subsequently removed selective to unreacted portions of the semiconductor material layer 54L in a selective etch process. Generally, the thickness of the metal layer 66L and the thickness of the semiconductor material layer 54L can be selected to ensure that the entire volume of the metal portions 66 react with the semiconductor material layer 54L to form metal-semiconductor alloy portions 67. A vertical stack of metal-semiconductor alloy portions 67 can be formed by reacting the vertical stack of metal portions 66 with portions of the semiconductor material layer 54L located at levels of the insulating layers 32. Unreacted portions of the semiconductor material layer 54L remain at each level of the sacrificial material layers 42 located over the top surface of the pedestal channel portion 11. The set of unreacted portions of the semiconductor material layer 54L in the memory opening 49 comprise a vertical stack of semiconductor material portions 54S.

Referring to FIG. 5K, a selective isotropic etch process that etches the material of the metal-semiconductor alloy portions 67 selective to the material of the semiconductor material portions 54S can be performed. The vertical stack of metal-semiconductor alloy portions 67 is removed selective to unreacted portions of the semiconductor material layer 54L, i.e., the vertical stack of semiconductor material portions 54S. The vertical stack of semiconductor material portions 54S remain at levels of the spacer material layers (such as the sacrificial material layers 42). In one embodiment, each semiconductor portion 54S can have a have a tubular shape. As used herein, a "tubular" element refers to an element having an inner cylindrical sidewall, an outer cylindrical sidewall, and a substantially uniform thickness between the inner sidewall and the outer sidewall. The vertical stack of semiconductor material portions 54S can be subsequently employed as a vertical stack of charge storage elements, which can function as floating gates of a NAND string. Portions of the inner sidewall of the blocking dielectric layer 52 are physically exposed after removal of the vertical stack of metal-semiconductor alloy portions 67.

Referring to FIG. 5L, a tunneling dielectric layer 56 can be deposited employing a conformal deposition process such as a chemical vapor deposition process. The tunneling dielectric layer 56 includes a dielectric material through which charge tunneling can be performed under suitable electrical bias conditions. The tunneling dielectric layer 56 can be formed directly on the portions of the inner sidewall of the blocking dielectric layer 52 that are physically exposed and located at the levels of the insulating layers 32. The tunneling dielectric layer 56 can be formed directly on the vertical stack of discrete cylindrical semiconductor material portions 54S. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

An optional first semiconductor channel layer 601 can be subsequently deposited on the tunneling dielectric layer 56 by a conformal deposition process. The first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed.

Referring to FIG. 5M, an optional patterning film 77 can be anisotropically deposited to cover the insulating cap layer 70 and the topmost portion of the first semiconductor channel layer 601 that overlies the topmost spacer material layer (such as the topmost sacrificial material layer 42). The patterning film 77 is deposited with high directionality, and thus, has a significantly greater thickness above the insulating cap layer 70 than at the bottom horizontal surface of the memory opening 49 (which may be the top surface of the pedestal channel portion 11). The patterning film 77 may be a film including amorphous carbon as a predominant component. For example, Advanced Patterning Film™ by Applied Materials Inc.™ may be employed for the patterning film 77. Alternatively, the patterning film 77 may be omitted.

An anisotropic etch process can be performed to remove the horizontal bottom portions of the first semiconductor channel layer 601, the tunneling dielectric layer 56, and the blocking dielectric layer 52 located over the pedestal channel portion 11 (or located above the upper substrate semiconductor layer 10 in case a pedestal channel portion is not present) at the bottom of each memory opening 49. A center portion of the top surface of the pedestal channel portion 11 can be vertically recessed by the anisotropic etch process. In case a pedestal channel portion 11 is not present in the memory opening 49, a portion of the horizontal surface of the upper substrate semiconductor layer 10 can be vertically recessed underneath the memory opening 49. If present, the patterning film 77 can be subsequently removed, for example, by ashing.

A surface of the pedestal channel portion 11 (or a surface of the upper substrate semiconductor layer 10 in case the pedestal channel portions 11 are not employed) can be physically exposed underneath the opening through the first semiconductor channel layer 601, the tunneling dielectric layer 56, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the upper substrate semiconductor layer 10 in case pedestal channel portions 11 are not employed) by a recess distance. The vertical stack of semiconductor material portions 54S function as discrete charge storage elements that are floating gates. A set of the blocking dielectric layer 52, the vertical stack of semiconductor material portions 54S, and the tunneling dielectric layer 56 in a memory opening 49 constitutes a memory film 50. In one embodiment, the first semiconductor channel layer 601, the tunneling dielectric layer 56, and the blocking dielectric layer 52 can have vertically coincident sidewalls.

Referring to FIG. 5N, a second semiconductor channel layer 602 can be deposited directly on the semiconductor surface of the pedestal channel portion 11 or the upper substrate semiconductor layer 10 if the pedestal channel portion 11 is omitted, and directly on the first semiconductor channel layer 601 (if present). The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602. The combination of the blocking dielectric layer 52, the tunneling dielectric layer 56, the first semiconductor channel layer 601, and the second semiconductor channel layer 602 can completely fill the volumes of the annular lateral recesses provided at the levels of the insulating layers 32.

Referring to FIG. 5O, in case the memory cavity 49' in each memory opening is not completely filled by the second semiconductor channel layer 602, a dielectric core layer can be deposited in the memory cavity 49' to fill any remaining portion of the memory cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer can be removed, for example, by a recess etch from above the top surface of the second semiconductor channel layer 602. Further, the material of the dielectric core layer can be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer constitutes a dielectric core 62.

Referring to FIG. 5P, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material can be removed from above the top surface of the insulating cap layer 70, for example, by chemical mechanical planarization (CMP) or a recess etch. Each remaining portion of the semiconductor material having a doping of the second conductively type comprises a doped semiconductor region having a p-n junction at an interface with the vertical semiconductor channel 60. In one embodiment, the doped semiconductor region is employed as a drain region 63 for a vertical NAND string. The horizontal portion of the second semiconductor channel layer 602 located above the top surface of the insulating cap layer 70 can be concurrently removed by a planarization process. Each remaining portion of the second semiconductor channel layer 602 can be located entirety within a memory opening 49 or entirely within a support opening 19.

Each remaining portion of the doped semiconductor material having a doping of the second conductivity type constitutes a drain region 63. Each adjoining pair of the optional first semiconductor channel layer 601 and the second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a vertical stack of semiconductor material portions 54S, and laterally surrounds a portion of the vertical semiconductor channel 60. Each adjoining set of a tunneling dielectric layer 56, a vertical stack of semiconductor material portions 54S, and a blocking dielectric layer 52 collectively constitute a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising a vertical stack of discrete (i.e., vertically separated from each other) semiconductor material portions 54S, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figures 5Q, 5R:
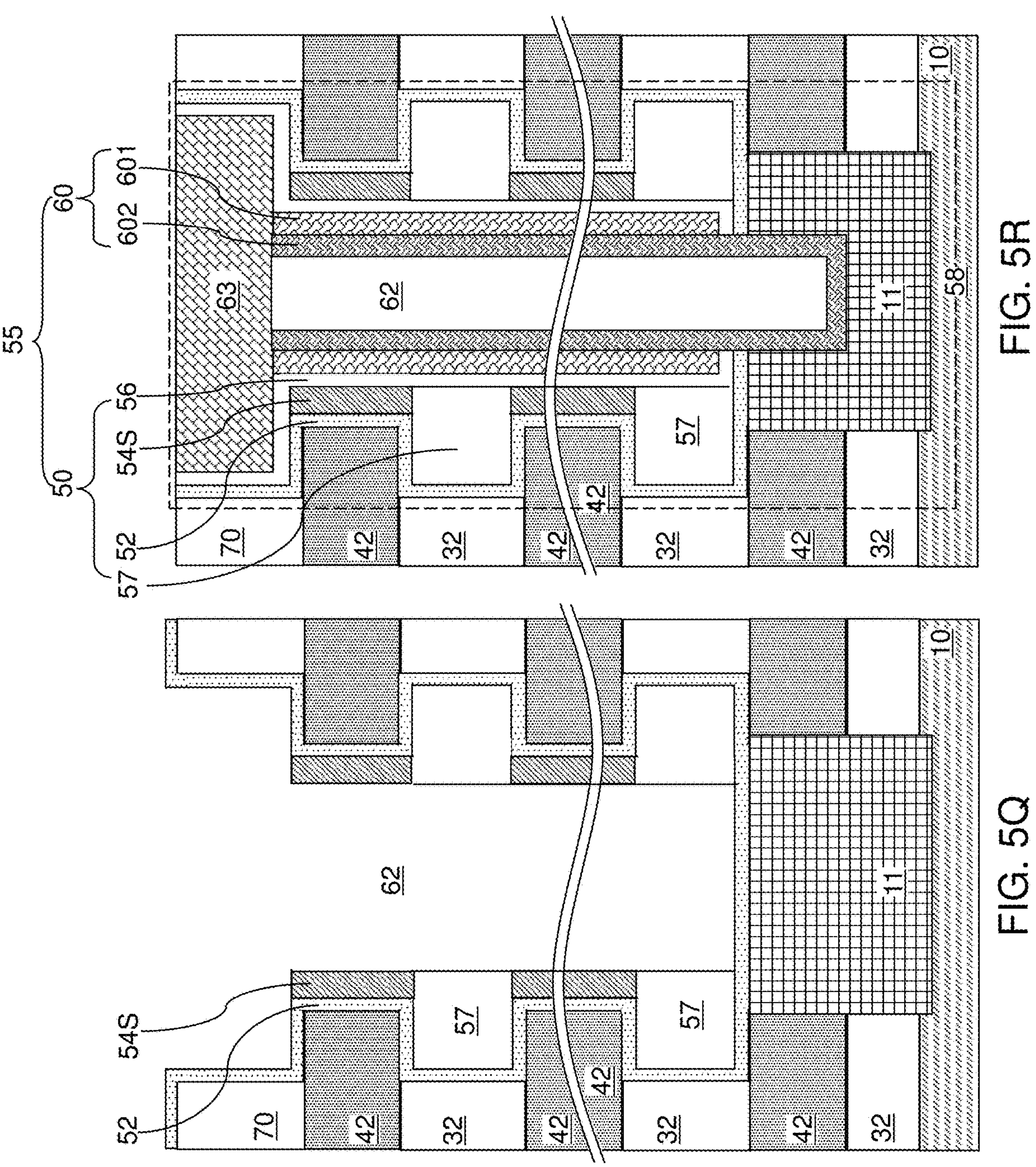

FIGS. 5Q and 5R illustrate an alternative configuration of the first exemplary memory opening fill structure. Referring to FIG. 5Q, the alternative configuration of the first exemplary memory opening fill structure can be derived from the structure illustrated in FIG. 5K by filling the annular lateral recesses 149 with a dielectric fill material. Specifically, a dielectric fill material such as undoped silicate glass or a doped silicate glass can be deposited in the remaining volumes of the annular lateral recesses 149 after removal of the vertical stack of metal-semiconductor alloy portions 67. In one embodiment, the dielectric fill material may have a higher etch rate than the material of the blocking dielectric layer 52. For example, the dielectric fill material may include borosilicate glass, which can provide an etch rate in dilute hydrofluoric acid than the etch rate of undoped silicate glass by a factor in a range from 100 to 10,000.

Portions of the dielectric fill material can be removed from outside the annular lateral recesses 149 by etching back the dielectric fill material. An isotropic etch process or an anisotropic etch process may be employed. The chemistry of the etch process employed to etch the dielectric fill material can be selective to the material of the semiconductor material portions 54S and the material of the blocking dielectric layer 52. Remaining portions of the dielectric fill material filling the annular lateral recesses 149 comprise a vertical stack of annular insulating material portions 57. In case an anisotropic etch process is employed to pattern the annular insulating material portions 57, inner sidewalls of the annular insulating material portions 57 may be vertically coincident with inner sidewalls of the semiconductor material portions 54S.

Referring to FIG. 5R, the processing steps of FIGS. 5L-5P can be performed to provide an alternative configuration of the second exemplary memory opening fill structure 58. In this case, the tunneling dielectric layer 56 can be formed directly on the vertical stack of annular insulating material portions 57. The memory film 50 can comprise the blocking dielectric layer 52, the vertical stack of semiconductor material portions 54S, the vertical stack of annular insulating material portions 57 (which can contact the vertical stack of semiconductor material portions 54S), and the tunneling dielectric layer 56.

FIGS. 6A-6J are sequential schematic vertical cross-sectional views of a memory opening within the first exemplary structure during formation of a second exemplary memory opening fill structure according to an embodiment of the present disclosure. The second exemplary memory opening fill structure can be formed within each memory opening 49 in lieu of the first exemplary memory opening fill structure.

Figures 6A, 6B:
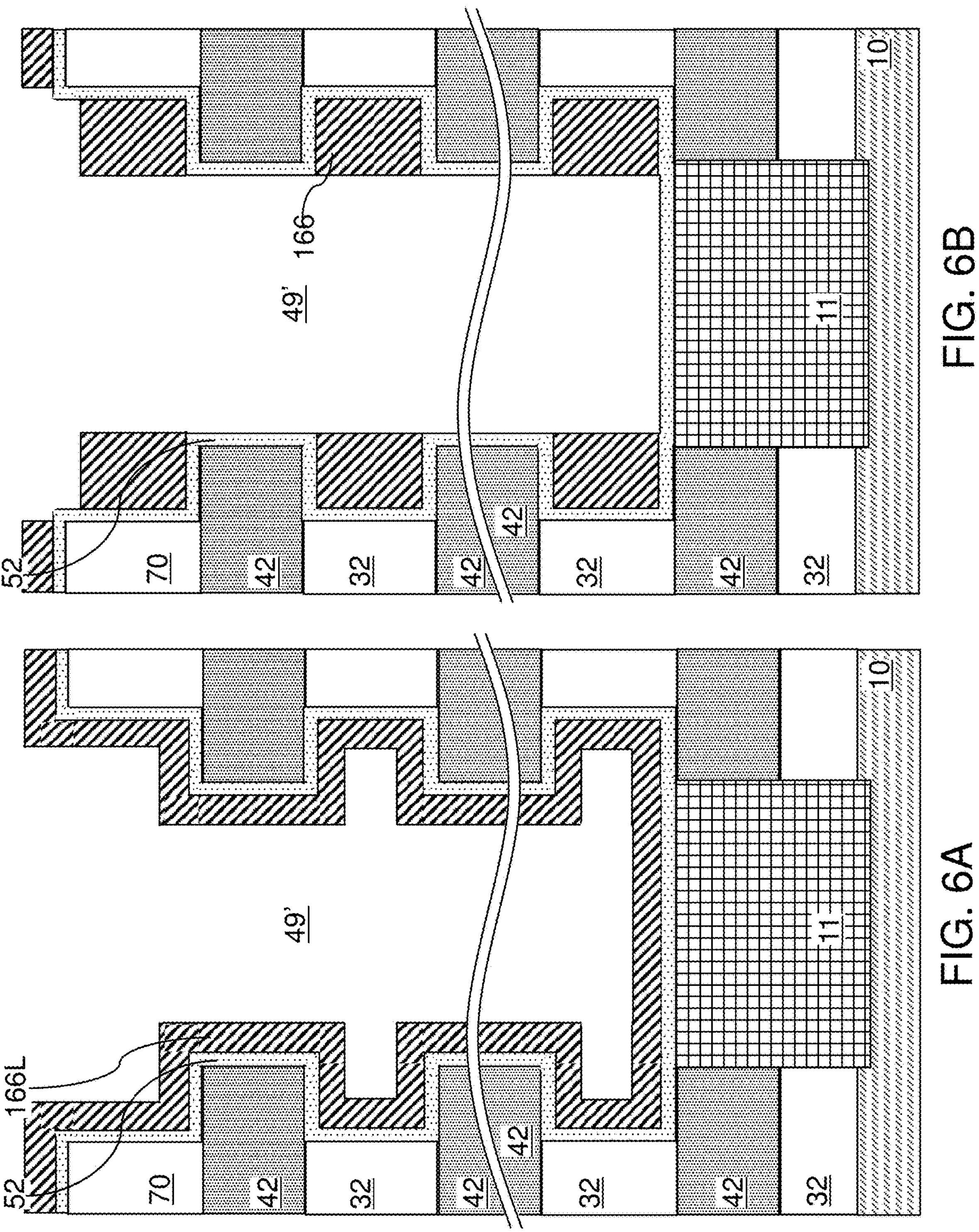
FIGS. 6A-6J are sequential schematic vertical cross-sectional views of a memory opening within the first exemplary structure during formation of a second exemplary memory opening fill structure according to a first embodiment of the present disclosure.

Referring to FIG. 6A, a memory opening 49 is illustrated during formation of the second exemplary memory opening fill structures in which the metal layer self-segregates into the annular lateral recesses 149 during an anneal. Specifically, the structure illustrated in FIG. 6A can be derived from the structure illustrated in FIG. 5D by conformally depositing a metal layer 166L on the inner sidewalls of the blocking dielectric layer 52. The metal layer 166L can include any metal that can spontaneously segregate into the annular lateral recesses 149 in a subsequent anneal process. For example, the metal layer 166L can include, and/or consist essentially of, cobalt.

Referring to FIG. 6B, a thermal anneal process is performed at an elevated temperature to induce thermal migration of the metal layer 166L into the annular lateral recesses 149. The metal layer 166L self-segregates into the vertical stack of discrete metal portions 166 during the thermal anneal process in order to reduce the total surface area. The elevated temperature of the thermal anneal process can be in a range from 300 degrees Celsius to 1,000 degrees Celsius, although lower and higher temperatures may also be employed depending on the composition of the metal layer 166L. The thickness of the metal layer 166L as deposited at the processing steps of FIG. 6A can be selected such that the discrete metal portions 166 are confined within a respective one of the annular lateral recesses 149, and are not in direct contact with each other (i.e., vertically separated from each other). Inner sidewalls of the blocking dielectric layer 52 can be physically exposed at each level of the spacer material layers (such as the sacrificial material layers 42).

Figures 6C, 6D:
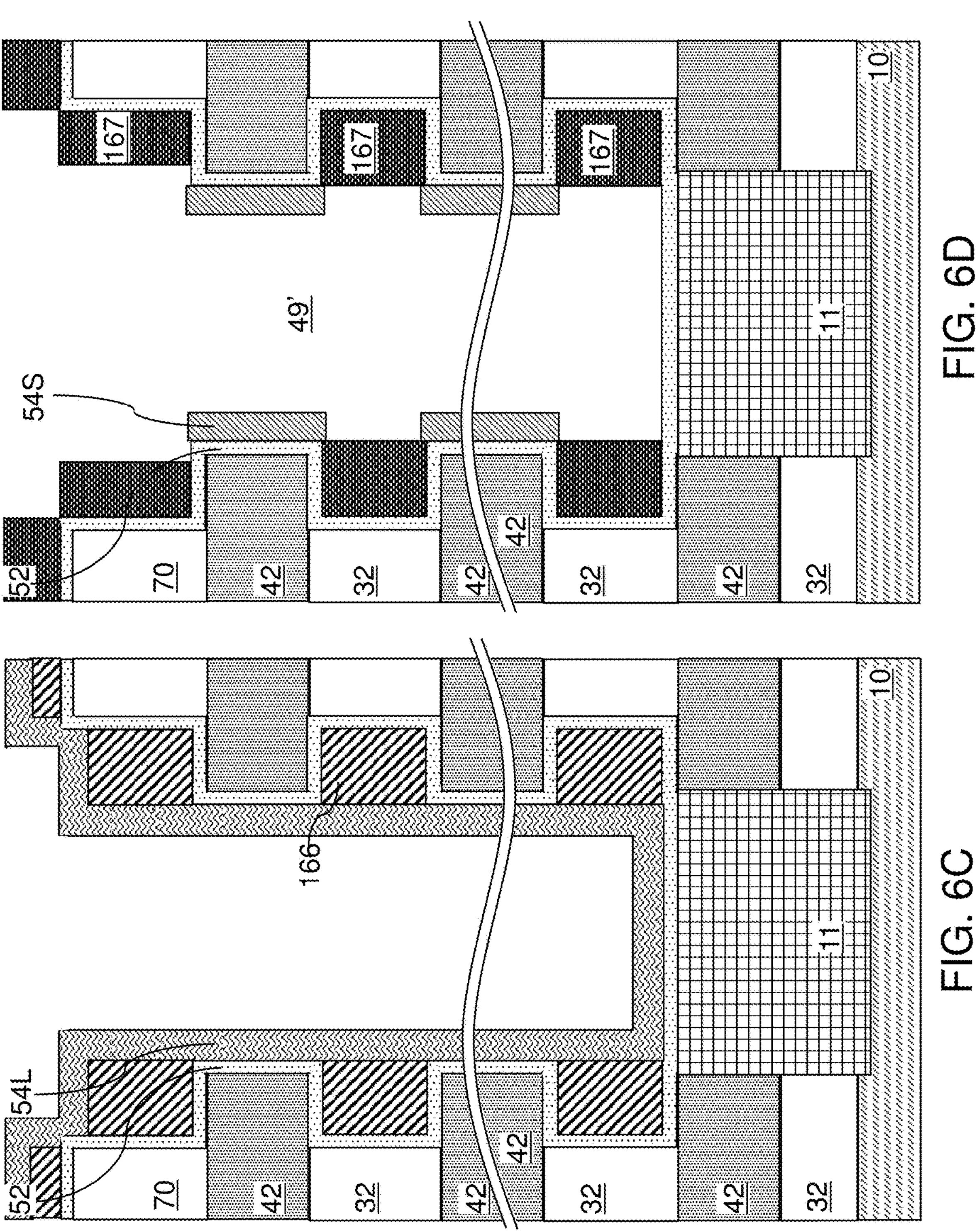

Referring to FIG. 6C, the processing steps of FIG. 5H can be performed to form a semiconductor material layer 54L. The semiconductor material layer 54L can be conformally deposited over the physically exposed surfaces of the blocking dielectric layer 52 and the discrete metal portions 166, each of which may have an annular configuration.

Referring to FIG. 6D, a thermal anneal process is performed at an elevated temperature that induces formation of a metal-semiconductor alloy between the material of the metal portions 166 and the material of the semiconductor material layer 54L. The elevated temperature may be in a range from 400 degrees Celsius to 1,000 degrees Celsius, although lower and higher temperatures may also be employed depending on the composition of the metal-semiconductor alloy. Generally, the thickness of the metal layer 166L and the thickness of the semiconductor material layer 54L can be selected to ensure that the entire volume of the metal portions 166 react with the semiconductor material layer 54L to form metal-semiconductor alloy portions 167. A vertical stack of metal-semiconductor alloy portions 167 can be formed by reacting the vertical stack of metal portions 166 with portions of the semiconductor material layer 54L located at levels of the insulating layers 32. Unreacted portions of the semiconductor material layer 54L remain at each level of the sacrificial material layers 42 located over the top surface of the pedestal channel portion 11. The set of unreacted portions of the semiconductor material layer 54L in the memory opening 49 comprise a vertical stack of semiconductor material portions 54S.

Figures 6E, 6F:
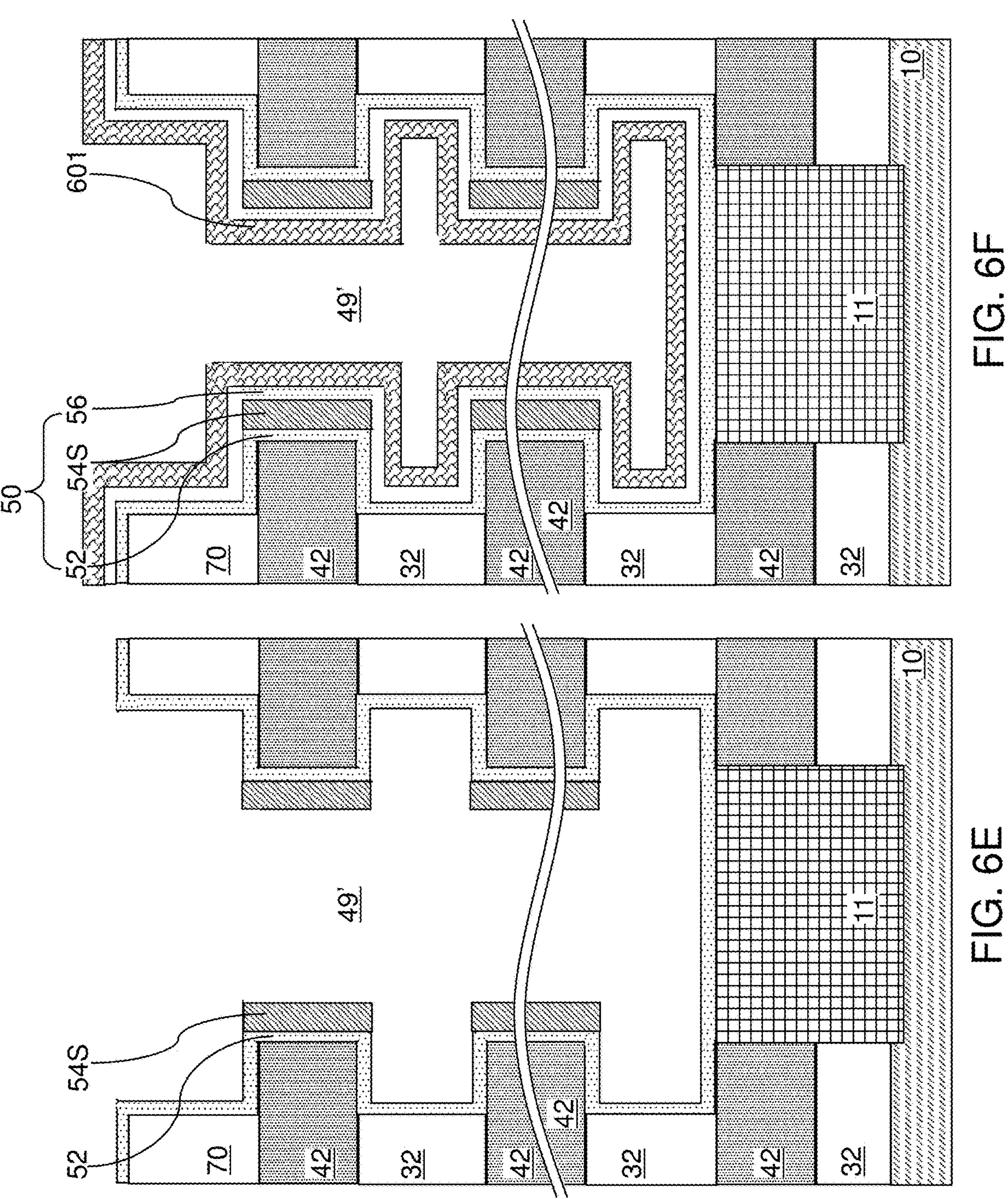

Referring to FIG. 6E, a selective isotropic etch process that etches the material of the metal-semiconductor alloy portions 167 selective to the material of the semiconductor material portions 54S can be performed. The vertical stack of metal-semiconductor alloy portions 167 is removed selective to unreacted portions of the semiconductor material layer 54L, i.e., the vertical stack of semiconductor material portions 54S. The vertical stack of semiconductor material portions 54S remain at levels of the spacer material layers (such as the sacrificial material layers 42). In one embodiment, each semiconductor portion 54S can have a have a tubular shape. The vertical stack of semiconductor material portions 54S can be subsequently employed as a vertical stack of charge storage elements, which can function as floating gates of a NAND string. Portions of the inner sidewall of the blocking dielectric layer 52 are physically exposed after removal of the vertical stack of metal-semiconductor alloy portions 167.

Referring to FIG. 6F, the processing steps of FIG. 5L can be performed to form a tunneling dielectric layer 56 and a first semiconductor channel layer 601.

Figures 6G, 6H:
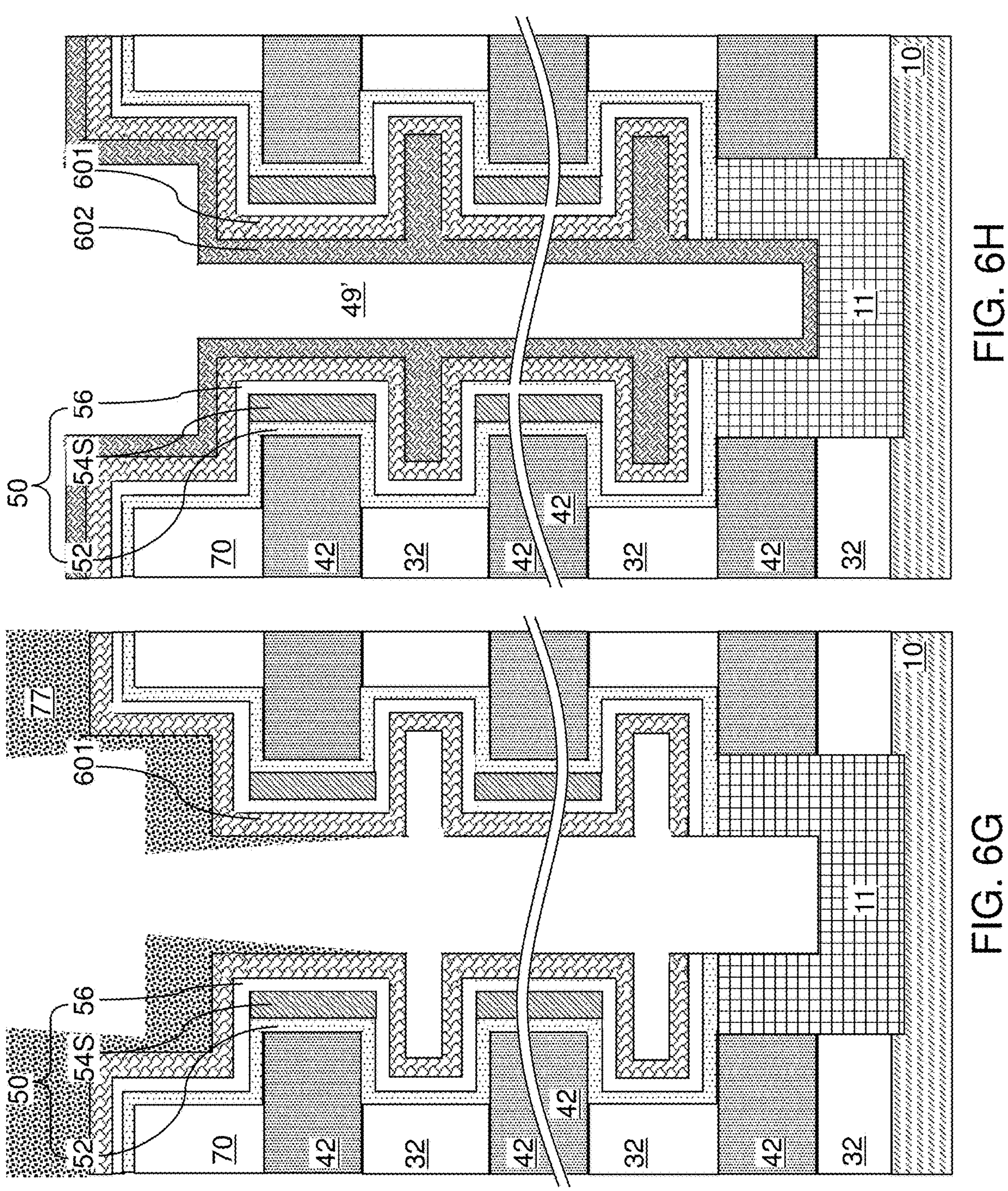

Referring to FIG. 6G, the processing steps of FIG. 5M can be performed to deposit an optional patterning film 77, and to anisotropically etch horizontal bottom portions of the first semiconductor channel layer 601, the tunneling dielectric layer 56, and the blocking dielectric layer 52 located over the pedestal channel portion 11 (or located above the upper substrate semiconductor layer 10 in case a pedestal channel portion is not present) at the bottom of each memory opening 49. A center portion of the top surface of the pedestal channel portion 11 can be vertically recessed by the anisotropic etch process. In case a pedestal channel portion 11 is not present in the memory opening 49, a portion of the horizontal surface of the upper substrate semiconductor layer 10 can be vertically recessed underneath the memory opening 49. The patterning film 77 (if present) can be subsequently removed, for example, by ashing.

Referring to FIG. 6H, the processing steps of FIG. 5N can be performed to form a second semiconductor channel layer 602. The materials of the first semiconductor channel layer 601 and the second semiconductor channel layer 602 are collectively referred to as a semiconductor channel material. The combination of the blocking dielectric layer 52, the tunneling dielectric layer 56, the first semiconductor channel layer 601, and the second semiconductor channel layer 602 can completely fill the volumes of the annular lateral recesses provided at the levels of the insulating layers 32.

Figures 6I, 6J:
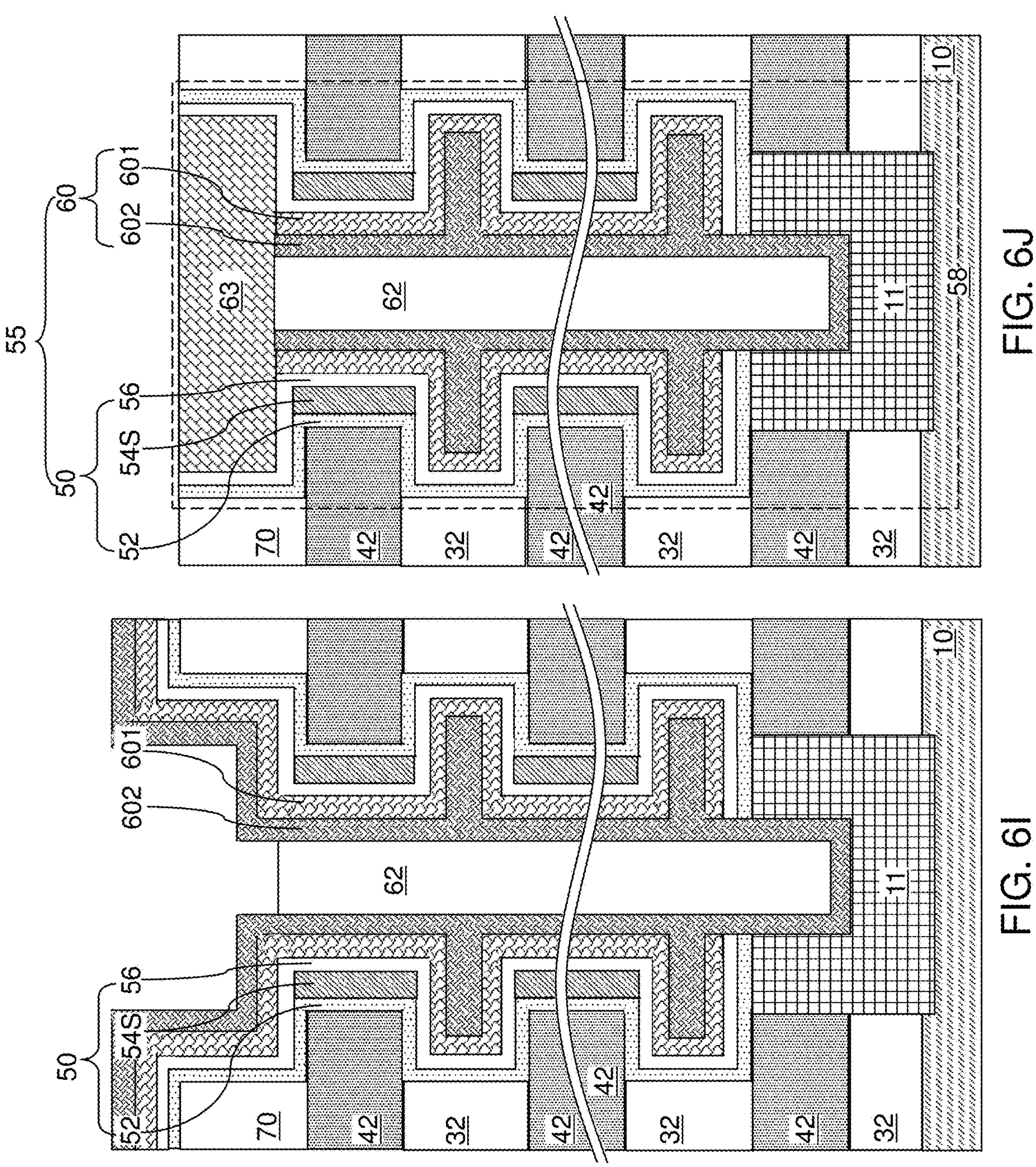

Referring to FIG. 6I, the processing steps of FIG. 5O can be performed to form a dielectric core 62 in each memory opening 49.

Referring to FIG. 6J, the processing steps of FIG. 5P can be performed to form a doped semiconductor portion such as a drain region 63 at an upper portion of each memory opening 49. Each adjoining pair of a first semiconductor channel layer 601 (if present) and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a vertical stack of semiconductor material portions 54S, and laterally surrounds a portion of the vertical semiconductor channel 60. Each adjoining set of a tunneling dielectric layer 56, a vertical stack of semiconductor material portions 54S, and a blocking dielectric layer 52 collectively constitute a memory film 50, which includes a vertical stack of memory elements that can store a respective data bit with a macroscopic retention time.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising a vertical stack of semiconductor material portions 54S, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figures 6K, 6L:
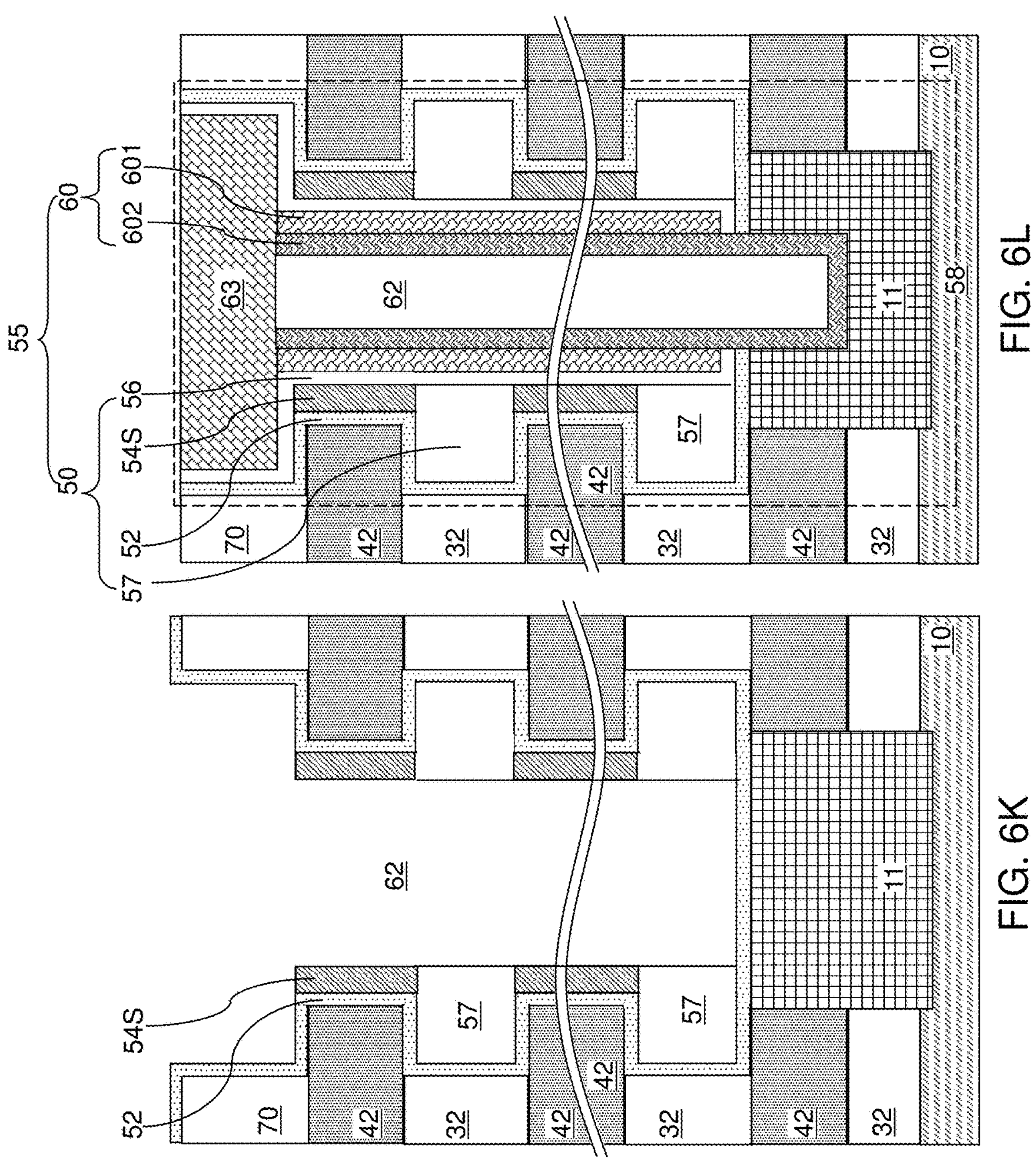
FIGS. 6K and 6L are sequential schematic vertical cross-sectional views of a memory opening during formation of an alternative configuration of the second exemplary memory opening fill structure according to a first embodiment of the present disclosure.

FIGS. 6K and 6L illustrate an alternative configuration of the second exemplary memory opening fill structure. Referring to FIG. 6K, the alternative configuration of the first exemplary memory opening fill structure can be derived from the structure illustrated in FIG. 6E by filling the annular lateral recesses 149 with a dielectric fill material. Specifically, a dielectric fill material such as undoped silicate glass or a doped silicate glass can be deposited in the remaining volumes of the annular lateral recesses 149 after removal of the vertical stack of metal-semiconductor alloy portions 67. In one embodiment, the dielectric fill material may have a higher etch rate than the material of the blocking dielectric layer 52. For example, the dielectric fill material may include borosilicate glass, which can provide an etch rate in dilute hydrofluoric acid than the etch rate of undoped silicate glass by a factor in a range from 100 to 10,000.

Portions of the dielectric fill material can be removed from outside the annular lateral recesses 149 by etching back the dielectric fill material. An isotropic etch process or an anisotropic etch process may be employed. The chemistry of the etch process employed to etch the dielectric fill material can be selective to the material of the semiconductor material portions 54S and the material of the blocking dielectric layer 52. Remaining portions of the dielectric fill material filling the annular lateral recesses 149 comprise a vertical stack of annular insulating material portions 57. In case an anisotropic etch process is employed to pattern the annular insulating material portions 57, inner sidewalls of the annular insulating material portions 57 may be vertically coincident with inner sidewalls of the semiconductor material portions 54S.

Referring to FIG. 6L, the processing steps of FIGS. 6F-6J can be performed to provide an alternative configuration of the second exemplary memory opening fill structure 58. In this case, the tunneling dielectric layer 56 can be formed directly on the vertical stack of annular insulating material portions 57. The memory film 50 can comprise the blocking dielectric layer 52, the vertical stack of semiconductor material portions 54S, the vertical stack of annular insulating material portions 57 (which can contact the vertical stack of semiconductor material portions 54S), and the tunneling dielectric layer 56.

Figures 7A, 7B:
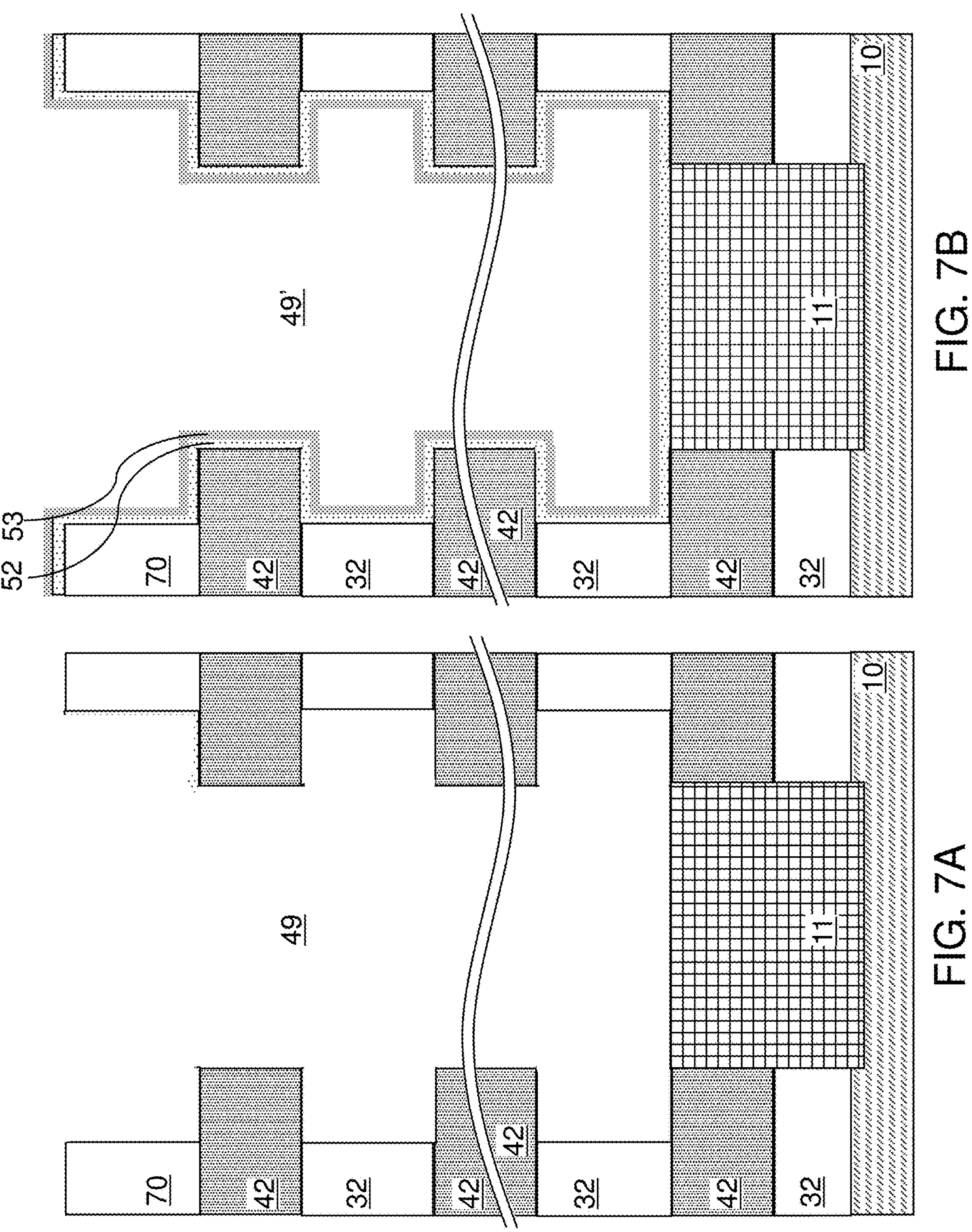
FIGS. 7A-7N are sequential schematic vertical cross-sectional views of a memory opening within the first exemplary structure during formation of a third exemplary memory opening fill structure according to a first embodiment of the present disclosure.
Figures 7C, 7D:
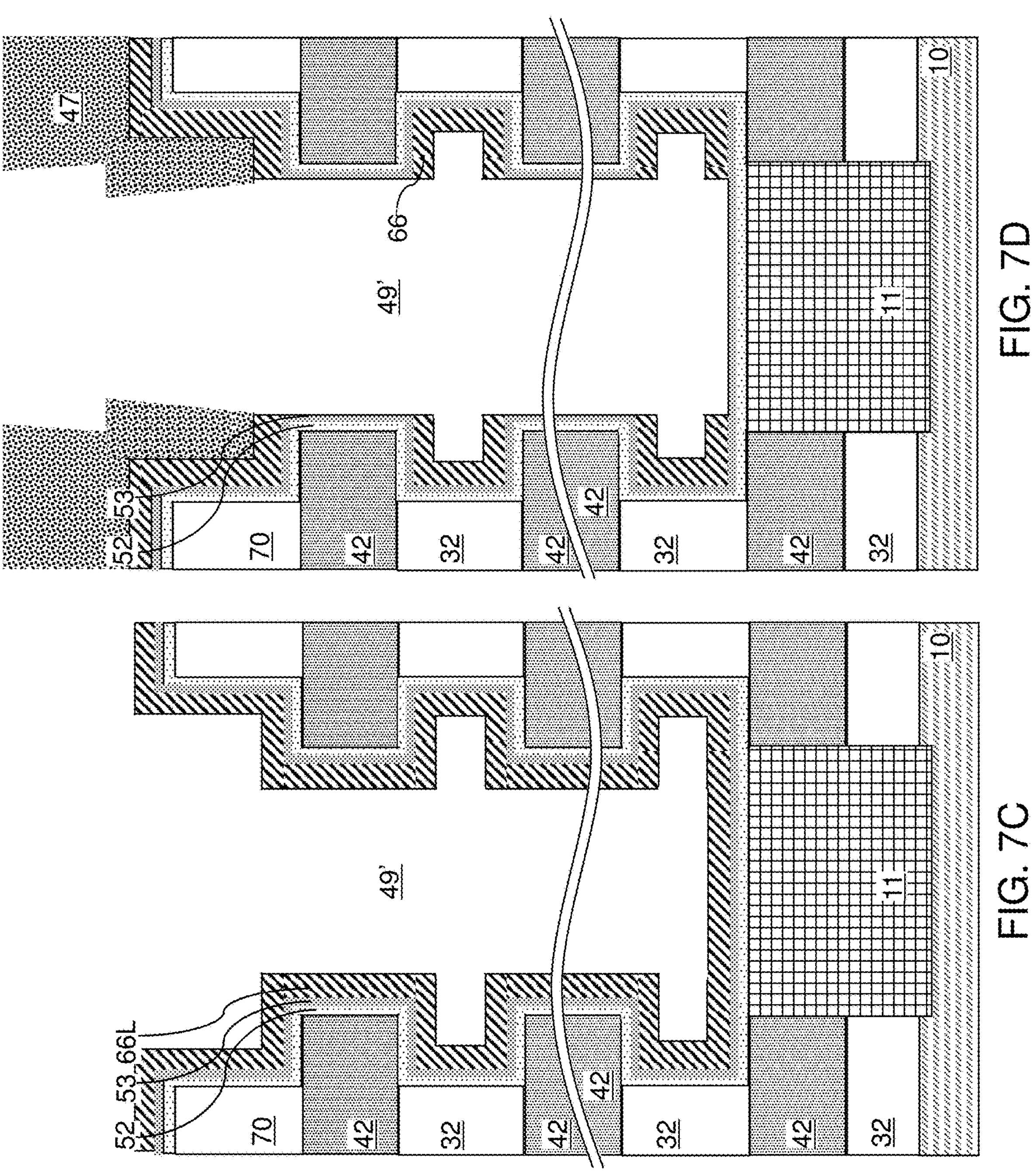
FIGS. 7O and 7P are sequential schematic vertical cross-sectional views of a memory opening during formation of an alternative configuration of the third exemplary memory opening fill structure according to a first embodiment of the present disclosure.
Figures 7E, 7F:
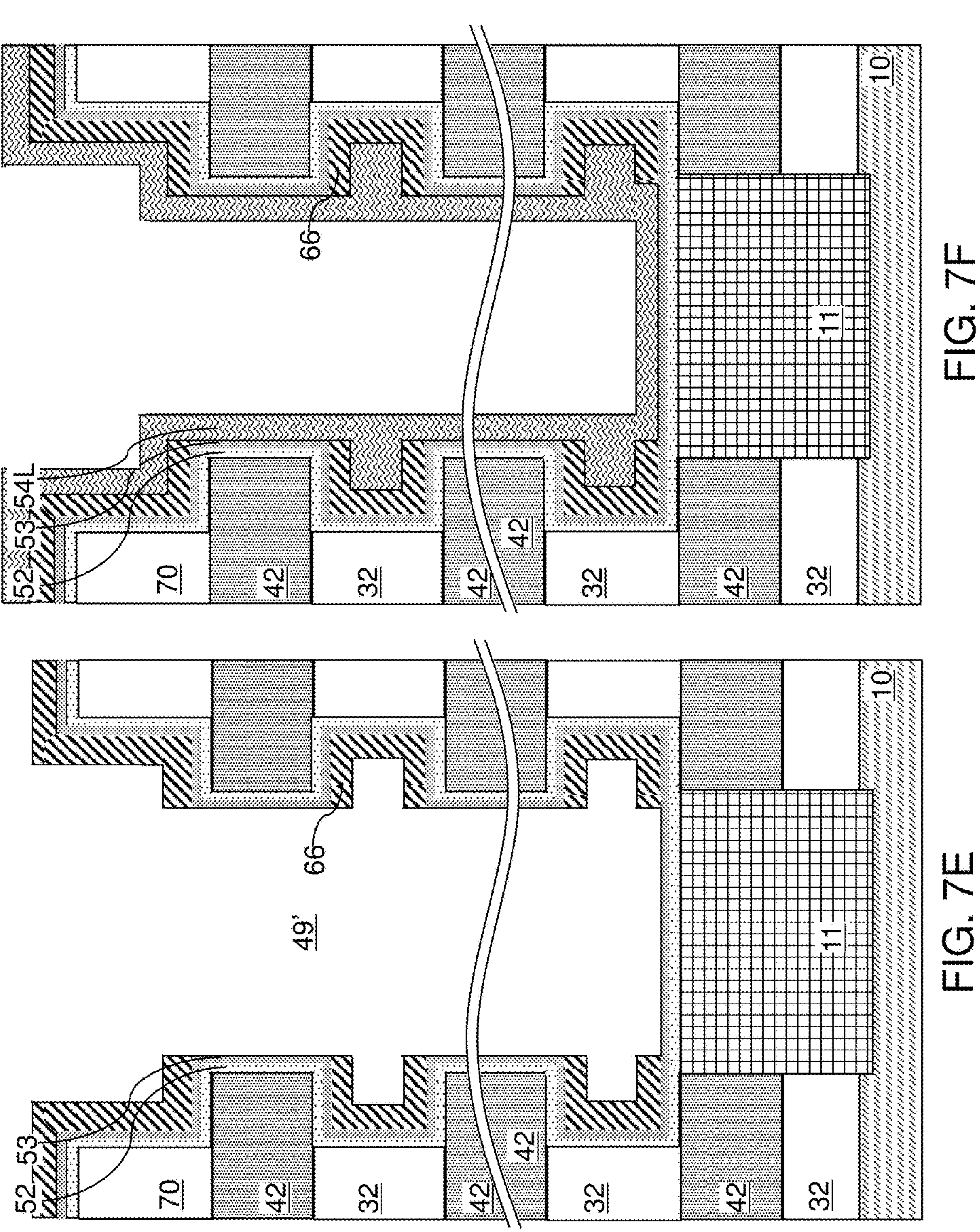
Figures 7G, 7H:
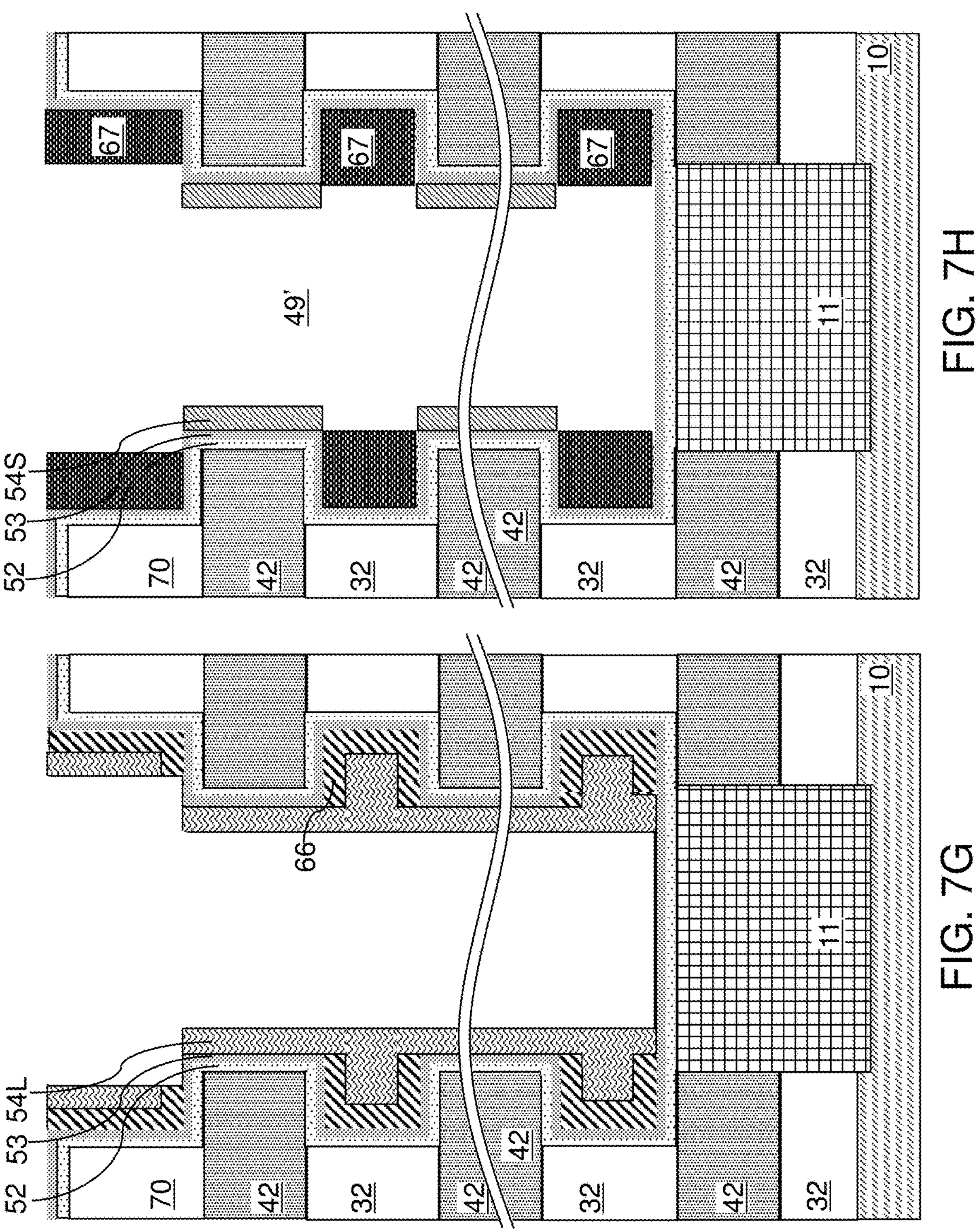
Figures 7I, 7J:
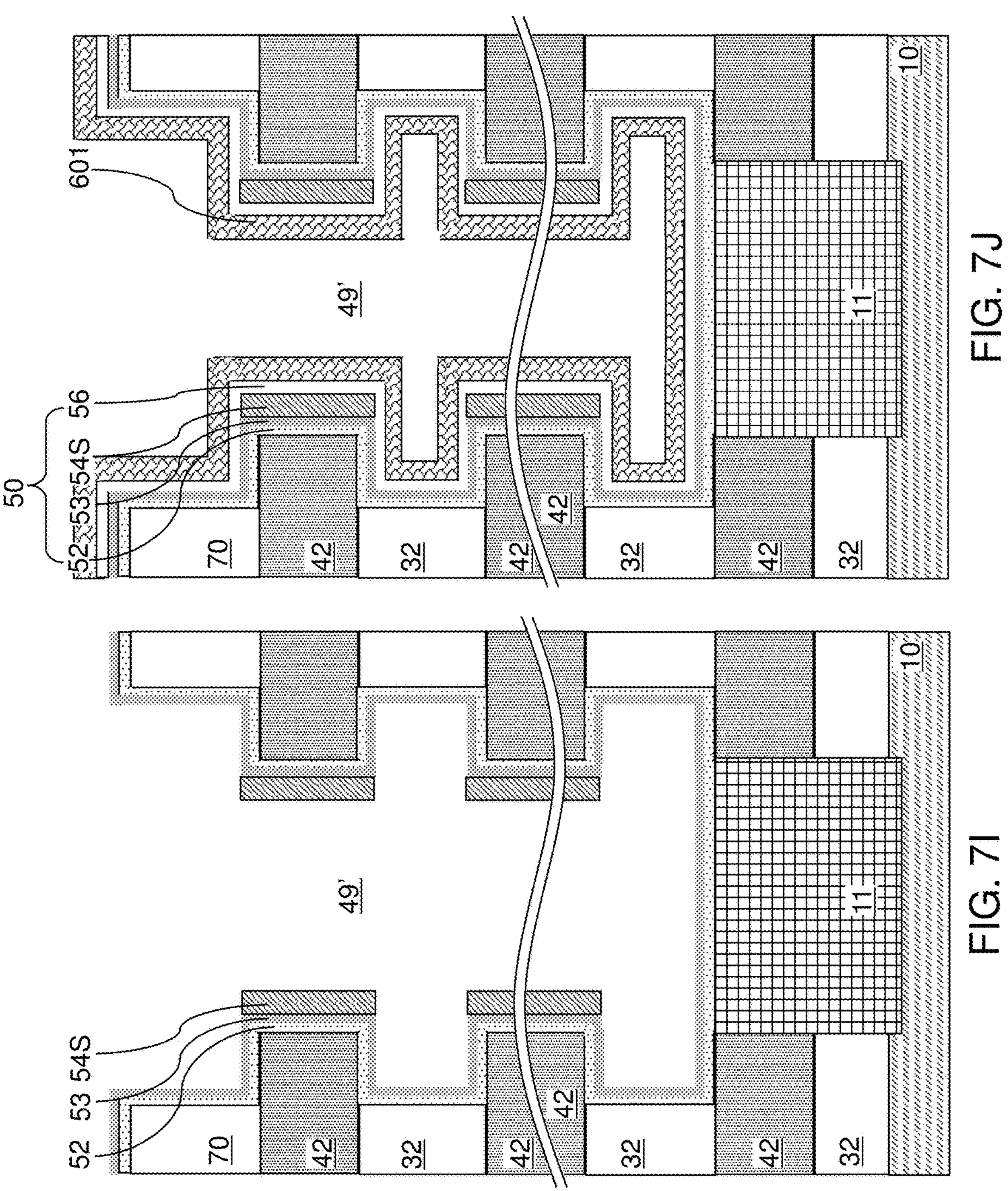
Figures 7K, 7L:
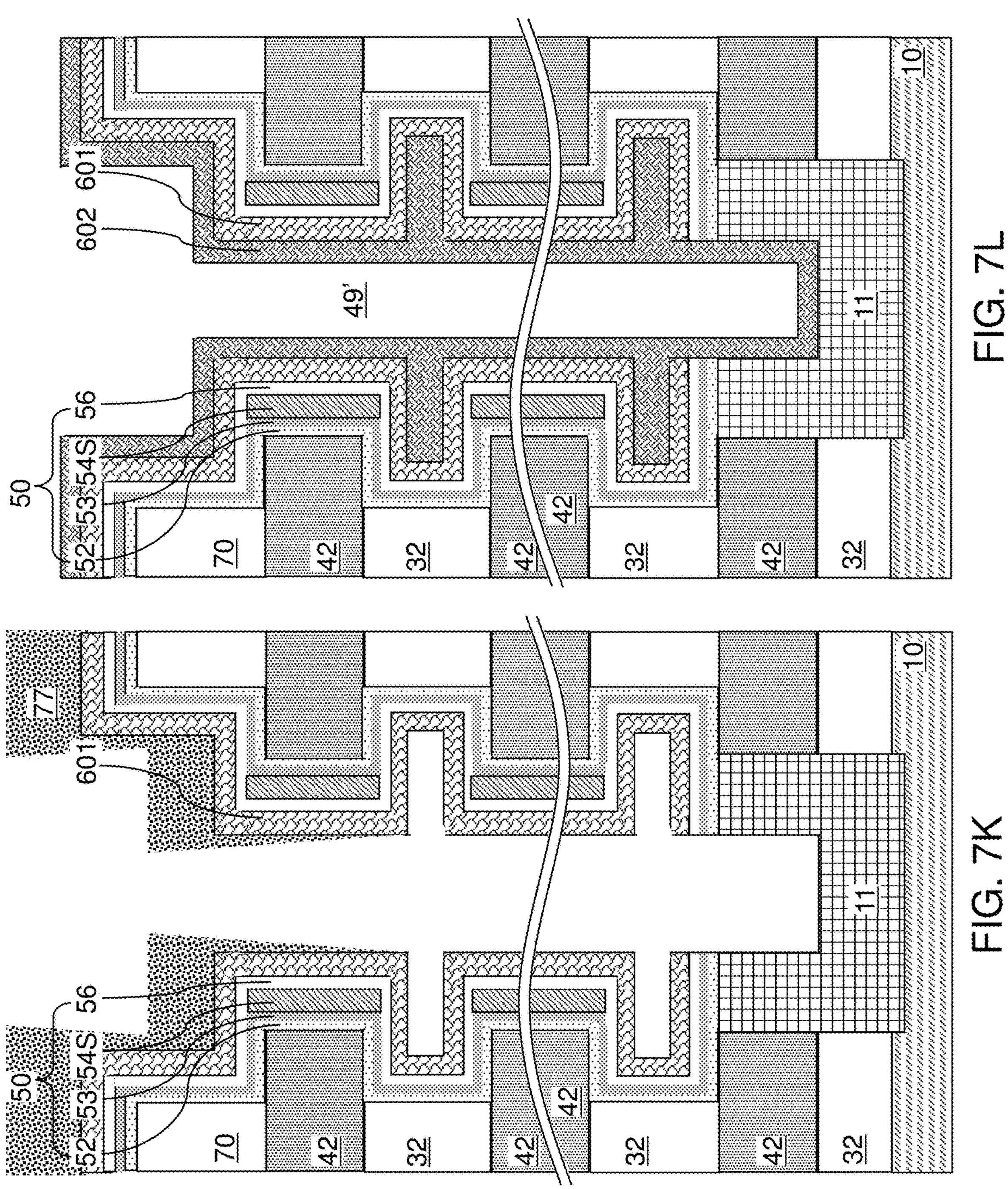
Figures 7M, 7N:
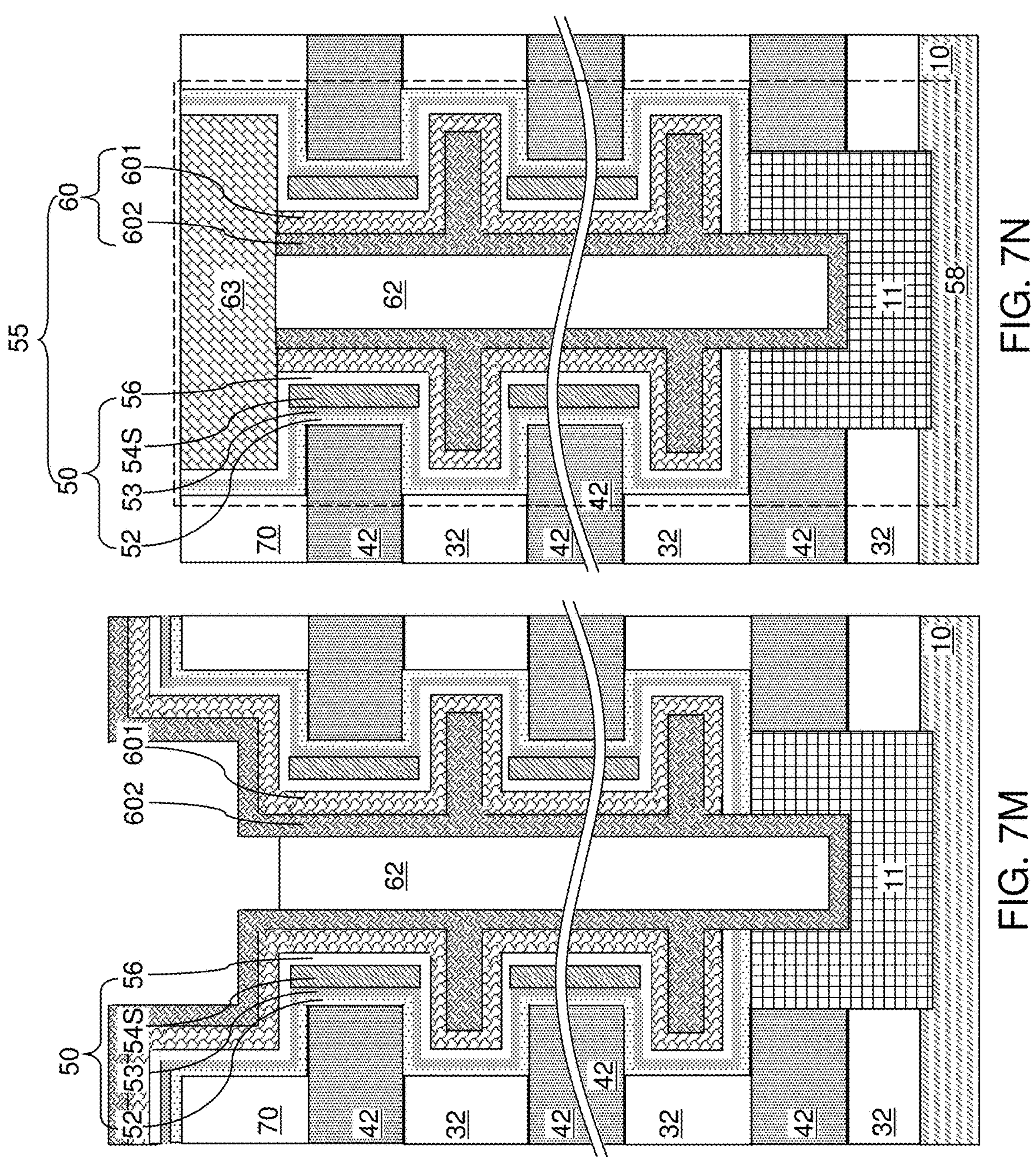

FIGS. 7A-7N are sequential schematic vertical cross-sectional views of a memory opening within the first exemplary structure during formation of a third exemplary memory opening fill structure containing a hybrid charge storage structures containing a continuous charge storage dielectric layer and discrete floating gates, according to an embodiment of the present disclosure. The third exemplary memory opening fill structure can be formed within each memory opening 49 in lieu of the first or second exemplary memory opening fill structure described above.

Referring to FIG. 7A, a memory opening 49 is illustrated after formation of annular lateral recesses 149 at levels of the insulating layers 32. The first exemplary structure of FIG. 7A may be the same as the first exemplary structure illustrated in FIG. 5C.

Referring to FIG. 7B, the processing steps of FIG. 5D can be performed to form a blocking dielectric layer 52. Subsequently, a continuous charge storage dielectric layer, such as a silicon nitride layer 53, can be deposited on the physically exposed surfaces of the blocking dielectric layer 52 by a conformal deposition process such as a chemical vapor deposition process or an atomic layer deposition process. The silicon nitride layer 53 can have a thickness in a range from 1 nm to 8 nm, such as from 2 nm to 6 nm, although lesser and greater thicknesses can also be employed. The silicon nitride layer 53 vertically extends through layers of the alternating stack (32, 42), and contacts an outer sidewall of each discrete tubular semiconductor material portion 54S within the vertical stack of discrete tubular semiconductor material portions 54S. The silicon nitride layer 53 can be in contact with the inner sidewall of the blocking dielectric layer 52.

Referring to FIG. 7C, the processing steps of FIG. 5E can be performed to form a metal layer 66L directly on the silicon nitride layer 53.

Referring to FIG. 7D, the processing steps of FIG. 5F can optionally be performed to anisotropically deposit an optional patterning film 47, and to anisotropically etch portions of the metal layer 66L that are not masked by the patterning film 47. Remaining portions of the metal layer 66L after the anisotropic etch process include a vertical stack of discrete metal portions 66. Alternatively, if the metal layer 66L comprised cobalt, then it may be self-segregated into discrete metal portions 66 by an anneal as described with respect to FIG. 6B above.

Referring to FIG. 7E, the patterning film 47 (if present) can be subsequently removed, for example, by ashing.

Referring to FIG. 7F, the processing steps of FIG. 5H can be performed to conformally deposit a semiconductor material layer 54L.

Referring to FIG. 7G, the processing steps of FIG. 5I can be performed to anisotropically etch horizontal portions of the semiconductor material layer 54L and the metal layer 66L that overlie the insulating cap layer 70, and to remove a horizontal portion of the semiconductor material layer 54L located at the bottom of the memory opening 49 (such as the horizontal portion of the semiconductor material layer 54L located above the pedestal channel portion 11).

Referring to FIG. 7H, the processing steps of FIG. 5J can be performed. Specifically, a thermal anneal process is performed at an elevated temperature that induces formation of a metal-semiconductor alloy between the material of the metal portions 66 and the material of the semiconductor material layer 54L. Generally, the thickness of the metal layer 66L and the thickness of the semiconductor material layer 54L can be selected to ensure that the entire volume of the metal portions 66 react with the semiconductor material layer 54L to form metal-semiconductor alloy portions 67. A vertical stack of metal-semiconductor alloy portions 67 can be formed by reacting the vertical stack of metal portions 66 with portions of the semiconductor material layer 54L located at levels of the insulating layers 32. Unreacted portions of the semiconductor material layer 54L remain at each level of the sacrificial material layers 42 located over the top surface of the pedestal channel portion 11. The set of unreacted portions of the semiconductor material layer 54L in the memory opening 49 comprise a vertical stack of semiconductor material portions 54S.

Referring to FIG. 7I, the processing steps of 5K can be performed. Specifically, a selective isotropic etch process that etches the material of the metal-semiconductor alloy portions 67 selective to the material of the semiconductor material portions 54S can be performed. The vertical stack of metal-semiconductor alloy portions 67 is removed selective to unreacted portions of the semiconductor material layer 54L, i.e., the vertical stack of semiconductor material portions 54S. The vertical stack of semiconductor material portions 54S remain at levels of the spacer material layers (such as the sacrificial material layers 42). In one embodiment, each semiconductor portion 54S can have a have a tubular shape. The vertical stack of semiconductor material portions 54S can be subsequently employed as a vertical stack of charge storage elements, which can function as floating gates of a NAND string. Portions of the inner sidewall of the silicon nitride layer 53 are physically exposed after removal of the vertical stack of metal-semiconductor alloy portions 67.

Referring to FIG. 7J, the processing steps of FIG. 5L can be performed to form the tunneling dielectric layer 56 and the optional first semiconductor channel layer 601.

Referring to FIG. 7K, the processing steps of FIG. 5M can optionally be performed to anisotropically deposit a patterning film 77 over the insulating cap layer 70 and the topmost portion of the first semiconductor channel layer 601 that overlies the topmost spacer material layer (such as the topmost sacrificial material layer 42). An anisotropic etch process can be performed to remove the horizontal bottom portions of the first semiconductor channel layer 601, the tunneling dielectric layer 56, the silicon nitride layer 53, and the blocking dielectric layer 52 located over the pedestal channel portion 11 (or located above the upper substrate semiconductor layer 10 in case a pedestal channel portion is not present) at the bottom of each memory opening 49. A center portion of the top surface of the pedestal channel portion 11 can be vertically recessed by the anisotropic etch process. In case a pedestal channel portion 11 is not present in the memory opening 49, a portion of the horizontal surface of the upper substrate semiconductor layer 10 can be vertically recessed underneath the memory opening 49. The patterning film 77 can be subsequently removed, for example, by ashing.

A surface of the pedestal channel portion 11 (or a surface of the upper substrate semiconductor layer 10 in case the pedestal channel portions 11 are not employed) can be physically exposed underneath the opening through the first semiconductor channel layer 601, the tunneling dielectric layer 56, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the upper substrate semiconductor layer 10 in case pedestal channel portions 11 are not employed) by a recess distance. The vertical stack of semiconductor material portions 54S function as discrete charge storage elements that are floating gates. The continuous silicon nitride layer 53 functions as an additional charge storage material portion that continuously extends through each layer of the alternating stack (32, 42) located above the horizontal plane including the top surface of the pedestal channel portion 11. The combination of the silicon nitride layer 53 and the vertical stack of semiconductor material portions 54S constitute a composite charge storage structure including charge storage elements at each level of the spacer material layers (such as the sacrificial material layers 42). A set of the blocking dielectric layer 52, the silicon nitride layer 53, the vertical stack of semiconductor material portions 54S, and the tunneling dielectric layer 56 in a memory opening 49 constitutes a memory film 50. In one embodiment, the first semiconductor channel layer 601, the tunneling dielectric layer 56, the silicon nitride layer 53, and the blocking dielectric layer 52 can have vertically coincident sidewalls.

Referring to FIG. 7L, the processing steps of FIG. 5N can be performed to deposit a second semiconductor channel layer 602 directly on the semiconductor surface of the pedestal channel portion 11 or the upper substrate semiconductor layer 10 if the pedestal channel portion 11 is omitted, and directly on the first semiconductor channel layer 601. The combination of the blocking dielectric layer 52, the silicon nitride layer 53, the tunneling dielectric layer 56, the first semiconductor channel layer 601, and the second semiconductor channel layer 602 can completely fill the volumes of the annular lateral recesses provided at the levels of the insulating layers 32.

Referring to FIG. 7M, the processing steps of 5O can be performed a dielectric core 62 in each memory opening 49.

Referring to FIG. 7N, the processing steps of FIG. 5P can be performed to form a doped semiconductor material portion such as a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising a vertical stack of semiconductor material portions 54S and portions of the silicon nitride layer 53 located at the levels of the spacer material layers 42, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

In one embodiment, the tunneling dielectric layer 56 has a laterally-undulating vertical cross-sectional profile, and comprises laterally-protruding portions located at levels of the insulating layers 32 and contacting horizontal annular surfaces of the blocking dielectric layer 52 and overlying or underlying portions of the spacer material layers (such as the sacrificial material layers 42) that are proximal to the vertical stack of discrete tubular semiconductor material portions 54S.

Figures 7O, 7P:
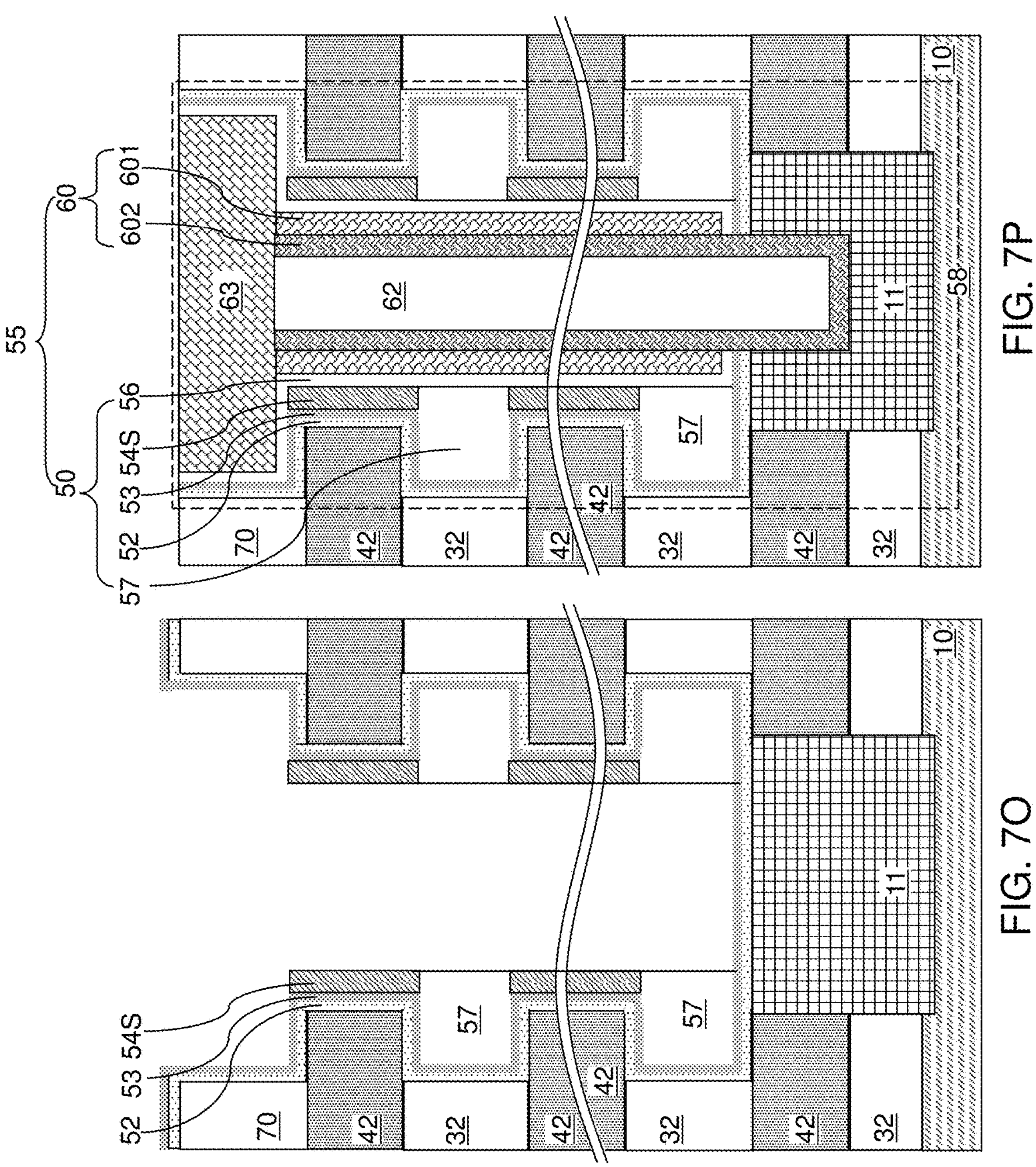

FIGS. 7O and 7P illustrate an alternative configuration of the third exemplary memory opening fill structure. Referring to FIG. 7O, the alternative configuration of the third exemplary memory opening fill structure can be derived from the structure illustrated in FIG. 7I by filling the annular lateral recesses 149 with a dielectric fill material. Specifically, a dielectric fill material such as undoped silicate glass or a doped silicate glass can be deposited in the remaining volumes of the annular lateral recesses 149 after removal of the vertical stack of metal-semiconductor alloy portions 67. In one embodiment, the dielectric fill material may have a higher etch rate than the material of the blocking dielectric layer 52. For example, the dielectric fill material may include borosilicate glass, which can provide an etch rate in dilute hydrofluoric acid than the etch rate of undoped silicate glass by a factor in a range from 100 to 10,000.

Portions of the dielectric fill material can be removed from outside the annular lateral recesses 149 by etching back the dielectric fill material. An isotropic etch process or an anisotropic etch process may be employed. The chemistry of the etch process employed to etch the dielectric fill material can be selective to the material of the semiconductor material portions 54S and the material of the blocking dielectric layer 52. Remaining portions of the dielectric fill material filling the annular lateral recesses 149 comprise a vertical stack of annular insulating material portions 57. In case an anisotropic etch process is employed to pattern the annular insulating material portions 57, inner sidewalls of the annular insulating material portions 57 may be vertically coincident with inner sidewalls of the semiconductor material portions 54S.

Referring to FIG. 7P, the processing steps of FIGS. 7J-7N can be performed to provide an alternative configuration of the third exemplary memory opening fill structure 58. In this case, the tunneling dielectric layer 56 can be formed directly on the vertical stack of annular insulating material portions 57. The memory film 50 can comprise the blocking dielectric layer 52, the silicon nitride layer 53, the vertical stack of semiconductor material portions 54S, the vertical stack of annular insulating material portions 57 (which can contact the vertical stack of semiconductor material portions 54S), and the tunneling dielectric layer 56.

The memory opening fill structure of FIG. 7P comprises a vertical stack of annular insulating material portions 57 located at each level of the insulating layers 32 between the blocking dielectric layer 52 and the tunneling dielectric layer 56. The tunneling dielectric layer 56 comprises a straight outer sidewall contacting each annular insulating material portion 57 within the vertical stack of annular insulating material portions 57 and contacting the vertical stack of discrete tubular semiconductor material portions 54S.

In the third exemplary memory opening fill structure 58 of FIG. 7N and the alternative embodiment of FIG. 7P, all surfaces of the vertical stack of discrete tubular semiconductor material portions 54S are in contact with a surface of the silicon nitride liner 53 or a surface of the tunneling dielectric layer 56.

The combination of the silicon nitride layer 53 and the vertical stack of discrete tubular semiconductor material portions 54S constitutes charge storage structures (53, 54S). Generally, the charge storage structures (53, 54S) comprises a vertical stack of discrete tubular semiconductor material portions 54S and at least one continuous silicon nitride material portion in contact with the vertical stack of discrete tubular semiconductor material portions 54S. In one embodiment, the at least one silicon nitride material portion comprises a silicon nitride layer 53 vertically extending through layers of the alternating stack (32, 42) and contacting an outer sidewall of each discrete tubular semiconductor material portion 54S within the vertical stack of discrete tubular semiconductor material portions 54S. In one embodiment shown in FIG. 7N, at the level of the insulating layers 32, the silicon nitride layer 53 is in contact with an inner sidewall of the blocking dielectric layer 52 and the outer sidewall of the tunneling dielectric layer 56. In one embodiment, all surfaces of the vertical stack of discrete tubular semiconductor material portions 54S can be in contact with a surface of the silicon nitride liner 53 or a surface of the tunneling dielectric layer 56.

FIGS. 8A-8F are sequential schematic vertical cross-sectional views of a memory opening within the first exemplary structure during formation of a fourth exemplary memory opening fill structure containing discrete charge storage dielectric portions according to an embodiment of the present disclosure. The fourth exemplary memory opening fill structure can be formed within each memory opening 49 in lieu of the first, second, or third exemplary memory opening fill structure described above.

Figures 8A, 8B:
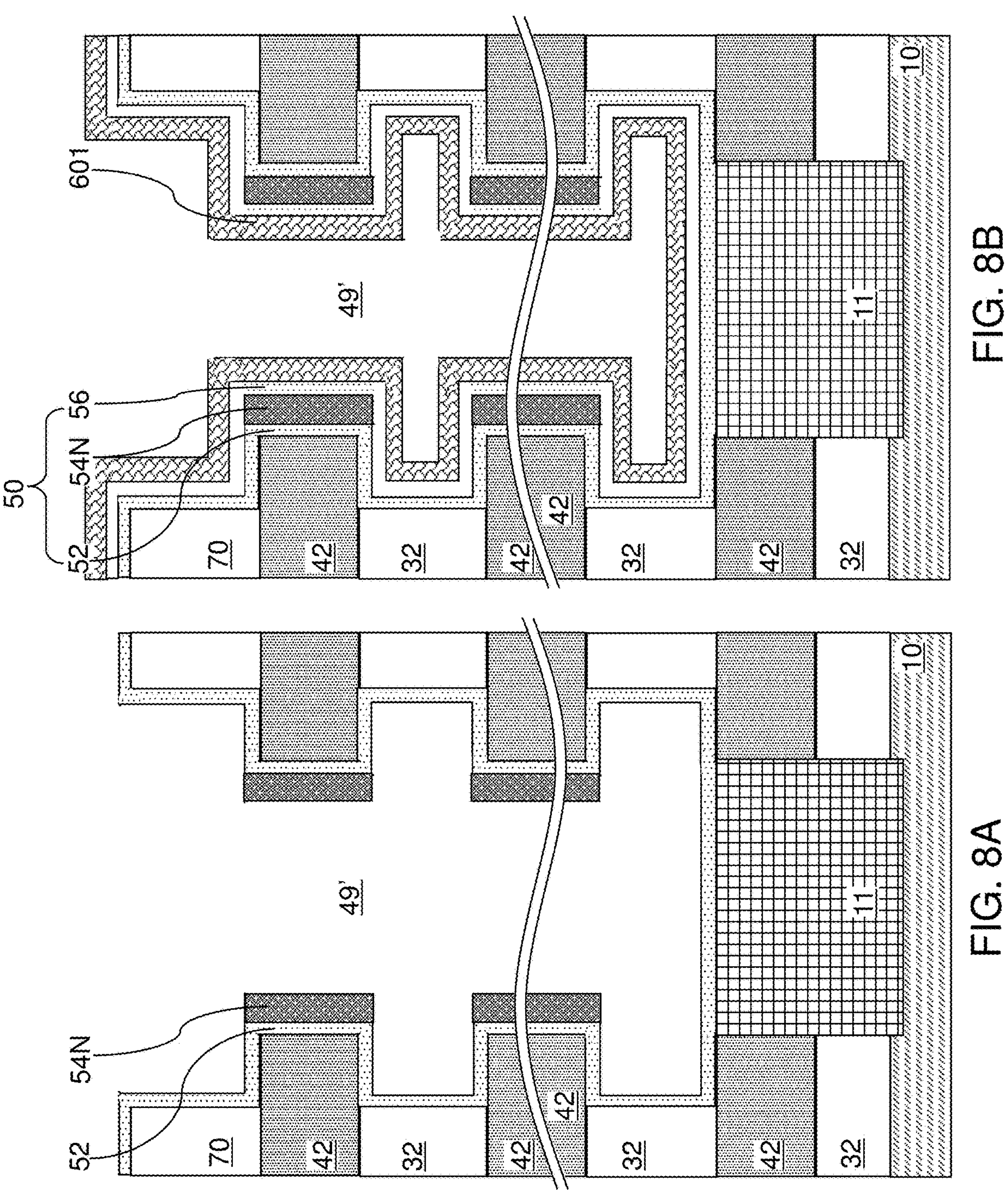
FIGS. 8A-8F are sequential schematic vertical cross-sectional views of a memory opening within the first exemplary structure during formation of a fourth exemplary memory opening fill structure according to a first embodiment of the present disclosure.

Referring to FIG. 8A, the structure for forming a fourth exemplary memory opening fill structure can be derived from the structure of FIG. 5K, the structure of FIG. 6E, or the structure of FIG. 7I by nitriding the vertical stack of semiconductor material portions 54S. The vertical stack of semiconductor material portions 54S is at least partially converted into a vertical stack of silicon nitride material portions 54N, which may be a vertical stack of discrete tubular silicon nitride material portions 54N. In one embodiment, if the vertical stack of semiconductor material portions 54S completely converted into a vertical stack of silicon nitride material portions 54N, then each silicon nitride material portion 54N may have a graded silicon-to-nitrogen ratio with a lower ratio at the inner portion facing the memory opening 49 than at the outer portion facing the spacer material layers 42. In one embodiment, the thickness of each silicon nitride material portion 54N can be in a range from 3 nm to 30 nm, such as from 5 nm to 15 nm, although lesser and greater thicknesses can also be employed.

Referring to FIG. 8B, the processing steps of FIG. 5L can be performed to form the blocking dielectric layer 52 and an optional first semiconductor channel layer 601.

Figures 8C, 8D:
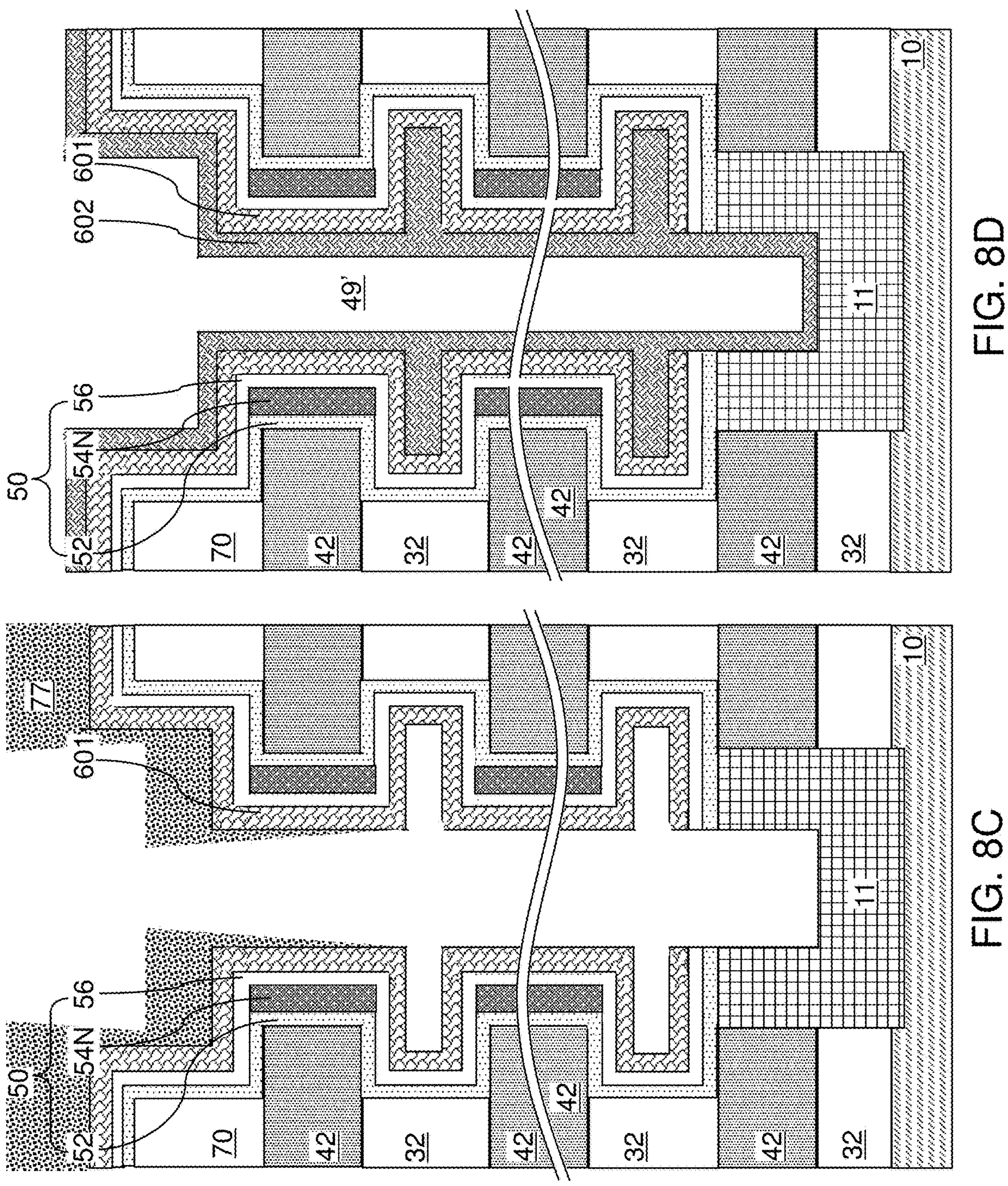

Referring to FIG. 8C, the processing steps of FIG. 5M can be performed to optionally deposit a patterning film 77, and to anisotropically etch horizontal bottom portions of the first semiconductor channel layer 601 (if present), the tunneling dielectric layer 56, and the blocking dielectric layer 52 located over the pedestal channel portion 11 (or located above the upper substrate semiconductor layer 10 in case a pedestal channel portion is not present) at the bottom of each memory opening 49. A center portion of the top surface of the pedestal channel portion 11 can be vertically recessed by the anisotropic etch process. In case a pedestal channel portion 11 is not present in the memory opening 49, a portion of the horizontal surface of the upper substrate semiconductor layer 10 can be vertically recessed underneath the memory opening 49. The patterning film 77 can be subsequently removed, for example, by ashing.

Referring to FIG. 8D, the processing steps of FIG. 5N can be performed to form a second semiconductor channel layer 602. The materials of the first semiconductor channel layer 601 and the second semiconductor channel layer 602 are collectively referred to as a semiconductor channel material. The combination of the blocking dielectric layer 52, the tunneling dielectric layer 56, the first semiconductor channel layer 601, and the second semiconductor channel layer 602 can completely fill the volumes of the annular lateral recesses provided at the levels of the insulating layers 32.

Figures 8E, 8F:
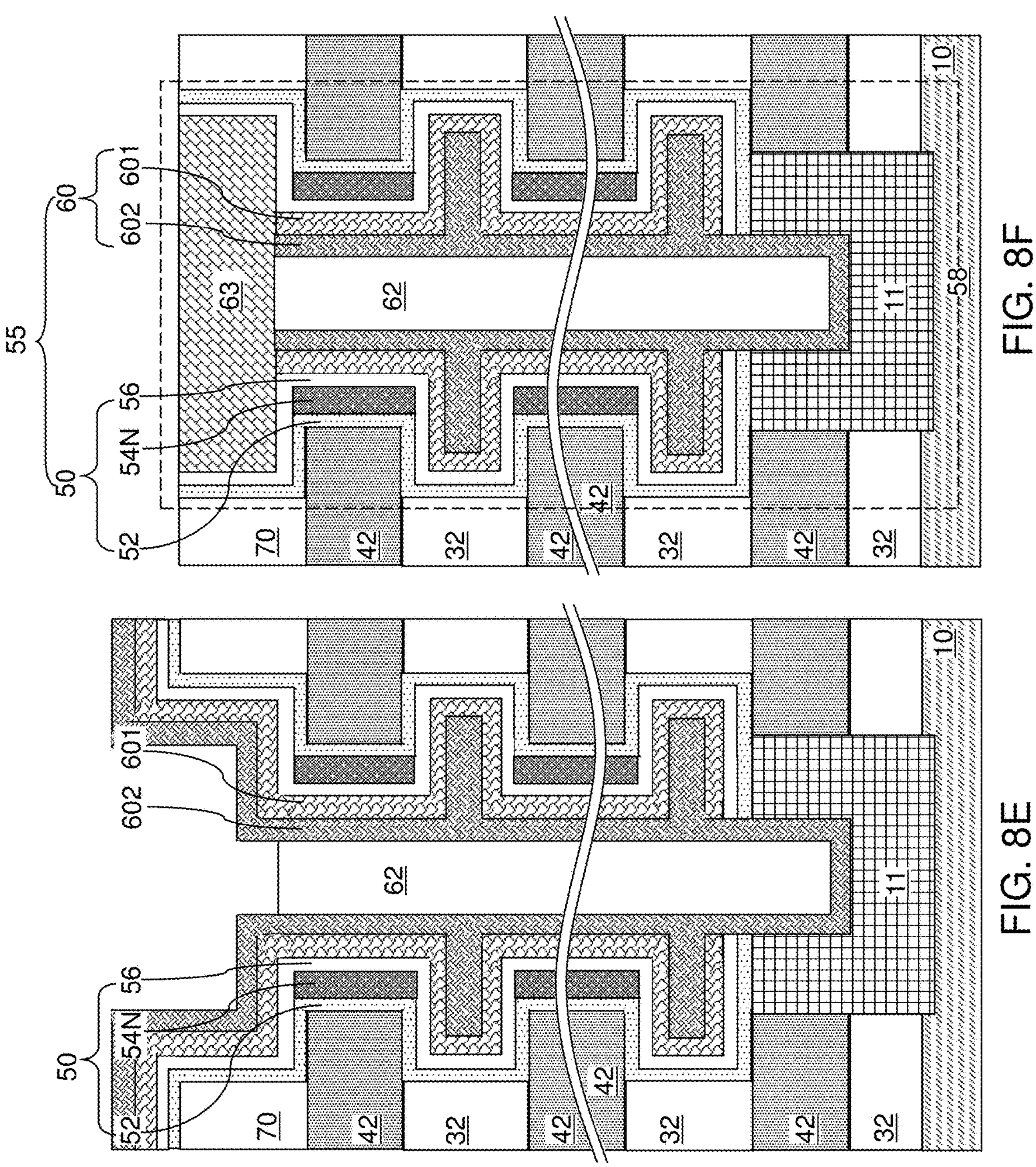
Figure 50:
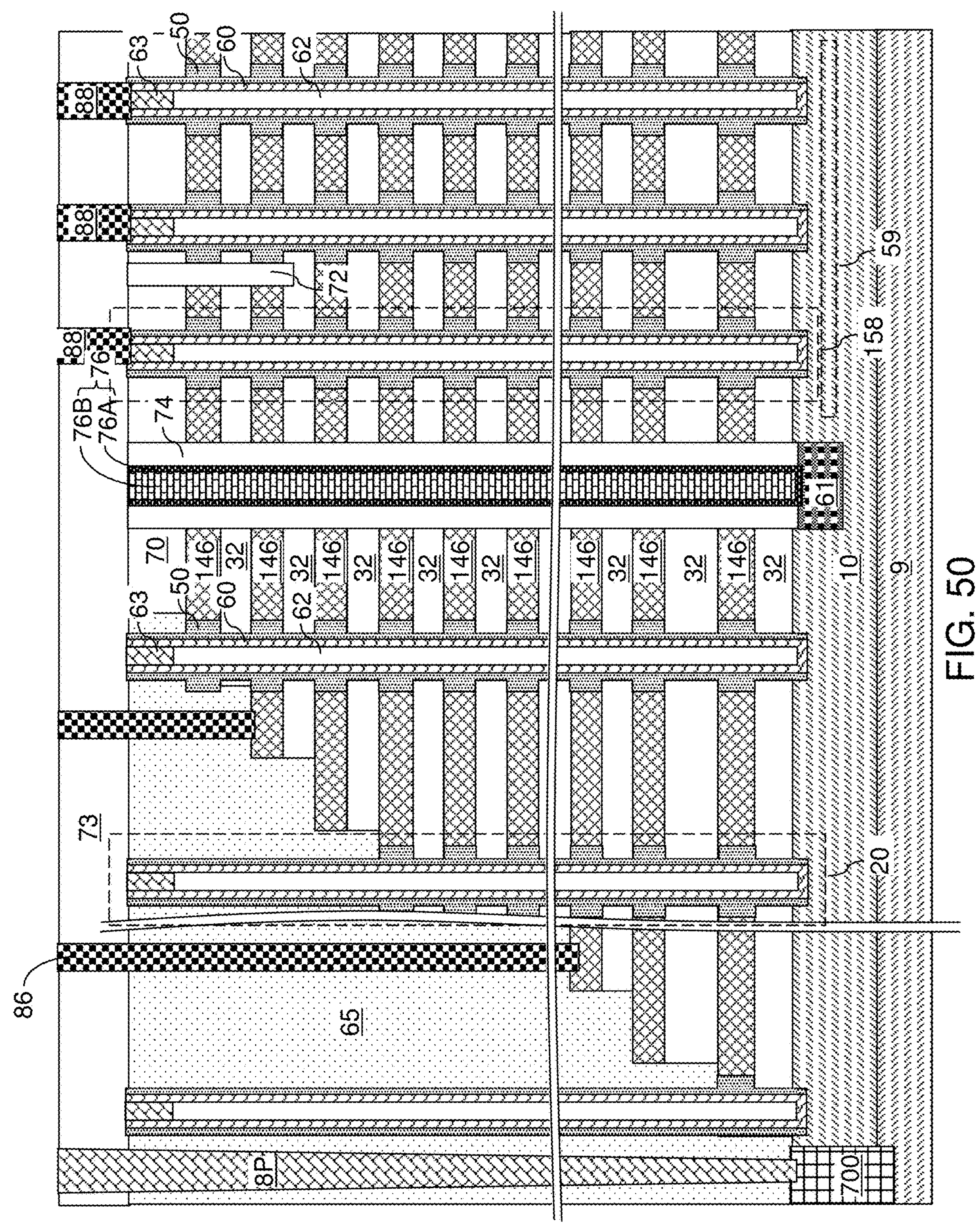
FIG. 50 is a vertical cross-sectional view of the fourth exemplary structure after formation of backside contact via structures according to the fourth embodiment of the present disclosure.

Referring to FIG. 8E, the processing steps of FIG. 50 can be performed to form a dielectric core 62 in each memory opening 49.

Referring to FIG. 8F, the processing steps of FIG. 5P can be performed to form a doped semiconductor portion such as a drain region 63 at an upper portion of each memory opening 49. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a vertical stack of silicon nitride material portions 54N, and laterally surrounds a portion of the vertical semiconductor channel 60. Each adjoining set of a tunneling dielectric layer 56, a vertical stack of silicon nitride material portions 54N, and a blocking dielectric layer 52 collectively constitute a memory film 50, which includes a vertical stack of memory elements that can store a respective data bit with a macroscopic retention time.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising a vertical stack of silicon nitride material portions 54N, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figures 8G, 8H:
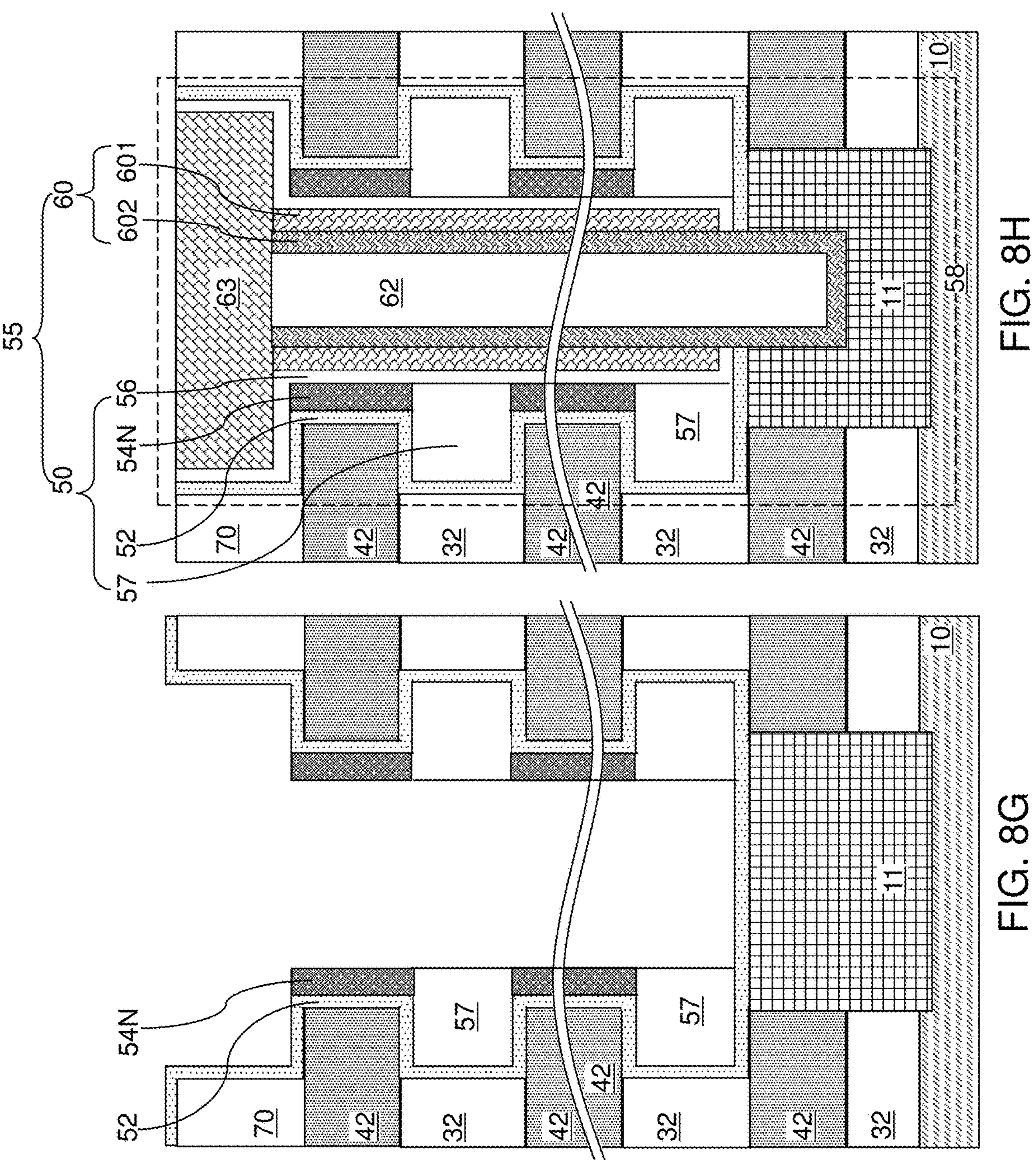
FIGS. 8G and 8H are sequential schematic vertical cross-sectional views of a memory opening during formation of an alternative configuration of the fourth exemplary memory opening fill structure according to a first embodiment of the present disclosure.

FIGS. 8G and 8H illustrate an alternative configuration of the fourth exemplary memory opening fill structure. Referring to FIG. 8G, the alternative configuration of the fourth exemplary memory opening fill structure can be derived from the structure illustrated in FIG. 8A by filling the annular lateral recesses 149 with a dielectric fill material. Specifically, a dielectric fill material such as undoped silicate glass or a doped silicate glass can be deposited in the remaining volumes of the annular lateral recesses 149 after removal of the vertical stack of metal-semiconductor alloy portions 67. In one embodiment, the dielectric fill material may have a higher etch rate than the material of the blocking dielectric layer 52. For example, the dielectric fill material may include borosilicate glass, which can provide an etch rate in dilute hydrofluoric acid than the etch rate of undoped silicate glass by a factor in a range from 100 to 10,000.

Portions of the dielectric fill material can be removed from outside the annular lateral recesses 149 by etching back the dielectric fill material. An isotropic etch process or an anisotropic etch process may be employed. The chemistry of the etch process employed to etch the dielectric fill material can be selective to the material of the silicon nitride material portions 54N and the material of the blocking dielectric layer 52. Remaining portions of the dielectric fill material filling the annular lateral recesses 149 comprise a vertical stack of annular insulating material portions 57. In case an anisotropic etch process is employed to pattern the annular insulating material portions 57, inner sidewalls of the annular insulating material portions 57 may be vertically coincident with inner sidewalls of the silicon nitride material portions 54N.

Referring to FIG. 8H, the processing steps of FIGS. 8B-8F can be performed to provide an alternative configuration of the first exemplary memory opening fill structure 58. In this case, the tunneling dielectric layer 56 can be formed directly on the vertical stack of annular insulating material portions 57. The memory film 50 can comprise the blocking dielectric layer 52, the vertical stack of silicon nitride material portions 54N, the vertical stack of annular insulating material portions 57 (which can contact the vertical stack of silicon nitride material portions 54N), and the tunneling dielectric layer 56.

FIGS. 9A-9F are sequential schematic vertical cross-sectional views of a memory opening within the first exemplary structure during formation of a fifth exemplary memory opening fill structure containing hybrid charge storage structures including discrete dielectric charge storage portions and floating gates, according to an embodiment of the present disclosure. The fifth exemplary memory opening fill structure can be formed within each memory opening 49 in lieu of the first, second, third, or fourth exemplary memory opening fill structure described above.

Figures 9A, 9B:
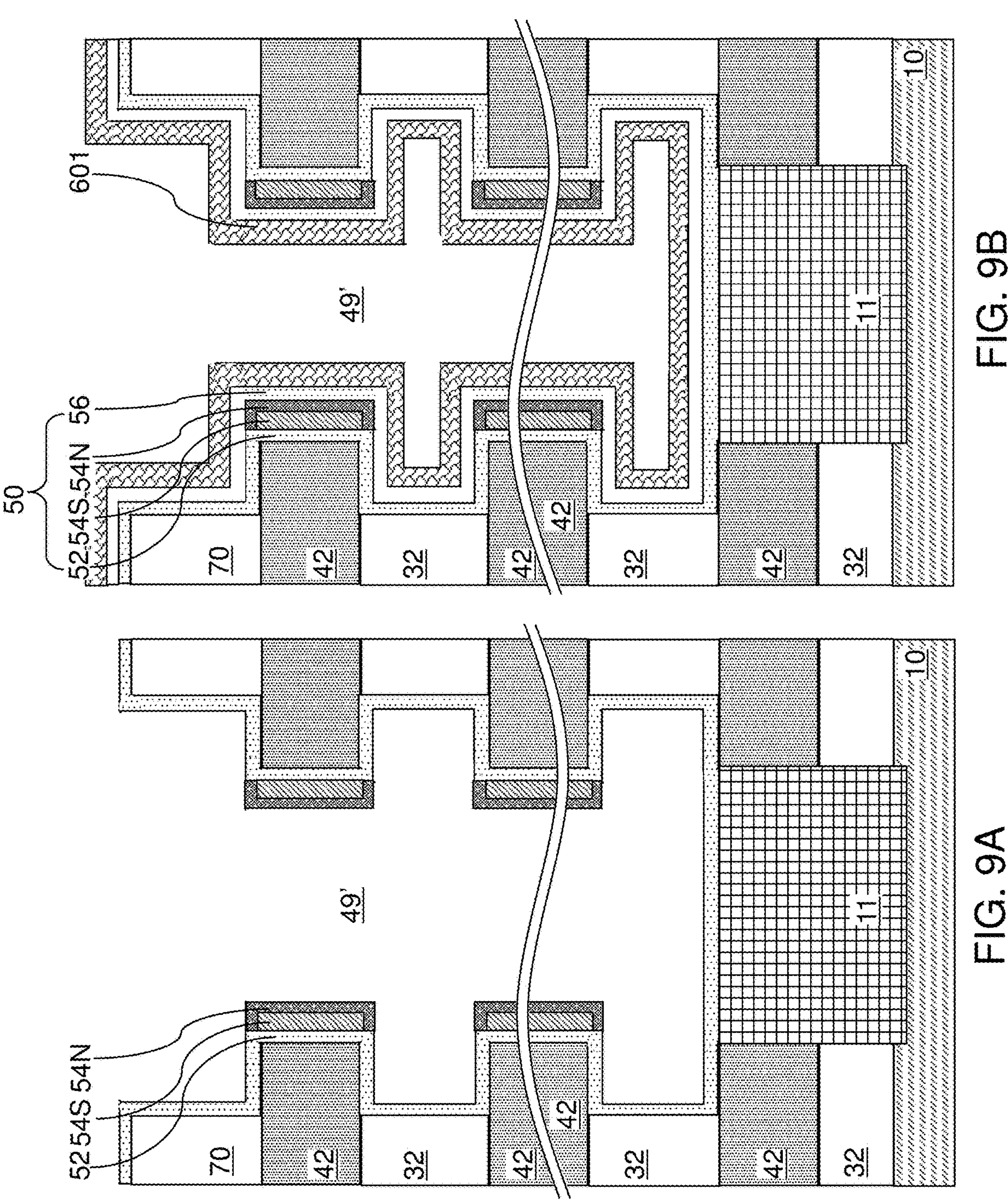
FIGS. 9A-9F are sequential schematic vertical cross-sectional views of a memory opening within the first exemplary structure during formation of a fifth exemplary memory opening fill structure according to a first embodiment of the present disclosure.

Referring to FIG. 9A, the structure for forming a fifth exemplary memory opening fill structure can be derived from the structure of FIG. 5K, the structure of FIG. 6E, or the structure of FIG. 7I by partially nitriding the vertical stack of semiconductor material portions 54S. A vertical stack of composite charge storage structures (54S, 54N) can be formed by converting surface portions of the vertical stack of discrete tubular semiconductor material portions 54S into silicon nitride material portions 54N. Each of the composite charge storage structures (54S, 54N) comprises a respective semiconductor material portion 54S which is a remaining portion of a respective one of the discrete tubular semiconductor material portions 54S and a respective silicon nitride material portion 54N which is formed by nitridation of a surface portion of the respective one of the discrete tubular semiconductor material portions 54S. In one embodiment, each silicon nitride material portion 54N comprises an interfacial region located in proximity to a respective one of the semiconductor material portions 54S and having a graded silicon-to-nitrogen ratio with decreases from portion 54N toward portion 54S. The thickness of each semiconductor material portion 54S can be in a range from 1 nm to 30 nm, such as from 2 nm to 20 nm, although lesser and greater thicknesses can also be employed. The thickness of each silicon nitride material portion 54N can be in a range from 1 nm to 30 nm, such as from 2 nm to 20 nm, although lesser and greater thicknesses can also be employed. The thickness of each composite charge storage structure (54S, 54N) can be in a range from 3 nm to 30 nm, such as from 5 nm to 15 nm, although lesser and greater thicknesses can also be employed.

Referring to FIG. 9B, the processing steps of FIG. 5L can be performed to form the blocking dielectric layer 52 and optionally the first semiconductor channel layer 601.

Figures 9C, 9D:
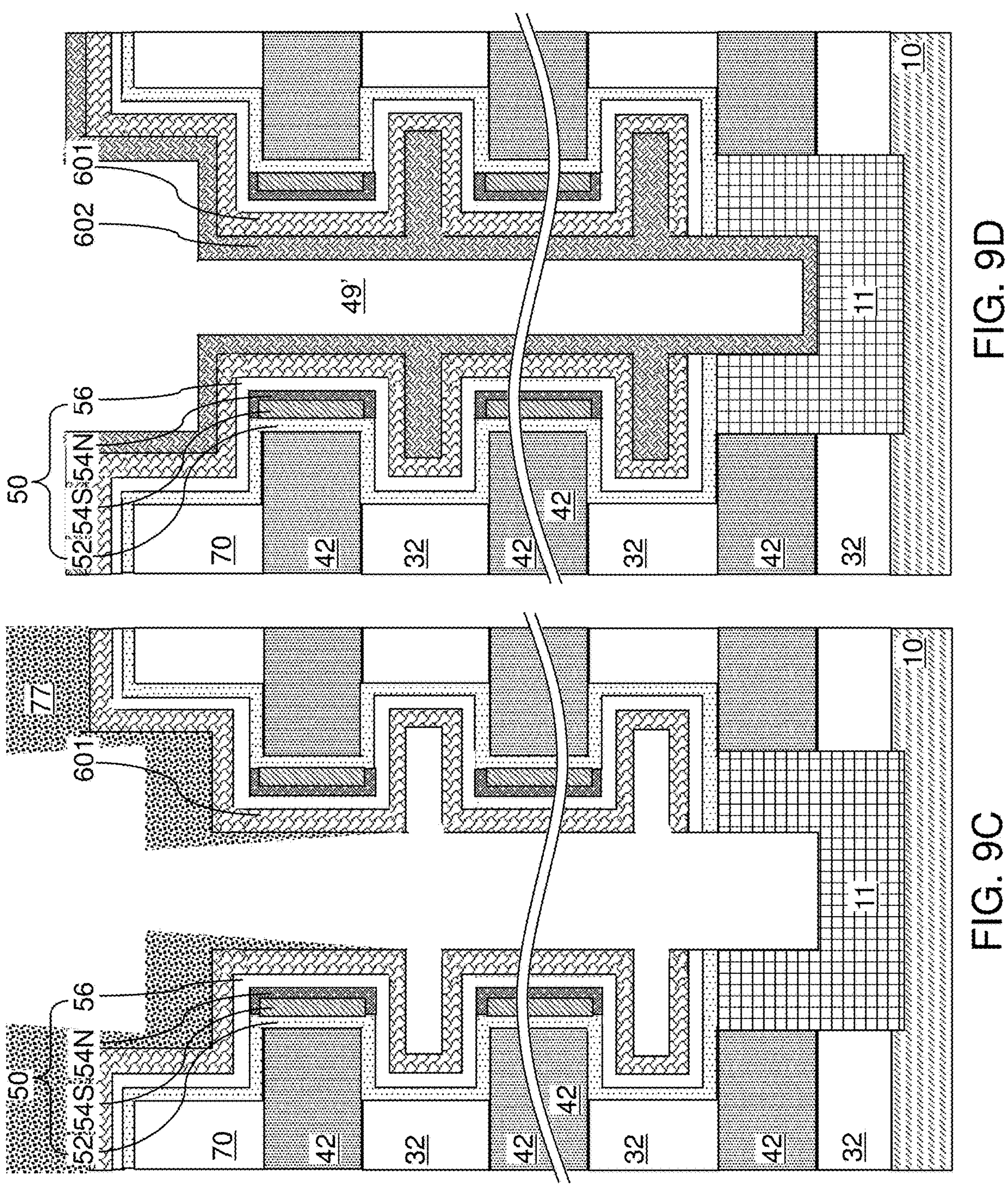

Referring to FIG. 9C, the processing steps of FIG. 5M can be performed to deposit a patterning film 77, and to anisotropically etch horizontal bottom portions of the first semiconductor channel layer 601, the tunneling dielectric layer 56, and the blocking dielectric layer 52 located over the pedestal channel portion 11 (or located above the upper substrate semiconductor layer 10 in case a pedestal channel portion is not present) at the bottom of each memory opening 49. A center portion of the top surface of the pedestal channel portion 11 can be vertically recessed by the anisotropic etch process. In case a pedestal channel portion 11 is not present in the memory opening 49, a portion of the horizontal surface of the upper substrate semiconductor layer 10 can be vertically recessed underneath the memory opening 49. The patterning film 77 can be subsequently removed, for example, by ashing.

Referring to FIG. 9D, the processing steps of FIG. 5N can be performed to form a second semiconductor channel layer 602. The materials of the first semiconductor channel layer 601 and the second semiconductor channel layer 602 are collectively referred to as a semiconductor channel material. The combination of the blocking dielectric layer 52, the tunneling dielectric layer 56, the first semiconductor channel layer 601, and the second semiconductor channel layer 602 can completely fill the volumes of the annular lateral recesses provided at the levels of the insulating layers 32.

Figures 9E, 9F:
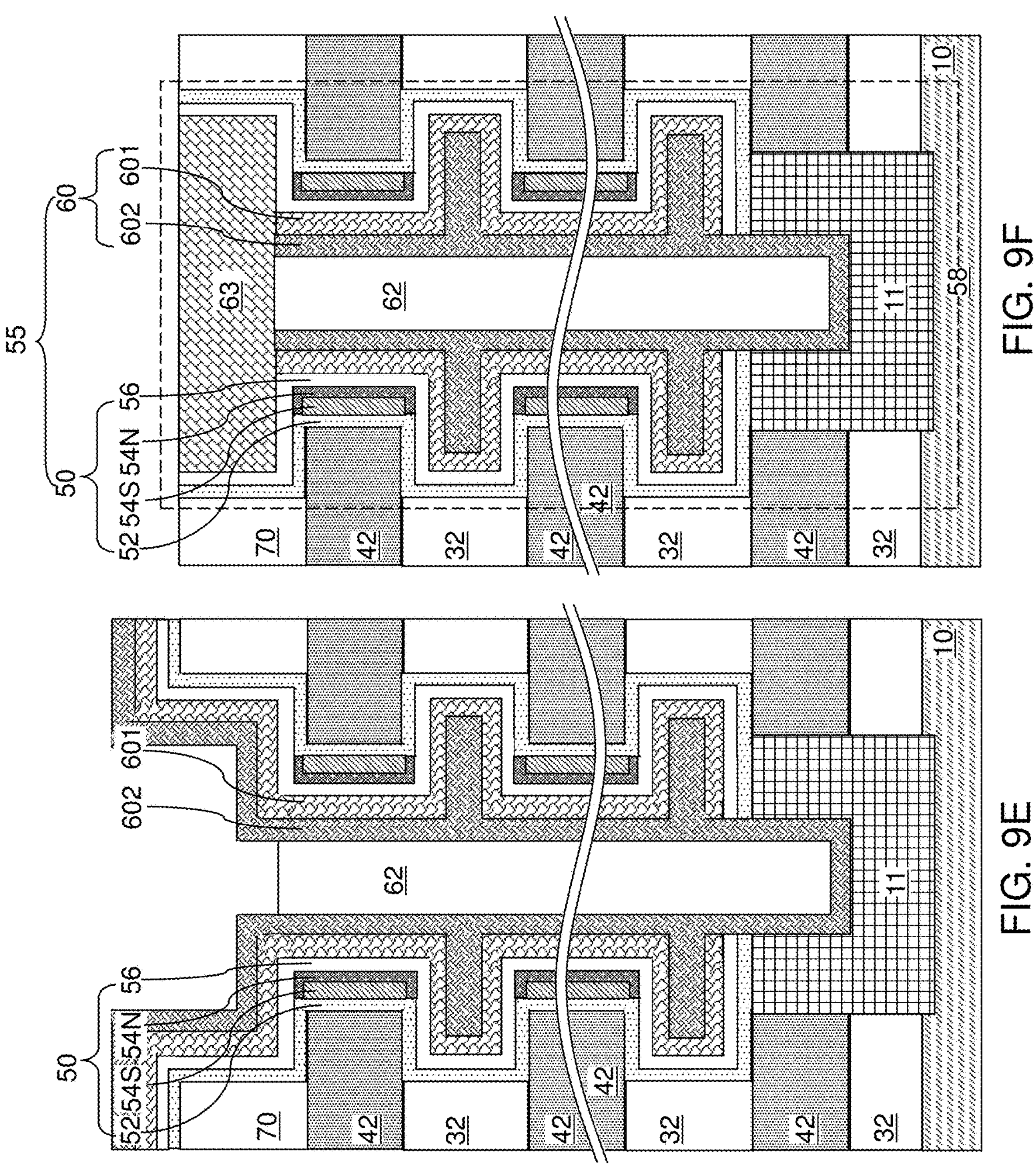

Referring to FIG. 9E, the processing steps of FIG. 50 can be performed to form a dielectric core 62 in each memory opening 49.

Referring to FIG. 9F, the processing steps of FIG. 5P can be performed to form a doped semiconductor portion such as a drain region 63 at an upper portion of each memory opening 49. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a vertical stack of composite charge storage structures (54S, 54N), and laterally surrounds a portion of the vertical semiconductor channel 60. Each adjoining set of a tunneling dielectric layer 56, a vertical stack of composite charge storage structures (54S, 54N), and a blocking dielectric layer 52 collectively constitute a memory film 50, which includes a vertical stack of memory elements that can store a respective data bit with a macroscopic retention time.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising a vertical stack of composite charge storage structures (54S, 54N), and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figures 9G, 9H:
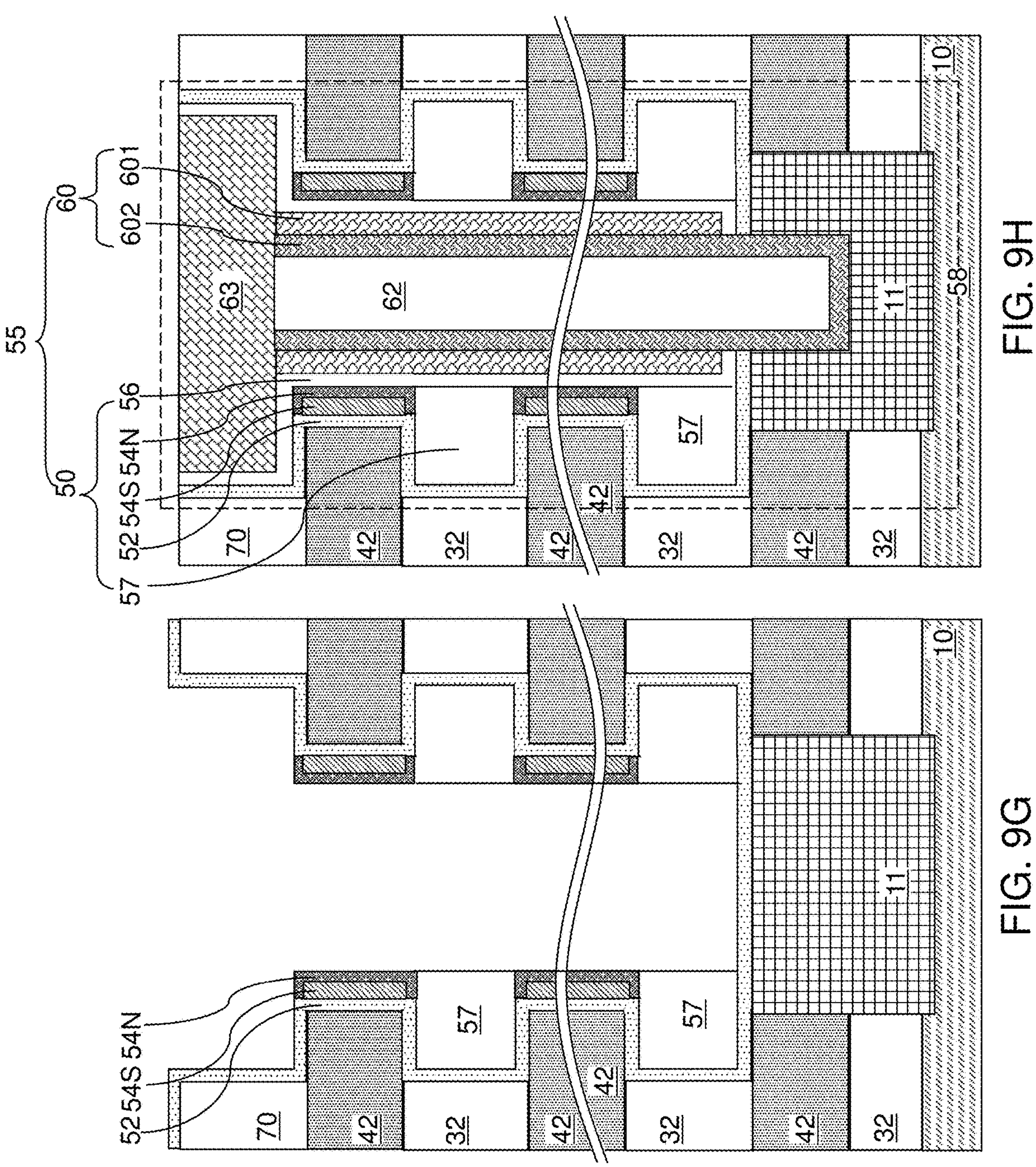
FIGS. 9G and 9H are sequential schematic vertical cross-sectional views of a memory opening during formation of an alternative configuration of the fifth exemplary memory opening fill structure according to a first embodiment of the present disclosure.

FIGS. 9G and 9H illustrate an alternative configuration of the fourth exemplary memory opening fill structure. Referring to FIG. 9G, the alternative configuration of the fourth exemplary memory opening fill structure can be derived from the structure illustrated in FIG. 9A by filling the annular lateral recesses 149 with a dielectric fill material. Specifically, a dielectric fill material such as undoped silicate glass or a doped silicate glass can be deposited in the remaining volumes of the annular lateral recesses 149 after removal of the vertical stack of metal-semiconductor alloy portions 67. In one embodiment, the dielectric fill material may have a higher etch rate than the material of the blocking dielectric layer 52. For example, the dielectric fill material may include borosilicate glass, which can provide an etch rate in dilute hydrofluoric acid than the etch rate of undoped silicate glass by a factor in a range from 100 to 10,000.

Portions of the dielectric fill material can be removed from outside the annular lateral recesses 149 by etching back the dielectric fill material. An isotropic etch process or an anisotropic etch process may be employed. The chemistry of the etch process employed to etch the dielectric fill material can be selective to the material of the composite charge storage structures (54S, 54N) and the material of the blocking dielectric layer 52. Remaining portions of the dielectric fill material filling the annular lateral recesses 149 comprise a vertical stack of annular insulating material portions 57. In case an anisotropic etch process is employed to pattern the annular insulating material portions 57, inner sidewalls of the annular insulating material portions 57 may be vertically coincident with inner sidewalls of the composite charge storage structures (54S, 54N).

Referring to FIG. 9H, the processing steps of FIGS. 9B-9F can be performed to provide an alternative configuration of the first exemplary memory opening fill structure 58. In this case, the tunneling dielectric layer 56 can be formed directly on the vertical stack of annular insulating material portions 57. The memory film 50 can comprise the blocking dielectric layer 52, the vertical stack of composite charge storage structures (54S, 54N), the vertical stack of annular insulating material portions 57 (which can contact the vertical stack of composite charge storage structures (54S, 54N)), and the tunneling dielectric layer 56.

FIGS. 10A-10M are sequential schematic vertical cross-sectional views of a memory opening within the first exemplary structure during formation of a sixth exemplary memory opening fill structure containing floating gates with flange portions according to an embodiment of the present disclosure. The sixth exemplary memory opening fill structure can be formed within each memory opening 49 in lieu of the first, second, third, fourth, or fifth exemplary memory opening fill structure described above.

Figures 10A, 10B:
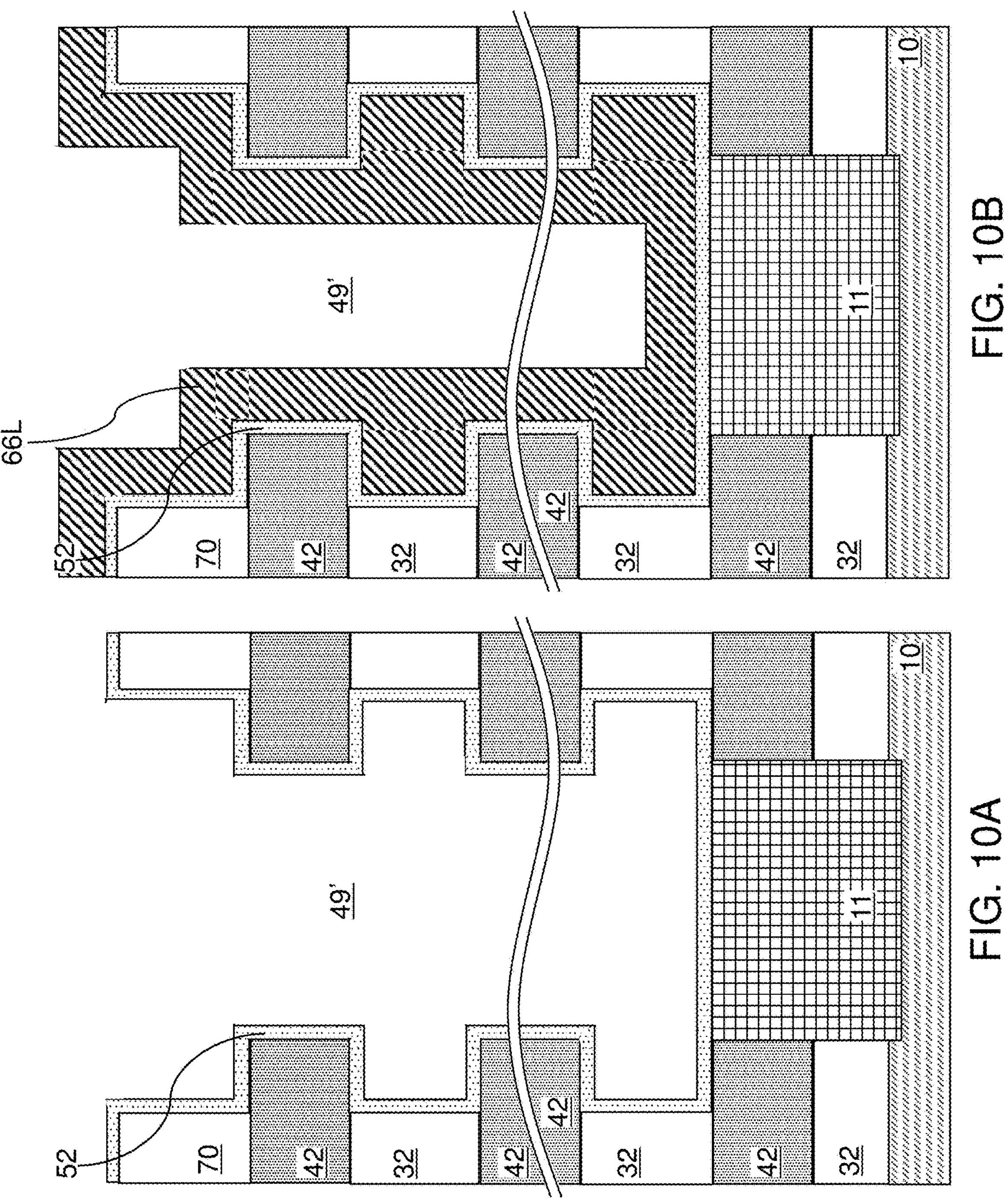
FIGS. 10A-10M are sequential schematic vertical cross-sectional views of a memory opening within the first exemplary structure during formation of a sixth exemplary memory opening fill structure according to a first embodiment of the present disclosure.

Referring to FIG. 10A, a structure for forming a sixth exemplary memory opening fill structure is illustrated, which may be the same as the structure of FIG. 5D.

Referring to FIG. 10B, a metal layer 66L can be conformally deposited on the inner sidewalls of the blocking dielectric layer. The metal layer 66L can include any metal that can form a metal-semiconductor alloy such as a metal silicide. In one embodiment, the metal layer 66L can include at least one transition metal that can form a metal silicide. For example, the metal layer 66L can include tungsten, titanium, cobalt, molybdenum, platinum, nickel, and/or any other transition metal that forms a metal silicide upon reaction with silicon. The metal layer 66L can be deposited by a conformal deposition method such as a chemical vapor deposition process or an atomic layer deposition process. The thickness of the metal layer 66L may be greater than one half of the thickness of each insulating layer 32. In one embodiment, the metal layer fills an entire volume of each cavity in the annular lateral recesses 149. In one embodiment, the thickness of the metal layer 66L over sidewalls of the spacer material layers (such as the sacrificial material layers 42) can be in a range from 10 nm to 50, such as from 20 nm to 25 nm, although lesser and greater thicknesses can also be employed.

Figures 10C, 10D:
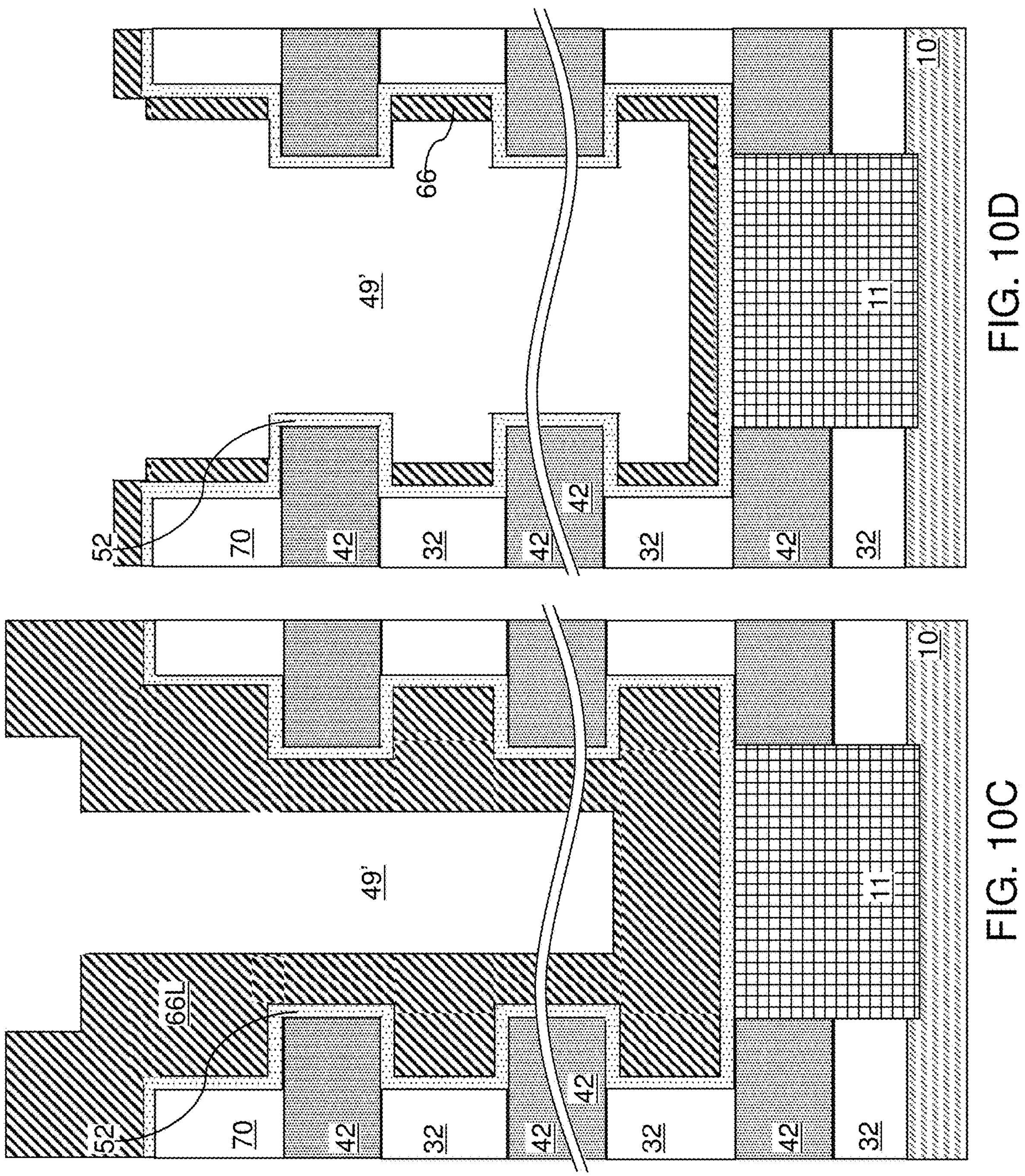

Referring to FIG. 10C, an optional anisotropic deposition process, such as a physical vapor deposition process (e.g., sputtering), may be optionally performed to deposit additional portions of the metal on horizontal surfaces of the metal layer 66L. Horizontal portions of the metal layer 66L can be thickened. The anisotropic metal deposition process increases the thickness of horizontal portions of the metal layer 66L so that removal of horizontal portions of a semiconductor material layer through formation of metal-semiconductor alloy portions is facilitated at a subsequent processing step. Alternatively, the step of FIG. 10C may be omitted.

Referring to FIG. 10D, an isotropic etch process such as a wet etch process can be performed to thin the metal layer 66L (i.e., to partially recess the metal layer 66L). Alternatively, if the metal layer 66L comprises cobalt, then the metal layer 66L may self-segregate during an anneal as described above to form the structure shown in FIG. 10D. Remaining portions of the metal layer 66L include vertical stack of discrete metal portions 66.

The discrete metal portions 66 can be formed within but not completely filling a respective one of the annular lateral recesses 149 of the memory opening 49. Each discrete metal portion 66 within the vertical stack of discrete metal portions 66 comprises an inner sidewall that is laterally offset outward from portions of an inner sidewall of the blocking dielectric layer 52 located at levels of the spacer material layers (such as the sacrificial material layers 42).

Thus, the vertical stack of discrete metal portions 66 can be formed in the annular lateral recesses 149. The vertical stack of discrete metal portions 66 is formed directly on portions of an inner sidewall of the blocking dielectric layer 52 located at levels of the insulating layers 32.

The discrete metal portions 66 may have a respective tubular shape. Each discrete metal portion 66 can have an inner sidewall that is laterally offset outward from sidewalls of the spacer material layers (such as the sacrificial material layers 42). In one embodiment, the discrete metal portion 66 can comprise, and/or can consist essentially of, tungsten, titanium, cobalt, molybdenum, platinum, nickel, and/or any other transition metal that forms a metal silicide upon reaction with silicon. In one embodiment, the discrete metal portions 66 can have a thickness in a range from 2 nm to 20 nm, such as from 4 nm to 10 nm, although lesser and greater thicknesses can also be employed. Horizontal remaining portions of the metal layer 66L may be present over the top surface of the pedestal channel portion 11 and over the top surface of the insulating cap layer 70.

Figures 10E, 10F:
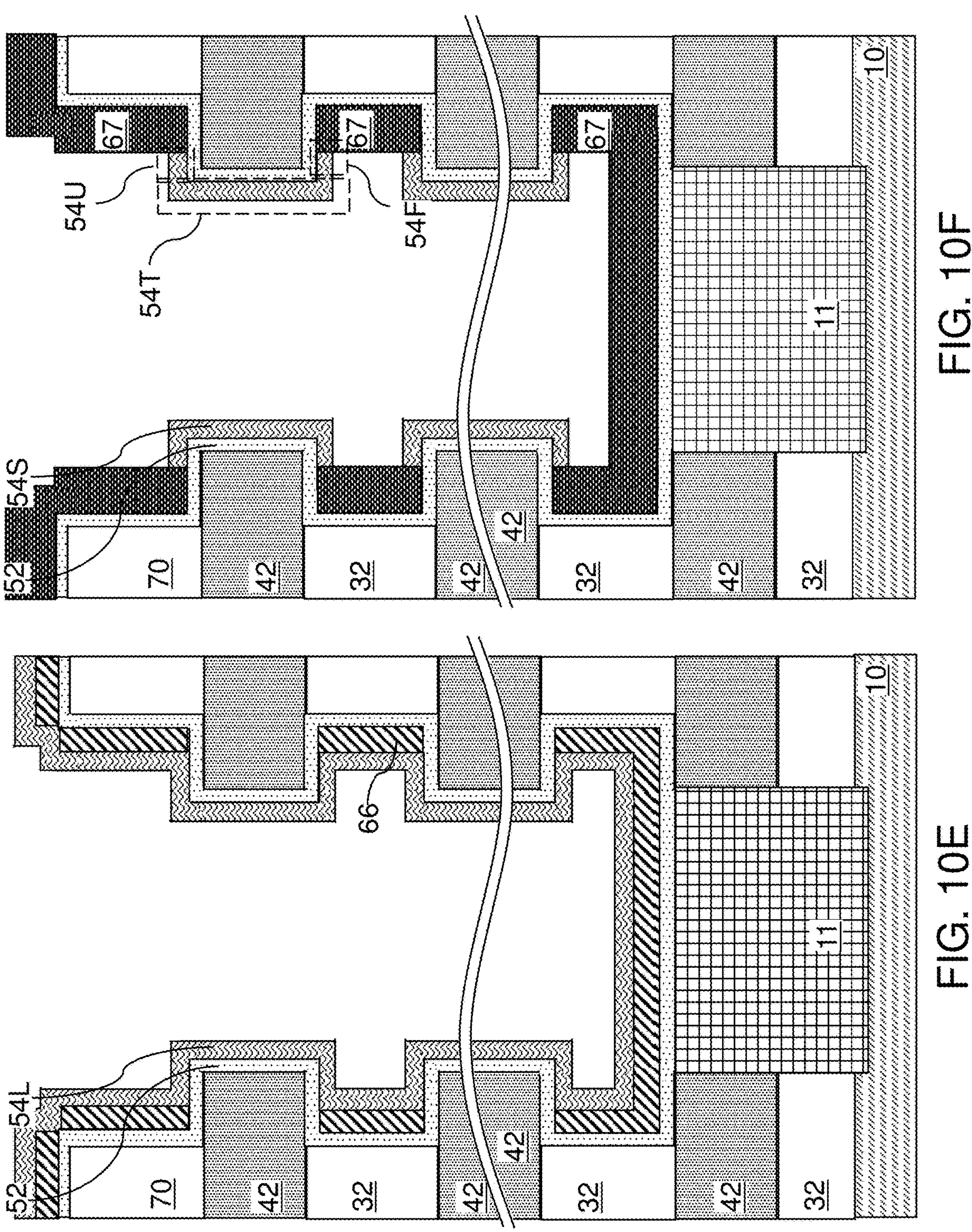

Referring to FIG. 10E, a semiconductor material layer 54L can be conformally deposited on the physically exposed surfaces of the vertical stack of the metal portions 66 and on the physically exposed surfaces of the blocking dielectric layer 52. The semiconductor material layer 54L includes a semiconductor material that can form a metal-semiconductor alloy with the material of the metal portions 66. For example, the semiconductor material layer 54L can include silicon and/or germanium. In one embodiment, the semiconductor material layer 54L can include amorphous silicon, polysilicon, germanium, and/or a silicon-germanium alloy. The thickness of the semiconductor material layer 54L can be selected such that the entirety of the vertical stack of discrete metal portions 66 can react with the semiconductor material of the semiconductor material layer 54L during a subsequent anneal process. In one embodiment, the semiconductor material layer 54L can have a thickness in a range from 2 nm to 20 nm, such as from 4 nm to 10 nm, although lesser and greater thicknesses can also be employed.

Referring to FIG. 10F, a thermal anneal process is performed at an elevated temperature that induces formation of a metal-semiconductor alloy between the material of the metal portions 66 and the material of the semiconductor material layer 54L. The elevated temperature may be in a range from 400 degrees Celsius to 1,000 degrees Celsius, although lower and higher temperatures may also be employed depending on the composition of the metal-semiconductor alloy. It is not necessary to form a low-resistance phase metal-semiconductor alloy as required for typical semiconductor applications in this case. Even high-resistance intermediate phase metal-semiconductor alloys formed at a relatively low temperature is sufficient provided that such metal-semiconductor alloys can be subsequently removed selective to unreacted portions of the semiconductor material layer 54L in a selective etch process. Generally, the thickness of the discrete metal portions 66 and the thickness of the semiconductor material layer 54L can be selected to ensure that the entire volume of the metal portions 66 react with the semiconductor material layer 54L to form metal-semiconductor alloy portions 67. A vertical stack of metal-semiconductor alloy portions 67 can be formed by reacting the vertical stack of metal portions 66 with portions of the semiconductor material layer 54L located at levels of the insulating layers 32. Unreacted portions of the semiconductor material layer 54L remain at each level of the sacrificial material layers 42 located over the top surface of the pedestal channel portion 11. The set of unreacted portions of the semiconductor material layer 54L in the memory opening 49 comprise a vertical stack of semiconductor material portions 54S.

In one embodiment, the metal-semiconductor alloy portions 67 can be laterally offset outward from a cylindrical vertical plane including sidewalls of the spacer material layers (such as the sacrificial material layers 42) around the memory opening 49, while parts of the semiconductor material portions 54S protrude into the recesses 149. Specifically, each of the semiconductor material portions 54S comprises a tubular portion 54T, an upper flange portion 54U laterally extending outward into the recess 149 from an upper end of an outer sidewall of the tubular portion 54T, and a lower flange portion 54F laterally extending outward into the recess 149 from a lower end of the outer sidewall of the tubular portion 54T.

Figures 10G, 10H:
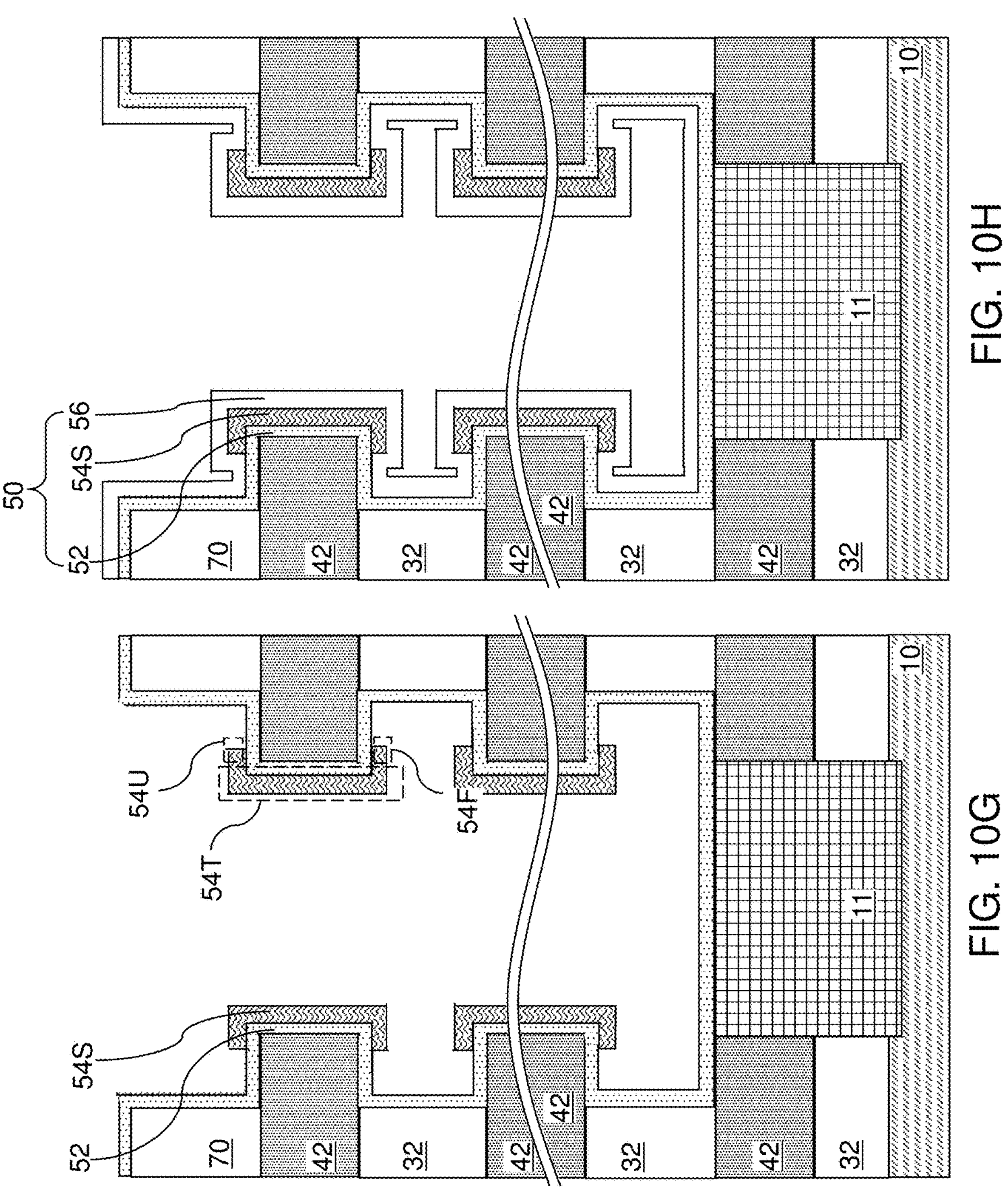

Referring to FIG. 10G, a selective isotropic etch process that etches the material of the metal-semiconductor alloy portions 67 selective to the material of the semiconductor material portions 54S can be performed. The vertical stack of metal-semiconductor alloy portions 67 is removed selective to unreacted portions of the semiconductor material layer 54L, i.e., the vertical stack of semiconductor material portions 54S. The vertical stack of semiconductor material portions 54S remain at levels of the spacer material layers (such as the sacrificial material layers 42) and extends partially into the recesses 149. In one embodiment, each of the semiconductor material portions 54S comprises a tubular portion 54T, an upper flange portion 54U, and a lower flange portion 54F. The upper flange portion 54U and the lower flange portion 54F of each semiconductor material portion 54S are located in the recess 149 and provide increased charge trapping volume in additional to the charge trapping volume provided by the tubular portion 54T. Thus, the thickness of the spacer material layers (such as the sacrificial material layers 42) can be reduced relative to conventional NAND devices in which charge storage elements do not include flange portions. The vertical stack of discrete semiconductor material portions 54S can be subsequently employed as a vertical stack of charge storage elements, which can function as floating gates of a NAND string. Portions of the inner sidewall of the blocking dielectric layer 52 are physically exposed after removal of the vertical stack of metal-semiconductor alloy portions 67. The vertical stack of discrete metal portions 66 and portions of the semiconductor material layer 54L that are adjacent to the vertical stack of discrete metal portions 66 are removed in the form of a vertical stack of metal-semiconductor alloy portions 67.

Referring to FIG. 10H, a tunneling dielectric layer 56 can be deposited employing a conformal deposition process such as a chemical vapor deposition process, as described in the previous embodiments. The tunneling dielectric layer 56 can be formed directly on the portions of the inner sidewall of the blocking dielectric layer 52 that are physically exposed and located at the levels of the insulating layers 32. The tunneling dielectric layer 56 can also be formed directly on the vertical stack of discrete cylindrical semiconductor material portions 54S. The combination of the blocking dielectric layer 52, the vertical stack of semiconductor material portions 54S, and the tunneling dielectric layer 56 constitutes a memory film 50.

Figures 10I, 10J:
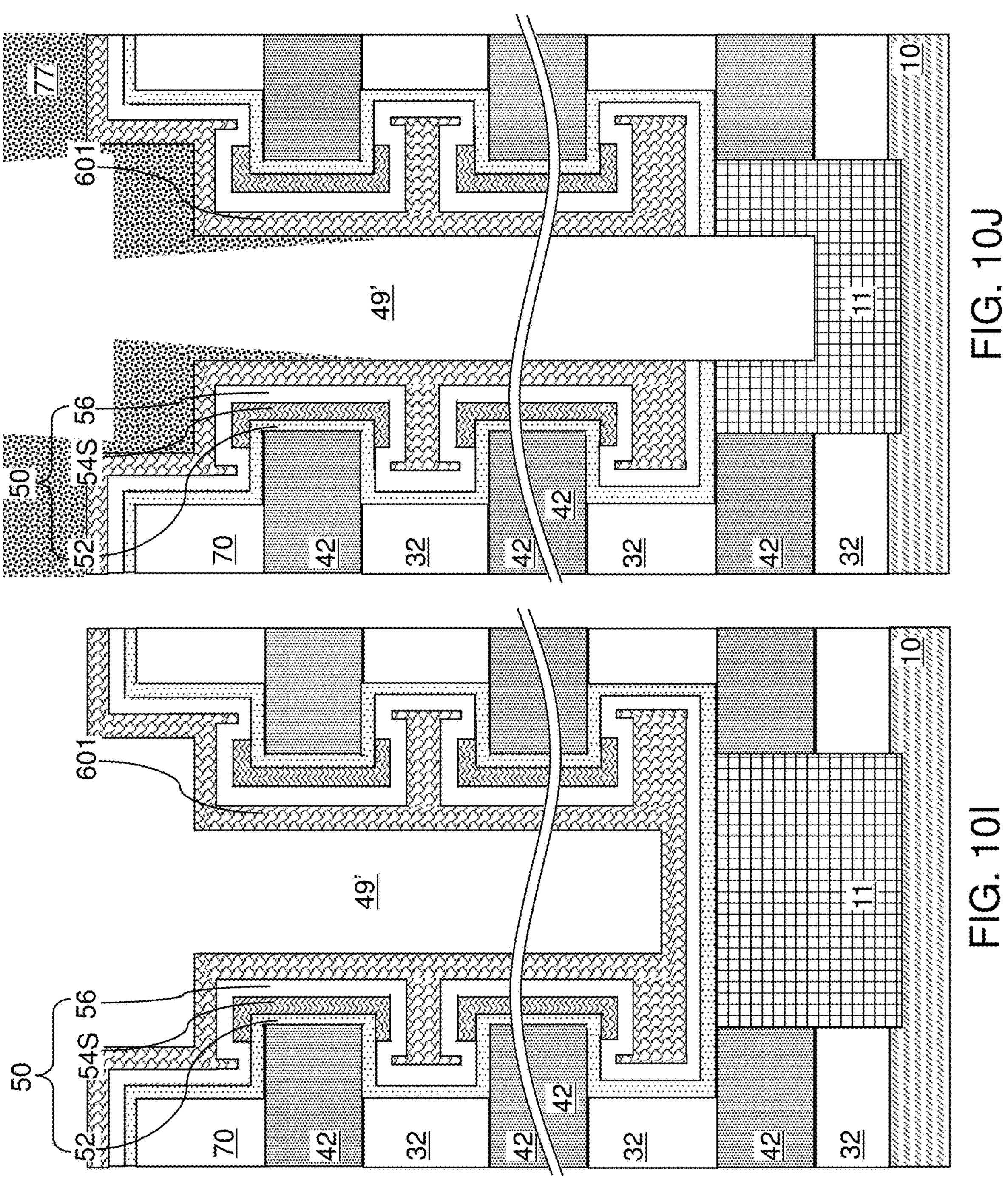

Referring to FIG. 10I, the processing steps of FIG. 5L can be performed to form the optional first semiconductor channel layer 601 on the tunneling dielectric layer 56.

Referring to FIG. 10J, the processing steps of FIG. 5M can optionally be performed to deposit an optional patterning film 77. An anisotropic etch process can be performed to remove the horizontal bottom portions of the first semiconductor channel layer 601 (if present), the tunneling dielectric layer 56, and the blocking dielectric layer 52 located over the pedestal channel portion 11 (or located above the upper substrate semiconductor layer 10 in case a pedestal channel portion is not present) at the bottom of each memory opening 49. A set of the blocking dielectric layer 52, the vertical stack of semiconductor material portions 54S, and the tunneling dielectric layer 56 in a memory opening 49 constitutes a memory film 50. In one embodiment, the first semiconductor channel layer 601, the tunneling dielectric layer 56, and the blocking dielectric layer 52 can have vertically coincident sidewalls. The patterning film 77 (if present) can be subsequently removed, for example, by ashing.

Figures 10K, 10L:
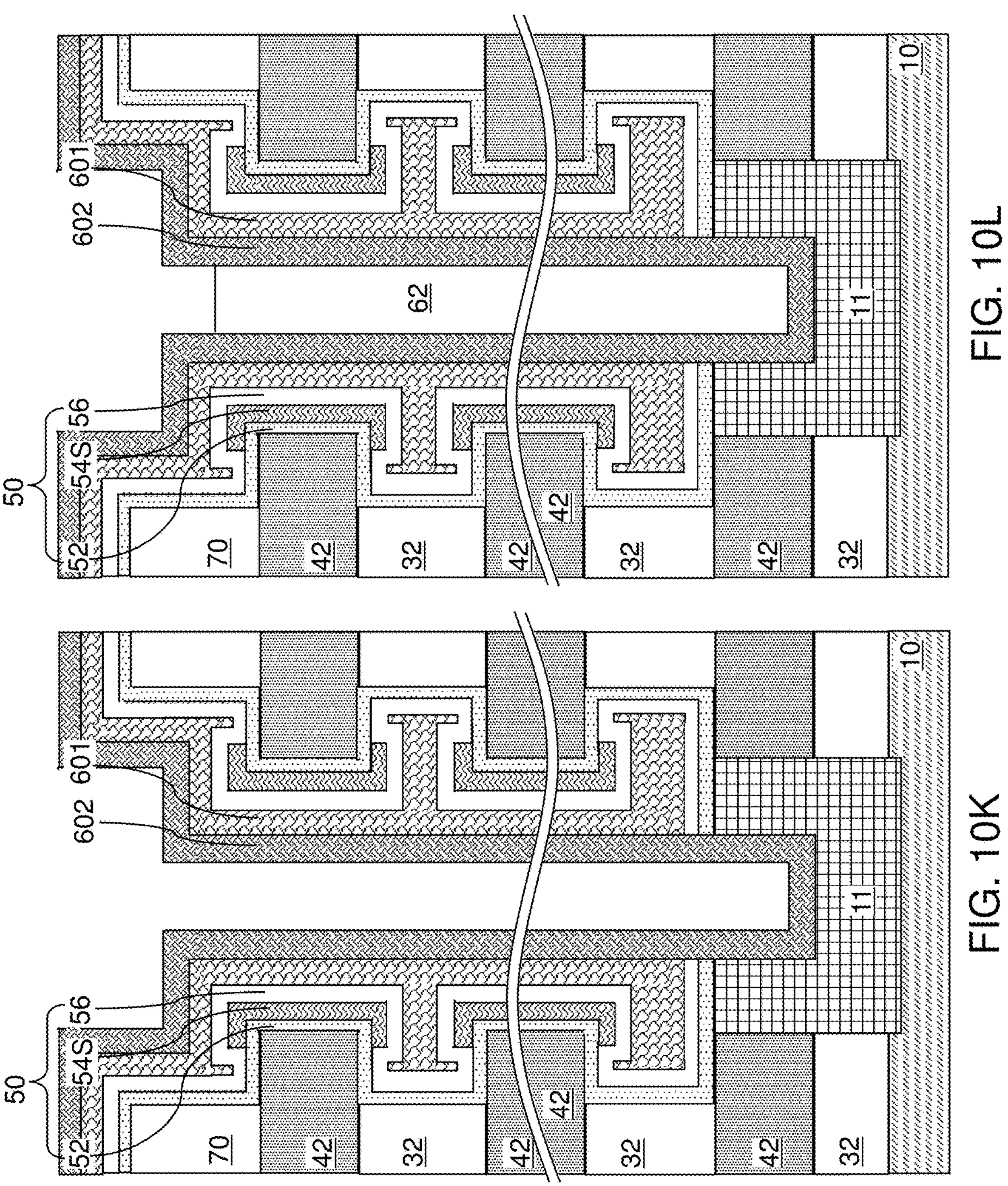

Referring to FIG. 10K, the processing steps of FIG. 5N can be performed to deposit a second semiconductor channel layer 602. The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602. The combination of flange portions of the semiconductor material portions 54S, the blocking dielectric layer 52, the tunneling dielectric layer 56, the first semiconductor channel layer 601, and the second semiconductor channel layer 602 can completely fill the volumes of the annular lateral recesses 149 provided at the levels of the insulating layers 32.

Referring to FIG. 10L, the processing steps of FIG. 50 can be performed to form a dielectric core 62.

Figures 10M, 10N:
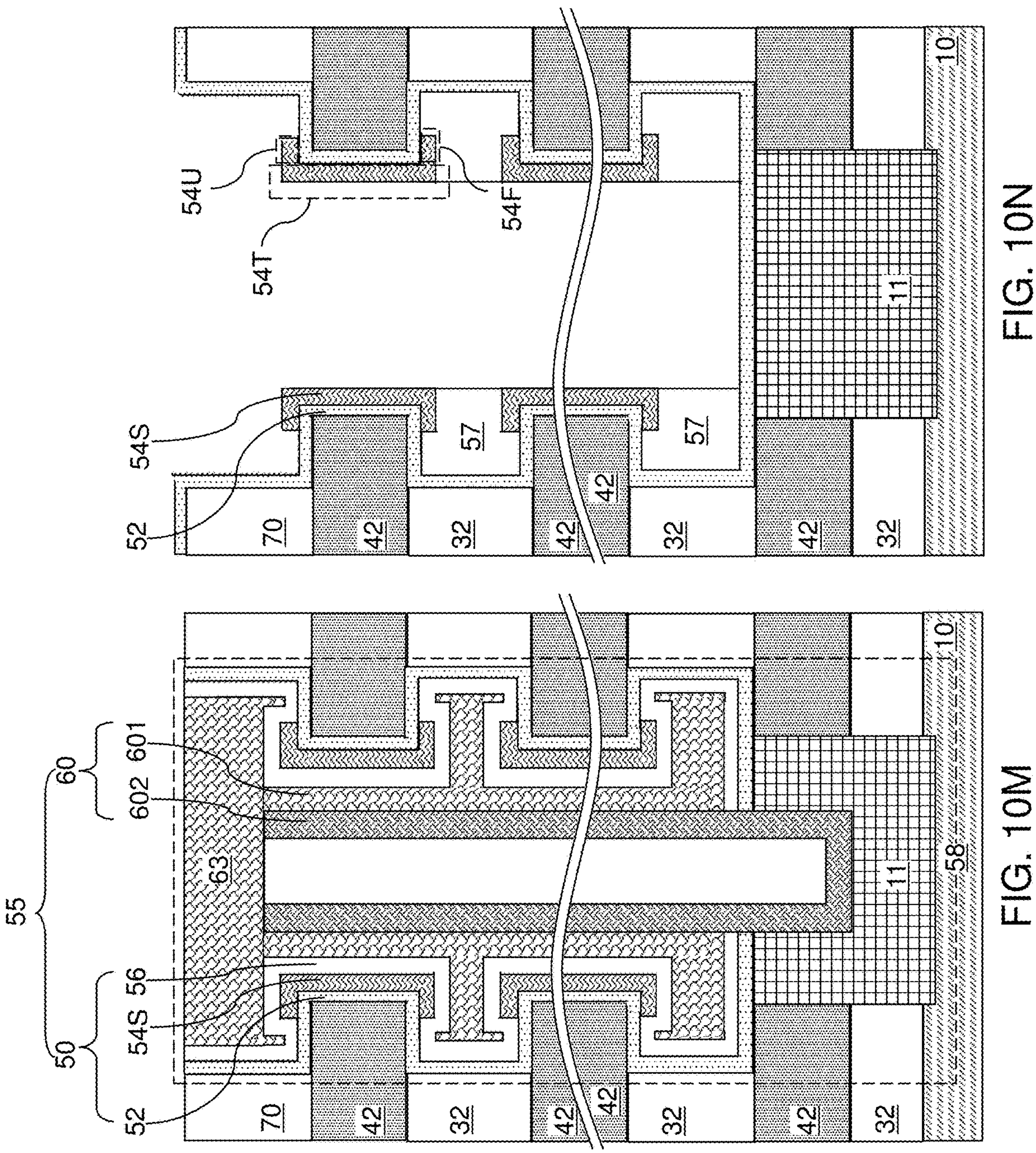
FIGS. 10N and 10O are sequential schematic vertical cross-sectional views of a memory opening during formation of an alternative configuration of the sixth exemplary memory opening fill structure according to a first embodiment of the present disclosure.

Referring to FIG. 10M, the processing steps of FIG. 5P can be performed to form a doped semiconductor material portion such as a drain region 63. Each adjoining set of a tunneling dielectric layer 56, a vertical stack of semiconductor material portions 54S, and a blocking dielectric layer 52 collectively constitute a memory film 50, which includes a vertical stack of memory elements that can store a respective data bit with a macroscopic retention time. Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising a vertical stack of semiconductor material portions 54S, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 10O:
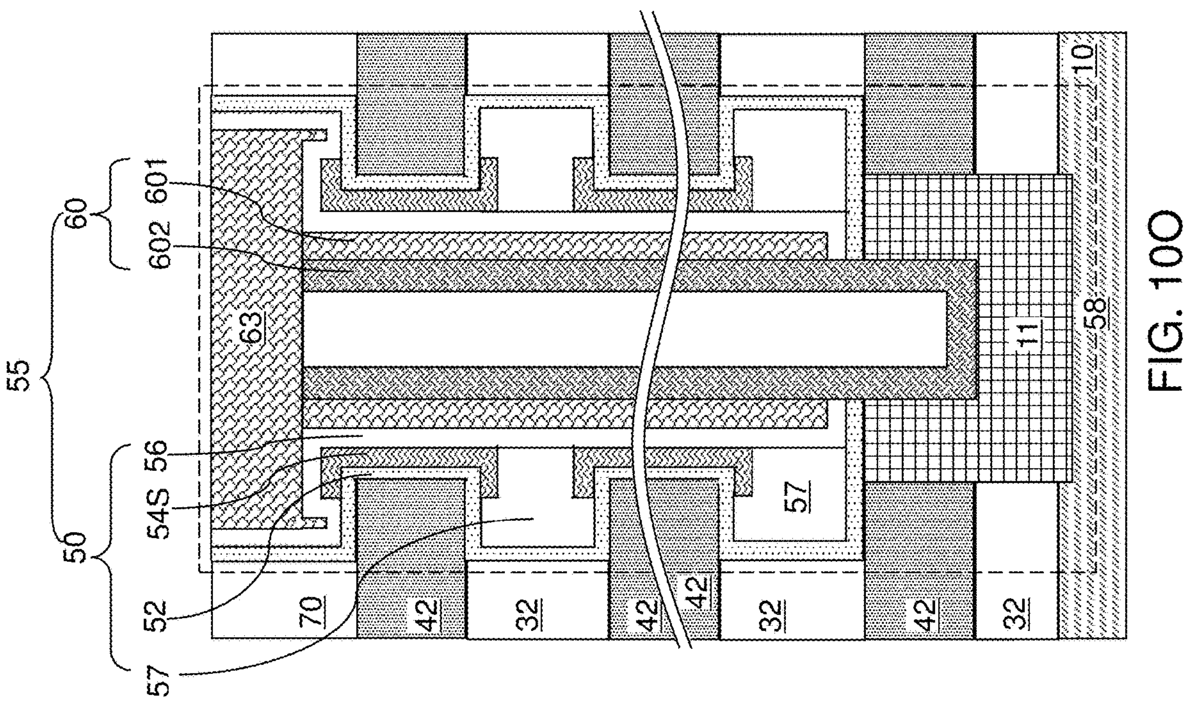

FIGS. 10N and 10O illustrate an alternative configuration of the first exemplary memory opening fill structure. Referring to FIG. 10N, the alternative configuration of the first exemplary memory opening fill structure can be derived from the structure illustrated in FIG. 10G by filling the annular lateral recesses 149 with a dielectric fill material. Specifically, a dielectric fill material such as undoped silicate glass or a doped silicate glass can be deposited in the remaining volumes of the annular lateral recesses 149 after removal of the vertical stack of metal-semiconductor alloy portions 67. In one embodiment, the dielectric fill material may have a higher etch rate than the material of the blocking dielectric layer 52. For example, the dielectric fill material may include borosilicate glass, which can provide an etch rate in dilute hydrofluoric acid than the etch rate of undoped silicate glass by a factor in a range from 100 to 10,000.

Portions of the dielectric fill material can be removed from outside the annular lateral recesses 149 by etching back the dielectric fill material. An isotropic etch process or an anisotropic etch process may be employed. The chemistry of the etch process employed to etch the dielectric fill material can be selective to the material of the semiconductor material portions 54S and the material of the blocking dielectric layer 52. Remaining portions of the dielectric fill material filling the annular lateral recesses 149 comprise a vertical stack of annular insulating material portions 57. In case an anisotropic etch process is employed to pattern the annular insulating material portions 57, inner sidewalls of the annular insulating material portions 57 may be vertically coincident with inner sidewalls of the semiconductor material portions 54S.

Referring to FIG. 10O, the processing steps of FIGS. 10H-10M can be performed to provide an alternative configuration of the second exemplary memory opening fill structure 58. In this case, the tunneling dielectric layer 56 can be formed directly on the vertical stack of annular insulating material portions 57. The memory film 50 can comprise the blocking dielectric layer 52, the vertical stack of semiconductor material portions 54S, the vertical stack of annular insulating material portions 57 (which can contact the vertical stack of semiconductor material portions 54S), and the tunneling dielectric layer 56.

FIGS. 11A-11G are sequential schematic vertical cross-sectional views of a memory opening within the first exemplary structure during formation of a seventh exemplary memory opening fill structure containing discrete dielectric charge storage elements with flange portions according to an embodiment of the present disclosure. The seventh exemplary memory opening fill structure can be formed within each memory opening 49 in lieu of the first, second, third, fourth, fifth, or sixth exemplary memory opening fill structure described above.

Figures 11A, 11B:
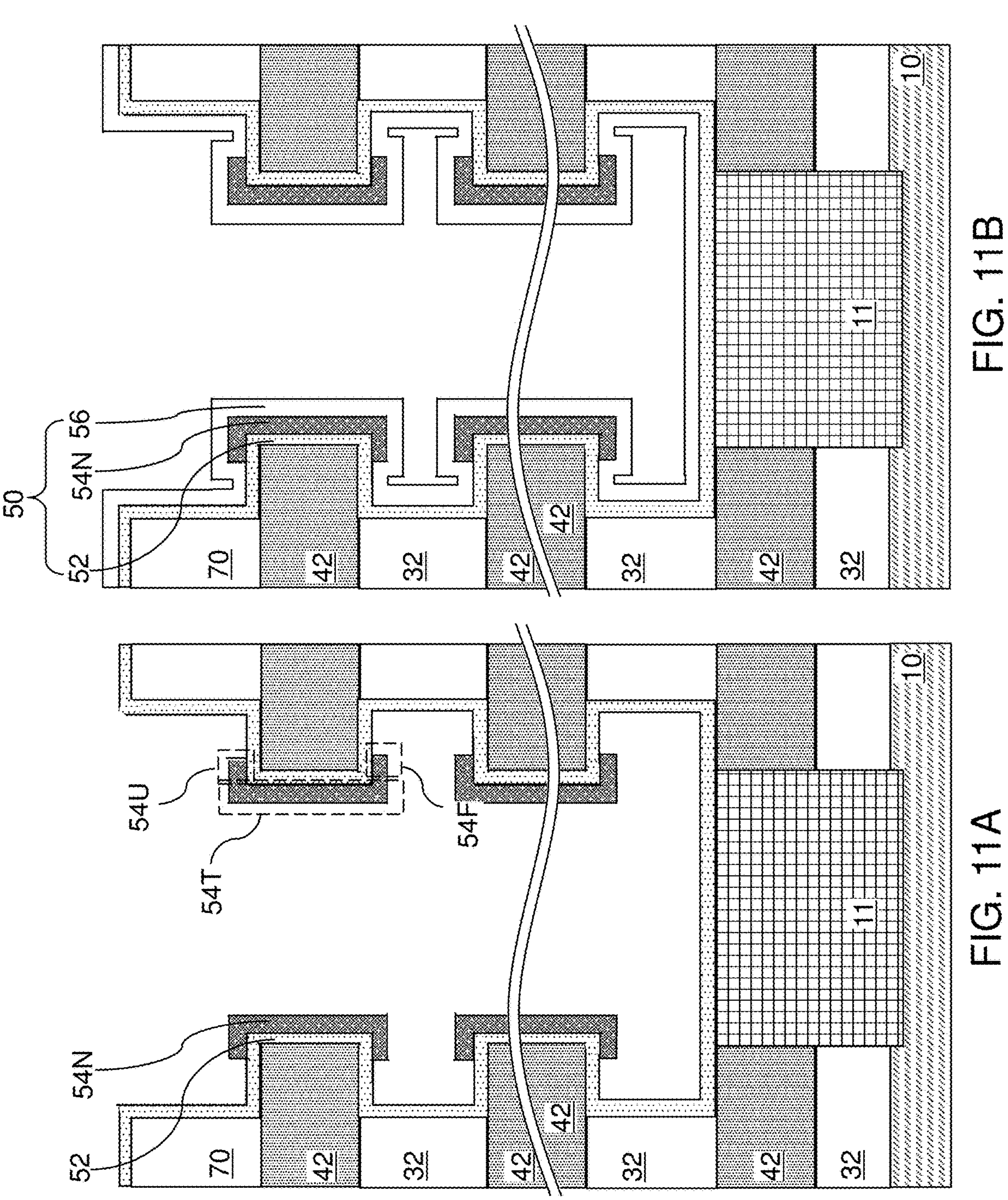
FIGS. 11A-11G are sequential schematic vertical cross-sectional views of a memory opening within the first exemplary structure during formation of a seventh exemplary memory opening fill structure according to a first embodiment of the present disclosure.

Referring to FIG. 11A, the structure for forming a seventh exemplary memory opening fill structure can be derived from the structure of FIG. 10G by nitriding the vertical stack of semiconductor material portions 54S. The vertical stack of semiconductor material portions 54S is fully converted into a vertical stack of silicon nitride material portions 54N. Each of the silicon nitride material portions 54N comprises a tubular portion 54T, an upper flange portion 54U laterally extending into the recess 149 outward from an upper end of an outer sidewall of the tubular portion 54T, and a lower flange portion 54F laterally extending into the recess 149 outward from a lower end of the outer sidewall of the tubular portion 54T. In one embodiment, each silicon nitride material portion 54N has a graded silicon-to-nitrogen ratio, as described with respect to FIG. 8A above. In one embodiment, the thickness of the tubular portion 54T of each silicon nitride material portion 54N can be in a range from 3 nm to 30 nm, such as from 5 nm to 15 nm, although lesser and greater thicknesses can also be employed. In one embodiment, the tubular portion 54T, the upper flange portion 54U, and the lower flange portion 54F can have substantially the same thickness.

The vertical stack of silicon nitride material portions 54N is located at levels of the spacer material layers (such as the sacrificial material layers 42). In one embodiment, each of the silicon nitride material portions 54N comprises a tubular portion 54T, an upper flange portion 54U, and a lower flange portion 54F. The upper flange portion 54U and the lower flange portion 54F of each silicon nitride material portion 54N provide increased charge trapping volume in additional to the charge trapping volume provided by the tubular portion 54T. Thus, the thickness of the spacer material layers (such as the sacrificial material layers 42) can be reduced relative to conventional NAND devices in which charge storage elements do not include flange portions. The vertical stack of discrete silicon nitride material portions 54N can be subsequently employed as a vertical stack of charge storage elements, which can function as floating gates of a NAND string. Portions of the inner sidewall of the blocking dielectric layer 52 are physically exposed after removal of the vertical stack of metal-semiconductor alloy portions 67.

Referring to FIG. 11B, the processing steps of FIG. 10H can be performed to form a tunneling dielectric layer 56.

Figures 11C, 11D:
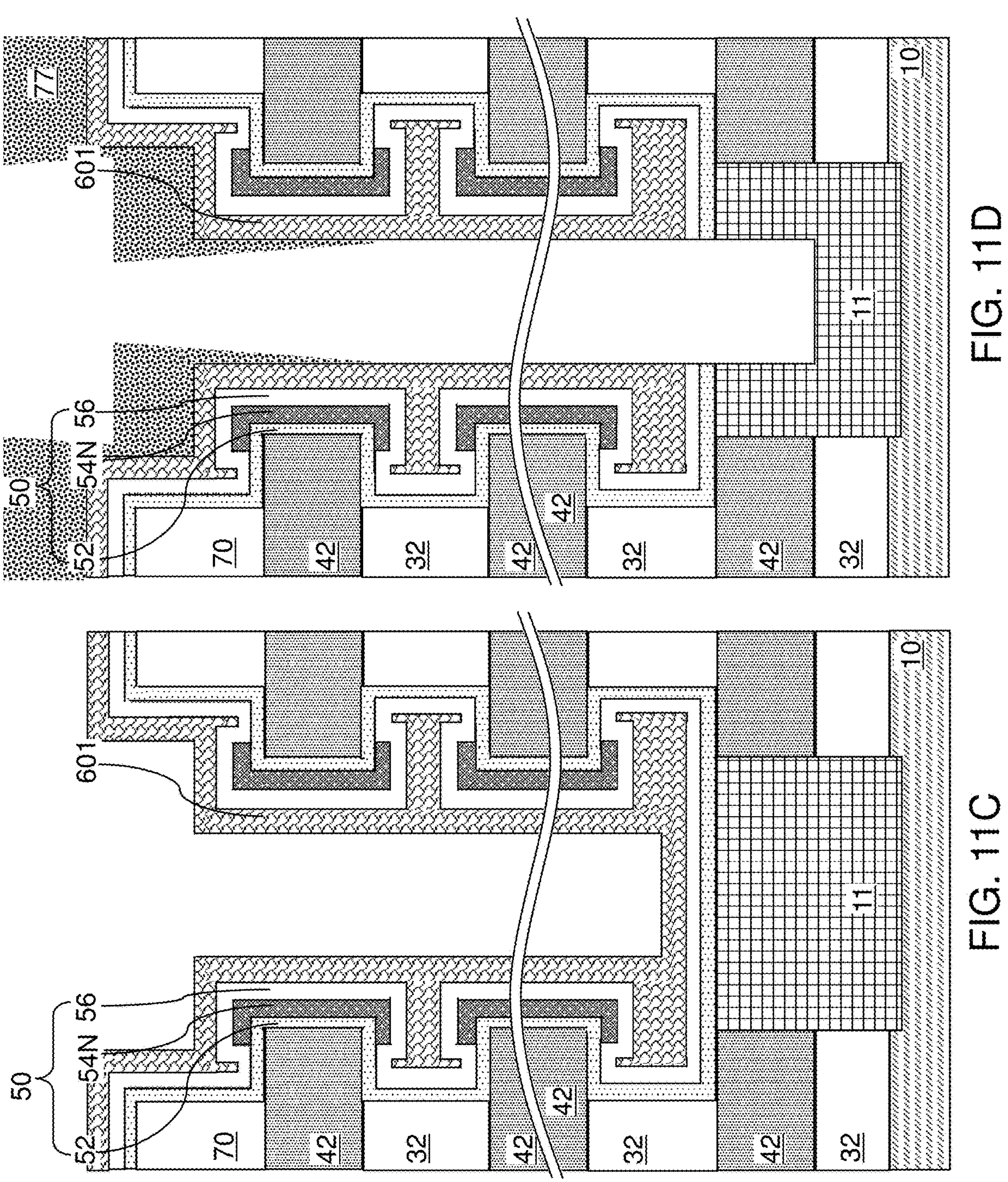

Referring to FIG. 11C, the processing steps of FIG. 10I can be performed to form a first semiconductor channel layer 601.

Referring to FIG. 11D, the processing steps of FIG. 10J can optionally be performed to deposit the optional patterning film 77, and to anisotropically etch horizontal bottom portions of the first semiconductor channel layer 601 (if present), the tunneling dielectric layer 56, and the blocking dielectric layer 52 located over the pedestal channel portion 11 (or located above the upper substrate semiconductor layer 10 in case a pedestal channel portion is not present) at the bottom of each memory opening 49. A center portion of the top surface of the pedestal channel portion 11 can be vertically recessed by the anisotropic etch process. In case a pedestal channel portion 11 is not present in the memory opening 49, a portion of the horizontal surface of the upper substrate semiconductor layer 10 can be vertically recessed underneath the memory opening 49. The patterning film 77 (if present) can be subsequently removed, for example, by ashing.

Figures 11E, 11F:
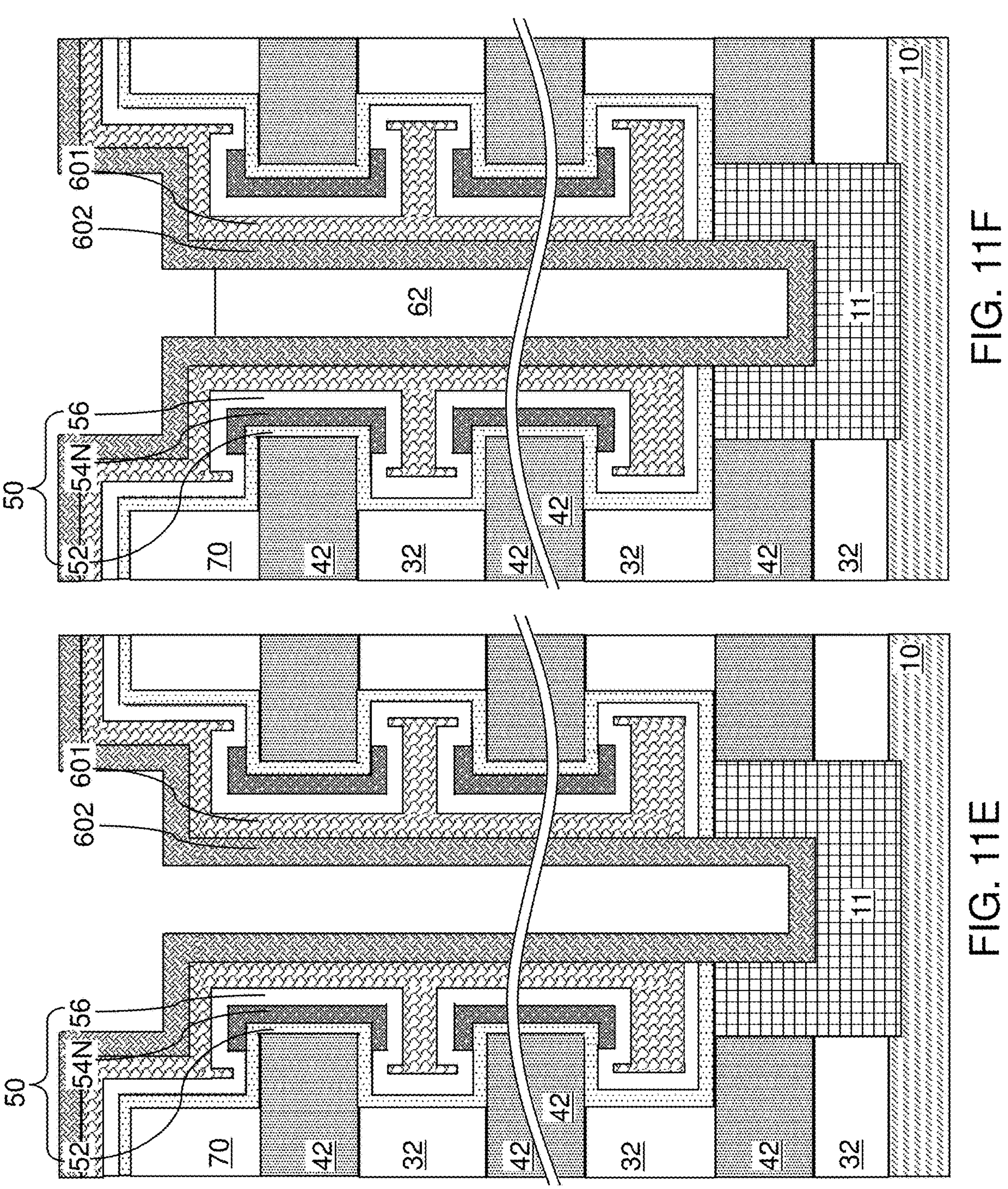

Referring to FIG. 11E, the processing steps of FIG. 10K can be performed to form a second semiconductor channel layer 602. The materials of the first semiconductor channel layer 601 and the second semiconductor channel layer 602 are collectively referred to as a semiconductor channel material. The combination of the blocking dielectric layer 52, the tunneling dielectric layer 56, the first semiconductor channel layer 601, and the second semiconductor channel layer 602 can completely fill the volumes of the annular lateral recesses provided at the levels of the insulating layers 32.

Referring to FIG. 11F, the processing steps of FIG. 10L can be performed to form a dielectric core 62 in each memory opening 49.

Figures 11G, 11H:
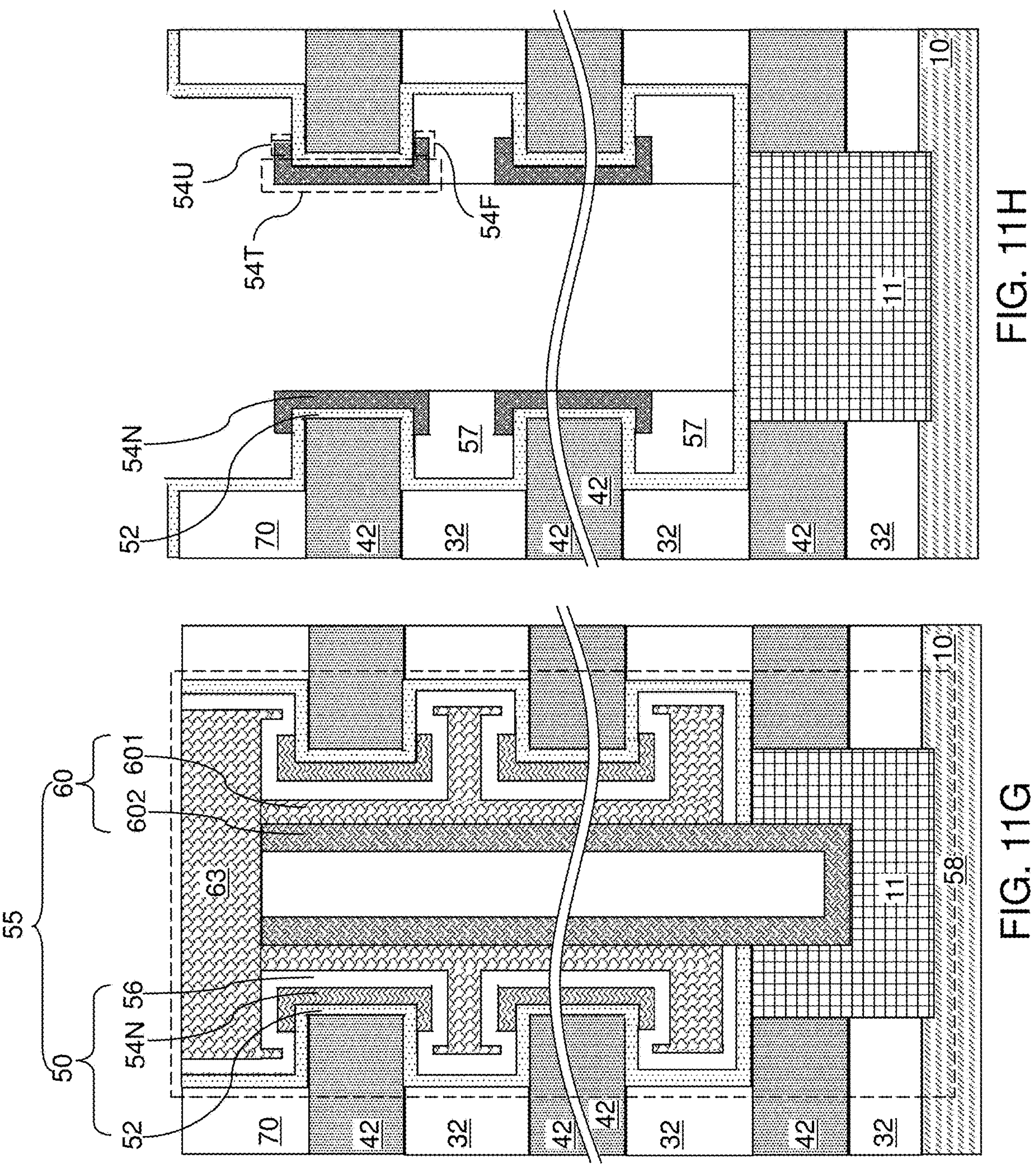
FIGS. 11H and 11I are sequential schematic vertical cross-sectional views of a memory opening during formation of an alternative configuration of the seventh exemplary memory opening fill structure according to a first embodiment of the present disclosure.

Referring to FIG. 11G, the processing steps of FIG. 10M can be performed to form a doped semiconductor portion such as a drain region 63 at an upper portion of each memory opening 49. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a vertical stack of silicon nitride material portions 54N, and laterally surrounds a portion of the vertical semiconductor channel 60. Each adjoining set of a tunneling dielectric layer 56, a vertical stack of silicon nitride material portions 54N, and a blocking dielectric layer 52 collectively constitute a memory film 50, which includes a vertical stack of memory elements that can store a respective data bit with a macroscopic retention time.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising a vertical stack of silicon nitride material portions 54N, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 11I:
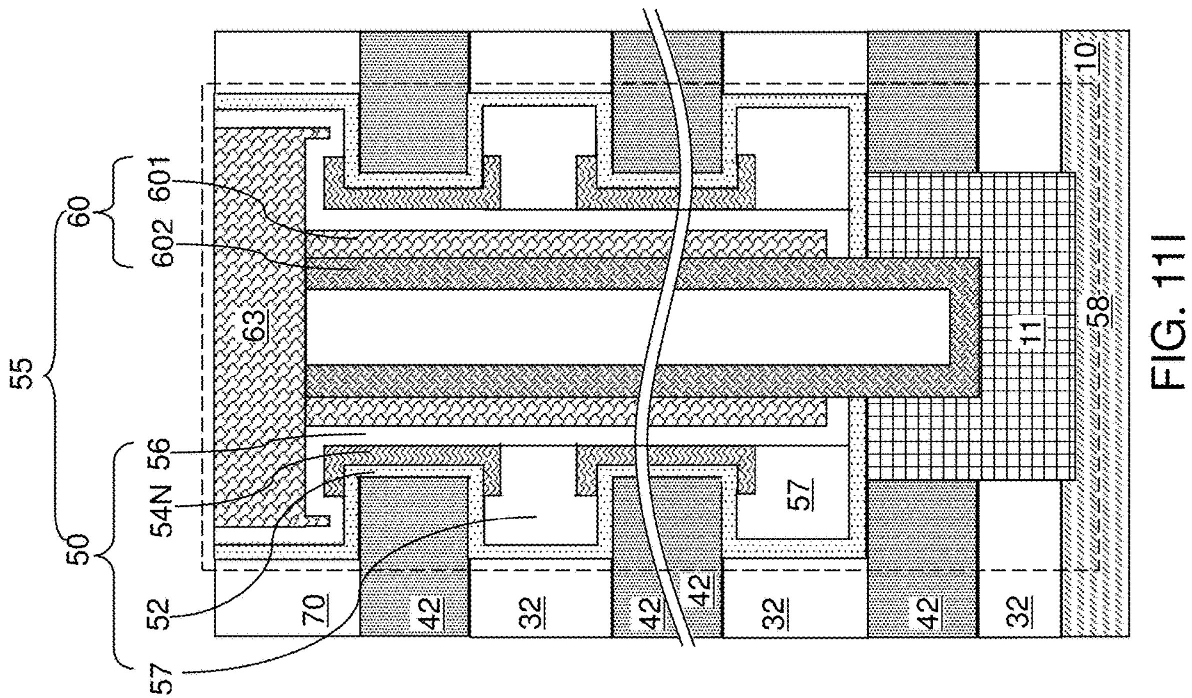

FIGS. 11H and 11I illustrate an alternative configuration of the fourth exemplary memory opening fill structure. Referring to FIG. 11H, the alternative configuration of the seventh exemplary memory opening fill structure can be derived from the structure illustrated in FIG. 10G by filling the annular lateral recesses 149 with a dielectric fill material. The processing steps of FIG. 10N can be employed to form a vertical stack of annular insulating material portions 57 in unfilled volumes of the annular lateral recesses of each memory opening 49.

Referring to FIG. 11I, the processing steps of FIGS. 10H-10M can be performed to provide an alternative configuration of the first exemplary memory opening fill structure 58. In this case, the tunneling dielectric layer 56 can be formed directly on the vertical stack of annular insulating material portions 57. The memory film 50 can comprise the blocking dielectric layer 52, the vertical stack of silicon nitride material portions 54N, the vertical stack of annular insulating material portions 57 (which can contact the vertical stack of silicon nitride material portions 54N), and the tunneling dielectric layer 56.

FIGS. 12A-12G are sequential schematic vertical cross-sectional views of a memory opening within the first exemplary structure during formation of an eighth exemplary memory opening fill structure containing hybrid discrete chare storage structures including discrete dielectric charge storage portions and floating gates with flange portions, according to an embodiment of the present disclosure. The eighth exemplary memory opening fill structure can be formed within each memory opening 49 in lieu of the first, second, third, fourth, fifth, sixth, or seventh exemplary memory opening fill structure described above.

Figures 12A, 12B:
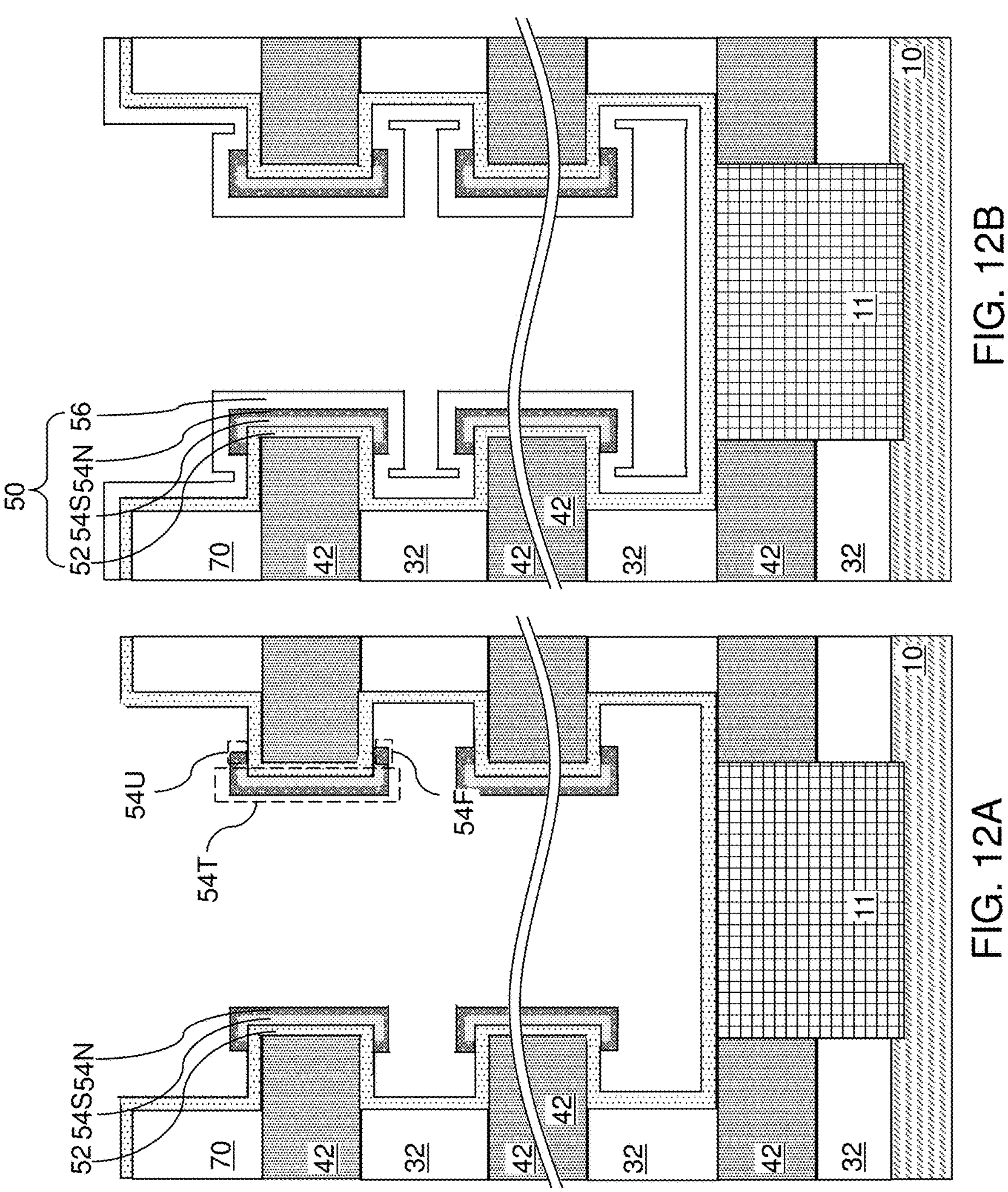
FIGS. 12A-12G are sequential schematic vertical cross-sectional views of a memory opening within the first exemplary structure during formation of an eighth exemplary memory opening fill structure according to a first embodiment of the present disclosure.

Referring to FIG. 12A, the structure for forming the eight exemplary memory opening fill structure can be derived from the structure of FIG. 10G by partially nitriding the vertical stack of semiconductor material portions 54S. Surface portions of the semiconductor material portions 54S that are physically exposed to the memory cavity 49' are converted into silicon nitride material portions 54N, while underlying portions of the semiconductor material portions 54S that contact the blocking dielectric layer 52 remain as semiconductor material portions 54S. Thus, a vertical stack of silicon nitride material portions 54N is formed by the nitridation process, and the remaining vertical stack of semiconductor material portions 54S has a lesser volume than the vertical stack of semiconductor material portions 54S provided at the processing steps of FIG. 10G. A vertical stack of composite charge storage structures (54S, 54N) can be formed by converting surface portions of the vertical stack of discrete semiconductor material portions 54S into the silicon nitride material portions 54N. In one embodiment, each silicon nitride material portion 54N comprises an interfacial region located in proximity to a respective one of the discrete semiconductor material portions 54S and having a graded silicon-to-nitrogen ratio, as described above. Each of the composite charge storage structures (54S, 54N) comprises a respective semiconductor material portion 54S (which is a remaining portion of a respective one of the discrete semiconductor material portions 54S as provided at the processing steps of FIG. 10G) and a respective silicon nitride material portion 54N which is formed by nitridation of a surface portion of the respective one of the discrete semiconductor material portions 54S.

Each of the composite charge storage structures (54S, 54N) comprises a tubular portion 54T, an upper flange portion 54U laterally extending outward into the recess 149 from an upper end of an outer sidewall of the tubular portion 54T, and a lower flange portion 54F laterally extending outward into the recess 149 from a lower end of the outer sidewall of the tubular portion 54T. Each semiconductor material portion 54S includes a respective tubular portion, a respective upper flange portion, and a respective lower flange portion. Each silicon nitride material portion 54N includes a respective tubular portion, a respective upper flange portion, and a respective lower flange portion. The thickness of the tubular portion of each semiconductor material portion 54S can be in a range from 1 nm to 30 nm, such as from 2 nm to 20 nm, although lesser and greater thicknesses can also be employed. The thickness of the tubular portion of each silicon nitride material portion 54N can be in a range from 1 nm to 30 nm, such as from 2 nm to 20 nm, although lesser and greater thicknesses can also be employed. The thickness of each tubular portion of composite charge storage structure (54S, 54N) can be in a range from 3 nm to 30 nm, such as from 5 nm to 15 nm, although lesser and greater thicknesses can also be employed. The thickness of a tubular portion of a composite charge storage structure (54S, 54N) can be formed between an inner cylindrical sidewall and an outer cylindrical sidewall of the respective composite charge storage structure (54S, 54N).

The vertical stack composite charge storage structures (54S, 54N) is located at levels of the spacer material layers (such as the sacrificial material layers 42) and partially protrudes into the recesses 149. In one embodiment, each of the composite charge storage structures (54S, 54N) comprises a tubular portion 54T, an upper flange portion 54U, and a lower flange portion 54F. The upper flange portion 54U and the lower flange portion 54F of each composite charge storage structure (54S, 54N) provide increased charge trapping volume in additional to the charge trapping volume provided by the tubular portion 54T. Thus, the thickness of the spacer material layers (such as the sacrificial material layers 42) can be reduced relative to conventional NAND devices in which charge storage elements do not include flange portions. The vertical stack of composite charge storage structures (54S, 54N) can be subsequently employed as a vertical stack of charge storage elements, which can function as hybrid floating gates and charge trapping dielectric elements of a NAND string. Portions of the inner sidewall of the blocking dielectric layer 52 are physically exposed after removal of the vertical stack of metal-semiconductor alloy portions 67.

Referring to FIG. 12B, the processing steps of FIG. 10H can be performed to form a tunneling dielectric layer 56.

Figures 12C, 12D:
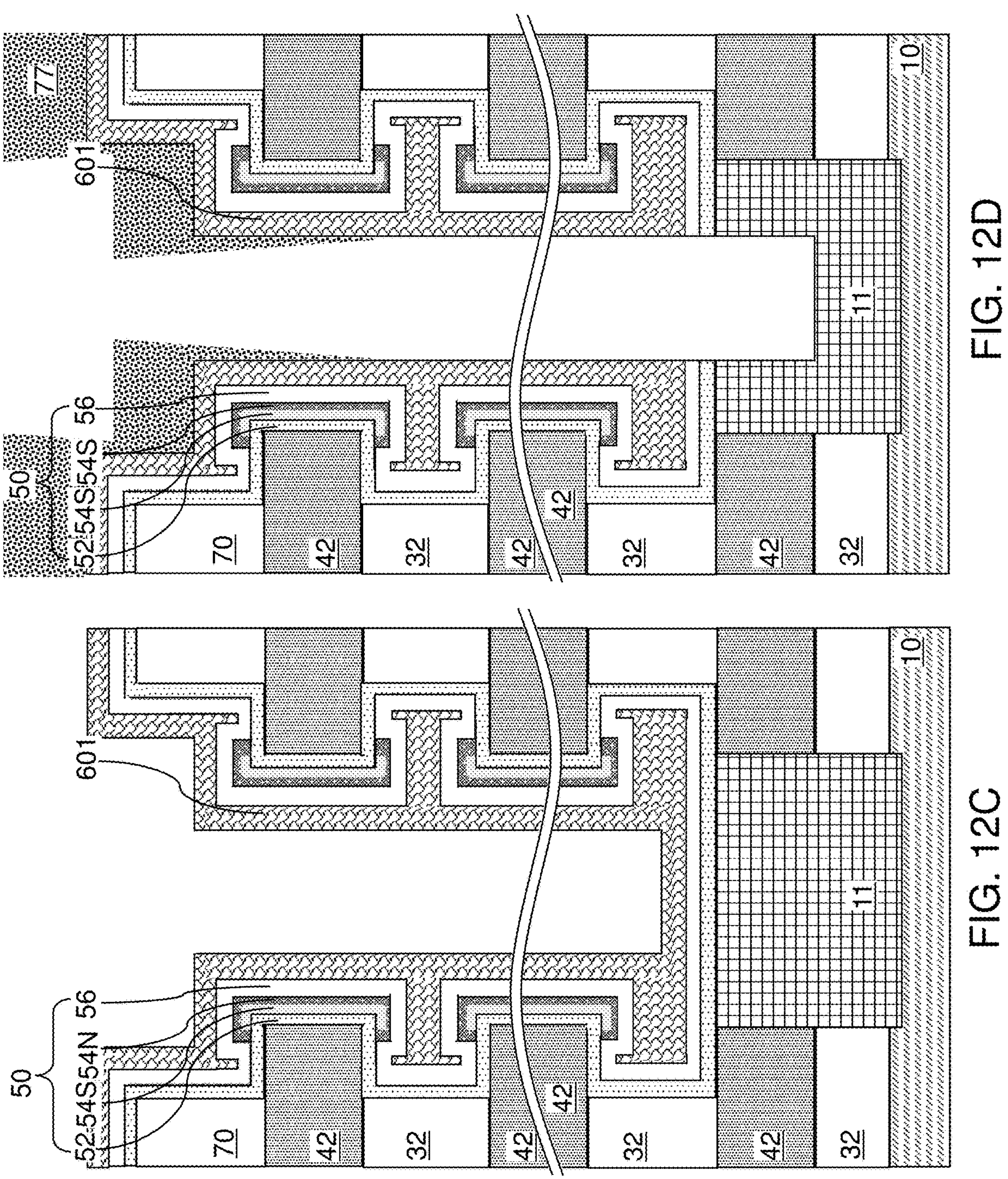

Referring to FIG. 12C, the processing steps of FIG. 10I can be performed to form the optional first semiconductor channel layer 601.

Referring to FIG. 12D, the processing steps of FIG. 10J can optionally be performed to deposit the optional patterning film 77, and to anisotropically etch horizontal bottom portions of the first semiconductor channel layer 601 (if present), the tunneling dielectric layer 56, and the blocking dielectric layer 52 located over the pedestal channel portion 11 (or located above the upper substrate semiconductor layer 10 in case a pedestal channel portion is not present) at the bottom of each memory opening 49. A center portion of the top surface of the pedestal channel portion 11 can be vertically recessed by the anisotropic etch process. In case a pedestal channel portion 11 is not present in the memory opening 49, a portion of the horizontal surface of the upper substrate semiconductor layer 10 can be vertically recessed underneath the memory opening 49. The patterning film 77 can be subsequently removed, for example, by ashing.

Figures 12E, 12F:
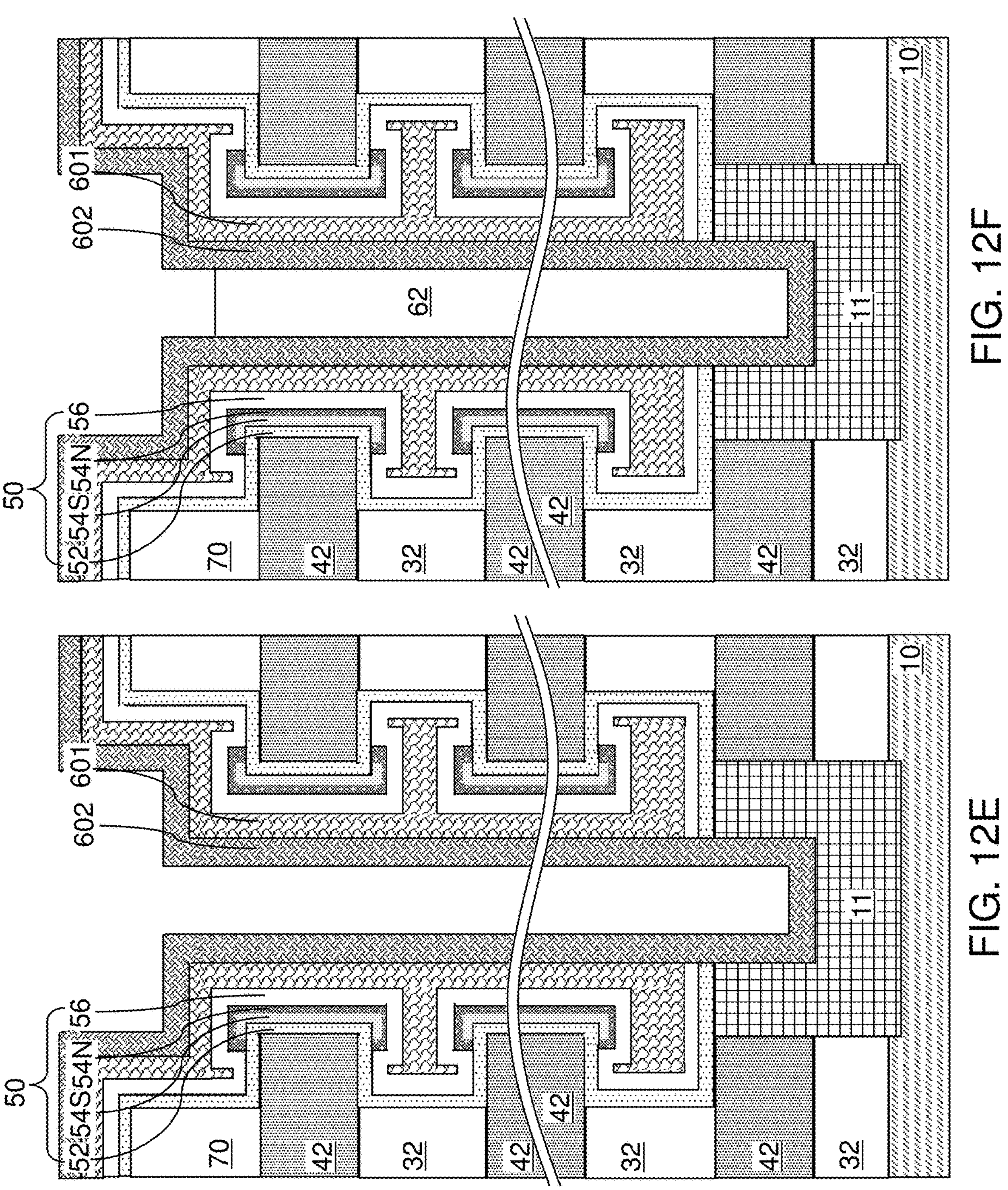

Referring to FIG. 12E, the processing steps of FIG. 10K can be performed to form a second semiconductor channel layer 602. The materials of the first semiconductor channel layer 601 and the second semiconductor channel layer 602 are collectively referred to as a semiconductor channel material. The combination of the blocking dielectric layer 52, the tunneling dielectric layer 56, the first semiconductor channel layer 601, and the second semiconductor channel layer 602 can completely fill the volumes of the annular lateral recesses provided at the levels of the insulating layers 32.

Referring to FIG. 12F, the processing steps of FIG. 10L can be performed to form a dielectric core 62 in each memory opening 49.

Figures 12G, 12H:
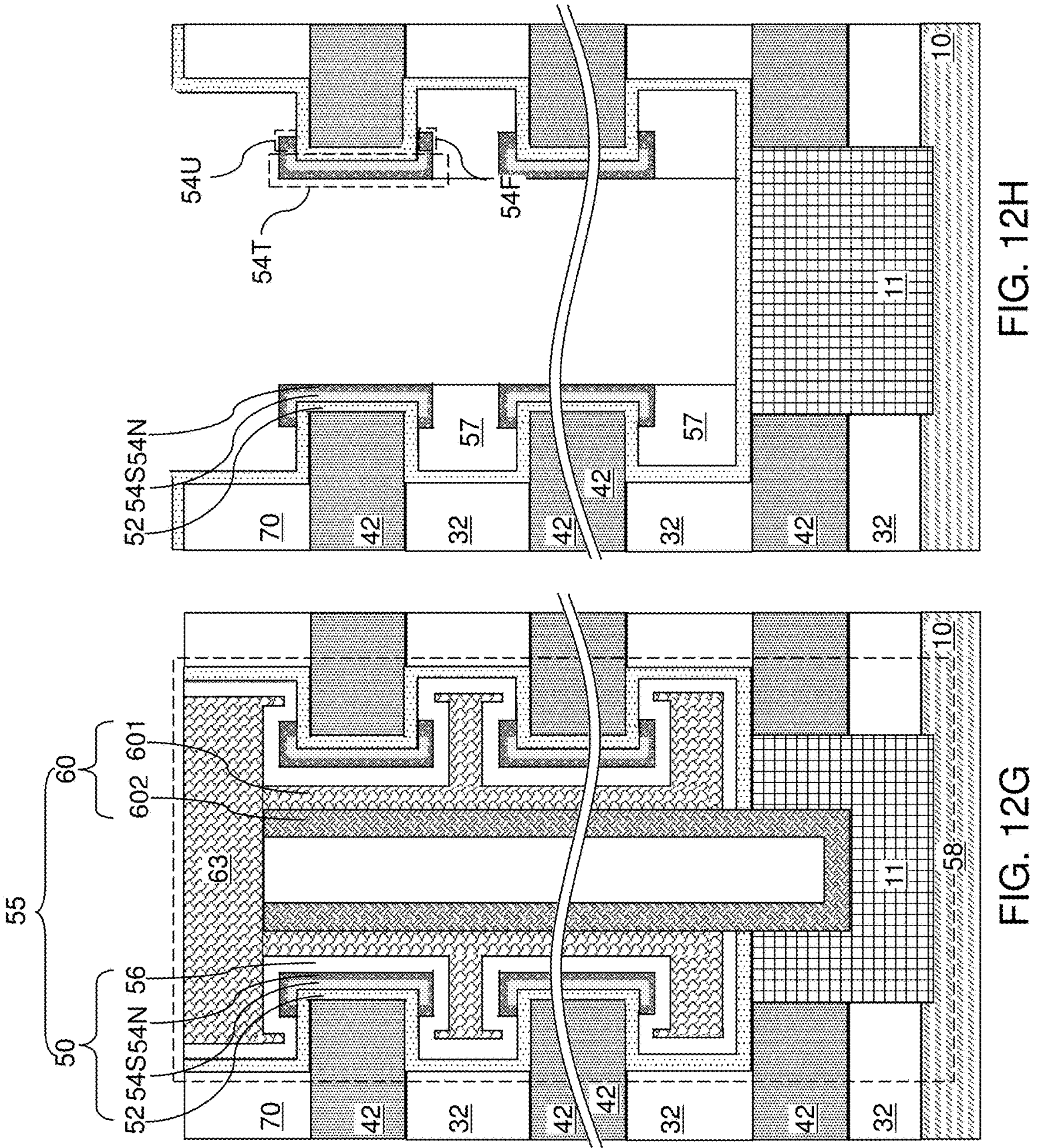
FIGS. 12H and 12I are sequential schematic vertical cross-sectional views of a memory opening during formation of an alternative configuration of the eighth exemplary memory opening fill structure according to a first embodiment of the present disclosure.

Referring to FIG. 12G, the processing steps of FIG. 10M can be performed to form a doped semiconductor portion such as a drain region 63 at an upper portion of each memory opening 49. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a vertical stack of composite charge storage structures (54S, 54N), and laterally surrounds a portion of the vertical semiconductor channel 60. Each adjoining set of a tunneling dielectric layer 56, a vertical stack of composite charge storage structures (54S, 54N), and a blocking dielectric layer 52 collectively constitute a memory film 50, which includes a vertical stack of memory elements that can store a respective data bit with a macroscopic retention time.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising a vertical stack of composite charge storage structures (54S, 54N), and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 12I:
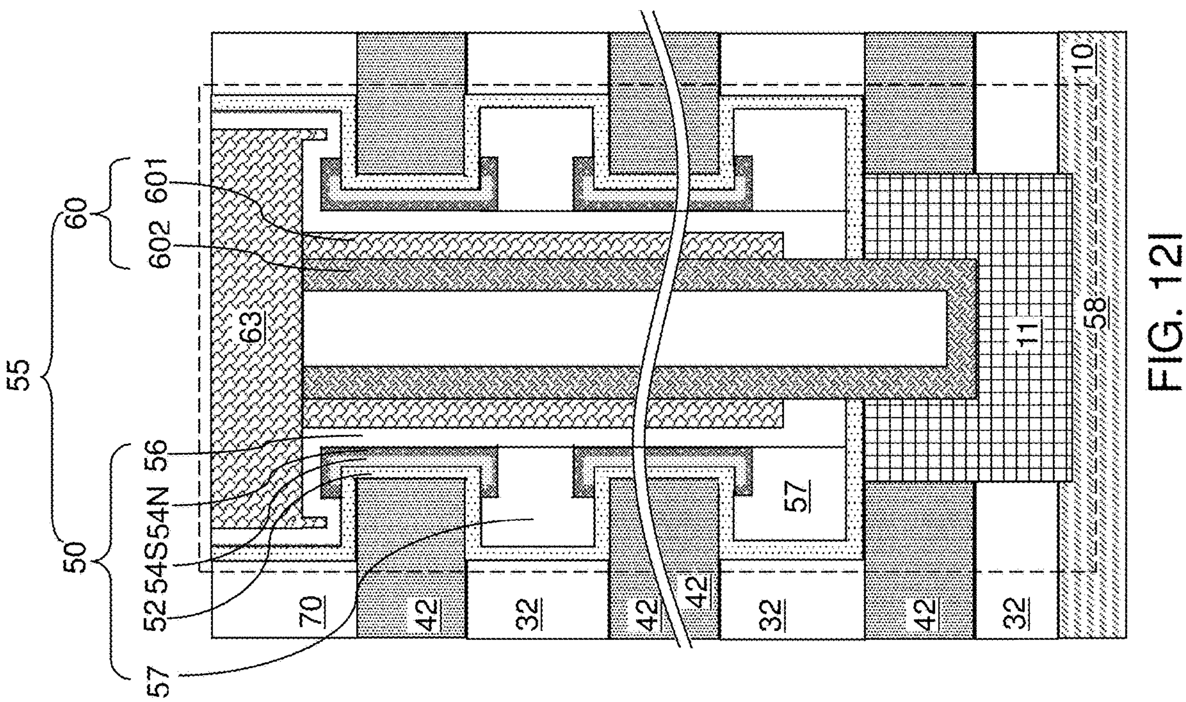

FIGS. 12H and 12I illustrate an alternative configuration of the fourth exemplary memory opening fill structure. Referring to FIG. 12H, the alternative configuration of the fourth exemplary memory opening fill structure can be derived from the structure illustrated in FIG. 10G by filling the annular lateral recesses 149 with a dielectric fill material. The processing steps of FIG. 10N can be employed to form a vertical stack of annular insulating material portions 57 in unfilled volumes of the annular lateral recesses of each memory opening 49.

Referring to FIG. 12I, the processing steps of FIGS. 10H-10M can be performed to provide an alternative configuration of the first exemplary memory opening fill structure 58. In this case, the tunneling dielectric layer 56 can be formed directly on the vertical stack of annular insulating material portions 57. The memory film 50 can comprise the blocking dielectric layer 52, the vertical stack of composite charge storage structures (54S, 54N), the vertical stack of annular insulating material portions 57 (which can contact the vertical stack of silicon nitride material portions 54N), and the tunneling dielectric layer 56.

Figure 13:
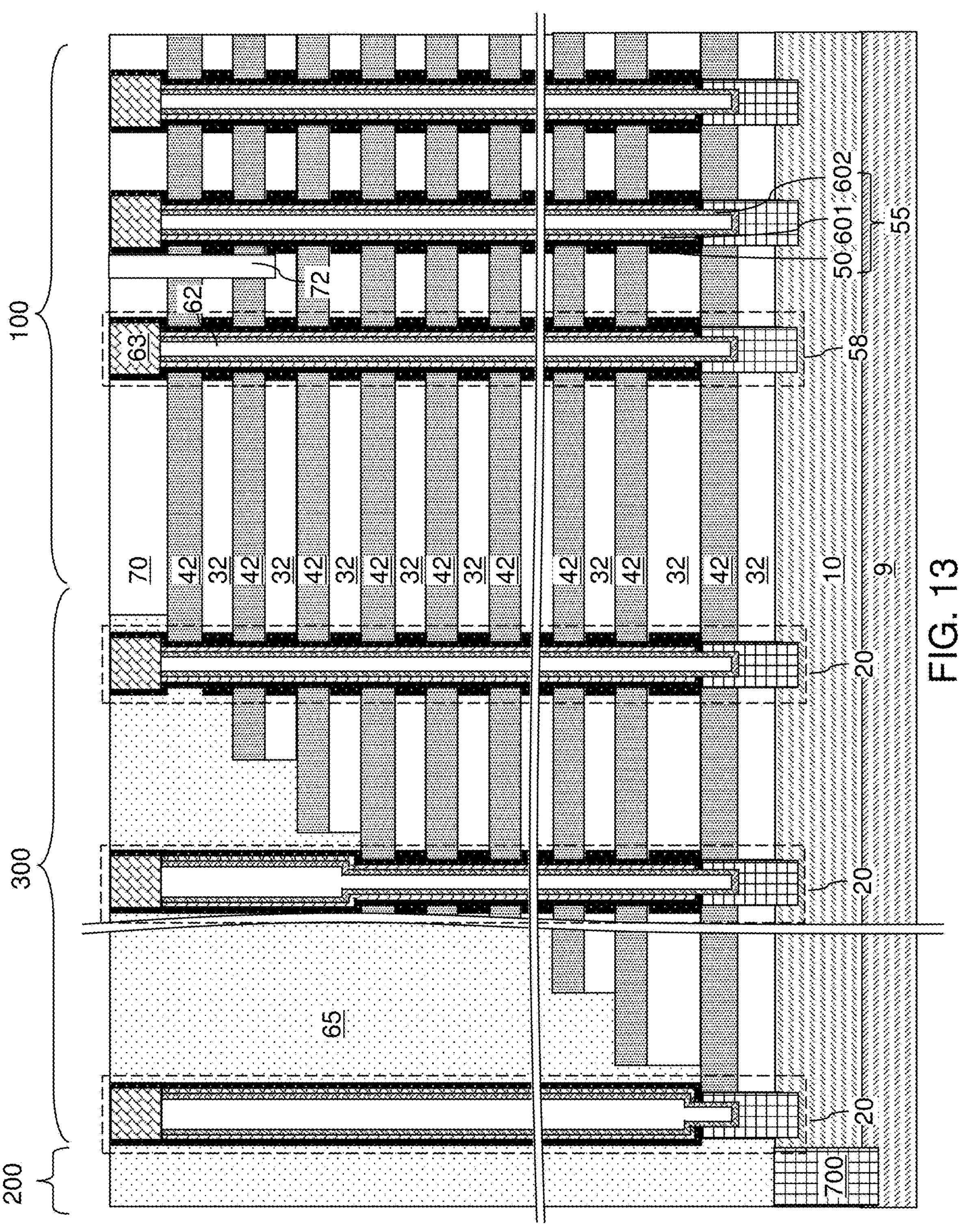
FIG. 13 is a schematic vertical cross-sectional view of the first exemplary structure after formation of memory stack structures and support pillar structures according to a first embodiment of the present disclosure.

Referring to FIG. 13, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 14A:
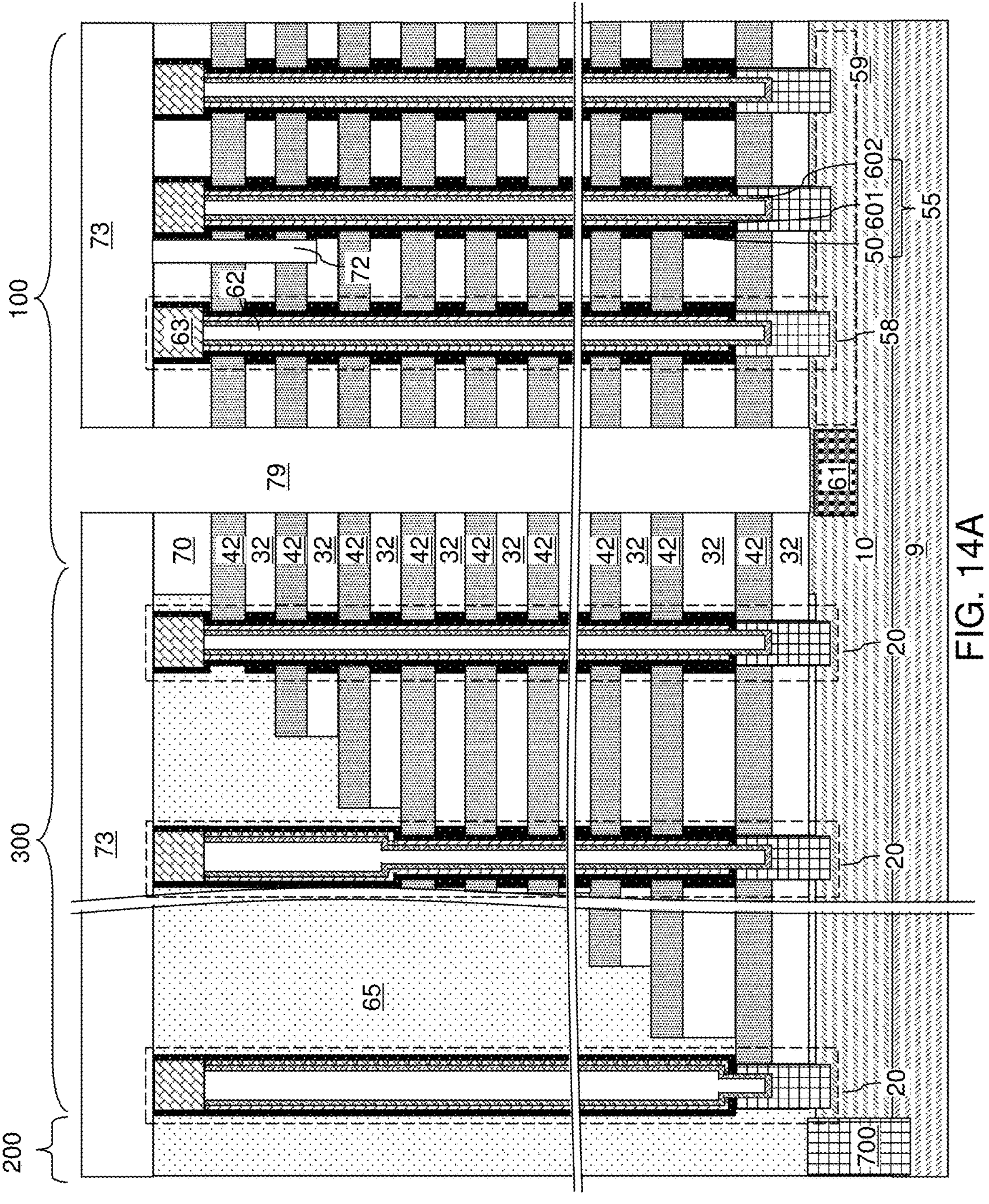
FIG. 14A is a schematic vertical cross-sectional view of the first exemplary structure after formation of backside trenches according to a first embodiment of the present disclosure.
Figure 14B:
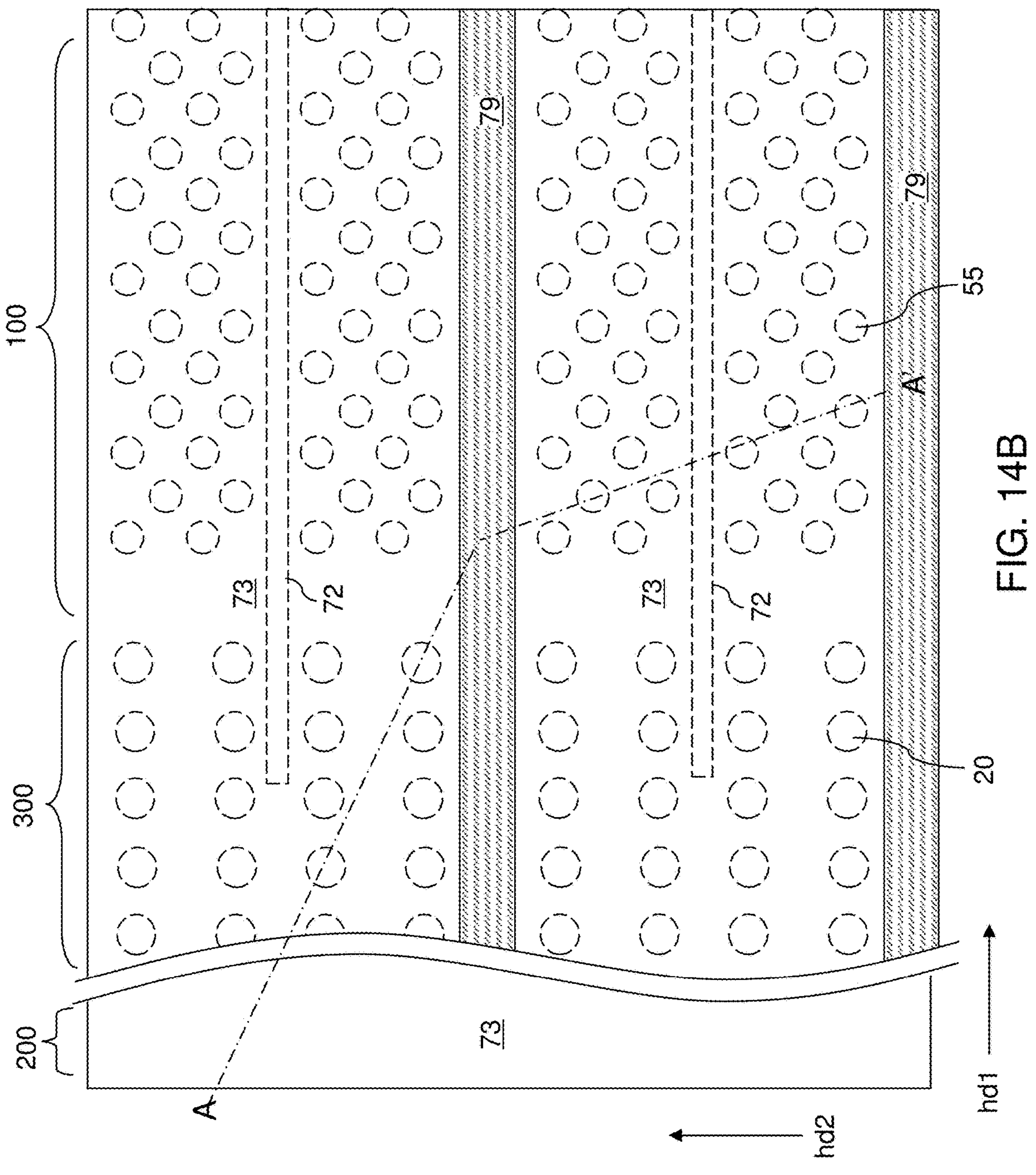
FIG. 14B is a partial see-through top-down view of the first exemplary structure of FIG. 14A. The vertical plane A-A' is the plane of the schematic vertical cross-sectional view of FIG. 14A.

Referring to FIGS. 14A and 14B, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Dopants of the second conductivity type can be implanted into portions of the upper substrate semiconductor layer 10 that underlie the backside trenches 79 to form source regions 61. The atomic concentration of the dopants of the second conductivity type in the source regions 61 can be in a range from $5.0\times10^{18}/cm^3$ to $2.0\times10^{21}/cm^3$, although lesser and greater atomic concentrations can also be employed. Surface portions of the upper substrate semiconductor layer 10 that extend between each source region 61 and adjacent memory opening fill structures 58 comprise horizontal semiconductor channels 59.

Figure 15:
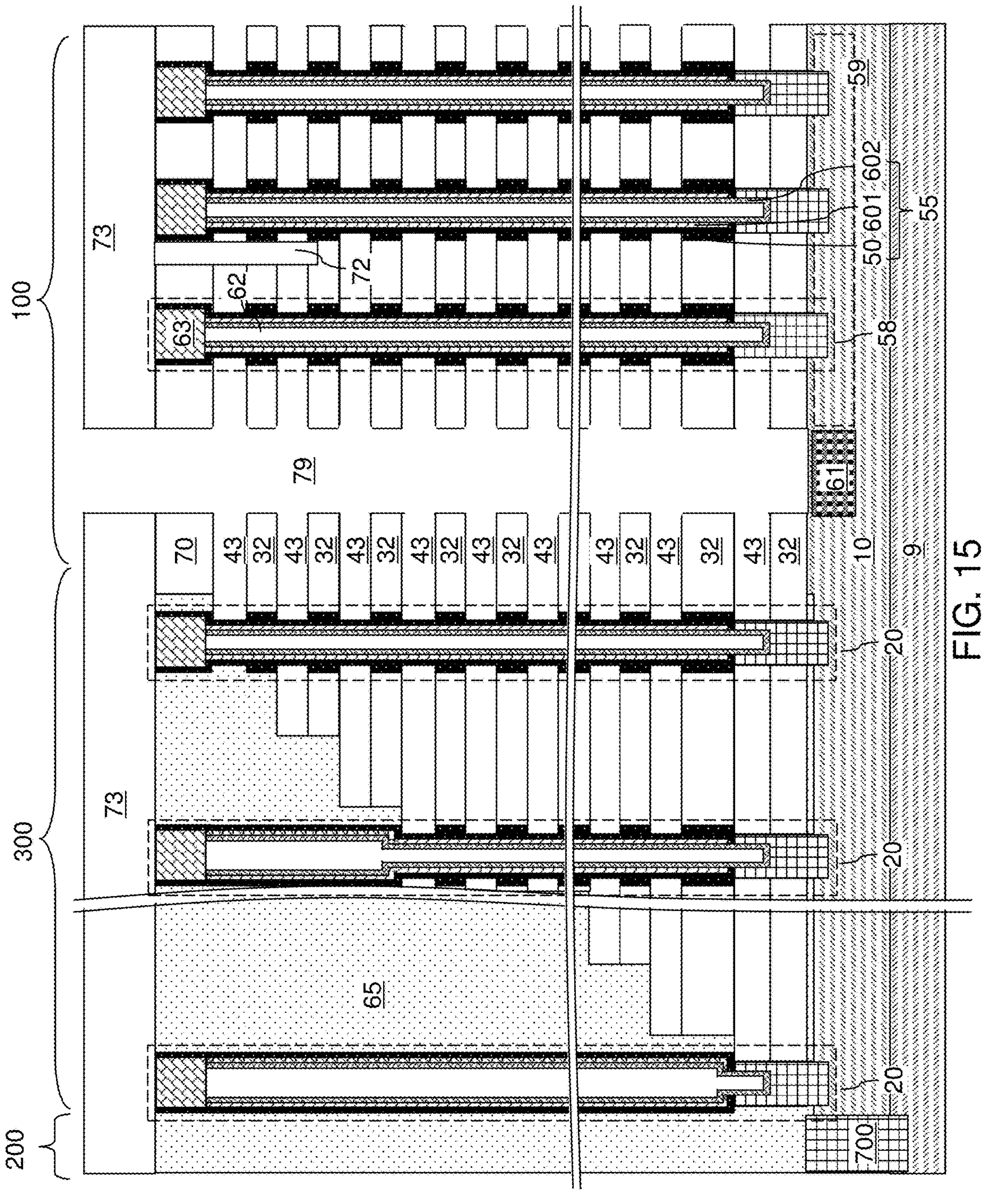
FIG. 15 is a schematic vertical cross-sectional view of the first exemplary structure after formation of backside recesses according to a first embodiment of the present disclosure.

Referring to FIG. 15, an etchant that selectively etches the spacer material of the sacrificial material layers 42 with respect to the insulating material of the insulating layers 32 can be introduced into the backside trenches 79, for example, employing an etch process. Backside recesses 43 are formed in volumes from which the sacrificial material layers 42 are removed. The removal of the spacer material of the sacrificial material layers 42 can be selective to the insulating material of the insulating layers 32, the material of the retro-stepped dielectric material portion 65, the semiconductor material of the upper substrate semiconductor layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the spacer material selective to the insulating material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the spacer material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 16A:
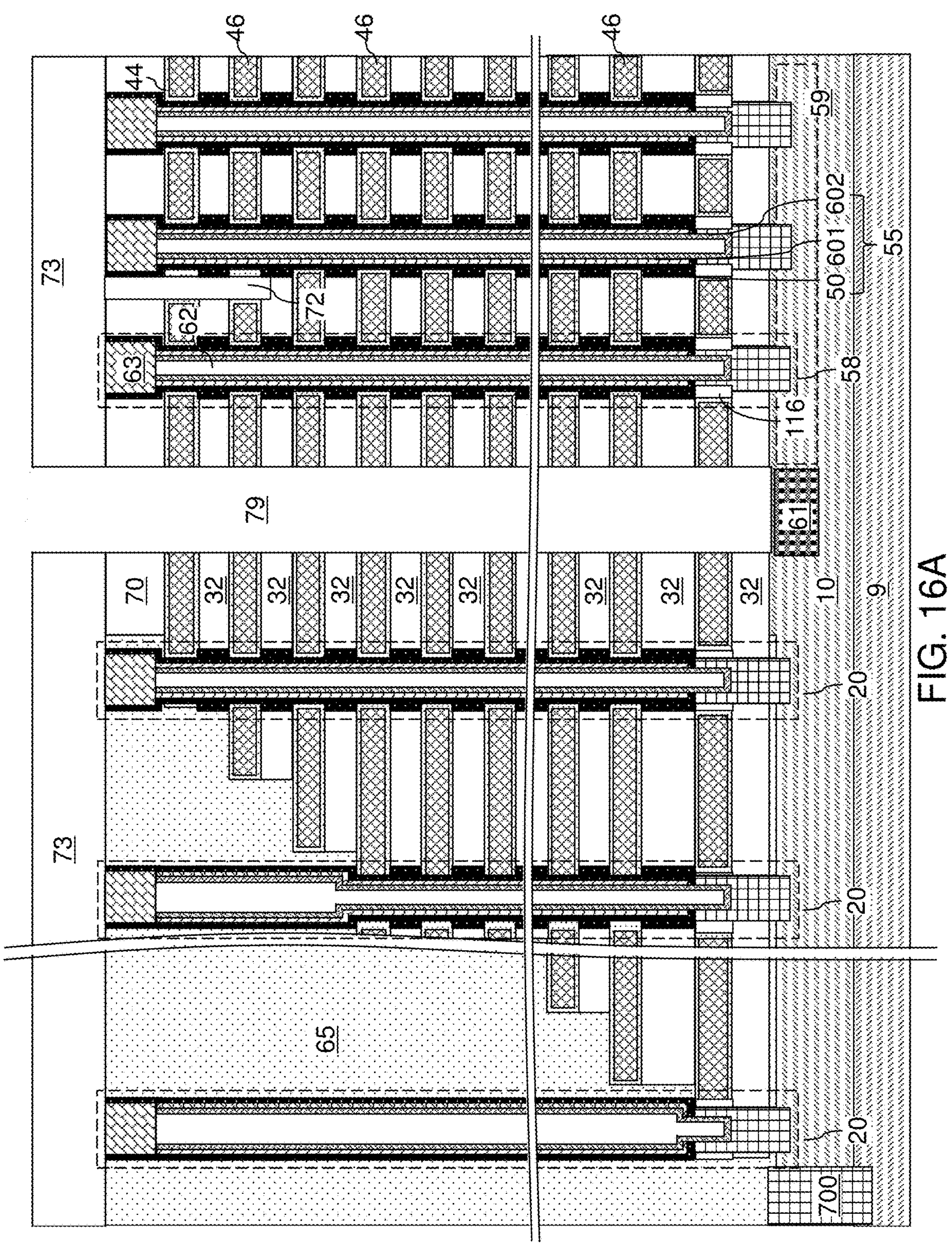
FIG. 16A is a schematic vertical cross-sectional view of the first exemplary structure after formation of electrically conductive layers in the backside recesses according to a first embodiment of the present disclosure.
Figure 16B:
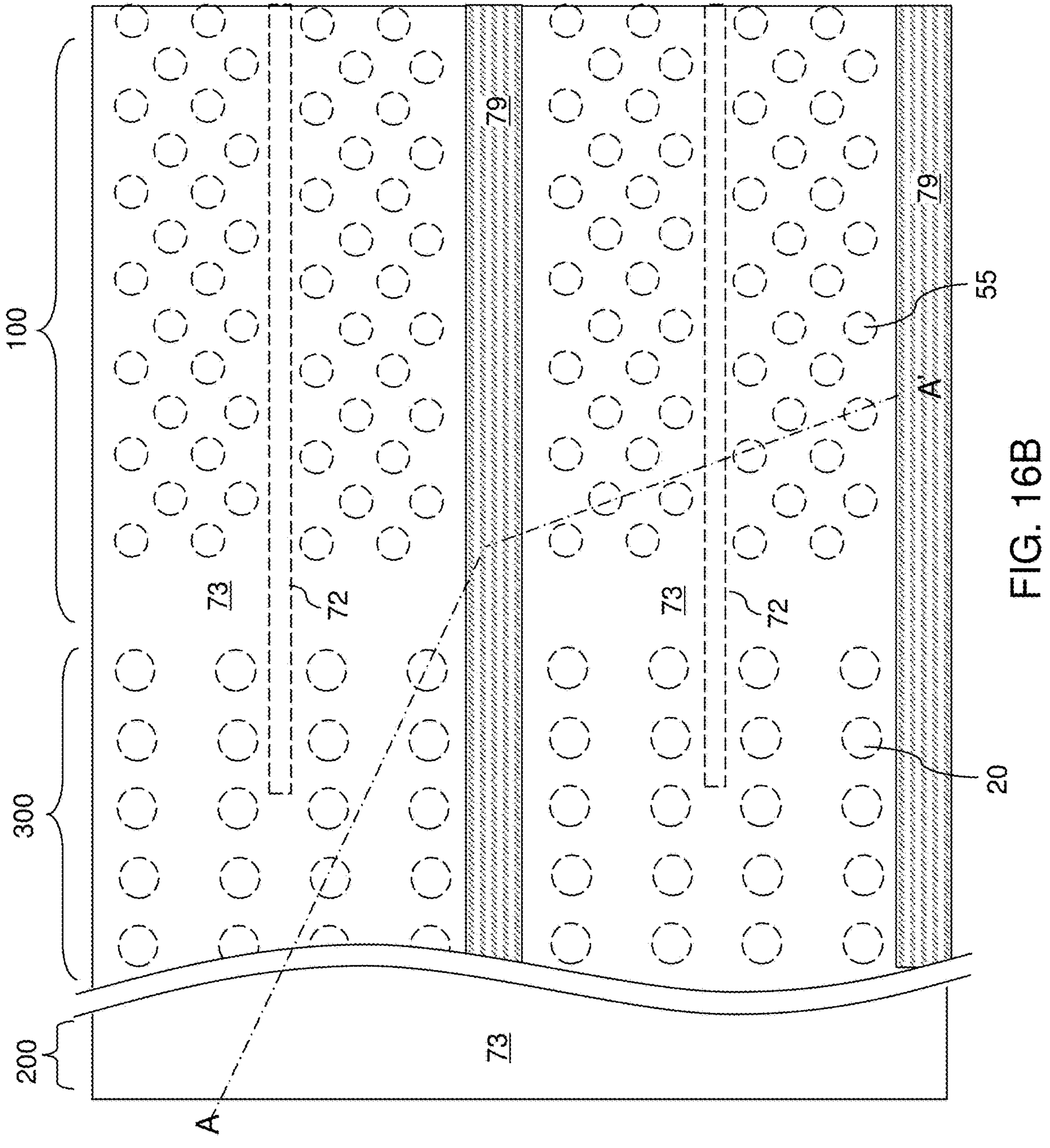
FIG. 16B is a partial see-through top-down view of the first exemplary structure of FIG. 16A. The vertical plane A-A' is the plane of the schematic vertical cross-sectional view of FIG. 16A.

Referring to FIGS. 16A and 16B, physically exposed surface portions of the optional pedestal channel portions 11 and the upper substrate semiconductor layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the upper substrate semiconductor layer 10 into a planar dielectric portion (not illustrated). In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Dopants in the drain regions 63, the source regions 61, and the semiconductor channels 60 can be activated during the anneal process that forms the planar dielectric portions and the tubular dielectric spacers 116. Alternatively, an additional anneal process may be performed to active the electrical dopants in the drain regions 63, the source regions 61, and the semiconductor channels 60.

A backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion prior to formation of the backside blocking dielectric layer 44 is optional. In one embodiment, the backside blocking dielectric layer 44 can be formed by a conformal deposition process such as atomic layer deposition (ALD) or low pressure chemical vapor deposition (LPCVD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as low pressure chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion. A backside cavity is present within the portion of each backside trench 79 that is not filled with the backside blocking dielectric layer 44.

At least one metallic material can be deposited in the backside recesses 43. For example, a combination of a metallic barrier layer and a metallic fill material can be deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, MoN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, molybdenum, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which can block diffusion of fluorine atoms therethrough.

A plurality of electrically conductive layers 46 can be formed in the plurality of backside recesses 43, and a continuous electrically conductive material layer (not shown) can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer includes a continuous portion of the at least one conductive material that is located in the backside trenches 79 or above the contact-level dielectric layer 73.

Each sacrificial material layer 42 can be replaced with an electrically conductive layer 46. A backside cavity is present in the portion of each backside trench 79 that is not filled with the backside blocking dielectric layer 44 and the continuous electrically conductive material layer. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The deposited metallic material of the continuous electrically conductive material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer may not be selective to the material of the backside blocking dielectric layer 44 or, the backside blocking dielectric layer 44 may not be employed. The planar dielectric portions can be removed during removal of the continuous electrically conductive material layer. A backside cavity is present within each backside trench 79.

Figure 17:
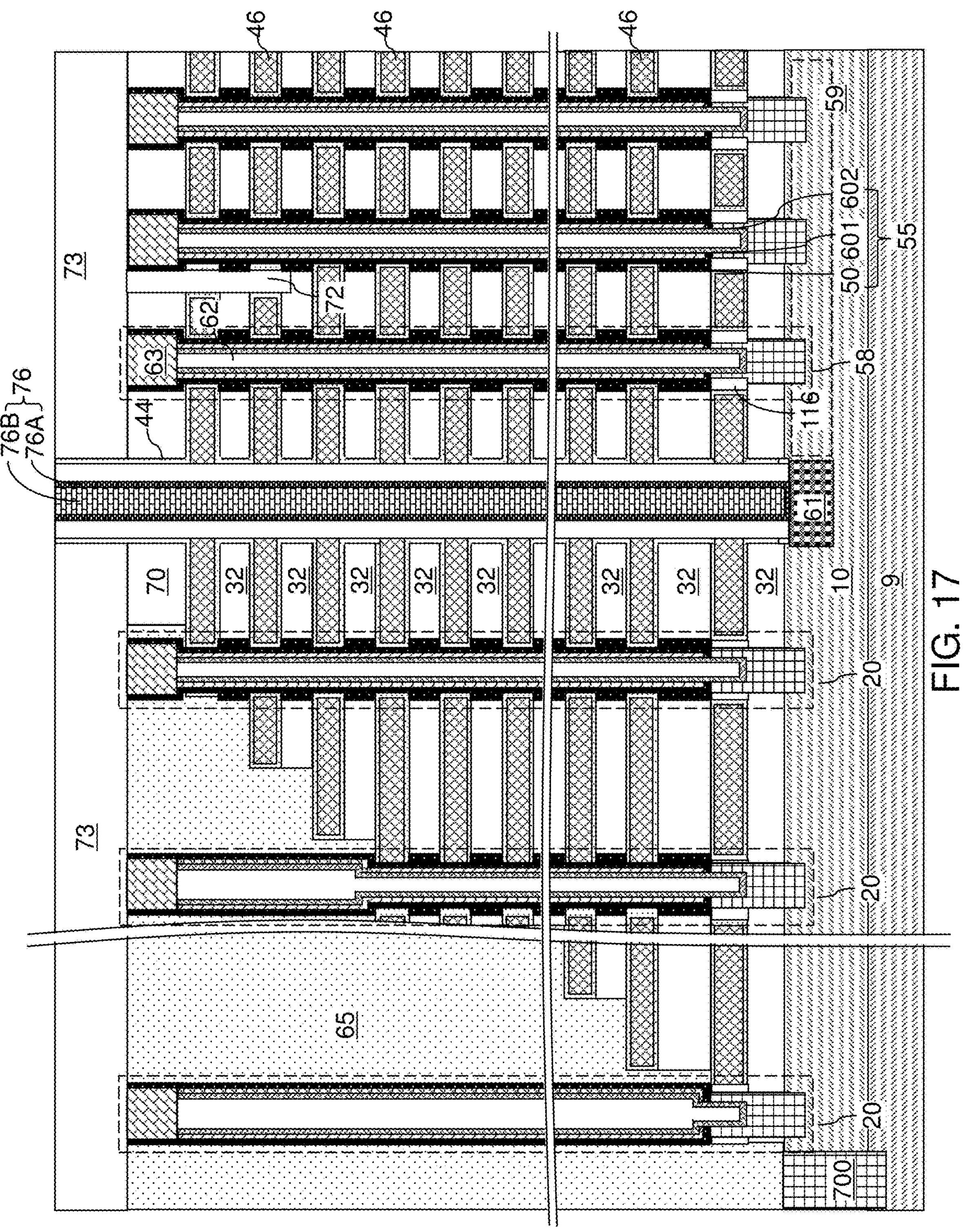
FIG. 17 is a schematic vertical cross-sectional view of the first exemplary structure after formation of an insulating spacer and a backside contact structure according to a first embodiment of the present disclosure.

Referring to FIG. 17, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the upper substrate semiconductor layer 10 can be physically exposed at the bottom of each backside trench 79.

An upper portion of the upper substrate semiconductor layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective backside cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, WC, TiC, TaC, MoN, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Mo, Cu, Al, Co, Ru, Ni, an alloy thereof, or a stack thereof.

In an alternative embodiment, the contact via structure 76 may be omitted and a horizontal source line may contact a side of a bottom portion of the vertical semiconductor channel 60.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 18A:
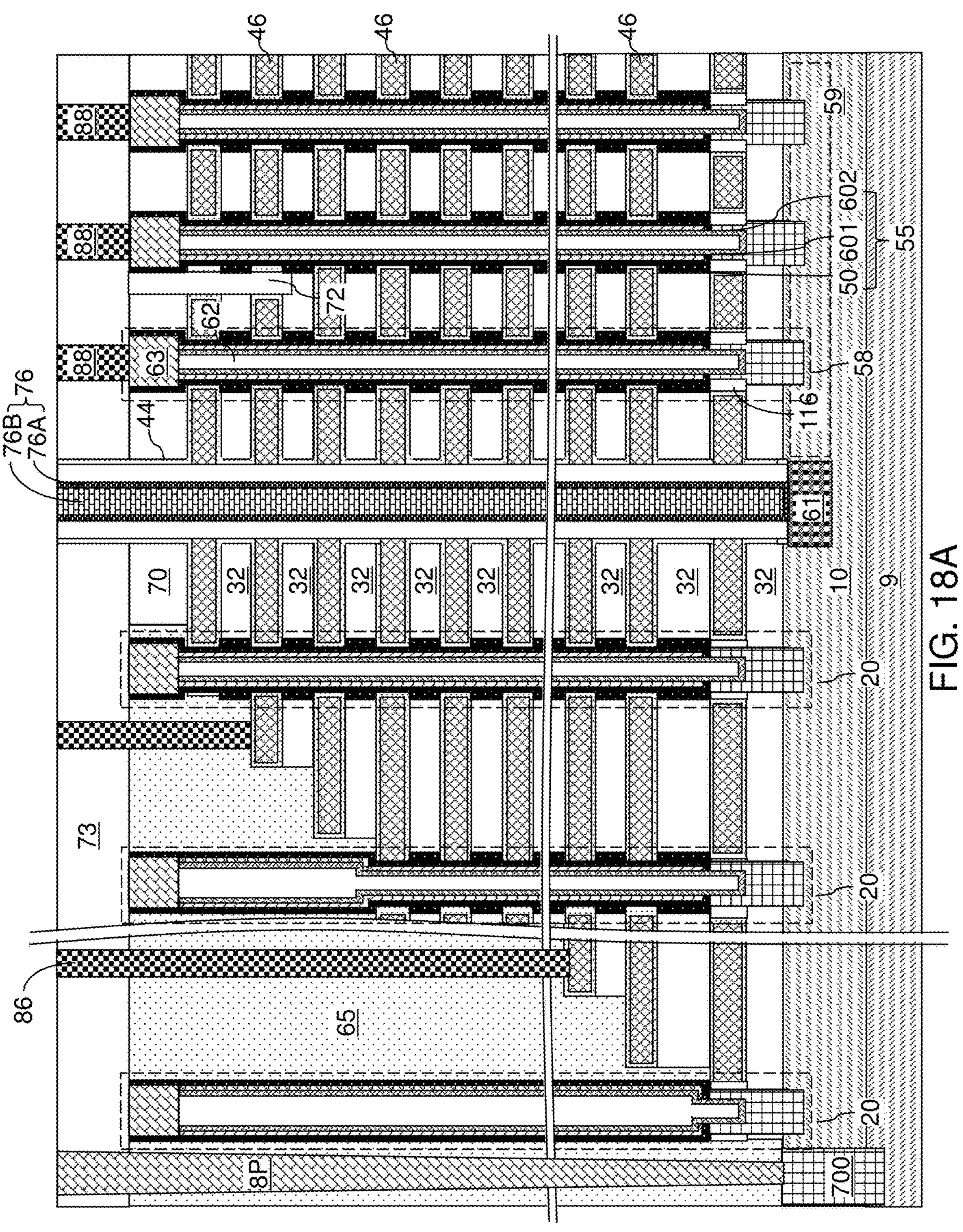
FIG. 18A is a schematic vertical cross-sectional view of the first exemplary structure after formation of additional contact via structures according to a first embodiment of the present disclosure.
Figure 18B:
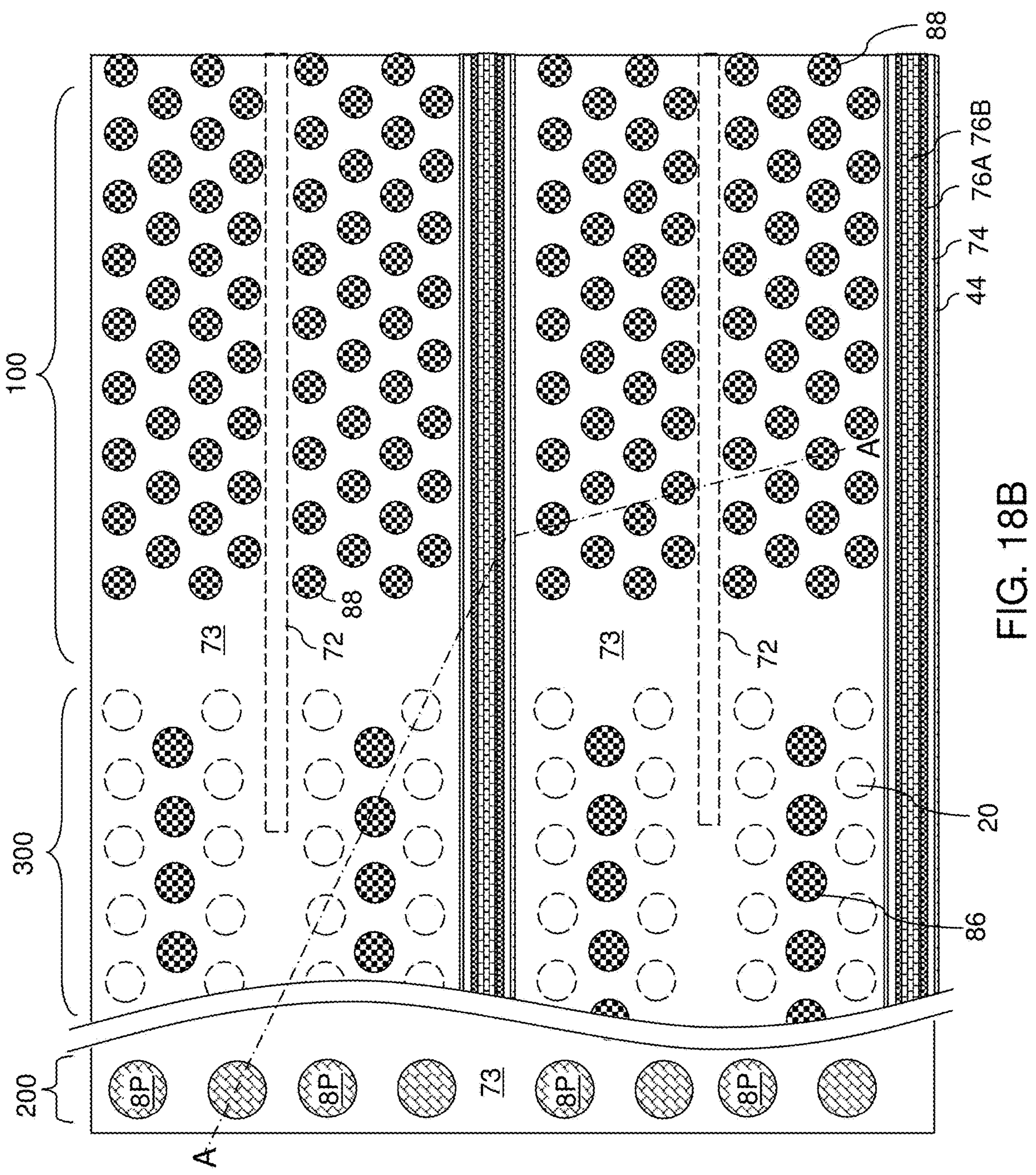
FIG. 18B is a top-down view of the first exemplary structure of FIG. 18A. The vertical plane A-A' is the plane of the schematic vertical cross-sectional view of FIG. 18A.

Referring to FIGS. 18A and 18B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

The first exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. The silicon substrate can contain an integrated circuit comprising a driver circuit (comprising a subset of the least one semiconductor device 700) for the memory device located thereon. Alternatively, the driver circuit may be formed on a separate substrate and then bonded to the memory device. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60, and a plurality of charge storage elements. Each charge storage element can be located adjacent to a respective one of the plurality of semiconductor channels (59, 11, 60).

Figures 19A, 19B:
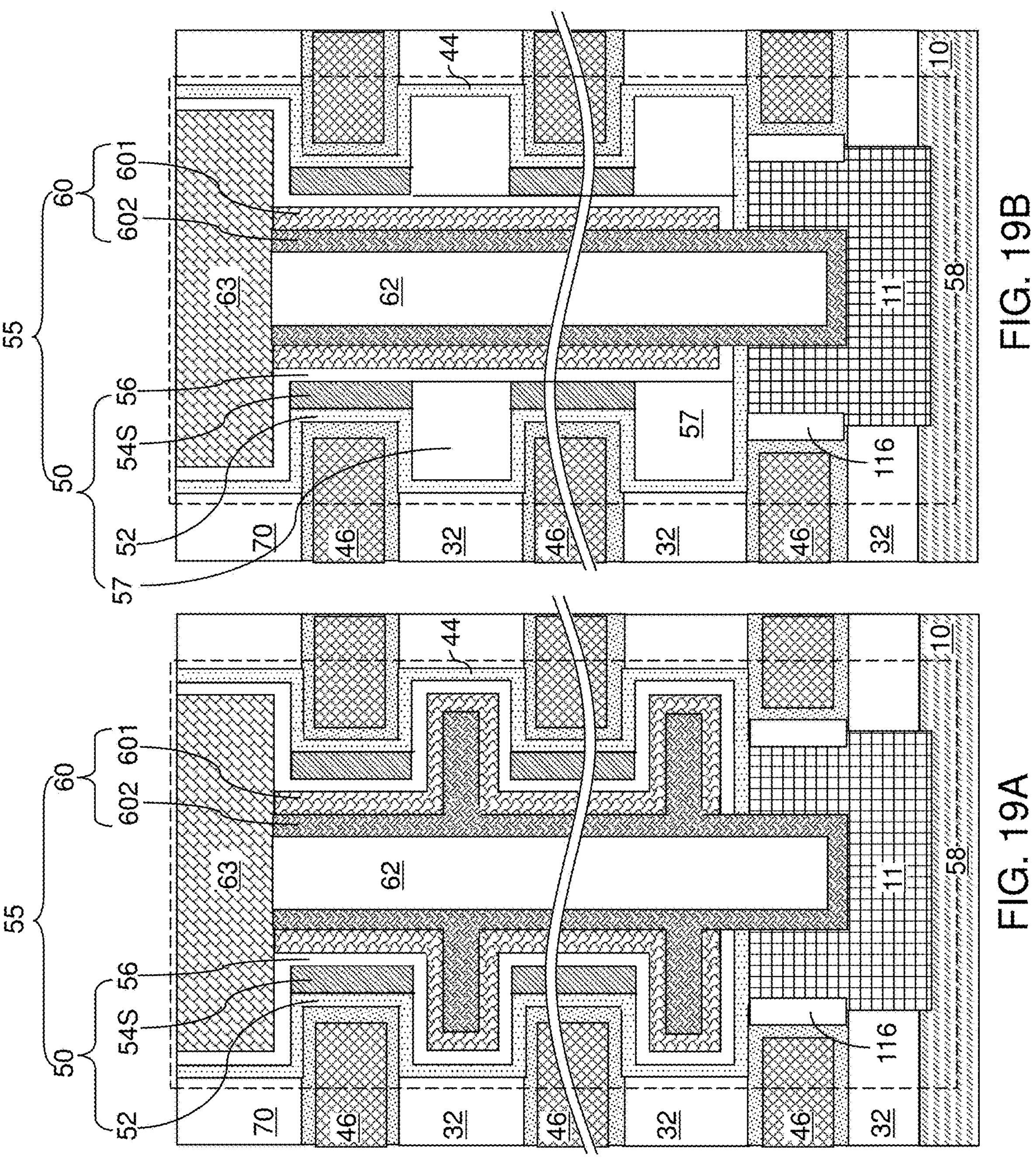
FIG. 19A is a magnified view of a memory opening in the first exemplary structure of FIGS. 18A and 18B in case a first exemplary memory opening fill structure or a second exemplary memory opening fill structure is present in the memory opening according to a first embodiment of the present disclosure.
FIG. 19B is a magnified view of a memory opening in the first exemplary structure of FIGS. 18A and 18B in case an alternative configuration of the first exemplary memory opening fill structure or the second exemplary memory opening fill structure is present in the memory opening according to a first embodiment of the present disclosure.

FIG. 19A is a magnified view of a memory opening in the first exemplary structure of FIGS. 18A and 18B in case a first exemplary memory opening fill structure or a second exemplary memory opening fill structure is present in the memory opening according to an embodiment of the present disclosure. In this case, each charge storage element may comprise a semiconductor material portion 54S, which may have a tubular configuration. The tunneling dielectric layer 56 is in direct contact with the blocking dielectric layer 52 at levels of the insulating layers 32.

FIG. 19B is a magnified view of a memory opening in the first exemplary structure of FIGS. 18A and 18B in case an alternative configuration of the first exemplary memory opening fill structure or the second exemplary memory opening fill structure is present in the memory opening according to an embodiment of the present disclosure. In this case, each charge storage element may comprise a semiconductor material portion 54S, which may have a tubular configuration. The tunneling dielectric layer 56 is in direct contact with inner sidewalls of the annular insulating material portions 57 at levels of the insulating layers 32.

Figures 20A, 20B:
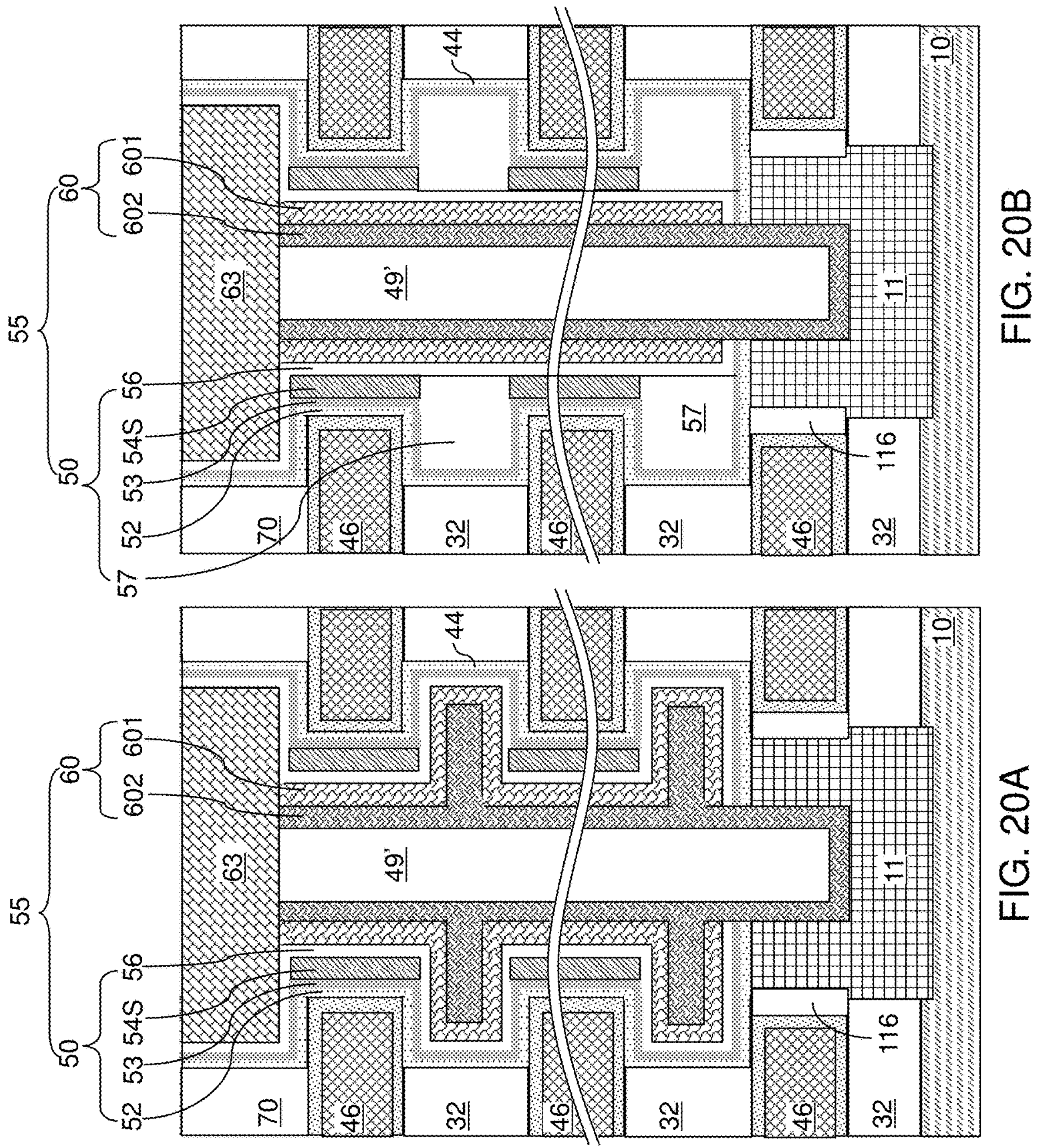
FIG. 20A is a magnified view of a memory opening in the first exemplary structure of FIGS. 18A and 18B in case a third exemplary memory opening fill structure is present in the memory opening according to a first embodiment of the present disclosure.
FIG. 20B is a magnified view of a memory opening in the first exemplary structure of FIGS. 18A and 18B in case an alternative configuration of the third exemplary memory opening fill structure is present in the memory opening according to a first embodiment of the present disclosure.

FIG. 20A is a magnified view of a memory opening in the first exemplary structure of FIGS. 18A and 18B in case a third exemplary memory opening fill structure is present in the memory opening according to an embodiment of the present disclosure. In this case, each charge storage element may comprise a combination of a semiconductor material portion 54S (which may have a tubular configuration) and a portion of a silicon nitride layer 53 located at the level of the semiconductor material portion 54S. The tunneling dielectric layer 56 is in direct contact with the blocking dielectric layer 52 at levels of the insulating layers 32.

FIG. 20B is a magnified view of a memory opening in the first exemplary structure of FIGS. 18A and 18B in case an alternative configuration of the third exemplary memory opening fill structure is present in the memory opening according to an embodiment of the present disclosure. In this case, each charge storage element may comprise a combination of a semiconductor material portion 54S (which may have a tubular configuration) and a portion of a silicon nitride layer 53 located at the level of the semiconductor material portion 54S. The tunneling dielectric layer 56 is in direct contact with inner sidewalls of the annular insulating material portions 57 at levels of the insulating layers 32.

Figures 21A, 21B:
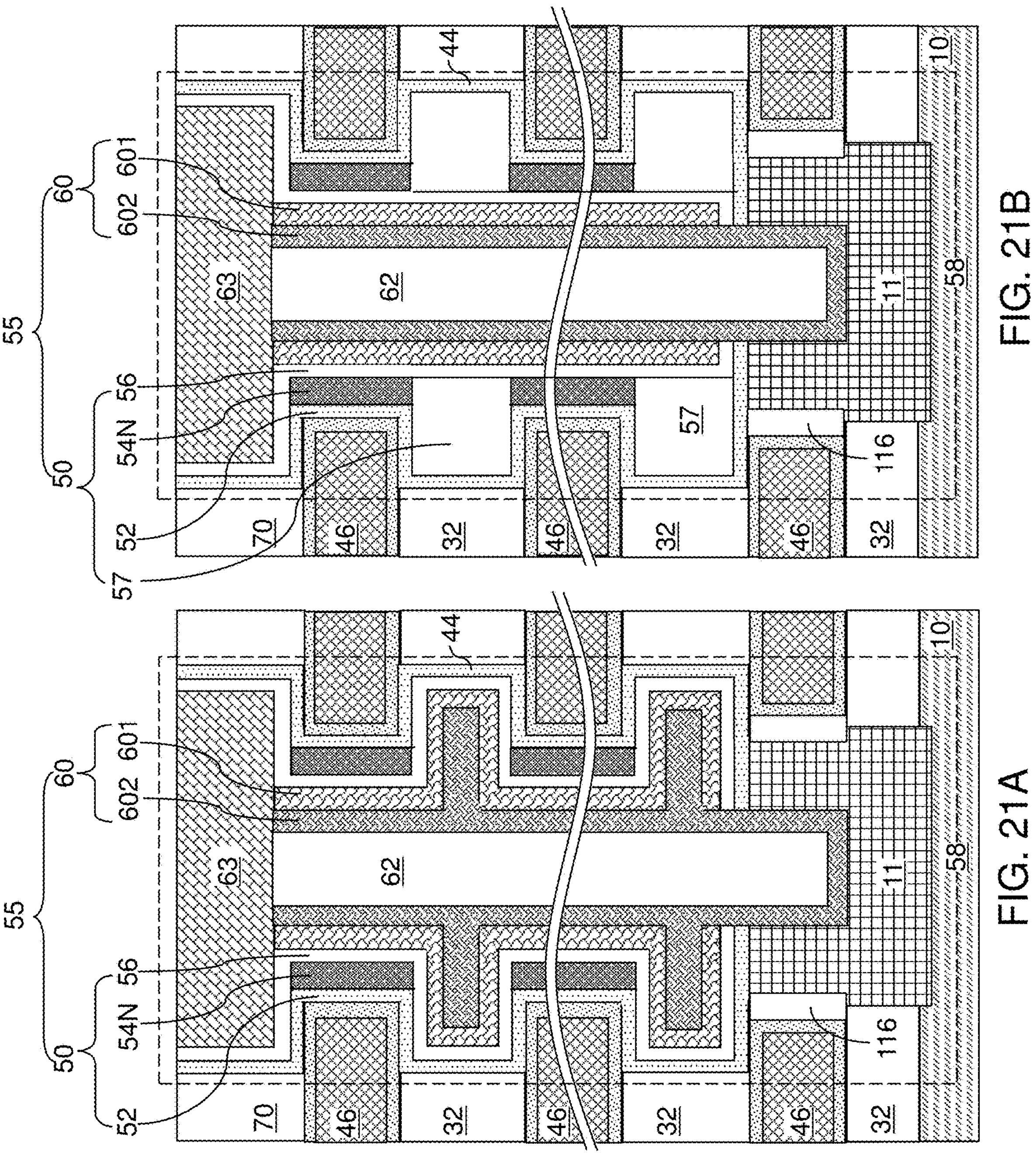
FIG. 21A is a magnified view of a memory opening in the first exemplary structure of FIGS. 18A and 18B in case a fourth exemplary memory opening fill structure is present in the memory opening according to a first embodiment of the present disclosure.
FIG. 21B is a magnified view of a memory opening in the first exemplary structure of FIGS. 18A and 18B in case an alternative configuration of the fourth exemplary memory opening fill structure is present in the memory opening according to a first embodiment of the present disclosure.

FIG. 21A is a magnified view of a memory opening in the first exemplary structure of FIGS. 18A and 18B in case a fourth exemplary memory opening fill structure is present in the memory opening according to an embodiment of the present disclosure. In this case, each charge storage element may comprise a discrete silicon nitride material portion 54N, which may have a tubular configuration. The tunneling dielectric layer 56 is in direct contact with the blocking dielectric layer 52 at levels of the insulating layers 32.

FIG. 21B is a magnified view of a memory opening in the first exemplary structure of FIGS. 18A and 18B in case an alternative configuration of the fourth exemplary memory opening fill structure is present in the memory opening according to an embodiment of the present disclosure. In this case, each charge storage element may comprise a silicon nitride material portion 54N, which may have a tubular configuration. The tunneling dielectric layer 56 is in direct contact with inner sidewalls of the annular insulating material portions 57 at levels of the insulating layers 32.

Figures 22A, 22B:
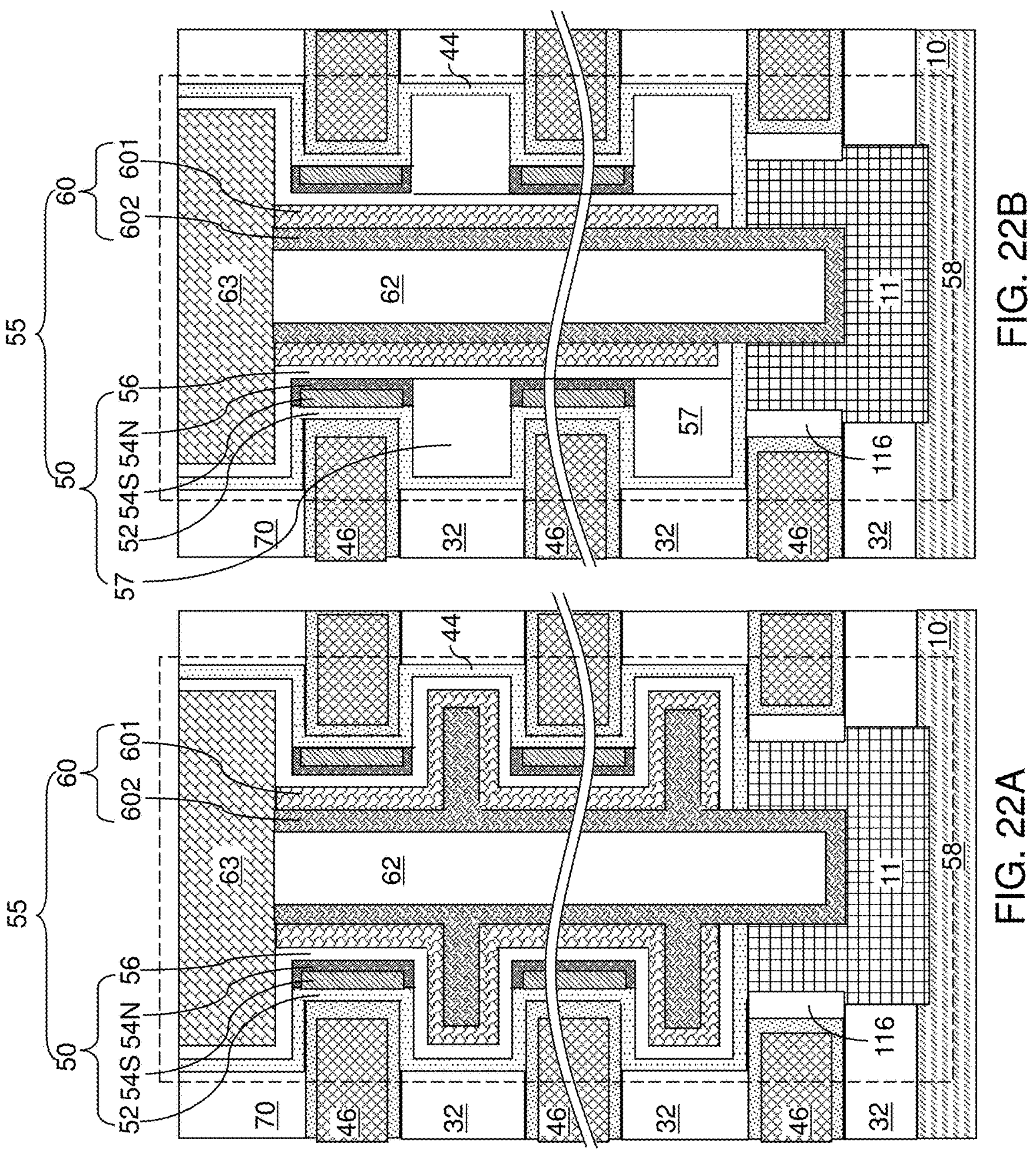
FIG. 22A is a magnified view of a memory opening in the first exemplary structure of FIGS. 18A and 18B in case a fifth exemplary memory opening fill structure is present in the memory opening according to a first embodiment of the present disclosure.
FIG. 22B is a magnified view of a memory opening in the first exemplary structure of FIGS. 18A and 18B in case an alternative configuration of the fifth exemplary memory opening fill structure is present in the memory opening according to a first embodiment of the present disclosure.

FIG. 22A is a magnified view of a memory opening in the first exemplary structure of FIGS. 18A and 18B in case a fifth exemplary memory opening fill structure is present in the memory opening according to an embodiment of the present disclosure. In this case, each charge storage element may comprise a discrete, composite charge storage structure (54S, 54N), which may have a tubular configuration. Each composite charge storage structure (54S, 54N) can include a stack of a semiconductor material portion 54S and a silicon nitride material portion 54N. The tunneling dielectric layer 56 is in direct contact with the blocking dielectric layer 52 at levels of the insulating layers 32.

FIG. 22B is a magnified view of a memory opening in the first exemplary structure of FIGS. 18A and 18B in case an alternative configuration of the fifth exemplary memory opening fill structure is present in the memory opening according to an embodiment of the present disclosure. In this case, each charge storage element may comprise a composite charge storage structure (54S, 54N), which may have a tubular configuration. Each composite charge storage structure (54S, 54N) can include a stack of a semiconductor material portion 54S and a silicon nitride material portion 54N. The tunneling dielectric layer 56 is in direct contact with inner sidewalls of the annular insulating material portions 57 at levels of the insulating layers 32.

Figures 23A, 23B:
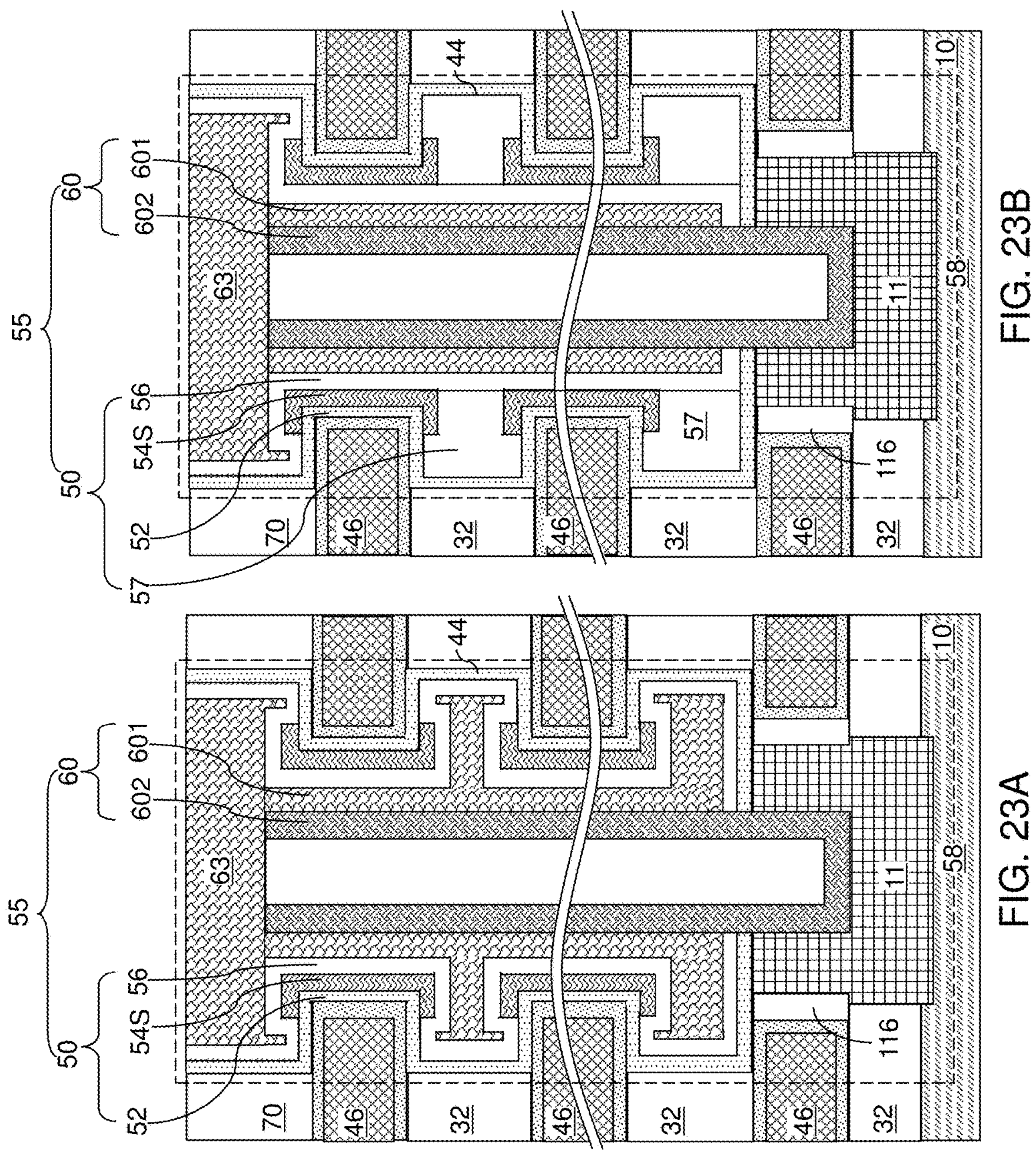
FIG. 23A is a magnified view of a memory opening in the first exemplary structure of FIGS. 18A and 18B in case a sixth exemplary memory opening fill structure is present in the memory opening according to a first embodiment of the present disclosure.
FIG. 23B is a magnified view of a memory opening in the first exemplary structure of FIGS. 18A and 18B in case an alternative configuration of the sixth exemplary memory opening fill structure is present in the memory opening according to a first embodiment of the present disclosure.

FIG. 23A is a magnified view of a memory opening in the first exemplary structure of FIGS. 18A and 18B in case a sixth exemplary memory opening fill structure is present in the memory opening according to an embodiment of the present disclosure. In this case, each charge storage element may comprise a discrete semiconductor material portion 54S, which may have a tubular portion 54T, an upper flange portion 54U, and a lower flange portion 54F. The tunneling dielectric layer 56 is in direct contact with the blocking dielectric layer 52 at levels of the insulating layers 32.

FIG. 23B is a magnified view of a memory opening in the first exemplary structure of FIGS. 18A and 18B in case an alternative configuration of the sixth exemplary memory opening fill structure is present in the memory opening according to an embodiment of the present disclosure. In this case, each charge storage element may comprise a semiconductor material portion 54S, which may have a tubular portion 54T, an upper flange portion 54U, and a lower flange portion 54F. The tunneling dielectric layer 56 is in direct contact with inner sidewalls of the annular insulating material portions 57 at levels of the insulating layers 32.

Figures 24A, 24B:
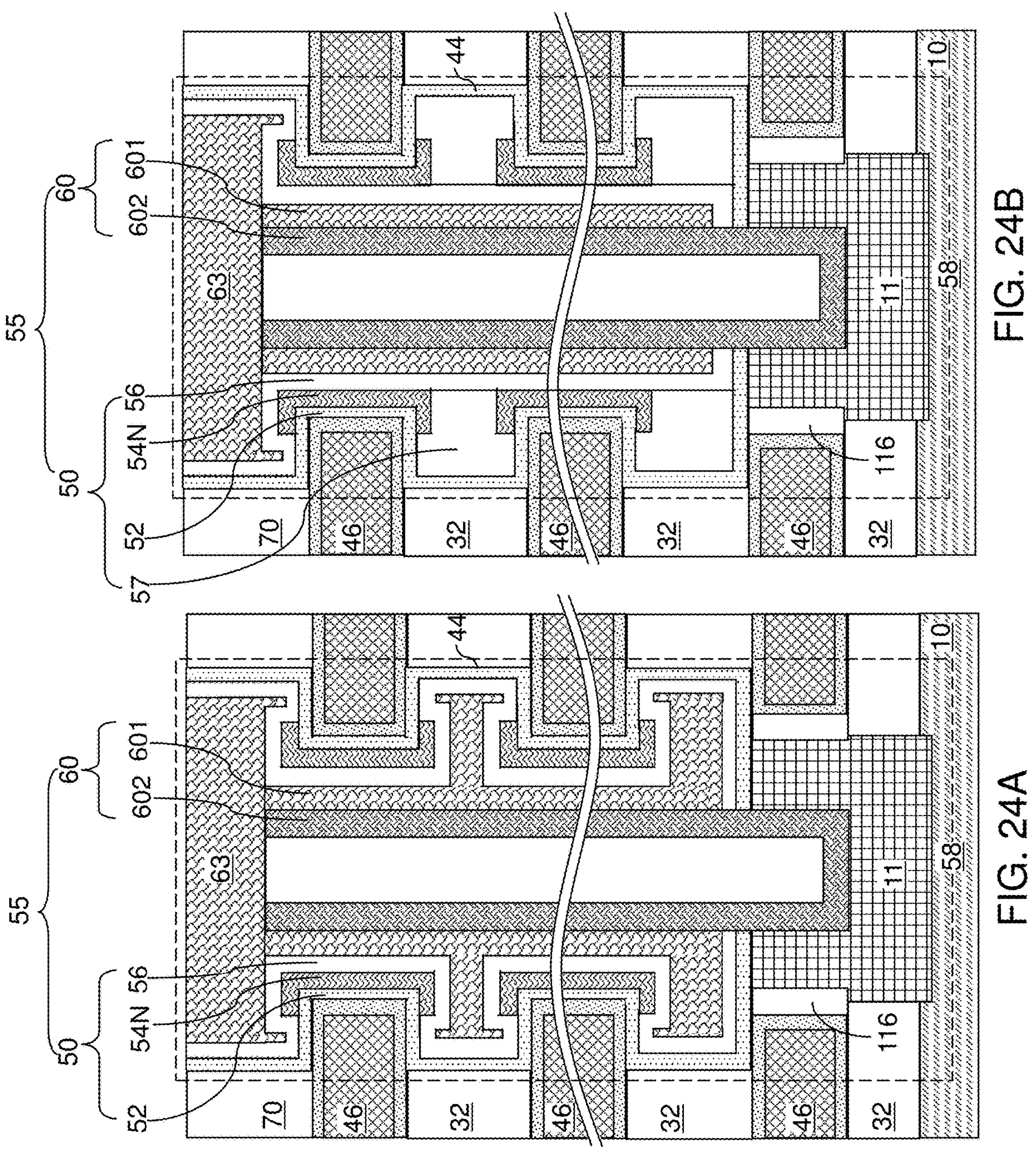
FIG. 24A is a magnified view of a memory opening in the first exemplary structure of FIGS. 18A and 18B in case a seventh exemplary memory opening fill structure is present in the memory opening according to a first embodiment of the present disclosure.
FIG. 24B is a magnified view of a memory opening in the first exemplary structure of FIGS. 18A and 18B in case an alternative configuration of the seventh exemplary memory opening fill structure is present in the memory opening according to a first embodiment of the present disclosure.

FIG. 24A is a magnified view of a memory opening in the first exemplary structure of FIGS. 18A and 18B in case a seventh exemplary memory opening fill structure is present in the memory opening according to an embodiment of the present disclosure. In this case, each charge storage element may comprise a discrete silicon nitride material portion 54N, which may have a tubular portion 54T, an upper flange portion 54U, and a lower flange portion 54F. The tunneling dielectric layer 56 is in direct contact with the blocking dielectric layer 52 at levels of the insulating layers 32.

FIG. 24B is a magnified view of a memory opening in the first exemplary structure of FIGS. 18A and 18B in case an alternative configuration of the seventh exemplary memory opening fill structure is present in the memory opening according to an embodiment of the present disclosure. In this case, each charge storage element may comprise a silicon nitride material portion 54N, which may have a tubular portion 54T, an upper flange portion 54U, and a lower flange portion 54F. The tunneling dielectric layer 56 is in direct contact with inner sidewalls of the annular insulating material portions 57 at levels of the insulating layers 32.

Figures 25A, 25B:
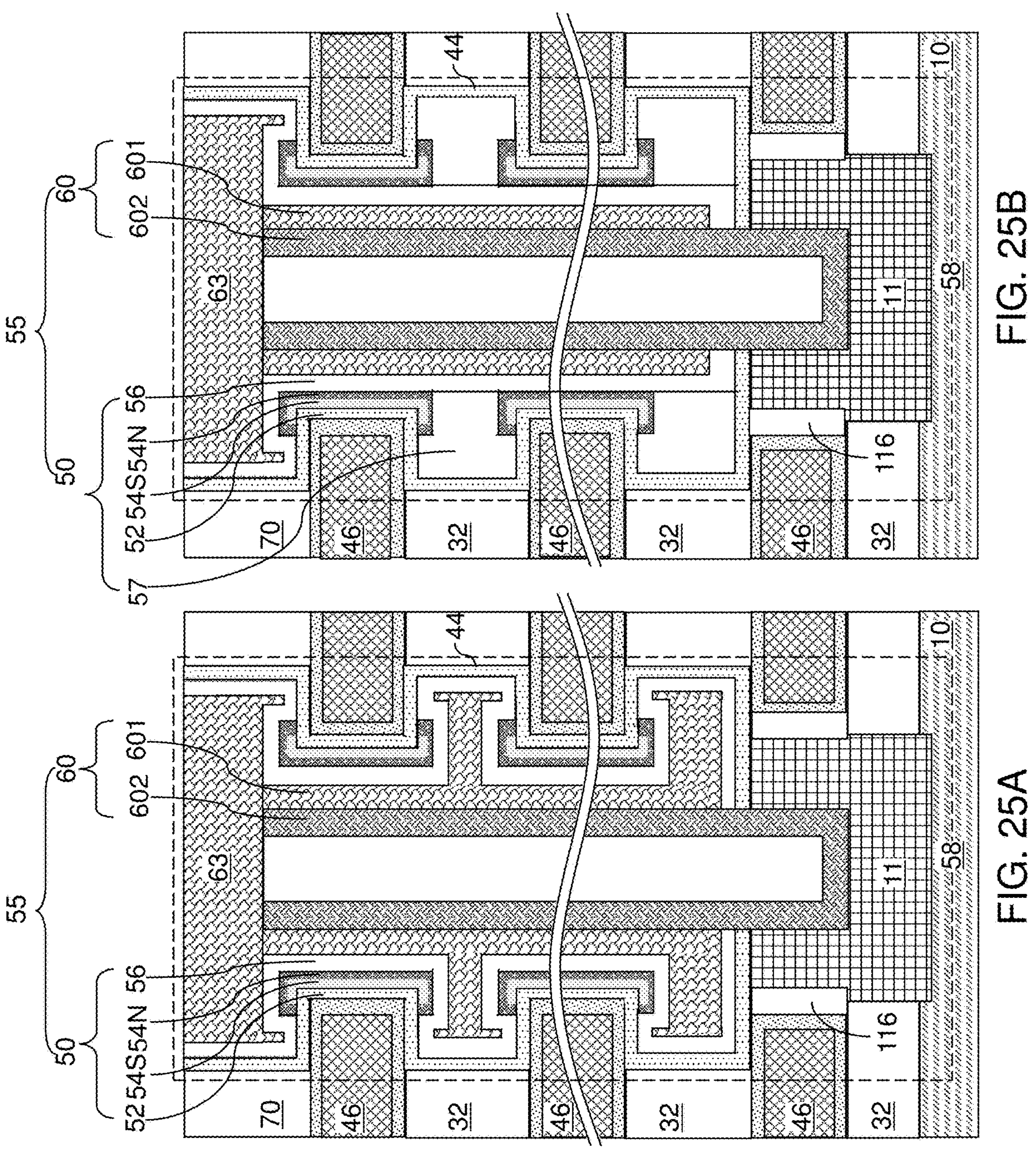
FIG. 25A is a magnified view of a memory opening in the first exemplary structure of FIGS. 18A and 18B in case a eighth exemplary memory opening fill structure is present in the memory opening according to a first embodiment of the present disclosure.
FIG. 25B is a magnified view of a memory opening in the first exemplary structure of FIGS. 18A and 18B in case an alternative configuration of the eighth exemplary memory opening fill structure is present in the memory opening according to a first embodiment of the present disclosure.

FIG. 25A is a magnified view of a memory opening in the first exemplary structure of FIGS. 18A and 18B in case a eighth exemplary memory opening fill structure is present in the memory opening according to an embodiment of the present disclosure. In this case, each charge storage element may comprise a discrete composite charge storage structure (54S, 54N), which includes a stack of a semiconductor material portion 54S and a silicon nitride material portion 54N. Each composite charge storage structure (54S, 54N) may have a tubular portion 54T, an upper flange portion 54U, and a lower flange portion 54F. The tunneling dielectric layer 56 is in direct contact with the blocking dielectric layer 52 at levels of the insulating layers 32.

FIG. 25B is a magnified view of a memory opening in the first exemplary structure of FIGS. 18A and 18B in case an alternative configuration of the eighth exemplary memory opening fill structure is present in the memory opening according to an embodiment of the present disclosure. In this case, each charge storage element may comprise a composite charge storage structure (54S, 54N), which includes a stack of a semiconductor material portion 54S and a silicon nitride material portion 54N. Each composite charge storage structure (54S, 54N) may have a tubular portion 54T, an upper flange portion 54U, and a lower flange portion 54F. The tunneling dielectric layer 56 is in direct contact with inner sidewalls of the annular insulating material portions 57 at levels of the insulating layers 32.

Referring to all drawings and according to various embodiments of the present disclosure, a three-dimensional memory device is provided, which comprises: an alternating stack of insulating layers 32 and electrically conductive layers 46 located over a substrate (9, 10); a memory opening 49 vertically extending through the alternating stack (32, 46), wherein the memory opening 49 has laterally-protruding portions (such as the annular lateral recesses 149) that extend outward at each level of the insulating layers 32; and a memory opening fill structure 58 located in the memory opening 49 and comprising, from outside to inside, a blocking dielectric layer 52, charge storage structures {(54S, 54N) or (54S, 52)} comprising a vertical stack of discrete semiconductor material portions 54S and at least one silicon nitride material portion (54N or 53) in contact with the vertical stack 54S, a tunneling dielectric layer 56 in contact with the charge storage structures {(54S, 54N) or (54S, 52)}, and a vertical semiconductor channel 60.

In one embodiment, the at least one silicon nitride material portion 54N comprises a vertical stack of discrete silicon nitride material portions 54N in contact with a respective discrete semiconductor material portion 54S within the vertical stack of discrete semiconductor material portions 54S.

In one embodiment, each discrete silicon nitride material portion 54N within the vertical stack of discrete silicon nitride material portions 54N is in contact with the tunneling dielectric layer 56; and each discrete semiconductor material portion 54S within the vertical stack of discrete semiconductor material portions 54S is not in contact with the tunneling dielectric layer 56, and is spaced from the tunneling dielectric layer 56 by the vertical stack of discrete silicon nitride material portions 54N.

In one embodiment, each silicon nitride material portion 54N comprises a tubular portion 54T having a uniform thickness between an inner sidewall and an outer sidewall, an upper flange portion 54U extending outward from an upper periphery of the inner sidewall of the tubular portion 54T, and a lower flange portion 54F extending outward from a lower periphery of the inner sidewall of the tubular portion 54T.

In one embodiment, each silicon nitride material portion 54N comprises an interfacial region located in proximity to a respective one of the discrete semiconductor material portions 54S and having a graded silicon-to-nitrogen ratio.

In one embodiment, the at least one silicon nitride material portion comprises a silicon nitride layer 53 vertically extending through layers of the alternating stack (32, 46) and contacting an outer sidewall of each discrete semiconductor material portion 54S within the vertical stack of discrete semiconductor material portions 54S. In one embodiment, the silicon nitride layer 53 is in contact with an inner sidewall of the blocking dielectric layer 52 and an outer sidewall of the tunneling dielectric layer 56. In one embodiment, all surfaces of the vertical stack of discrete semiconductor material portions 54S are in contact with a surface of the silicon nitride liner 53 or a surface of the tunneling dielectric layer 56.

In one embodiment, the tunneling dielectric layer 56 has a laterally-undulating vertical cross-sectional profile, and comprises laterally-protruding portions located at levels of the insulating layers 32 and contacting horizontal annular surfaces of the blocking dielectric layer 52 and overlying or underlying portions of the electrically conductive layers 46 that are proximal to the vertical stack of discrete semiconductor material portions 54S.

In one embodiment, the memory opening fill structure 58 comprises a vertical stack of annular insulating material portions 57 located at each level of the insulating layers 32 between the blocking dielectric layer 52 and the tunneling dielectric layer 56; and the tunneling dielectric layer 56 comprises a straight outer sidewall contacting each annular insulating material portion 57 within the vertical stack of annular insulating material portions 57 and contacting the vertical stack of discrete semiconductor material portions 54S.

According to another aspect of the present disclosure, a three-dimensional memory device is provided, which comprises: an alternating stack of insulating layers 32 and electrically conductive layers 46 located over a substrate (9, 10); a memory opening 49 vertically extending through the alternating stack (32, 46), wherein the memory opening 49 has laterally-protruding portions (such as the annular lateral recesses 149) that extend outward at levels of the insulating layers 32; and a memory opening fill structure 58 located in the memory opening 49 and comprising, from outside to inside, a blocking dielectric layer 52, a vertical stack of discrete charge storage material portions {54S, 54N, (54S, 54N)}, a tunneling dielectric layer 56, and a vertical semiconductor channel 60, wherein each charge storage material portion {54S, 54N, (54S, 54N)} comprises a tubular portion 54T located at a level of a respective one of the electrically material layers 46, an upper flange portion 54U laterally extending outward from an upper end of an outer sidewall of the tubular portion 54T, and a lower flange portion 54F laterally extending outward from a lower end of the outer sidewall of the tubular portion 54T.

In one embodiment, each charge storage material portion comprises a respective semiconductor material portion 54S. In one embodiment, each charge storage material portion comprises a respective silicon nitride material portion 54N. In one embodiment, each charge storage material portion comprises a respective stack of a semiconductor material portion 54S and a silicon nitride material portion 54N. In one embodiment, the semiconductor material portion 54S of each charge storage material portion (54S, 54N) does not contact the tunneling dielectric layer 56, and is spaced from the tunneling dielectric layer 56 by a respective one of the silicon nitride material portions 54N.

In one embodiment, the upper flange portion 54U contacts a horizontal top surface of the blocking dielectric layer 52; and the lower flange portion 54F comprises a horizontal bottom surface of the blocking dielectric layer 52.

In one embodiment, the blocking dielectric layer 52 have a laterally-undulating vertical cross-sectional profile; first tubular portions of the blocking dielectric layer 52 located at levels of the insulating layers 32 are laterally offset outward from second tubular portions of the blocking dielectric layer 52 located at levels of the electrically conductive layers 46; and the first tubular portions of the blocking dielectric layer 52 are not in contact with (i.e., not in direct contact with) the vertical stack of charge storage material portions 54.

In one embodiment, the vertical semiconductor channel 60 comprises: a tubular portion that vertically extends through a plurality of electrically conductive material layers 46 within the alternating stack (32, 46); and laterally-protruding portions that protrude outward from the tubular portion at the levels of the insulating layers 32 (as illustrated, for example, in FIGS. 19A, 20A, 21A, 22A, 23A, 24A, and 25A).

In one embodiment, the memory opening fill structure 58 comprises a vertical stack of annular insulating material portions 57 located at the levels of the insulating layers 32 between the blocking dielectric layer 52 and the tunneling dielectric layer 56; and the tunneling dielectric layer 56 comprises a straight outer sidewall contacting each annular insulating material portion 57 within the vertical stack of annular insulating material portions 57 and contacting the vertical stack of charge storage material portions {54S, 54N, (54S, 54N)} (as illustrated in FIGS. 19B, 20B, 21B, 22B, 23B, 24B, and 25B).

In one embodiment, the memory opening fill structure 58 comprises a doped semiconductor material portion (such as a drain region 63) that overlies the vertical semiconductor channel 60 and forms a p-n junction at an interface with the vertical semiconductor channel 60.

The various embodiments of the present disclosure can be employed to provide a vertical stack of discrete charge storage elements providing reduced charge leakage across vertical levels and/or increased charge storage capacity through use of flange portions for each charge storage element. The various embodiments of the present disclosure can facilitate device scaling along the vertical direction in a three-dimensional NAND memory device or other vertical memory devices.

Figure 26:
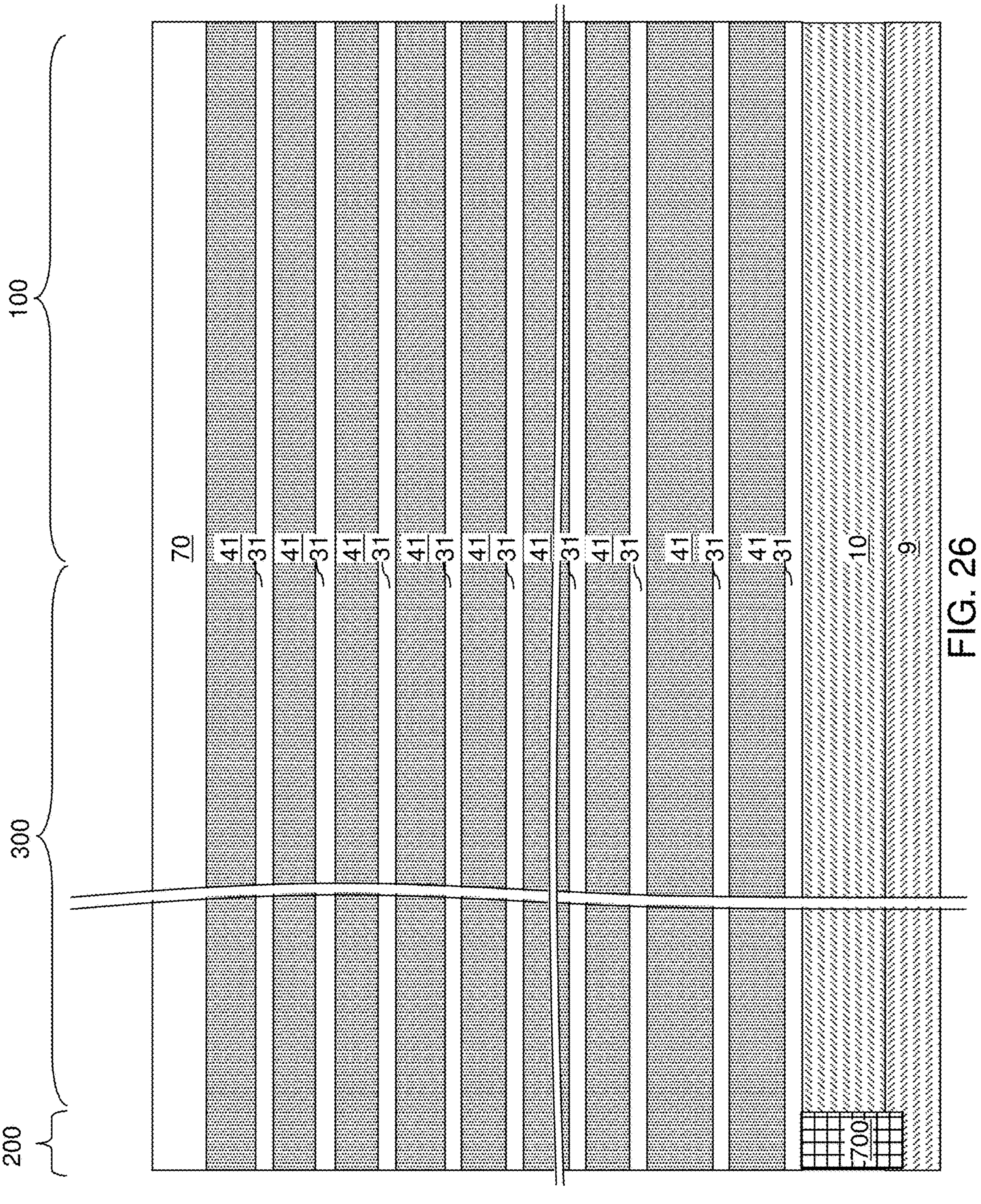
FIG. 26 is a schematic vertical cross-sectional view of a second exemplary structure after formation of an alternating stack of disposable material layers and silicon nitride layers according to a second embodiment of the present disclosure.

Referring to FIG. 26, a second exemplary structure according to a second embodiment of the present disclosure can be derived from the first exemplary structure of FIG. 1 by forming an alternating stack of disposable material layers 31 and silicon nitride layers 41. The disposable material layers 31 include a material that can be removed selective to the silicon nitride layers 41 and the upper substrate semiconductor layer 10. For example, the disposable material layer 31 may include undoped silicate glass (i.e., silicon oxide) doped silicate glass (such as borosilicate glass), organosilicate glass, amorous carbon, or a silicon-germanium alloy including germanium at an atomic concentration greater than 15% (such as from 15% to 99%). In one embodiment, the disposable material layers 31 can include doped or undoped silicon oxide. The silicon nitride layers 41 can consist essentially of silicon nitride.

The disposable material layers 31 can be deposited by chemical vapor deposition, and can have a thickness in a range from 1.5 nm to 10 nm, such as from 3 nm to 6 nm, although lesser and greater thicknesses may also be employed. The silicon nitride layers 41 can be deposited by chemical vapor deposition, and can have a thickness in a range from 6 nm to 40 nm, although lesser and greater thicknesses may also be employed. The sum of the thickness of a disposable material layer 31 and a silicon nitride layer 41 can be less than the sum of the thickness of an insulating layer 32 and a sacrificial material layer 42 in the first exemplary structure. Further, the silicon nitride layers 41 may be thicker than the disposable material layers 31. In one embodiment, a ratio of the thickness of a silicon nitride layer 41 to the thickness of a disposable material layer 31 can be in a range from 1.5 to 10, such as from 2 to 5, although lesser and greater ratios may also be employed. Generally, a lesser thickness for the disposable material layers 31 is preferable as long as the material of the disposable material layers 31 can be subsequently removed by a lateral isotropic etch process selective to the silicon nitride layers 41. An insulating cap layer 70 can be deposited in the same manner as in the processing steps of FIG. 2.

Figure 27:
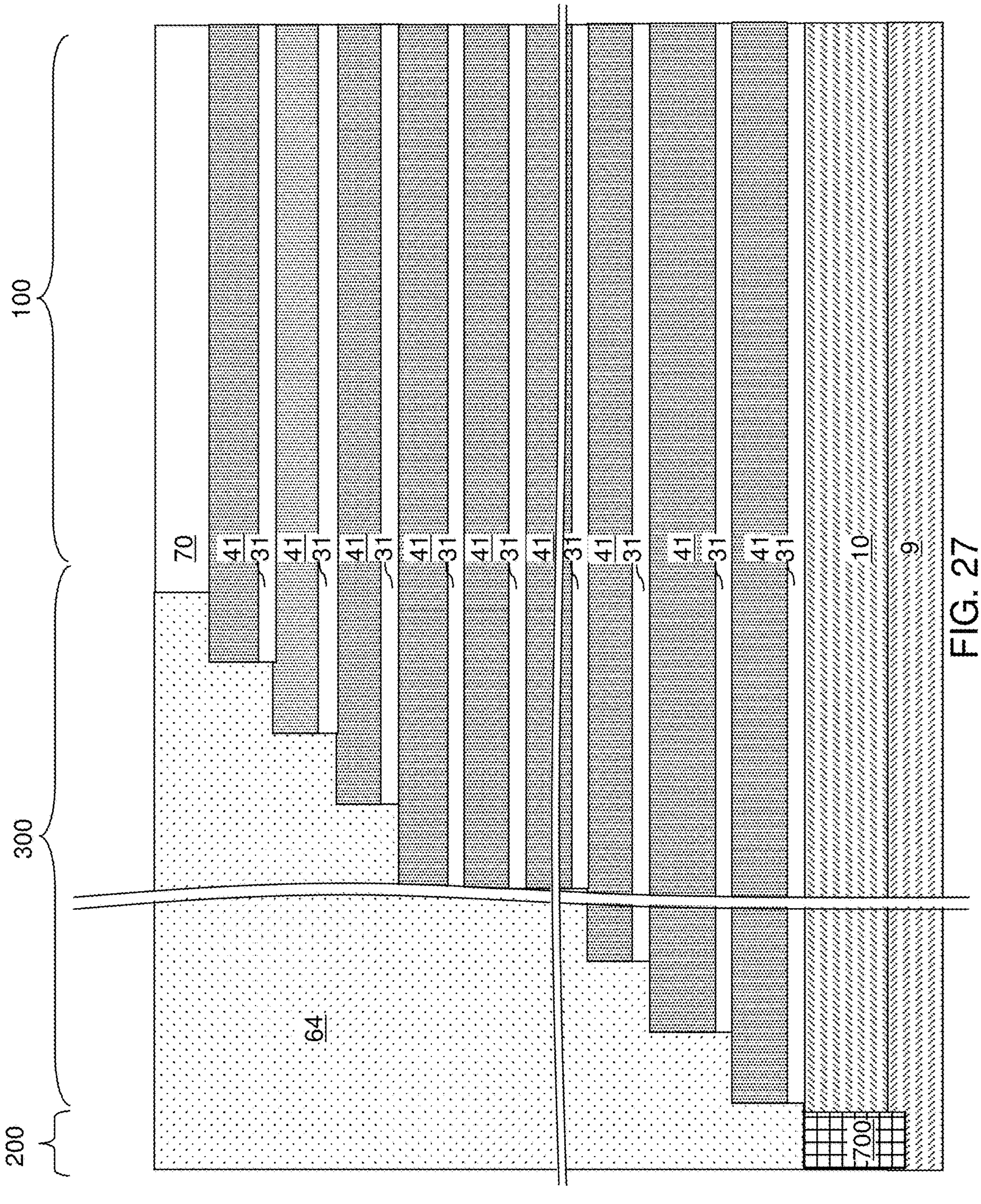
FIG. 27 is a schematic vertical cross-sectional view of the second exemplary structure after formation of stepped terraces and a retro-stepped dielectric material portion according to a second embodiment of the present disclosure.

Referring to FIG. 27, the processing steps of FIG. 3 can be performed to form stepped surfaces with any needed changes in view of the changes in the material compositions and thicknesses of the alternating stack of the disposable material layers 31 and the silicon nitride layers 41 relative to the alternating stack of the insulating layers 32 and the sacrificial material layers 42 in the first exemplary structure. A dielectric material can be deposited and planarized over the stepped surfaces to form a retro-stepped dielectric material portion 64. The retro-stepped dielectric material portion 64 can include a dielectric material that provides a higher etch resistance to an etchant to be subsequently employed to remove the disposable material layers 31. For example, if the disposable material layers 31 include a doped silicate glass or organosilicate glass, the retro-stepped dielectric material portion 64 can include silicon oxycarbide (e.g., carbon-doped silicate glass), which provides a significantly higher etch resistance to hydrofluoric acid than silicon oxide disposable material layers 31.

Figure 28A:
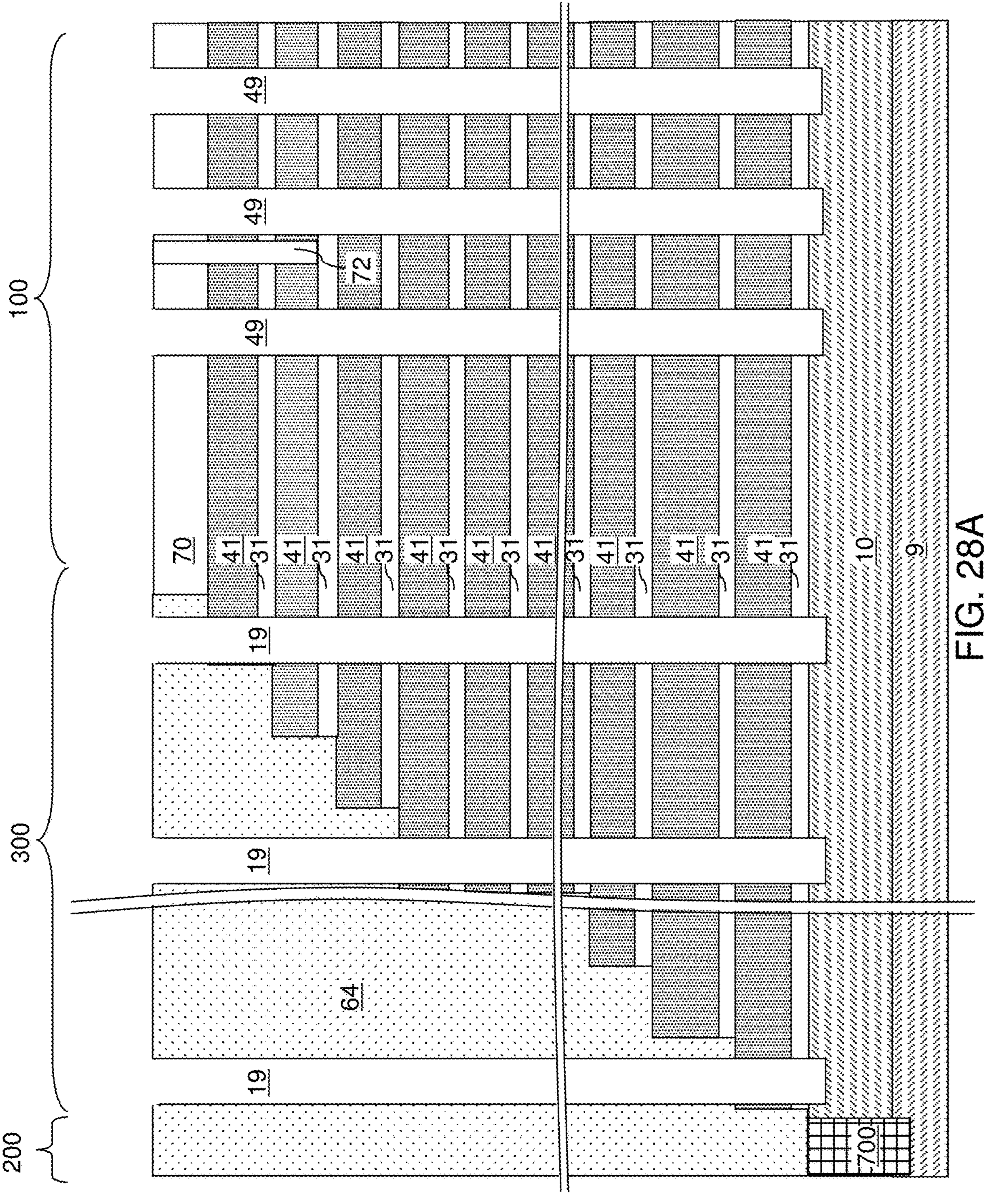
FIG. 28A is a schematic vertical cross-sectional view of the second exemplary structure after formation of memory openings and support openings according to a second embodiment of the present disclosure.
Figure 28B:
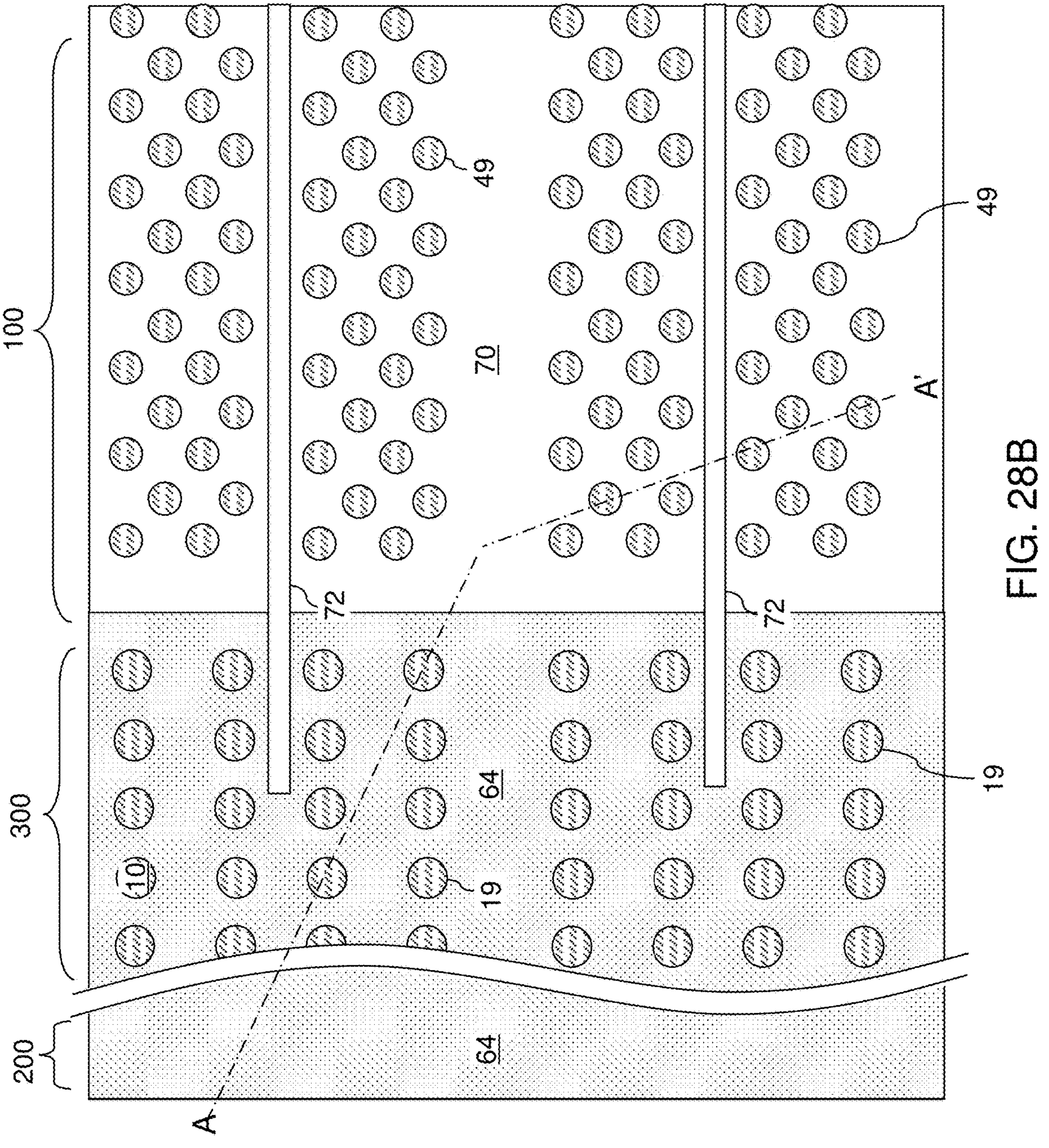
FIG. 28B is a top-down view of the second exemplary structure of FIG. 28A. The vertical plane A-A' is the plane of the cross-section for FIG. 28A.

Referring to FIGS. 28A and 28B, the processing steps of FIGS. 4A and 4B can be performed with any needed changes to form memory openings 49 and support openings 19 in view of the changes in the material compositions and thicknesses of the alternating stack of the disposable material layers 31 and the silicon nitride layers 41 relative to the alternating stack of the insulating layers 32 and the sacrificial material layers 42 in the first exemplary structure.

Figure 28C:
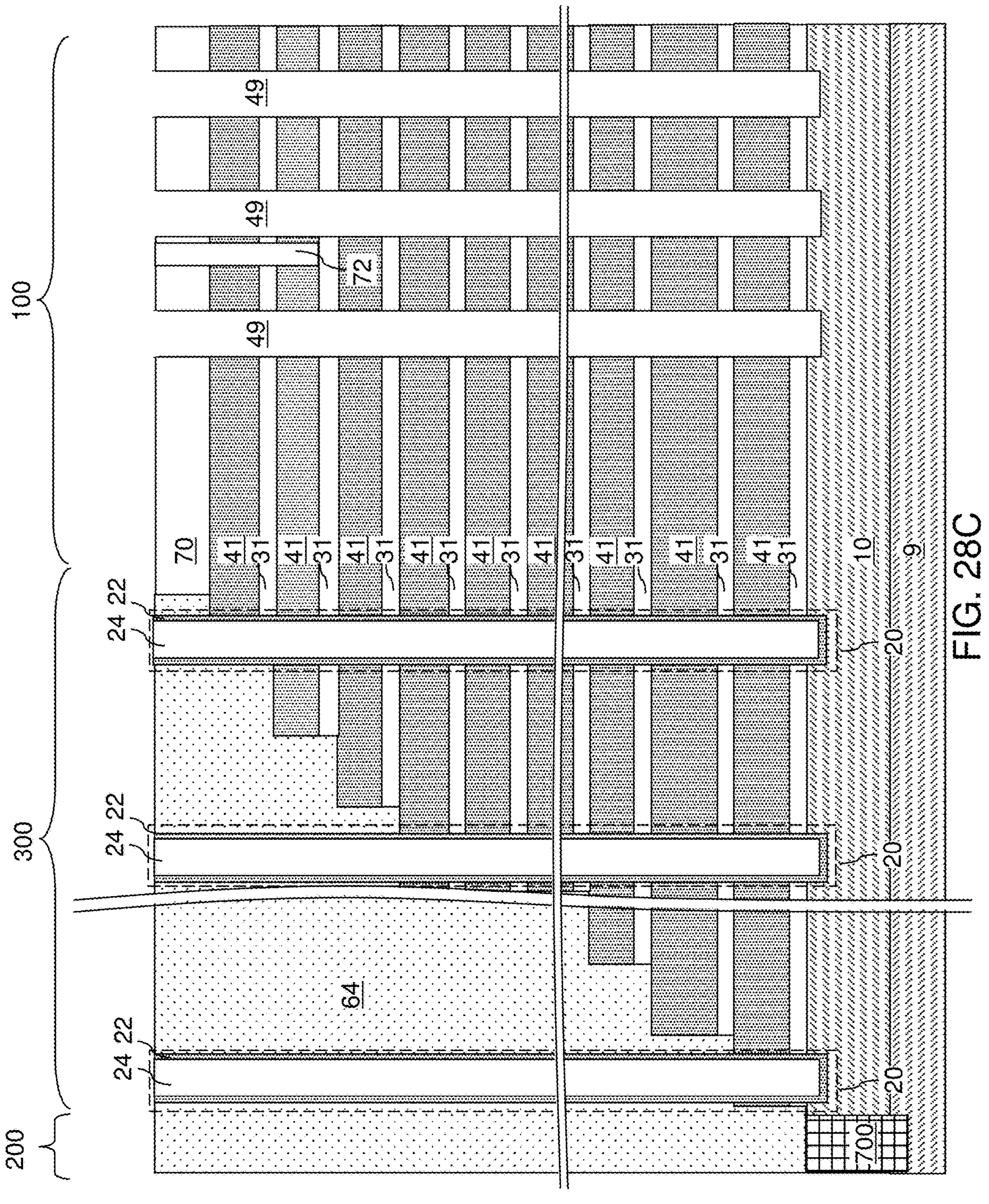
FIG. 28C is a schematic vertical cross-sectional view of the second exemplary structure after formation of support pillar structures according to a second embodiment of the present disclosure.

Referring to FIG. 28C, support pillar structures 20 are formed in the support openings 19. Each support pillar structure 20 comprises a dielectric (i.e., insulating) material at least in its outer surface. In other embodiment, the entire support pillar structure 20 may be formed from a dielectric material. For example, each support pillar structure 20 may comprise a silicon nitride liner 22 deposited into the support opening 19 surrounding a silicon oxide core 24 deposited over the silicon nitride liner 22. The silicon nitride liner 22 and the silicon oxide core 24 may be planarized by chemical mechanical planarization (i.e., polishing) such that their top surface is even with the top surface of the insulating cap layer 70. The memory opening 49 may be covered with a sacrificial mask (e.g., photoresist) or filled with a sacrificial fill material (e.g., amorphous silicon) during the deposition of the silicon nitride liner 22 and the silicon oxide core 24, and which may be removed after deposition of the silicon nitride liner 22 and the silicon oxide core 24. Alternatively, the silicon nitride liner 22 and the silicon oxide core 24 may be deposited into the memory openings 49 and the support openings 19 followed by masking the support openings 19 and removing the silicon nitride liner 22 and the silicon oxide core 24 located in the memory openings 49 by etching.

FIGS. 29A-29H are sequential schematic vertical cross-sectional views of a memory opening 49 within the second exemplary structure during formation of a memory stack structure 55, an optional dielectric core 62, and a drain region 63 therein according to an embodiment of the present disclosure.

Figures 29A, 29B:
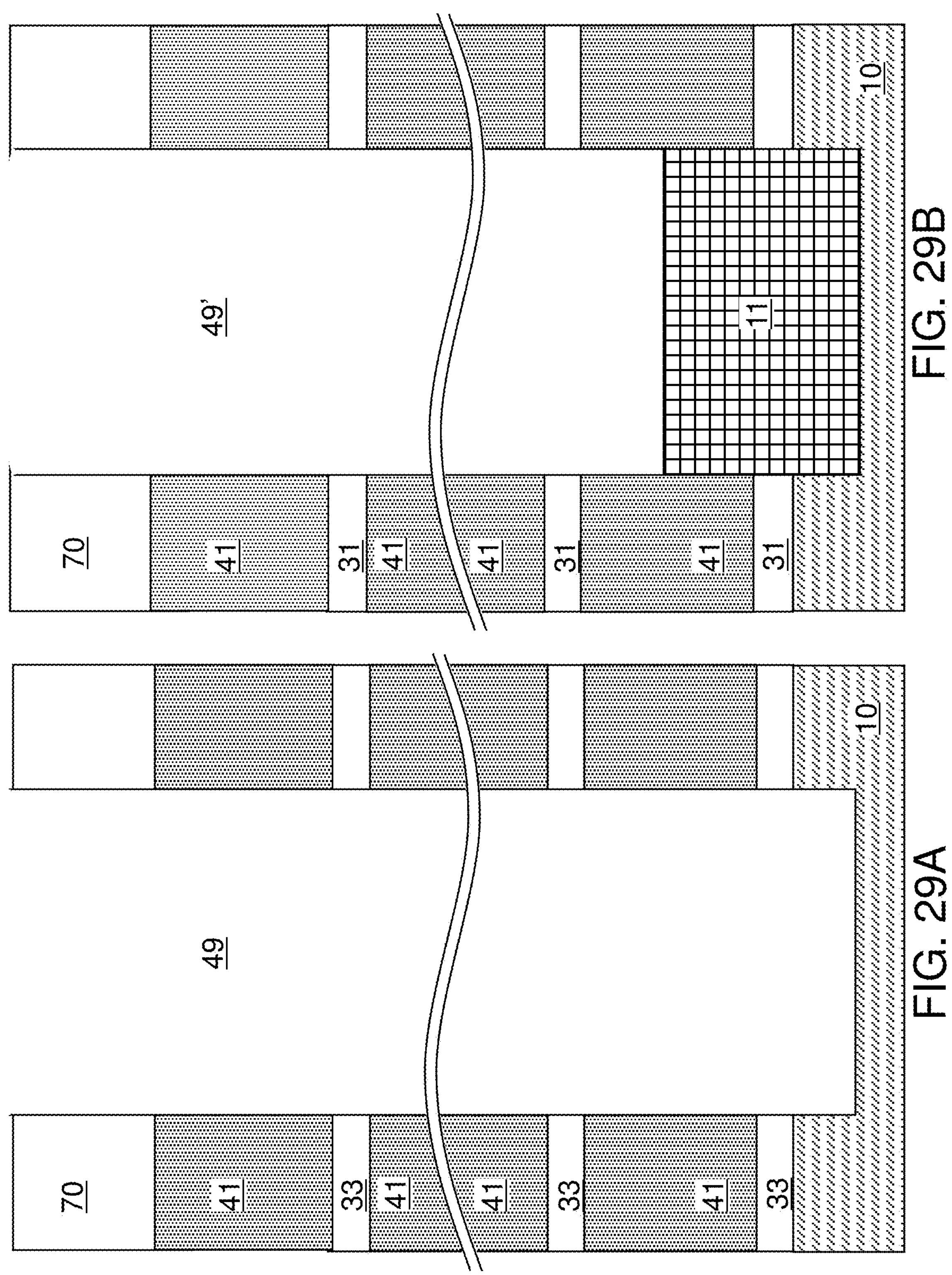
FIGS. 29A-29H are sequential schematic vertical cross-sectional views of a memory opening within the second exemplary structure during formation of a memory stack structure, an optional dielectric core, and a drain region therein according to a second embodiment of the present disclosure.

FIG. 29A illustrates a memory opening 49 at the processing steps of FIG. 28C.

Referring to FIG. 29B, the processing steps of FIG. 5B can be performed to form a pedestal channel portion 11 in each memory opening 49. Alternatively, the pedestal channel portion 11 may be omitted if a lateral source contact structure (e.g., direct strap contact) will be formed in contact with a side of the vertical semiconductor channel 60 in a subsequent step as will be described below with respect to the third embodiment.

Figures 29C, 29D:
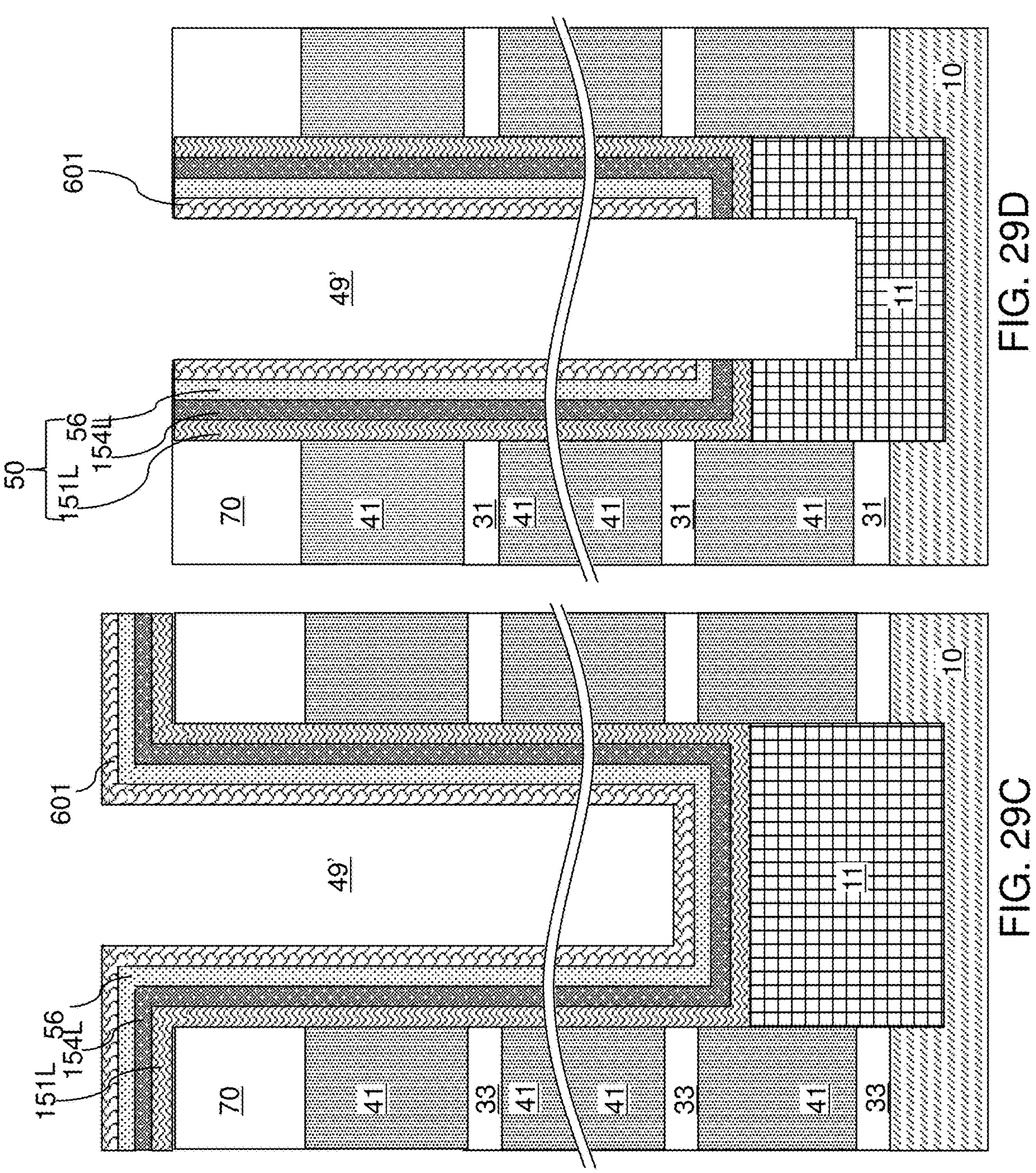

Referring to FIG. 29C, a stack of layers including a semiconductor liner 151L, a charge storage material layer 154L, a tunneling dielectric layer 56, and an optional first semiconductor channel layer 601 can be sequentially deposited in the memory openings 49.

The semiconductor liner 151L can include a semiconductor material such as amorphous silicon, polysilicon, or a silicon-germanium alloy. The semiconductor liner 151L includes a different material than the material of the disposable material layers 31. In case the disposable material layers 31 include a silicon-germanium alloy, the semiconductor liner 151L can include amorphous silicon or polysilicon so that the semiconductor liner 151L functions as an etch stop structure. In case the disposable material layers 31 include undoped silicate glass, a doped silicate glass, or organosilicate glass, the semiconductor liner 151L can include amorphous silicon, polysilicon, or a silicon-germanium alloy. The semiconductor liner 151L may have a thickness in a range from 1 nm to 6 nm, such as from 2 nm to 4 nm, although lesser and greater thicknesses may also be employed.

Subsequently, the charge storage material layer 154L can be formed. In one embodiment, the charge storage material layer 154L can be a continuous layer that is deposited by a conformal deposition process. In one embodiment, the charge storage material layer 154L can include a silicon nitride layer having a uniform thickness throughout. The thickness of the charge storage material layer 154L can be in a range from 3 nm to 8 nm, although lesser and greater thicknesses may also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601). In an alternative embodiment, a sacrificial cover material layer may be employed in lieu of the first semiconductor channel layer 601. In this case, the sacrificial cover material layer can include any cover material that can protect the charge storage material layer 154L during a subsequent anisotropic etch process.

Referring to FIG. 29D, the optional first semiconductor channel layer 601, the tunneling dielectric layer 56, the charge storage material layer 154L, the semiconductor liner 151L are sequentially anisotropically etched employing at least one anisotropic etch process. The portions of the first semiconductor channel layer 601, the tunneling dielectric layer 56, the charge storage material layer 154L, and the semiconductor liner 151L located above the top surface of the insulating cap layer 70 can be removed by the at least one anisotropic etch process. Further, the horizontal portions of the first semiconductor channel layer 601, the tunneling dielectric layer 56, the charge storage material layer 154L, and the semiconductor liner 151L at a bottom of each memory cavity 49' can be removed to form openings in remaining portions thereof. Each of the first semiconductor channel layer 601, the tunneling dielectric layer 56, the charge storage material layer 154L, and the semiconductor liner 151L can be etched by a respective anisotropic etch process employing a respective etch chemistry, which may, or may not, be the same for the various material layers.

Each remaining portion of the first semiconductor channel layer 601 can have a tubular configuration. In one embodiment, the charge storage material layer 154L can be a charge storage layer in which each portion adjacent to the silicon nitride layers 41 constitutes a charge storage region.

A surface of the pedestal channel portion 11 (or a surface of the upper substrate semiconductor layer 10 in case the pedestal channel portions 11 are not employed) can be physically exposed underneath the opening through the first semiconductor channel layer 601, the tunneling dielectric layer 56, the charge storage material layer 154L, and the semiconductor liner 151L. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the upper substrate semiconductor layer 10 in case pedestal channel portions 11 are not employed) by a recess distance. A tunneling dielectric layer 56 is located over the charge storage material layer 154L. A set of a semiconductor liner 151L, a charge storage material layer 154L, and a tunneling dielectric layer 56 in a memory opening 49 constitutes a memory film 50, which includes a plurality of charge storage regions (as embodied as the charge storage material layer 154L) that are insulated from surrounding materials by the semiconductor liner 151L and the tunneling dielectric layer 56. In one embodiment, the first semiconductor channel layer 601, the tunneling dielectric layer 56, the charge storage material layer 154L, and the semiconductor liner 151L can have vertically coincident sidewalls. In case a sacrificial cover material layer is employed in lieu of the first semiconductor channel layer 601, the sacrificial cover material layer can be removed selective to the charge storage material layer 154L.

Figures 29E, 29F:
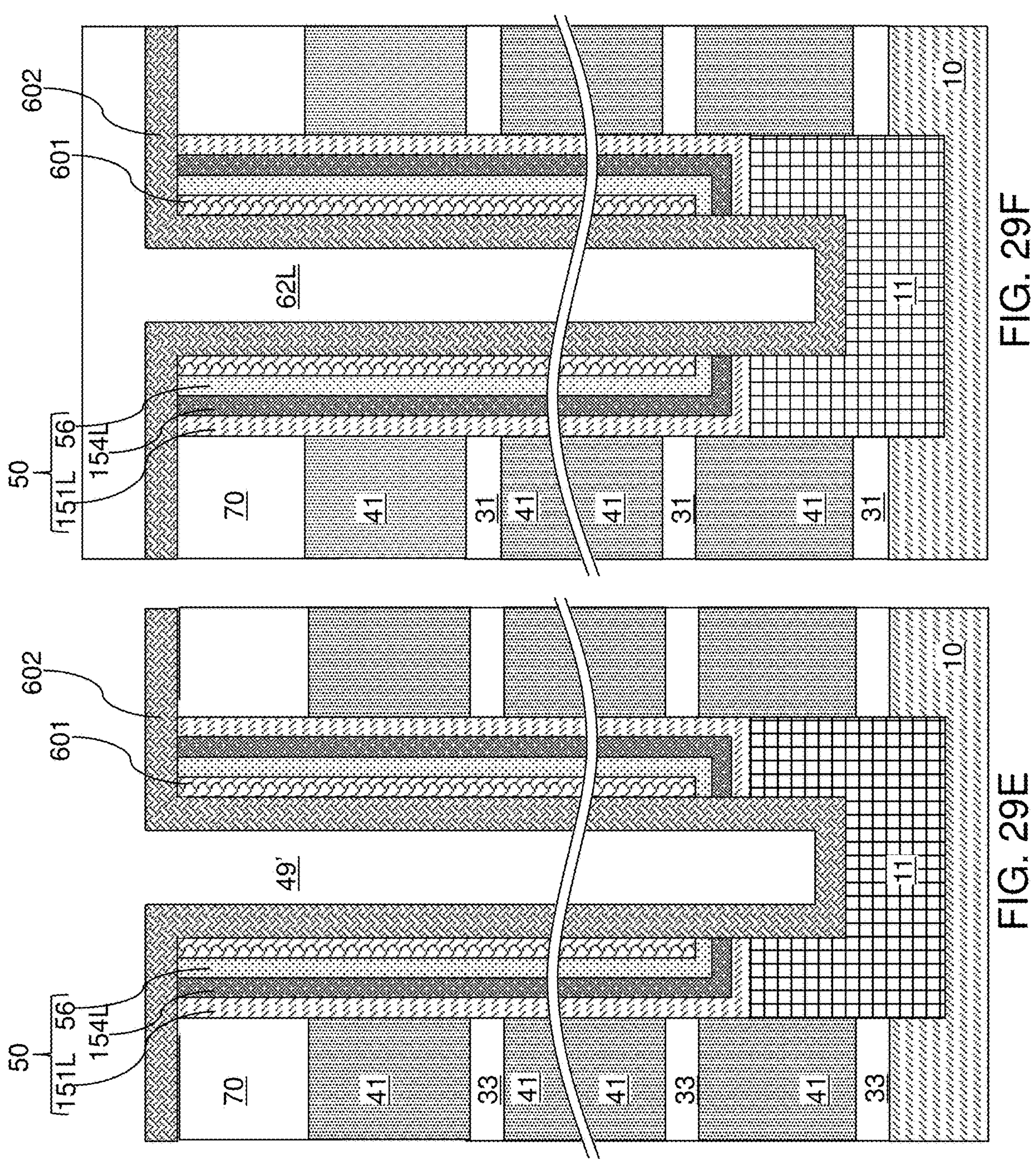

Referring to FIG. 29E, a second semiconductor channel layer 602 can be deposited directly on the semiconductor surface of the pedestal channel portion 11 or the upper substrate semiconductor layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 29F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figures 29G, 29H:
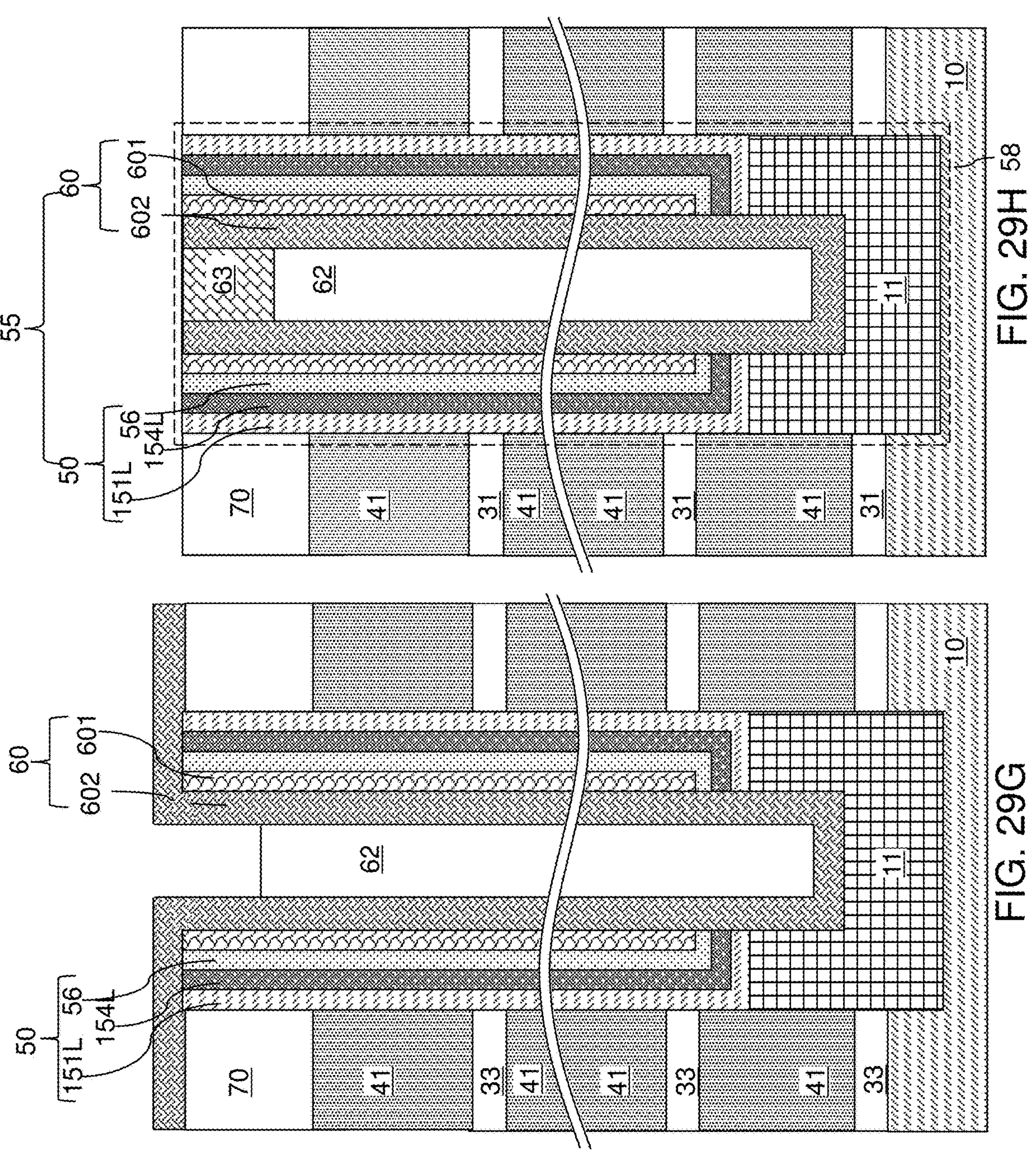

Referring to FIG. 29G, the horizontal portion of the dielectric core layer 62L can be removed, for example, by a recess etch from above the top surface of the insulating cap layer 70. The dielectric core layer 62L can be vertically recessed until top surfaces of remaining portions of the dielectric core layer 62L are recessed below the horizontal plane including the top surface of the insulating cap layer 70. Each remaining portion of the dielectric core layer 62L constitutes a dielectric core 62.

Referring to FIG. 29H, a doped semiconductor material having a doping of a second conductivity type can be deposited to form a recess region overlying the dielectric core 62. The second conductivity type that is the opposite of the first conductivity type. For example, if the first conductivity type is p-type, the second conductivity type is n-type, and vice versa. The dopant concentration in the doped semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material and horizontal portions of the second semiconductor channel layer 602 can be removed from above the top surface of the insulating cap layer 70, for example, by chemical mechanical planarization (CMP). Each remaining portion of the doped semiconductor material having a doping of the second conductivity type constitutes a drain region 63. Each remaining portion of the second semiconductor channel layer 602 can be located entirety within a memory opening 49. Each adjoining pair of a first semiconductor channel layer 601 (if present) and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage material layer 154L, and laterally surrounds a portion of the vertical semiconductor channel 60. The semiconductor liner 151L laterally surrounds and contacts the charge storage material layer 154L. Each adjoining set of a semiconductor liner 151L, a charge storage material layer 154L, and a tunneling dielectric layer 56 collectively constitute a memory film 50.

Each combination of a memory film 50 and a vertical semiconductor channel 60 within a memory opening 49 constitutes a memory stack structure 55. Each combination of a pedestal channel portion 11 (if present), a memory stack structure 55, a dielectric core 62, and a drain region 63 within a memory opening 49 is herein referred to as a memory opening fill structure 58.

Figure 30:
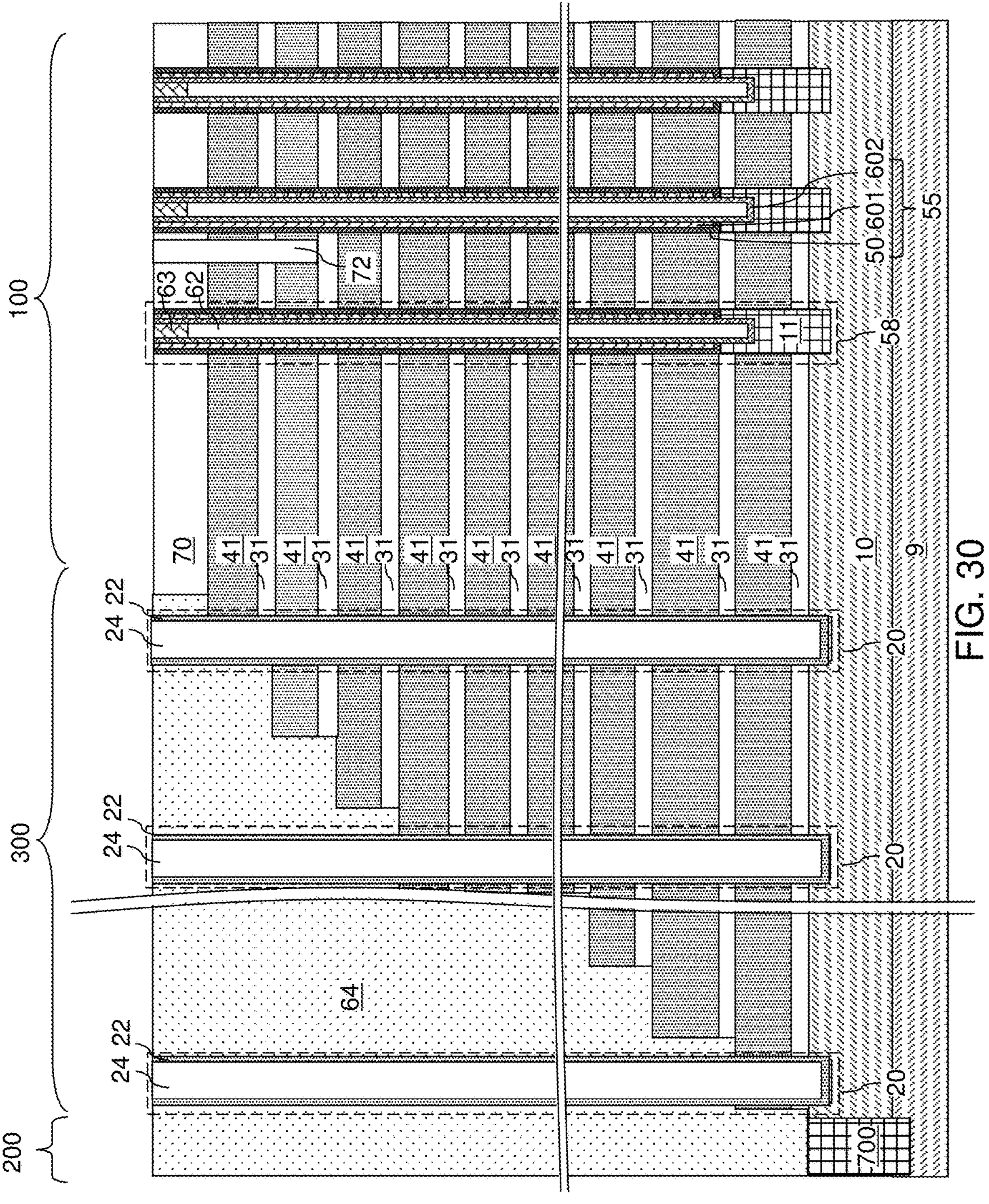
FIG. 30 is a schematic vertical cross-sectional view of the second exemplary structure after formation of memory stack structures according to a second embodiment of the present disclosure.

Referring to FIG. 30, the second exemplary structure is illustrated after formation of memory opening fill structures 58 and support pillar structure 20 within the memory openings 49 and the support openings 19, respectively. An instance of a memory opening fill structure 58 can be formed within each memory opening 49. An instance of the support pillar structure 20 can be formed within each support opening 19.

Each memory stack structure 55 includes a vertical semiconductor channel 60, which may comprise multiple semiconductor channel layers (601, 602) or a single semiconductor channel layer 602, and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as charge storage material layer 154L) and an optional semiconductor liner 151L. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 31A:
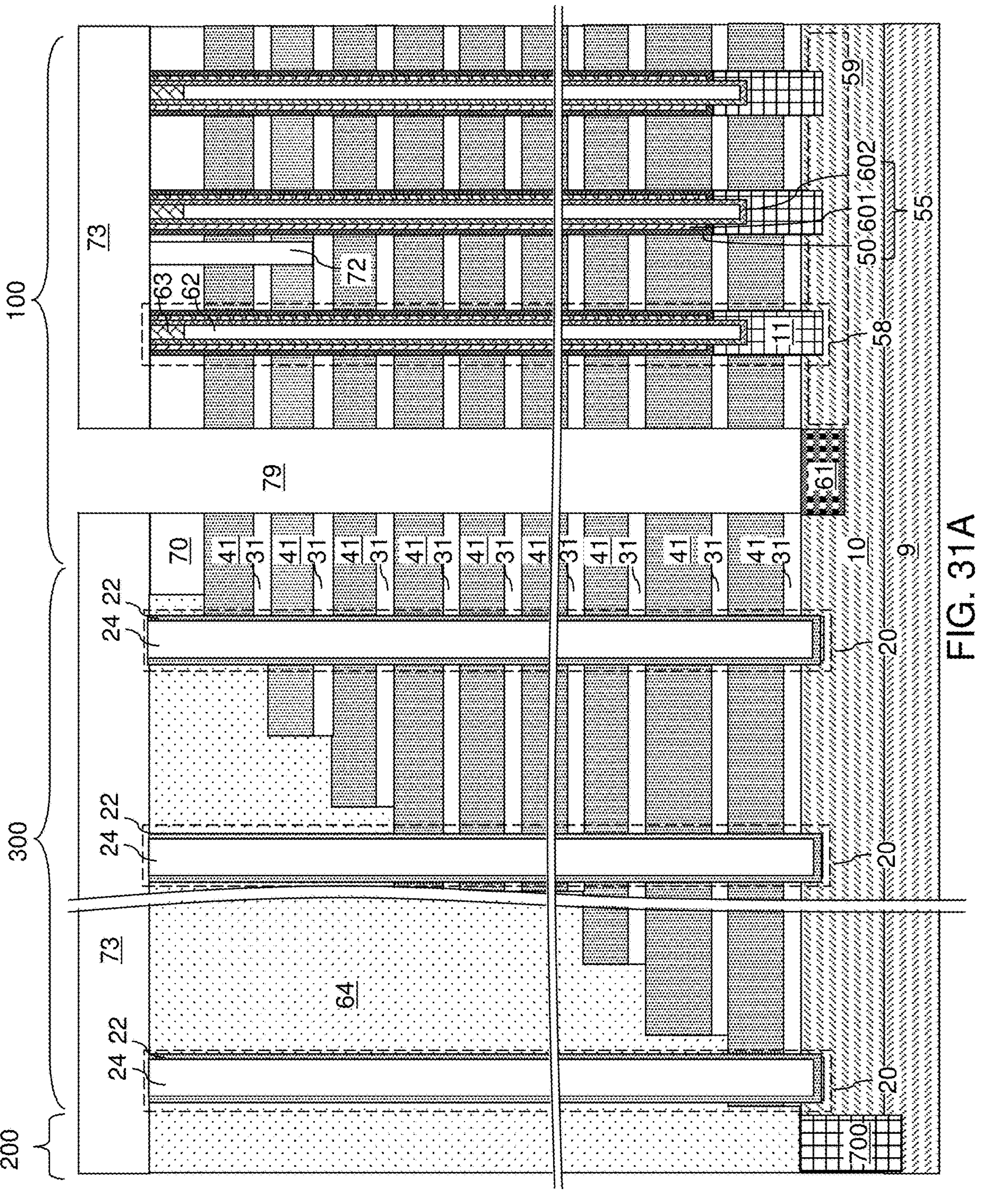
FIG. 31A is a schematic vertical cross-sectional view of the second exemplary structure after formation of backside trenches according to a second embodiment of the present disclosure.
Figure 31B:
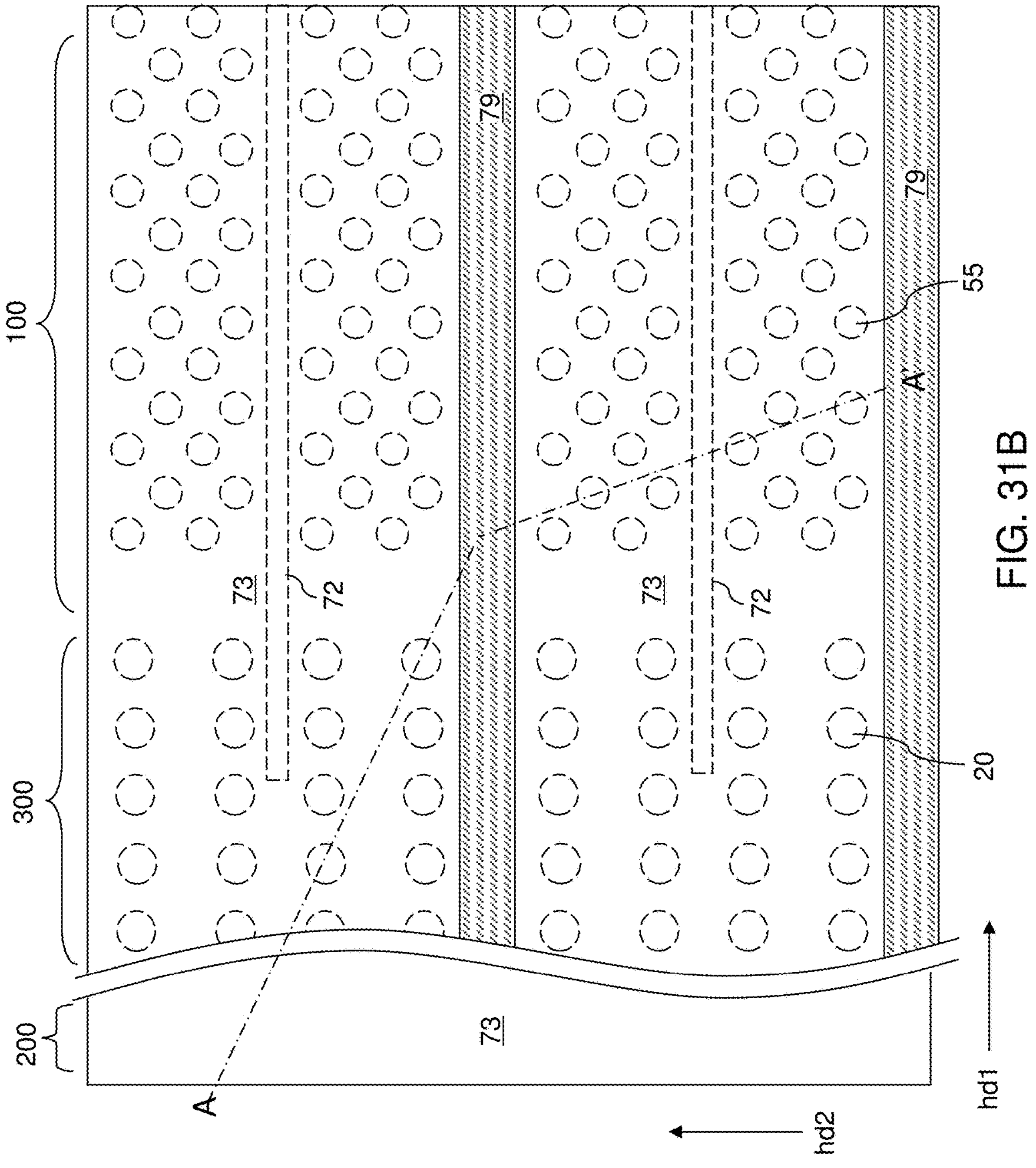
FIG. 31B is a partial see-through top-down view of the second exemplary structure of FIG. 31A. The vertical plane A-A' is the plane of the schematic vertical cross-sectional view of FIG. 31A.

Referring to FIGS. 31A and 31B, a contact-level dielectric layer 73 can be formed over the alternating stack (31, 41) of disposable material layer 31 and silicon nitride layers 41, and over the memory stack structures 55 and the support pillar structures 20. The contact-level dielectric layer 73 includes a dielectric material that is different from the dielectric material of the silicon nitride layers 41. For example, the contact-level dielectric layer 73 can include carbon-doped silicon oxide (i.e., silicon oxycarbide). The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (31, 41) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 (e.g., word line direction) and can be laterally spaced apart from each other along a second horizontal direction hd2 (e.g., bit line direction) that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

An optional source region 61 can be formed at a surface portion of the upper substrate semiconductor layer 10 under each backside trench 79 by implantation of electrical dopants into physically exposed surface portions of the upper substrate semiconductor layer 10. Each source region 61 is formed in a surface portion of the substrate (9, 10) that underlies a respective backside trench 79. An upper portion of the upper substrate semiconductor layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. Semiconductor channels (59, 11, 60) extend between each source region 61 and a respective set of drain regions 63. The semiconductor channels (59, 11, 60) include the vertical semiconductor channels 60 of the memory stack structures 55. Alternatively, a horizontal direct strap contact may be formed instead of the source region 61 as will be described below with respect to the third embodiment.

Figure 32:
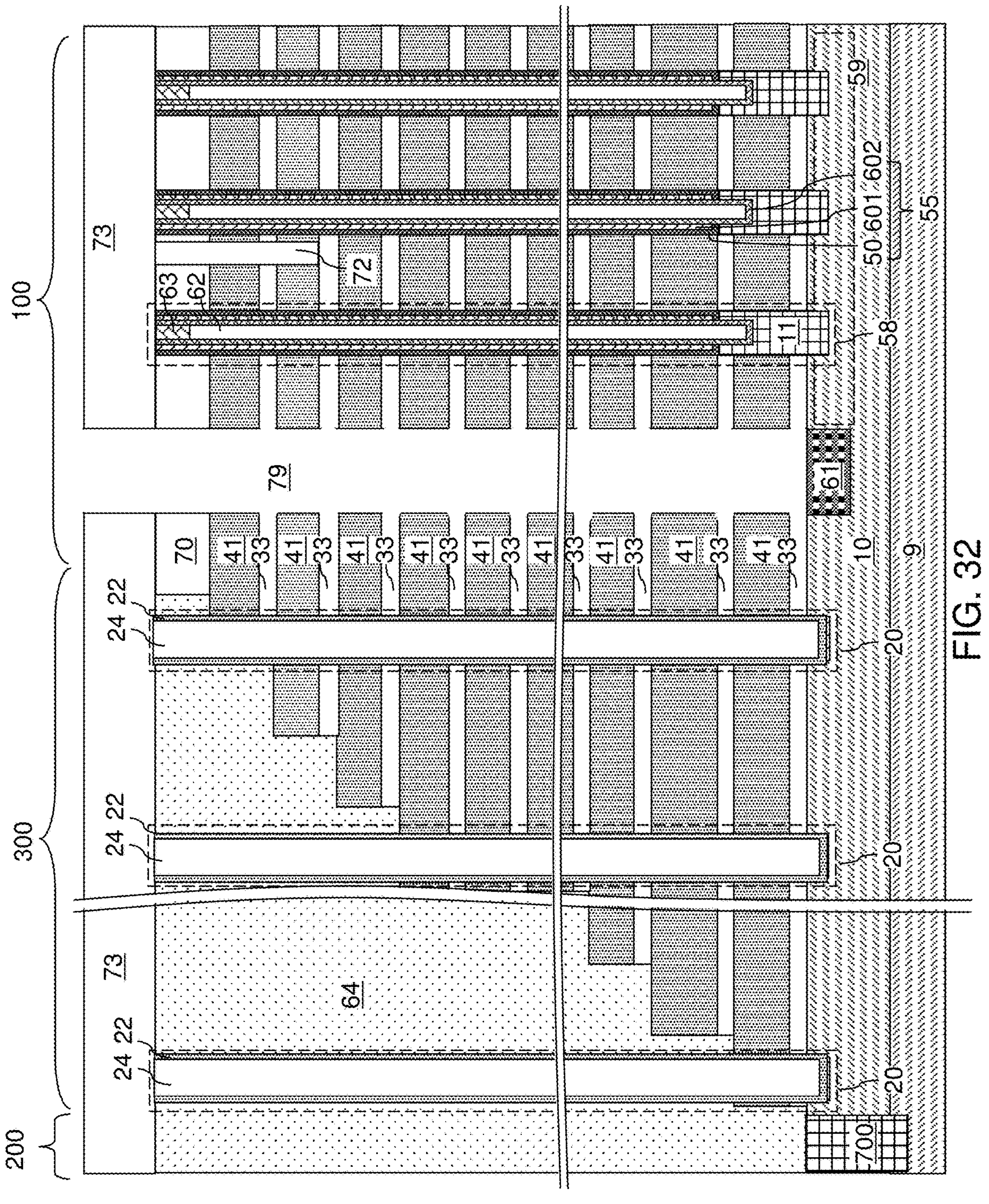
FIG. 32 is a vertical cross-sectional view of the second exemplary structure after formation of laterally-extending cavities by removal of the disposable material layers according to a second embodiment of the present disclosure.
Figures 33A, 33B:
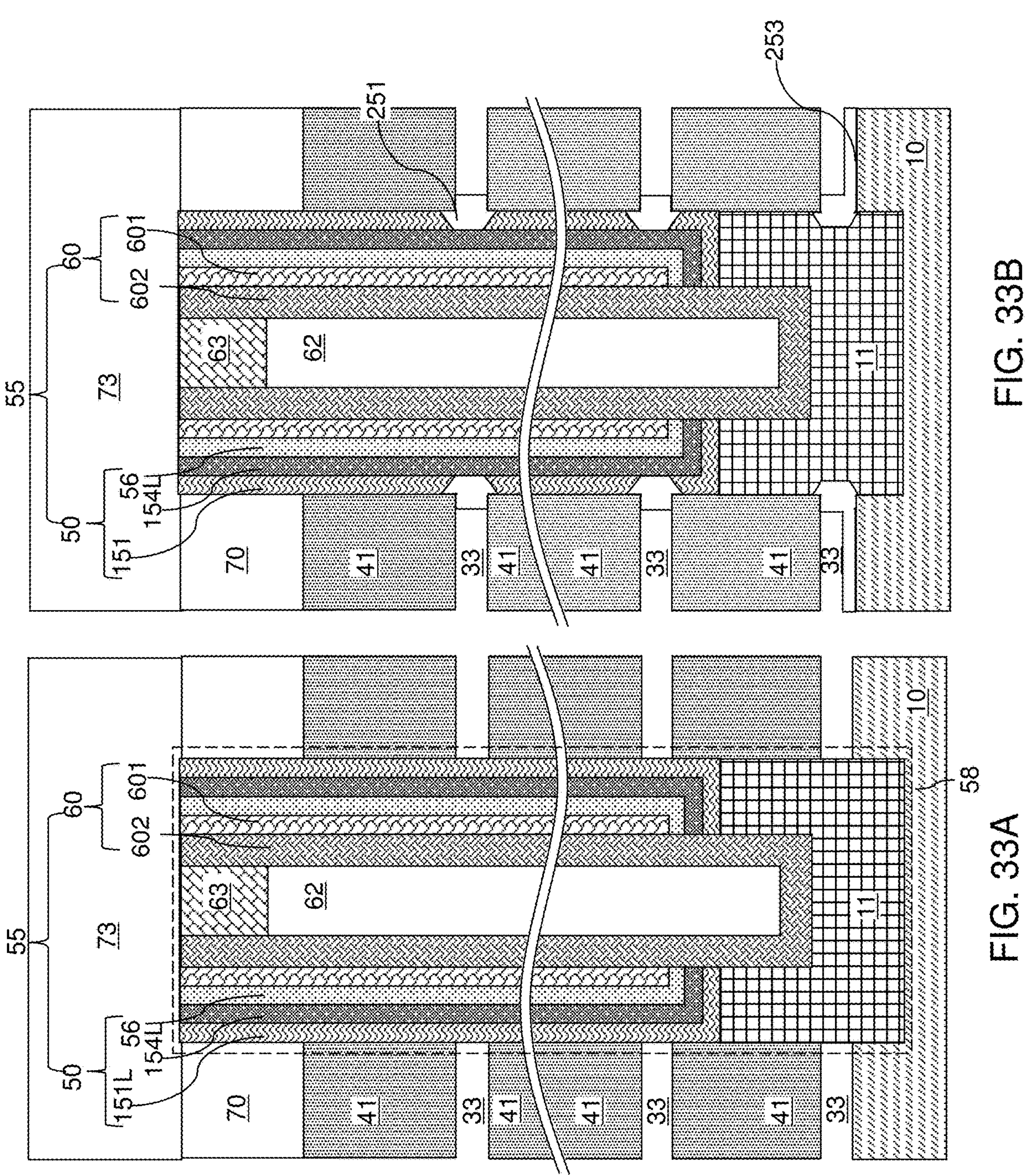
FIG. 33A-33D are sequential vertical cross-sectional views of a region of the second exemplary structure around a memory opening fill structure during formation of insulating layers according to a second embodiment of the present disclosure.

Referring to FIGS. 32 and 33A, laterally-extending cavities 33 can be formed by removal of the disposable material layers 31 selective to the silicon nitride layers 41. An isotropic etch process can be employed to remove the disposable material layers 31 selective to the silicon nitride layers 41. In case the disposable material layers 31 include undoped silicate glass, a doped silicate glass, or organosilicate glass, a wet etch process employing hydrofluoric acid may be employed. In this case, the retro-stepped dielectric material portion 64 and the contact-level dielectric layer 73 can include carbon doped silicate glass to minimize collateral etching. In case the disposable material layers 31 include a silicon-germanium alloy, an etchant employing a mixture of dilute hydrofluoric acid and hydrogen peroxide may be employed for the isotropic etch process. Generally, the laterally-extending cavities 33 can be formed by removing the disposable material layers 31 selective to the silicon nitride layers 41 and the memory opening fill structures 58.

Referring to FIG. 33B, an oxidation process can be performed to oxidize portions of the semiconductor liner 151L within each memory opening fill structure 58 that are physically exposed to the laterally-extending cavities 33. Portions of the semiconductor liners 151L that are proximal to the laterally-extending cavities 33 are oxidized to form annular semiconductor oxide portions 251, which may be annular silicon oxide portions. A vertical stack of annular semiconductor oxide portions 251 can be formed in each memory opening fill structure 58 by oxidation of the physically exposed portions of the semiconductor liners 151L. A semiconductor oxide liner 253 can be formed by oxidation of physically exposed surface portions of the upper substrate semiconductor layer 10 and the pedestal channel portions 11. Each semiconductor liner 151L can be converted into a vertical stack of annular semiconductor oxide portions 251 and a vertical stack of semiconductor portions 151. The duration of the oxidation process that forms the vertical stacks of annular semiconductor oxide portions 251 can be selected such that each vertical stack of annular semiconductor oxide portions 251 contacts a respective charge storage material layer 154L.

Figures 33C, 33D:
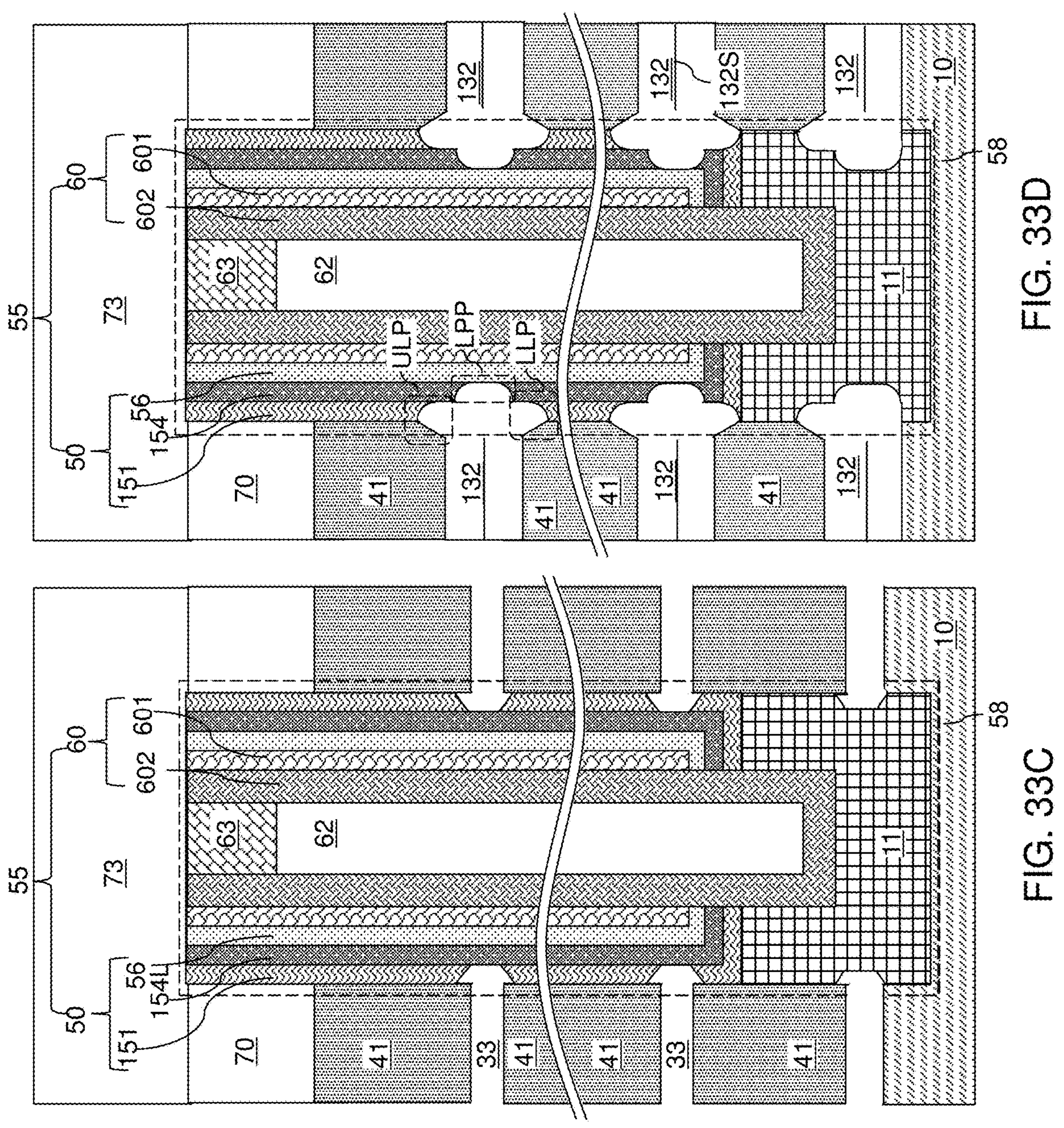

Referring to FIG. 33C, a selective isotropic etch process can be performed to etch the annular semiconductor oxide portions 251 selective to the materials of the silicon nitride layers 41, the charges storage material layers 154L, and the vertical stacks of semiconductor portions 151. For example, a wet etch process employing dilute hydrofluoric acid can be performed to remove the annular semiconductor oxide portions 251. A cylindrical surface segment of an outer sidewall of a charge storage material layer 154L can be physically exposed at each level of the laterally-extending cavities 33. Tapered and/or concave surfaces of the semiconductor portions 151 can be physically exposed to the laterally-extending cavities 33. Each laterally-extending cavity 33 can have planar portion having a uniform height and vertically-protruding annular portions that laterally surround a respective one of the memory opening fill structures 58. The vertically-protruding annular portions can have a greater height than the planar portion, and can be vertically bounded by tapered and/or concave surfaces of the semiconductor portions 151. Thus, referring to FIGS. 33B and 33C, each semiconductor liner 151L can be divided into a vertical stack of semiconductor portions 151 by removing portions of the semiconductor liners 151L from around the laterally-extending cavities 33, for example, by oxidation and removal of portions of the oxidized semiconductor liner 151L that are proximal to the laterally-extending cavities 33.

Referring to FIG. 33D, an oxidation process can be performed to oxidize proximal segments of the charge storage material layer 154L, proximal segments of the vertical stack of semiconductor portions 151, and proximal portions of the silicon nitride layers 41. The oxidation process may include a radical oxidation process in which atomic oxygen radicals are employed to provide a higher oxidation rate relative to the oxidation rates of wet or dry thermal oxidation processes. Exemplary radical oxidation processes include in-situ steam generation (ISSG) oxidation, ozone oxidation, and plasma oxidation. For example, the in-situ steam generation oxidation process utilizes oxygen and hydroxyl radicals generated through chemical reactions of hydrogen and oxygen. The in-situ steam generation oxidation process can be performed at low pressures to achieve a sufficiently long radical lifetime. A high volume of oxygen and hydrogen can be employed to reduce the chemical residence time. The reactants can be heated at the physically exposed surfaces of the charge storage material layer 154L, the vertical stack of semiconductor portions 151, and the silicon nitride layers 41 to convert surface portions of the charge storage material layer 154L, the vertical stack of semiconductor portions 151, and the silicon nitride layers 41 into a semiconductor oxide material, such as silicon oxide. The silicon nitride liner 22 is oxidized at the same time. This oxidation helps prevent or reduce etching of the oxidized silicon nitride liner 22 during a subsequent phosphoric acid etching step.

The oxidation process converts surface portions of the silicon nitride layers 41 into silicon oxide portions that are incorporated into insulating layers 132. In one embodiment, the charge storage material layers 154L comprise, and/or consists essentially of, silicon nitride, the oxidation process can convert physically exposed portions of the charge storage material layers 154L into silicon oxide portions that are incorporated into insulating layers 132. The unoxidized portion of each charge storage material layer 154L constitutes a vertical stack of charge storage elements (e.g., discrete, vertically separated silicon nitride segments) 154. In one embodiment, surface regions of the vertical stacks of semiconductor portions 151 that are physically exposed to the laterally-extending cavities 33 are oxidized during the oxidation process, and are incorporated into the insulating layers 132.

An insulating layer 132 including silicon oxide can be formed within each laterally-extending cavity 33. A subset of the insulating layers 132 is formed within laterally-extending cavities 33 that adjoin a pair of charge storage elements 154. Each such insulating layer 132 comprises a respective lateral protrusion portion LPP incorporating an oxidized portion of a respective one of the charge storage material layers 154L, and a respective upper lobe portion ULP and a respective lower lobe portion LLP that incorporate a respective oxidized surface region of the vertical stacks of semiconductor portions 151.

Further, each insulating layer 132 that is formed between a vertically neighboring pair of silicon nitride layers 41 comprises an upper horizontally-extending portion formed by oxidation of an upper silicon nitride layer 41 within the vertically neighboring pair and a lower horizontally-extending portion formed by oxidation of a lower silicon nitride layer 41 within the vertically neighboring pair. In one embodiment, the oxidation process can be continued until the upper horizontally-extending portion adjoins the lower horizontally-extending portion at a horizontal seam 132S.

Generally, insulating layers 132 comprising silicon oxide can be formed by performing an oxidation process that oxidizes surface portions of the silicon nitride layers 41 and portions of the charge storage material layers 154L that are proximal to the laterally-extending cavities 33. Remaining portions of the charge storage material layers 154L form a vertical stack of discrete charge storage elements 154 in each of the memory opening fill structures 58. In one embodiment, each memory film 50 comprises a tunneling dielectric layer 56 and a vertical stack of discrete charge storage elements 154 that are vertically spaced apart from each other by lateral protrusion portions LPP of a subset of the insulating layers 132.

For the subset of the insulating layers 132 that are formed above the horizontal plane including the top surfaces of the pedestal channel portions 11, each of the subset of the insulating layers 132 comprises an upper lobe portion ULP that contacts an outer sidewall of one of the discrete charge storage elements 154, and a lower lobe portion LLP that contacts an outer sidewall of another of the discrete charge storage elements 154. In one embodiment, each of the subset of the insulating layers 132 comprises a uniform thickness region having a respective uniform thickness and adjoined to the upper lobe portion ULP and to the lower lobe portion LLP, the upper lobe portion ULP protrudes upward above a horizontal plane including a top surface of the uniform thickness region, and the lower lobe portion LLP protrudes downward below a horizontal plane including a bottom surface of the uniform thickness region.

In one embodiment, the vertical stack of discrete charge storage elements 154 comprises, and/or consists essentially of, silicon nitride, the lateral protrusion portion LPP of each of the subset of the insulating layers 132 comprises silicon oxynitride at interfacial regions near the vertical stack of discrete charge storage elements 154 such that atomic concentration of nitrogen atoms decreases with a distance from the interfaces with the vertical stack of discrete charge storage elements 154.

In one embodiment, the upper lobe portions ULP and the lower lobe portions LLP of the subset of insulating layers 132 can be formed by oxidation of a nitrogen-free semiconductor material (i.e., the material of the semiconductor liner 151L), and can be free of nitrogen atoms or comprises nitrogen atoms at an average atomic concentration less than 10% of an average atomic concentration of nitrogen atomic within the lateral protrusion portions LPP. For example, the atomic concentration of nitrogen atoms in the upper lobe portions ULP and the lower lobe portions LLP of the subset of insulating layers 132 may be less than 1 part per million in atomic concentration.

In one embodiment, the insulating layers 132 comprise a respective horizontal seam 132S that does not contact any of the memory opening fill structures 58. In one embodiment, the insulating layers 132 comprise silicon oxide that is free of carbon atoms or comprise carbon atoms at an atomic concentration less than 1 part per million.

In one embodiment, each of the subset of the insulating layers 132 comprises silicon oxide and has a uniform thickness region having a respective uniform thickness, an upper surface portion of the uniform thickness region is doped nitrogen atoms such that atomic concentration of nitrogen atoms increases with a vertical distance from the substrate (9, 10) (due to the interfacial atomic concentration gradient of nitrogen atoms at an interface with unoxidized portions of an overlying silicon nitride layer 42), and a lower surface portion of the uniform thickness region is doped with nitrogen atomic such that atomic concentration of nitrogen atoms decreases with the vertical distance from the substrate (9, 10) (due to the interfacial atomic concentration gradient of nitrogen atoms at an interface with unoxidized portions of an underlying silicon nitride layer 42).

Within each memory opening fill structure 58, the tunneling dielectric layer 56 has a straight outer sidewall that vertically extends through levels of the subset of the insulating layers 132, the lateral protrusion portions LPP of a subset of the insulating layers 132 contacts the straight outer sidewall of the tunneling dielectric layer 56. The lateral protruding portions LPP of the subset of the insulating layers 132 can have convex surfaces that contact a respective concave surface of the vertical stack of discrete charge storage elements 154.

Figure 34:
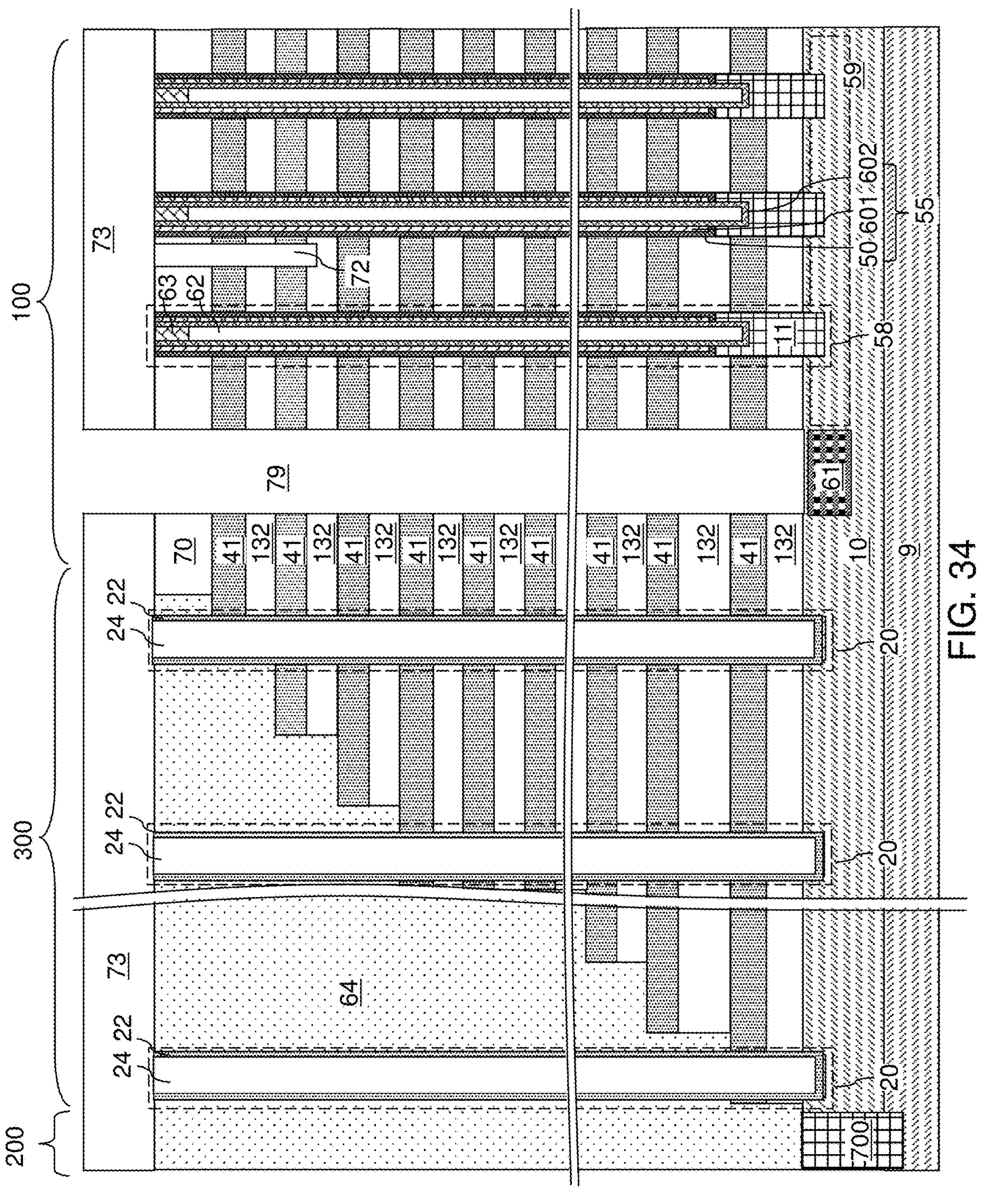
FIG. 34 is a schematic vertical cross-sectional view of the second exemplary structure after formation of the insulating layers according to a second embodiment of the present disclosure.

Referring to FIG. 34, an etch process (such as an anisotropic etch process or an isotropic etch process) can be performed to remove silicon oxide portions that are located at peripheral portions of the backside trenches 79. Sidewalls of the silicon nitride layers 41 can be physically exposed around each backside trench 70.

Figure 35:
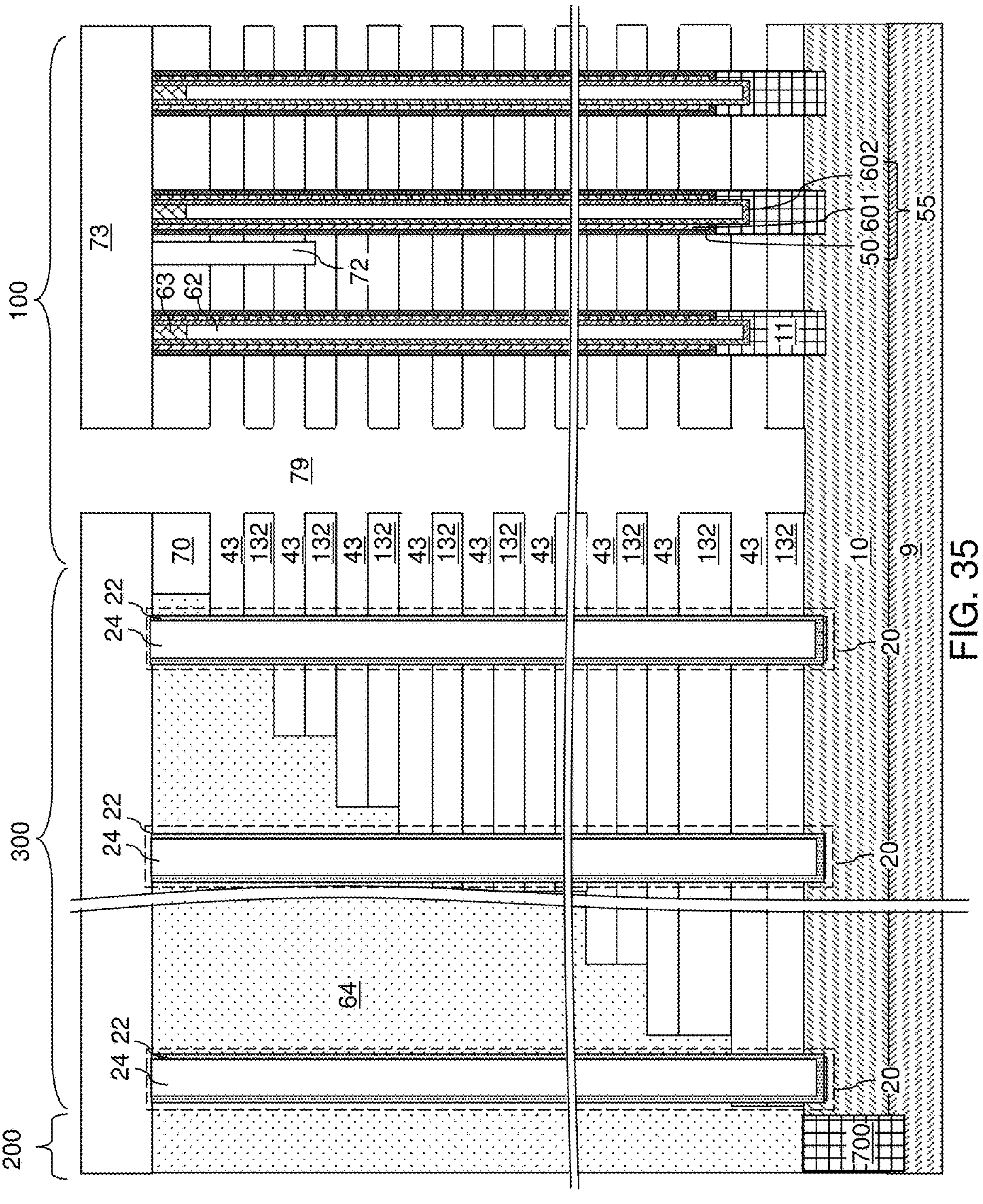
FIG. 35 is a schematic vertical cross-sectional view of the second exemplary structure after formation of backside recesses according to a second embodiment of the present disclosure.
Figures 36A, 36B:
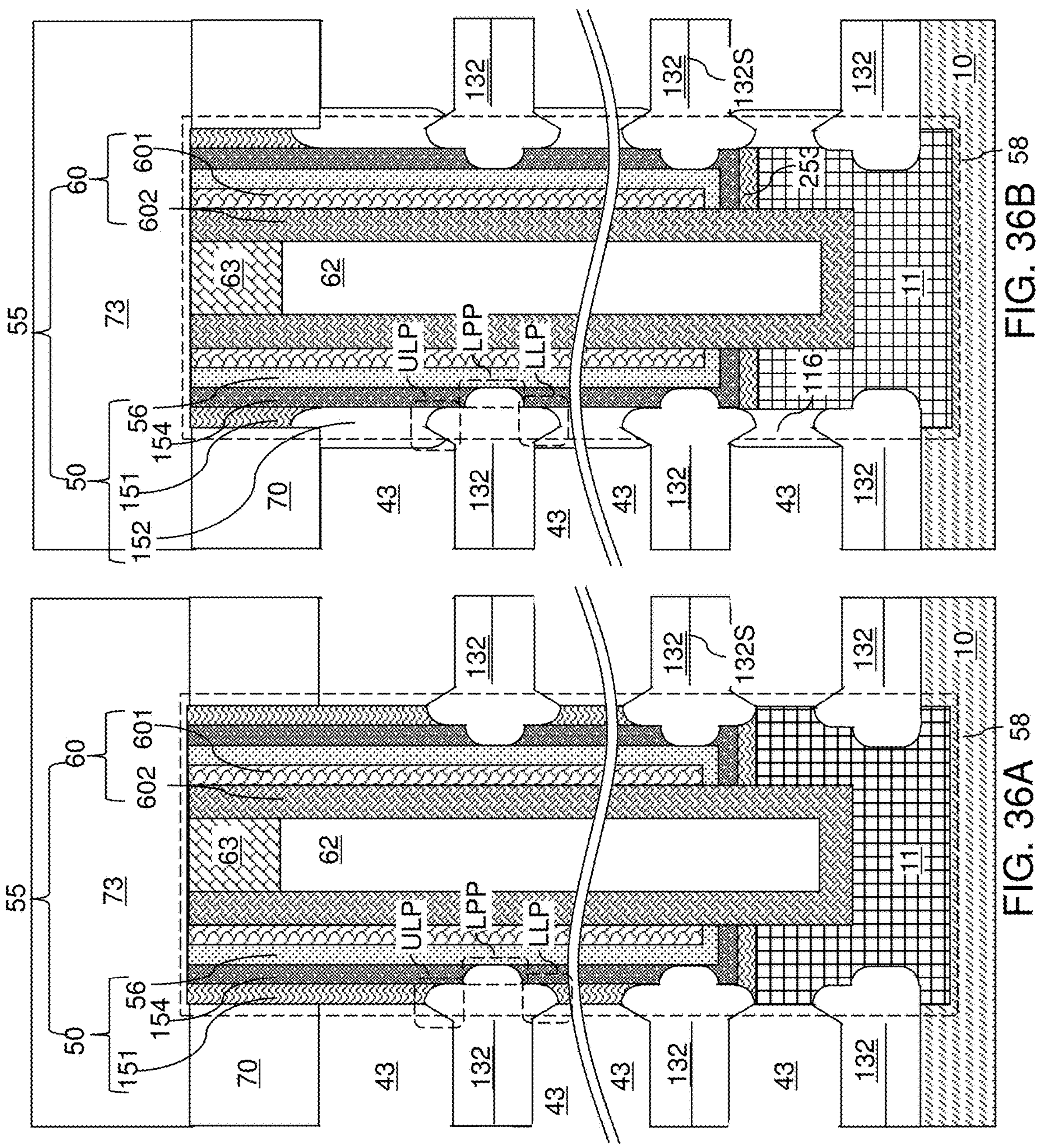
FIGS. 36A-36D are sequential vertical cross-sectional views of a region of the second exemplary structure during formation of electrically conductive layers according to a second embodiment of the present disclosure.

Referring to FIGS. 35 and 36A, backside recesses 43 can be formed by removing the remaining portions of the silicon nitride layers 41 selective to the insulating layers 132. An etchant that selectively etches the second material of the silicon nitride layers 41 with respect to the silicon oxide material of the insulating layers 132 can be introduced into the backside trenches 79, for example, employing an etch process. Backside recesses 43 are formed in volumes from which the silicon nitride layers 41 are removed. The removal of the second material of the silicon nitride layers 41 can be selective to the silicon oxide material of the insulating layers 132, the material of the retro-stepped dielectric material portion 65, the semiconductor material of the upper substrate semiconductor layer 10, the material of the semiconductor portions 151 and the material of the oxidized silicon nitride liner 22.

In one embodiment, the etch process can be a wet etch process in which the second exemplary structure is immersed within a wet etch tank including phosphoric acid, which etches silicon nitride selective to silicon oxide, silicon, and various other materials employed in the art. The support pillar structure 20, the retro-stepped dielectric material portion 64, and the memory opening fill structures 58 provide structural support while the backside recesses 43 are present within volumes previously occupied by the silicon nitride layers 41. Thus, the oxidation of the silicon nitride liner 22 at the step of FIG. 33D helps prevent or reduce etching of the oxidized silicon nitride liner 22 during the above described phosphoric acid etching step.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the silicon nitride layers 41 is removed. The memory openings in which the memory opening fill structures 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings. Each of the plurality of backside recesses 43 can extend substantially parallel to the top surface of the substrate (9, 10). A backside recess 43 can be vertically bounded by a top surface of an underlying insulating layer 132 and a bottom surface of an overlying insulating layer 132.

Referring to FIG. 36B, an oxidation process (such as a thermal oxidation process or a plasma oxidation process) can be performed to oxide physically exposed portions of the semiconductor portions 151 and to oxidize physically exposed surface portions of the optional pedestal channel portions 11. The oxidation process converts a surface portion of each pedestal channel portion 11 into a tubular dielectric spacer 116, and converts physically exposed segments of the semiconductor portions 151 into a vertical stack of discrete semiconductor oxide portions 152, such as silicon oxide portions. Within each memory opening fill structure 58, a remaining segment of the semiconductor portions 151 may include an annular horizontal semiconductor portion 253 that contacts an annular top surface of a pedestal channel portion 11. Generally, a vertical stack of discrete semiconductor oxide portions 152 can be formed by oxidizing a vertical stack of semiconductor portions 151 within each memory opening fill structure 58.

In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes oxygen atoms. The lateral thickness of the semiconductor oxide portions 152 may be in a range from 2 nm to 12 nm, such as from 4 nm to 8 nm, although lesser and greater thicknesses may also be employed.

Figures 36C, 36D:
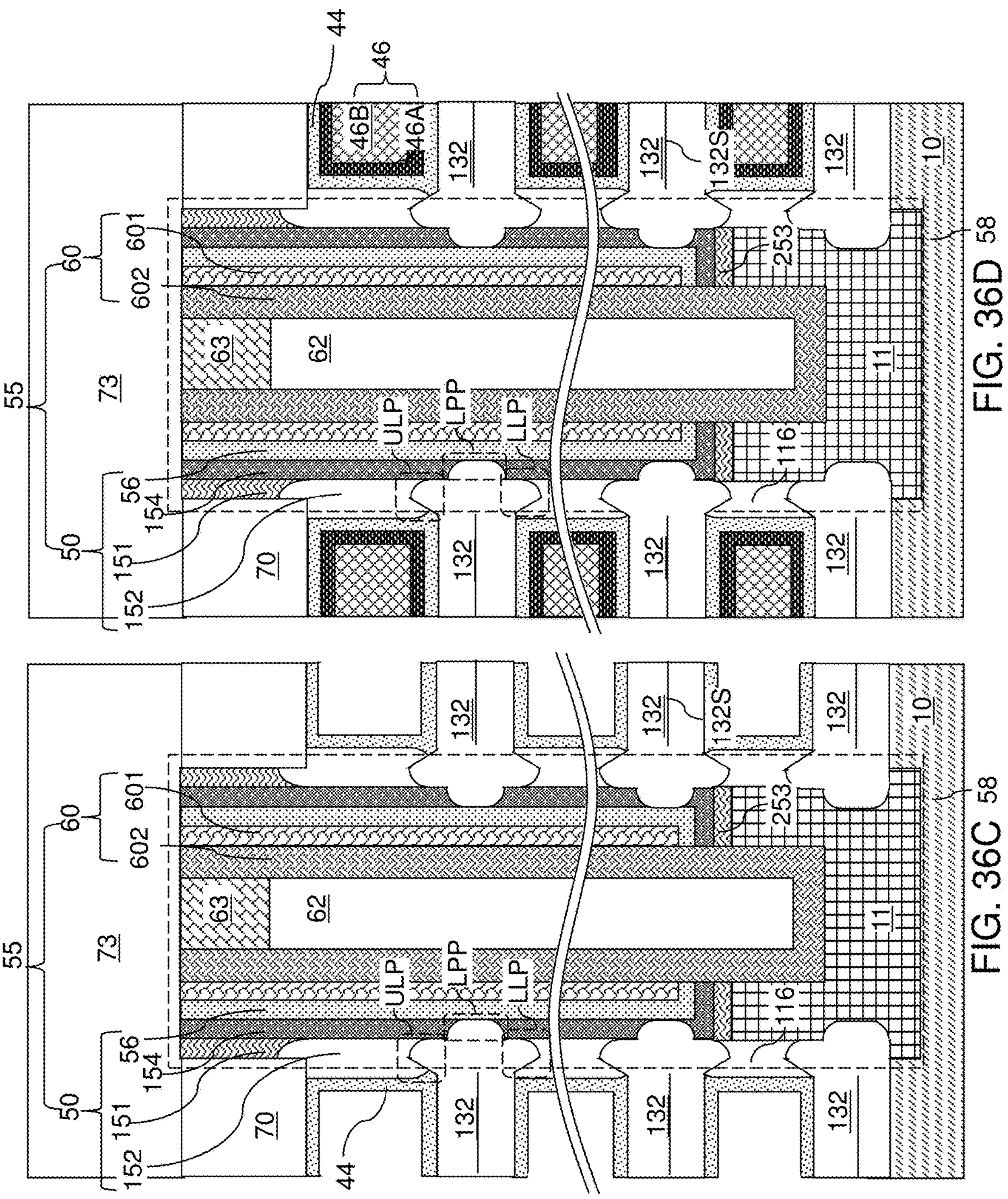

Referring to FIG. 36C, a backside blocking dielectric layer 44 can be optionally formed. The backside blocking dielectric layer 44, if present, comprises a dielectric material that functions as a control gate dielectric for the control gates to be subsequently formed in the backside recesses 43. The backside blocking dielectric layer 44 can be formed on the physically exposed surface of the semiconductor oxide portions 152 and the insulating layers 132. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can comprise, and/or can consist essentially of, a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. A backside cavity is present within the portion of each backside trench 79 that is not filled with the backside blocking dielectric layer 44.

Figure 37A:
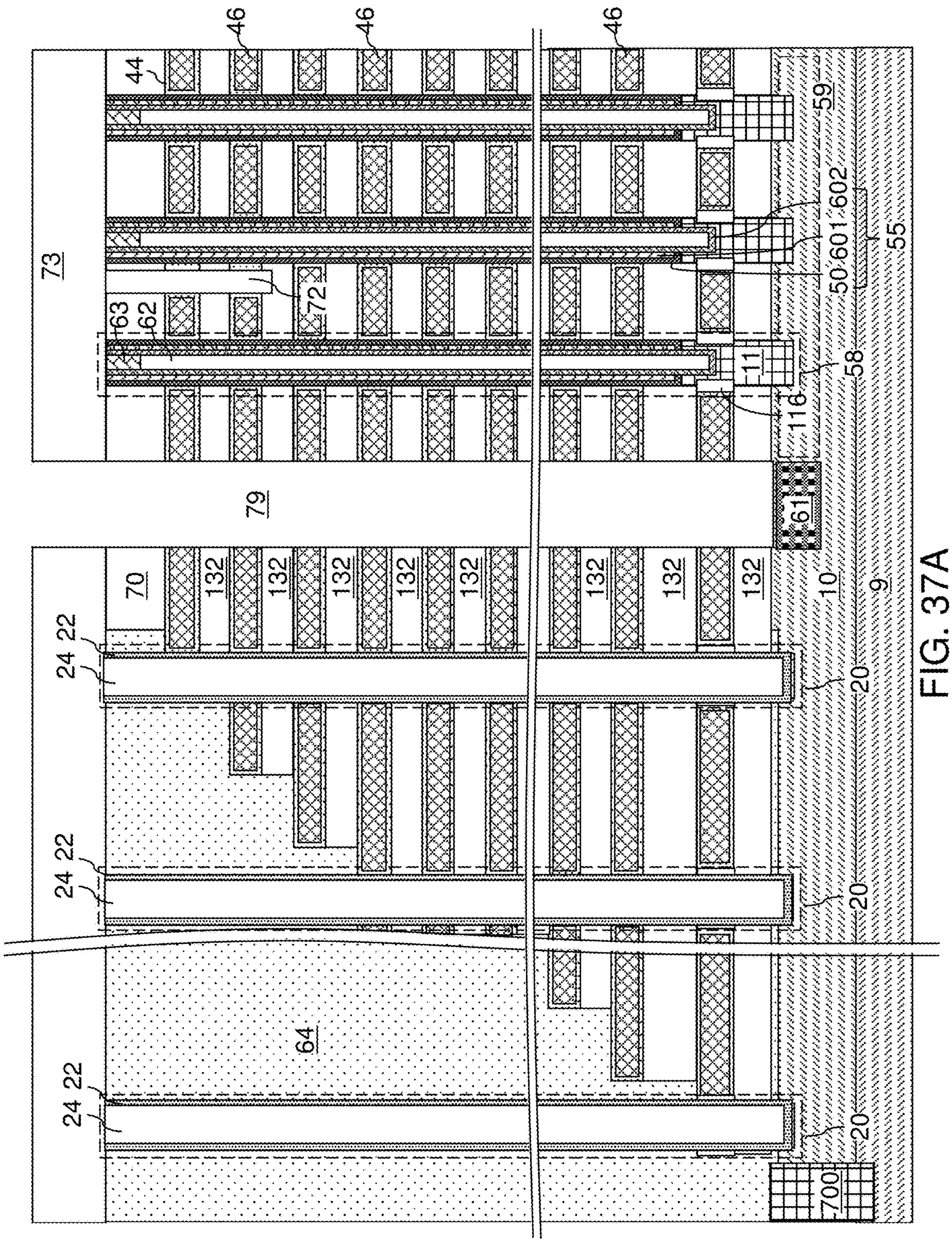
FIG. 37A is a schematic vertical cross-sectional view of the second exemplary structure after removal of a deposited conductive material from within the backside trench according to a second embodiment of the present disclosure.
Figure 37B:
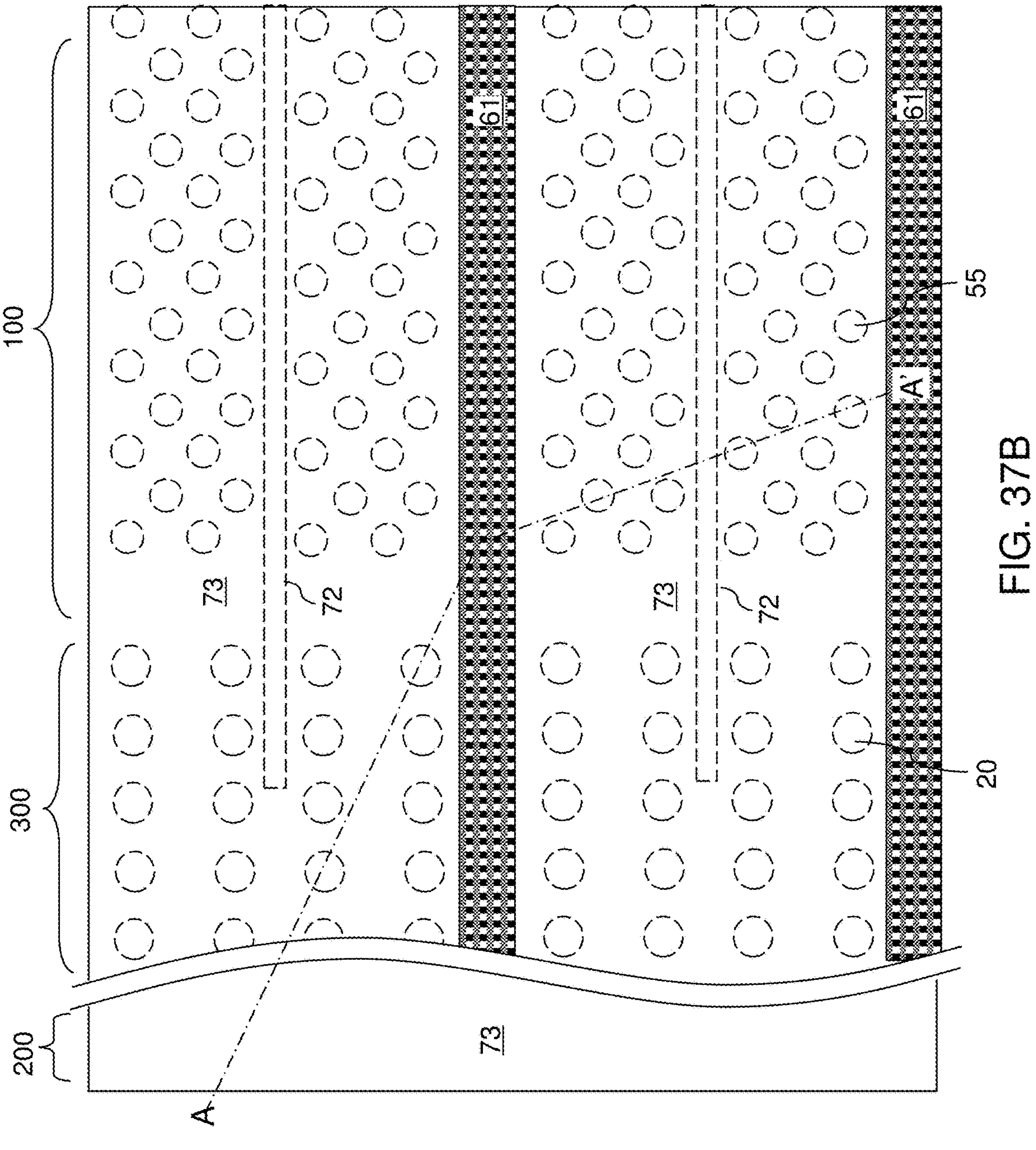
FIG. 37B is a partial see-through top-down view of the second exemplary structure of FIG. 37A. The vertical plane A-A' is the plane of the schematic vertical cross-sectional view of FIG. 37A.

Referring to FIGS. 36D, 37A and 37B, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 132 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 132. The continuous metallic material layer includes a continuous portion of the metallic barrier layer 46A and a continuous portion of the metallic fill material layer 46B that are located in the backside trenches 79 or above the contact level dielectric layer 73.

Each silicon nitride layer 41 can be replaced with an electrically conductive layer 46. A backside cavity is present in the portion of each backside trench 79 that is not filled with the backside blocking dielectric layer 44 and the continuous metallic material layer. An optional tubular dielectric spacer 116 laterally surrounds the optional pedestal channel portion 11. A bottommost electrically conductive layer 46 laterally surrounds each tubular dielectric spacer 116 upon formation of the electrically conductive layers 46.

The deposited metallic material of the continuous electrically conductive material layer is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the silicon nitride layers 41 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer may not be selective to the material of the backside blocking dielectric layer 44 or, the backside blocking dielectric layer 44 may not be employed.

In one embodiment, each of the memory opening fill structures 58 comprise a vertical stack of semiconductor oxide portions 152 that contact an outer sidewall of a respective one of the discrete charge storage elements 154. The upper lobe portions ULP and the lower lobe portions LLP of the insulating layers 132 contact a respective one of the semiconductor oxide portions 152. Backside blocking dielectric layers 44 can be located between, and can contact, a respective one of the electrically conductive layers 46 and a respective one of the semiconductor oxide portions 152.

Figure 38:
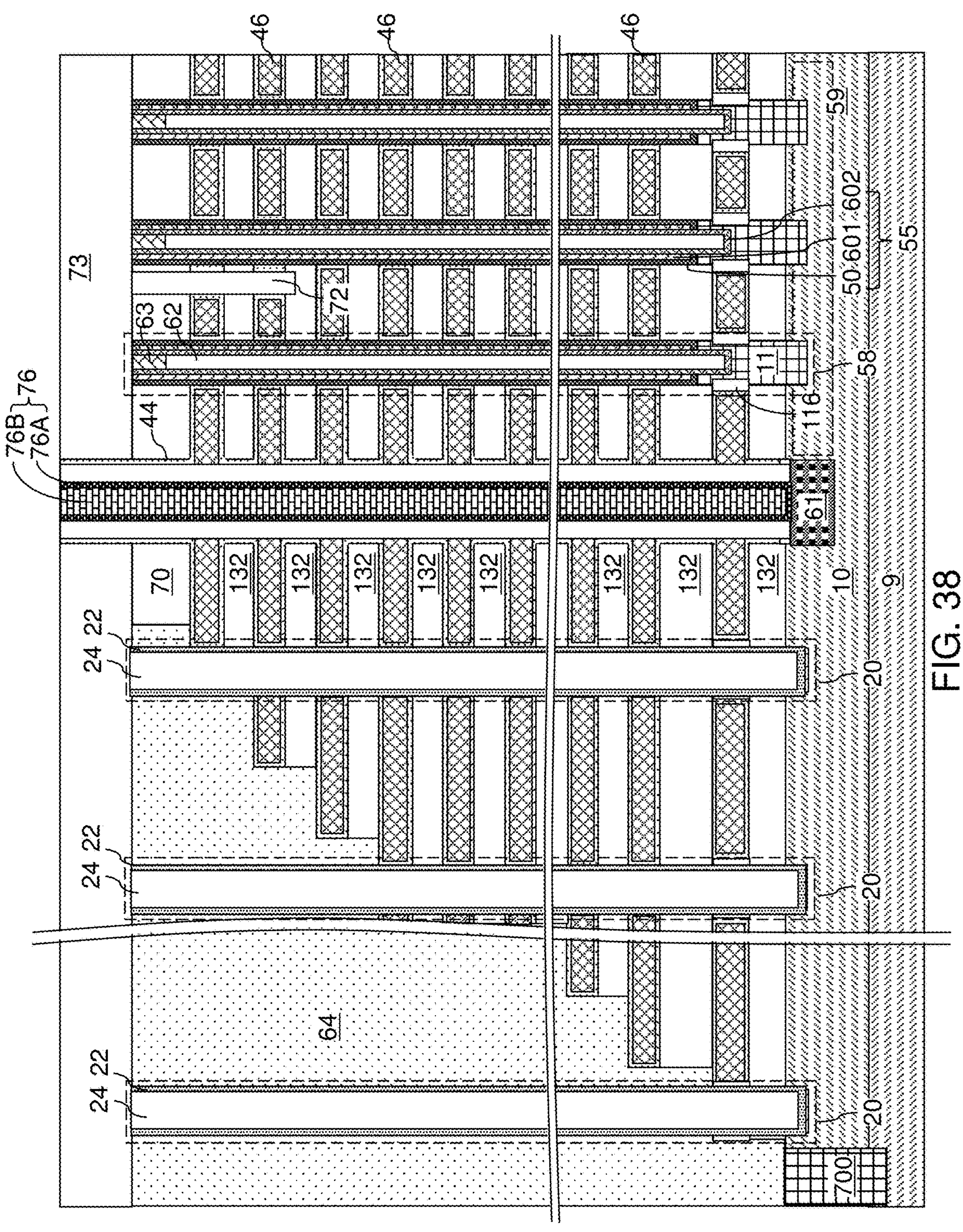
FIG. 38 is a schematic vertical cross-sectional view of the second exemplary structure after formation of an insulating spacer and a backside contact structure according to a second embodiment of the present disclosure.

Referring to FIG. 38, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of a source region 61 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In the third embodiment described below, the source region 61 may be omitted, and a lateral source contact structure (e.g., direct strap contact) may contact a side of the lower portion of the semiconductor channel 60.

Figure 39A:
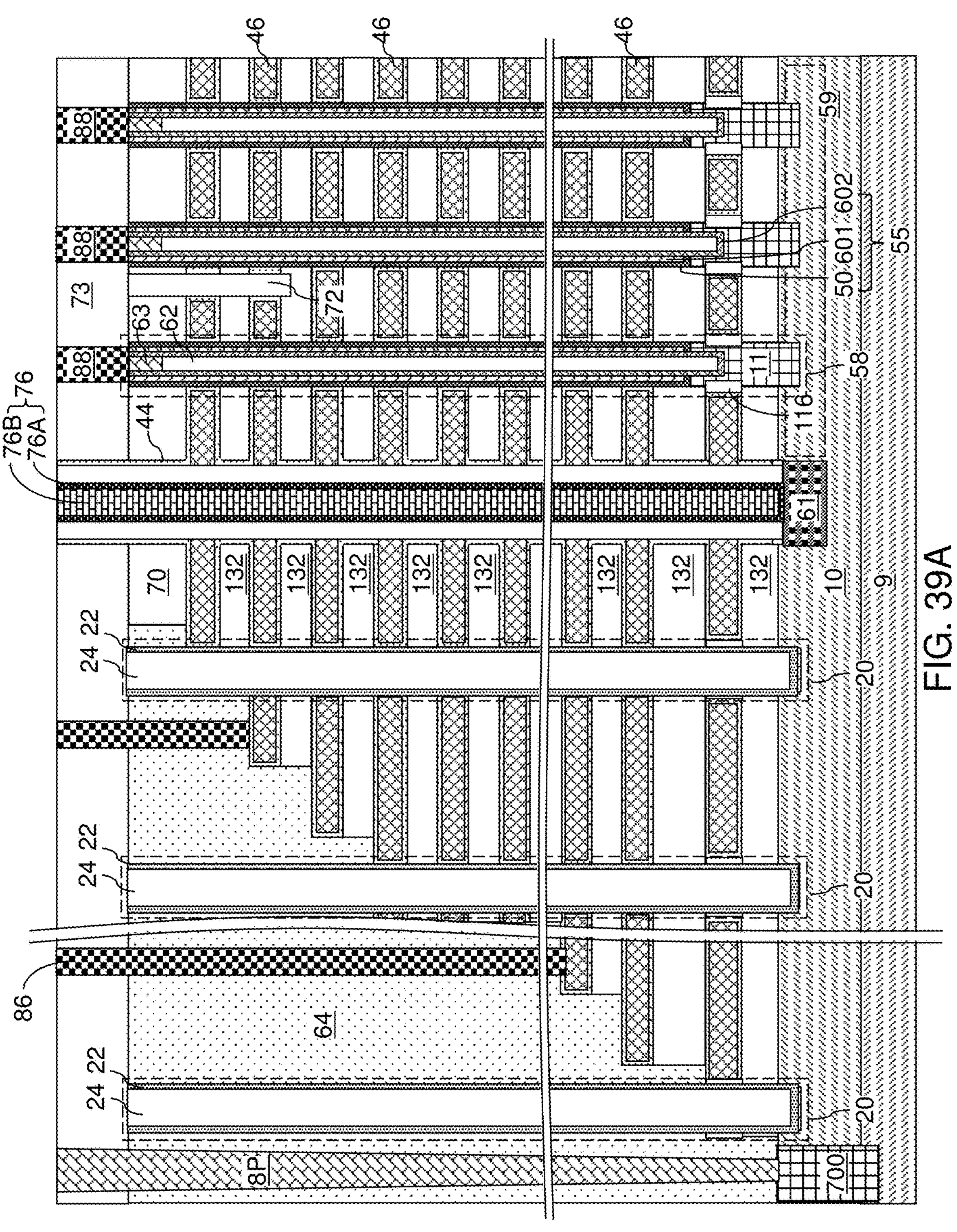
FIG. 39A is a schematic vertical cross-sectional view of the second exemplary structure after formation of additional contact via structures according to a second embodiment of the present disclosure.
Figure 39B:
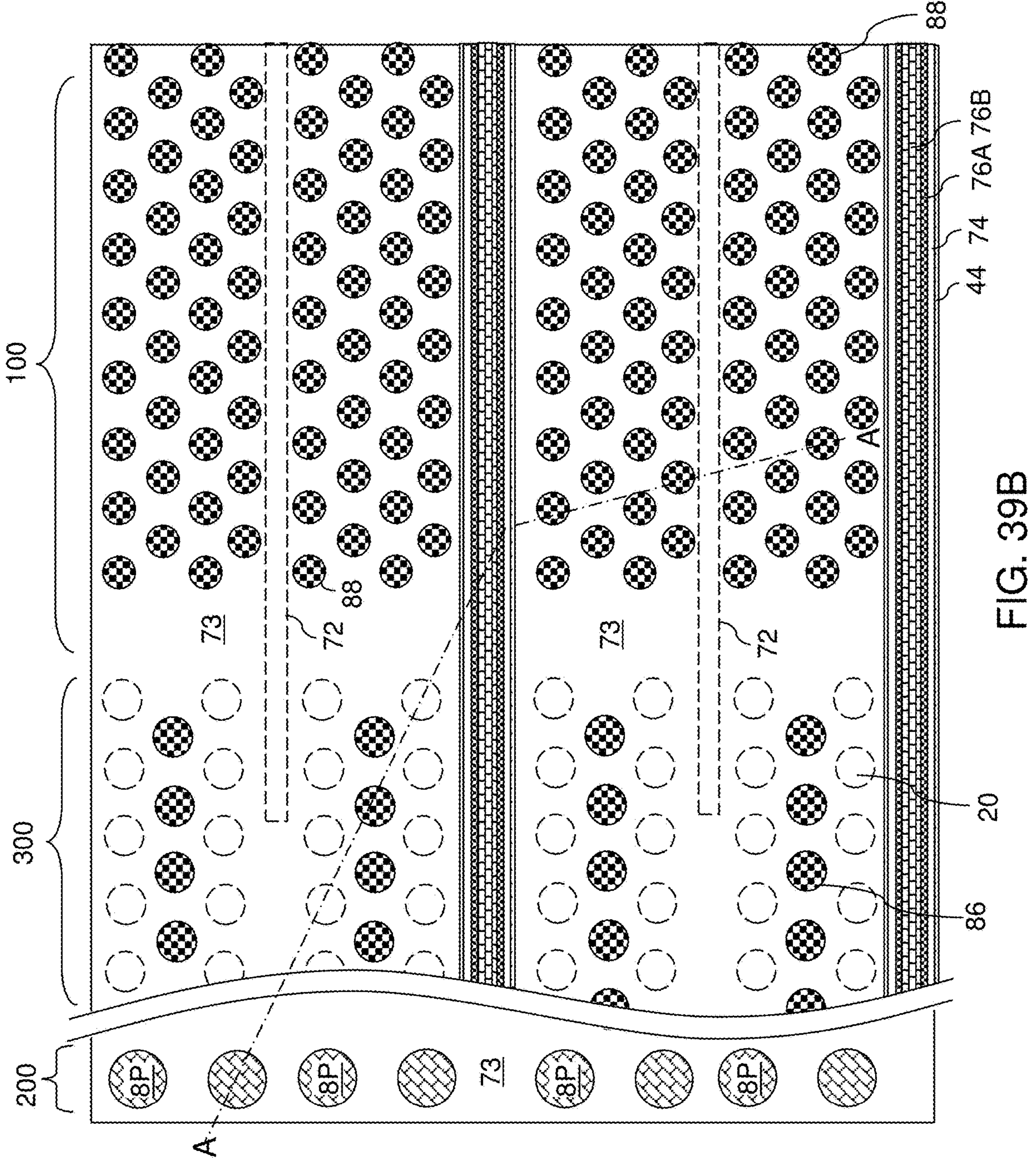
FIG. 39B is a top-down view of the second exemplary structure of FIG. 39A. The vertical plane A-A' is the plane of the schematic vertical cross-sectional view of FIG. 39A.

Referring to FIGS. 39A and 39B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 40:
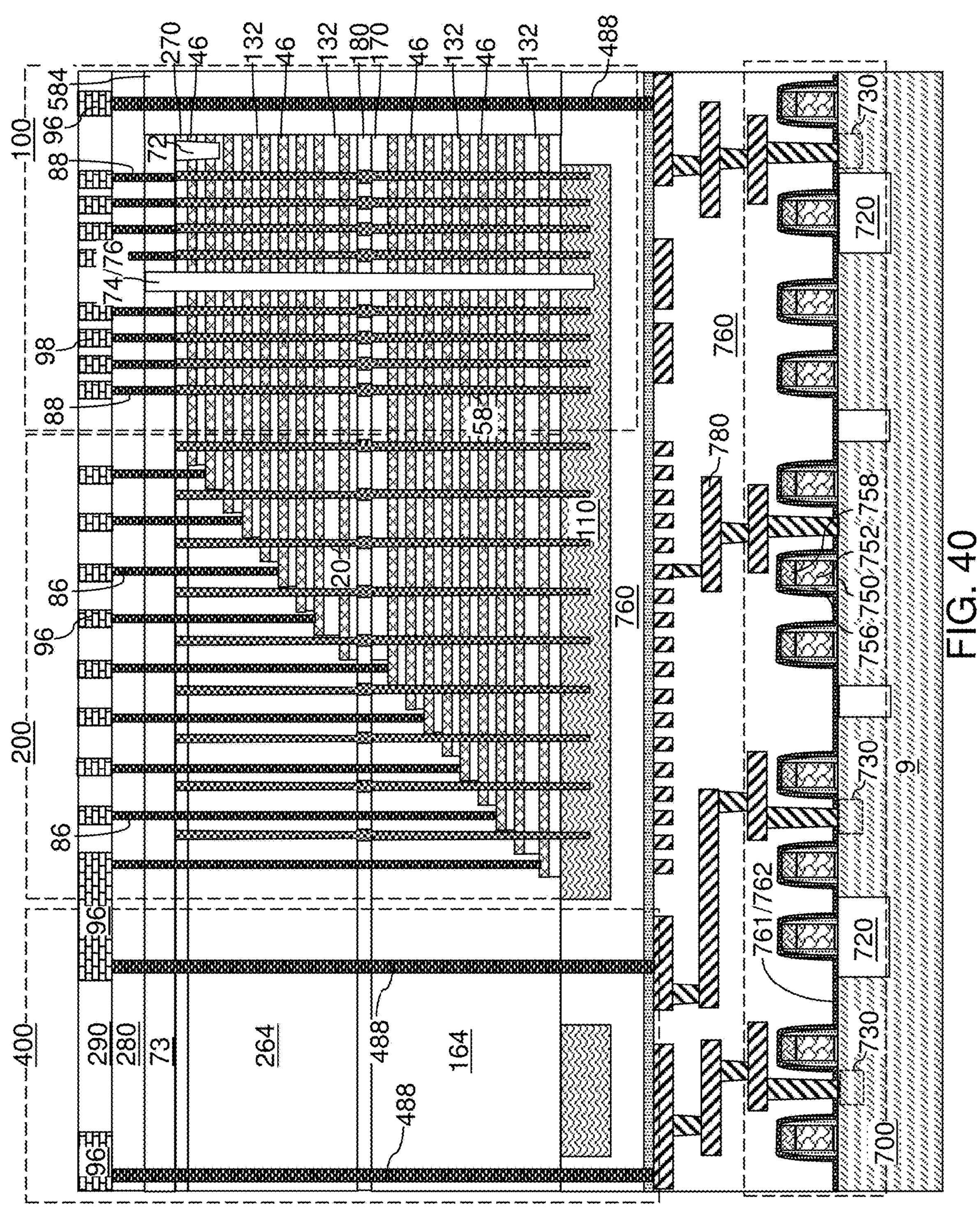
FIG. 40 is a vertical cross-sectional view of a third exemplary structure according to a third embodiment of the present disclosure.

The method employed to form the second exemplary structure can be applied to other semiconductor structures such as a third semiconductor structure of the third embodiment illustrated in FIG. 40. In the third exemplary structure, semiconductor devices 700 may be formed over an entire area of a semiconductor die, and metal interconnect structures 780 embedded within interconnect-level dielectric material layers 760 can be formed over the semiconductor devices.

Source-level material layers 110 including at least source contact layer can be formed over the interconnect-level dielectric material layers, and at least one alternating stack of insulating layers 132 and electrically conductive layers 46 can be formed above the source-level material layers 110. Intermediate-level dielectric material layers such as a first insulating cap layer 170, an inter-level dielectric material layer 180, and a second insulating cap layer 270 can be formed as needed. A first retro-stepped dielectric material portion 164 and a second retro-stepped dielectric material portion 264 may be formed, which can include the same type of dielectric material as the retro-stepped dielectric material portion 64 described above. Dielectric pillar portions 584 may be optionally formed through the alternating stacks of insulating layers 132 and electrically conductive layers 46. A via-level dielectric layer 280 can be formed above the contact-level dielectric layer 73, and various contact via structures (88, 86) can be formed. Through-memory-level connection via structures 488 can be formed through the retro-stepped dielectric material portions (164, 264) or through the dielectric pillar structures 584. A line-level dielectric layer 290 can be formed above the via-level dielectric layer 280, and metal line structures (96, 98) can be formed in the line-level dielectric layer 290. In one embodiment, the metal line structures (96, 98) can include bit lines 98 that contact a respective one of the drain contact via structures 88 and interconnection metal lines 96 that contact the word line contact via structures 86 or the through-memory-level connection via structures 488.

In the third embodiment, a sacrificial source layer is formed below the lower most disposable material layer 31 and the pedestal channel portions and the source regions 61 are omitted 11. Instead, the backside trenches 79 are extend down by etching to expose the sacrificial source layer at the step shown in FIG. 34. The sacrificial source layer is then removed through the backside trenches 79 by selective etching to form a source cavity. The memory film 50 exposed in the source cavity is removed by selective etching to expose a sidewall of the vertical semiconductor channel 60. A doped semiconductor direct strap contact is then formed in the source cavity in contact with the exposed sidewall of the vertical semiconductor channel 60.

Referring to FIGS. 1-40 and according to various embodiments of the present disclosure, a three-dimensional memory device is provided, which comprises: an alternating stack of insulating layers 132 and electrically conductive layers 46 located over a substrate (9, 10); memory openings 49 vertically extending through the alternating stack (132, 46); and memory opening fill structures 58 located in the memory openings 49, wherein: each of the memory opening fill structures 58 comprises a vertical semiconductor channel 60 and a memory film 50; and the memory film 50 comprises a tunneling dielectric layer 56 and a vertical stack of discrete charge storage elements 154 that are vertically spaced apart from each other by lateral protrusion portions LPP of a subset of the insulating layers 132.

Figure 41:
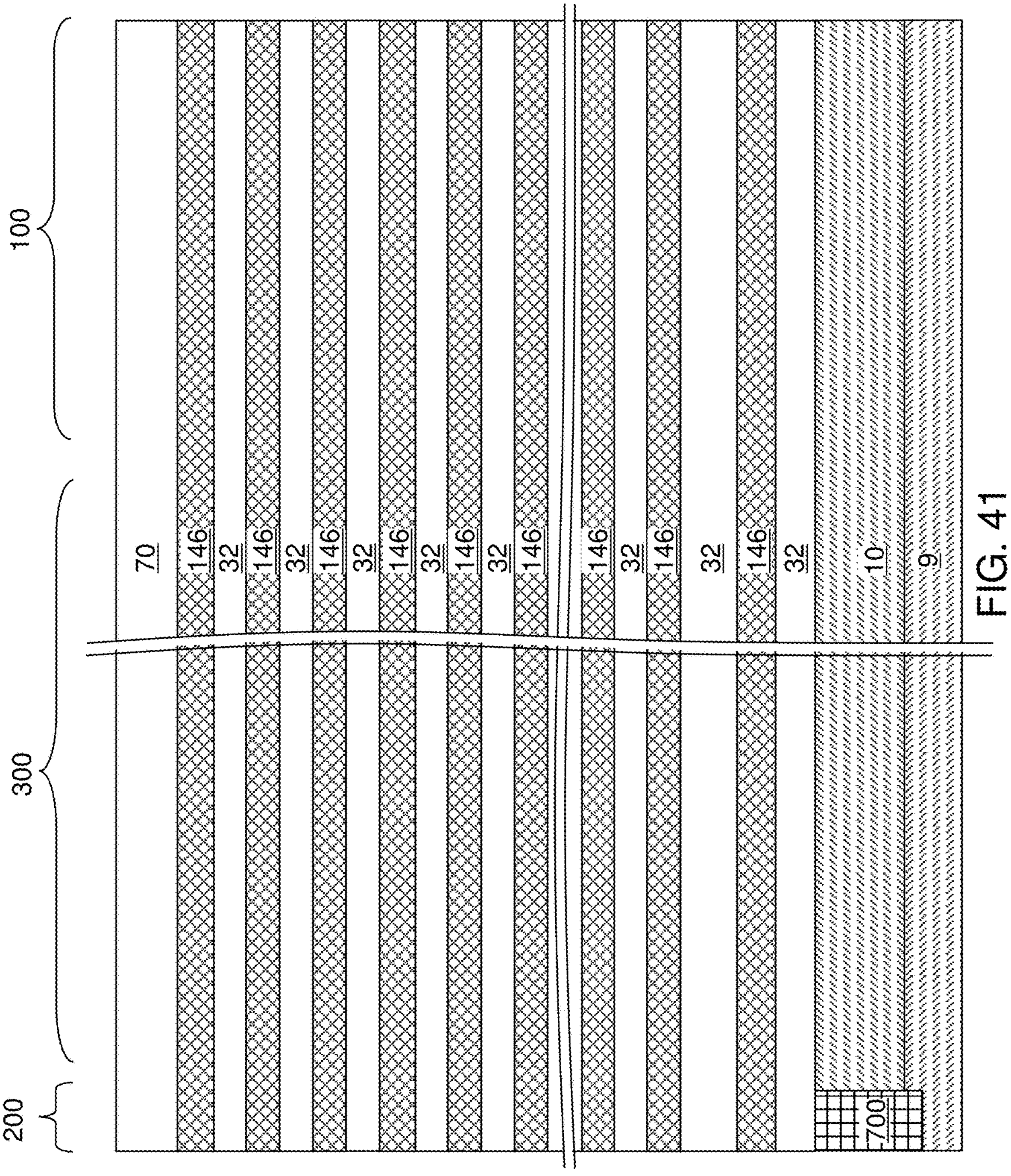
FIG. 41 is a vertical cross-sectional view of a fourth exemplary structure after formation of an alternating stack of insulating layers and electrically conductive layers according to a fourth embodiment of the present disclosure.

Referring to FIG. 41, a fourth exemplary structure according to a fourth embodiment of the present disclosure can be derived from the first exemplary structure illustrated in FIG. 1 by forming an alternating stack of spacer material layers and electrically conductive layers 146 over the top surface of the semiconductor material layer 10. The spacer material layers may comprise insulating layers 32, or may comprise sacrificial material layers that are subsequently replaced with insulating layers 32. In the illustrated example of FIG. 41, the spacer material layers comprise the insulating layers 32.

The insulating layers 32 of the fourth exemplary structure may have the same material composition and/or the same thickness range as the insulating layers 32 in the first exemplary structure. For example, the insulating layers 32 may comprise silicon oxide or silicon oxynitride. The electrically conductive layers 146 can be formed by deposition of a metallic material, such as an elemental metal, that can collaterally form a metal oxide compound during a subsequent anisotropic etch process around memory openings and support openings through the alternating stack (32, 146) by oxidation of surface portions of the metallic material. In one embodiment, the electrically conductive layers 146 may have a homogeneous material composition throughout, and may comprise, and/or may consist essentially of, a refractory metal that forms a metal oxide upon oxidation. In one embodiment, the elemental metal in the electrically conductive layers 146 may be selected from Mo, W, Ru, Co, or Nb. An insulating cap layer 70 can be formed above the alternating stack (32, 146) in the same manner as in the first embodiment.

Figure 42:
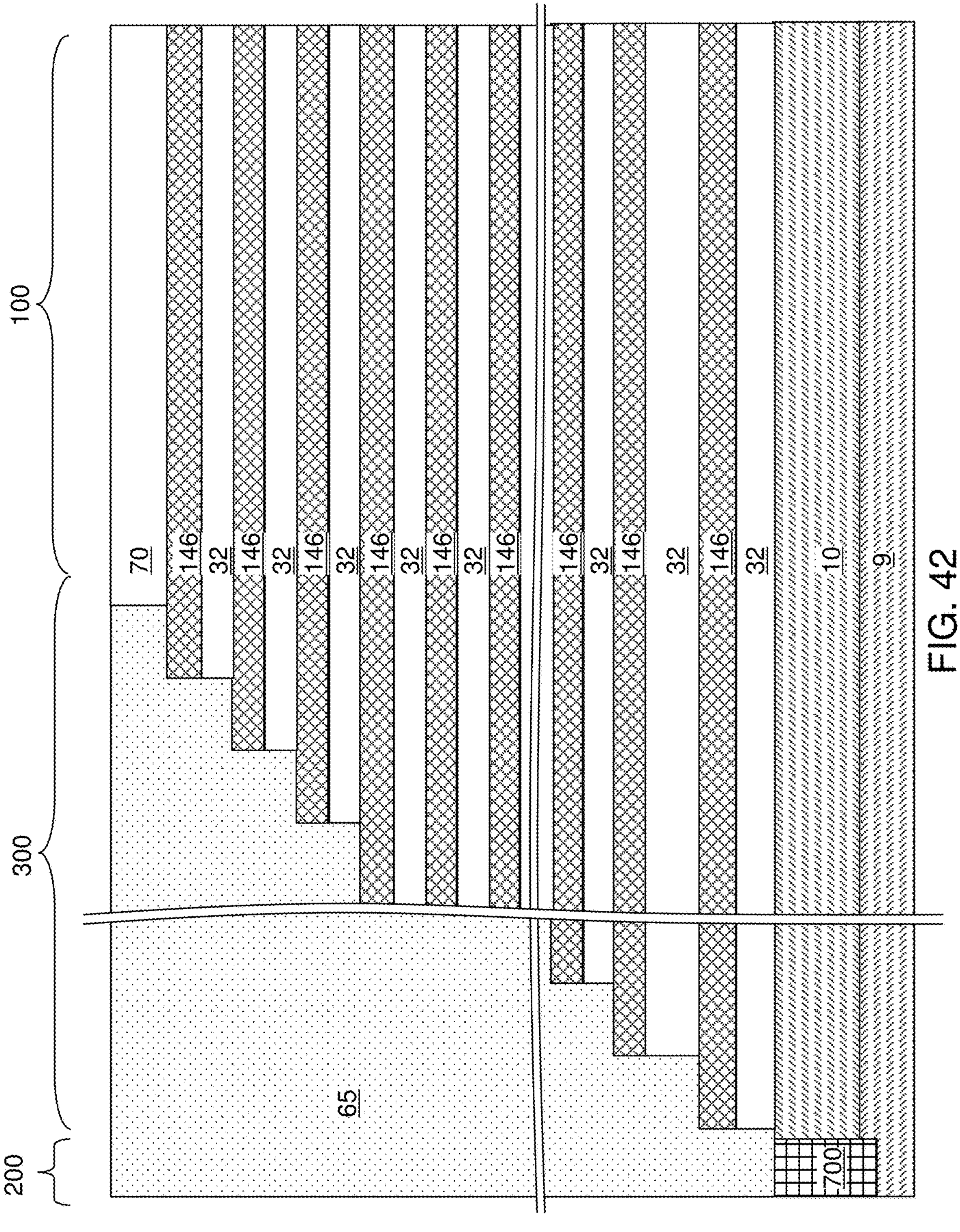
FIG. 42 is a vertical cross-sectional view of the fourth exemplary structure after formation of stepped surfaces and a retro-stepped dielectric material portion according to the fourth embodiment of the present disclosure.

Referring to FIG. 42, stepped surfaces are formed in the staircase region 300 by patterning the alternating stack (32, 146). A retro-stepped dielectric material portion 65 can be formed in the same manner as in the first embodiment.

Figure 43:
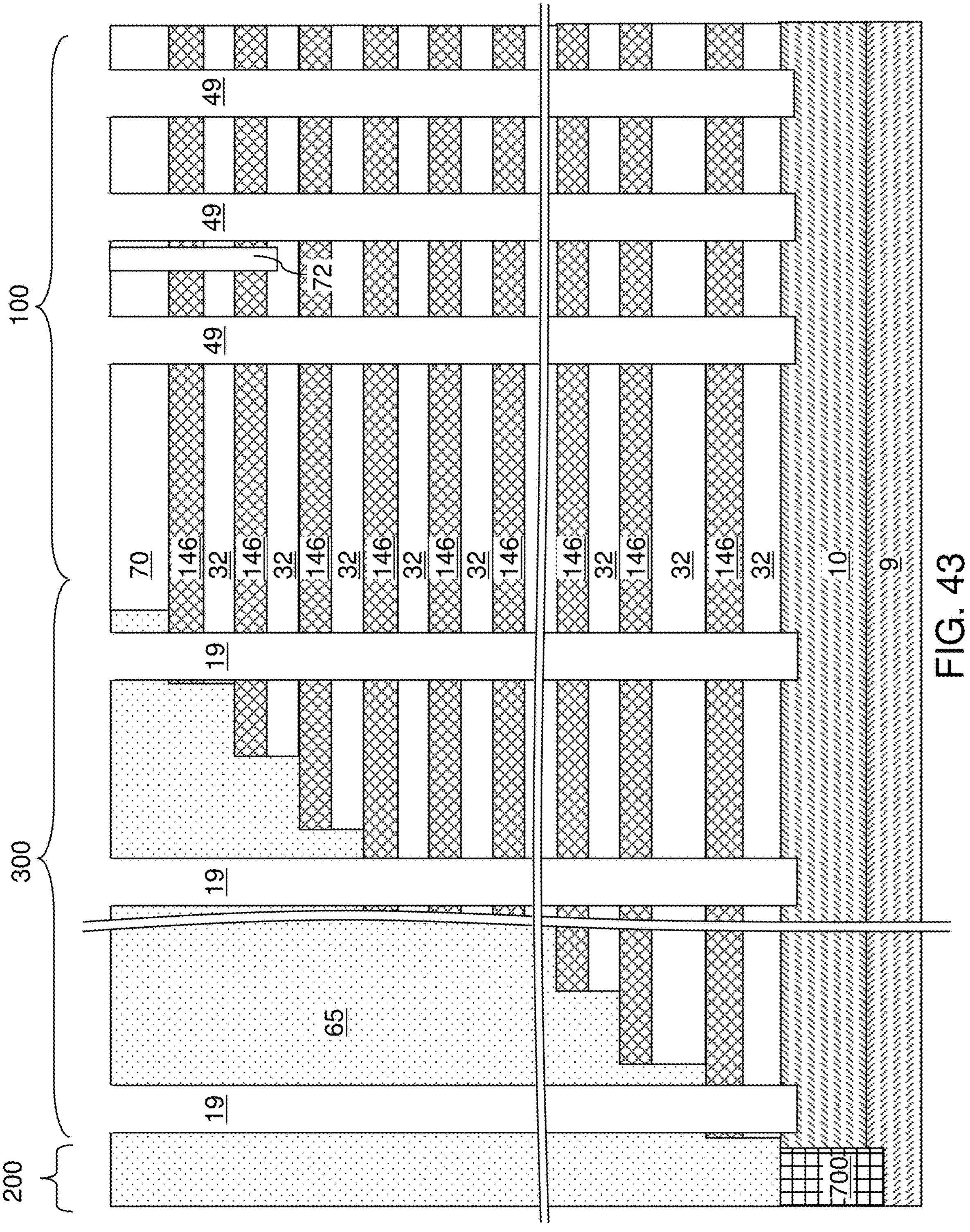
FIG. 43 is a vertical cross-sectional view of the fourth exemplary structure after formation of memory openings and support openings according to the fourth embodiment of the present disclosure.
Figure 44A:
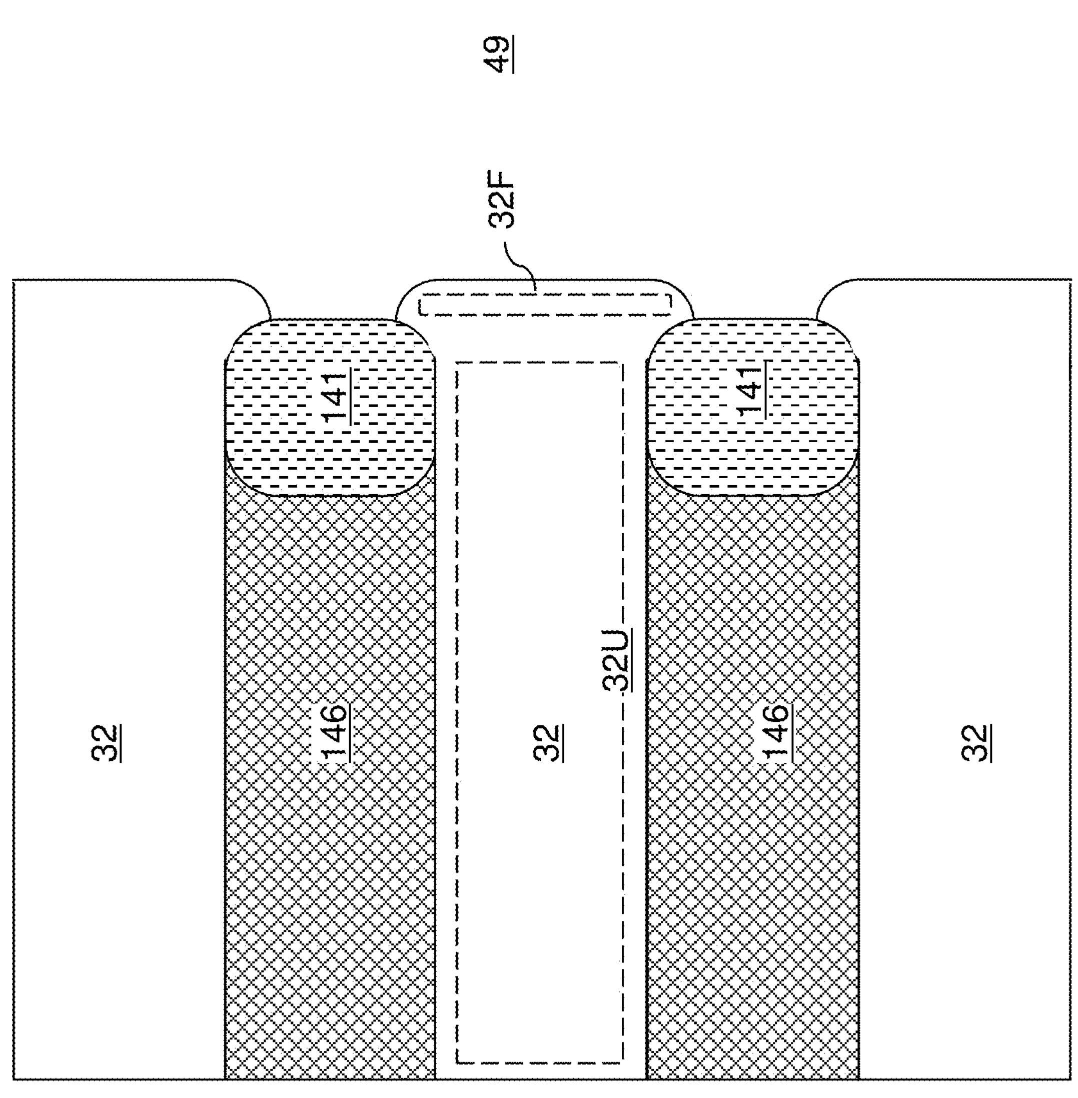
FIGS. 44A-44D are sequential vertical cross-sectional views of a side of a memory opening during formation of a first configuration of a memory opening fill structure according to the fourth embodiment of the present disclosure.

Referring to FIGS. 43 and 44A, a photoresist layer can be applied over the insulating cap layer 70 and the retro-stepped dielectric material portion 65, and can be lithographically patterned to form openings therein. The pattern of the openings in the photoresist layer may be the same as the pattern of openings in the photoresist layer at the processing steps of FIGS. 4A and 4B of the first embodiment.

An anisotropic etch process can be performed to transfer the pattern in the photoresist layer though the insulating cap layer 70, the retro-stepped dielectric material portion, and the alternating stack (32, 146). Memory openings 49 are formed in the memory array region 100, and support openings 19 are formed in the staircase region 300.

According to an aspect of the present disclosure, the anisotropic etch process has an etch chemistry that etches the materials of the insulating layers 32 and the electrically conductive layers 146 while oxidizing physically exposed surface portions of the electrically conductive layers 146 and while re-depositing a fraction of etched portions of the insulating layers 32 on physically exposed surfaces of the insulating layers. In one embodiment, the anisotropic etch process may employ a chlorine-based etch chemistry, such as a $SiCl_4$ and $Cl_2$ containing plasma. During the anisotropic etch process, the $Cl^-$ ions from the plasma of the anisotropic etch process react with the silicon oxide or oxynitride material of the insulating layers 32 to form $SiCl_4$ and $O_2$. $O_2$ reacts with the elemental metal of the electrically conductive layers 146 to form a metal oxide material. The oxidized portions of the electrically conductive layers 146 form metal oxide portions 141, which may be, for example, molybdenum oxide, tungsten oxide, ruthenium oxide, cobalt oxide, or niobium oxide.

In one embodiment, the metal oxide portions 141 may have a higher work function than the metal of the electrically conductive layers 146. This helps improve erase saturation and data retention of the memory device. Embodiments that include the higher word function metal oxide portions 141 may thereof exhibit improved memory cell characteristics. Furthermore, the metal oxide portions 141 may serve as a diffusion barrier layer to prevent impurity diffusion (such as chlorine and/or fluorine diffusion) from the metal of the electrically conductive layers 146 (e.g., chlorine and/or fluorine out diffusion from tungsten electrically conductive layers deposited from a chlorine or fluorine precursor gases) to the memory cell areas. This can improve memory cell reliability.

Part of the metal oxide material reacts with a silicon-chlorine compound gas (e.g., $SiCl_y$, such as $SiCl_4$) that is provided from the plasma of the anisotropic etch process and/or from byproduct gases of the etched silicon oxide material of the insulating layers 32. A volatile metal-oxygen-chlorine compound gas and silicon oxide ($SiO_x$) byproduct materials are generated by the anisotropic etch process. In an illustrative example, the volatile metal-oxygen-chlorine compound gas may be a molybdenum oxychloride compound gas in case the metal is molybdenum. The volatile metal-oxygen-chlorine compound gas is pumped out of the memory openings 49 and the support openings 19 during the anisotropic etch process. The silicon oxide byproduct materials (which may be stoichiometric or non-stoichiometric) may be re-deposited on the sidewalls of the memory openings 49 and the support openings 19. In one embodiment, the silicon oxide byproduct material may be re-deposited in proximity to the interfaces between the insulating layers 32 and oxidized portions of the electrically conductive layers 146. The metal oxide portions 141 may be annular dielectric material portions having a respective shape of a torus. The lateral dimension between an outer sidewall and an inner sidewall of each metal oxide portion 141 may be in a range from 2 nm to 30 nm, such as from 4 nm to 20 nm, although lesser and greater lateral dimensions may also be employed.

In case the electrically conductive layers 146 consist essentially of molybdenum, the silicon tetrachloride and chlorine gas containing plasma may be employed to etch the memory openings 49 and the support openings 19 utilizing the following reactions:

$$SiO_2+Cl^- \rightarrow SiCl_4 \text{ (volatile)}+O_2$$

$$Mo+O_2 \text{ (from the product of the } SiO_2 \text{ etch)} \rightarrow MoO_x$$

$MoO_x+SiCl_y$ (from the plasma or from the $SiO_2$ etch)→$MoOCl_z$ (volatile)+$SiO_x$ (redeposited on sidewalls).

In some embodiments, in order to provide a more uniform thickness distribution for the metal oxide portions 141, oxygen gas ($O_2$) may be added to the plasma during the anisotropic etch process. In some embodiments, $SiCl_4$ and $O_2$ may be simultaneously flowed during the anisotropic etch process to provide necessary etch chemistry.

Generally, memory openings 49 and support openings 19 can be formed through the alternating stack (32, 146) employing an anisotropic etch process that converts surface portions of the electrically conductive layers 146 into metal oxide portions 141. The anisotropic etch process etches and redeposits the material of the spacer material layers (such as the insulating layers 32) around the memory openings 49 and the support openings 19. In one embodiment, each of the spacer material layers (such as the insulating layers 32) comprises a uniform-thickness region 32U having a uniform thickness (in the direction normal to the upper surface 7 of the substrate 9) throughout, and a flair region 32F having a greater thickness (i.e., height) than the uniform thickness (i.e., height) and located between the uniform-thickness region 32U and a memory opening 49. In one embodiment, each flair region 32F may have a configuration of a hammerhead shaped torus. An inner portion of the flair region 32F may protrude into the memory opening 49 past the inner edge of adjacent metal oxide portions 141. In this case, the metal oxide portion 141 may be recessed from the memory opening 49 relative to the adjacent flair regions 32F.

Figure 44B:
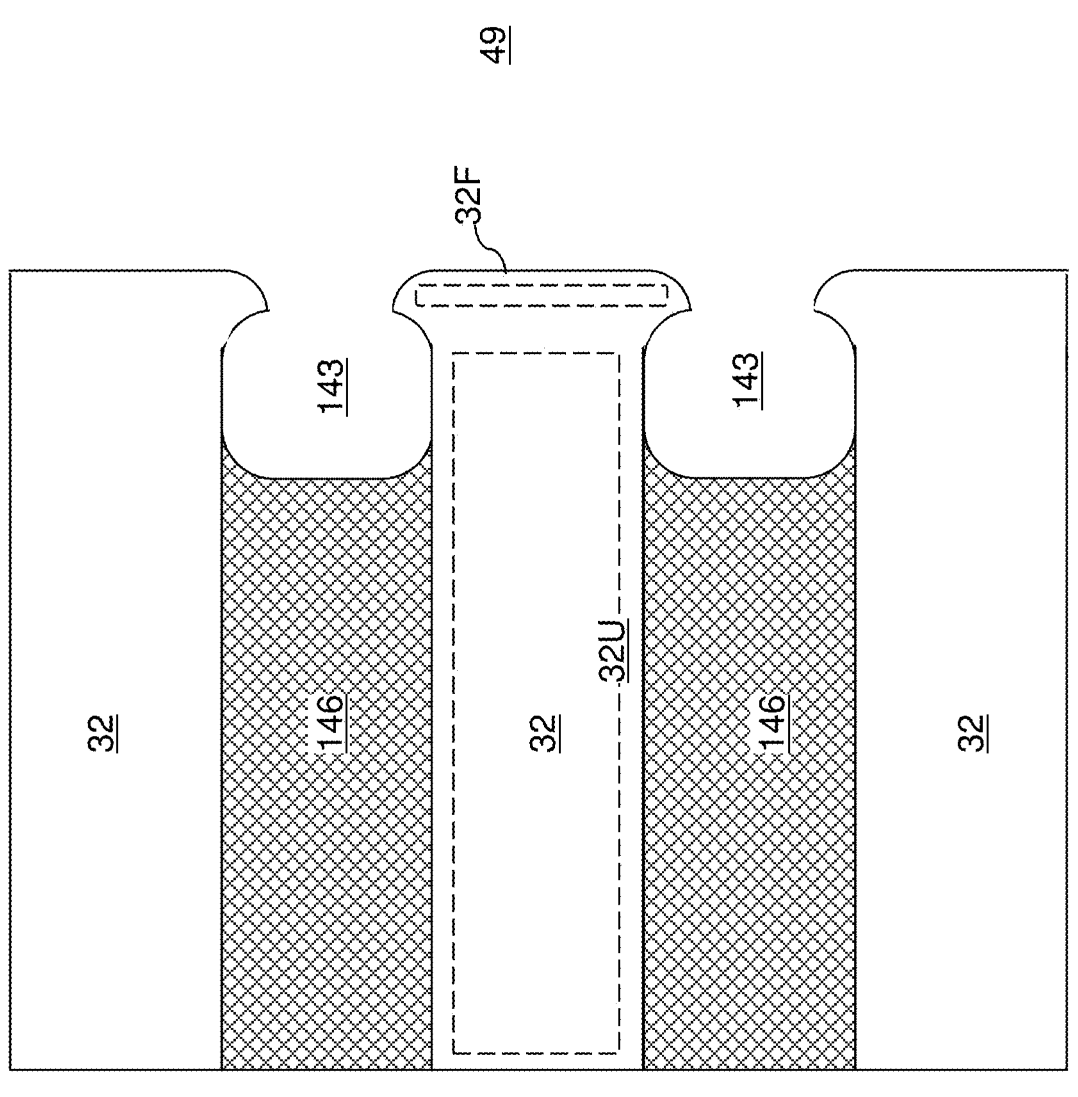

Referring to FIG. 44B, an isotropic etch process can be performed to etch the metal oxide portions 141 selective to the insulating layers 32 and the electrically conductive layers 146. In one embodiment, the isotropic etch process may comprise a wet etch process employing a wet etch chemistry that etches the metal oxide material of the metal oxide portions 141 selective to the silicon oxide material of the insulating layers 32 and the elemental metal of the electrically conductive layers 146. Annular cavities 143 are formed around the memory openings 49 in volumes from which the metal oxide portions 141 are removed. For example, if the metal oxide portions 141 comprise molybdenum oxide, then a selective wet etch using sodium hydroxide and phosphoric acid may be used to etch the metal oxide portions 141.

In one embodiment, the entirety of the metal oxide portions 141 may be removed during formation of the annular cavities 143. In this case, sidewalls of the electrically conductive layers 146 can be physically exposed to the annular cavities 143. In one embodiment, each physically exposed sidewall of the electrically conductive layers 146 may comprise a vertical cylindrical surface segment, an upper concave annular surface segment that is adjoined to an upper end of the vertical cylindrical surface segment, and a lower concave annular surface segment that is adjoined to a lower end of the vertical cylindrical surface segment.

Figure 44C:
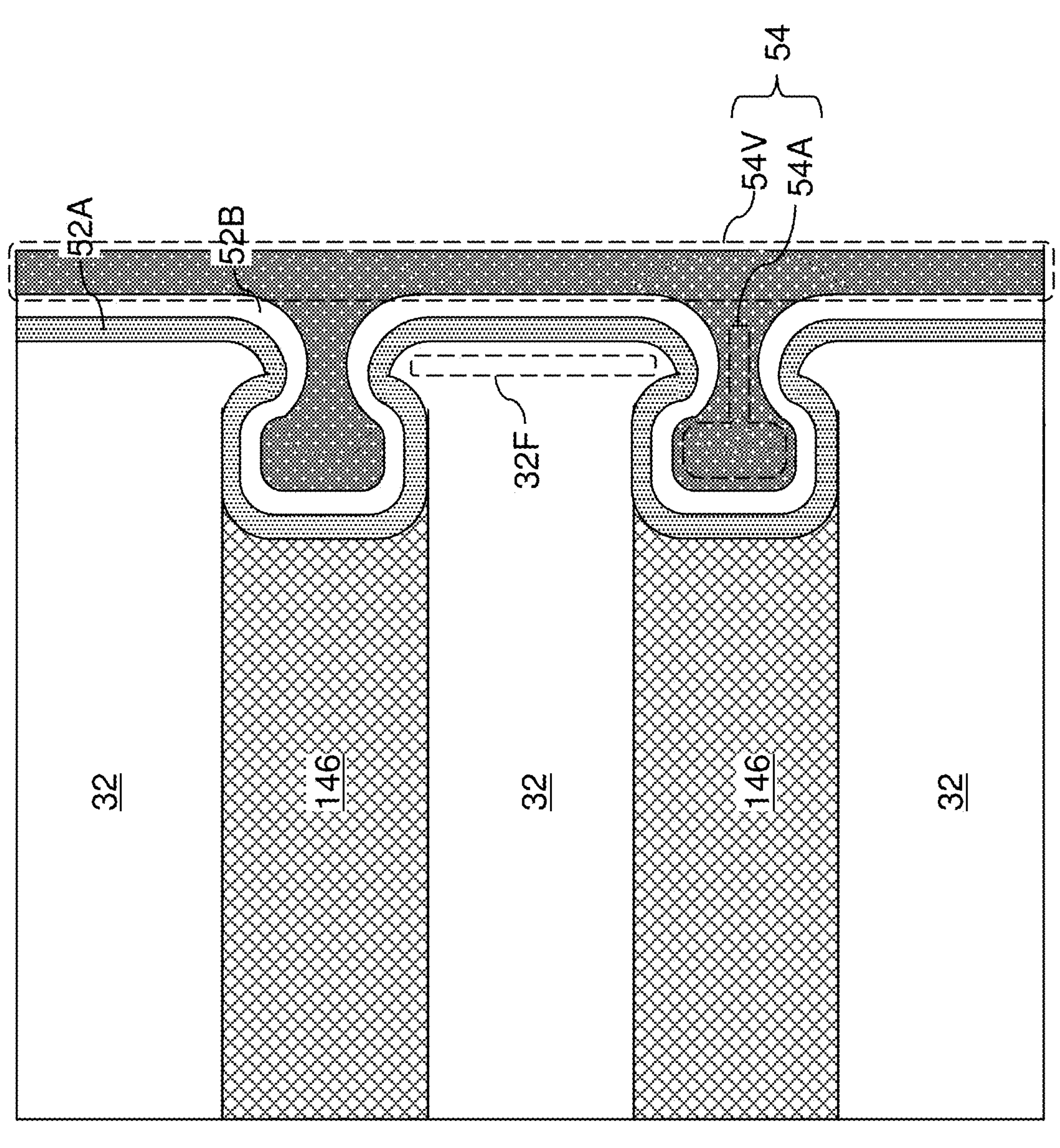

Referring to FIG. 44C, at least one blocking dielectric material can be conformally deposited to form at least one blocking dielectric layer. Each of the at least one blocking dielectric layer is formed with surfaces that replicate the topography of the physically exposed surfaces of the alternating stack (32, 146), and thus, follows the contour of the sidewalls of the alternating stack (32, 146) and is deposited into the annular cavities 143. The at least one blocking dielectric layer is herein referred to as at least one contoured blocking dielectric layer (52A, 52B).

In one embodiment, the at least one contoured blocking dielectric layer (52A, 52B) may comprise a contoured metal oxide blocking dielectric layer 52A consisting essentially of a dielectric metal oxide material such as aluminum oxide, a transition metal oxide material, a Lanthanide oxide material, alloys thereof, or layer stacks thereof, and a contoured silicon oxide blocking dielectric layer 52B consisting essentially of silicon oxide.

Generally, the at least one contoured blocking dielectric layer (52A, 52B) can be formed at peripheral regions of the annular cavities 143 and on sidewalls of the spacer material layers (such as the insulating layers 32) around each memory opening 49 and around each support opening 19. The at least one contoured blocking dielectric layer (52A, 52B) may be deposited directly on sidewalls of remaining portions of the electrically conductive layers 146 after formation of the annular cavities 143. Each of the contoured dielectric metal oxide blocking dielectric layer 52A and the contoured silicon oxide blocking dielectric layer 52B may be deposited by a respective chemical vapor deposition process and/or a respective atomic layer deposition process. In one embodiment, the contoured dielectric metal oxide blocking dielectric layer 52A may have a thickness in a range from 1 nm to 10 nm, such as from 2 nm to 6 nm, although lesser and greater thicknesses may also be employed. The contoured silicon oxide blocking dielectric layer 52B may have a thickness in a range from 1 nm to 10 nm, such as from 2 nm to 6 nm, although lesser and greater thicknesses may also be employed.

A charge storage material can be conformally deposited in remaining unfilled volumes of the annular cavities 143 and over the physically exposed surfaces of the at least one contoured blocking dielectric layer (52A, 52B). The charge storage material may comprise, and/or may consist essentially of, a dielectric charge trapping material, such as silicon nitride. A charge storage layer 54 can be formed over the at least one contoured blocking dielectric layer (52A, 52B) by a conformal deposition process such as a chemical vapor deposition process or an atomic layer deposition process. In one embodiment, the charge storage layer 54 can be formed over the at least one contoured blocking dielectric layer (52A, 52B) such that the charge storage layer 54 comprises a vertically-extending cylindrical portion 54V that continuously extends vertically through each of the electrically conductive layers 146 and each of the insulating layers 32 in the alternating stack (32, 146).

A vertical stack of charge storage material portions 54A can be formed over the at least one contoured blocking dielectric layer (52A, 52B) around each memory opening 49 within volumes of the annular cavities 143. The vertical stack of charge storage material portions 54A comprises portions of the charge storage layer 54 and is adjoined to the vertically-extending cylindrical portion 54V of the charge storage layer 54. The thickness of the vertically-extending cylindrical portion 54V of the charge storage layer 54, as measured at levels of the insulating layers 32, can be in a range from 2 nm to 20 nm, such as from 4 nm to 10 nm, although lesser and greater thicknesses may also be employed.

Figure 44D:
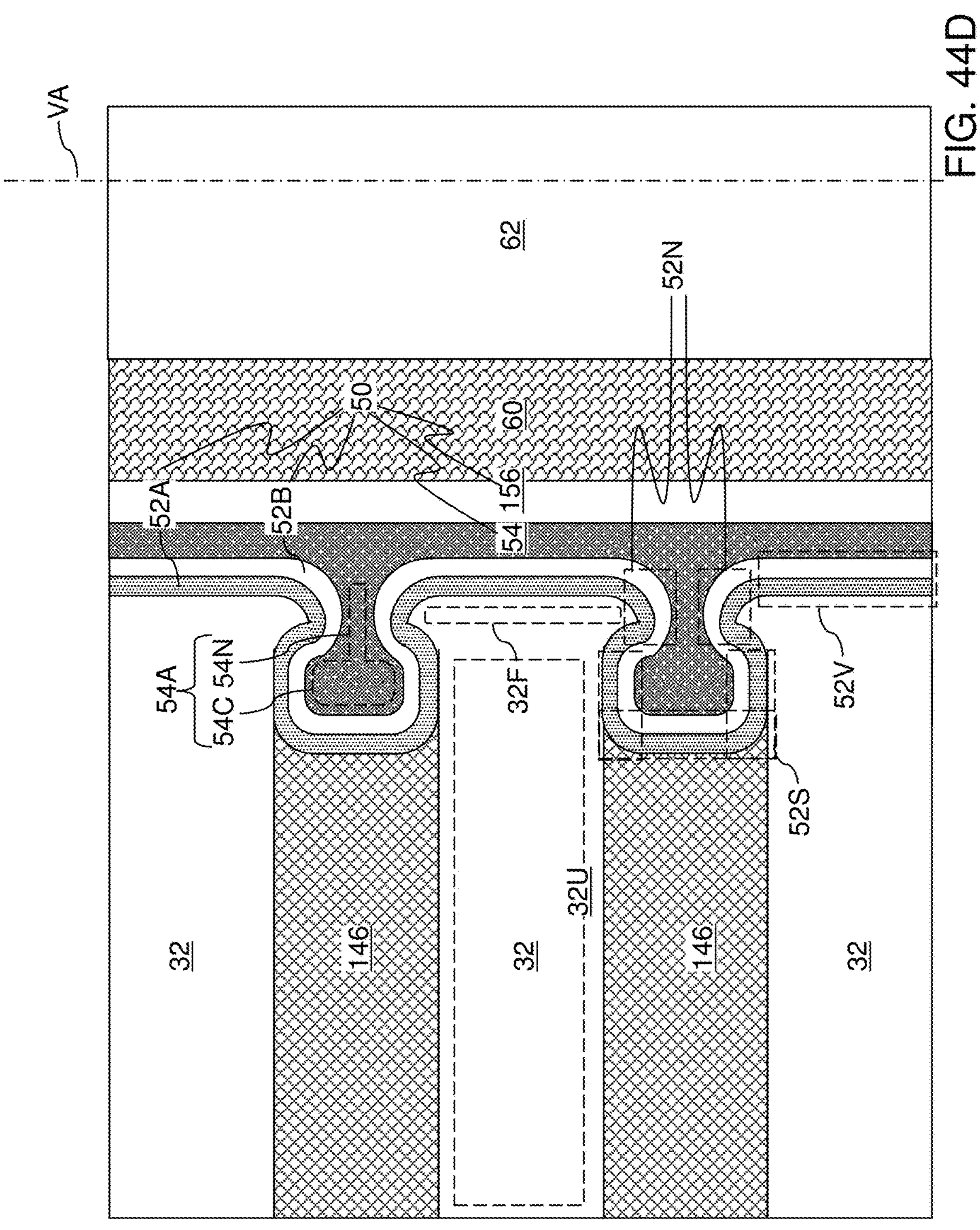

Referring to FIG. 44D, a tunneling dielectric layer 56 can be formed over the charge storage layer 54. The tunneling dielectric layer 56 may have the same material composition and/or the same thickness as in the first exemplary structure. The combination of the at least one contoured blocking dielectric layer (52A, 52B), the charge storage layer 54, and the tunneling dielectric layer 56 constitutes a memory film 50.

An anisotropic etch process may be performed to remove horizontally-extending portions of the tunneling dielectric layer 56, the charge storage layer 54, and the at least one contoured blocking dielectric layer (52A, 52B) from above the insulating cap layer 70 and at the bottom of each of the memory openings 49 and the support openings 19. Optionally, a sacrificial cover material layer (not shown) may be temporarily employed to protect sidewalls of the tunneling dielectric layer 56 during removal of the horizontally-extending portions of the tunneling dielectric layer 56, the charge storage layer 54, and the at least one contoured blocking dielectric layer (52A, 52B). A surface of the semiconductor material layer 10 may be physically exposed at the bottom of each memory opening 49 and at the bottom of each support opening 19 after the anisotropic etch process.

A semiconductor channel material having a doping of a first conductivity type can be deposited over the tunneling dielectric layer 56. A dielectric fill material can be deposited over the semiconductor channel material, and can be vertically recessed so that a top surface of each remaining portion of the dielectric fill material is formed at, or about, the horizontal plane including the bottom surface of the insulating cap layer 70. Each remaining portion of the semiconductor channel material having a doping of the first conductivity type comprises a vertical semiconductor channel 60. Each remaining portion of the dielectric fill material constitutes a dielectric core 62. A doped semiconductor material having a doping of a second conductivity type that is the opposite of the first conductivity can be deposited over the dielectric core 62. Excess portions of the doped semiconductor material and the semiconductor channel material can be removed from above the horizontal plane including the top surface of the insulating cap layer 70. Each remaining portion of the doped semiconductor material having a doping of the second conductivity type comprises a drain region, which may be the same as the drain region 63 of the first exemplary structure in material composition. The vertical semiconductor channel 60 may have the same material composition as in the first exemplary structure. A vertical axis VA passing through the geometrical center of a memory opening 49 may vertically extend through a dielectric core 62 and a drain region. A first configuration of a memory opening fill structure is formed in each memory opening 49.

According to an aspect of the present disclosure, each of the electrically conductive layers 146 comprises a vertically concave surface segment in contact with the memory film 50. As used herein, a vertically concave surface segment refers to a surface segment having a concave profile in a vertical cross-sectional view. In one embodiment, the at least one contoured blocking dielectric layer (52A, 52B) comprises vertically-extending segments 32V in contact with vertical sidewalls of the insulating layers 32, sac-shaped segments 32S in contact with a respective overlying insulating layer 32 and a respective underlying insulating layer 32, and neck segments 52N connecting a respective one of the sac-shaped segments 52S to a respective pair of vertically-extending segments 52V. The sac-shaped segments 52S have a clam or "C" shape, containing a curved vertical segment connecting two horizontal segments which contact the respective overlying and underlying insulating layers 32.

In one embodiment, each of the charge storage material portions 54A comprises a toroidal central portion 54C located outside a cylindrical sidewall including vertical interfaces between the insulating layers 32 and the memory film 50, and an annular neck portion 54N adjoined to the toroidal central portion 54C, more proximal to the tunneling dielectric layer 56 than the toroidal central portion 54C is to the tunneling dielectric layer 56, and having a lesser vertical extent (i.e., thickness) than the toroidal central portion. The neck portion 54N is located between the central portion 54C and the tunneling dielectric layer 56. In this embodiment, each of the charge storage material portions 54A are "partially discrete" because while they are connected to each other by the vertically-extending cylindrical portion 54V of the charge storage layer, the narrow annular neck portion 54N reduces charge carrier (e.g., electron) leakage between charge storage material portions 54A through the vertically-extending cylindrical portion 54V.

In one embodiment, each of the insulating layers 32 comprises a uniform-thickness region 32U having a uniform thickness throughout, and a flair region 32F having a greater thickness than the uniform thickness and located between the uniform-thickness region 32U and the memory film 50. In one embodiment, the flair region 32F contacts the memory film 50 at a contact surface that includes a vertically-extending cylindrical surface segment, an upper concave annular surface segment and a lower concave annular surface segment.

In one embodiment, each of the electrically conductive layers 146 has a uniform material composition throughout, and each of the electrically conductive layers 146 comprises an upper horizontal surface contacting a respective overlying insulating layer 32 and a lower horizontal surface contacting a respective underlying insulating layer 32.

Figure 45A:
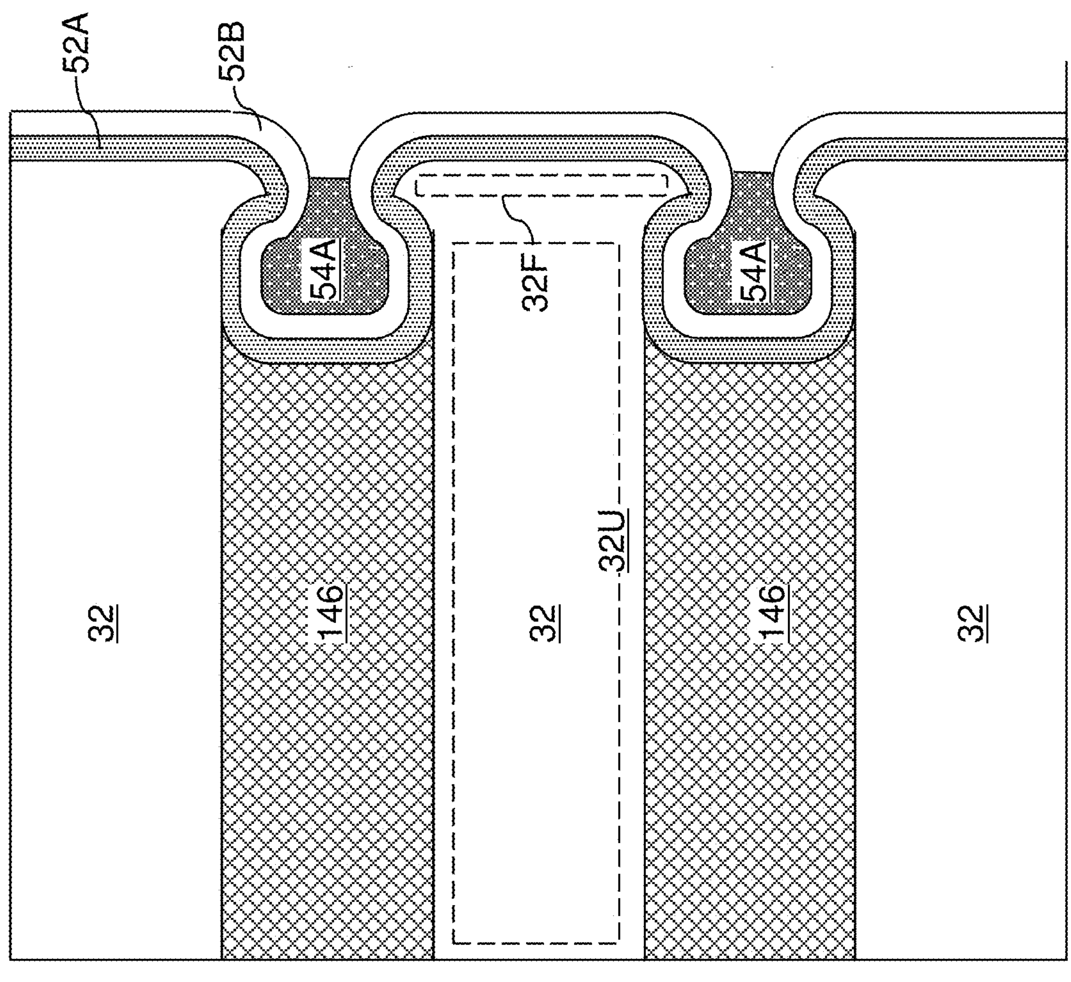
FIGS. 45A and 45B are sequential vertical cross-sectional views of a side of a memory opening during formation of a second configuration of a memory opening fill structure according to the fourth embodiment of the present disclosure.

Referring to FIG. 45A, a second configuration of the fourth exemplary structure can be derived from the first configuration of the fourth exemplary structure by forming a vertical stack of fully discrete charge storage material portions 54A entirely within volumes of the annular cavities 143. For example, the second configuration of the fourth exemplary structure can be derived from the first configuration of the fourth exemplary structure illustrated in FIG. 44C by etching back (i.e., removing) the vertically-extending cylindrical portion 54V of the charge storage layer around the memory opening 49. In an embodiment in which the charge storage layer 54 includes a silicon nitride material, an isotropic etch process such as a wet etch process using hot phosphoric acid may be employed to etch the silicon nitride material selective to the at least one contoured blocking dielectric layer (52A, 52B). The remaining portions of the charge storage layer 54 comprise the vertical stack of discrete charge storage material portions 54A having a respective toroidal shape.

Figure 45B:
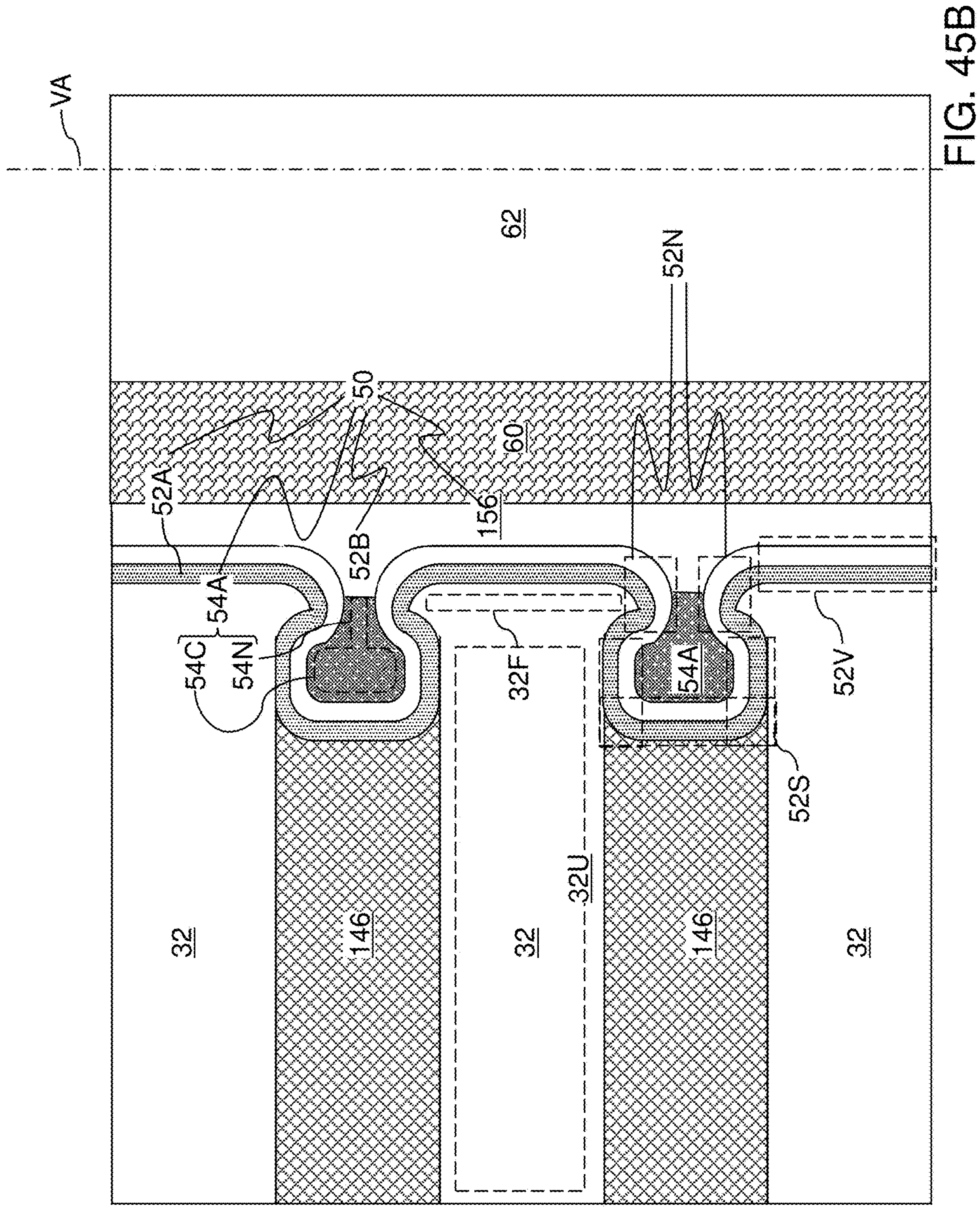

Referring to FIG. 45B, the processing steps of FIG. 44D can be performed to form a tunneling dielectric layer 56, a dielectric core 62, and a drain region in each of the memory openings 49. A memory opening fill structure having a second configuration is formed in each of the memory openings 49. Each of the discrete charge storage material portions 54A has the toroidal central portion 54C and the neck portion 54N located between the central portion and the tunneling dielectric layer 56. The central portion 54C has a greater thickness (i.e., height or vertical extend) than the neck portion 54N.

Figure 46A:
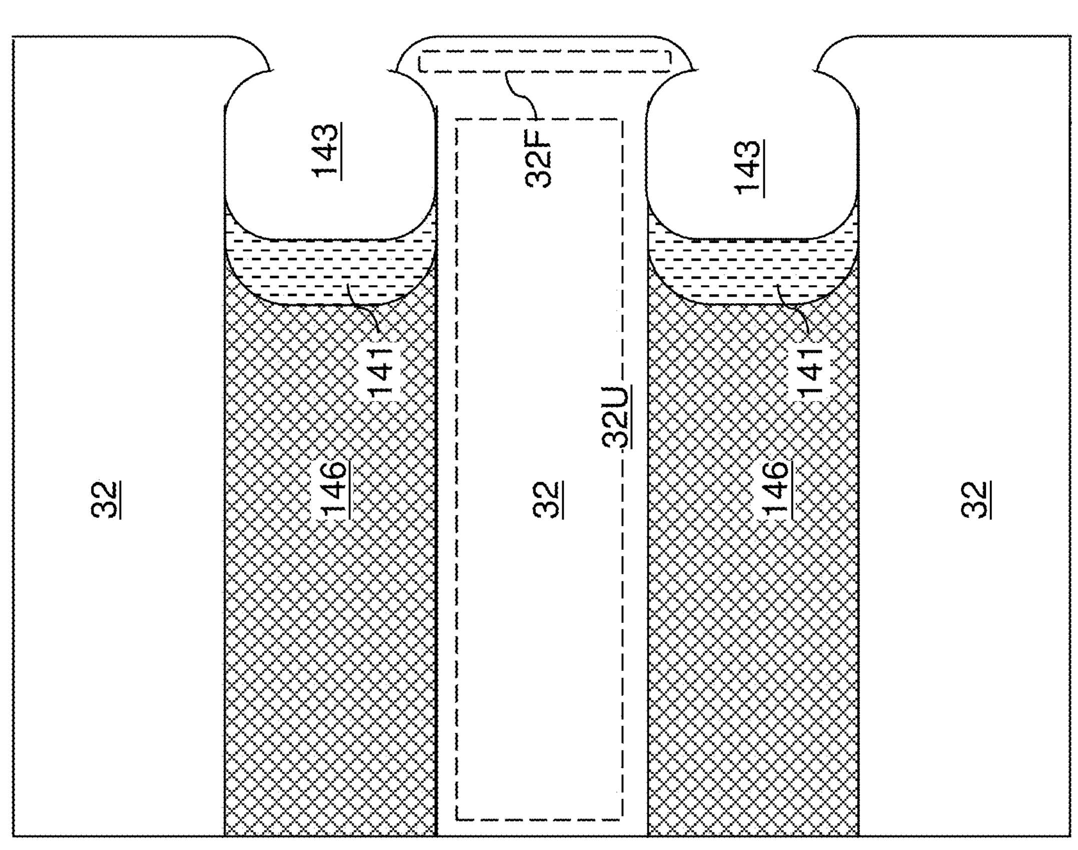
FIGS. 46A-46C are sequential vertical cross-sectional views of a side of a memory opening during formation of a third configuration of a memory opening fill structure according to the fourth embodiment of the present disclosure.

Referring to FIG. 46A, a third configuration of the fourth exemplary structure can be derived from the first configuration of the fourth exemplary structure by partially etching the metal oxide portions 141 instead of etching the entirety of the metal oxide portions 141 at the processing steps of FIG. 44B. Specifically, the third configuration of the fourth exemplary structure can be derived from the first configuration of the fourth exemplary structure illustrated in FIG. 44A by performing an isotropic etch process that etches the material of the metal oxide portions 141 with a modification to the duration of the isotropic etch process such that the metal oxide portions 141 are partially etched. Thus, a crescent-shaped metal oxide portion 141, as thinned by the isotropic etch process, is located on each of the electrically conductive layers 146 after formation of the annular cavities 143. The lateral distance between the outer sidewall of a metal oxide portion 141 and the inner sidewall of the metal oxide portion 141 may be in a range from 0.5 nm to 10 nm, such as from 1 nm to 6 nm, although lesser and greater lateral distances may also be employed.

Figure 46B:
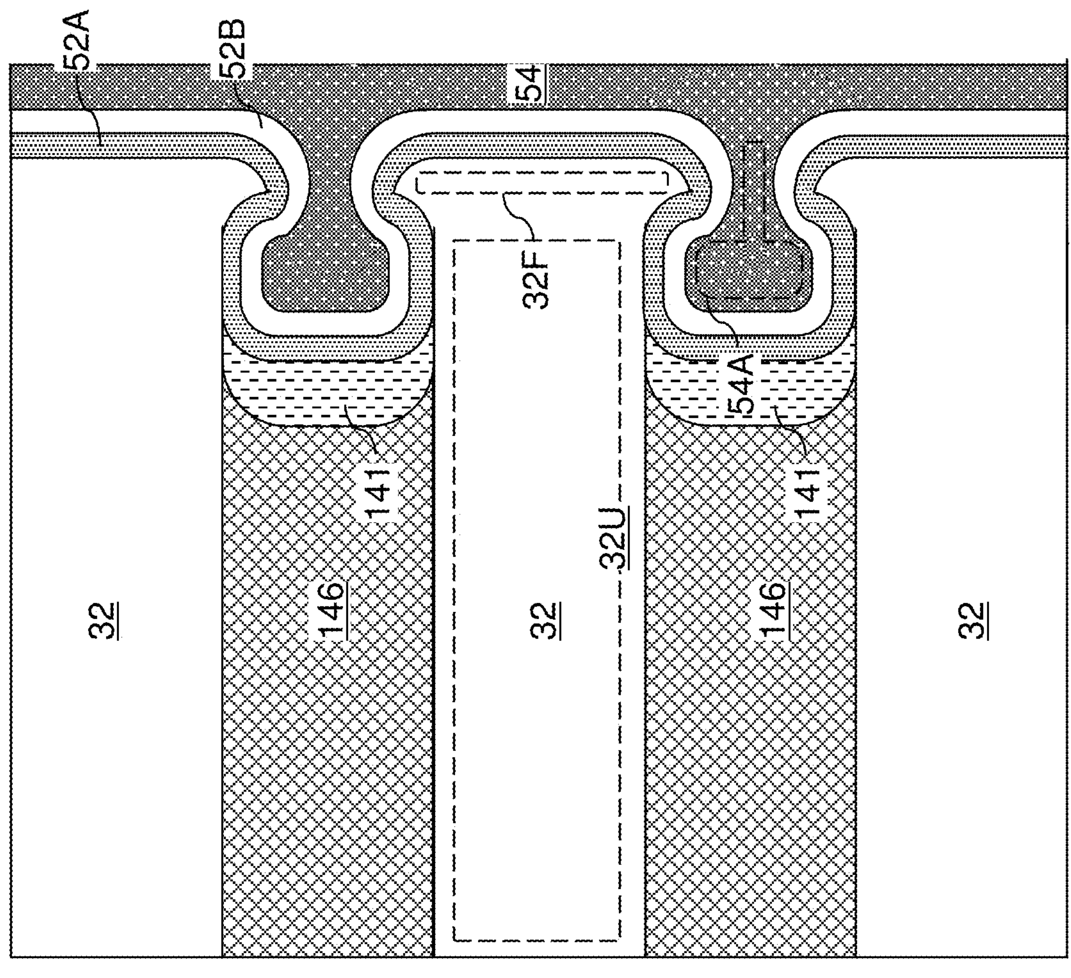

Referring to FIG. 46B, the processing steps of FIG. 44C can be performed to form at least one contoured blocking dielectric layer (52A, 52B) and a charge storage layer 54.

Figure 46C:
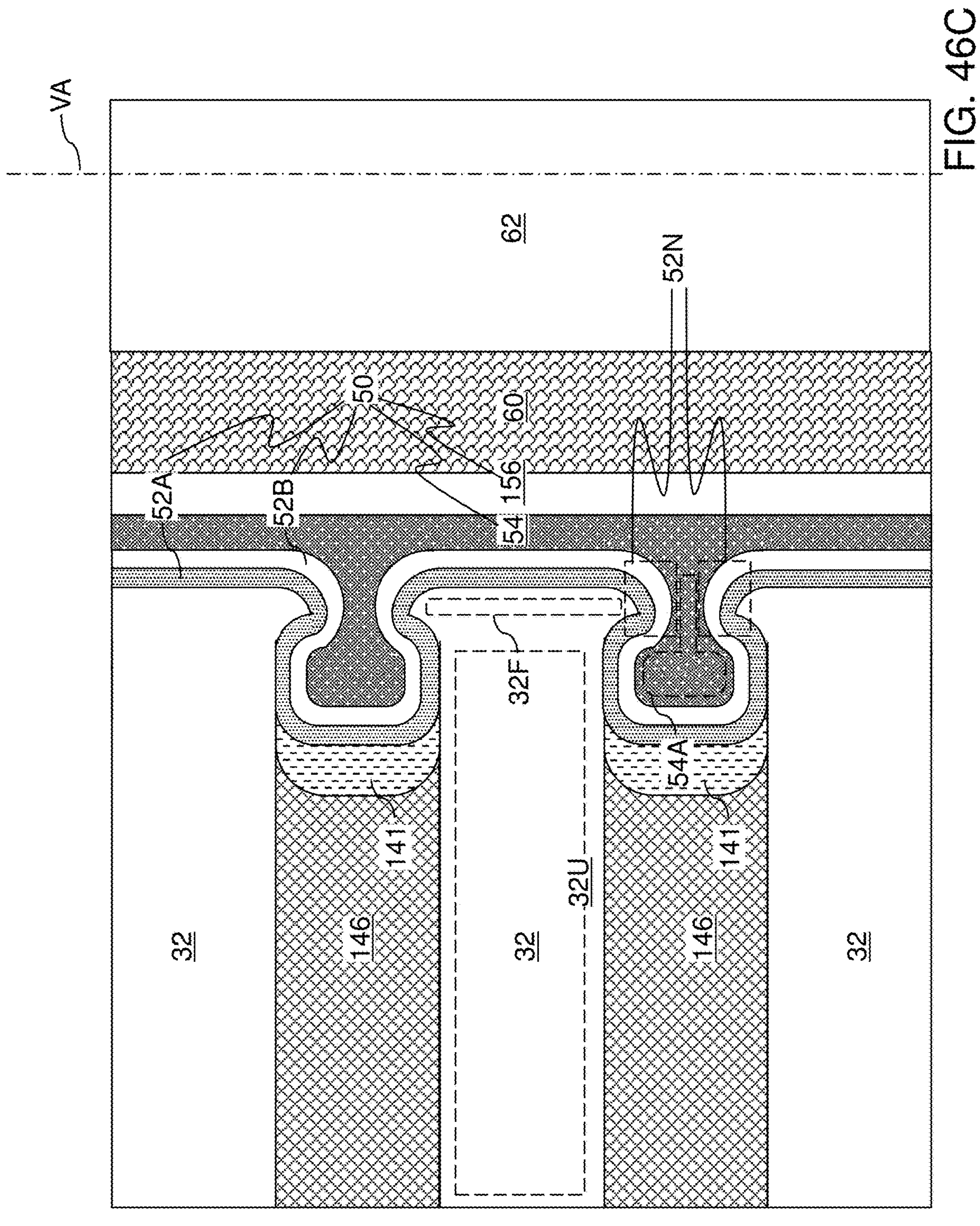

Referring to FIG. 46C, the processing steps of FIG. 44D can be performed to form a tunneling dielectric layer 56, a dielectric core 62, and a drain region in each of the memory openings 49. A memory opening fill structure having the third configuration can be formed within each of the memory openings 49.

Figure 47A:
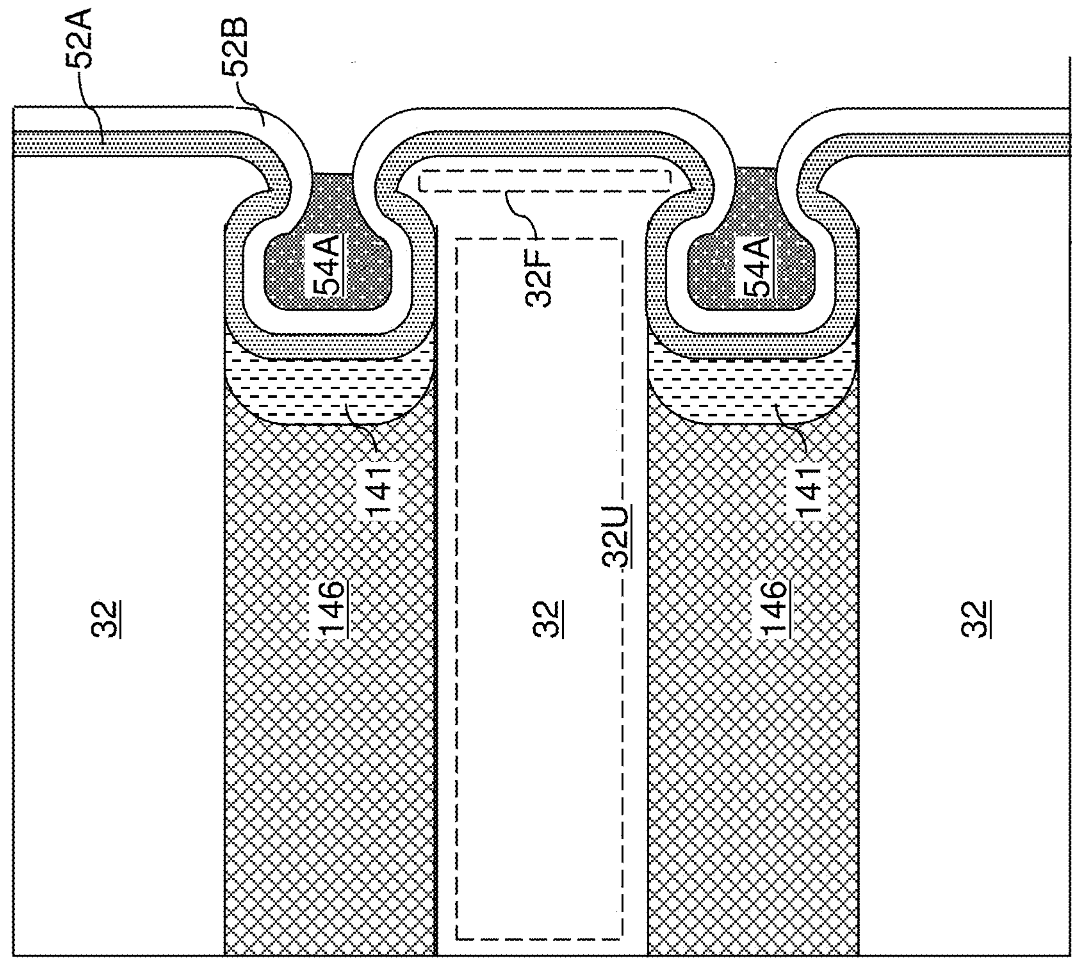
FIGS. 47A and 47B are sequential vertical cross-sectional views of a side of a memory opening during formation of a fourth configuration of a memory opening fill structure according to the fourth embodiment of the present disclosure.

Referring to FIG. 47A, a fourth configuration of the fourth exemplary structure can be derived from the third configuration of the fourth exemplary structure shown in FIG. 46B by forming a vertical stack of charge storage material portions 54A entirely within volumes of the annular cavities 143. For example, the fourth configuration of the fourth exemplary structure can be derived from the third configuration of the fourth exemplary structure illustrated in FIG. 46B by etching back the charge storage material around the memory opening 49, as described above with respect to FIG. 45A. The remaining portions of the charge storage layer 54 comprise the vertical stack of discrete charge storage material portions 54A having a respective toroidal shape.

Figure 47B:
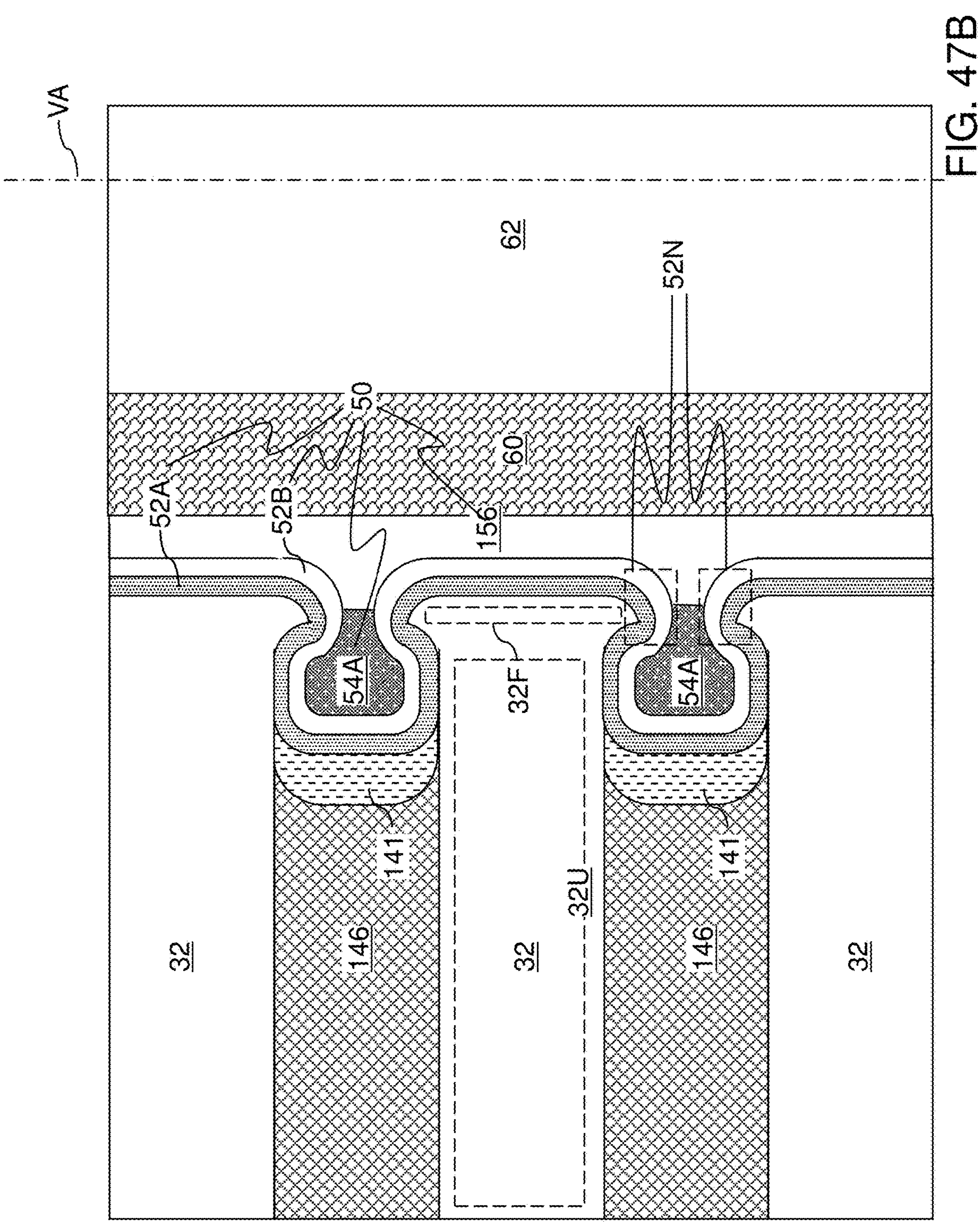

Referring to FIG. 47B, the processing steps of FIG. 44D can be performed to form a tunneling dielectric layer 56, a dielectric core 62, and a drain region in each of the memory openings 49. A memory opening fill structure having a fourth configuration is formed in each of the memory openings 49.

Figure 48:
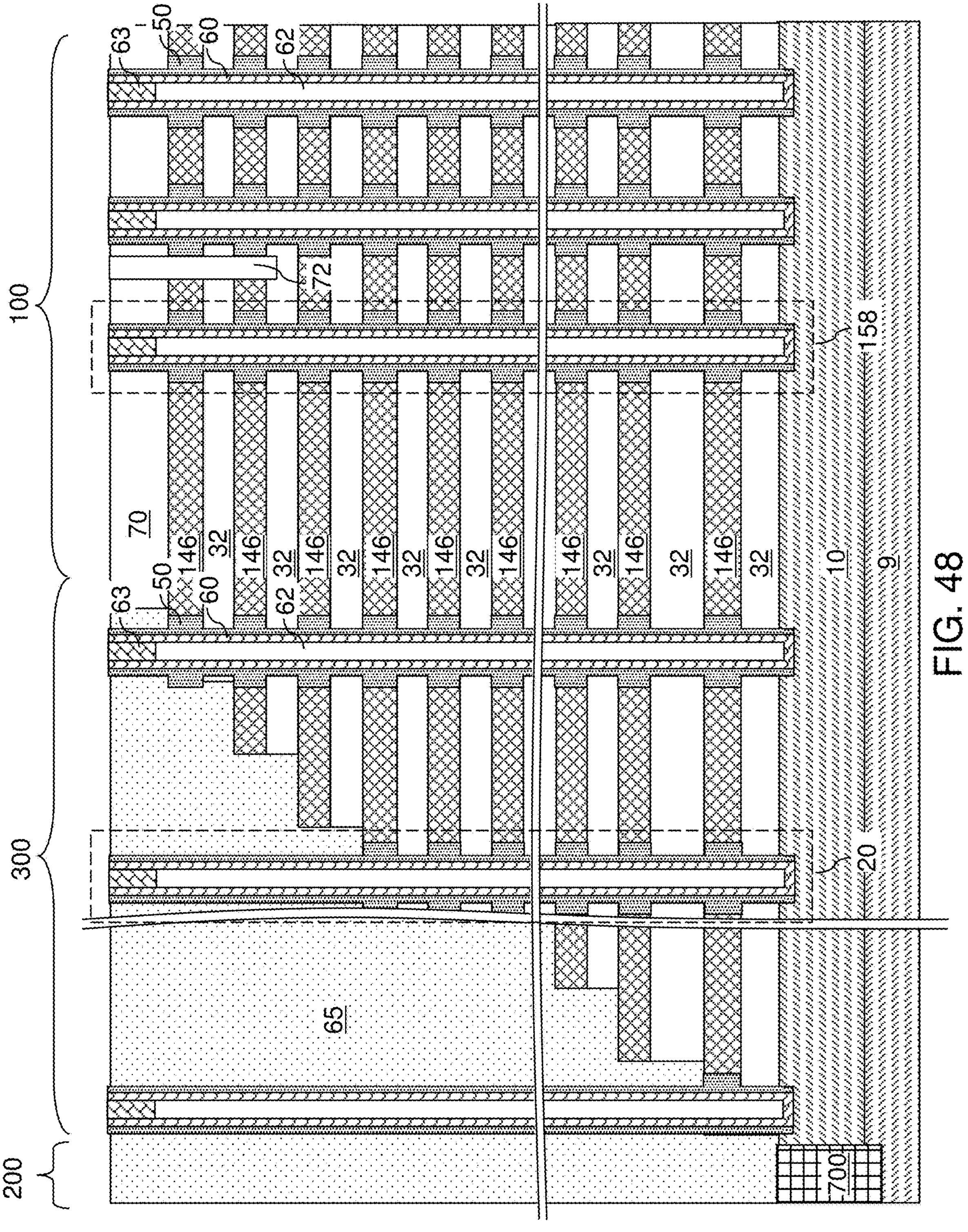
FIG. 48 is a vertical cross-sectional view of the fourth exemplary structure after formation of memory opening fill structures and support pillar structures according to the fourth embodiment of the present disclosure.

Referring to FIG. 48, the fourth exemplary structure is illustrated after formation of memory opening fill structures 158 and support pillar structures 20. The memory opening fill structures 158 and the support pillar structures 20 may have any of the configurations illustrated in FIG. 44D, 45B, 46C, or 47B.

Figure 49:
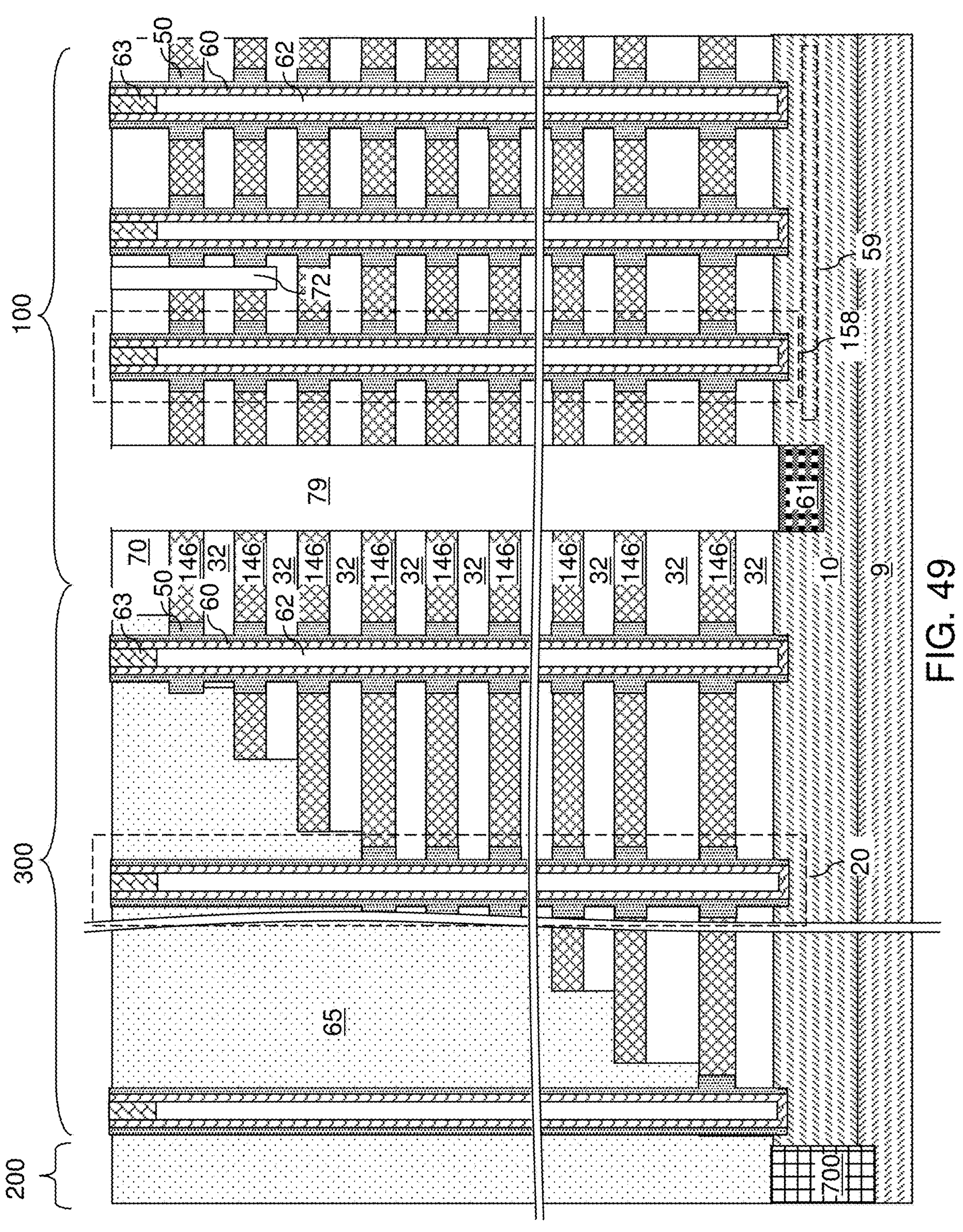
FIG. 49 is a vertical cross-sectional view of the fourth exemplary structure after formation of backside trenches and source regions according to the fourth embodiment of the present disclosure.

Referring to FIG. 49, a photoresist layer (not shown) can be applied over the insulating cap layer 70, and is lithographically patterned to form openings in areas between clusters of memory opening fill structures 158. The pattern in the photoresist layer can be transferred through the insulating cap layer 70, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory opening fill structures 158 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Dopants of the second conductivity type can be implanted into portions of the upper substrate semiconductor layer 10 that underlie the backside trenches 79 to form source regions 61. The atomic concentration of the dopants of the second conductivity type in the source regions 61 can be in a range from $5.0\times10^{18}/cm^3$ to $2.0\times10^{21}/cm^3$, although lesser and greater atomic concentrations can also be employed. Surface portions of the upper substrate semiconductor layer 10 that extend between each source region 61 and adjacent memory opening fill structures 158 comprise horizontal semiconductor channels 59.

Referring to FIG. 50, the processing steps of FIG. 17 can be performed to form an insulating spacer 74 and a backside contact via structure 76 in each backside trench 79. A contact-level dielectric layer 73 can be formed over the insulating cap layer 70, the retro-stepped dielectric material portion 65, the insulating spacers 74, and the backside contact via structures 76. Subsequently, the processing steps of FIGS. 18A and 18B can be performed to form drain contact via structures 88, word line contact via structures 86, and peripheral device contact via structures 8P.

Figure 51:
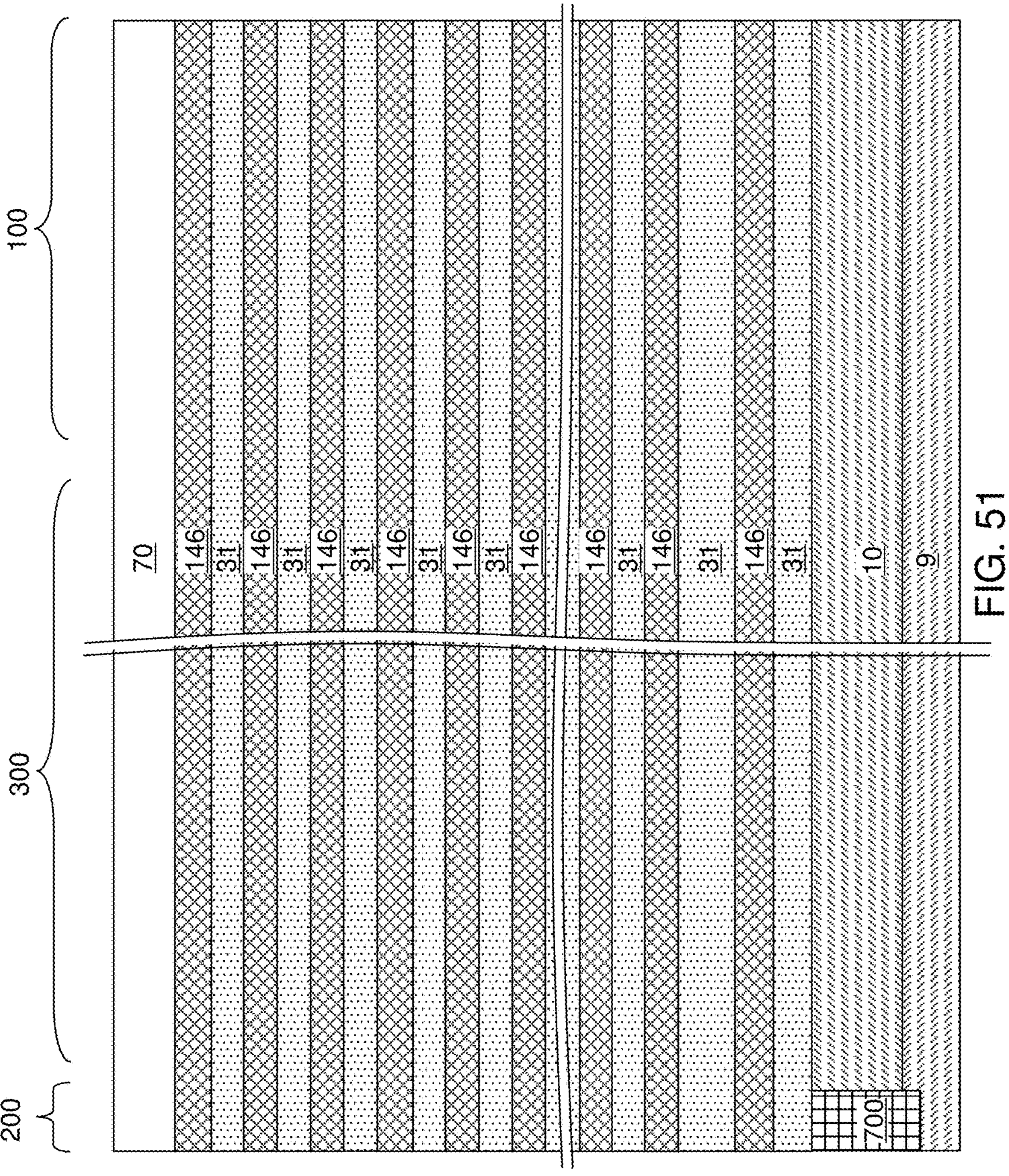
FIG. 51 is a vertical cross-sectional view of a fifth exemplary structure after formation of an alternating stack of sacrificial material layers and electrically conductive layers according to a fifth embodiment of the present disclosure.

Referring to FIG. 51, a fifth exemplary structure according to a fifth embodiment of the present disclosure can be derived from the fourth exemplary structure illustrated in FIG. 41 by forming an alternating stack of sacrificial material layers 31 and electrically conductive layers 146 instead of an alternating stack of insulating layers 32 and electrically conductive layers 146. In other words, sacrificial material layers 31, which are also referred to as insulating-level sacrificial material layers, are employed in lieu of the insulating layers 32. The sacrificial material layers 31 comprise a material that may be subsequently removed selective to the materials of the electrically conductive layers 146 and the at least one contoured blocking dielectric layer (52A, 52B). In an illustrative example, the sacrificial material layers 51 may comprise silicon nitride, silicon oxynitride or silicon oxide. The sacrificial material layers 31 may be deposited by chemical deposition processes, atomic layer deposition processes, or physical vapor deposition processes. The sacrificial material layers 31 are spacer material layers that are subsequently replaced with insulating layers.

Figure 52:
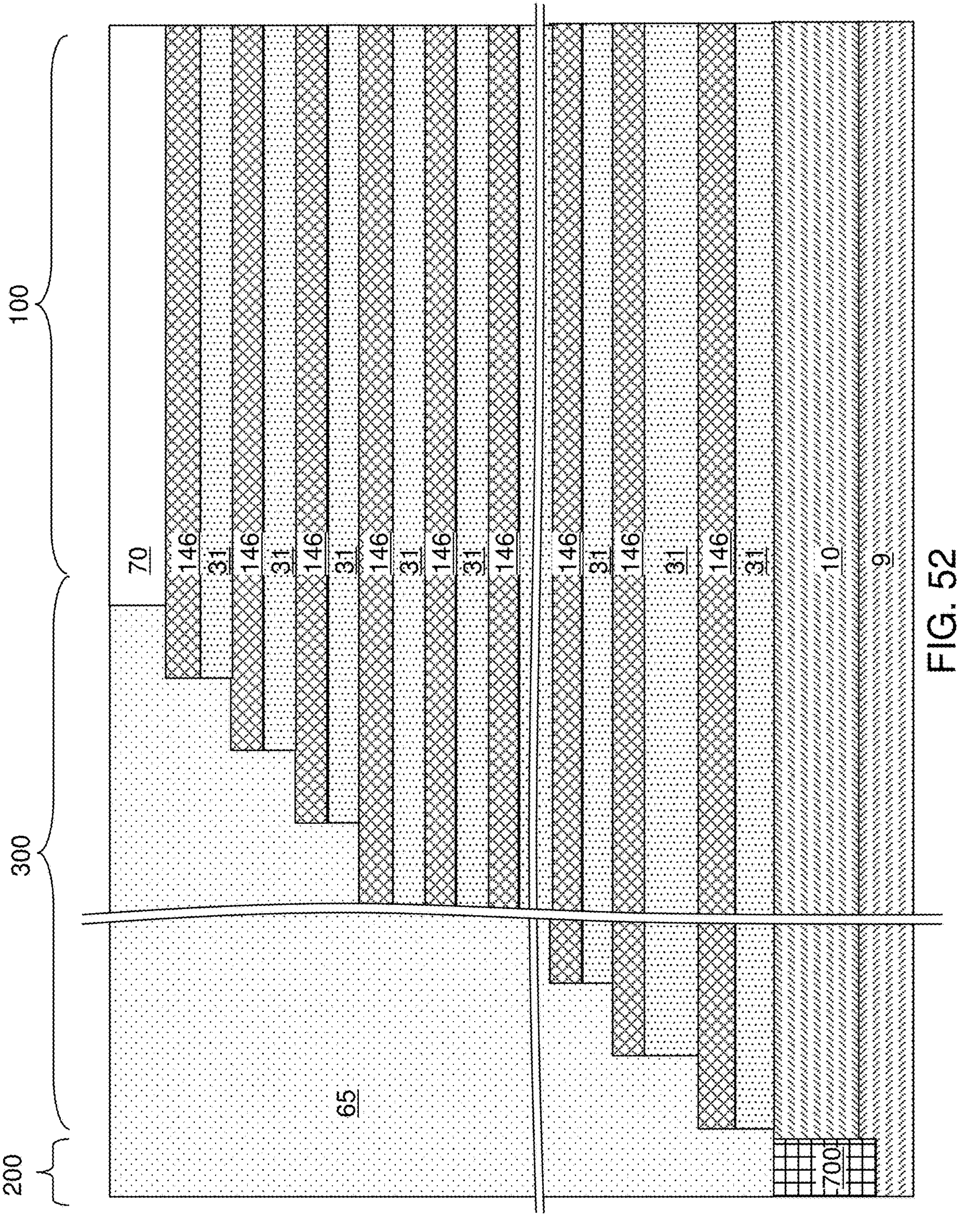
FIG. 52 is a vertical cross-sectional view of the fifth exemplary structure after formation of stepped surfaces and a retro-stepped dielectric material portion according to the fifth embodiment of the present disclosure.

Referring to FIG. 52, the processing steps of FIG. 42 can be performed with any needed changes in the etch chemistry of etch processes in view of the change in the material composition in the sacrificial material layers 31 relative to the insulating layers 32 of the fourth exemplary structure, to form stepped surfaces and to form a retro-stepped dielectric material portion 65.

Figure 53:
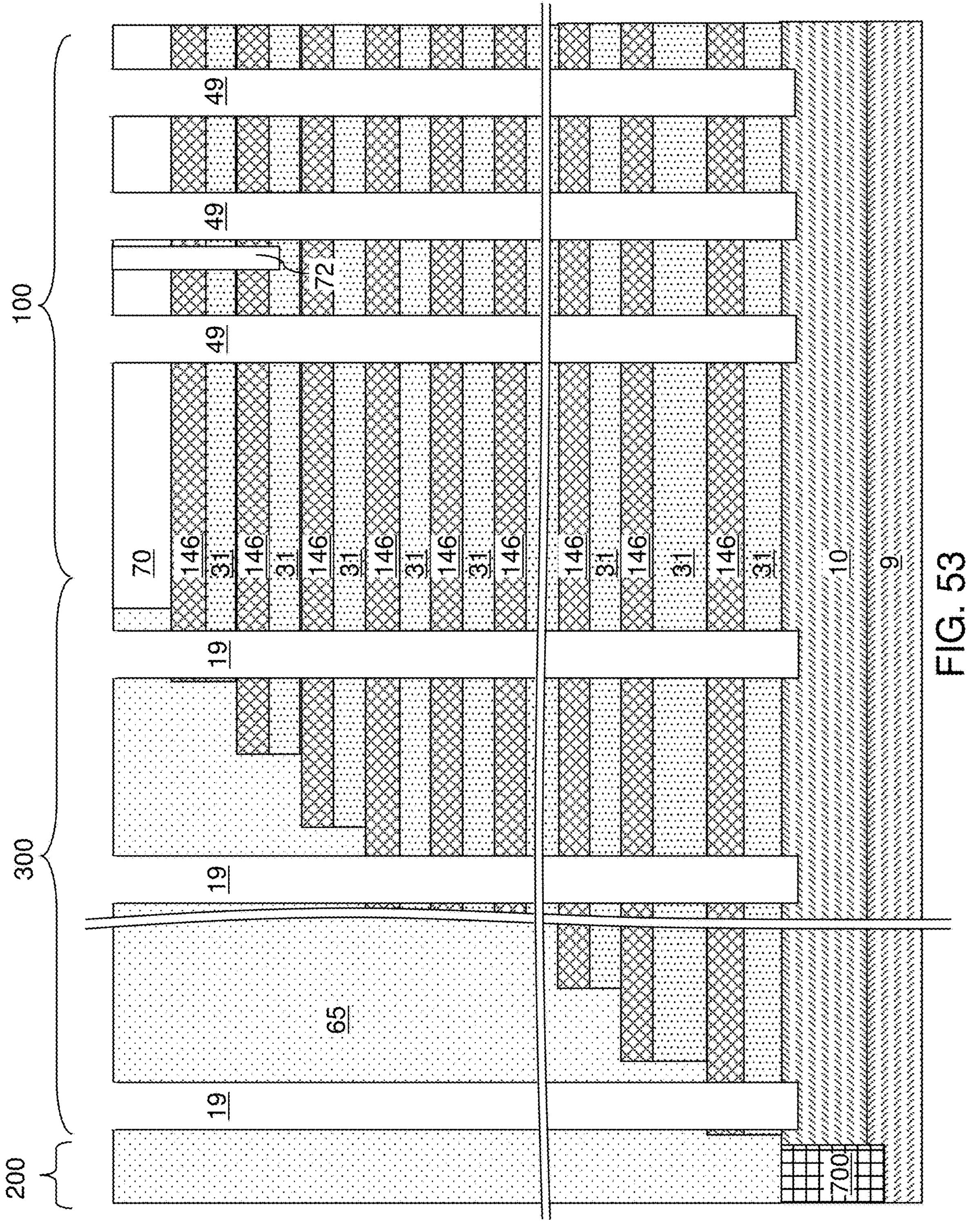
FIG. 53 is a vertical cross-sectional view of the fifth exemplary structure after formation of memory openings and support openings according to the fifth embodiment of the present disclosure.

Referring to FIG. 53, the processing steps of FIGS. 43 and 44A can be performed with any needed changes to the etch chemistry, to form memory openings 49 and the support openings 19. The pattern of the memory openings 49 and the support openings 19 can be the same as in the first and/or fourth exemplary structures. Surface portions of the electrically conductive layers 146 can be converted into metal oxide portions (not expressly shown), as described above with respect to the fourth embodiment.

Figure 54:
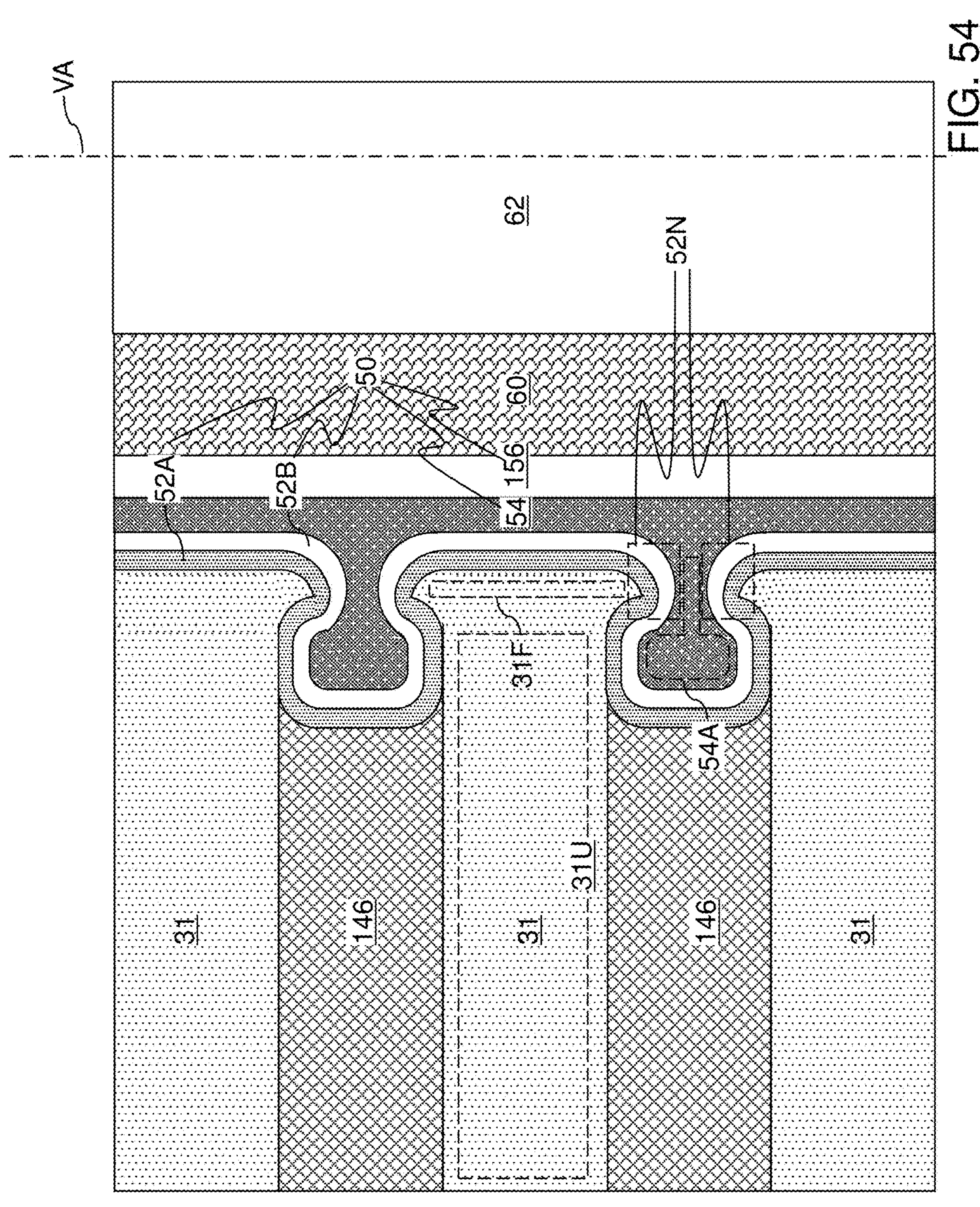
FIG. 54 is a vertical cross-sectional views of a side of a memory opening after formation of a first configuration of a memory opening fill structure according to the fifth embodiment of the present disclosure.

Referring to FIG. 54, the processing steps of FIGS. 44B, 44C, and 44D can be performed to form annular cavities 143, and to form a memory opening fill structure having the first configuration in each memory opening 49. Each memory opening fill structure can include at least one contoured blocking dielectric layer (52A, 52B), a charge storage layer 54, a tunneling dielectric layer 56, a vertical semiconductor channel 60, a dielectric core 62, and a drain region. In one embodiment, each of the spacer material layers (such as the sacrificial material layers 31) comprises: a uniform-thickness region 31U having a uniform thickness throughout, and a flair region 31F having a greater thickness than the uniform thickness and located between the uniform-thickness region 31U and a memory opening 49. In one embodiment, each flair region 31F may have a configuration of a torus.

Figure 55:
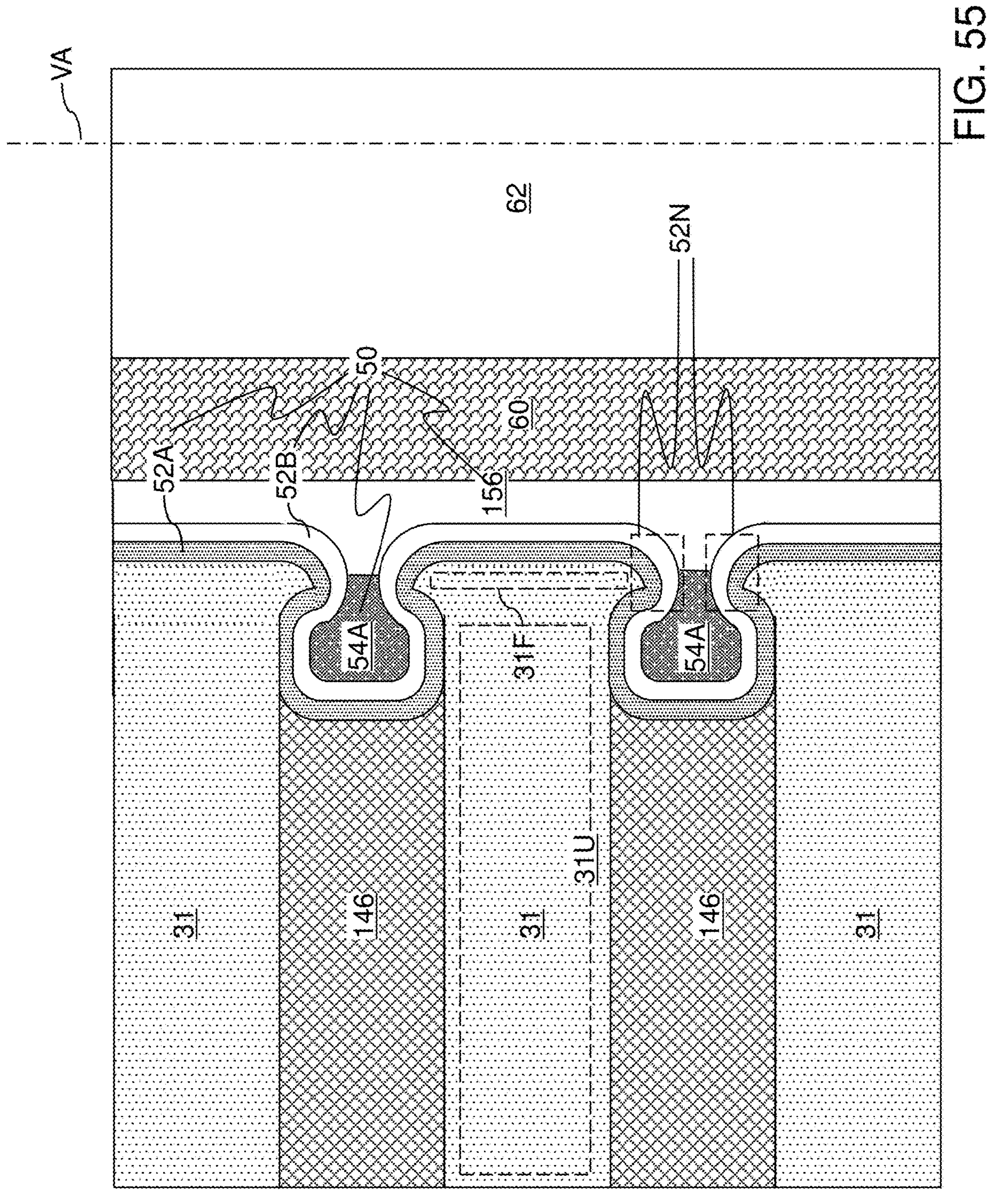
FIG. 55 is a vertical cross-sectional views of a side of a memory opening after formation of a second configuration of a memory opening fill structure according to the fifth embodiment of the present disclosure.

Referring to FIG. 55, the processing steps of FIGS. 45A and 45B may be performed in lieu of the processing steps of FIGS. 44B, 44C, and 44D to form an alternative memory opening fill structure having the second configuration in each memory opening 49.

Figure 56:
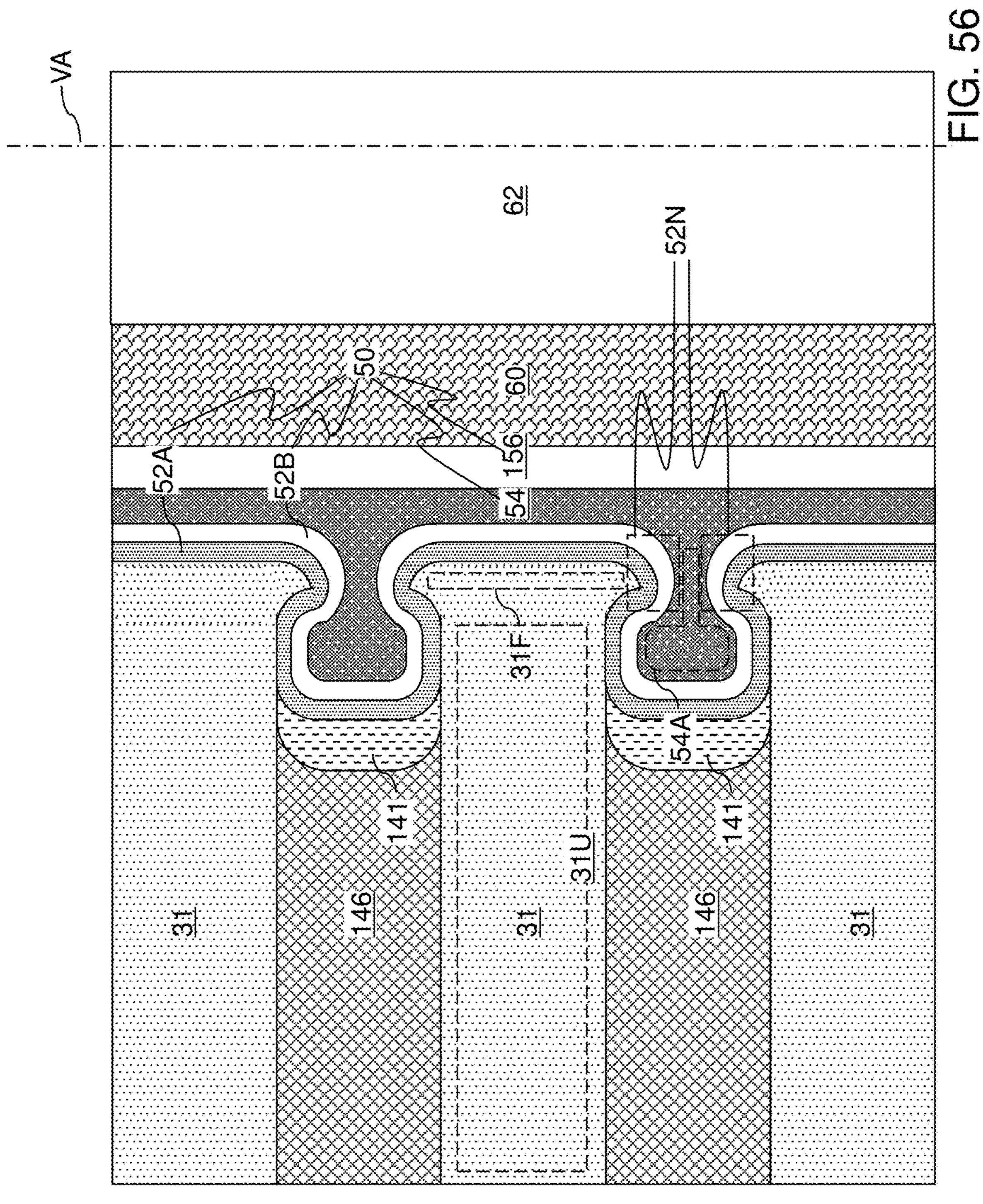
FIG. 56 is a vertical cross-sectional views of a side of a memory opening after formation of a third configuration of a memory opening fill structure according to the fifth embodiment of the present disclosure.

Referring to FIG. 56, the processing steps of FIGS. 46A-46C may be performed in lieu of the processing steps of FIGS. 44B, 44C, and 44D to form an alternative memory opening fill structure having the third configuration in each memory opening 49.

Figure 57:
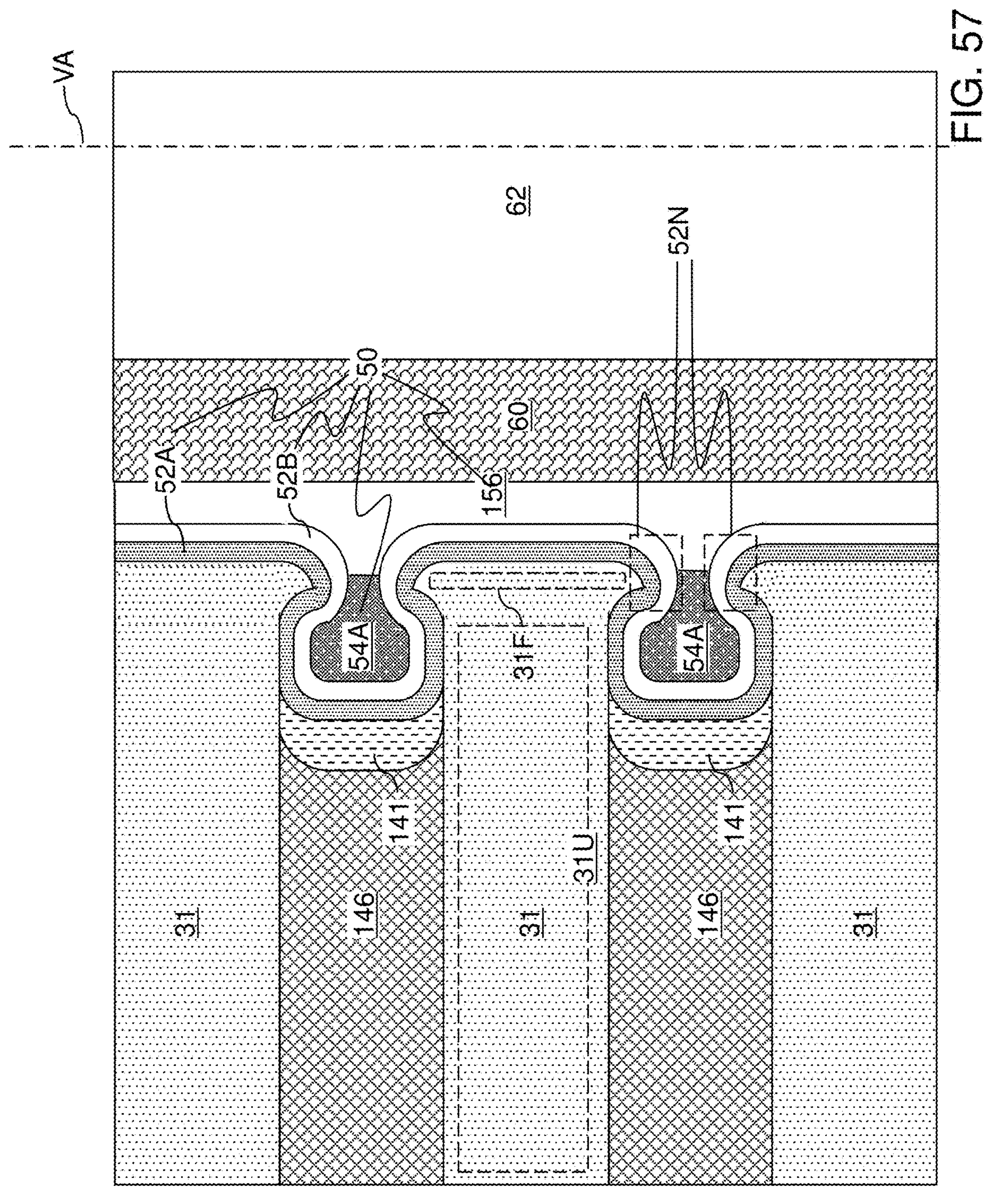
FIG. 57 is a vertical cross-sectional views of a side of a memory opening after formation of a fourth configuration of a memory opening fill structure according to the fifth embodiment of the present disclosure.

Referring to FIG. 57, the processing steps of FIGS. 47A and 47B may be performed in lieu of the processing steps of FIGS. 44B, 44C, and 44D to form another alternative memory opening fill structure having the fourth configuration in each memory opening 49.

Figure 58:
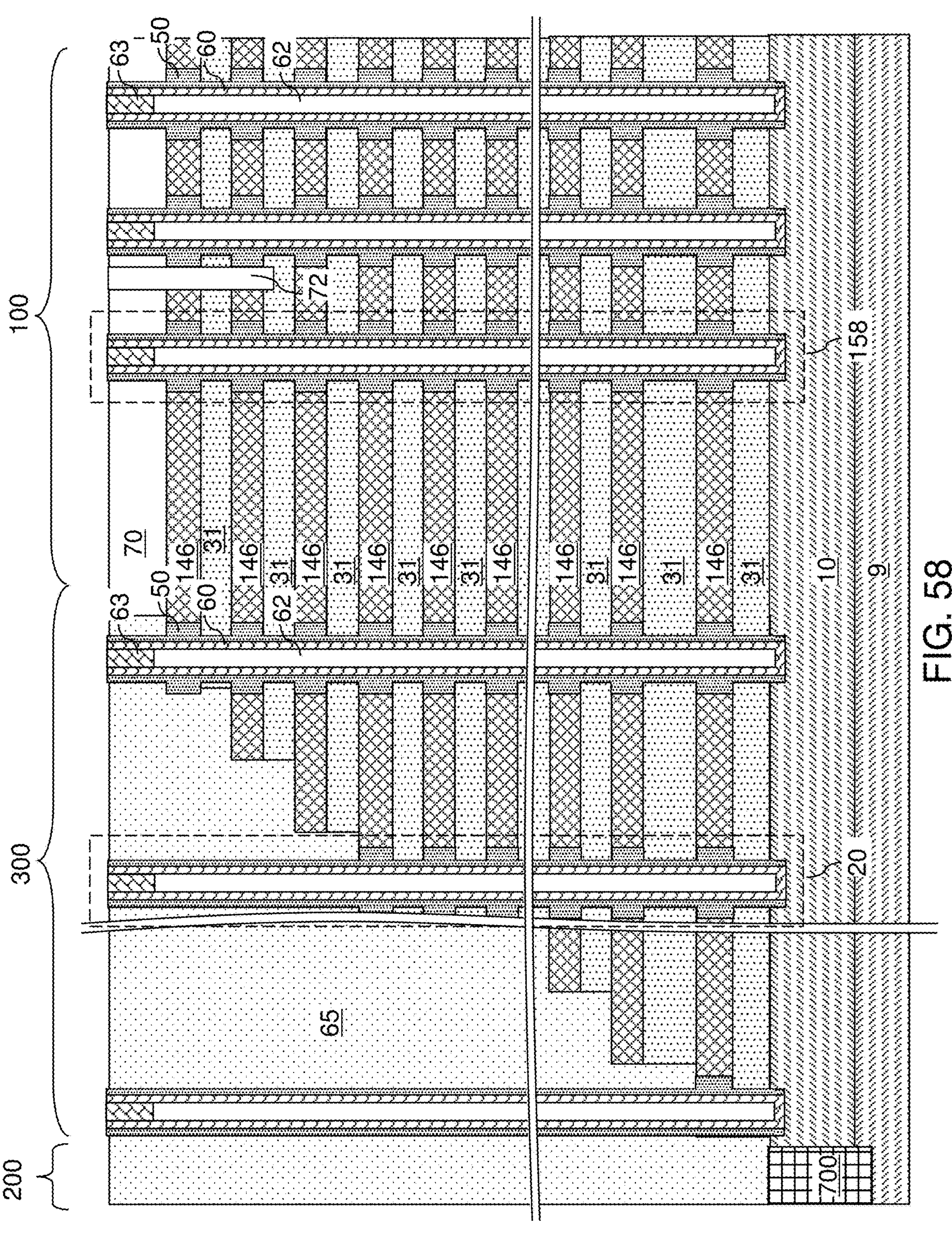
FIG. 58 is a vertical cross-sectional view of the fifth exemplary structure after formation of memory opening fill structures and support pillar structures according to the fifth embodiment of the present disclosure.

Referring to FIG. 58, the fifth exemplary structure is illustrated after formation of memory opening fill structures 158 and support pillar structures 20. The memory opening fill structures 158 and the support pillar structures 20 may have any of the configurations illustrated in FIG. 54, 55, 56, or 57.

Figure 59:
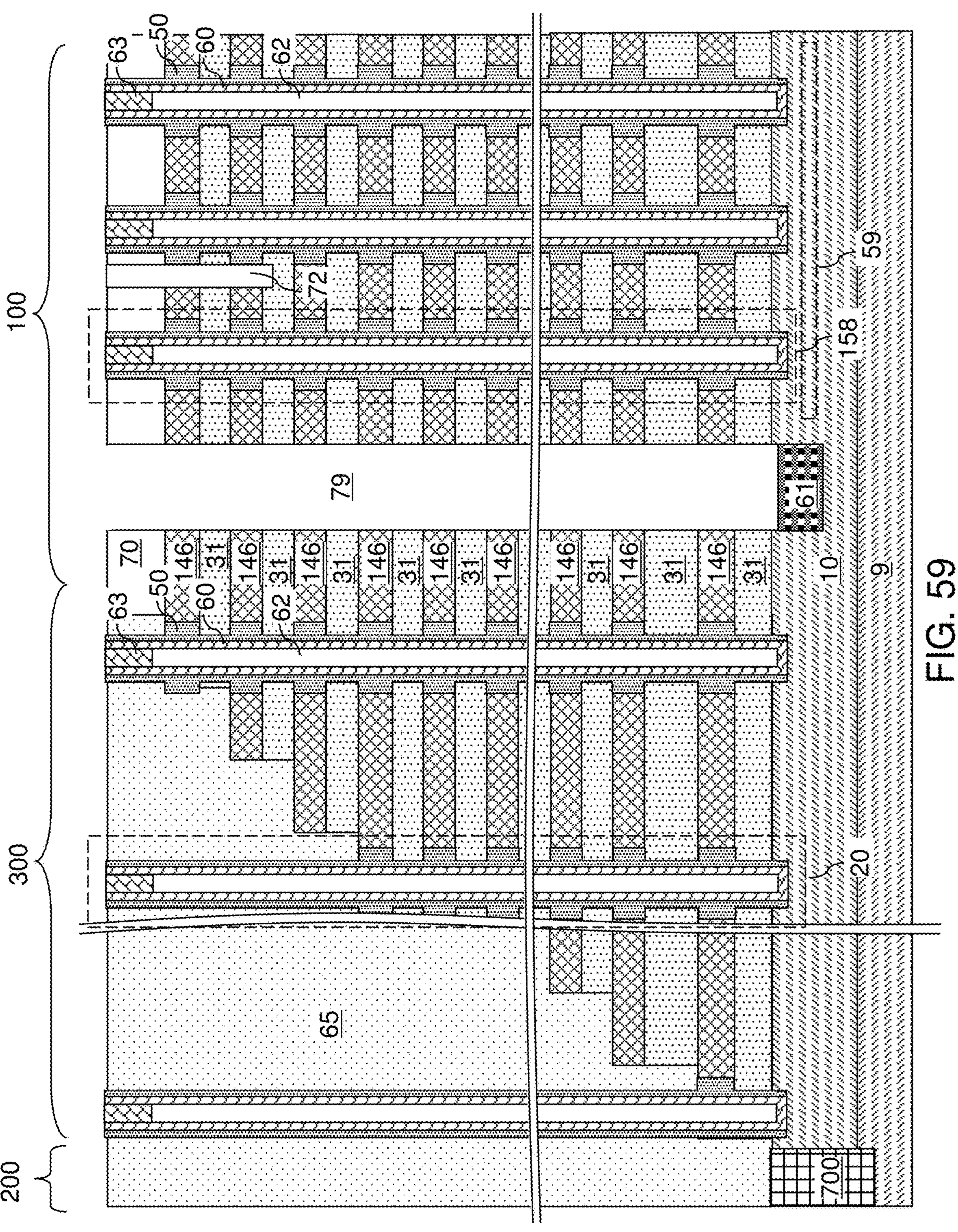
FIG. 59 is a vertical cross-sectional view of the fifth exemplary structure after formation of backside trenches and source regions according to the fifth embodiment of the present disclosure.

Referring to FIG. 59, the processing steps of FIG. 49 can be performed to form backside trenches 79, source regions 61, and horizontal semiconductor channels 59.

Figure 60A:
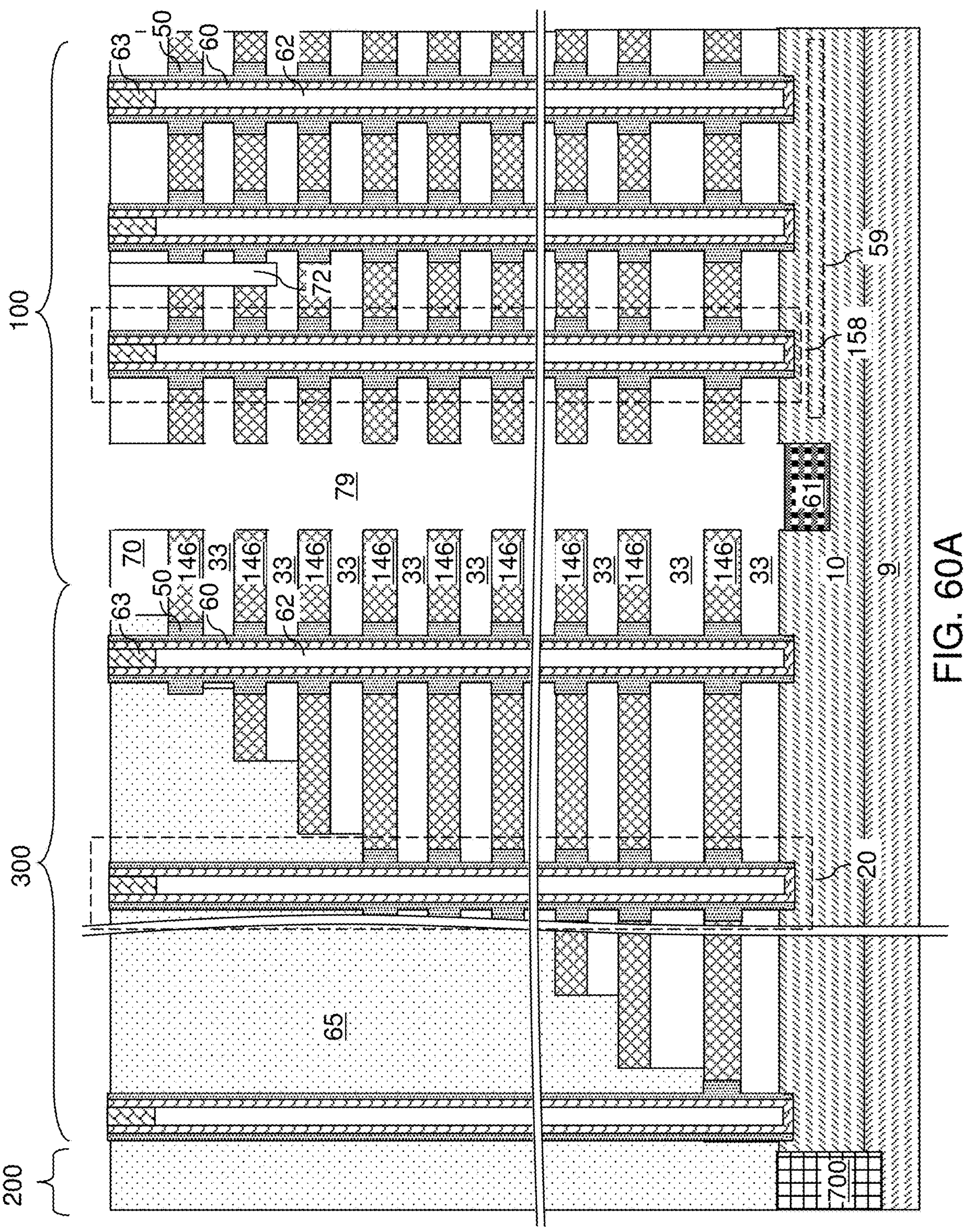
FIG. 60A is a vertical cross-sectional view of the fifth exemplary structure after formation of insulator-level backside recesses according to the fifth embodiment of the present disclosure.
Figure 60B:
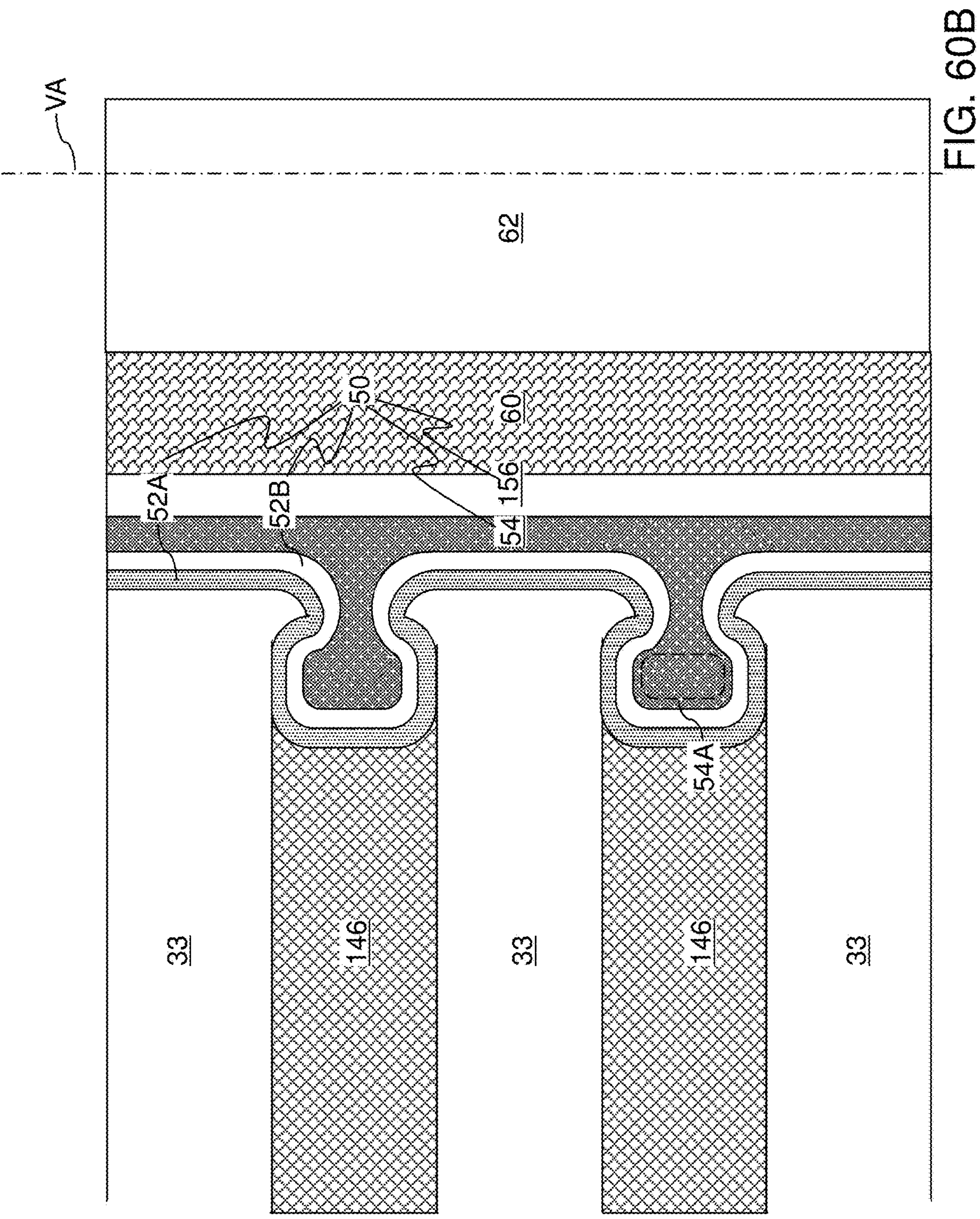
FIG. 60B is a vertical cross-sectional views of a side of a memory opening at the processing steps of FIG. 60A.

Referring to FIGS. 60A and 60B, an isotropic etchant can be performed to etch the material of the sacrificial material layers 31 selective to the material of the electrically conductive layers 146 and the at least one contoured blocking dielectric layer (52A, 52B) (such as the contoured dielectric metal oxide blocking dielectric layer 52A). In one embodiment in which the sacrificial material layers 31 comprise silicon nitride, the isotropic etch process may comprise a wet etch process employing phosphoric acid. Backside recesses, which are herein referred to as insulating-level backside recesses 33, can be formed in volumes from which the sacrificial material layers 31 are etched. Surfaces of the electrically conductive layers 146 and the at least one contoured blocking dielectric layer (52A, 52B) can be physically exposed to each insulating-level backside recess 33.

Figure 61A:
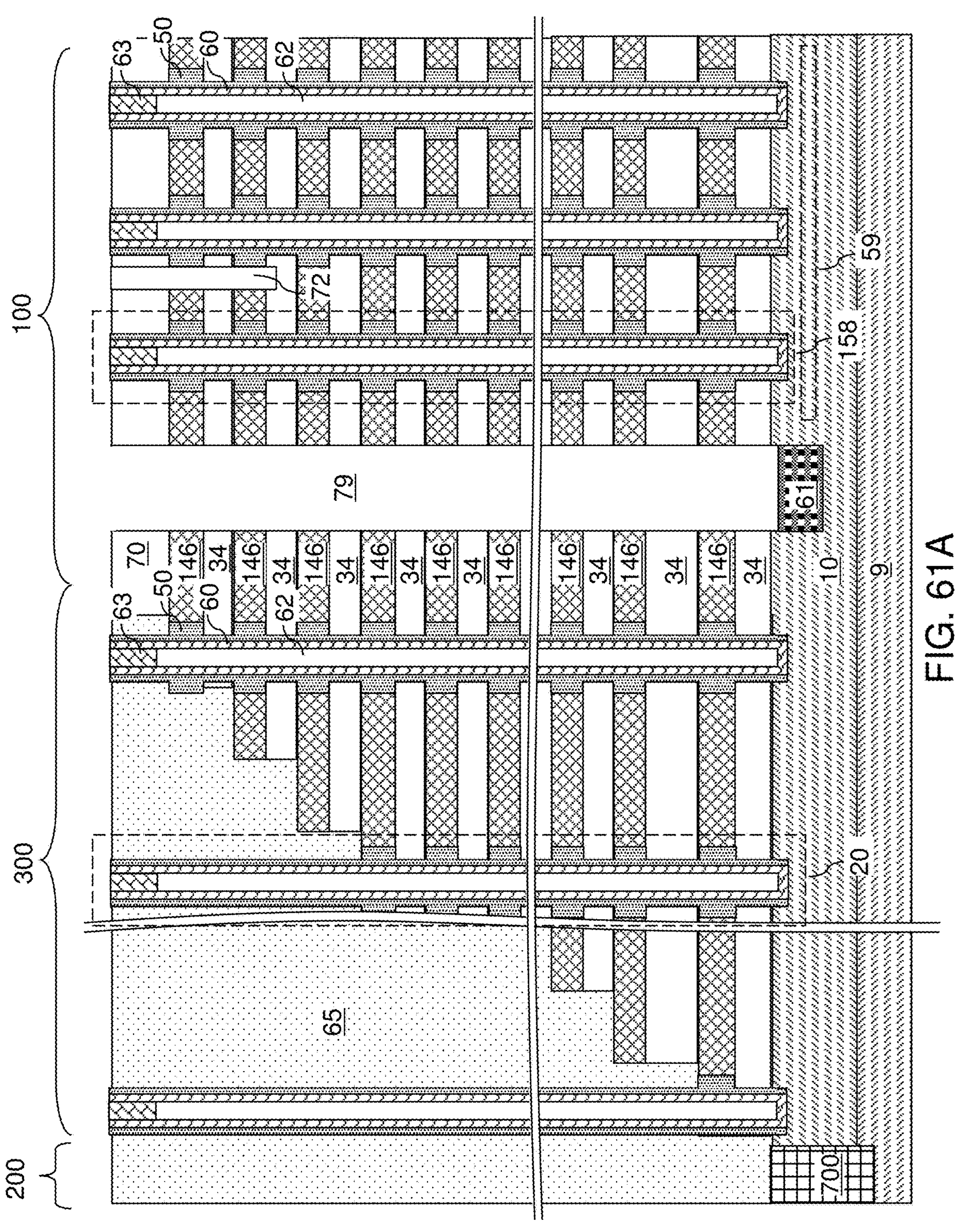
FIG. 61A is a vertical cross-sectional view of the fifth exemplary structure after formation of insulating layers according to the fifth embodiment of the present disclosure.
Figure 61B:
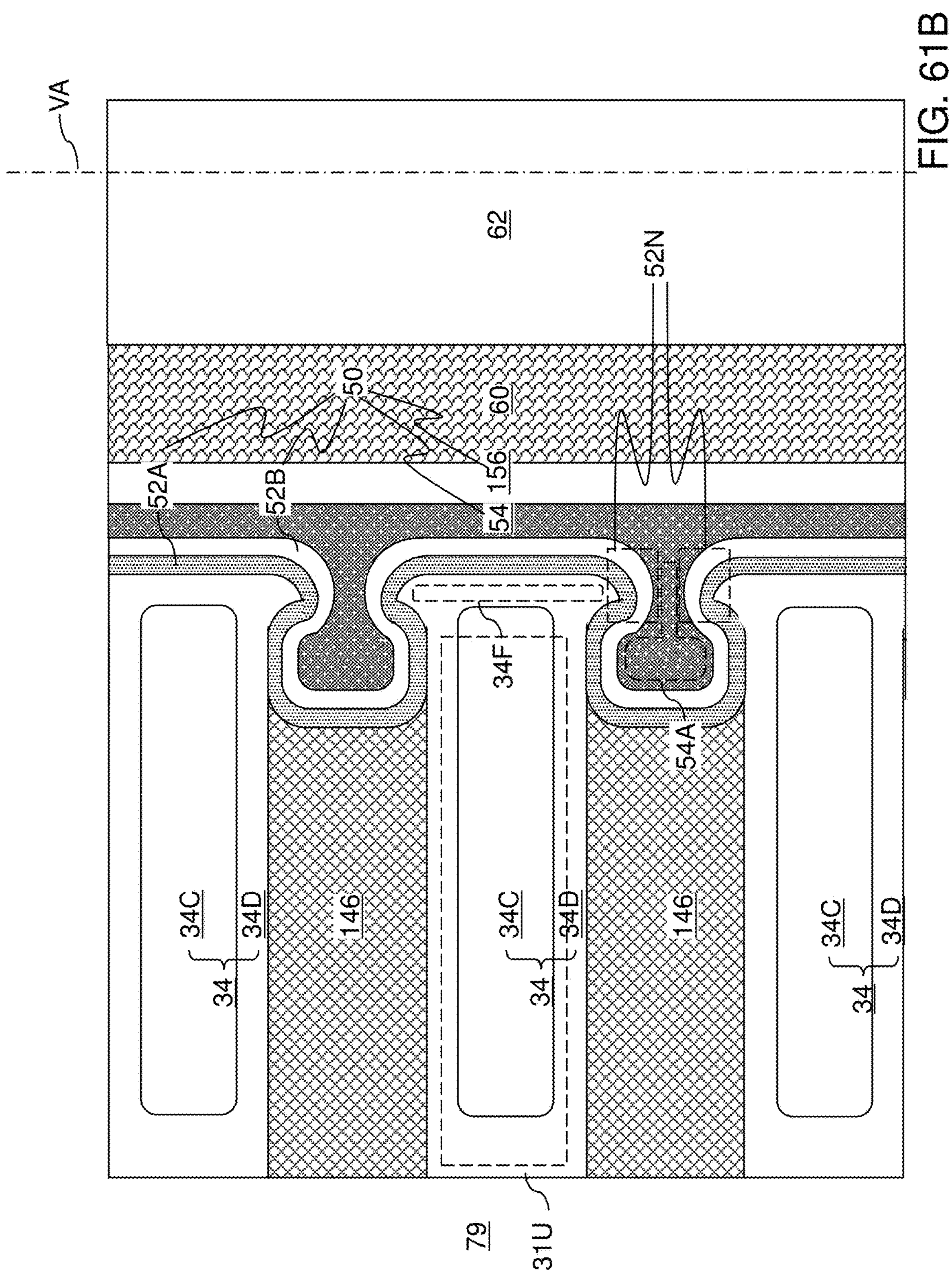
FIGS. 61B-61E are various configurations of a memory fill structure at the processing steps of FIG. 61A according to the fifth embodiment of the present disclosure.
Figure 61C:
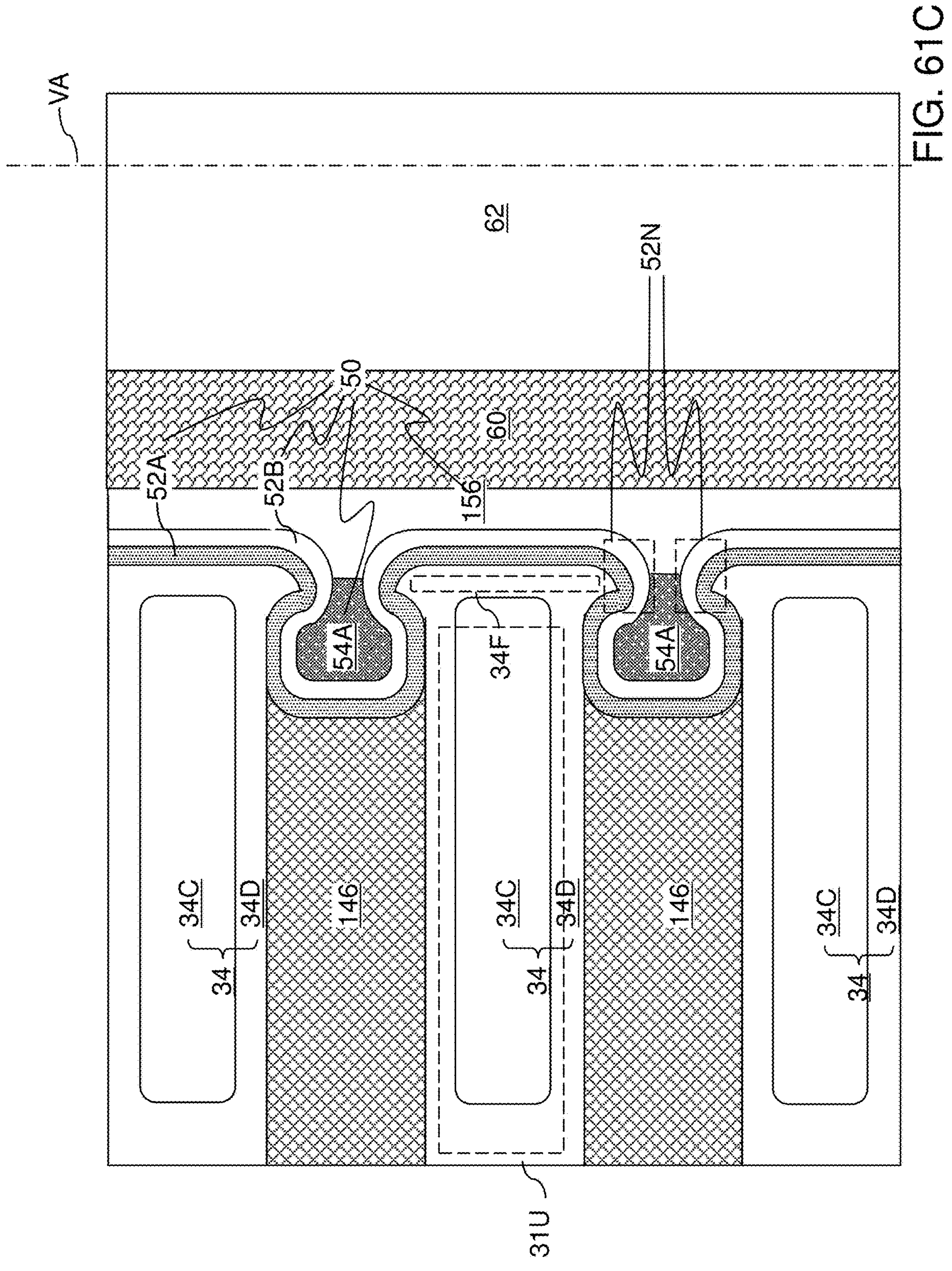
Figure 61D:
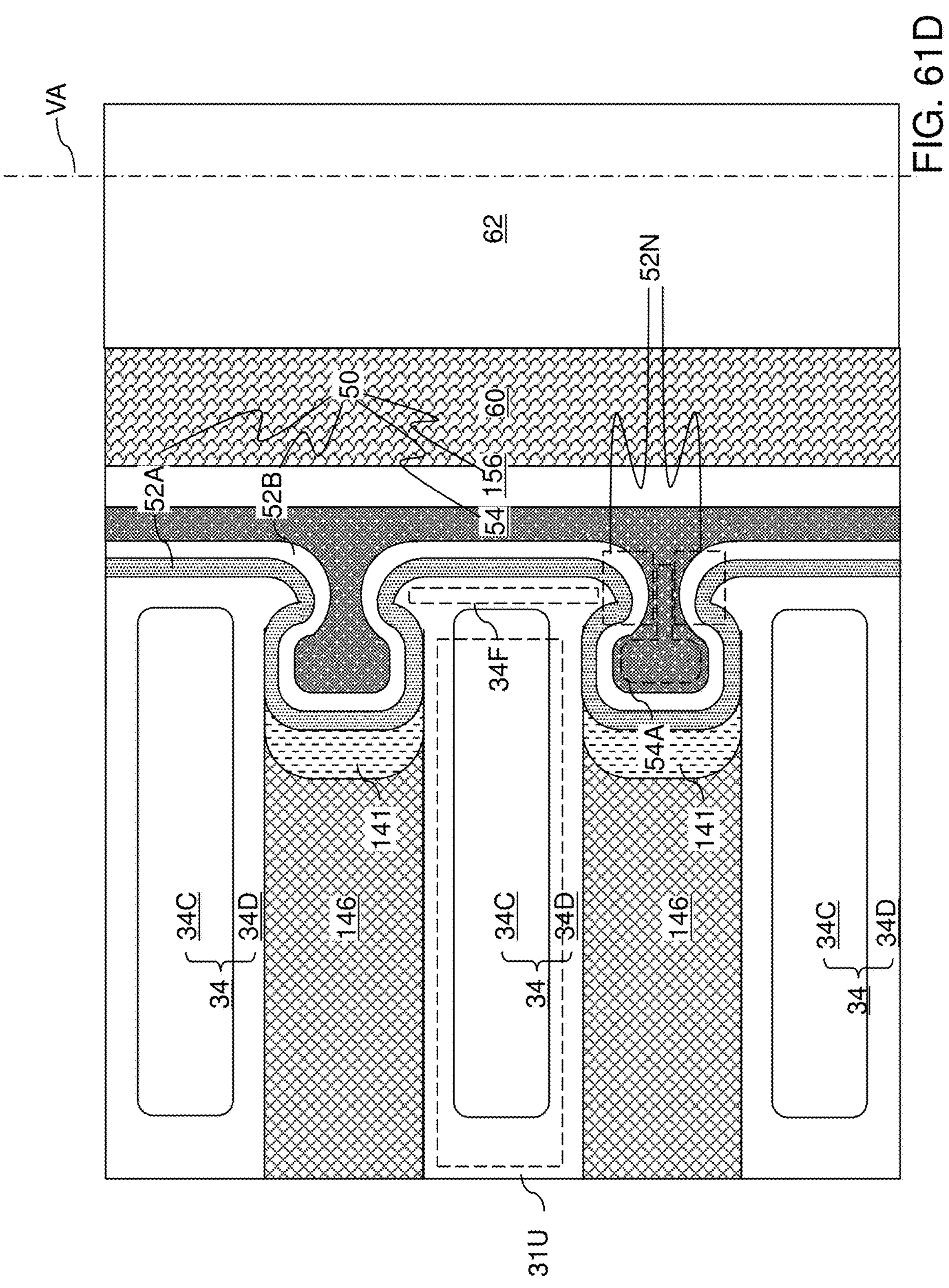
Figure 61E:
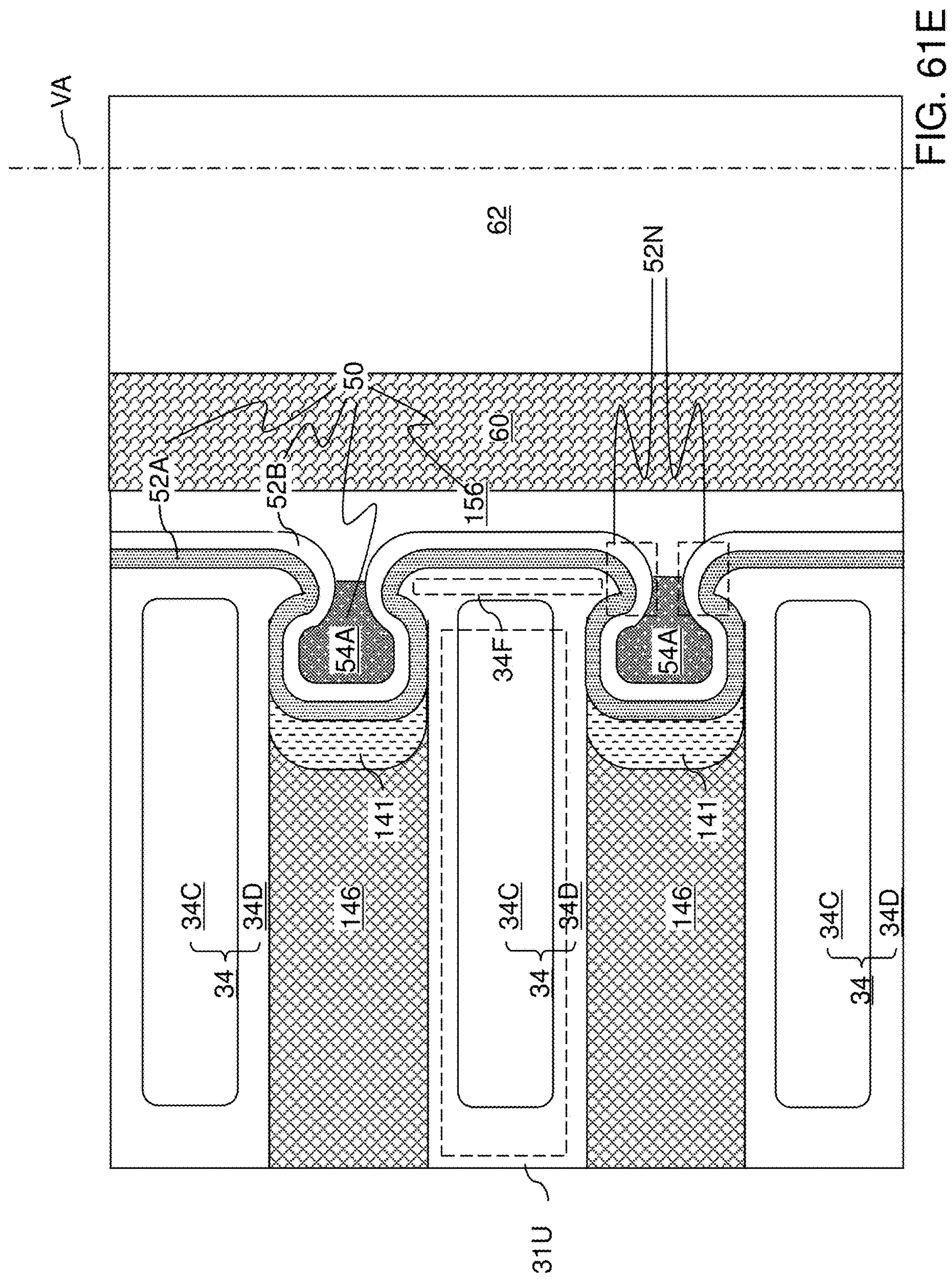

Referring to FIGS. 61A-61E, a dielectric fill material may be anisotropically deposited in the insulating-level backside recesses 33 to form insulating layers 34, which may be cavity-containing insulating layers including a respective cavity (i.e., air gap) 34C and a respective solid-phase dielectric material liner 34D. FIG. 61A is a vertical cross-sectional view of the fifth exemplary structure after formation of insulating layers according to the fifth embodiment of the present disclosure. FIGS. 61B-61E are various configurations of a memory fill structure and air gaps 34C in the insulating layers 34 at the processing steps of FIG. 61A according to the fifth embodiment of the present disclosure.

The cavities 34C may be free of any solid phase material. The solid-phase dielectric material liners 34D includes a solid phase dielectric material, such as undoped silicate glass, a doped silicate glass, or organosilicate glass. A non-conformal deposition process such as a plasma-enhanced chemical vapor deposition process may be employed to deposit the solid-phase dielectric material liners 34D. Portions of the dielectric fill material that are deposited in the backside recesses can be removed, for example, by an anisotropic etch process.

Figure 62:
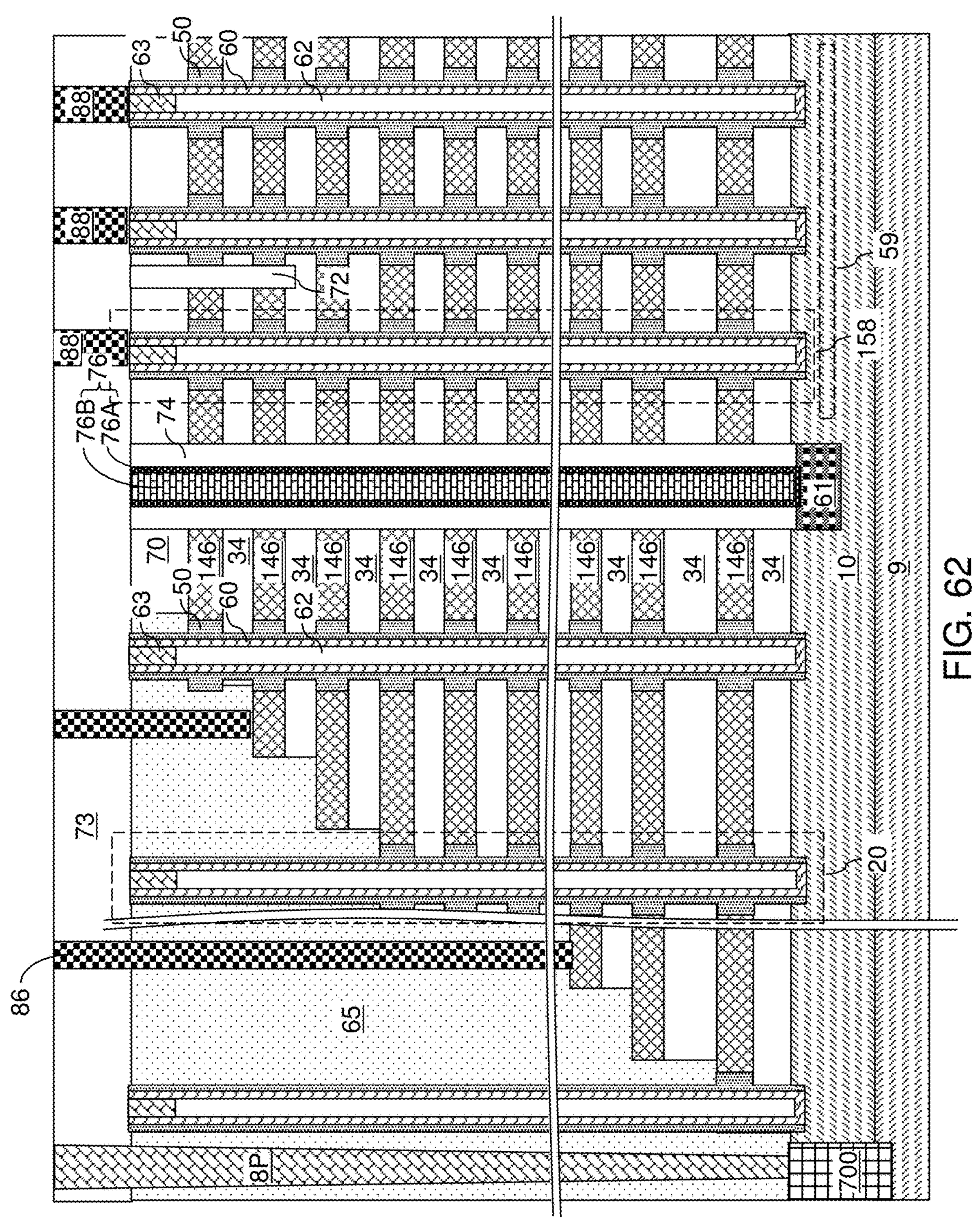
FIG. 62 is a vertical cross-sectional view of the fifth exemplary structure after formation of backside contact via structures according to the fifth embodiment of the present disclosure.

Referring to FIG. 62, the processing steps of FIG. 17 can be performed to form an insulating spacer 74 and a backside contact via structure 76 in each backside trench 79. A contact-level dielectric layer 73 can be formed over the insulating cap layer 70, the retro-stepped dielectric material portion 65, the insulating spacers 74, and the backside contact via structures 76. Subsequently, the processing steps of FIGS. 18A and 18B can be performed to form drain contact via structures 88, word line contact via structures 86, and peripheral device contact via structures 8P.

The fourth and fifth exemplary structures can include a three-dimensional memory device. In one embodiment, the three-dimensional memory device comprises a monolithic three-dimensional NAND memory device. The electrically conductive layers 146 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. The silicon substrate can contain an integrated circuit comprising a driver circuit (comprising a subset of the least one semiconductor device 700) for the memory device located thereon. Alternatively, the driver circuit may be formed on a separate substrate and then bonded to the memory device. The electrically conductive layers 146 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 60), wherein at least one end portion 60 of each of the plurality of semiconductor channels (59, 60) extends substantially perpendicular to a top surface of the substrate (9, 10) and comprising a respective one of the vertical semiconductor channels 60, and a plurality of charge storage elements. Each charge storage element can be located adjacent to a respective one of the plurality of semiconductor channels (59, 60).

Referring to various configurations of the fourth and fifth exemplary structures illustrated in FIGS. 41-62, a memory device is provided, which comprises: an alternating stack of insulating layers (32 or 34) and electrically conductive layers 146 located over a substrate (9, 10); a memory opening 49 vertically extending through the alternating stack {(32 or 34),146}; and a memory opening fill structure 158 located in the memory opening 49 and comprising a vertical semiconductor channel 60 and a memory film 50, wherein the memory film 50 comprises a tunneling dielectric layer 58 located in contact with the vertical semiconductor channel 60, and a vertical stack of charge storage material portions 54A that are vertically spaced apart from each other by lateral protrusion portions (32F or 34F) of a subset of the insulating layers (32 or 34).

In one embodiment, the memory film 50 also includes a contoured blocking dielectric layer (52A, 52B) including sac-shaped lateral protrusions 52S that protrude outward from a vertical axis VA passing through a geometrical center of the memory opening 49 and located at levels of the electrically conductive layers 146. In one embodiment, the vertical stack of charge storage material portions 54A is located between the contoured blocking dielectric layer (52A, 52B) and the tunneling dielectric layer 56 within volumes enclosed by the sac-shaped lateral protrusions 52S.

In one embodiment, the contoured blocking dielectric layer (52A, 52B) comprises: vertically-extending segments 52V in contact with vertical sidewalls of the insulating layers (32 or 34); and neck segments 52N connecting a respective one of the sac-shaped segments 52S to a respective pair of vertically-extending segments 52V of the vertically extending segments. The sac-shaped segments 52S are in contact with a respective overlying insulating layer and a respective underlying insulating layer of the insulating layers (32 or 34)

In one embodiment, each of the charge storage material portions 54A comprises: a toroidal central portion 54C recessed outward from a vertical interface between the insulating layers (32 or 34) and the memory opening 49; and an annular neck portion 54N adjoined to the toroidal central portion 54C, more proximal to the tunneling dielectric layer 56 than the toroidal central portion is to the tunneling dielectric layer 56, and having a lesser vertical extent than the toroidal central portion.

In one embodiment, each of the insulating layers (32, 34) comprises: a uniform-thickness region (32U or 34U) having a uniform thickness throughout; and one of the lateral protrusion portions which comprises a flair region (32F or 34F) having a greater thickness than the uniform thickness and located between the uniform-thickness region (32U or 34U) and the memory film 50. In one embodiment, the flair region (32F or 34F) contacts the memory film 50 at a contact surface that includes: a vertically-extending cylindrical surface segment; an upper concave annular surface segment; and a lower concave annular surface segment.

In one embodiment, each of the electrically conductive layers 146 has a uniform material composition throughout; and each of the electrically conductive layers 146 comprises an upper horizontal surface contacting a respective overlying insulating layer (32 or 34) and a lower horizontal surface contacting a respective underlying insulating layer (32 or 34).

In one embodiment, the electrically conductive layers 146 consist essentially of an elemental metal selected from Mo, W, Ru, Co, or Nb. In one embodiment, each of the electrically conductive layers 146 comprises a vertically concave surface segment in contact with the memory film 50.

In one embodiment, each of the electrically conductive layers 146 is laterally spaced from the memory film 50 by a respective annular crescent-shaped metal oxide material portion 141 consisting essentially of an oxide of an elemental metal contained within the electrically conductive layers 146.

In one embodiment, the vertical stack of charge storage material portions 54A comprises a vertical stack of discrete charge storage material portions 54A; and each discrete charge storage material portion within the vertical stack of discrete charge storage material portions 54A has a respective vertical extent that is not greater than a vertical thickness of an electrically conductive layer 146 located at a same level.

In one embodiment, the memory film 50 further comprising a charge storage layer 54. The charge storage layer 54 comprises a vertically-extending cylindrical portion 54V that continuously extends vertically through the electrically conductive layers 146, and the vertical stack of charge storage material portions 54A which is adjoined to the vertically-extending cylindrical portion 54V at the neck regions 54N of the charge storage material portions 54A.

In one embodiment, the insulating layers 32 have a same dielectric material composition throughout and are free of any seam or any cavity. In another embodiment, the insulating layers 34 comprise a respective horizontally-extending seam or a respective cavity 34C therein.

The various structures and methods of the present disclosure may be employed to provide a vertical stack of memory elements, such as a vertical stack of charge storage material portions, that do not contact one another, or having reduced contact area compared to prior art devices. The increase in the electrical isolation among the charge storage material portions within a memory opening fill structure decreases electrical coupling and/or charge diffusion between neighboring pairs of charge storage material portions (i.e., decreases leakage current), and enhances device performance, by enhancing data retention by decreasing interference from neighboring cells and decreasing program disturb related failures. Partially discrete charge storage regions do not require any sideways etching and simplify the process. Electrical isolation between charge storage regions is provided by structure geometry. Fully discrete charge storage regions provide isolation through both geometry and etch removal of the charge storage layer between memory cells. The reentrant structure for at least part of the memory film layers provides a greater distance between vertically adjacent memory cells, further reducing neighboring word line interference. Furthermore, the contoured shape of the blocking dielectric layer provides a larger contact area between the word lines and the blocking dielectric, which provides improved coupling leading to more efficient programming and greater program window.

FIGS. 63A-63G are sequential vertical cross-sectional views of a region around a memory opening 49 during formation of a memory opening fill structure 58 in a sixth exemplary structure according to a sixth embodiment of the present disclosure.

Referring to FIG. 63A, a memory opening 49 is illustrated at a processing step that corresponds to the processing step illustrated in FIGS. 4A and 4B. Generally, an alternating stack (32, 42) of insulating layers 32 and sacrificial material layers 42 can be formed over a substrate (9, 10), and the arrays of memory openings 49 can be formed through the alternating stack (32, 42). The memory opening 49 illustrated in FIG. 63A is one of such memory openings 49. A geometrical center GC of the memory opening 49 is a location of the center of gravity of a hypothetical object having the same volume as the memory opening 49 and having a uniform density throughout. A vertical axis VA passes through the geometrical center GC of the memory opening 49. In one embodiment, the volume of the memory opening 49 can be laterally enclosed by a cylindrical vertical plane CVP that extends vertically with a curvature in a plan view such that the cylindrical vertical plane CVP contains the entirety of the sidewalls of the insulating layers 32 and the sacrificial material layers 42 around the memory opening 49.

Referring to FIG. 63B, a vertical stack of tubular insulating spacers 252A can be formed on physically exposed surfaces of the insulating layers 32 around the memory opening 49. For example, the vertical stack of tubular insulating spacers 252A can be formed by performing a selective deposition process in which an insulating material grows from the physically exposed surfaces of the insulating layers 32 while growth of the insulating material from physically exposed surfaces of the sacrificial material layers 42 is suppressed. A selective deposition process refers to a deposition process in which a deposited material grows only from a first type of surfaces while growth of the material from a second type of surfaces is a suppressed. The differences in the growth mode of the material can result from different nucleation delays for the atoms of the deposited material on the different types of surfaces. The precursor gas employed for the selective deposition process can be chosen such that the nucleation delay time, which is also referred to as the incubation time, is a significantly shorter for the surfaces of the insulating layers 32 than for the surfaces of the sacrificial material layers 42.

In one embodiment, a self-aligned monolayer (SAM) of organic nucleation promoter molecules may be selectively deposited on physically exposed surfaces of the insulating layers 32 around the memory opening 49. The nucleation rate of the material of the tubular insulating spacers 252A is enhanced on the surface of the SAM relative to the uncovered surfaces of the sacrificial material layers 42 which are physically exposed around the memory opening 49.

In another embodiment, a SAM of organic nucleation inhibitor molecules may be selectively deposited on physically exposed surfaces of the sacrificial material layers 42 around the memory opening 49. The nucleation rate of the material of the tubular insulating spacers 252A is decreased on the surface of the SAM relative to the uncovered surfaces of the insulating layers 32 which are physically exposed around the memory opening 49.

In an illustrative example, the insulating layers 32 comprise a first silicon oxide material, and the sacrificial material layers 42 comprise silicon nitride. In this case, a silicon oxide selective deposition process can be performed to form tubular insulating spacers 252A comprising a second silicon oxide material. Generally, the second silicon oxide material of the tubular insulating spacers 252B may or may not have the same silicon to oxygen ratio and/or may or may not have the same dopant content as the first silicon oxide material of the insulating layers 32. For example, the insulating layers 32 may comprise undoped silicate glass or a doped silicate glass containing carbon atoms at a first residual carbon atomic concentration (which may be in a range from 0.1 parts per million to 30 parts per million) and containing hydrogen atoms at a first residual hydrogen atomic concentration (which may be in a range from 0.1 parts per million to 30 parts per million). The second silicon oxide material of the tubular insulating spacers 252B may comprise undoped silicate glass or a doped silicate glass containing carbon atoms at a second residual carbon atomic concentration (which may be in a range from 0.1 parts per million to 30 parts per million) and containing hydrogen atoms at a second residual hydrogen atomic concentration (which may be in a range from 0.1 parts per million to 30 parts per million). Generally, the second residual carbon atomic concentration can be different from the first residual carbon atomic concentration, and the second residual hydrogen atomic concentration can be different from the first residual hydrogen atomic concentration. Further, if one of the first silicon oxide material and the second silicon oxide material comprises a doped silicate glass including a dopant element (such as B, P, or As), then the other of the first silicon oxide material and the second silicon oxide material may or may not comprise the dopant element.

In one embodiment, the selective deposition process that forms the vertical stack of tubular insulating spacers 252A may comprises an atomic layer deposition (ALD) process, which may be a single atomic layer deposition process or a plurality of atomic layer deposition processes. In case a plurality of atomic layer deposition processes are employed, an etch back process may be performed between each temporally neighboring pair of atomic layer deposition processes. Such an etch back process may comprise an atomic layer etching (ALE) process known in the art, or may comprise an isotropic etch processes such as a wet etch process. For example, a vapor phase hydrofluoric acid etch process or a wet etch process employing dilute hydrofluoric acid may be employed as an etch back process to remove any nucleated silicon oxide material (typically in discrete nucleation islands) on the physically exposed surfaces of the sacrificial material layers 42 to uncover the physically exposed surfaces of the sacrificial material layers 42, and to increase the selectivity of a subsequent selective silicon oxide deposition process. In one embodiment, the selective deposition process comprises at least one atomic etch process that is temporally alternates with the plurality of atomic layer deposition processes.

Generally, at least one etch back process may be employed to periodically increase the selectivity of the area selective deposition process to deposit the tubular insulating spacers 252A having a thickness greater than 2 nm. An exemplary atomic layer etching process that may be used as the etch back process is described in Gasvoda et al., *Gas phase surface functionalization of SiN, with benzaldehyde to increase SiO2 to* $SiN_x$ *etch selectivity in atomic layer etching*, Journal of Vacuum Science & Technology A: Vacuum, Surfaces, and Films 39.4 (2021): 040401, the entire content of which is incorporated herein by reference. Alternatively, a hydrofluoric acid-based etch process may be used as an etch back process, such as the process described in Watanabe et al., *High selectivity* ($SiN/SiO_2$) *etching using an organic solution containing anhydrous HF*, Microelectronic Engineering 86.11 (2009): 2161 2164, the entire content of which is incorporated herein by reference.

In case an atomic layer deposition process is employed to deposit a silicon oxide material for the tubular insulating spacers 252A, a nucleation layer of silicon oxide may be formed on a silicon nitride surface after 50 cycles of the atomic layer deposition. Typically, a silicon oxide material having a thickness of about 2.5 nm is deposited on silicon oxide surfaces after 50 cycles. Thus, by performing an etch back process that removes a surface layer of silicon oxide (e.g., about 0.25 nm), uncovered surfaces of the material of the sacrificial material layers 42 can be physically exposed, and the next cycle of the atomic layer deposition process can be performed with high selectivity. In other words, the initial selectivity of the selective deposition process can be restored by periodically performing an etch back process that removes collaterally deposited nucleation islands of the deposited silicon oxide material on the surfaces of the sacrificial material layers 42.

Generally, the lateral thickness of the tubular insulating spacers 252A is less than 50%, and preferably less than 25%, of the vertical thickness of the sacrificial material layers 42. In one embodiment, the sacrificial material layers 42 may have the same or substantially the same vertical thickness, and a lateral thickness of the tubular insulating spacers 252A may be in a range from 3% to 45%, such as from 5% to 30%, and/or from 10% to 30%, of the vertical thickness of the sacrificial material layers 42. In an illustrative example, the lateral thickness of the tubular insulating spacers 252A may be in a range from 1 nm to 6 nm, such as from 2 nm to 4 nm, although lesser and greater lateral thicknesses may also be employed.

Each of the tubular insulating spacers 252A may have a contoured inner sidewall and a straight outer sidewall which is a cylindrical outer sidewall. The straight outer sidewall of each tubular insulating spacer 252A may contact the entirety of a cylindrical sidewall of an insulating layer 32 and a pair of a cylindrical surface segments of the sacrificial material layers 42. In one embodiment, each tubular insulating spacer 252A within the vertical stack of tubular insulating spacers 252A may have a respective contoured inner sidewall. The respective contoured inner sidewall can comprises a cylindrical (i.e., vertically straight) inner sidewall segment 52CS that extends along a vertical direction; a lower annular convex surface segment 52LS adjoined to a bottom periphery of the cylindrical inner sidewall segment 52CS and having a first curvature C1 that is the same as a distance from a bottom periphery of a cylindrical sidewall of a respective insulating layer 32; and an upper annular convex surface segment 52US adjoined to a top periphery of the cylindrical inner sidewall segment 52CS and having a second curvature C2 that is the same as a distance from a top periphery of the cylindrical sidewall of the respective insulating layer 32. The first curvature C1 and the second curvature C2 can be the same as the lateral thickness of the tubular insulating spacers 252A.

In one embodiment, the entirety of the lower annular convex surface segments 52LS and the upper annular convex surface segments 52US of the vertical stack of tubular insulating spacers 252A can be located inside the cylindrical vertical plane CVP, which is a vertically-extending cylindrical plane including sidewalls of the insulating layers 32 around the memory opening 49. In one embodiment, an entirety of the vertical stack of tubular insulating spacers 252A is located inside the cylindrical vertical plane CVP.

Referring to FIG. 63C, a blocking dielectric layer 252B can be conformally deposited on physically exposed surfaces of the vertical stack of tubular insulating spacers 252A and the sacrificial material layers 42. The blocking dielectric layer 252B can include a single dielectric material layer or a stack of a plurality of dielectric material layers. In one embodiment, the blocking dielectric layer can include a silicon oxide layer consisting essentially of silicon dioxide. For example, the blocking dielectric layer 252B can include undoped silicate glass formed by thermal decomposition of tetraethyl orthosilicate (TEOS) in a low pressure chemical vapor deposition (LPCVD) process.

Alternatively or additionally, the blocking dielectric layer 252B may comprise a dielectric metal oxide layer consisting essentially of a dielectric metal oxide. In one embodiment, the blocking dielectric layer 252B can include a dielectric metal oxide, such as aluminum oxide, having a dielectric constant greater than 7.9, i.e., having a dielectric constant greater than the dielectric constant of silicon nitride.

The thickness of the as deposited blocking dielectric layer 252B may be in a range from 4 nm to 30 nm, such as from 6 nm to 15 nm, although lesser and greater thicknesses may also be employed.

The blocking dielectric layer 252B contacts and is laterally surrounded by the vertical stack of tubular insulating spacers 252A. The blocking dielectric layer 252B has a laterally-undulating vertical cross-sectional profile in which portions of the blocking dielectric layer 252B located at levels of the sacrificial material layers 42 laterally protrude outward from a vertical axis VA passing through a geometrical center GC of the memory opening 49 relative to portions of the blocking dielectric layer 252B located at levels of the insulating layers 32.

Referring to FIG. 63D, in case the thickness of the blocking dielectric layer 252B is greater than a target thickness for the blocking dielectric layer 252B to be incorporated into a three-dimensional memory device, an isotropic or anisotropic etch back process may be performed to thin the blocking dielectric layer 252B. In one embodiment, an isotropic etch process (such as a wet etch process employing dilute hydrofluoric acid) may be performed to thin the blocking dielectric layer 252B. The final thickness of the blocking dielectric layer 252B may be in a range from 2 to 20 nm, such as from 4 nm to 10 nm, although lesser and greater thicknesses may also be employed. The thinning of the blocking dielectric layer 252B may be advantageously employed to reduce the effect of any sharp corner in the memory opening 49 as provided in the processing steps of FIG. 63A particularly if the alternating stack (32, 42) is formed as a multi-tier structure.

Referring to FIG. 63E, an in-process memory material layer 254' may be deposited in the memory opening 49 by performing a conformal deposition process. In one embodiment, a lateral thickness of the in-process memory material layer 254 at levels of the insulating layers 32 can be greater than one half of the height of a physically exposed recessed cylindrical surface segment of blocking dielectric layer 252B located at a level of a sacrificial material layer 42. In this case, the effect of lateral undulation of the physically exposed surface of the blocking dielectric layer 252B can be eliminated or substantially reduced as contoured growth surface segments of the in-process memory material layer 254' merge during the deposition process. Thus, the inner sidewall of the in-process memory material layer 254' may be a cylindrical planar surface (i.e., a straight vertical surface) without any lateral undulation in the vertical cross-sectional profile.

Generally, the in-process memory material layer 254' may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the in-process memory material layer 254' comprises a charge trapping material, such as silicon nitride. The in-process memory material layer 254' can be formed, for example, by chemical vapor deposition (CVD), atomic layer deposition (ALD), or any suitable conformal deposition process. The thickness of the in-process memory material layer 254' can be in a range from 10 nm to 30 nm, although lesser and greater thicknesses can also be employed. The inner sidewall of the in-process memory material layer 254' may be a straight cylindrical surface.

Referring to FIG. 63F, inner portions of the in-process memory material layer 254' can be etched by performing an etch back process. The etch back process may comprise an anisotropic etch process such as reactive ion etch process. The duration of the etch back process may be selected such that the in-process memory material layer 254' is thinned to a desired thickness, such that the in-process memory material layer 254' becomes a memory material layer 254. The memory material layer 254 contains an inner continuous portion 254C which extends through the entire alternating stack (32, 42), and a plurality of outer laterally-protruding memory material portions 254P which protrude outwards from the inner continuous portion 254C at levels of the sacrificial material layers 42. The outer laterally-protruding memory material portions 254P comprise discrete portions which are vertically separated from each other and which contact the inner continuous portion 254C.

The lateral thickness of the thinner portions of the memory material layer 254 (i.e., the inner continuous portion 254C) located at levels of the insulating layers 32, may be in a range from 1 nm to 6 nm, such as from 2 nm to 4 nm, although lesser and greater thicknesses may also be employed. The lateral thickness of the thicker portions of the memory material layer 254 (i.e., the sum of the inner continuous portion 254C and the respective outer laterally-protruding memory material portions 254P) located at level of the respective sacrificial material layer 42 may be in a range from 6 nm to 30 nm, such as from 8 nm to 20 nm.

In one embodiment, a laterally-recessed inner surface of the in-process memory material layer 254' becomes straight inner cylindrical sidewall of the memory material layer 254. Thus, the memory material layer 254 is located over the vertical stack of tubular insulating spacers 252A (and optionally the blocking dielectric layer 252B) and has a straight inner cylindrical sidewall (i.e., sidewall of portion 254C) that vertically extends through the alternating stack (32, 42) without lateral undulation, and a laterally-undulating outer sidewall (i.e., sidewalls of alternating portions 254C and 254P) having outward lateral protrusions at levels of the sacrificial material layers 42. In one embodiment, the laterally-undulating outer sidewall of the memory material layer 254 comprises cylindrical surface segments CSS of portions 254C located at levels of the insulating layers 32; annular concave surface segments ACSS adjoined to an upper periphery of a lower periphery of a respective one of the cylindrical surface segments CSS; and connecting surface segments NSS of portions 254P that connect a respective vertically-neighboring pair of annular concave surface segments ACSS and located at levels of the sacrificial material layers 42.

In one embodiment, the cylindrical surface segments CSS are located inside a volume that is laterally enclosed by a cylindrical vertical plane CVP including sidewalls of the insulating layers 32 that laterally surround the memory opening 49. In one embodiment, the connecting surface segments NSS are located entirely within the volume that is laterally enclosed by, and is bounded by, the cylindrical vertical plane CVP. In one embodiment, the connecting surface segments NSS are straight surface segments that extend along a vertical direction and are located outside the plane CVP.

Figure 63G:
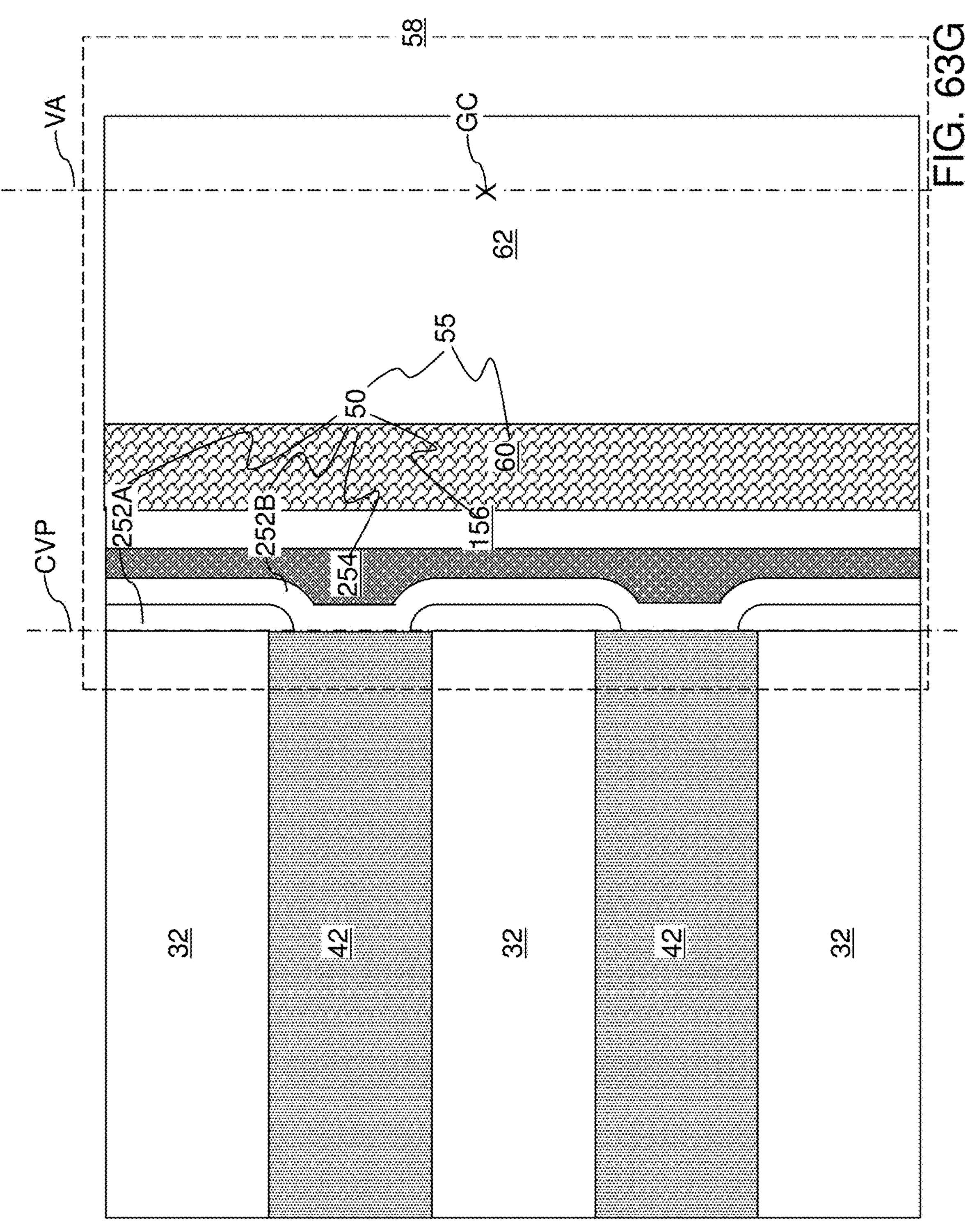

Referring to FIG. 63G, an optional dielectric liner 156 can be deposited employing a conformal deposition process such as a chemical vapor deposition process. In one embodiment, the optional dielectric liner 156 may comprise a tunneling dielectric layer through which charge tunneling can be performed under suitable electrical bias conditions. The optional dielectric liner 156 can be formed directly on the portions of the inner sidewall of the memory material layer 254. The charge tunneling may be performed through hot-carrier injection or by Fowler-Nordheim tunneling induced charge transfer depending on the mode of operation of the NAND memory device to be formed. The optional dielectric liner 156 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the optional dielectric liner 156 can include a stack of a first silicon oxide layer, a silicon oxynitride layer, and a second silicon oxide layer, which is commonly known as an ONO stack. In one embodiment, the optional dielectric liner 156 can include a silicon oxide layer that is substantially free of carbon or a silicon oxynitride layer that is substantially free of carbon. The thickness of the optional dielectric liner 156 can be in a range from 2 nm to 20 nm, although lesser and greater thicknesses can also be employed.

An anisotropic etch process can be performed to remove the horizontal bottom portions of the optional dielectric liner 156, the memory material layer 254, and the blocking dielectric layer 252B at the bottom of each memory opening 49. An underlying pedestal channel portion (not shown) or a top surface of the upper substrate semiconductor layer 10 can be physically exposed at the bottom of each memory opening 49.

A semiconductor channel layer can be deposited directly on the semiconductor surface of the pedestal channel portion or the upper substrate semiconductor layer 10 (if the pedestal channel portion is omitted). The semiconductor channel layer includes a semiconductor material having a doping of a first conductivity type. In one embodiment, the doped semiconductor material of the semiconductor channel layer may comprise at least one elemental semiconductor material, at least one III-V compound semiconductor material, at least one II-VI compound semiconductor material, at least one organic semiconductor material, or other semiconductor materials known in the art. In one embodiment, the semiconductor channel layer includes amorphous silicon or polysilicon. The semiconductor channel layer can be formed by a conformal deposition method such as low pressure chemical vapor deposition (LPCVD). The thickness of the second semiconductor channel layer can be in a range from 2 nm to 30 nm, such as from 4 nm to 15 nm, although lesser and greater thicknesses can also be employed. The second semiconductor channel layer may partially fill the memory cavity 49' in each memory opening 49, or may fully fill the memory cavity 49' in each memory opening 49.

In case the memory cavity 49' in each memory opening 49 is not completely filled by the semiconductor channel layer, a dielectric core layer can be deposited in the memory cavity 49' to fill any remaining portion of the memory cavity 49' within each memory opening 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The material of the dielectric core layer can be vertically recessed selective to the semiconductor material of the semiconductor channel layer into each memory opening 49 down to a depth between a first horizontal plane including the top surface of the insulating cap layer 70 and a second horizontal plane including the bottom surface of the insulating cap layer 70. Each remaining portion of the dielectric core layer constitutes a dielectric core 62.

A doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material can be removed from above the top surface of the insulating cap layer 70, for example, by chemical mechanical planarization (CMP) or a recess etch. Each remaining portion of the semiconductor material having a doping of the second conductively type comprises a drain region 63 (shown in FIG. 62). The horizontal portion of the semiconductor channel layer located above the top surface of the insulating cap layer 70 can be concurrently removed by a planarization process. Each remaining portion of the semiconductor channel layer having a doping of the first conductivity type and located entirely within a respective memory opening 49 comprises a vertical semiconductor channel 60.

A contiguous set of a vertical stack of tubular insulating spacers 252A, a blocking dielectric layer 252B, a memory material layer 254, and an optional dielectric liner 156 constitutes a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours. Each combination of a memory film 50 and a vertical semiconductor channel 60 within a memory opening 49 constitutes a memory stack structure 55. The set of all material portions in a memory opening 49 constitutes a memory opening fill structure 58. Each memory opening fill structure 58 may comprise an optional pedestal channel portion, a memory film 50, a vertical semiconductor channel 60, an optional dielectric core 62, and a drain region 63.

The sixth exemplary structure comprises an alternating stack (32, 42) of insulating layers 32 and sacrificial material layers 42 located over a substrate (9, 10); a memory opening 49 vertically extending through the alternating stack (32, 42); and a memory opening fill structure 58 located in the memory opening 49 and comprising a vertical semiconductor channel 60 and a memory film 50. The memory film 50 comprises a memory material layer 254 having a straight inner cylindrical sidewall that vertically extends through a plurality of sacrificial material layers 42 within the alternating stack (32, 42) without lateral undulation and a laterally-undulating outer sidewall having outward lateral protrusions at levels of the plurality of sacrificial material layers 42.

Subsequently, the processing steps described with reference to FIGS. 14A and 14B can be performed to form a contact-level dielectric layer 73 and backside trenches 79. The processing steps described with reference to FIG. 15 can be performed to remove the sacrificial material layers 42 selective to the insulating layers 32. Backside recesses 43 can be formed in volumes form which the sacrificial material layers 42 are removed.

Figure 64A:
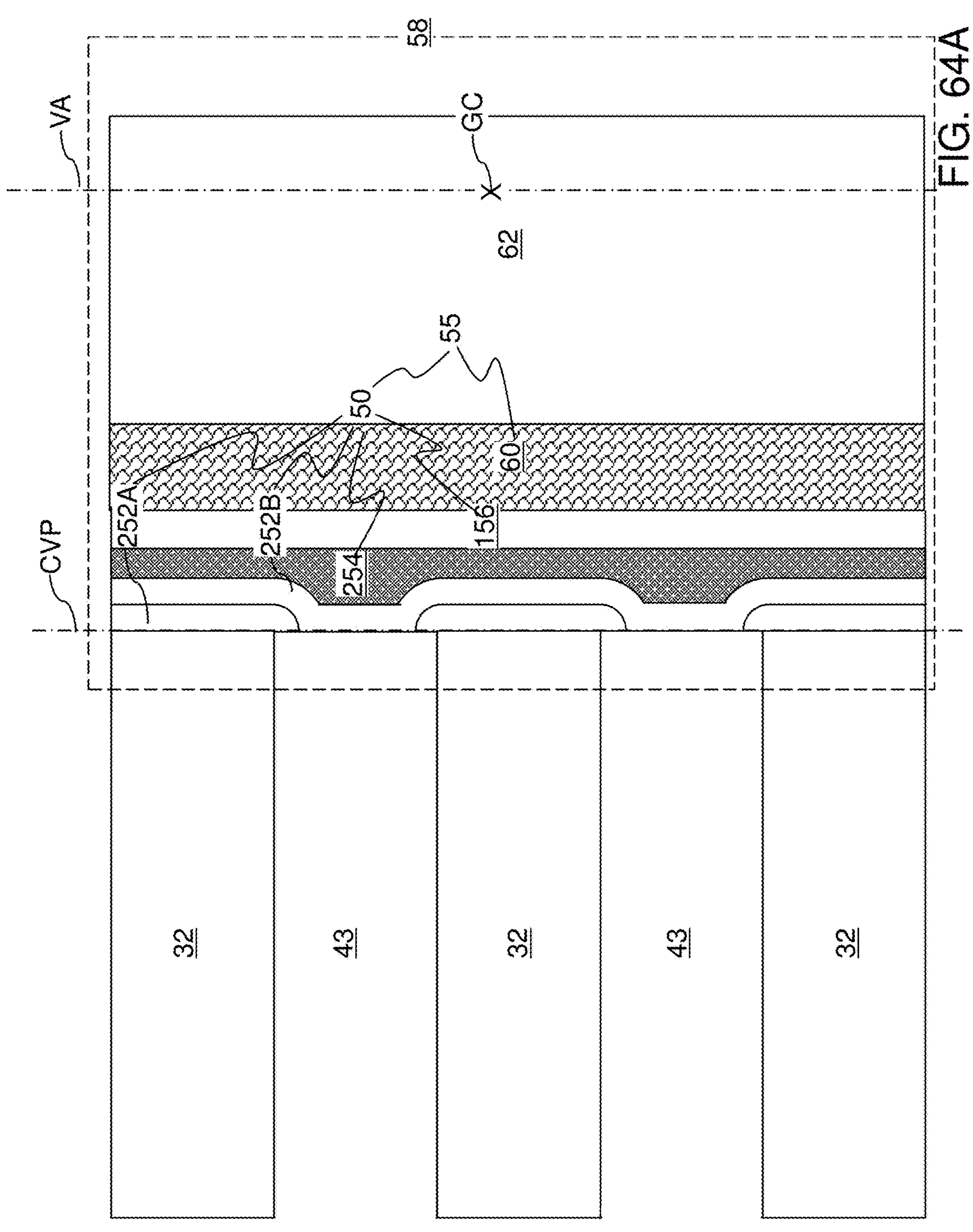
FIGS. 64A and 64B are sequential vertical cross-sectional views of a region around a memory opening fill structure during replacement of sacrificial material layers with electrically conductive layers according to the sixth embodiment of the present disclosure.
Figure 64B:
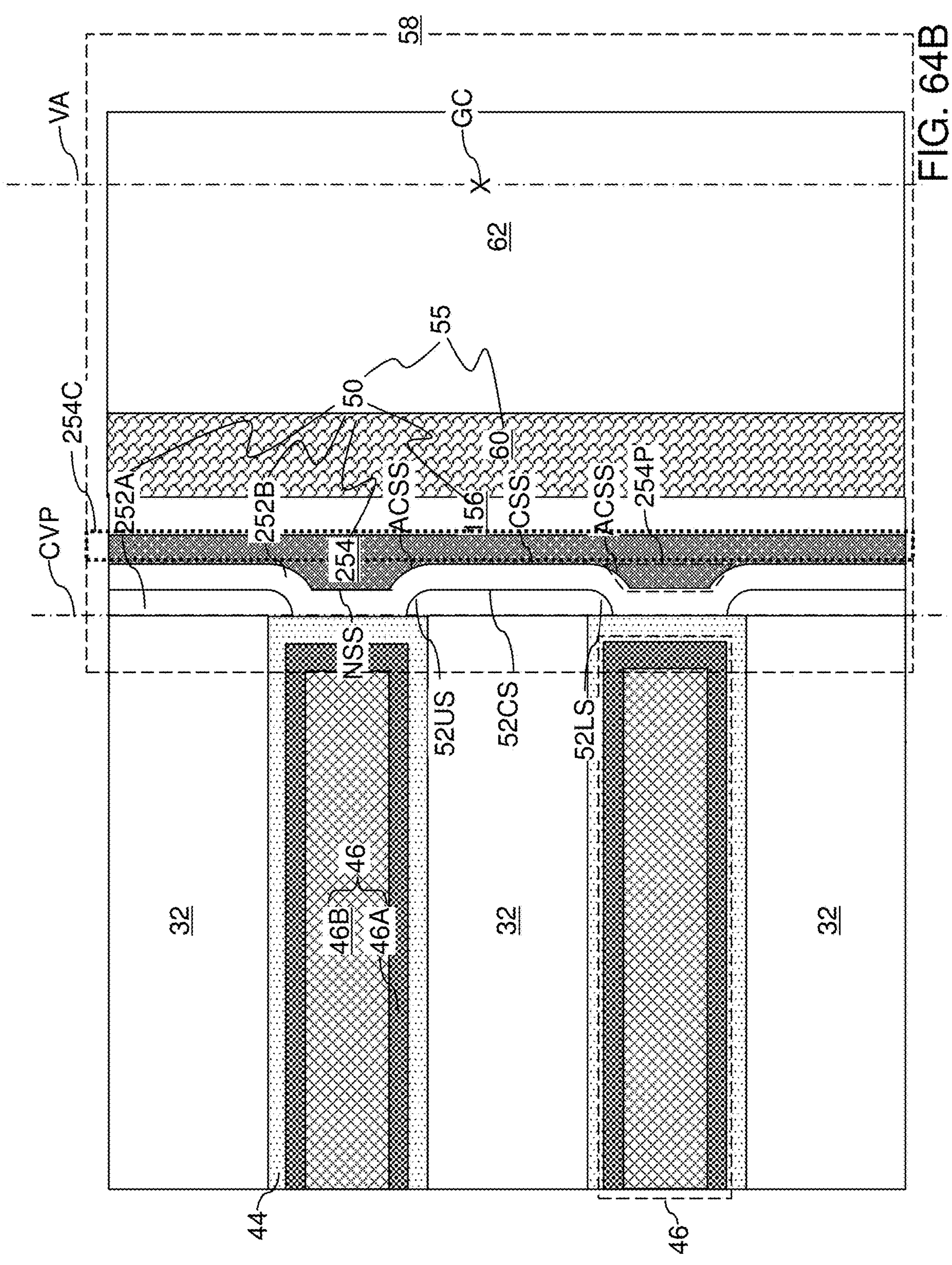

FIGS. 64A and 64B are sequential vertical cross-sectional views of a region around a memory opening fill structure 58 during replacement of sacrificial material layers 42 with electrically conductive layers 46 according to the sixth embodiment of the present disclosure.

Referring to FIG. 64A, a region of around a memory opening fill structure 58 is illustrated after formation of backside recesses 43. Cylindrical surface segments of straight outer sidewalls of a vertical stack of tubular insulating spacers 252A may be physically exposed to the backside recesses 43. Straight cylindrical surface segments of the blocking dielectric layer 252, which can be contained in and can coincide with the cylindrical vertical plane CVP including sidewalls of the insulating layers 32 around the memory opening fill structure 58, can be physically exposed to the backside recesses 43.

Referring to FIG. 64B, the processing steps described with reference to FIGS. 16A and 16B can be performed to form the optional backside blocking dielectric layers 44 and electrically conductive layers 46 in the backside recesses 43. Subsequently, the processing steps described with reference to FIGS. 17, 18A, and 18B may be performed.

Generally, the sacrificial material layers 42 are replaced with material portions comprising electrically conductive layers 46. The memory device in the sixth exemplary structure can also optionally comprise backside blocking dielectric layers 44 located between vertically neighboring pairs of an insulating layer 32 and an electrically conductive layer 46 within the alternating stack (32, 46).

The sixth exemplary structure may comprise an alternating stack (32, 46) of insulating layers 32 and electrically conductive layers 46 located over a substrate (9, 10); a memory opening 49 vertically extending through the alternating stack (32, 46); and a memory opening fill structure 58 located in the memory opening 49 and comprising a vertical semiconductor channel 60 and a memory film 50. The memory film 50 comprises a memory material layer 254 having a straight inner cylindrical sidewall that vertically extends through a plurality of electrically conductive layers 46 within the alternating stack (32, 46) without lateral undulation and a laterally-undulating outer sidewall having outward lateral protrusions at levels of the plurality of electrically conductive layers 46.

In one embodiment, backside blocking dielectric layers 44 can be located between each vertically neighboring pair of an electrically conductive layer 46 and an insulating layer 32 within the alternating stack (32, 46), and can laterally surround each of the memory opening fill structures 58. In one embodiment, each of the backside blocking dielectric layers 44 contacts a respective pair of tubular insulating spacers 252A within the vertical stack of tubular insulating spacers 252A.

In one embodiment, each tubular insulating spacer 252A within the vertical stack of tubular insulating spacers 252A may have a respective contoured inner sidewall. The respective contoured inner sidewall can comprises a cylindrical inner sidewall segment 52CS that extends along a vertical direction; a lower annular convex surface segment 52LS adjoined to a bottom periphery of the cylindrical inner sidewall segment 52CS and having a first curvature C1 that is the same as a distance from a bottom periphery of a cylindrical sidewall of a respective insulating layer 32 among the insulating layers 32; and an upper annular convex surface segment 52US adjoined to a top periphery of the cylindrical inner sidewall segment 52CS and having a second curvature C2 that is the same as a distance from a top periphery of the cylindrical sidewall of the respective insulating layer 32. The first curvature C1 and the second curvature C2 can be the same as the lateral thickness of the tubular insulating spacers 252A. In one embodiment, each of the lower annular convex surface segments 52LS and the upper annular convex surface segments 52US is not in direct contact with any horizontal surface of the insulating layers 32, and is in contact with a surface segment of a respective one of the backside blocking dielectric layers 44.

The memory material layer 254 within each memory film 50 comprises a vertical stack of discrete, outer laterally-protruding memory material portions 254P that protrude outward from the cylindrical vertical plane including the cylindrical surface segments CSS of a laterally-undulating outer sidewall of the inner continuous portion 254C of the memory material layer 254 that are located at levels of the insulating layers 32. The local thickening of the memory material layer 254 at each level of the electrically conductive layers 46 increases the amount of a memory material within each memory cell which comprises a respective outer laterally-protruding memory material portion 254P and part of the inner continuous portion of the memory material layer 254 located at the level of the respective electrically conductive layer 46. Thus, the retention time and the reliability of data bits stored in the memory elements can be enhanced through local thickening of the memory material layer 254.

FIGS. 65A-65G are sequential vertical cross-sectional views of a region around a first alternative configuration of a memory opening 49 during formation of a memory opening fill structure 58 in a sixth exemplary structure according to the sixth embodiment of the present disclosure.

Referring to FIG. 65A, the first alternative configuration of the sixth exemplary structure can be derived from the sixth exemplary structure illustrated in FIG. 63A by laterally recessing the sacrificial material layers 42 relative to the insulating layers 32 around each memory opening 49. An isotropic etch process may be performed to laterally recess sidewalls of the sacrificial material layers 42 relative to sidewalls of the insulating layers 32 around each memory opening 49. For example, if the insulating layers 32 comprise silicon oxide and if the sacrificial material layers 42 comprise silicon nitride, a wet etch process employing hot phosphoric acid may be performed to laterally recess the sacrificial material layers 42. The lateral recess distance of the recess etch process may be in a range from 1 nm to 30 nm, such as from 3 nm to 10 nm, although lesser and greater lateral recess distances may also be employed.

The lateral recessing of the sacrificial material layers 42 can provide the benefit of increasing the volumes of the outer laterally-protruding memory material portions 254P to be subsequently formed. Specifically, the lateral extent of the outer laterally-protruding memory material portions 254P to be subsequently formed at levels of the sacrificial material layers 42 can increase without changing the size of the memory opening 49 as formed by an anisotropic etch process.

Referring to FIG. 65B, the processing steps described with reference to FIG. 63B can be performed to form a vertical stack of tubular insulating spacers 252A within each memory opening 49.

Each of the tubular insulating spacers 252A may have a contoured inner sidewall, a straight outer sidewall which is a cylindrical outer sidewall, a pair of annular horizontal surfaces contacting a respective annular horizontal surface segment of a respective insulating layer 32, and a pair of cylindrical vertical surface segments contacting a pair of sacrificial material layers 42. The straight outer sidewall of each tubular insulating spacer 252A may contact the entirety of a cylindrical sidewall of an insulating layer 32. In one embodiment, each tubular insulating spacer 252A within the vertical stack of tubular insulating spacers 252A may have a respective contoured inner sidewall. The respective contoured inner sidewall can comprises a cylindrical inner sidewall segment 52CS that extends along a vertical direction; a lower annular convex surface segment 52LS adjoined to a bottom periphery of the cylindrical inner sidewall segment 52CS and having a first curvature C1 that is the same as a distance from a bottom periphery of a cylindrical sidewall of a respective insulating layer 32 among the insulating layers 32; and an upper annular convex surface segment 52US adjoined to a top periphery of the cylindrical inner sidewall segment 52CS and having a second curvature C2 that is the same as a distance from a top periphery of the cylindrical sidewall of the respective insulating layer 32. The first curvature C1 and the second curvature C2 can be the same as the lateral thickness of the tubular insulating spacers 252A.

In one embodiment, a first portion of each tubular insulating spacer 252A is located inside the cylindrical vertical plane CVP, and second portions of each tubular insulating spacer 252A are located outside the cylindrical vertical plane CVP.

Referring to FIG. 65C, the processing steps described with reference to FIG. 63C can be performed to form a blocking dielectric layer 252B. The blocking dielectric layer 252B contacts and is laterally surrounded by the vertical stack of tubular insulating spacers 252A. The blocking dielectric layer 252B has a laterally-undulating vertical cross-sectional profile in which portions of the blocking dielectric layer 252B located at levels of the sacrificial material layers 42 laterally protrude outward from a vertical axis VA passing through a geometrical center GC of the memory opening 49 relative to portions of the blocking dielectric layer 252B located at levels of the insulating layers 32.

Referring to FIG. 65D, the processing steps described with reference to FIG. 63D can be performed to thin the blocking dielectric layer 252B. In one embodiment, an isotropic etch process (such as a wet etch process employing dilute hydrofluoric acid) may be performed to thin the blocking dielectric layer 252B. The final thickness of the blocking dielectric layer 252B may be in a range from 2 to 20 nm, such as from 4 nm to 10 nm, although lesser and greater thicknesses may also be employed. In one embodiment, first portions of the blocking dielectric layer 252B are located inside the cylindrical vertical plane CVP, and second portions of the blocking dielectric layer 252B are located outside the cylindrical vertical plane CVP.

Referring to FIG. 65E, the processing steps described with reference to FIG. 63E can be performed to form an in-process memory material layer 254'. The inner sidewall of the in-process memory material layer 254' may be a cylindrical planar surface without any lateral undulation in the vertical cross-sectional profile.

Referring to FIG. 65F, the processing steps described with reference to FIG. 63F can be performed to thin the in-process memory material layer 254', thereby forming a memory material layer 254. The thickness of the memory material layer 254 may be in a range from 8 nm to 50 nm, such as from 10 nm to 30 nm as measured at a level of a sacrificial material layer 42. The thickness of thin portions of the memory material layer 254, as measured over at levels of the insulating layers 32, may be in a range from 1 nm to 6 nm, such as from 2 nm to 4 nm, although lesser and greater thicknesses may also be employed. In one embodiment, a laterally-recessed inner surface of the in-process memory material layer 254' becomes straight inner cylindrical sidewall of the memory material layer 254.

Figure 65G:
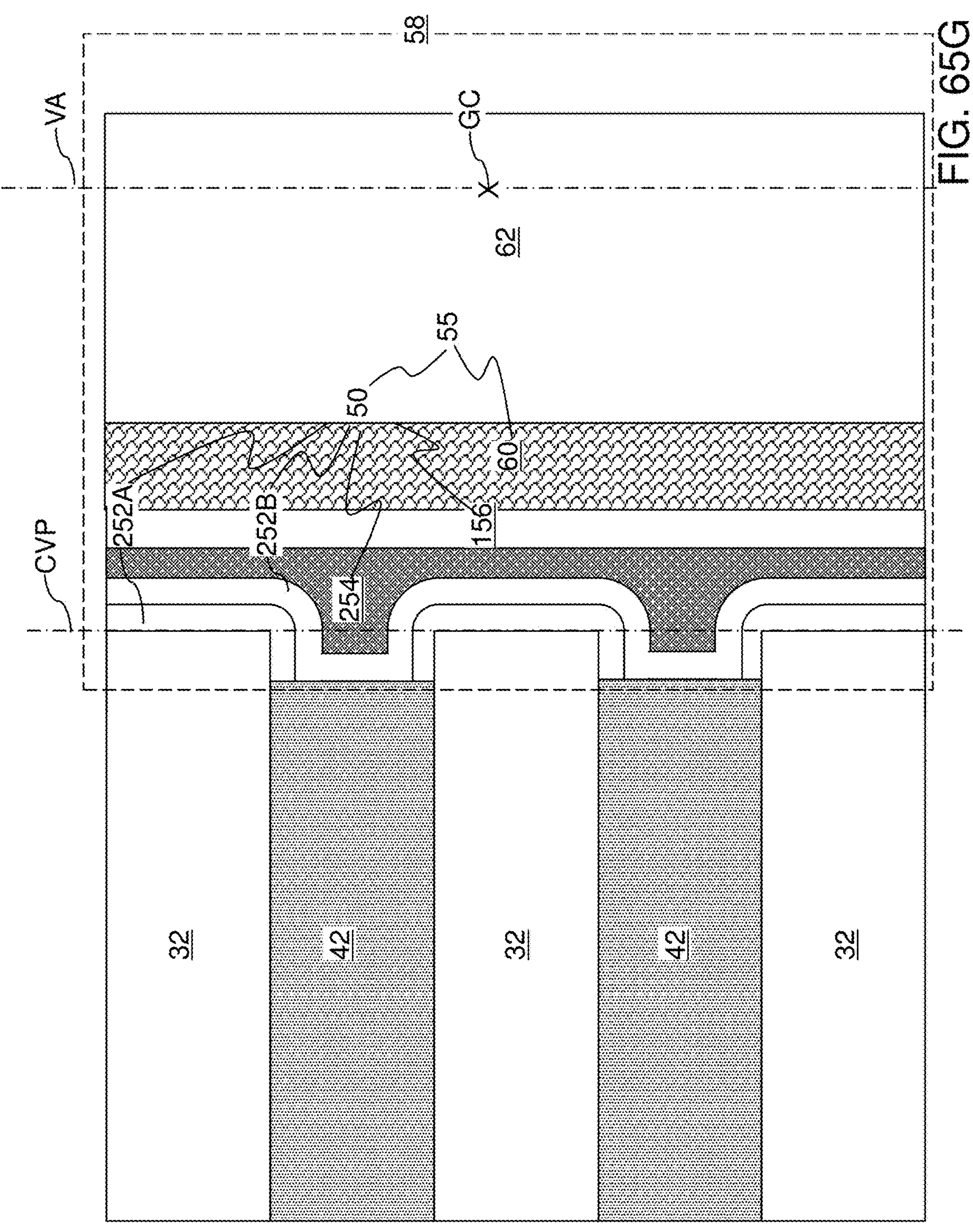

Referring to FIG. 65G, the processing steps described with reference to FIG. 63G can be performed to form a memory opening fill structure 58 within each memory opening 49.

The first alternative configuration of the sixth exemplary structure comprises an alternating stack (32, 42) of insulating layers 32 and sacrificial material layers 42 located over a substrate (9, 10); a memory opening 49 vertically extending through the alternating stack (32, 42); and a memory opening fill structure 58 located in the memory opening 49 and comprising a vertical semiconductor channel 60 and a memory film 50. The memory film 50 comprises a memory material layer 254 having a straight inner cylindrical sidewall that vertically extends through a plurality of sacrificial material layers 42 within the alternating stack (32, 42) without lateral undulation and a laterally-undulating outer sidewall having outward lateral protrusions at levels of the plurality of sacrificial material layers 42.

Subsequently, the processing steps described with reference to FIGS. 14A and 14B can be performed to form a contact-level dielectric layer 73 and backside trenches 79. The processing steps described with reference to FIG. 15 can be performed to remove the sacrificial material layers 42 selective to the insulating layers 32. Backside recesses 43 can be formed in volumes form which the sacrificial material layers 42 are removed.

Figure 66A:
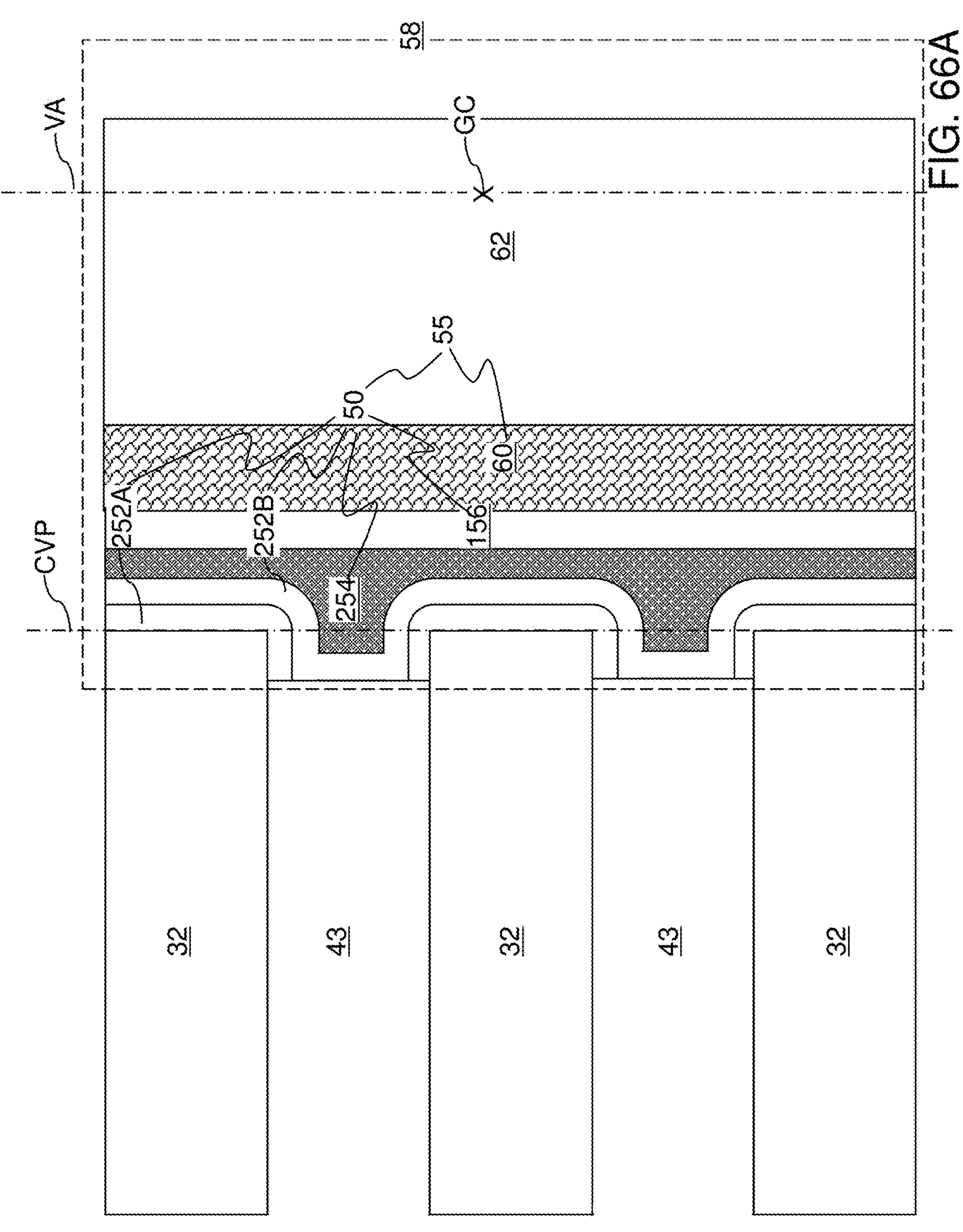
FIGS. 66A and 66B are sequential vertical cross-sectional views of a region around a first alternative configuration of a memory opening fill structure during replacement of sacrificial material layers with electrically conductive layers according to the sixth embodiment of the present disclosure.
Figure 66B:
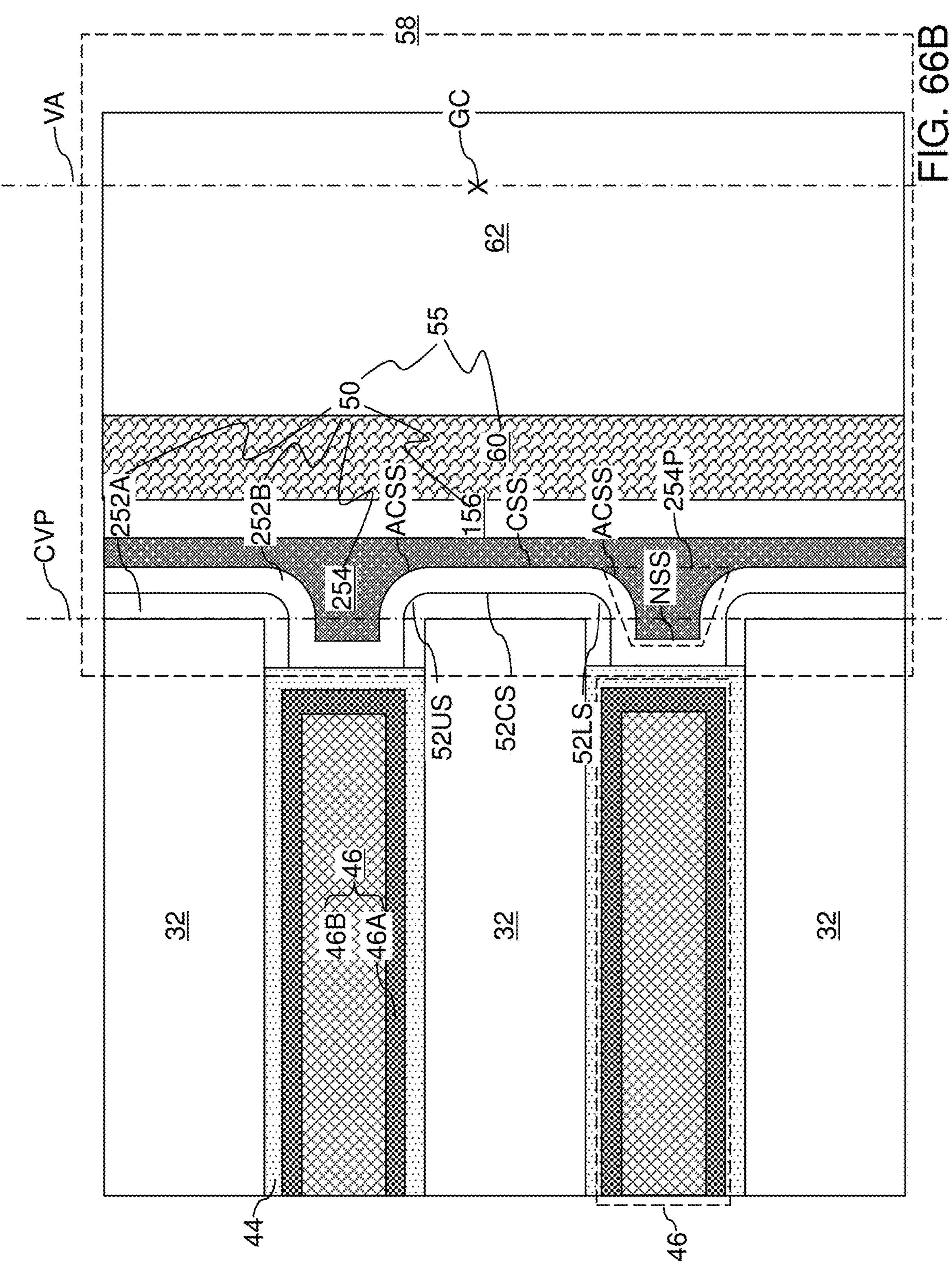

FIGS. 66A and 66B are sequential vertical cross-sectional views of a region around a first alternative configuration of a memory opening fill structure 58 during replacement of sacrificial material layers 42 with electrically conductive layers 46 according to the sixth embodiment of the present disclosure.

Referring to FIG. 66A, a region of around a memory opening fill structure 58 is illustrated after formation of backside recesses 43. Cylindrical surface segments of tubular insulating spacers 252A can be physically exposed to the backside recesses 43. Straight cylindrical surface segments of the blocking dielectric layer 252, which are located outside the cylindrical vertical plane CVP including sidewalls of the insulating layers 32 around the memory opening fill structure 58, can be physically exposed to the backside recesses 43.

Referring to FIG. 66B, the processing steps described with reference to FIGS. 16A and 16B can be performed to form backside blocking dielectric layers 44 and electrically conductive layers 46 in the backside recesses 43. Subsequently, the processing steps described with reference to FIGS. 17, 18A, and 18B may be performed.

Generally, the sacrificial material layers 42 are replaced with material portions comprising electrically conductive layers 46. The memory device in the first alternative configuration of the sixth exemplary structure can optionally comprise backside blocking dielectric layers 44 located between vertically neighboring pairs of an insulating layer 32 and an electrically conductive layer 46 within the alternating stack (32, 46).

The first alternative configuration of sixth exemplary structure may comprise an alternating stack (32, 46) of insulating layers 32 and electrically conductive layers 46 located over a substrate (9, 10); a memory opening 49 vertically extending through the alternating stack (32, 46); and a memory opening fill structure 58 located in the memory opening 49 and comprising a vertical semiconductor channel 60 and a memory film 50. The memory film 50 comprises a memory material layer 254 having a straight inner cylindrical sidewall that vertically extends through a plurality of electrically conductive layers 46 within the alternating stack (32, 46) without lateral undulation and a laterally-undulating outer sidewall having outward lateral protrusions at levels of the plurality of electrically conductive layers 46.

FIGS. 67A-67G are sequential vertical cross-sectional views of a region around a second alternative configuration of a memory opening 49 during formation of a memory opening fill structure 58 in a sixth exemplary structure according to the sixth embodiment of the present disclosure.

Referring to FIG. 67A, the second alternative configuration of the sixth exemplary structure can be derived from the sixth exemplary structure illustrated in FIG. 63A by laterally recessing the sacrificial material layers 42 relative to the insulating layers 32 around each memory opening 49. An isotropic etch process may be performed to non-uniformly laterally recess sidewalls of the sacrificial material layers 42 relative to sidewalls of the insulating layers 32 around each memory opening 49. In one embodiment, the non-uniformly laterally recessed sidewalls of the sacrificial material layers 42 may have a concave vertical cross-sectional profile in which a middle portion of each laterally recessed sidewall of each sacrificial material layer 42 is recessed more than an upper edge portion and a lower edge portion of the respective sacrificial material layer 42.

Referring to FIG. 67B, the processing steps described with reference to FIG. 63B can be performed to form a vertical stack of tubular insulating spacers 252A within each memory opening 49. In one embodiment, a first portion of each tubular insulating spacer 252A is located inside the cylindrical vertical plane CVP, and second portions of each tubular insulating spacer 252A are located outside the cylindrical vertical plane CVP.

Referring to FIG. 67C, the processing steps described with reference to FIG. 63C can be performed to form a blocking dielectric layer 252B. The blocking dielectric layer 252B contacts, and is laterally surrounded by, the vertical stack of tubular insulating spacers 252A. The blocking dielectric layer 252B has a laterally-undulating vertical cross-sectional profile in which portions of the blocking dielectric layer 252B located at levels of the sacrificial material layers 42 laterally protrude outward from a vertical axis VA passing through a geometrical center GC of the memory opening 49 relative to portions of the blocking dielectric layer 252B located at levels of the insulating layers 32.

Referring to FIG. 67D, the processing steps described with reference to FIG. 63D can be performed to thin the blocking dielectric layer 252B. In one embodiment, an isotropic etch process (such as a wet etch process employing dilute hydrofluoric acid) may be performed to thin the blocking dielectric layer 252B. The final thickness of the blocking dielectric layer 252B may be in a range from 2 to 20 nm, such as from 4 nm to 10 nm, although lesser and greater thicknesses may also be employed. In one embodiment, first portions of the blocking dielectric layer 252B are located inside the cylindrical vertical plane CVP, and second portions of the blocking dielectric layer 252B are located outside the cylindrical vertical plane CVP.

Referring to FIG. 67E, the processing steps described with reference to FIG. 63E can be performed to form an in-process memory material layer 254'. The an inner sidewall of the in-process memory material layer 254' may be cylindrical planar surfaces without any lateral undulation in the vertical cross-sectional profile.

Referring to FIG. 67F, the processing steps described with reference to FIG. 63F can be performed to thin the in-process memory material layer 254', thereby forming a memory material layer 254. The thickness of the memory material layer 254 may be in a range from 8 nm to 50 nm, such as from 10 nm to 30 nm as measured at a level of a sacrificial material layer 42. The thickness of thin portions of the memory material layer 254, as measured over at levels of the insulating layers 32, may be in a range from 1 nm to 6 nm, such as from 2 nm to 4 nm, although lesser and greater thicknesses may also be employed. In one embodiment, a laterally-recessed inner surface of the in-process memory material layer 254' becomes straight inner cylindrical sidewall of the memory material layer 254.

Figure 67G:
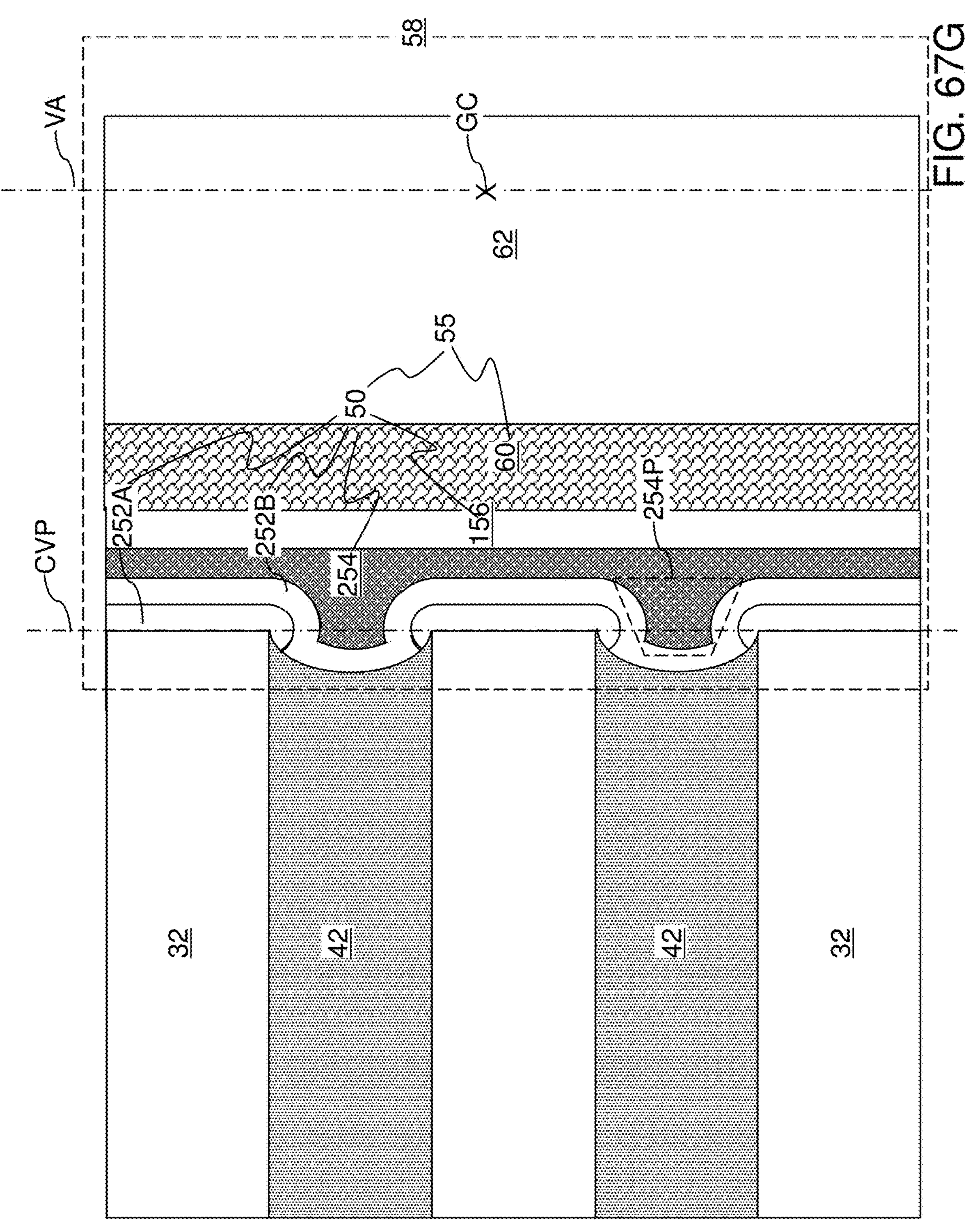

Referring to FIG. 67G, the processing steps described with reference to FIG. 63G can be performed to form a memory opening fill structure 58 within each memory opening 49.

Subsequently, the processing steps described with reference to FIGS. 14A and 14B can be performed to form a contact-level dielectric layer 73 and backside trenches 79. The processing steps described with reference to FIG. 15 can be performed to remove the sacrificial material layers 42 selective to the insulating layers 32. Backside recesses 43 can be formed in volumes form which the sacrificial material layers 42 are removed.

Figure 68A:
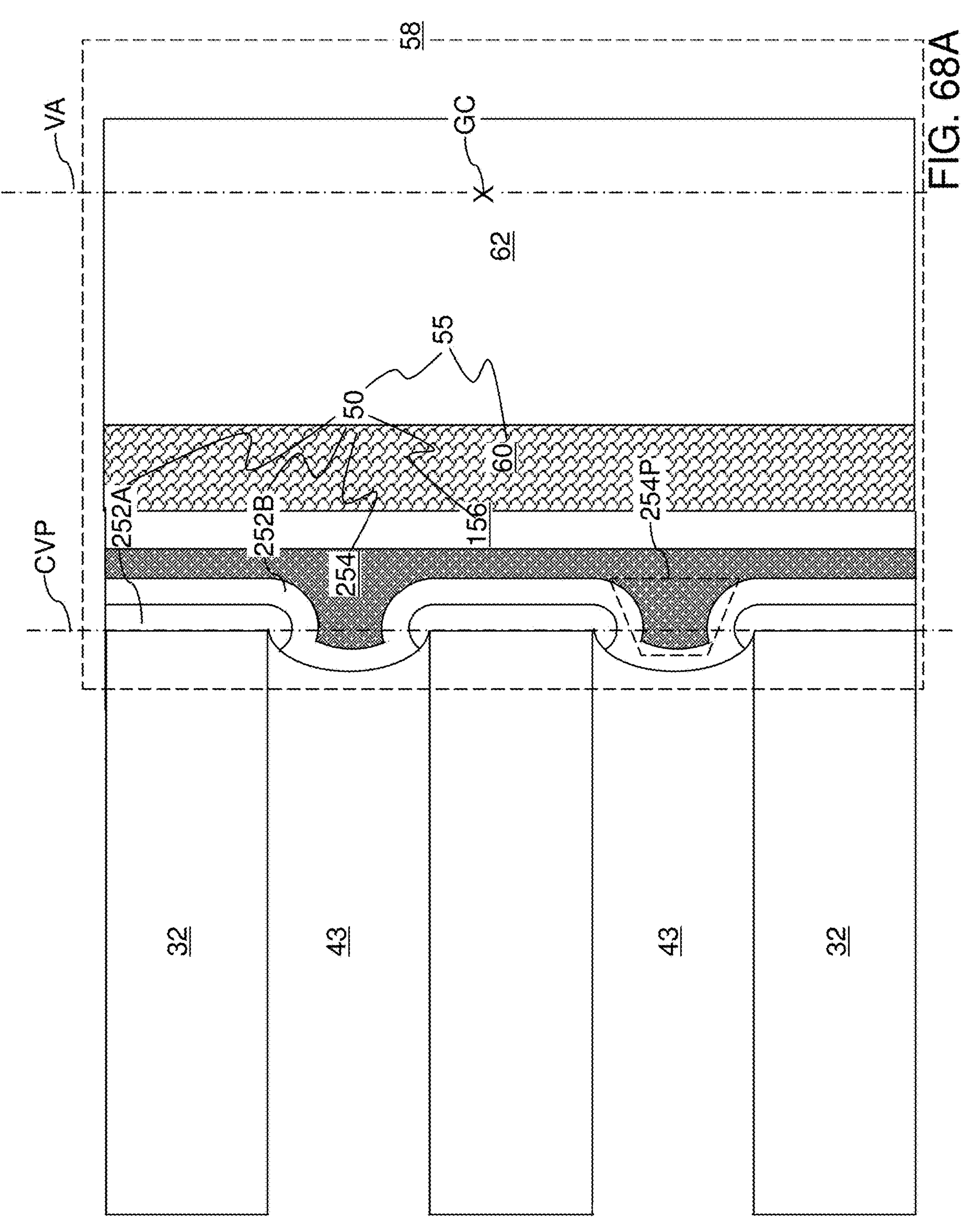
FIGS. 68A and 68B are sequential vertical cross-sectional views of a region around a second alternative configuration of a memory opening fill structure during replacement of sacrificial material layers with electrically conductive layers according to the sixth embodiment of the present disclosure.
Figure 68B:
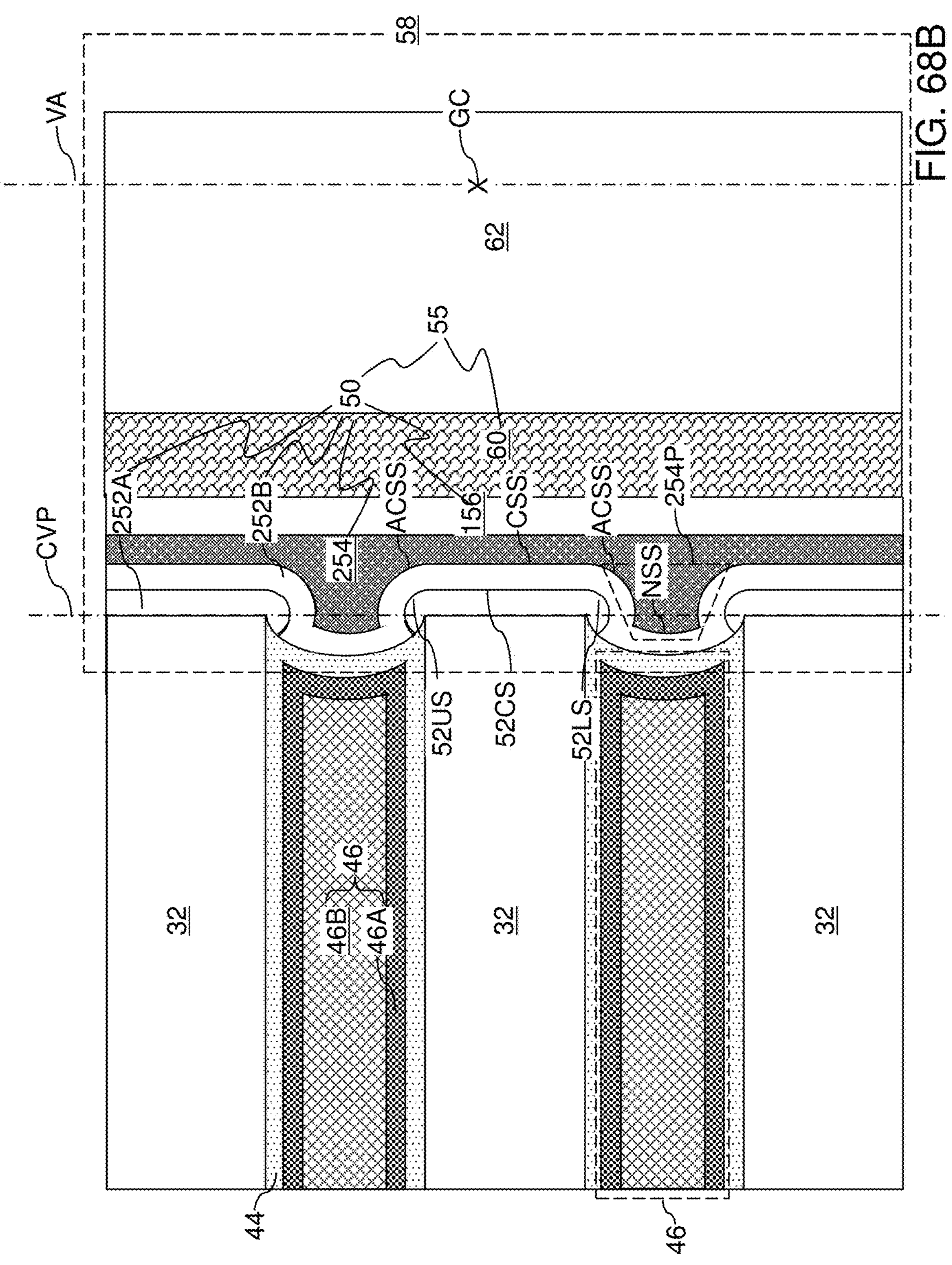

FIGS. 68A and 68B are sequential vertical cross-sectional views of a region around a second alternative configuration of a memory opening fill structure 58 during replacement of sacrificial material layers 42 with electrically conductive layers 46 according to the sixth embodiment of the present disclosure.

Referring to FIG. 68A, a region of around a memory opening fill structure 58 is illustrated after formation of backside recesses 43. Convex tapered surface segments of tubular insulating spacers 252A can be physically exposed to the backside recesses 43. Convex annular surface segments of the blocking dielectric layer 252, which are located outside the cylindrical vertical plane CVP including sidewalls of the insulating layers 32 around the memory opening fill structure 58, can be physically exposed to the backside recesses 43.

Referring to FIG. 68B, the processing steps described with reference to FIGS. 16A and 16B can be performed to form backside blocking dielectric layers 44 and electrically conductive layers 46 in the backside recesses 43. Subsequently, the processing steps described with reference to FIGS. 17, 18A, and 18B may be performed.

The second alternative configuration of sixth exemplary structure may comprise an alternating stack (32, 46) of insulating layers 32 and electrically conductive layers 46 located over a substrate (9, 10); a memory opening 49 vertically extending through the alternating stack (32, 46); and a memory opening fill structure 58 located in the memory opening 49 and comprising a vertical semiconductor channel 60 and a memory film 50. The memory film 50 comprises a memory material layer 254 having a straight inner cylindrical sidewall that vertically extends through a plurality of electrically conductive layers 46 within the alternating stack (32, 46) without lateral undulation and a laterally-undulating outer sidewall having outward lateral protrusions at levels of the plurality of electrically conductive layers 46.

Referring to FIGS. 63A-68B and related drawings and according to various embodiments of the present disclosure, a memory device comprises: an alternating stack (32, 46) of insulating layers 32 and electrically conductive layers 46; a memory opening 49 vertically extending through the alternating stack (32, 46); and a memory opening fill structure 58 located in the memory opening 49 and comprising a vertical semiconductor channel 60 and a memory film 50, wherein the memory film 50 comprises a memory material layer 254 having a straight inner cylindrical sidewall that vertically extends through a plurality of electrically conductive layers 46 within the alternating stack (32, 46) without lateral undulation and a laterally-undulating outer sidewall having outward lateral protrusions at levels of the plurality of electrically conductive layers 46.

In one embodiment, the memory film 50 comprises a vertical stack of tubular insulating spacers 252A having a respective outer sidewall that contacts a respective one of the insulating layers 32.

In one embodiment, each tubular insulating spacer 252A within the vertical stack of tubular insulating spacers 252A has a respective contoured inner sidewall that comprises: a straight cylindrical inner sidewall segment 52CS that extends along a vertical direction; a lower annular convex surface segment 52LS adjoined to a bottom periphery of the straight cylindrical inner sidewall segment 52CS and having a first curvature C1 that is the same as a distance from a bottom periphery of a cylindrical sidewall of a respective insulating layer 32 of the insulating layers 32; and an upper annular convex surface segment 52US adjoined to a top periphery of the straight cylindrical inner sidewall segment 52CS and having a second curvature C2 that is the same as a distance from a top periphery of the cylindrical sidewall of the respective insulating layer 32.

In one embodiment, portions of the lower annular convex surface segments 52LS and portions of the upper annular convex surface segments 52US of the vertical stack of tubular insulating spacers 252A are located outside a vertically-extending cylindrical plane including sidewalls of the insulating layers 32 that are in contact with the memory opening fill structure 58.

In one embodiment, the memory device comprises backside blocking dielectric layers 44 located between vertically neighboring pairs of an insulating layer 32 and an electrically conductive layer 46 within the alternating stack (32, 46). In one embodiment, one of the tubular insulating spacers 252A is in contact with a respective annular horizontal surface of a respective one of the insulating layers 32, and is in contact with a surface segment of a respective one of the backside blocking dielectric layers 44. In one embodiment, each of the lower annular convex surface segments 52LS and the upper annular convex surface segments 52US is not in direct contact with any horizontal surface of the insulating layers 32, and is in contact with a surface segment of a respective one of the backside blocking dielectric layers 44. In one embodiment, each of the backside blocking dielectric layers 44 contacts a respective pair of tubular insulating spacers 252A within the vertical stack of tubular insulating spacers 252A.

In one embodiment, an entirety of the vertical stack of tubular insulating spacers 252A is located inside a vertically-extending cylindrical plane including sidewalls of the insulating layers 32 around the memory opening 49.

In one embodiment, the memory material layer 254 comprises an inner continuous portion 254C which extends through an entirety of the alternating stack (32, 46), and a plurality of outer laterally-protruding memory material portions 254P which protrude outwards from the inner continuous portion 254C at levels of the electrically conductive layers 46. In one embodiment, the outer laterally-protruding memory material portions 254P comprise discrete portions which are vertically separated from each other and which contact the inner continuous portion 254C.

In one embodiment, the memory film 50 further comprises a blocking dielectric layer 252B laterally surrounding the memory material layer 254 and laterally surrounded by the vertical stack of tubular insulating spacers 252A.

In one embodiment, the blocking dielectric layer 252B has a laterally-undulating vertical cross-sectional profile in which portions of the blocking dielectric layer 252B located at levels of the electrically conductive layers 46 laterally protrude outward from a vertical axis VA passing through a geometrical center GC of the memory opening fill structure 58 relative to portions of the blocking dielectric layer 252B located at levels of the insulating layers 32.

In one embodiment, the laterally-undulating outer sidewall of the memory material layer 254 comprises: straight cylindrical surface segments CSS located at levels of the insulating layers 32; annular concave surface segments ACSS adjoined to an upper periphery of a lower periphery of a respective one of the straight cylindrical surface segments CSS; and connecting surface segments NSS that connect a respective vertically-neighboring pair of annular concave surface segments ACSS and that are located at levels of the electrically conducive layers 46.

In one embodiment, the straight cylindrical surface segments CSS are located inside a volume that is laterally enclosed by a cylindrical vertical plane CVP including sidewalls of the insulating layers 32 that contact the memory opening fill structure 58; and the connecting surface segments NSS are located entirely, or partly, outside the volume that is laterally enclosed by cylindrical vertical plane CVP.

In one embodiment, the connecting surface segments NSS are straight surface segments that extend along a vertical direction.

In one embodiment, the connecting surface segments NSS comprise convex surface segments in contact with concave surface segments of the blocking dielectric layer 252B.

The various embodiments of the present disclosure may be employed to provide a memory material layer 254 including width-modulated memory elements. For example, the memory material layer 254 may comprise laterally-protruding memory material portions 254P at levels of the electrically conductive layers 46. Reduction of the memory material at levels of the insulating layers 32 can reduce nearest-neighbor interference of signals among the memory elements within each vertical stack of memory elements.

Figure 69:
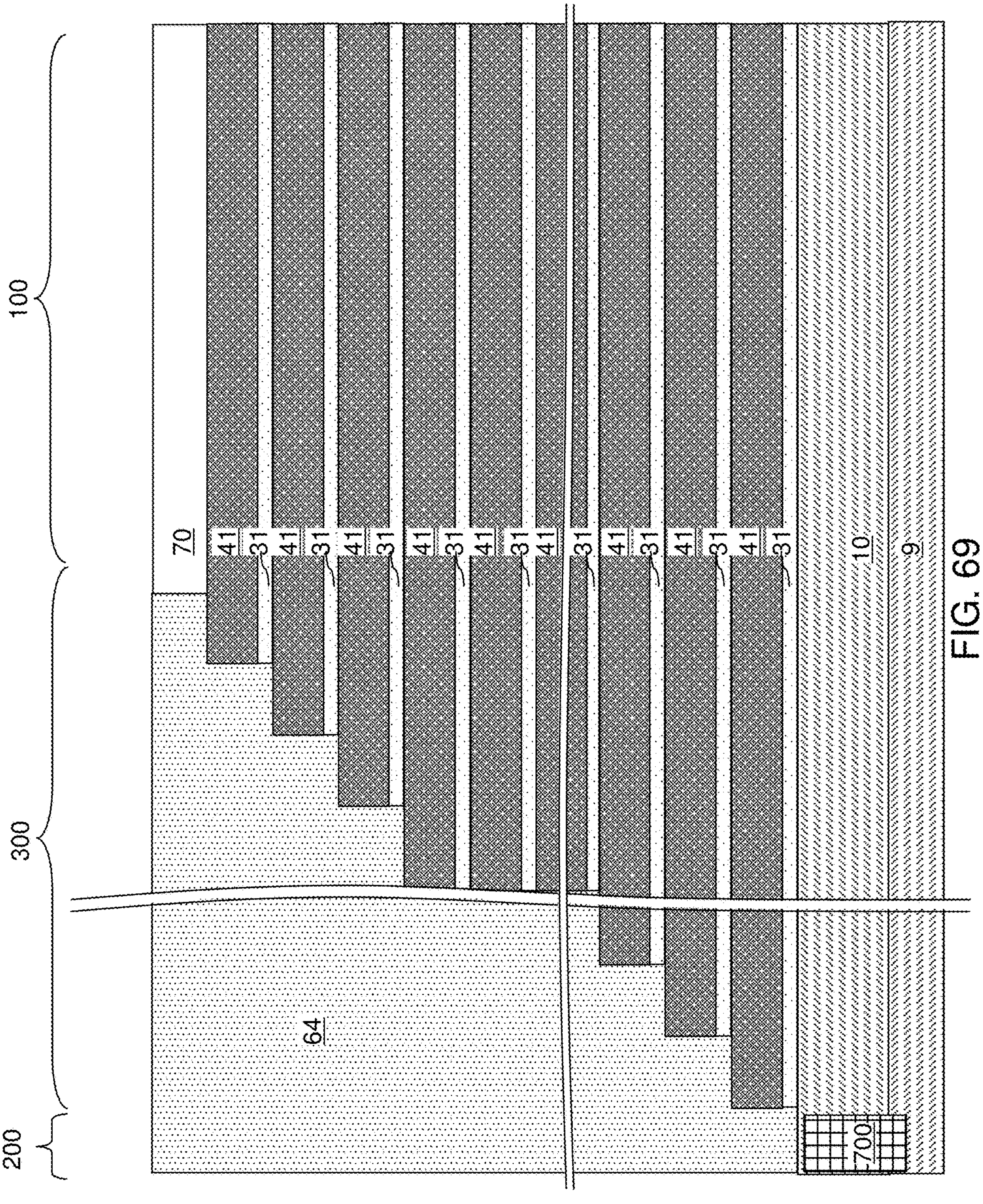
FIG. 69 is a vertical cross-sectional view of a seventh exemplary structure after formation of an alternating stack of disposable material layers and silicon nitride layers and a retro-stepped dielectric material portion according to a seventh embodiment of the present disclosure.

Referring to FIG. 69, a seventh exemplary structure according to a seventh embodiment of the present disclosure is illustrated, which may be the same as the second exemplary structure illustrated in FIG. 27. An alternating stack (31, 41) of disposable material layers 31 and silicon nitride layers 41 can be formed over a substrate (9, 10), stepped surfaces can be formed by patterning the alternating stack (31, 41), and a retro-stepped dielectric material portion 64 can be formed over the stepped surfaces. In this embodiment, the silicon nitride layers 41 may be thicker than, thinner than or have the same thickness as the disposable material layers 31.

Figure 70A:
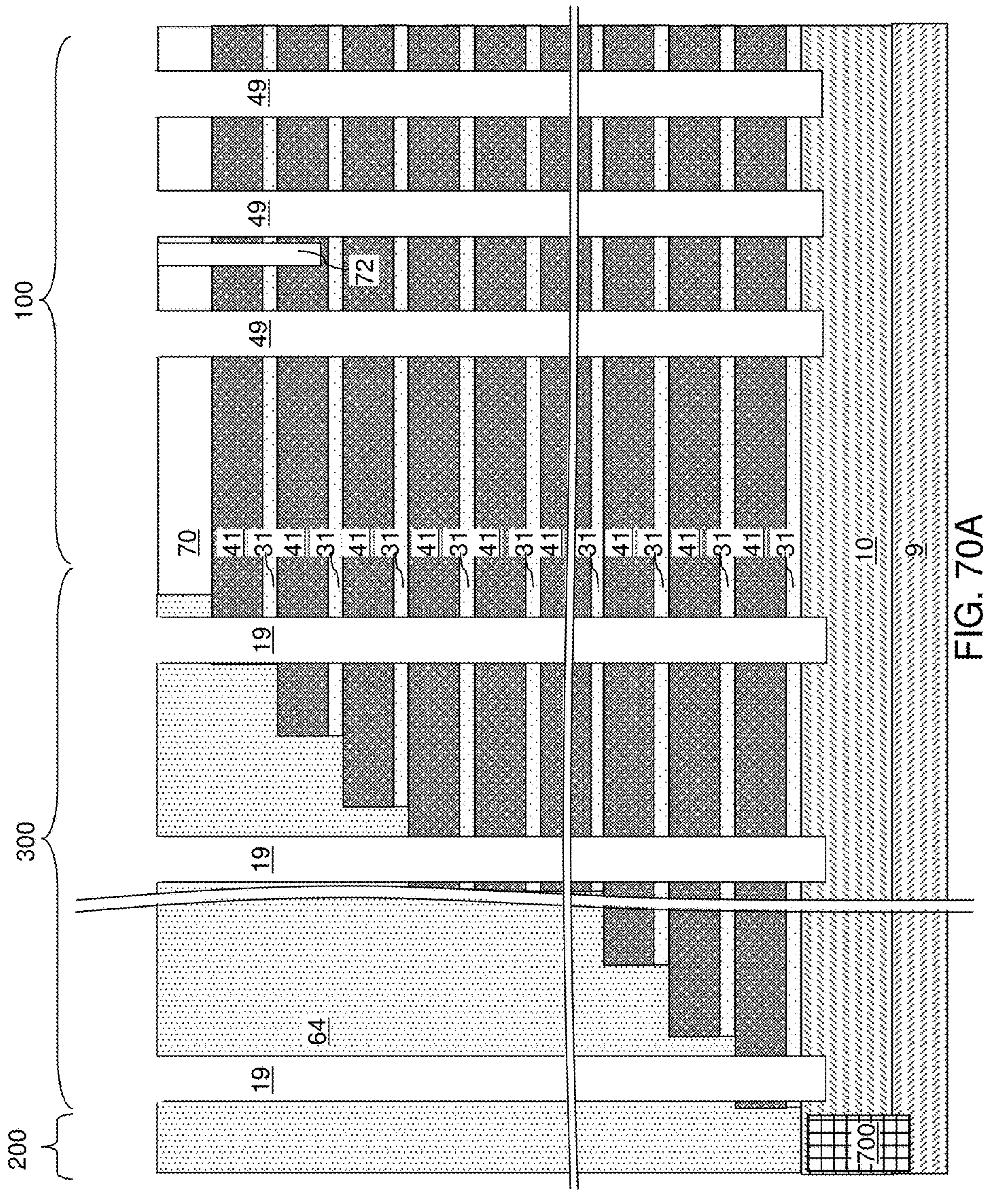
FIG. 70A is a vertical cross-sectional view of the seventh exemplary structure after formation of memory openings and support openings according to the seventh embodiment of the present disclosure.
Figure 70B:
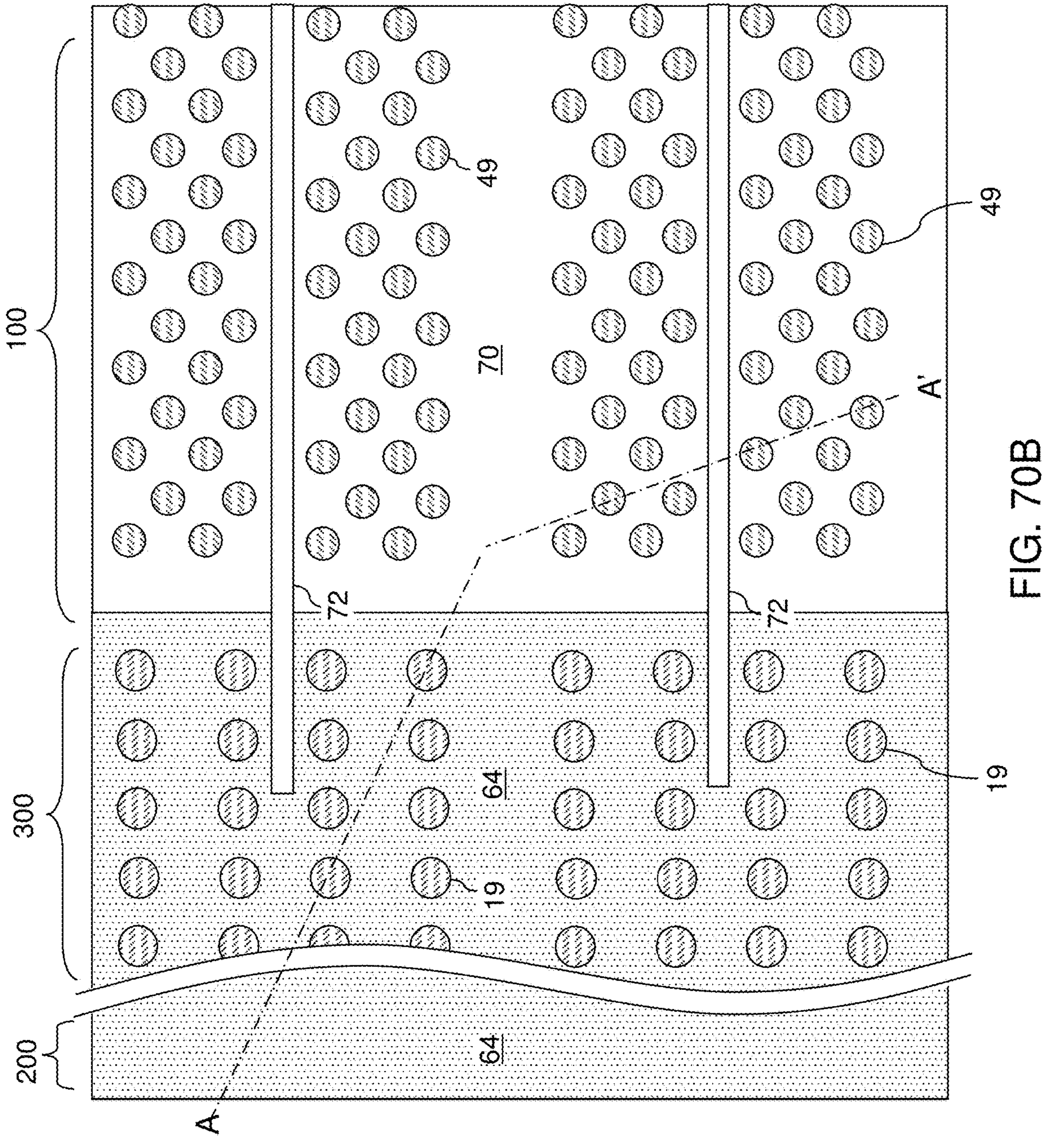
FIG. 70B is a top-down view of the seventh exemplary structure of FIG. 70A. The vertical plane A-A' is the cut plane of the vertical cross-sectional view of FIG. 70A.

Referring to FIGS. 70A and 70B, the processing steps described with reference to FIGS. 28A and 28B can be performed to form memory openings 49 and support openings 19.

Figure 71:
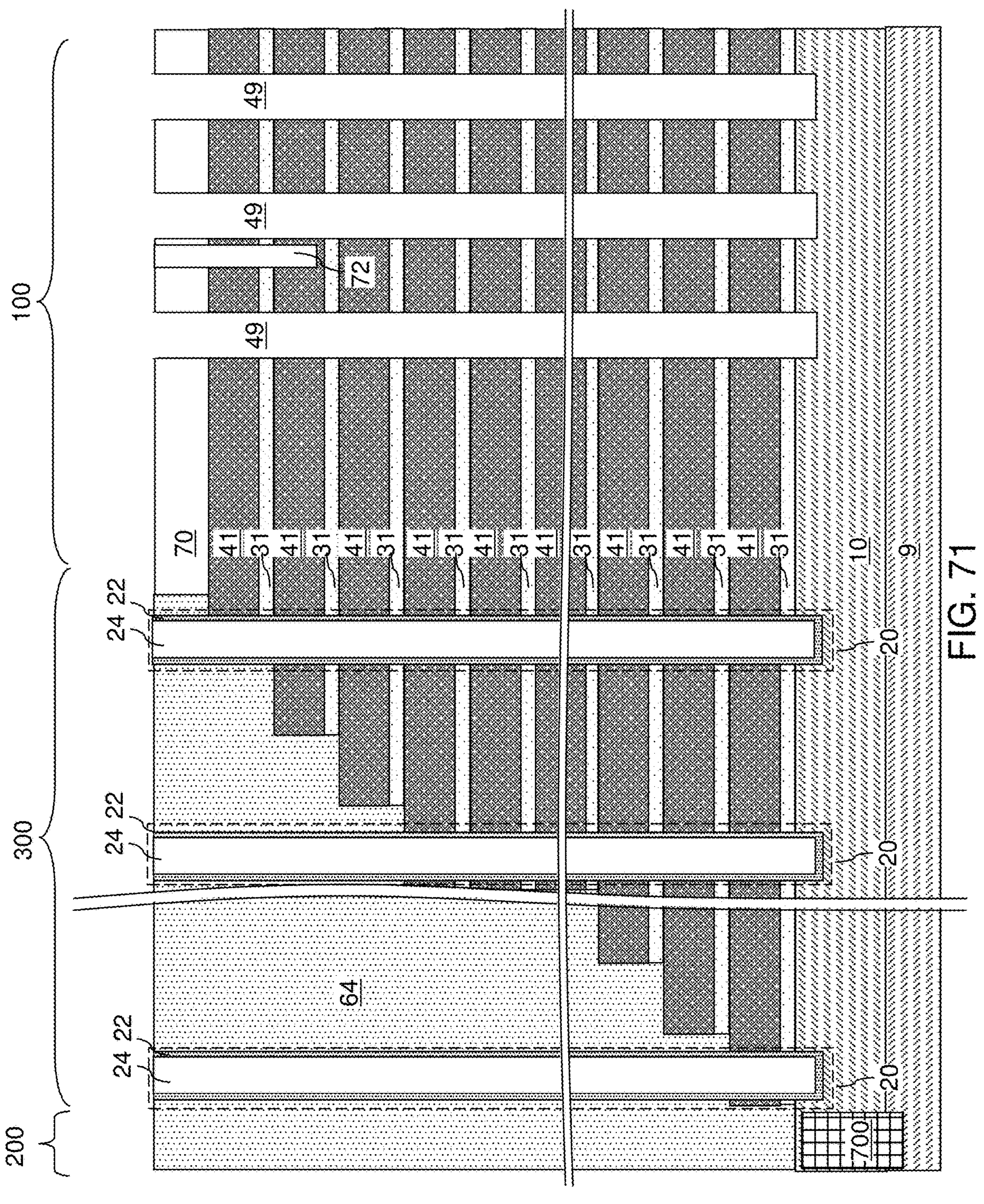
FIG. 71 is a vertical cross-sectional view of the seventh exemplary structure after formation of support pillar structures according to the seventh embodiment of the present disclosure.

Referring to FIG. 71, the processing steps described with reference to FIG. 28C can be performed to form support pillar structures 20 in the support openings 19.

FIGS. 72A-72H are vertical sequential cross-sectional views of a memory opening 49 in the seventh exemplary structure during formation of a memory opening fill structure 58 according to the seventh embodiment of the present disclosure.

Figures 72A, 72B:
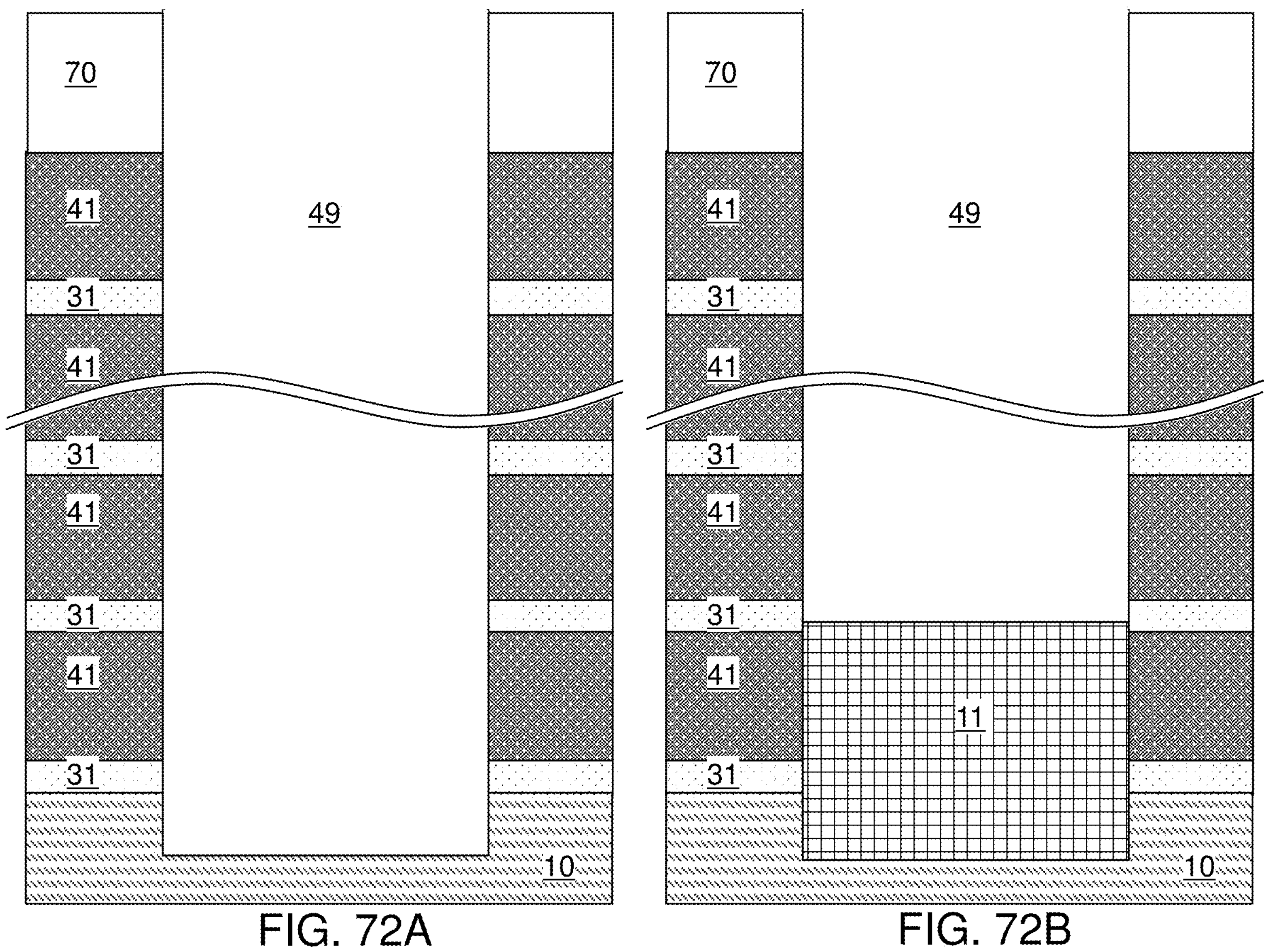
FIGS. 72A-72H are vertical sequential cross-sectional views of a memory opening in the seventh exemplary structure during formation of a memory opening fill structure according to the seventh embodiment of the present disclosure.

FIG. 72A illustrates a memory opening 49 after the processing steps of FIG. 71.

Referring to FIG. 72B, the processing steps of FIG. 5B can be performed to form a pedestal channel portion 11 in each memory opening 49. Alternatively, the pedestal channel portion 11 may be omitted if a lateral source contact structure (e.g., direct strap contact) is subsequently formed to contact a side of the vertical semiconductor channel 60.

Figures 72C, 72D:
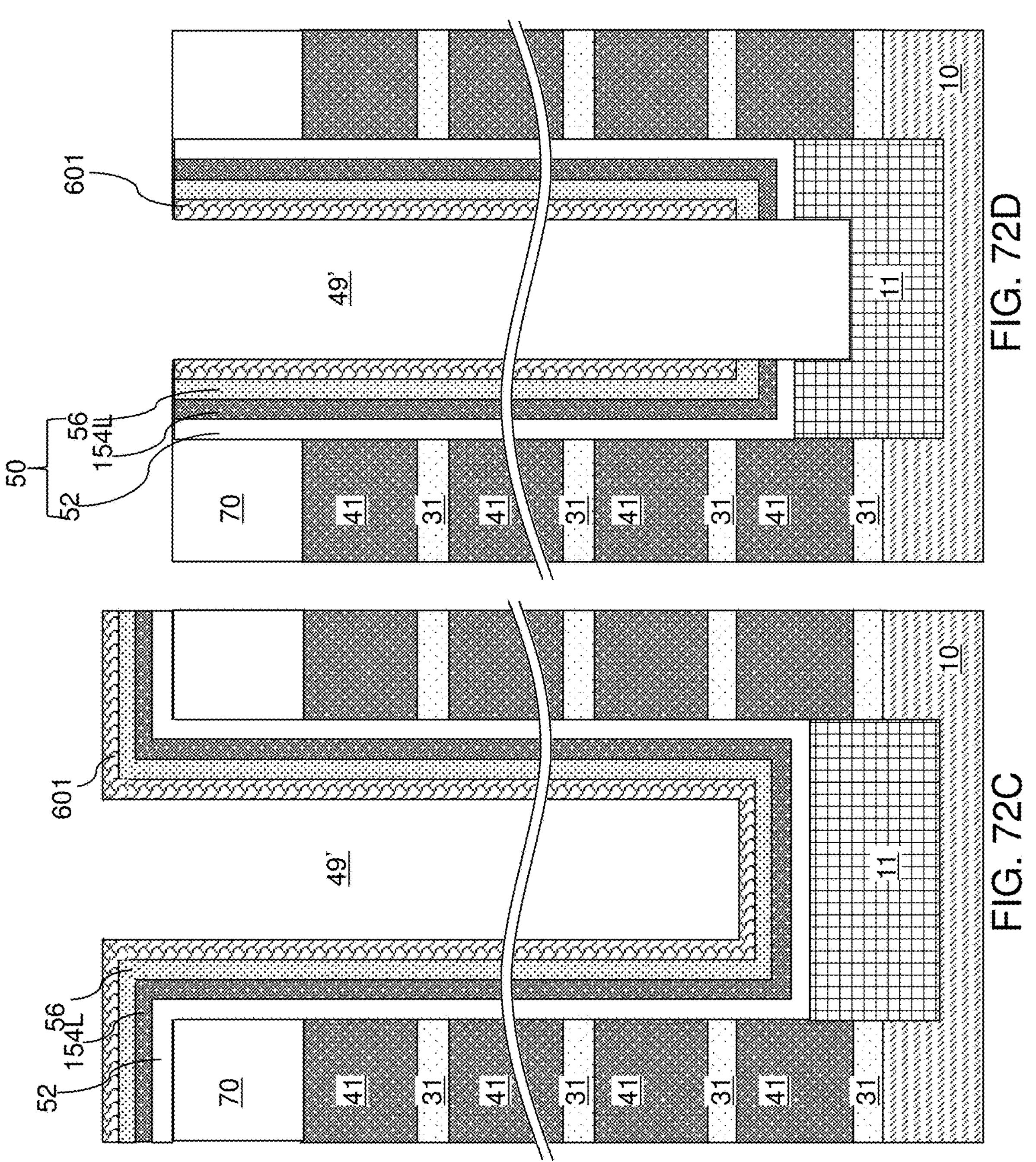

Referring to FIG. 72C, a stack of layers including a blocking dielectric layer 52, a charge storage material layer 154L, a tunneling dielectric layer 56, and an optional first semiconductor channel layer 601 can be sequentially deposited in the memory openings 49.

The blocking dielectric layer 52 may have the same material composition and the same thickness range as the blocking dielectric layer 52 in the first exemplary structure. In one embodiment, the blocking dielectric layer 52 may comprise, and/or may consist essentially of, a silicon oxide material, such as undoped silicate glass. The thickness of the blocking dielectric layer can be in a range from 1 nm to 20 nm, such as from 2 nm to 10 nm, although lesser and greater thicknesses can also be employed.

Subsequently, the charge storage material layer 154L can be formed. In the seventh exemplary structure, the charge storage material layer 154L may consist essentially of silicon nitride. In one embodiment, the charge storage material layer 154L can be a continuous layer that is deposited by a conformal deposition process. In this case, the charge storage material layer 154L can include a silicon nitride layer having a uniform thickness throughout. The thickness of the charge storage material layer 154L can be in a range from 3 nm to 8 nm, although lesser and greater thicknesses may also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601). In an alternative embodiment, a sacrificial cover material layer may be employed in lieu of the first semiconductor channel layer 601. In this case, the sacrificial cover material layer can include any cover material that can protect the tunneling dielectric layer 154L during a subsequent anisotropic etch process.

Referring to FIG. 72D, the optional first semiconductor channel layer 601, the tunneling dielectric layer 56, the charge storage material layer 154L, the blocking dielectric layer 52 are sequentially anisotropically etched employing at least one anisotropic etch process. The portions of the first semiconductor channel layer 601, the tunneling dielectric layer 56, the charge storage material layer 154L, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage material layer 154L, and the blocking dielectric layer 52 at a bottom of each memory cavity 49' can be removed to form openings in remaining portions thereof. Each of the first semiconductor channel layer 601, the tunneling dielectric layer 56, the charge storage material layer 154L, and the blocking dielectric layer 52 can be etched by a respective anisotropic etch process employing a respective etch chemistry, which may or may not be the same for the various material layers.

Each remaining portion of the first semiconductor channel layer 601 can have a tubular configuration. In one embodiment, the charge storage material layer 154L can be a charge storage layer in which each portion adjacent to the silicon nitride layers 41 constitutes a charge storage region.

A surface of the pedestal channel portion 11 (or a surface of the upper substrate semiconductor layer 10 in case the pedestal channel portions 11 are not employed) can be physically exposed underneath the opening through the first semiconductor channel layer 601, the tunneling dielectric layer 56, the charge storage material layer 154L, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the upper substrate semiconductor layer 10 in case pedestal channel portions 11 are not employed) by a recess distance. A tunneling dielectric layer 56 is located over the charge storage material layer 154L. A set of a blocking dielectric layer 52, a charge storage material layer 154L, and a tunneling dielectric layer 56 in a memory opening 49 constitutes a memory film 50. In one embodiment, the first semiconductor channel layer 601, the tunneling dielectric layer 56, the charge storage material layer 154L, and the blocking dielectric layer 52 can have vertically coincident sidewalls. In case a sacrificial cover material layer is employed in lieu of the first semiconductor channel layer 601, the sacrificial cover material layer can be removed selective to the tunneling dielectric layer 56.

Figures 72E, 72F:
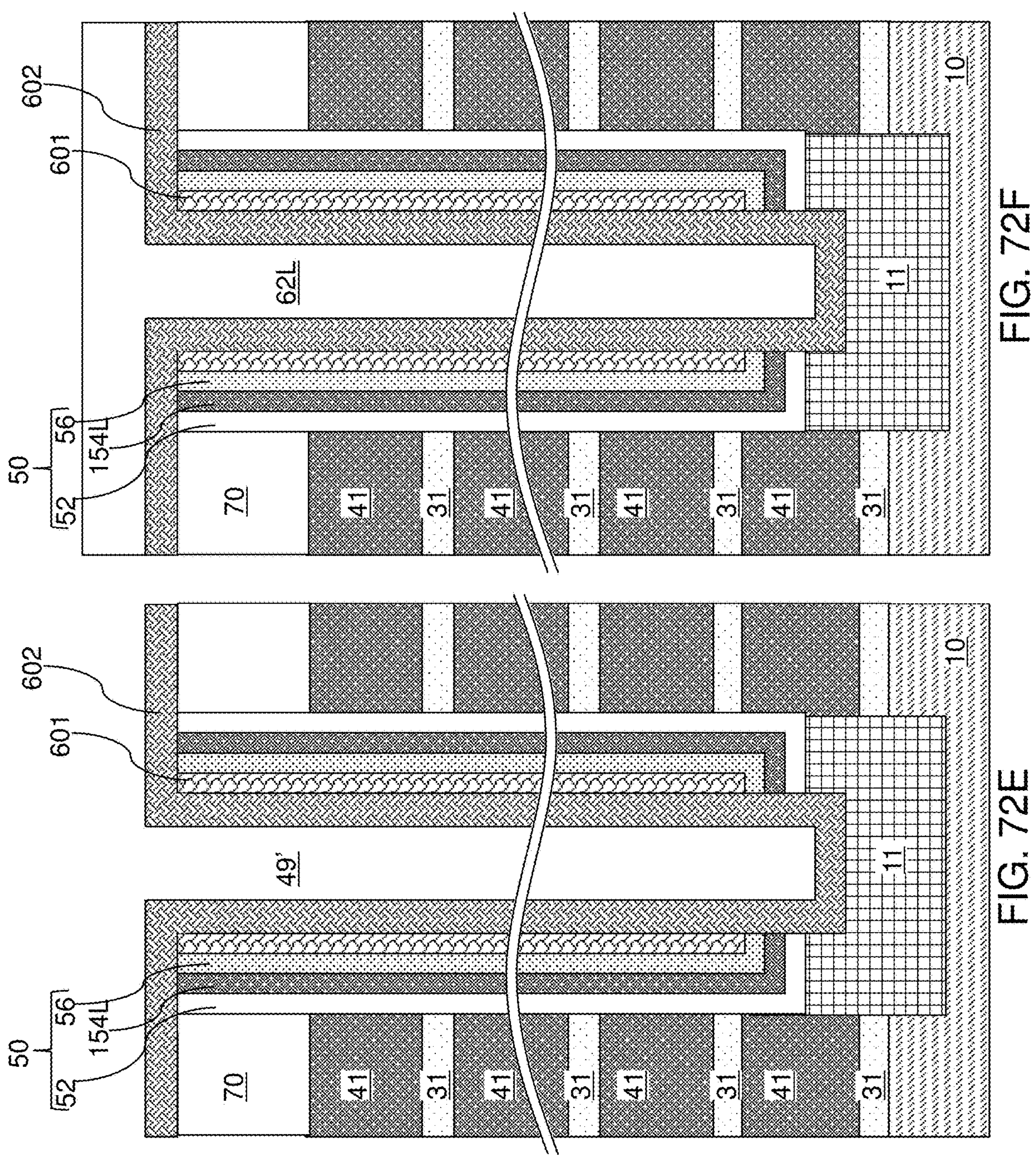

Referring to FIG. 72E, a second semiconductor channel layer 602 can be deposited directly on the semiconductor surface of the pedestal channel portion 11 or the upper substrate semiconductor layer 10 if the pedestal channel portion 11 is omitted, and directly on the first semiconductor channel layer 601 (if present) or on the tunneling dielectric layer 56 (if layer 601 is omitted). The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 72F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figures 72G, 72H:
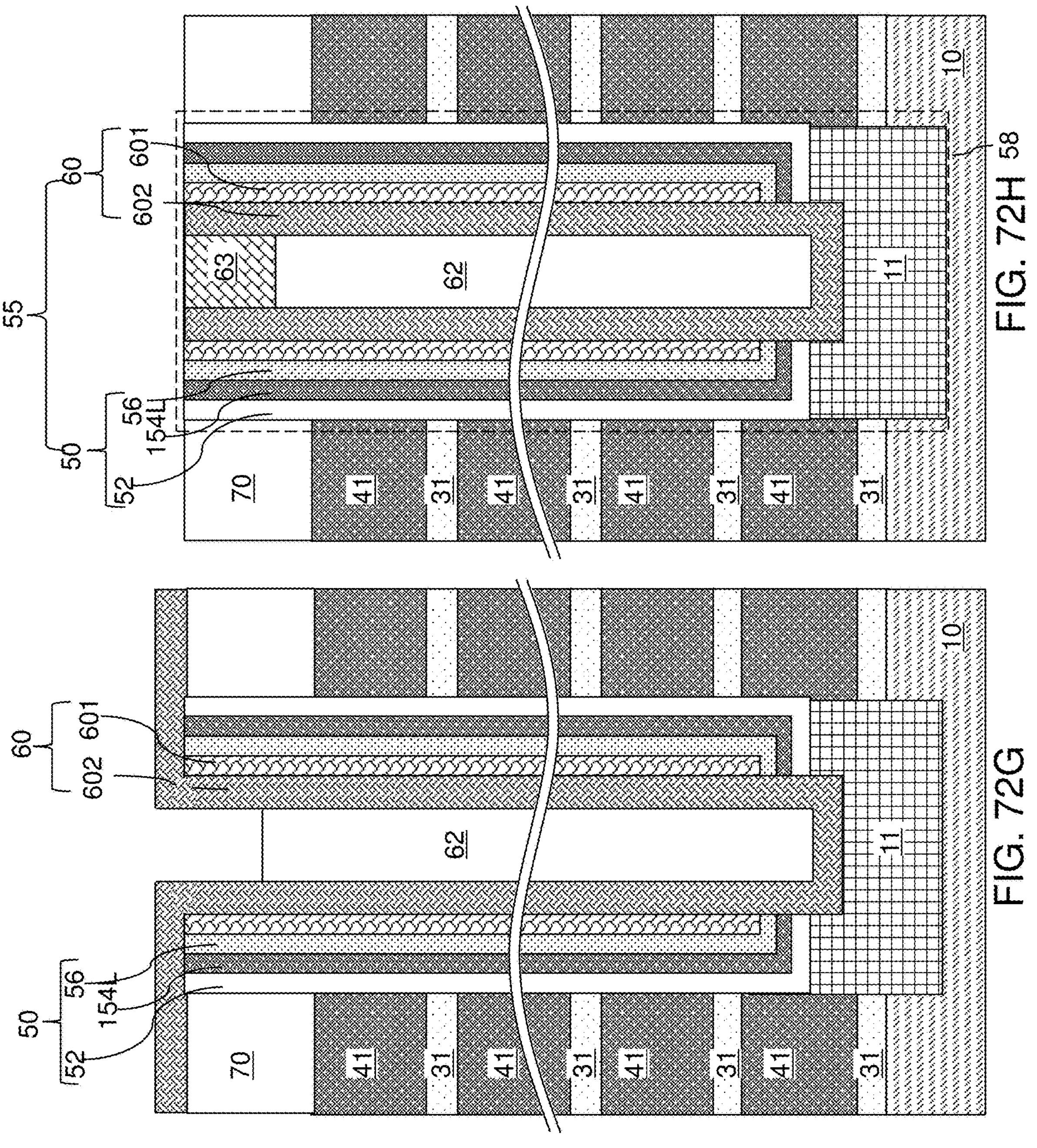

Referring to FIG. 72G, the horizontal portion of the dielectric core layer 62L can be removed, for example, by a recess etch from above the top surface of the insulating cap layer 70. The dielectric core layer 62L can be vertically recessed until top surfaces of remaining portions of the dielectric core layer 62L are recessed below the horizontal plane including the top surface of the insulating cap layer 70. Each remaining portion of the dielectric core layer 62L constitutes a dielectric core 62.

Referring to FIG. 72H, a doped semiconductor material having a doping of a second conductivity type can be deposited to form a recess region overlying the dielectric core 62. The second conductivity type that is the opposite of the first conductivity type. For example, if the first conductivity type is p-type, the second conductivity type is n-type, and vice versa. The dopant concentration in the doped semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material and horizontal portions of the second semiconductor channel layer 602 can be removed from above the top surface of the insulating cap layer 70, for example, by chemical mechanical planarization (CMP). Each remaining portion of the doped semiconductor material having a doping of the second conductivity type constitutes a drain region 63. Each remaining portion of the second semiconductor channel layer 602 can be located entirety within a memory opening 49. Each adjoining pair of a first semiconductor channel layer 601 (if present) and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage material layer 154L, and laterally surrounds a portion of the vertical semiconductor channel 60. The blocking dielectric layer 52 laterally surrounds and contacts the charge storage material layer 154L. Each adjoining set of a blocking dielectric layer 52, a charge storage material layer 154L, and a tunneling dielectric layer 56 collectively constitute a memory film 50.

Each combination of a memory film 50 and a vertical semiconductor channel 60 within a memory opening 49 constitutes a memory stack structure 55. Each combination of a pedestal channel portion 11 (if present), a memory stack structure 55, a dielectric core 62, and a drain region 63 within a memory opening 49 is herein referred to as a memory opening fill structure 58.

Figure 73:
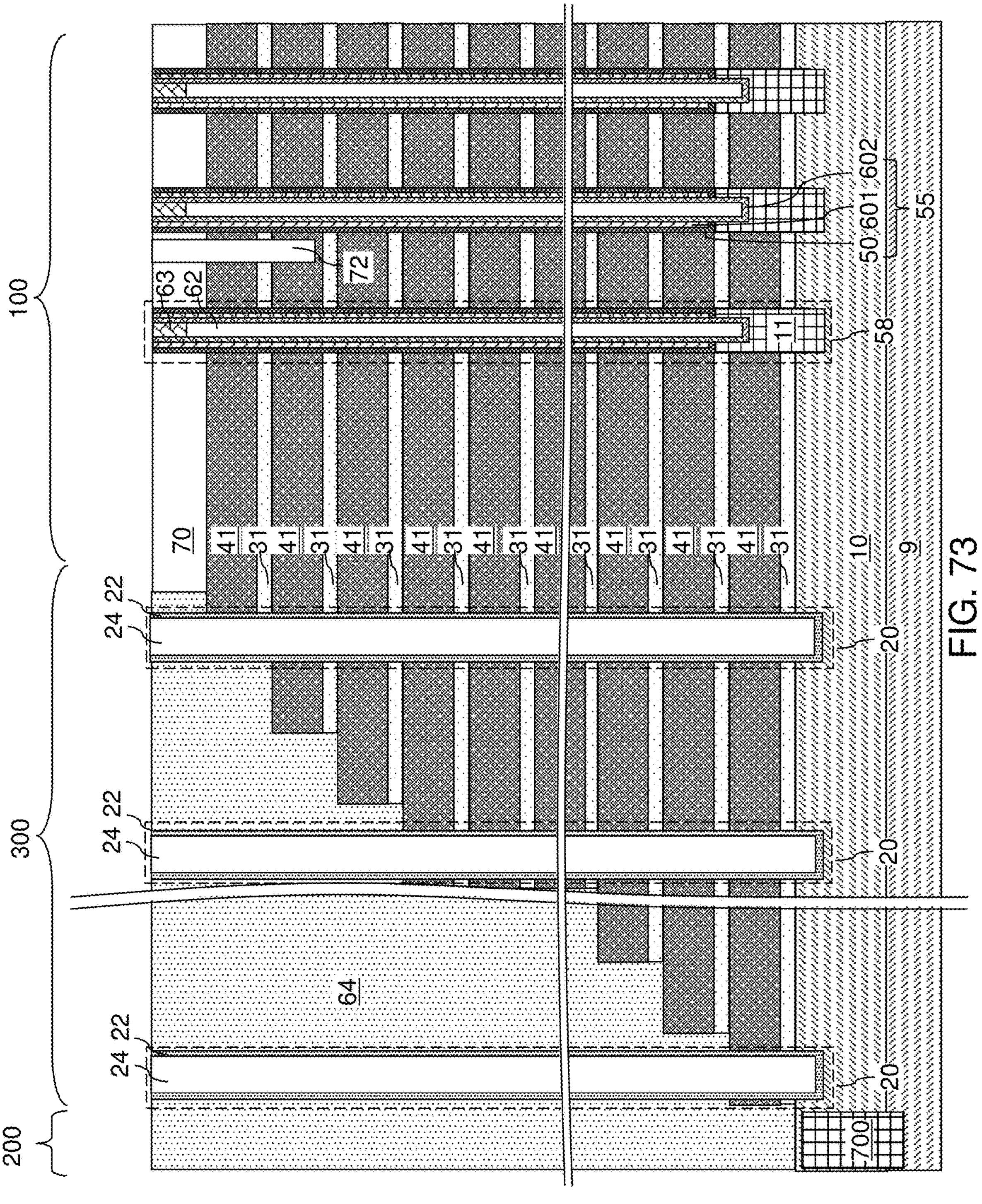
FIG. 73 is a vertical cross-sectional view of the seventh exemplary structure after formation of memory opening fill structures according to the seventh embodiment of the present disclosure.

Referring to FIG. 73, the seventh exemplary structure is illustrated after formation of memory opening fill structures 58 and support pillar structure 20 within the memory openings 49 and the support openings 19, respectively. An instance of a memory opening fill structure 58 can be formed within each memory opening 49. An instance of the support pillar structure 20 can be formed within each support opening 19. Each memory stack structure 55 includes a vertical semiconductor channel 60, which may comprise multiple semiconductor channel layers (601, 602) or a single semiconductor channel layer 602, and a memory film 50.

Figure 74A:
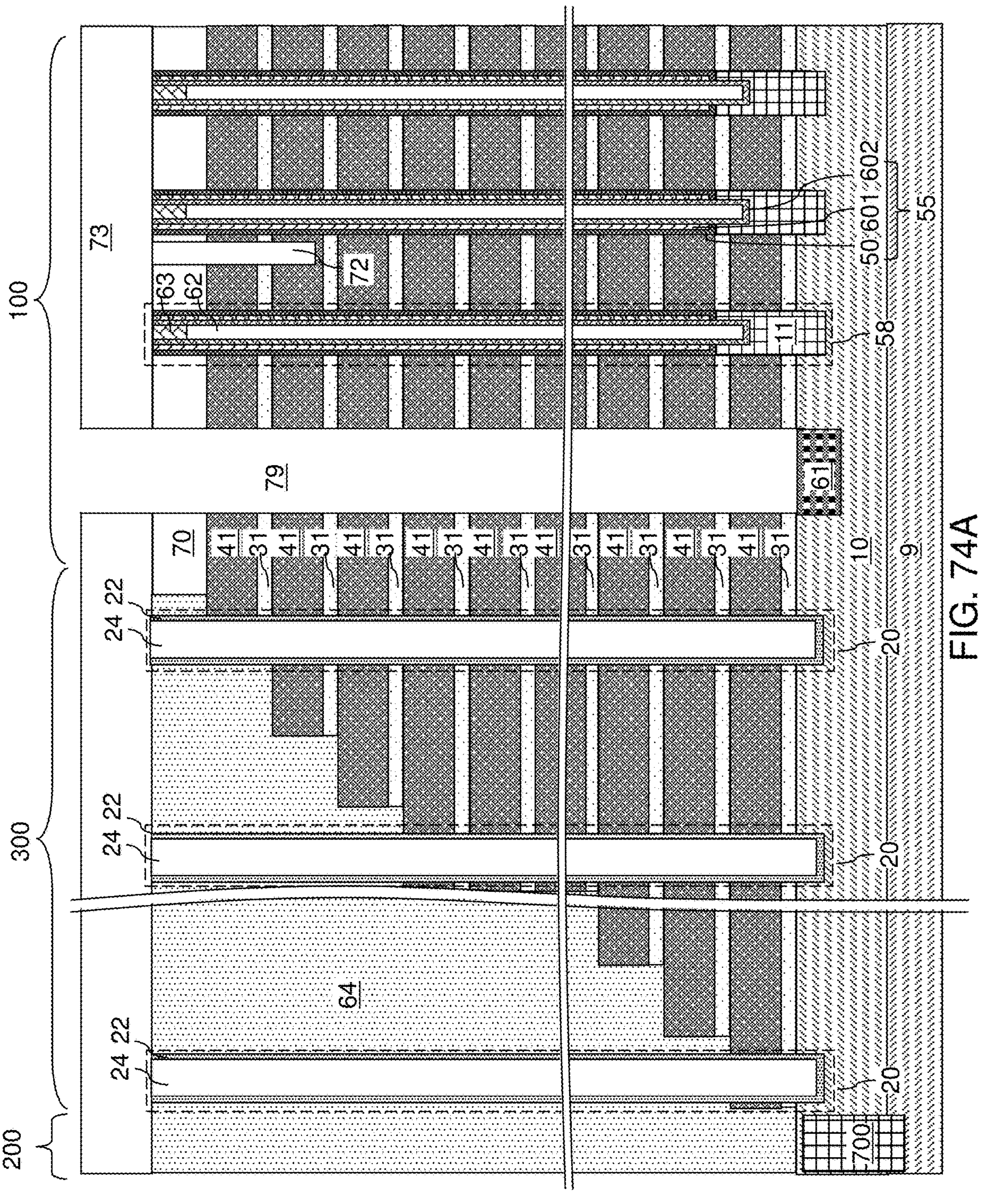
FIG. 74A is a vertical cross-sectional view of the seventh exemplary structure after formation of a contact-level dielectric layer, backside trenches, and source regions according to the seventh embodiment of the present disclosure.
Figure 74B:
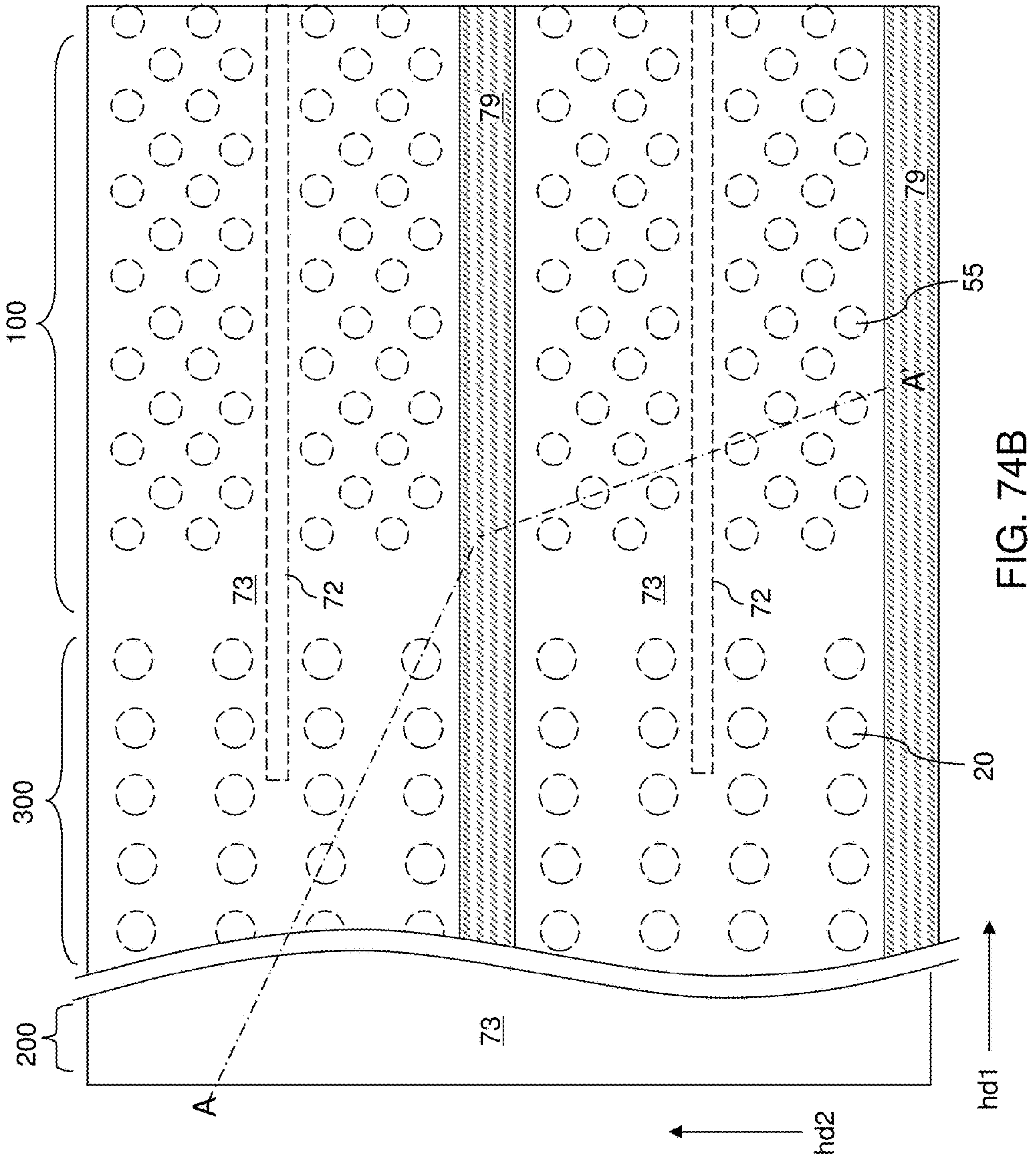
FIG. 74B is a top-down view of the seventh exemplary structure of FIG. 74A. The vertical plane A-A' is the cut plane of the vertical cross-sectional view of FIG. 74A.

Referring to FIGS. 74A and 74B, a contact-level dielectric layer 73 can be formed over the alternating stack (31, 41) of disposable material layer 31 and silicon nitride layers 41, and over the memory stack structures 55 and the support pillar structures 20. The contact-level dielectric layer 73 includes a dielectric material that is different from the dielectric material of the silicon nitride layers 41. For example, the contact-level dielectric layer 73 can include carbon-doped silicon oxide (i.e., silicon oxycarbide). The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (31, 41) and/or the retro-stepped dielectric material portion 64 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 (e.g., word line direction) and can be laterally spaced apart from each other along a second horizontal direction hd2 (e.g., bit line direction) that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

An optional source region 61 can be formed at a surface portion of the upper substrate semiconductor layer 10 under each backside trench 79 by implantation of electrical dopants into physically exposed surface portions of the upper substrate semiconductor layer 10. Each source region 61 is formed in a surface portion of the substrate (9, 10) that underlies a respective backside trench 79. An upper portion of the upper substrate semiconductor layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. Semiconductor channels (59, 11, 60) extend between each source region 61 and a respective set of drain regions 63. The semiconductor channels (59, 11, 60) include the vertical semiconductor channels 60 of the memory stack structures 55. Alternatively, a horizontal direct strap contact may be formed instead of the source region 61 as described above with respect to the third embodiment.

Figure 75:
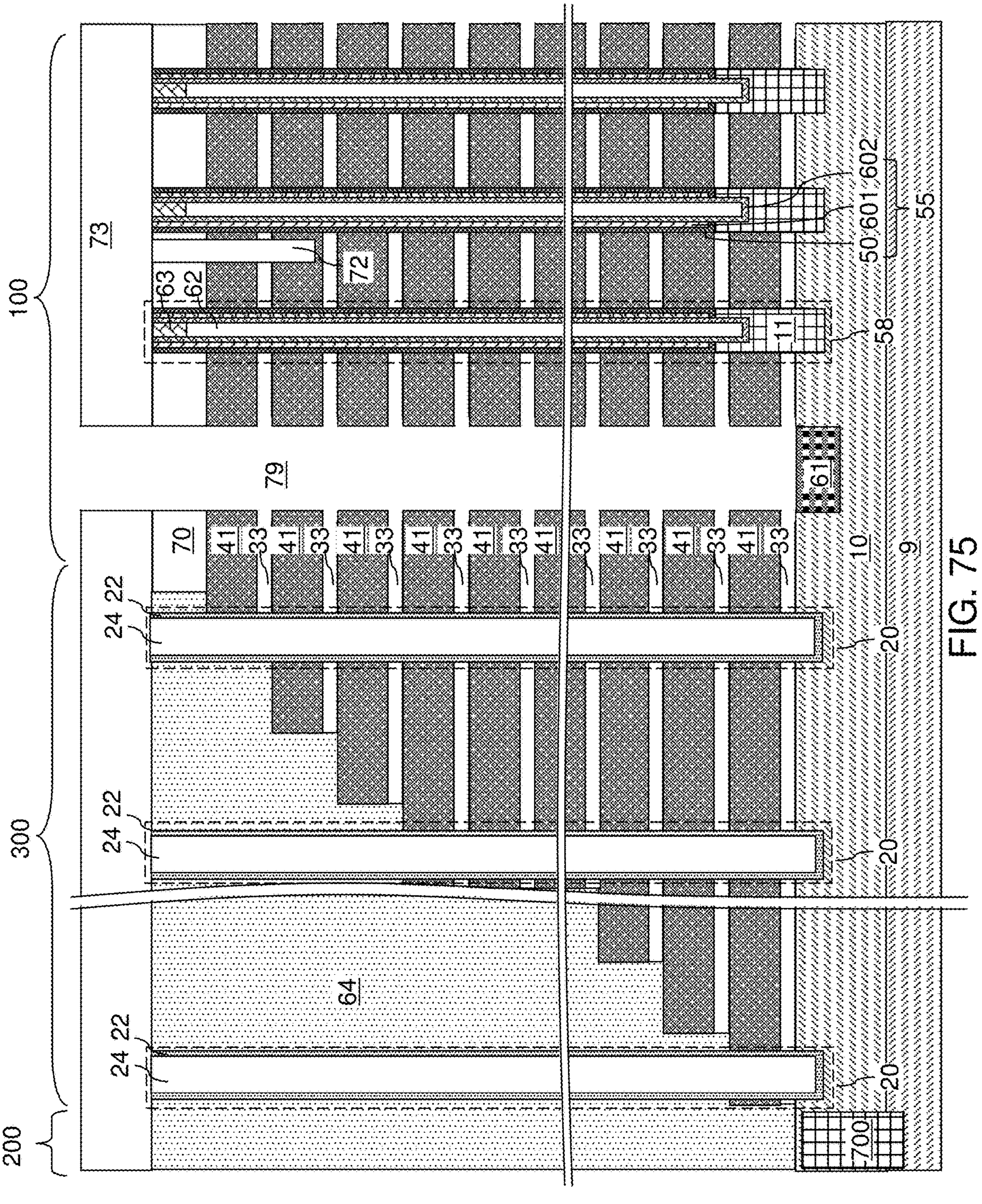
FIG. 75 is a vertical cross-sectional view of the seventh exemplary structure after formation of laterally-extending cavities by removal of the disposable material layers according to the seventh embodiment of the present disclosure.
Figure 76A:
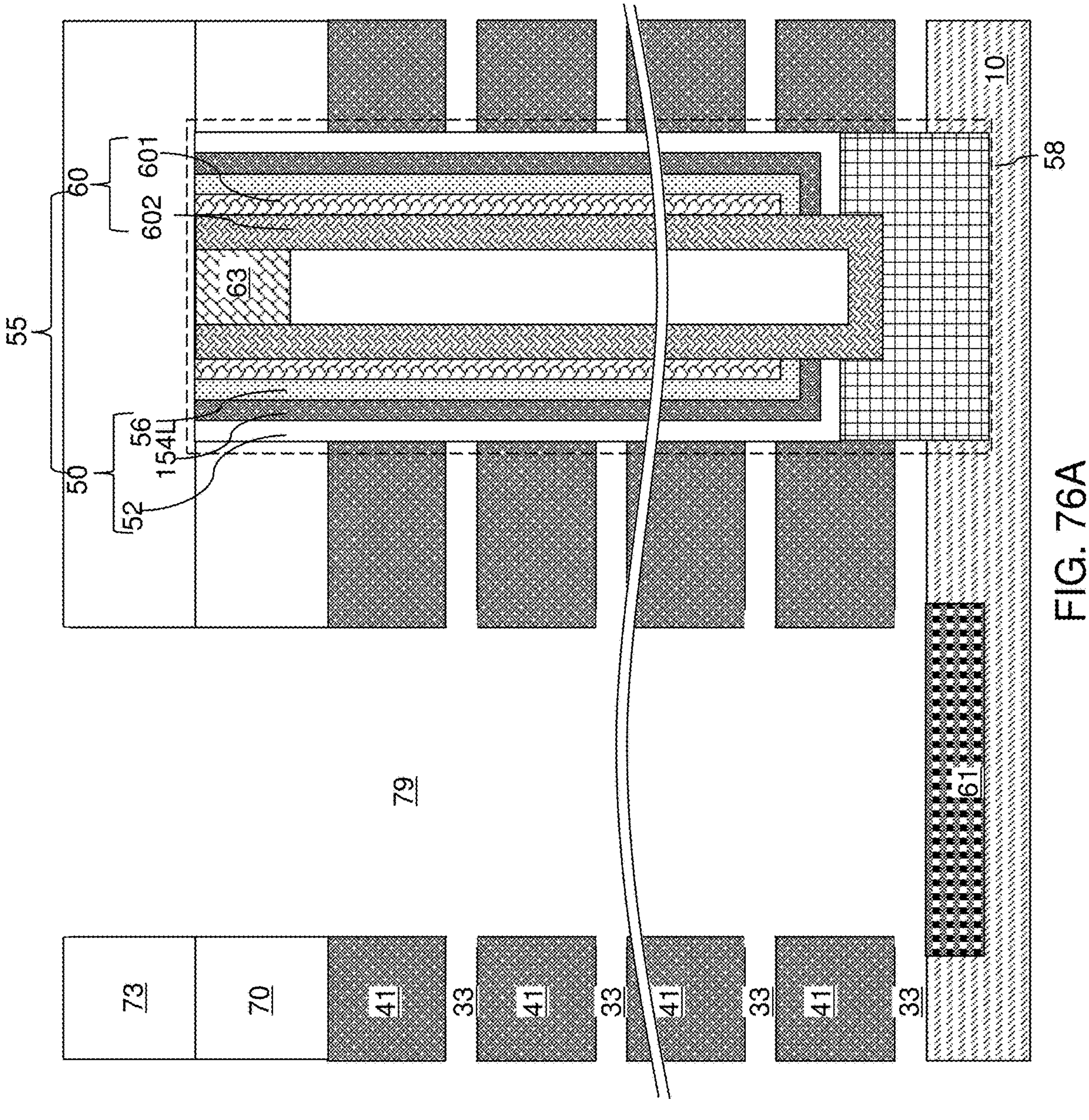
FIG. 76A-76G are sequential vertical cross-sectional views of a region of the seventh exemplary structure around a memory opening fill structure during formation of insulating layers and electrically conductive layers according to the seventh embodiment of the present disclosure.

Referring to FIGS. 75 and 76A, laterally-extending cavities 33 can be formed by removal of the disposable material layers 31 selective to the silicon nitride layers 41. An isotropic etch process can be employed to remove the disposable material layers 31 selective to the silicon nitride layers 41. In case the disposable material layers 31 include undoped silicate glass (e.g., silicon oxide), a doped silicate glass, or organosilicate glass, a wet etch process employing hydrofluoric acid may be employed. In this case, the retro-stepped dielectric material portion 64 and the contact-level dielectric layer 73 can include carbon doped silicate glass to minimize collateral etching. In case the disposable material layers 31 include a silicon-germanium alloy, an etchant employing a mixture of dilute hydrofluoric acid and hydrogen peroxide may be employed for the isotropic etch process. Generally, the laterally-extending cavities 33 can be formed by removing the disposable material layers 31 selective to the silicon nitride layers 41 and the memory opening fill structures 58.

Figure 76B:
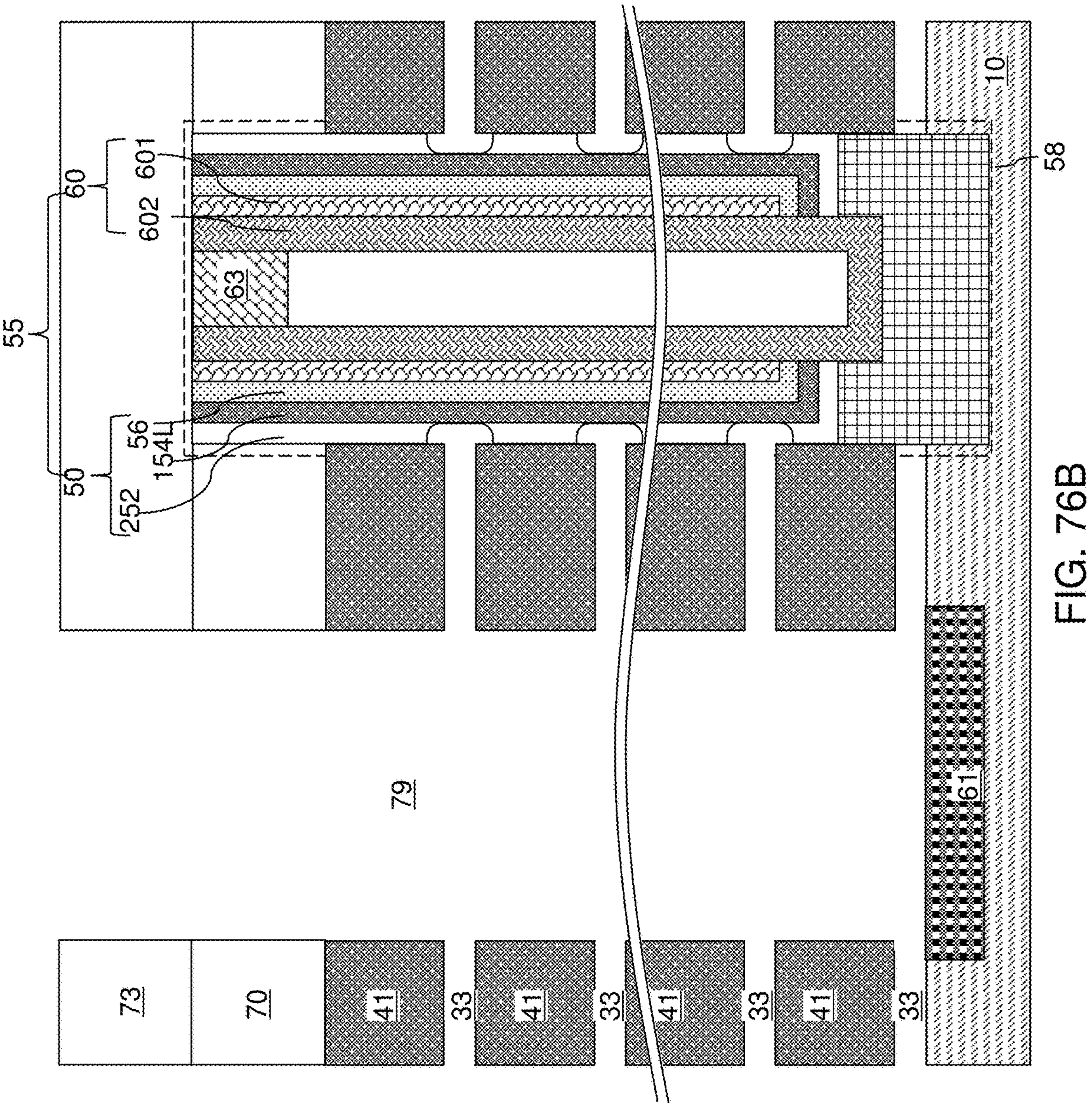

Referring to FIG. 76B, the isotropic etch process of FIG. 76A can be continued or a new isotropic etch process can be performed to isotropically recess physically exposed portions of the blocking dielectric layer 52 of each memory opening fill structure 58 selective to the material of the silicon nitride layers 41. For example, if the blocking dielectric layers 52 comprise silicon oxide, the wet etch process employing dilute hydrofluoric acid can be continued or performed to recess portions of the blocking dielectric layers 52 that are proximal to the laterally-extending cavities 33. The duration of the isotropic etch process can be selected such that the etch distance of the isotropic etch process is greater than the thickness of the blocking dielectric layers 52. Thus, annular surface segments of each charge storage material layer 154L can be physically exposed after the isotropic etch process. Each blocking dielectric layer 52 can be divided into a respective vertical stack of tubular insulating spacers 252. Generally, portions of each blocking dielectric layer 52 can be removed from around the laterally-extending cavities 33, and remaining portions of the blocking dielectric layer 52 comprise a vertical stack of tubular insulating spacers 252. In one embodiment, each of the tubular insulating spacers 252 may comprise at least one concave annular surface segment that is exposed to a respective one of the laterally-extending cavities 33. A plurality of tubular insulating spacers 252 may comprise a respective pair of concave annular surface segments.

Figure 76C:
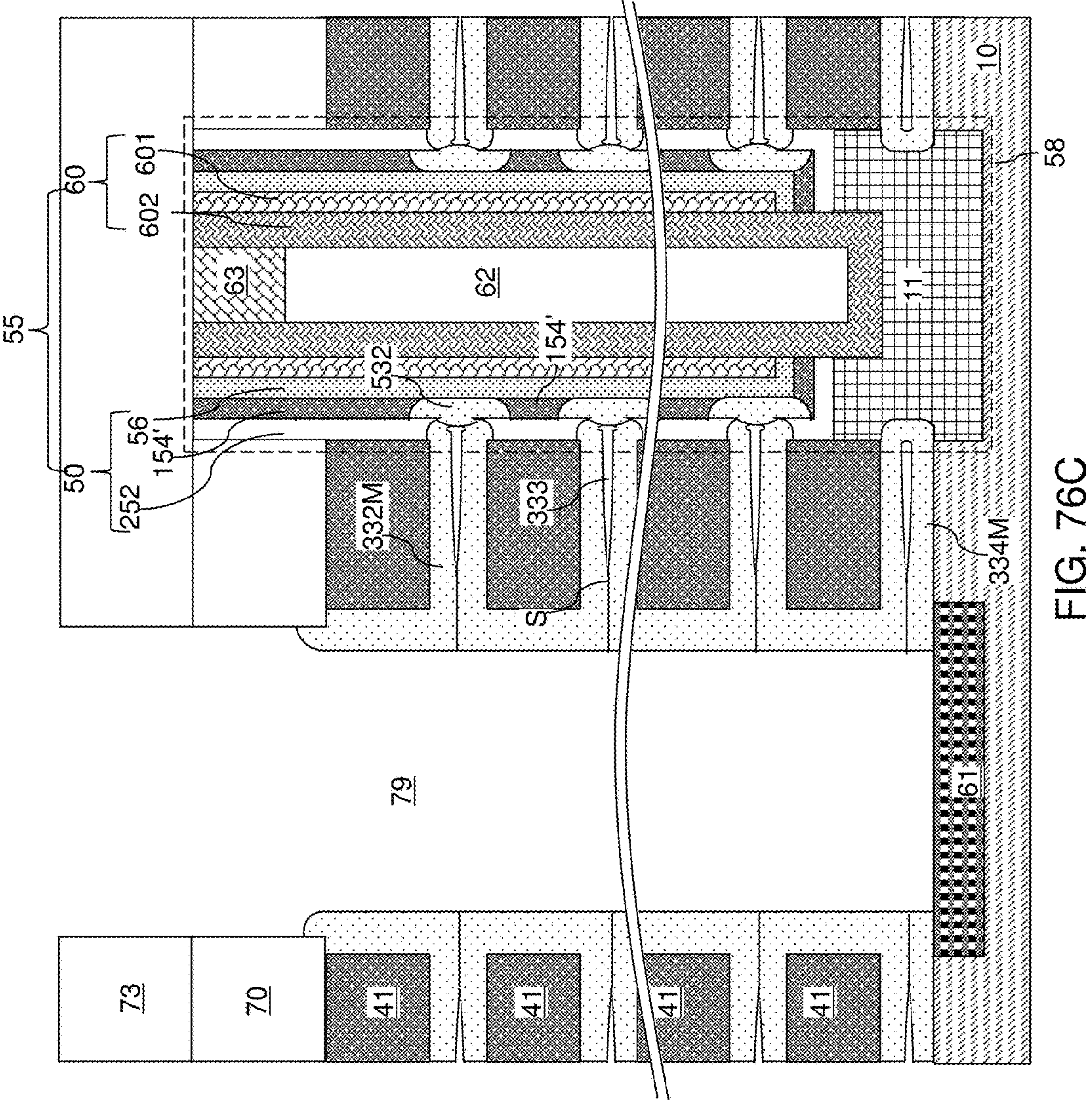

Referring to FIG. 76C, an oxidation process can be performed to convert surface portions of the silicon nitride material in the charge storage material layers 154L and in the silicon nitride layers 41 into silicon oxide material portions. The silicon oxide material portions may comprise undoped silicon oxide (e.g., silicon dioxide) or a nitrogen doped silicon oxide (e.g., silicon oxynitride) depending on the oxidation process parameters. In one embodiment, the oxidation process may comprise a high pressure oxidation process in a water vapor ambient. The high pressure oxidation process may be conducted at a temperature of at least 750 degrees Celsius, such as 800 to 1000 degrees Celsius, for example, 850 to 950 degrees Celsius, at a pressure of at least 10 atm, for example 15 to 50 atm, such as 20 to 30 atm for at least 10 minutes, for example 15 to 60 minutes, such as 30 to 45 minutes.

The oxidation process converts surface portions of each charge storage material layer 154L that are exposed in the laterally-extending cavities 33 into a vertical stack of annular silicon oxide material portions 532. Further, the oxidation process converts surface portions of the silicon nitride layers 41 that are proximal to the laterally-extending cavities 33 into silicon oxide material portions 332M that expand in volume to fill the laterally-extending cavities 33. The duration of the oxidation process can be selected such that pairs of silicon oxide material portions 332M merge with a respective horizontally-extending seam S in a plurality of laterally-extending cavities 33 of the laterally-extending cavities 33. A silicon oxide material portion 332M that is formed by conversion of a bottom portion of a bottommost silicon nitride layer 41 can merge within a silicon oxide portion 334M that is formed by oxidation of a surface portion of the semiconductor material layer 10 and a surface portion of a surface portion of a pedestal channel portion 11.

Remaining portions of each charge storage material layer 154L that are not converted into a respective vertical stack of annular silicon oxide material portions 532 comprise a vertical stack of discrete silicon nitride charge storage material portions 154'. Each vertical stack of silicon nitride charge storage material portions 154' can be interlaced with a respective vertical stack of annular silicon oxide material portions 532 along a vertical direction. Each annular silicon oxide material portion 532 within the vertical stacks of annular silicon oxide material portions 532 may contact a respective merged pair of silicon oxide material portions 332M of the merged pairs of silicon oxide material portions 332M.

In one embodiment, each memory opening fill structure 58 may be formed in a respective memory opening 49. Each memory opening fill structure 58 may comprise a vertical stack of discrete silicon nitride charge storage material portions 154', a vertical stack of annular silicon oxide material portions 532 that is interlaced with the vertical stack of silicon nitride charge storage material portions 154' along a vertical direction, and a vertical semiconductor channel 60. Each silicon oxide material portion 532 in the vertical stack of annular silicon oxide material portions 532 may comprise a doped silicon oxide material having a graded material composition in which an atomic concentration of nitrogen atoms decreases with a distance from an interface with a most proximal one of the silicon nitride charge storage material portions 154'.

In one embodiment, an air gap (i.e., encapsulated cavity) 333 may be formed within at least one of the laterally-extending cavities 33. The air gap 333 may be formed adjacent to one, a plurality or each of the horizontally-extending seams S at which two silicon oxide material portions 332M merge, or at which a silicon oxide material portion 332M and a silicon oxide material portion 334M merge. Each air gap 333 may be adjoined to a respective one of the horizontally-extending seams S, and may be laterally bounded by a respective annular silicon oxide material portion 532 within a vertical stack of annular silicon oxide material portions 532.

In one embodiment, each of the silicon oxide material portions 332M may be in direct contact with a respective one of the annular silicon oxide material portions 532 within a vertical stack of annular silicon oxide material portions 532. Each of the silicon oxide material portions 332M may comprise a doped or undoped silicon oxide material. In one embodiment, each of the silicon oxide material portions 332M may comprise a nitrogen doped silicon oxide having a vertical compositional modulation in an atomic concentration of nitrogen atoms therein. In one embodiment, each of the silicon oxide material portions 332M that overlies a horizontally-extending seam S may have a vertical compositional gradient in which an atomic concentration of nitrogen atoms increases with an upward vertical distance from the horizontally-extending seam S. In one embodiment, each of the silicon oxide material portions 332M that underlies a horizontally-extending seam S may have a vertical compositional gradient in which an atomic concentration of nitrogen atoms increases with a downward vertical distance from the horizontally-extending seam S.

In one embodiment, each air gap 333 may be adjoined to a respective horizontally-extending seam S, and may laterally surround at least one memory opening fill structure 58, (e.g., may surround one or a plurality of memory opening fill structures 58). In one embodiment, each air gap 333 may be bounded by and may be in contact with an outer surface of a respective annular silicon oxide material portion 532 within a vertical stack of annular silicon oxide material portions 532.

In one embodiment, each surface of the annular silicon oxide material portions 532 that contacts a respective one of the silicon nitride charge storage material portions 154' has a convex vertical cross-sectional profile.

Figure 76D:
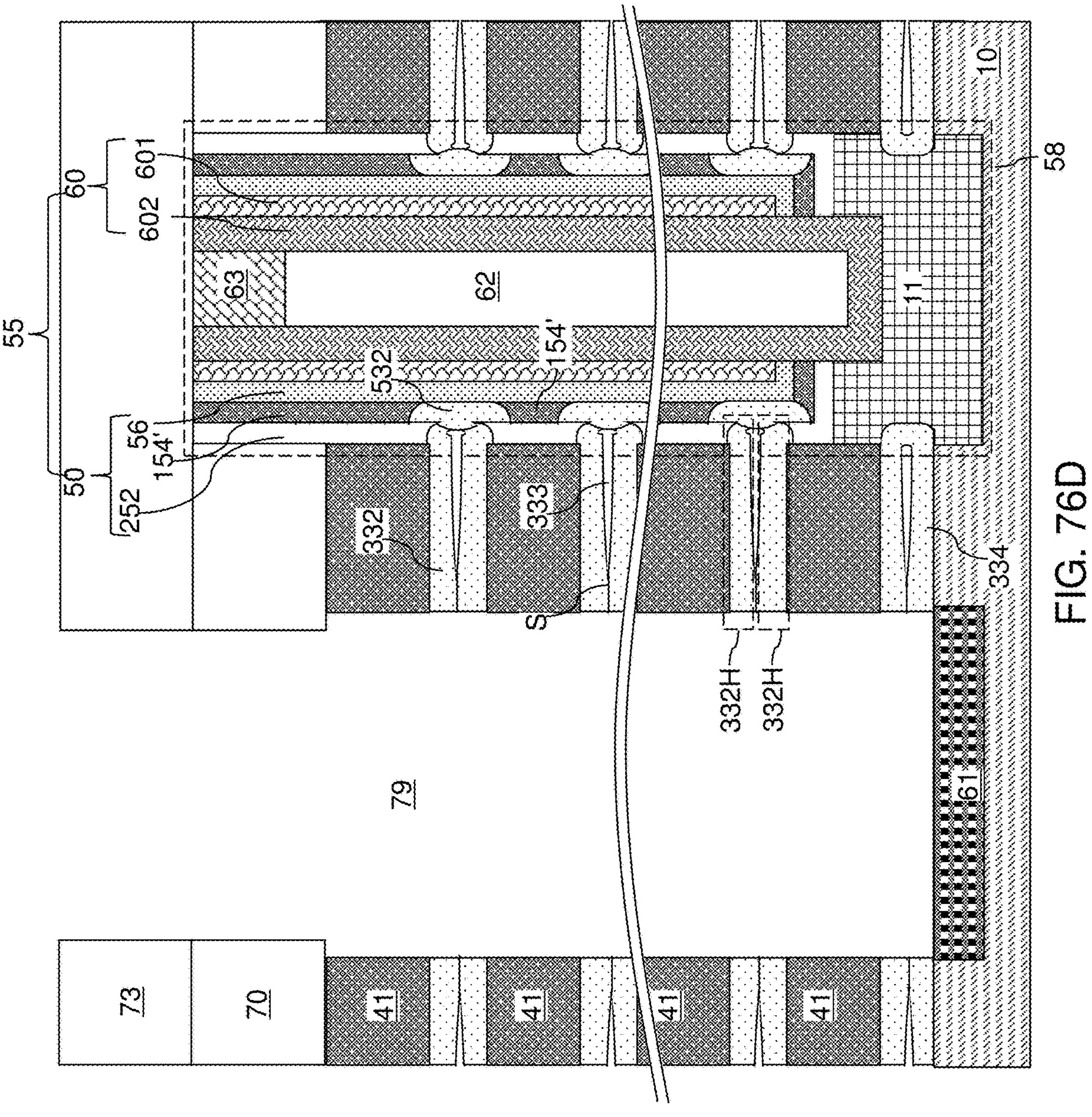

Referring to FIG. 76D, an isotropic etch process may be performed to laterally recess the silicon oxide material portions 332M and the silicon oxide material portion 334M selective to the silicon nitride material of the silicon nitride layers 41. The duration of the isotropic etch process may be selected such that sidewalls of the silicon nitride layers 41 are physically exposed around each of the backside trenches 79. For example, a wet etch process employing dilute hydrofluoric acid may be performed to isotropically recess the silicon oxide material portions 332M and the silicon oxide material portion 334M. The remaining parts of the silicon oxide material portions 332M that fill the laterally-extending cavities constitute insulating layers 332. Each insulating layer 332 may comprise a pair of horizontally-extending silicon oxide material portions 332H separated by the seam S and/or the air gap 333. For example, each insulating layer 332 may comprise a horizontally-extending seam S at which the pair of horizontally-extending silicon oxide material portions 332H contact each other. A bottommost one of the insulating layers 332 may comprise a combination of a horizontally-extending silicon oxide material portion 332H and a silicon oxide material portion 334.

One, a plurality or each of the insulating layers 332 may comprise an air gap 333 therein. Each air gap 333 may be adjoined to a respective one of the horizontally-extending seams S and laterally bounded by a respective annular silicon oxide material portion 532 within a vertical stack of annular silicon oxide material portions 532.

Figure 76E:
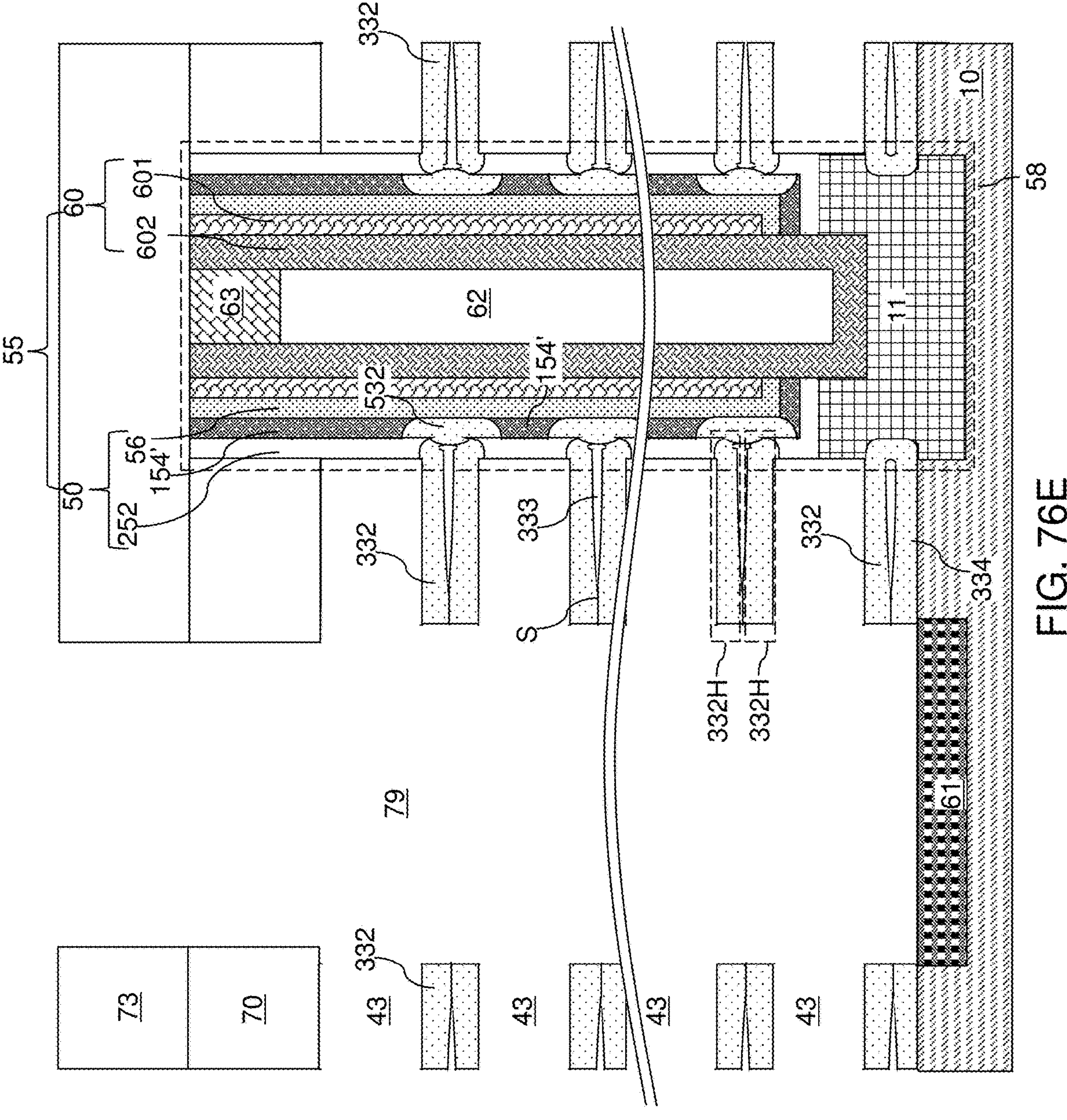

Referring to FIG. 76E, backside recesses 43 can be formed by removing the remaining portions of the silicon nitride layers 41 selective to the insulating layers 332 and the vertical stacks of tubular insulating spacers 252. An etchant that selectively etches the silicon nitride of the silicon nitride layers 41 with respect to the silicon oxide material of the insulating layers 332 can be introduced into the backside trenches 79, for example, employing an etch process. Backside recesses 43 are formed in volumes from which the silicon nitride layers 41 are removed. The removal of the silicon nitride material of the silicon nitride layers 41 can be selective to the silicon oxide material of the insulating layers 332, the dielectric material of the tubular insulating spacers 252, the dielectric material of the retro-stepped dielectric material portion 65, and the semiconductor material of the source regions 61.

In one embodiment, the etch process can be a wet etch process in which the seventh exemplary structure is immersed within a wet etch tank including phosphoric acid, which etches silicon nitride selective to silicon oxide, silicon, and various other materials employed in the art. The support pillar structure 20, the retro-stepped dielectric material portion 64, and the memory opening fill structures 58 provide structural support while the backside recesses 43 are present within volumes previously occupied by the silicon nitride layers 41.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the silicon material of the silicon nitride layers 41 is removed. The memory openings 49 in which the memory opening fill structures 58 are formed are herein referred to as front side openings or front side cavities in contrast with the backside recesses 43. In one embodiment, each backside recess 43 can define a space for receiving a respective word line of the array of vertical NAND strings. Each of the plurality of backside recesses 43 can extend substantially parallel to the top surface of the substrate (9, 10). A backside recess 43 can be vertically bounded by a top surface of an underlying insulating layer 332 and a bottom surface of an overlying insulating layer 332.

Figure 76F:
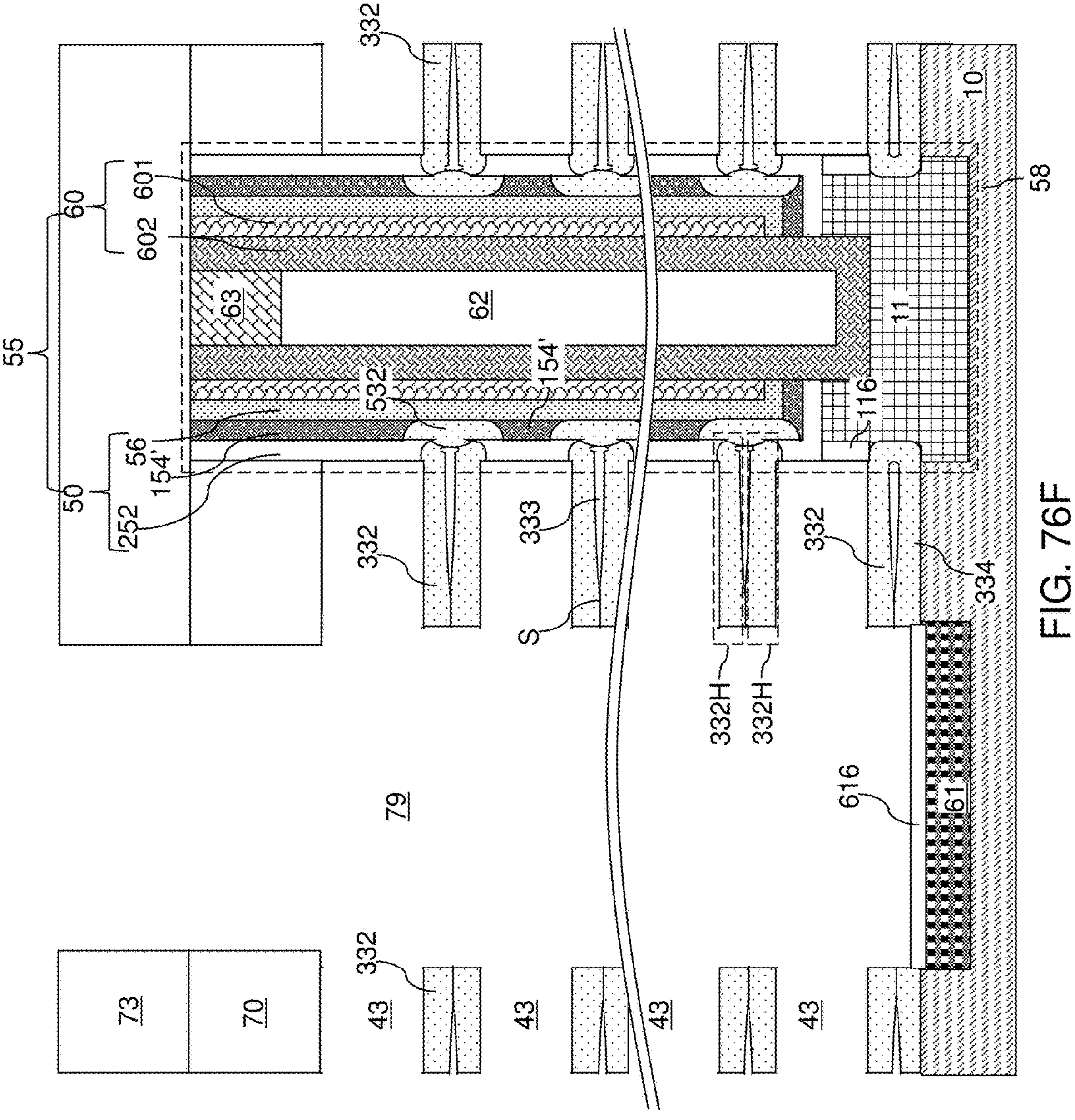

Referring to FIG. 76F, an optional oxidation process can be performed to convert physically exposed surface portions of the optional pedestal channel portions 11 into tubular dielectric spacers 116, and to convert top surface portions of the source regions 61 into planar dielectric portions 616. The lateral thickness of the tubular dielectric spacers 116 may be in a range from 4 nm to 10 nm, such as from 5 nm to 7 nm, although lesser and greater thicknesses may also be employed. The oxidation process may comprise a thermal oxidation process that is performed at an elevated temperature. In this case, dopants in the drain regions 63, the source regions 61, and the semiconductor channels 60 can be activated during the thermal oxidation process.

If the insulating layers 332 have sharp corners (e.g., a "bird's beak") formed during the oxidation, then an optional etch process may be used to recess the insulating layers 332 and to remove the sharp corners (i.e., the bird's beak). For example, a selective chemical dry etch may be used to remove the sharp corners.

Figure 76G:
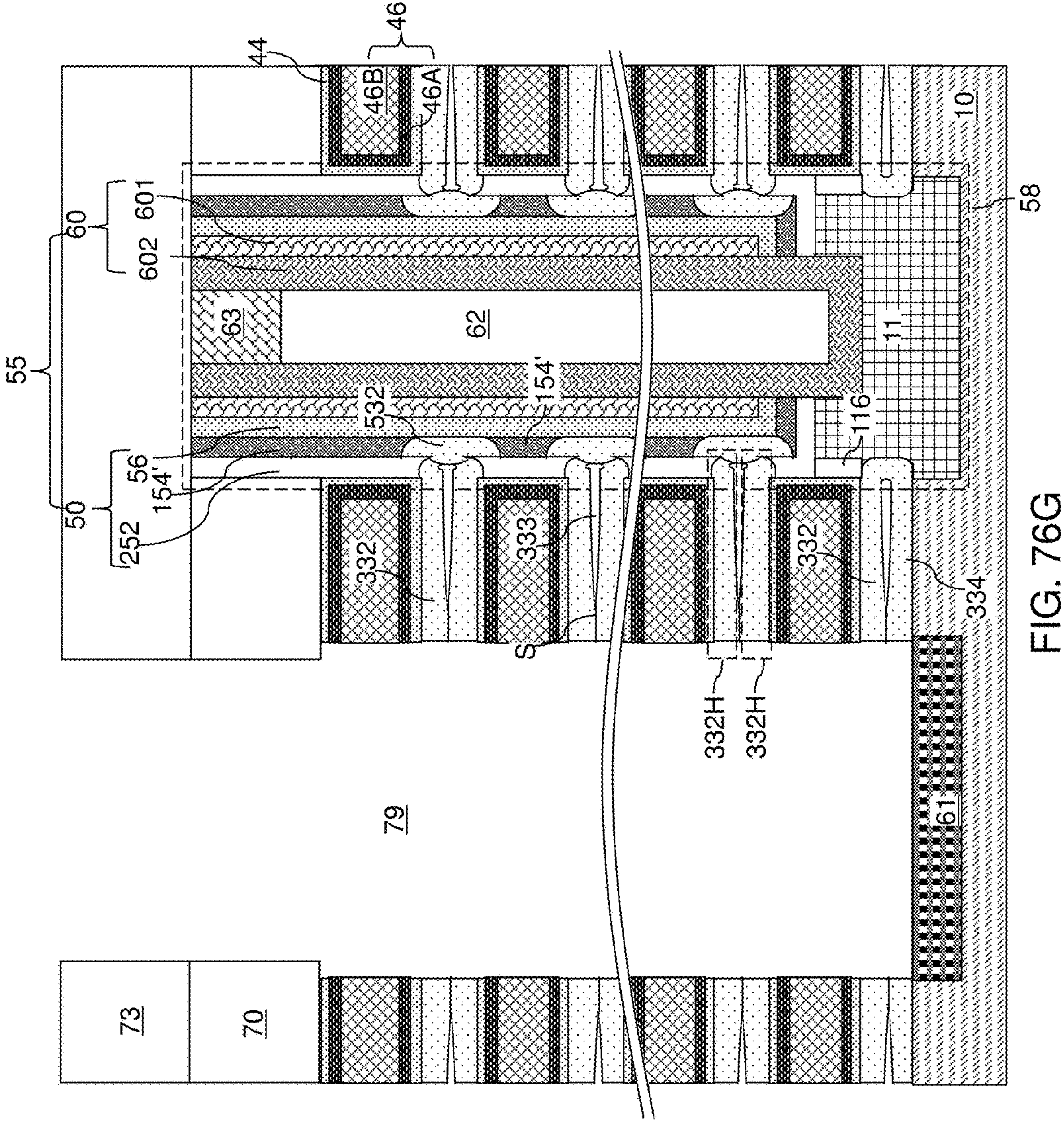

Referring to FIG. 76G, a backside blocking dielectric layer 44 can be optionally formed. The backside blocking dielectric layer 44, if present, comprises a dielectric material that functions as a control gate dielectric for the control gates to be subsequently formed in the backside recesses 43. The backside blocking dielectric layer 44 can be formed on the physically exposed surface of the tubular insulating spacers 252 and the insulating layers 332. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can comprise, and/or can consist essentially of, a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. A backside cavity is present within the portion of each backside trench 79 that is not filled with the backside blocking dielectric layer 44.

At least one metallic material can be conformally deposited in the backside recesses 43 to fill the backside recesses 43, and excess portions of the at least one metallic material can be removed from inside the backside trenches 79 and from above the contact-level dielectric layer 73. The at least one metallic material may comprise a metallic barrier layer 46A and a metallic fill material.

In one embodiment, the metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, MoN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

The metal fill material can be subsequently deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 332 and the memory stack structures 55 by the metallic barrier layer 46A, which is a metallic barrier layer that blocks diffusion of fluorine atoms therethrough.

The backside recesses 43 can be filled with the at least one metallic material (46A, 46B), and a continuous metallic material layer can be formed on the sidewalls of each backside trench 79 and over the contact level dielectric layer 73. A backside cavity is present in the portion of each backside trench 79 that is not filled with the backside blocking dielectric layer 44 and the continuous metallic material layer. The deposited metallic material of the continuous electrically conductive material layer is etched back from the sidewalls of each backside trench 79 and from above the contact level dielectric layer 73, for example, by an isotropic wet etch, an anisotropic dry etch, or a combination thereof. The planar dielectric portions 616 can be collaterally removed during removal of the continuous electrically conductive material layer. Each remaining portion of the deposited metallic material in the backside recesses 43 constitutes an electrically conductive layer 46. Each electrically conductive layer 46 can be a conductive line structure.

Each silicon nitride layer 41 can be replaced with an electrically conductive layer 46. Each electrically conductive layer 46 includes a portion of the metallic barrier layer 46A and a portion of the metallic fill material layer 46B that are located between a vertically neighboring pair of dielectric material layers such as a pair of insulating layers 332. An optional tubular dielectric spacer 116 laterally surrounds the optional pedestal channel portion 11. A bottommost electrically conductive layer 46 laterally surrounds each tubular dielectric spacer 116 upon formation of the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer may not be selective to the material of the backside blocking dielectric layer 44 or, the backside blocking dielectric layer 44 may not be employed.

Generally, remaining portions of the silicon nitride layers 41 as provided at the processing steps of FIG. 76D can be replaced with electrically conductive layers 46. In one embodiment, each of the insulating layers 332 is in direct contact with a respective annular silicon oxide material portion 532 within a vertical stack of annular silicon oxide material portions 532. In one embodiment, each of the insulating layers 332 comprises a silicon oxide material. In one embodiment, each of the insulating layers 332 comprises a nitrogen doped silicon oxide material which has a vertical compositional modulation in an atomic concentration of nitrogen atoms therein. In one embodiment, each of the insulating layers 332 has a horizontally-extending seam S therein.

In one embodiment, at least one of the insulating layers 332 has an air gap 333 that is adjoined to a respective horizontally-extending seam S and laterally surrounding the memory opening fill structure 58. In one embodiment, each air gap 333 is bounded by, and is in contact with, an outer surface of a respective annular silicon oxide material portion 532 within the vertical stack of annular silicon oxide material portions 532.

In one embodiment, each surface of the annular silicon oxide material portions 532 that contacts a respective one of the silicon nitride charge storage material portions 154' has a convex vertical cross-sectional profile.

In one embodiment, each memory opening fill structure 58 may comprise a vertical stack of tubular insulating spacers 252 that is interlaced with the insulating layers 332 along the vertical direction, wherein inner cylindrical sidewalls of the tubular insulating spacers 252 contact outer sidewalls of the silicon nitride charge storage material portions 154'. In one embodiment, each of the tubular insulating spacers 252 contacts at least one cylindrical outer surface segment of the vertical stack of annular silicon oxide material portions 532. In one embodiment, a subset of the insulating layers 332 comprises a respective pair of convex annular surface segments that contacts concave annular surface segments of a respective pair of tubular insulating spacers 252 among the tubular insulating spacers 252. In one embodiment, each tubular insulating spacer 252 among the vertical stack of tubular insulating spacers 252 has a homogeneous material composition throughout. For example, each tubular insulating spacer 252 may consist of a silicon oxide material such as undoped silicate glass or a doped silicate glass.

Figure 77A:
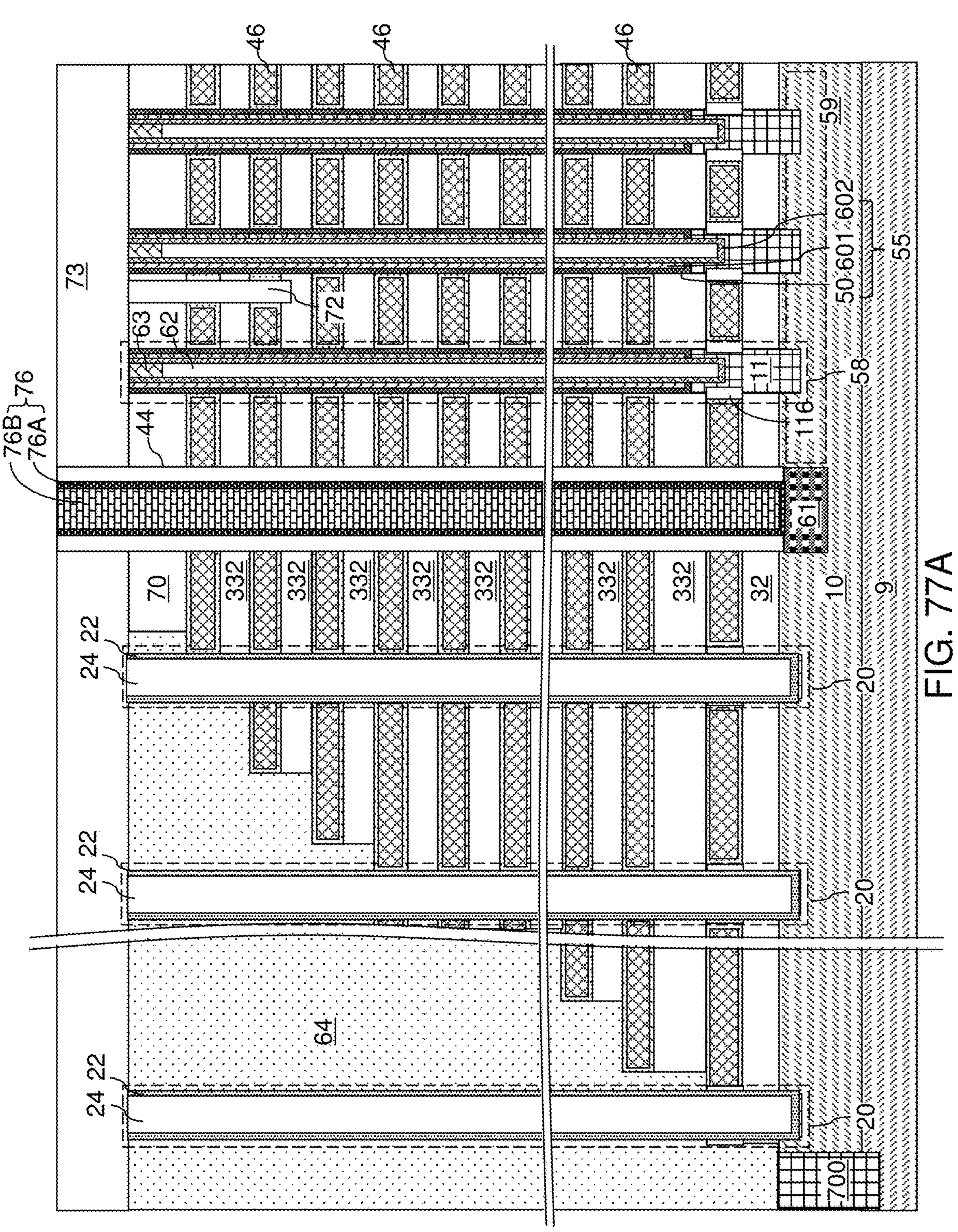
FIG. 77A is a schematic vertical cross-sectional view of the seventh exemplary structure after formation of backside trench fill structures according to the seventh embodiment of the present disclosure.
Figure 77B:
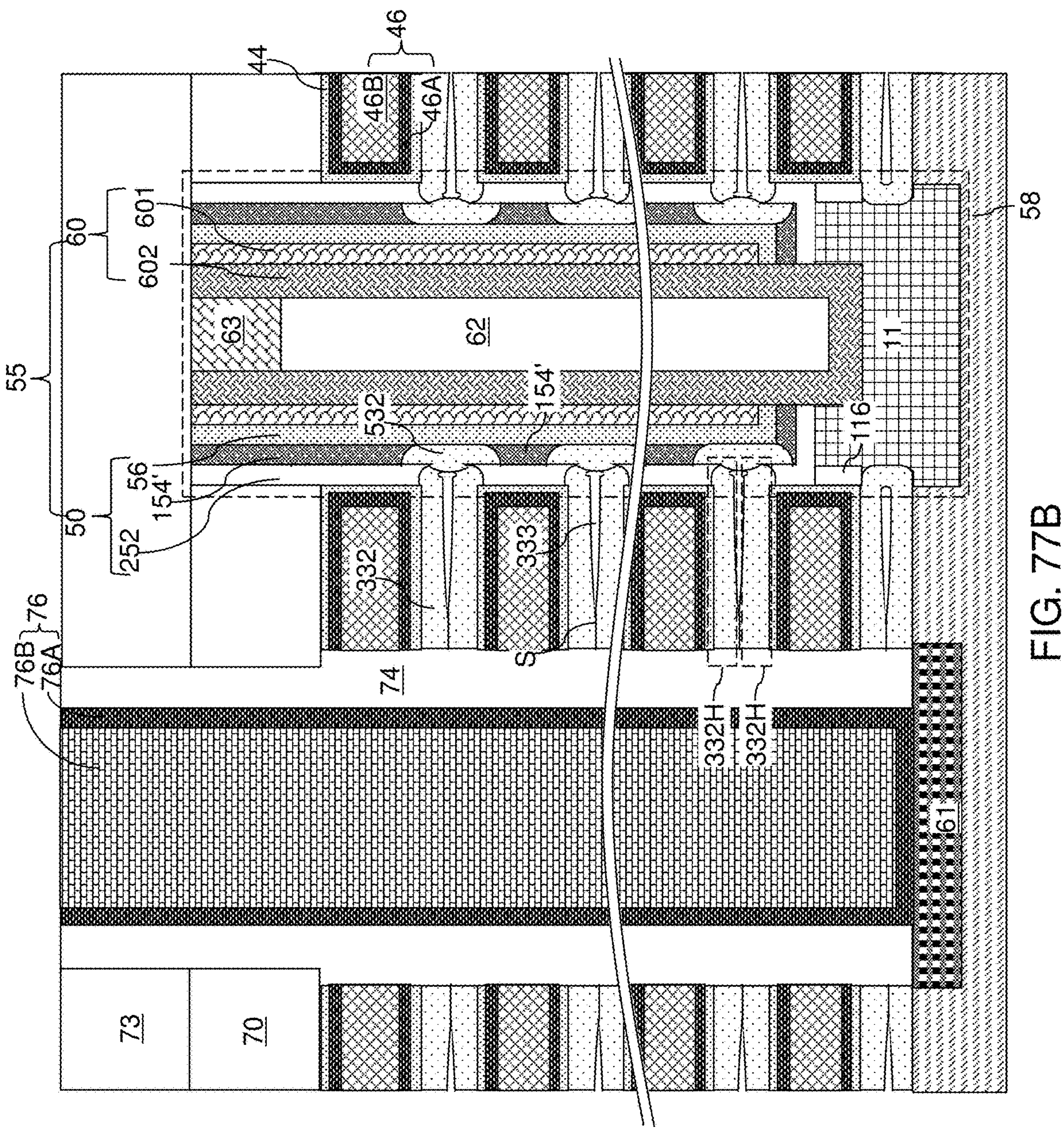
FIG. 77B is a magnified view of a region of the seventh exemplary structure of FIG. 77A.

Referring to FIGS. 77A and 77B, the processing steps described with reference to FIG. 38 can be performed to form a combination of an insulating spacer 74 and a backside contact via structure 76 in each backside trench 79.

Figure 78A:
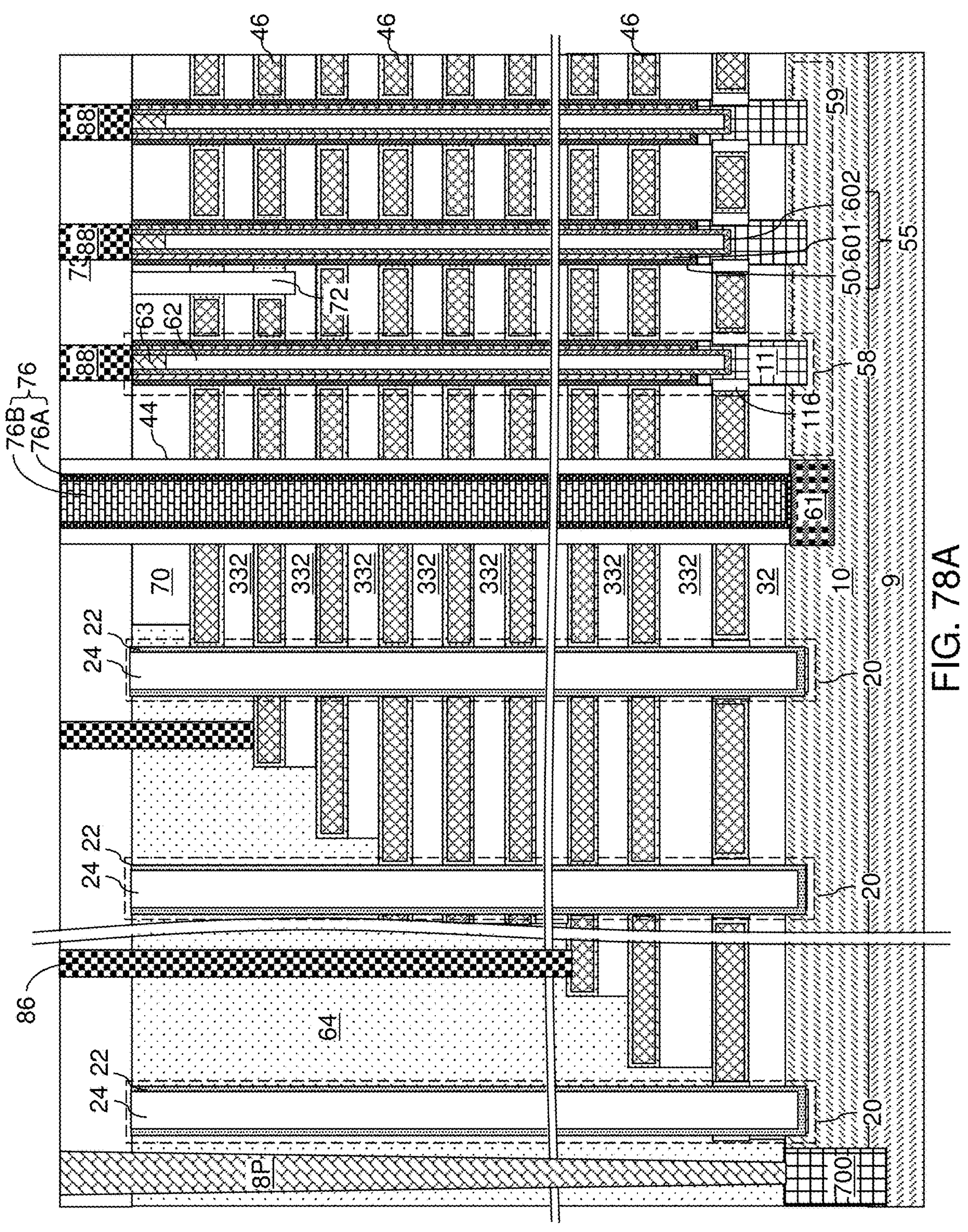
FIG. 78A is a schematic vertical cross-sectional view of the seventh exemplary structure after formation of additional contact via structures according to a seventh embodiment of the present disclosure.
Figure 78B:
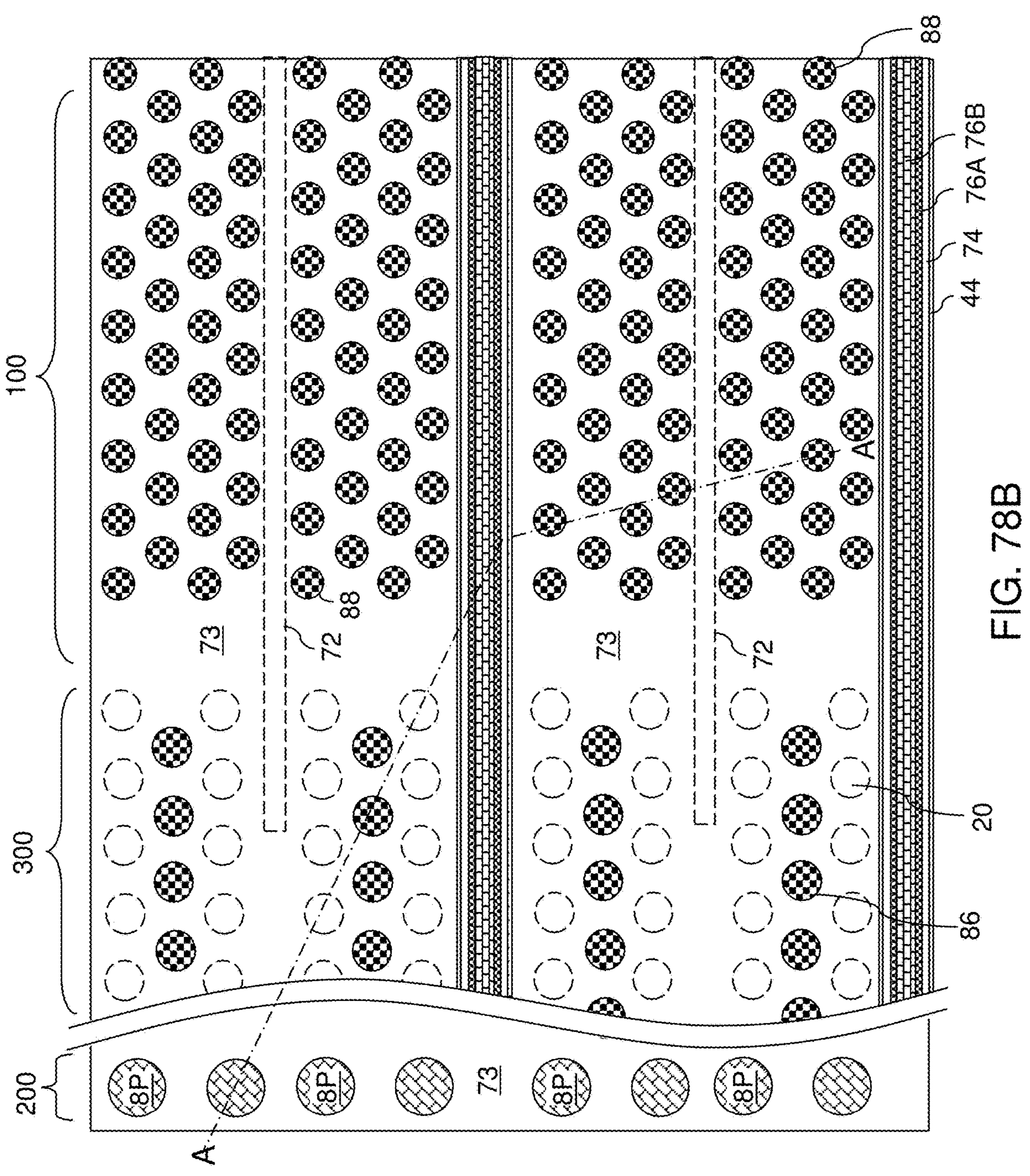
FIG. 78B is a top-down view of the seventh exemplary structure of FIG. 78A. The vertical plane A-A' is the plane of the schematic vertical cross-sectional view of FIG. 78A.

Referring to FIGS. 78A and 78B, the processing steps described with reference to FIGS. 39A and 39B can be performed to form additional contact via structures (88, 86, 8P) can be formed through the contact level dielectric layer 73, and optionally through the retro-stepped dielectric material portion 65.

Figure 79:
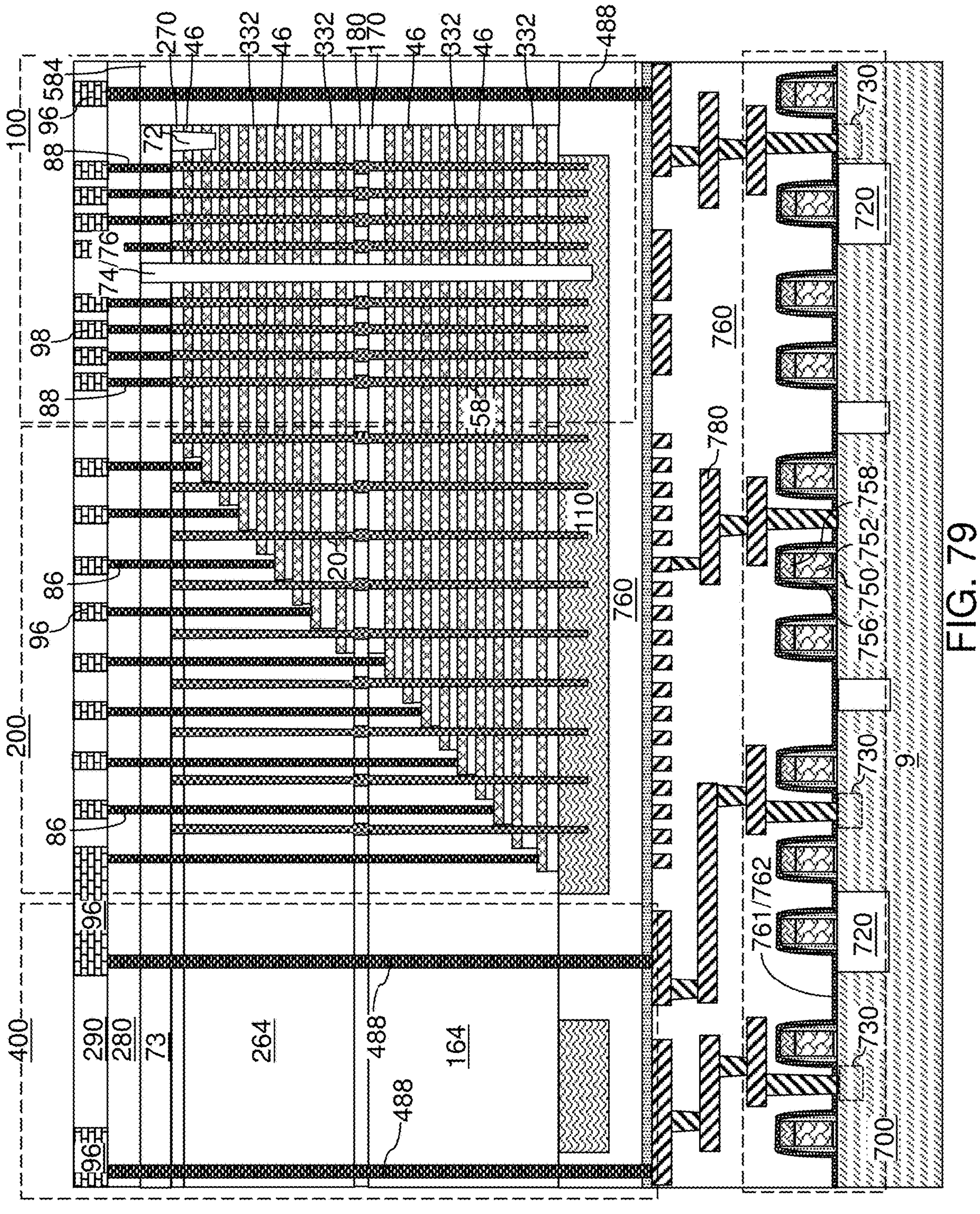
FIG. 79 is a vertical cross-sectional view of an eighth exemplary structure according to an eighth embodiment of the present disclosure.

Referring to FIG. 79, an eighth exemplary structure according to an eighth embodiment of the present disclosure can be derived from the third exemplary structure illustrated in FIG. 40 by employing the processing steps described with reference to FIGS. 72A-72H to form memory opening fill structures 58, and by employing the processing steps described with reference to FIGS. 76A-76G to form the insulating layers 332 and the electrically conductive layers 46. In this eighth embodiment, the memory device includes a horizontal direct strap contact source and a driver circuit located below the memory array.

Referring to all drawings related to the seventh exemplary structure and the eighth exemplary structure and according to various embodiments of the present disclosure, a memory device is provided, which comprises: an alternating stack (332, 46) of insulating layers 332 and electrically conductive layers 46; a memory opening 49 vertically extending through the alternating stack (332, 46); and a memory opening fill structure 58 located in the memory opening 49 and comprising a vertical stack of silicon nitride charge storage material portions 154', a vertical stack of annular silicon oxide material portions 532 that is interlaced with the vertical stack of silicon nitride charge storage material portions 154' along a vertical direction, and a vertical semiconductor channel 60. Each of the insulating layers 332 has a horizontally-extending seam S therein. At least one of the insulating layers has an air gap 333 that is adjoined to a respective horizontally-extending seam S and laterally surrounding the memory opening fill structure 58.

The various embodiments of the present disclosure may be employed to provide memory stack structures 55 including discrete charge storage elements, which may be employed to reduce or eliminate charge diffusion between neighboring memory cells in memory devices.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device, comprising:

forming an alternating stack of disposable material layers and silicon nitride layers over a substrate;

forming a memory opening through the alternating stack;

forming a memory film and a vertical semiconductor channel in the memory opening, wherein the memory film comprises a continuous silicon nitride charge storage material layer and a tunneling dielectric layer;

forming a backside trench through the alternating stack;

forming laterally-extending cavities by removing the disposable material layers selective to the silicon nitride layers through the backside trench;

oxidizing portions of the silicon nitride layers and the continuous silicon nitride charge storage material layer exposed in the laterally-extending cavities to form silicon oxide insulating layers and to separate the continuous silicon nitride charge storage material layer into a vertical stack of discrete silicon nitride charge storage material portions, wherein a horizontally-extending seam is formed in each of the silicon oxide insulating layers during the oxidation; and replacing remaining portions of the silicon nitride layers with electrically conductive layers.

2. The method of claim 1, wherein:

the portions of the continuous silicon nitride charge storage material layer that are exposed in the laterally-extending cavities are converted into a vertical stack of annular silicon oxide material portions during the oxidizing; and the vertical stack of discrete silicon nitride charge storage material portions is interlaced with the vertical stack of annular silicon oxide material portions along a vertical direction.

3. The method of claim 1, wherein the portions of the silicon nitride layers that are exposed in the laterally-extending cavities are converted into silicon oxide material portions that expand in volume to fill the laterally-extending cavities.

4. The method of claim 3, further comprising laterally recessing the silicon oxide material portions, wherein remaining parts of the silicon oxide material portions that fill the laterally-extending cavities comprise the silicon oxide insulating layers.

5. The method of claim 1, wherein the memory film further comprises a blocking dielectric layer.

6. The method of claim 1, further comprising removing portions of the blocking dielectric layer exposed in the laterally-extending cavities, wherein remaining portions of the blocking dielectric layer comprise a vertical stack of tubular insulating spacers.

7. A method of forming a memory device, comprising:

forming an alternating stack of disposable material layers and silicon nitride layers over a substrate;

forming a memory opening through the alternating stack;

forming a memory film and a vertical semiconductor channel in the memory opening, wherein the memory film comprises a continuous silicon nitride charge storage material layer and a tunneling dielectric layer;

forming a backside trench through the alternating stack;

forming laterally-extending cavities by removing the disposable material layers selective to the silicon nitride layers through the backside trench;

oxidizing portions of the silicon nitride layers and the continuous silicon nitride charge storage material layer exposed in the laterally-extending cavities to form silicon oxide insulating layers and to separate the continuous silicon nitride charge storage material layer into a vertical stack of discrete silicon nitride charge storage material portions; and replacing remaining portions of the silicon nitride layers with electrically conductive layers, wherein the replacing the remaining portions of the silicon nitride layers with the electrically conductive layers comprises selectively removing the remaining portions of the silicon nitride layers through the backside trench to form backside recesses, recessing the silicon oxide insulating layers to remove a bird's beak, and forming the electrically conductive layers in the backside recesses through the backside trench.

8. The method of claim 1, wherein an air gap is formed in each of the silicon oxide insulating layers during the oxidation.

9. The method of claim 1, wherein the oxidizing comprises a high pressure oxidation step in a water vapor ambient at a pressure of at least 10 atm and a temperature of at least 750 degrees Celsius.

* * * * *